US012063854B2

(12) United States Patent
Nakano et al.

(10) Patent No.: US 12,063,854 B2
(45) Date of Patent: Aug. 13, 2024

(54) ORGANIC ELECTROLUMINESCENCE DEVICE AND ELECTRONIC APPARATUS USING THE SAME

(71) Applicant: IDEMITSU KOSAN CO., LTD., Tokyo (JP)

(72) Inventors: Yuki Nakano, Sodegaura (JP); Satomi Tasaki, Sodegaura (JP); Kazuki Nishimura, Sodegaura (JP); Tomoki Kato, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 583 days.

(21) Appl. No.: 17/311,040

(22) PCT Filed: Jun. 14, 2019

(86) PCT No.: PCT/JP2019/023610

§ 371 (c)(1),
(2) Date: Jun. 4, 2021

(87) PCT Pub. No.: WO2020/115933

PCT Pub. Date: Jun. 11, 2020

(65) Prior Publication Data

US 2022/0059775 A1 Feb. 24, 2022

(30) Foreign Application Priority Data

Dec. 5, 2018 (JP) ................................ 2018-228046
Jan. 30, 2019 (JP) ................................ 2019-014183

(51) Int. Cl.
*H01L 51/00* (2006.01)
*H10K 85/60* (2023.01)
(Continued)

(52) U.S. Cl.
CPC ....... *H10K 85/6572* (2023.02); *H10K 85/622* (2023.02); *H10K 85/624* (2023.02);
(Continued)

(58) Field of Classification Search
CPC ............. H10K 85/6574; H10K 85/624; H10K 85/615; H10K 85/622; H10K 85/636;
(Continued)

(56) References Cited

U.S. PATENT DOCUMENTS 9,954,187 B2 4/2018 Takahashi et al.
10,230,058 B2 3/2019 Takahashi et al.
(Continued)

FOREIGN PATENT DOCUMENTS

JP 2013-523847 A 6/2013
JP 2017-141167 * 8/2017
(Continued)

OTHER PUBLICATIONS

International Preliminary Report on Patentability issued in International Application No. PCT/JP2019/023610 on Jun. 8, 2021. (6 pages).
(Continued)

*Primary Examiner* — Hrayr A Sayadian
(74) *Attorney, Agent, or Firm* — Foley & Lardner LLP

(57) ABSTRACT

An organic electroluminescence device comprising: a cathode; an anode; and an organic layer disposed between the cathode and the anode, wherein the organic layer includes an emitting layer and a first layer; the first layer is disposed between the cathode and the emitting layer; the emitting layer contains a compound represented by the following formula (A1); and the first layer contains a compound represented by the following formula (B1).
(Continued)

(A1)

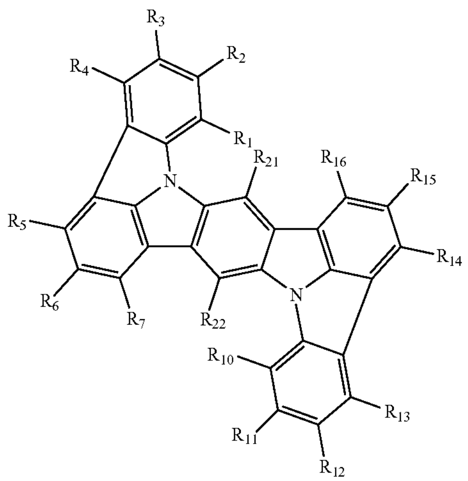

(B1)

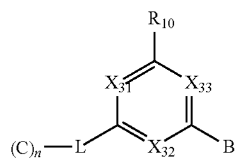

40 Claims, 1 Drawing Sheet

(51) Int. Cl.
*H10K 50/11* (2023.01)
*H10K 101/10* (2023.01)

(52) U.S. Cl.
CPC ......... *H10K 85/626* (2023.02); *H10K 85/636* (2023.02); *H10K 85/654* (2023.02); *H10K 85/6574* (2023.02); *H10K 85/6576* (2023.02); *H10K 50/11* (2023.02); *H10K 2101/10* (2023.02)

(58) Field of Classification Search
CPC ............. H10K 85/623; H10K 85/6572; H10K 85/6576; H10K 85/654; H10K 85/657; H10K 85/626; H10K 50/11; H10K 50/165; H10K 2101/10; C09K 11/06
USPC ............................................................ 257/40
See application file for complete search history.

(56) References Cited

U.S. PATENT DOCUMENTS

| | | | | |
|---|---|---|---|---|
| 2017/0324045 | A1 | 11/2017 | Takahashi et al. | |
| 2018/0198076 | A1 | 7/2018 | Takahashi et al. | |
| 2019/0097142 | A1 | 3/2019 | Takahashi et al. | |
| 2019/0221747 | A1* | 7/2019 | Takahashi .............. | H10K 50/11 |
| 2020/0052225 | A1 | 2/2020 | Takahashi et al. | |

FOREIGN PATENT DOCUMENTS

| | | | |
|---|---|---|---|
| JP | 2017-141167 | A | 8/2017 |
| KR | 20130106255 | A | 9/2013 |
| WO | WO-2013/077344 | A1 | 5/2013 |
| WO | WO-2017/074052 | A1 | 5/2017 |
| WO | WO-2018/151065 | A1 | 8/2018 |
| WO | WO-2019/111971 | A1 | 6/2019 |

OTHER PUBLICATIONS

International Search Report and Written Opinion received in International Application No. PCT/JP2019/023610 on Aug. 6, 2019. (6 pages).

Niebel, Claude et al., "Dibenzo[2, 3:5, 6]pyrrolizino [1, 7-bc] indolo [1, 2, 3-1m] carbazole : a new electron donor", New Journal of Chemistry, 2010, vol. 34, pp. 1243-1246, compound 6 (4 pages).

* cited by examiner

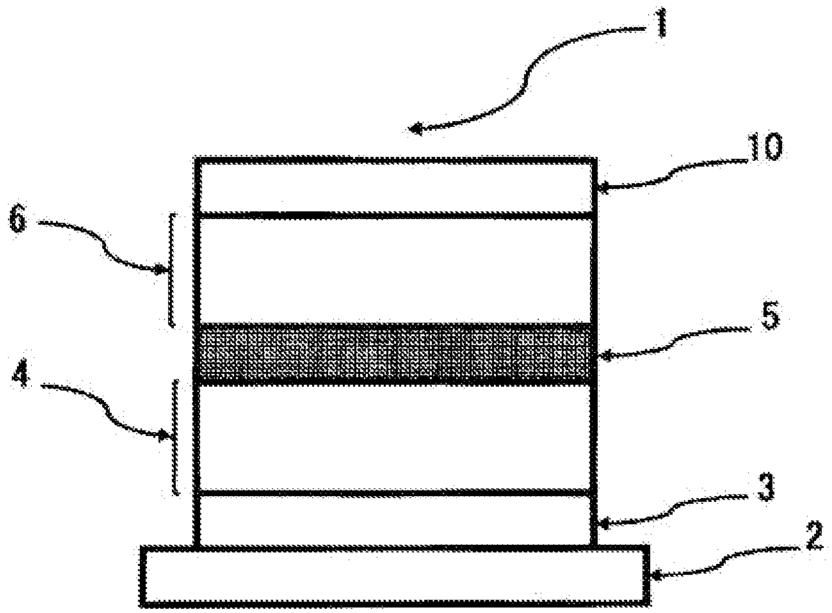
1
10
6
5
4
3
2

ORGANIC ELECTROLUMINESCENCE DEVICE AND ELECTRONIC APPARATUS USING THE SAME

CROSS-REFERENCE TO RELATED APPLICATIONS

The present application claims priority under 37 U.S.C. § 371 to International Patent Application No. PCT/JP2019/023610, filed Jun. 14, 2019, which claims priority to and the benefit of Japanese Patent Application Nos. 2018-228046, filed on Dec. 5, 2018, and 2019-014183, filed on Jan. 30, 2019. The contents of these applications are hereby incorporated by reference in their entireties.

TECHNICAL FIELD

The invention relates to an organic electroluminescence device and an electronic apparatus using the same.

BACKGROUND ART

When voltage is applied to an organic electroluminescence device (hereinafter, referred to as an organic EL device in several cases), holes and electrons are injected into an emitting layer from an anode and a cathode, respectively. Then, thus injected holes and electrons are recombined in the emitting layer, and excitons are formed therein.

Patent Document 1 discloses the use of a compound having a specific fused-ring structure as a material for an emitting layer of an organic EL device.

RELATED ART DOCUMENTS

Patent Documents

[Patent Document 1] WO2018/151065A1

SUMMARY OF THE INVENTION

It is an object of the invention to provide an organic EL device having a long lifetime and an electronic apparatus using the organic EL device.

According to the invention, the following organic EL device and electronic apparatus are provided.

1. An organic electroluminescence device comprising:
   - a cathode;
   - an anode; and
   - an organic layer disposed between the cathode and the anode, wherein
   - the organic layer comprises an emitting layer and a first layer;
   - the first layer is disposed between the cathode and the emitting layer;
   - the emitting layer comprises a compound represented by the following formula (A1); and
   - the first layer comprises a compound represented by the following formula (B1):

(A1)

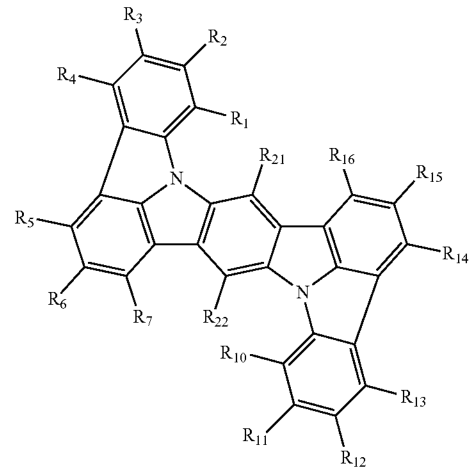

wherein in the formula (A1), one or more sets of adjacent two or more of $R_1$ to $R_7$ and $R_{10}$ to $R_{16}$ form a substituted or unsubstituted, saturated or unsaturated ring by bonding with each other, or do not form a substituted or unsubstituted, saturated or unsaturated ring;

$R_1$ to $R_7$ and $R_{10}$ to $R_{16}$ which do not form the substituted or unsubstituted, saturated or unsaturated ring, and $R_{21}$ and $R_{22}$ are independently a hydrogen atom or a substituent;

the substituent is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{905})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms;

when two or more of each of $R_{901}$ to $R_{907}$ are present, the two or more of each of $R_{901}$ to $R_{907}$ may be the same or different; and provided that the formula (A1) satisfies one or both of the following requirements (i) and (ii):

(i) one or more sets of adjacent two or more of $R_1$ to $R_7$ and $R_{10}$ to $R_{16}$ form a substituted or unsubstituted, saturated or unsaturated ring by bonding with each other, (ii) one or more of $R_1$ to $R_7$, $R_{10}$ to $R_{16}$, $R_{21}$ and $R_{22}$ is the substituent:

(B1)

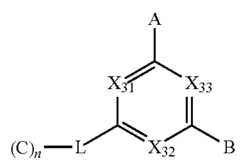

wherein in the formula (B1), one or more of $X_{31}$ to $X_{33}$ is a nitrogen atom, and the others which are not a nitrogen atom are CR;

R is a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

when a plurality of R's are present, the plurality of R's may be the same as or different from each other;

A is a substituted or unsubstituted aryl group including 6 to 18 ring carbon atoms, or a substituted or unsubstituted monovalent heterocyclic group including 5 to 13 ring atoms;

B is a substituted or unsubstituted aryl group including 6 to 18 ring carbon atoms, or a substituted or unsubstituted monovalent heterocyclic group including 5 to 13 ring atoms;

L is a single bond, a substituted or unsubstituted (n+1)-valent aromatic hydrocarbon ring group including 6 to 18 ring carbon atoms, or a substituted or unsubstituted (n+1)-valent heterocyclic group including 5 to 13 ring atoms; the aromatic hydrocarbon ring group may be a structure formed by bonding two or more different aromatic hydrocarbon rings;

C's are independently a substituted or unsubstituted aryl group including 6 to 30 ring carbon atoms, or a substituted or unsubstituted monovalent heterocyclic group including 5 to 60 ring atoms;

n is an integer of 1 to 3; when n is 2 or more, L is not a single bond;

provided that when two of $X_{31}$ to $X_{33}$ are nitrogen atoms, n is 2, and L is a trivalent benzene ring, A and B are not unsubstituted m-biphenyl groups; when two of $X_{31}$ to $X_{33}$ are nitrogen atoms and A is a trivalent benzene ring, B and -L-$(C)_n$ are not unsubstituted m-biphenyl groups; and when two of $X_{31}$ to $X_{33}$ are nitrogen atoms and B is a trivalent benzene ring, A and -L-$(C)_n$ are not unsubstituted m-biphenyl groups.

2. An electronic apparatus, equipped with the organic electroluminescence device according to 1.

According to the invention, an organic EL device having a long lifetime and an electronic apparatus using the organic EL device can be provided.

BRIEF DESCRIPTION OF THE DRAWINGS

The FIGURE is a diagram showing a schematic configuration of an organic EL device according to an aspect of the invention.

MODE FOR CARRYING OUT THE INVENTION

Definition

In this specification, a hydrogen atom means an atom including isotopes different in the number of neutrons, namely, a protium, a deuterium and a tritium.

In this specification, to a bondable position in which a symbol such as "R", or "D" representing a deuterium atom is not specified in a chemical formula, a hydrogen atom, that is, a protium atom, a deuterium atom, or a tritium atom is bonded thereto.

In this specification, a term "ring carbon atoms" represents the number of carbon atoms among atoms forming a subject ring itself of a compound having a structure in which atoms are bonded in a ring form (for example, a monocyclic compound, a fused ring compound, a cross-linked compound, a carbocyclic compound or a heterocyclic compound). When the subject ring is substituted by a substituent, the carbon contained in the substituent is not included in the number of ring carbon atoms. The same shall apply to the "ring carbon atoms" described below, unless otherwise noted. For example, a benzene ring has 6 ring carbon atoms, a naphthalene ring has 10 ring carbon atoms, a pyridine ring has 5 ring carbon atoms, and a furan ring has 4 ring carbon atoms. Further, for example, a 9,9-diphenylfluorenyl group has 13 ring carbon atoms, and a 9,9'-spirobifluorenyl group has 25 ring carbon atoms.

Further, when the benzene ring or the naphthalene ring is substituted by an alkyl group as a substituent, for example, the number of carbon atoms of the alkyl group is not included in the ring carbon atoms.

In this specification, a term "ring atoms" represents the number of atoms forming a subject ring itself of a compound having a structure in which atoms are bonded in a ring form (for example, a monocycle, a fused ring and a ring assembly) (for example, a monocyclic compound, a fused ring compound, a cross-linked compound, a carbocyclic compound or a heterocyclic compound). The term "ring atoms" does not include atoms which do not form the ring (for example, a hydrogen atom which terminates a bond of the atoms forming the ring) or atoms contained in a substituent when the ring is substituted by the substituent. The same shall apply to the "ring atoms" described below, unless otherwise noted. For example, a pyridine ring has 6 ring atoms, a quinazoline ring has 10 ring atoms, and a furan ring has 5 ring atoms. A hydrogen atom bonded with a carbon atom of the pyridine ring or the quinazoline ring or an atom forming the substituent is not included in the number of the ring atoms.

In this specification, a term "XX to YY carbon atoms" in an expression of "substituted or unsubstituted ZZ group including XX to YY carbon atoms" represents the number of carbon atoms when the ZZ group is unsubstituted. The number of carbon atoms of a substituent when the ZZ group is substituted is not included. Here, "YY" is larger than "XX", and "XX" and "YY" each mean an integer of 1 or more.

In this specification, a term "XX to YY atoms" in an expression of "substituted or unsubstituted ZZ group including XX to YY atoms" represents the number of atoms when the ZZ group is unsubstituted. The number of atoms of a substituent when the group is substituted is not included. Here, "YY" is larger than "XX", and "XX" and "YY" each mean an integer of 1 or more.

A term "unsubstituted" in the case of "substituted or unsubstituted ZZ group" means that the ZZ group is not substituted by a substituent, and a hydrogen atom is bonded therewith. Alternatively, a term "substituted" in the case of "substituted or unsubstituted ZZ group" means that one or more hydrogen atoms in the ZZ group are substituted by a substituent. Similarly, a term "substituted" in the case of "BB group substituted by an AA group" means that one or more hydrogen atoms in the BB group are substituted by the AA group.

Hereinafter, the substituent described in this specification will be described.

The number of the ring carbon atoms of the "unsubstituted aryl group" described in this specification is 6 to 50, preferably 6 to 30, and more preferably 6 to 18, unless otherwise specified.

The number of the ring carbon atoms of the "unsubstituted heterocyclic group" described in this specification is 5 to 50, preferably 5 to 30, and more preferably 5 to 18, unless otherwise specified.

The number of the carbon atoms of the "unsubstituted alkyl group" described in this specification is 1 to 50, preferably 1 to 20, and more preferably 1 to 6, unless otherwise specified.

The number of the carbon atoms of the "unsubstituted alkenyl group" described in this specification is 2 to 50, preferably 2 to 20, and more preferably 2 to 6, unless otherwise specified.

The number of the carbon atoms of the "unsubstituted alkynyl group" described in this specification is 2 to 50, preferably 2 to 20, and more preferably 2 to 6, unless otherwise specified.

The number of the ring carbon atoms of the "unsubstituted cycloalkyl group" described in this specification is 3 to 50, preferably 3 to 20, and more preferably 3 to 6, unless otherwise specified.

The number of the ring carbon atoms of the "unsubstituted arylene group" described in this specification is 6 to 50, preferably 6 to 30, and more preferably 6 to 18, unless otherwise specified.

The number of the ring atoms of the "unsubstituted divalent heterocyclic group" described in this specification is 5 to 50, preferably 5 to 30, and more preferably 5 to 18, unless otherwise specified.

The number of the carbon atoms of the "unsubstituted alkylene group" described in this specification is 1 to 50, preferably 1 to 20, and more preferably 1 to 6, unless otherwise specified.

Specific examples (specific example group G1) of the "substituted or unsubstituted aryl group" described in this specification include an unsubstituted aryl group and a substituted aryl group described below. (Here, a term "unsubstituted aryl group" refers to a case where the "substituted or unsubstituted aryl group" is the "unsubstituted aryl group," and a term "substituted aryl group" refers to a case where the "substituted or unsubstituted aryl group" is the "substituted aryl group". Hereinafter, a case of merely "aryl group" includes both the "unsubstituted aryl group" and the "substituted aryl group".

The "substituted aryl group" refers to a case where the "unsubstituted aryl group" has a substituent, and specific examples thereof include a group in which the "unsubstituted aryl group" has the substituent, and a substituted aryl group described below. It should be noted that examples of the "unsubstituted aryl group" and examples of the "substituted aryl group" listed in this specification are only one example, and the "substituted aryl group" described in this specification also includes a group in which a group in which "unsubstituted aryl group" has a substituent further has a substituent, and a group in which "substituted aryl group" further has a substituent, and the like.

An unsubstituted aryl group:

a phenyl group,
a p-biphenyl group,
a m-biphenyl group,
an o-biphenyl group,
a p-terphenyl-4-yl group,
a p-terphenyl-3-yl group,
a p-terphenyl-2-yl group,
a m-terphenyl-4-yl group,
a m-terphenyl-3-yl group,
a m-terphenyl-2-yl group,
an o-terphenyl-4-yl group,
an o-terphenyl-3-yl group,
an o-terphenyl-2-yl group,
a 1-naphthyl group,
a 2-naphthyl group,
an anthryl group,
a benzanthryl group,
a phenanthryl group,
a benzophenanthryl group,
a phenalenyl group,
a pyrenyl group,
a chrysenyl group,
a benzochrysenyl group,
a triphenylenyl group,
a benzotriphenylenyl group,
a tetracenyl group,
a pentacenyl group,
a fluorenyl group,
a 9,9'-spirobifluorenyl group,
a benzofluorenyl group,
a dibenzofluorenyl group,
a fluoranthenyl group,
a benzofluoranthenyl group, and
a perylenyl group.

A substituted aryl group:

an o-tolyl group,
a m-tolyl group,
a p-tolyl group,
a p-xylyl group,
a m-xylyl group,
an o-xylyl group,
a p-isopropyl phenyl group,
a m-isopropyl phenyl group,
an o-isopropyl phenyl group,
a p-t-butylphenyl group,
a m-t-butylphenyl group,
an o-t-butylphenyl group,
a 3,4,5-trimethylphenyl group,
a 9,9-dimethylfluorenyl group,
a 9,9-diphenylfluorenyl group
a 9,9-di(4-methylpheny)fluorenyl group,
a 9,9-di(4-isopropylpheny)fluorenyl group,
a 9,9-di(4-t-butylphenyDlfluorenyl group,
a cyanophenyl group,
a triphenylsilylphenyl group,
a trimethylsilylphenyl group,
a phenylnaphthyl group, and
a naphthylphenyl group.

The "heterocyclic group" described in this specification is a ring group including at least one hetero atom in the ring atom. Specific examples of the hetero atom include a nitrogen atom, an oxygen atom, a sulfur atom, a silicon atom, a phosphorus atom and a boron atom.

The "heterocyclic group" described in this specification may be a monocyclic group, or a fused ring group.

The "heterocyclic group" described in this specification may be an aromatic heterocyclic group, or an aliphatic heterocyclic group.

Specific examples (specific example group G2) of the "substituted or unsubstituted heterocyclic group" include an unsubstituted heterocyclic group and a substituted heterocyclic group described below. (Here, the unsubstituted heterocyclic group refers to a case where the "substituted or unsubstituted heterocyclic group" is the "unsubstituted heterocyclic group," and the substituted heterocyclic group refers to a case where the "substituted or unsubstituted heterocyclic group" is the "substituted heterocyclic group". Hereinafter, the case of merely "heterocyclic group" includes both the "unsubstituted heterocyclic group" and the "substituted heterocyclic group".

The "substituted heterocyclic group" refers to a case where the "unsubstituted heterocyclic group" has a substituent, and specific examples thereof include a group in which the "unsubstituted heterocyclic group" has a substituent, and a substituted heterocyclic group described below. It should be noted that examples of the "unsubstituted heterocyclic group" and examples of the "substituted heterocyclic group" listed in this specification are merely one example, and the "substituted heterocyclic group" described in this specification also includes a group in which "unsubstituted heterocyclic group" which has a substituent further has a substituent, and a group in which "substituted heterocyclic group" further has a substituent, and the like.

An unsubstituted heterocyclic group including a nitrogen atom:

a pyrrolyl group,
an imidazolyl group,
a pyrazolyl group,
a triazolyl group,
a tetrazolyl group,
an oxazolyl group,
an isoxazolyl group,
an oxadiazolyl group,
a thiazolyl group,
an isothiazolyl group,
a thiadiazolyl group,
a pyridyl group,
a pyridazinyl group,
a pyrimidinyl group,
a pyrazinyl group,
a triazinyl group,
an indolyl group,
an isoindolyl group,
an indolizinyl group,
a quinolizinyl group,
a quinolyl group,
an isoquinolyl group,
a cinnolyl group,
a phthalazinyl group,
a quinazolinyl group,
a quinoxalinyl group,
a benzimidazolyl group,
an indazolyl group,
a phenanthrolinyl group,
a phenanthridinyl group an acridinyl group,
a phenazinyl group,
a carbazolyl group,
a benzocarbazolyl group,
a morpholino group,
a phenoxazinyl group,
a phenothiazinyl group,
an azacarbazolyl group, and
a diazacarbazolyl group.

An unsubstituted heterocyclic group including an oxygen atom:

a furyl group,
an oxazolyl group,
an isoxazolyl group,
an oxadiazolyl group,
a xanthenyl group,
a benzofuranyl group,
an isobenzofuranyl group,
a dibenzofuranyl group,
a naphthobenzofuranyl group,
a benzoxazolyl group,
a benzisoxazolyl group,
a phenoxazinyl group,
a morpholino group,
a dinaphthofuranyl group,
an azadibenzofuranyl group,
a diazadibenzofuranyl group,
an azanaphthobenzofuranyl group, and
a diazanaphthobenzofuranyl group.

An unsubstituted heterocyclic group including a sulfur atom:

a thienyl group,
a thiazolyl group,
an isothiazolyl group,
a thiadiazolyl group,
a benzothiophenyl group,
an isobenzothiophenyl group,
a dibenzothiophenyl group,
a naphthobenzothiophenyl group,
a benzothiazolyl group,
a benzisothiazolyl group,
a phenothiazinyl group,
a dinaphthothiophenyl group,
an azadibenzothiophenyl group,
a diazadibenzothiophenyl group,
an azanaphthobenzothiophenyl group, and
a diazanaphthobenzothiophenyl group.

A substituted heterocyclic group including a nitrogen atom:

a (9-pheny)carbazolyl group,
a (9-biphenyly)carbazolyl group,
a (9-phenyl)phenylcarbazolyl group,
a (9-naphthy)carbazolyl group,
a diphenylcarbazol-9-yl group,
a phenylcarbazol-9-yl group,
a methylbenzimidazolyl group,
an ethylbenzimidazolyl group,
a phenyltriazinyl group,
a biphenylyltriazinyl group,
a diphenyltriazinyl group,
a phenylquinazolinyl group, and
a biphenylylquinazolinyl group.

A substituted heterocyclic group including an oxygen atom:

a phenyldibenzofuranyl group,
a methyldibenzofuranyl group,
a t-butyldibenzofuranyl group, and a monovalent residue of spiro[9H-xanthene-9,9'-[9H] fluorene].

A substituted heterocyclic group including a sulfur atom:

a phenyldibenzothiophenyl group, a methyldibenzothiophenyl group, a t-butyldibenzothiophenyl group, and a monovalent residue of spiro[9H-thioxantene-9,9'-[9H] fluorene].

A monovalent group derived from the following unsubstituted heterocyclic ring containing at least one of a nitrogen atom, an oxygen atom and a sulfur atom by removal of one hydrogen atom bonded to the ring atoms thereof, and a monovalent group in which a monovalent group derived from the following unsubstituted heterocyclic ring has a substituent by removal of one hydrogen atom bonded to the ring atoms thereof:

(XY-1)

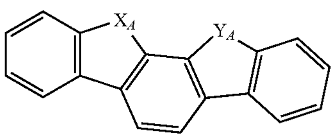

(XY-2)

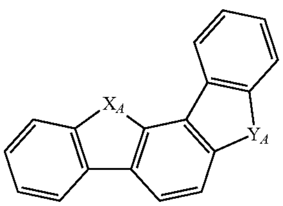

(XY-3)

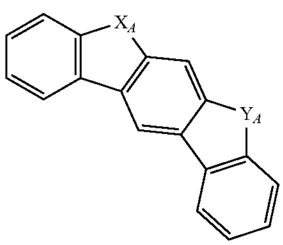

(XY-4)

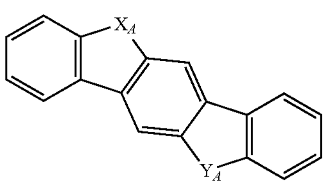

(XY-5)

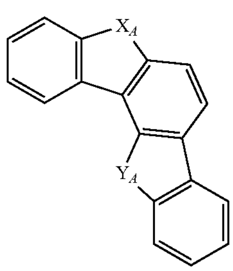

-continued (XY-6)

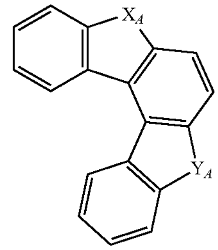

(XY-7)

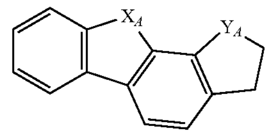

(XY-8)

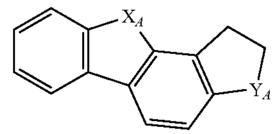

(XY-9)

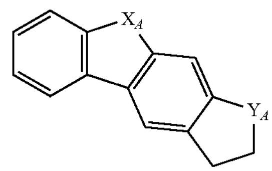

(XY-10)

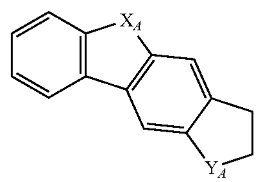

(XY-11)

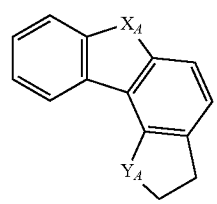

(XY-12)

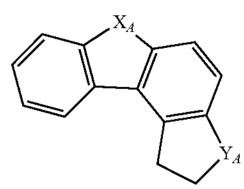

(XY-13)

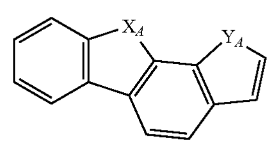

(XY-14)

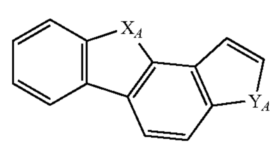

-continued (XY-15)

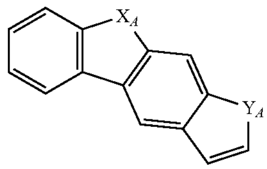

(XY-16)

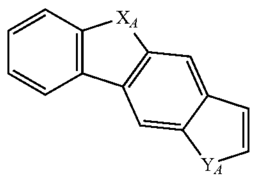

(XY-17)

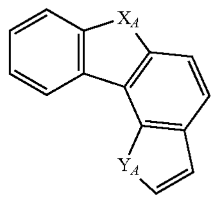

(XY-18)

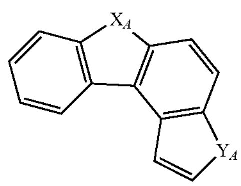

In the formulas (XY-1) to (XY=18), $X_A$ and $Y_A$ are independently an oxygen atom, a sulfur atom, NH or $CH_2$. However, at least one of $X_A$ and $Y_A$ is an oxygen atom, a sulfur atom or NH.

The heterocyclic ring represented by the formulas (XY-1) to (XY-18) becomes a monovalent heterocyclic group including a bond at an arbitrary position.

An expression "the monovalent group derived from the unsubstituted heterocyclic ring represented by the formulas (XY-1) to (XY-18) has a substituent" refers to a case where the hydrogen atom bonded with the carbon atom which constitutes a skeleton of the formulas is substituted by a substituent, or a state in which $X_A$ or $Y_A$ is NH or $CH_2$, and the hydrogen atom in the NH or $CH_2$ is replaced with a substituent.

Specific examples (specific example group G3) of the "substituted or unsubstituted alkyl group" include an unsubstituted alkyl group and a substituted alkyl group described below. (Here, the unsubstituted alkyl group refers to a case where the "substituted or unsubstituted alkyl group" is the "unsubstituted alkyl group," and the substituted alkyl group refers to a case where the "substituted or unsubstituted alkyl group" is the "substituted alkyl group"). Hereinafter, the case of merely "alkyl group" includes both the "unsubstituted alkyl group" and the "substituted alkyl group".

The "substituted alkyl group" refers to a case where the "unsubstituted alkyl group" has a substituent, and specific examples thereof include a group in which the "unsubstituted alkyl group" has a substituent, and a substituted alkyl group described below. It should be noted that examples of the "unsubstituted alkyl group" and examples of the "substituted alkyl group" listed in this specification are merely one example, and the "substituted alkyl group" described in this specification also includes a group in which "unsubstituted alkyl group" has a substituent further has a substituent, a group in which "substituted alkyl group" further has a substituent, and the like.

An unsubstituted alkyl group:
a methyl group,
an ethyl group,
a n-propyl group,
an isopropyl group,
a n-butyl group,
an isobutyl group,
a s-butyl group, and
a t-butyl group.

A substituted alkyl group:
a heptafluoropropyl group (including an isomer),
a pentafluoroethyl group,
a 2,2,2-trifluoroethyl group, and
a trifluoromethyl group.

Specific examples (specific example group G4) of the "substituted or unsubstituted alkenyl group" include an unsubstituted alkenyl group and a substituted alkenyl group described below. (Here, the unsubstituted alkenyl group refers to a case where the "substituted or unsubstituted alkenyl group" is the "unsubstituted alkenyl group," and the substituted alkenyl group refers to a case where the "substituted or unsubstituted alkenyl group" is the "substituted alkenyl group"). Hereinafter, the case of merely "alkenyl group" includes both the "unsubstituted alkenyl group" and the "substituted alkenyl group".

The "substituted alkenyl group" refers to a case where the "unsubstituted alkenyl group" has a substituent, and specific examples thereof include a group in which the "unsubstituted alkenyl group" has a substituent, and a substituted alkenyl group described below. It should be noted that examples of the "unsubstituted alkenyl group" and examples of the "substituted alkenyl group" listed in this specification are merely one example, and the "substituted alkenyl group" described in this specification also includes a group in which "unsubstituted alkenyl group" has a substituent further has a substituent, a group in which "substituted alkenyl group" further has a substituent, and the like.

An unsubstituted alkenyl group and a substituted alkenyl group:
a vinyl group,
an allyl group,
a 1-butenyl group,
a 2-butenyl group,
a 3-butenyl group,
a 1,3-butanedienylgroup,
a 1-methylvnyl group,
a 1-methylallyl group,
a 1,1-dimethylallyl group,
a 2-methylallyl group, and
a 1,2-dimethylallyl group.

Specific examples (specific example group G5) of the "substituted or unsubstituted alkynyl group" include an unsubstituted alkynyl group described below. (Here, the unsubstituted alkynyl group refers to a case where the "substituted or unsubstituted alkynyl group" is the "unsubstituted alkynyl group"). Hereinafter, a case of merely "alkynyl group" includes both the "unsubstituted alkynyl group" and the "substituted alkynyl group". The "substituted alkynyl group" refers to a case where the "unsubstituted alkynyl group" has a substituent, and specific examples thereof include a group in which the "unsubstituted alkynyl group" described below has a substituent.

An unsubstituted alkynyl group:

an ethynyl group.

Specific examples (specific example group G6) of the "substituted or unsubstituted cycloalkyl group" described in this specification include an unsubstituted cycloalkyl group and a substituted cycloalkyl group described below. (Here, the unsubstituted cycloalkyl group refers to a case where the "substituted or unsubstituted cycloalkyl group" is the "unsubstituted cycloalkyl group," and the substituted cycloalkyl group refers to a case where the "substituted or unsubstituted cycloalkyl group" is the "substituted cycloalkyl group"). Hereinafter, a case of merely "cycloalkyl group" includes both the "unsubstituted cycloalkyl group" and the "substituted cycloalkyl group".

The "substituted cycloalkyl group" refers to a case where the "unsubstituted cycloalkyl group" a the substituent, and specific examples thereof include a group in which the "unsubstituted cycloalkyl group" has a substituent, and a substituted cycloalkyl group described below. It should be noted that examples of the "unsubstituted cycloalkyl group" and examples of the "substituted cycloalkyl group" listed in this specification are merely one example, and the "substituted cycloalkyl group" described in this specification also includes a group in which "unsubstituted cycloalkyl group" has a substituent further has a substituent, a group in which "substituted cycloalkyl group" further has a substituent, and the like.

An unsubstituted aliphatic ring group:

a cyclopropyl group, a cyclobutyl group, a cyclopentyl group, a cyclohexyl group, a 1-adamantyl group, a 2-adamantyl group, a 1-norbomyl group, and a 2-norbomyl group.

A substituted cycloalkyl group:

a 4-methylcyclohexyl group.

Specific examples (specific example group G7) of the group represented by —Si($R_{901}$)($R_{902}$)($R_{903}$) described in this specification include —Si(G1)(G1)(G1), —Si(G1)(G2)(G2), —Si(G1)(G1)(G2), —Si(G2)(G2)(G2), —Si(G3)(G3)(G3), —Si(G5)(G5)(G5) and —Si(G6)(G6)(G6).

In which,

G1 is the "aryl group" described in the specific example group G1.

G2 is the "heterocyclic group" described in the specific example group G2.

G3 is the "alkyl group" described in the specific example group G3.

G5 is the "alkynyl group" described in the specific example group G5.

G6 is the "cycloalkyl group" described in the specific example group G6.

Specific examples (specific example group G8) of the group represented by —O—($R_{904}$) described in this specification include

—O(G1),

—O(G2),

—O(G3) and

—O(G6).

In which,

G1 is the "aryl group" described in the specific example group G1.

G2 is the "heterocyclic group" described in the specific example group G2.

G3 is the "alkyl group" described in the specific example group G3.

G6 is the "cycloalkyl group" described in the specific example group G6.

Specific examples (specific example group G9) of the group represented by —S—($R_{905}$) described in this specification include

—S(G1),

—S(G2),

—S(G3) and

—S(G6).

In which,

G1 is the "aryl group" described in the specific example group G1.

G2 is the "heterocycle group" described in the specific example group G2.

G3 is the "alkyl group" described in the specific example group G3.

G6 is the "cycloalkyl group" described in the specific example group G6.

Specific examples (specific example group G10) of the group represented by —N($R_{905}$)($R_{907}$) described in this specification include

—N(G1)(G1),

—N(G2)(G2),

—N(G1)(G2),

—N(G3)(G3) and

—N(G6) (G6).

In which,

G1 is the "aryl group" described in the specific example group G1.

G2 is the "heterocycle group" described in the specific example group G2.

G3 is the "alkyl group" described in the specific example group G3.

G6 is the "cycloalkyl group" described in the specific example group G6.

Specific examples (specific example group G11) of the "halogen atom" described in this specification include a fluorine atom, a chlorine atom, a bromine atom and an iodine atom.

Specific examples of the "alkoxy group" described in this specification include a group represented by —O(G3), where G3 is the "alkyl group" described in the specific example group G3. The number of carbon atoms of the "unsubstituted alkoxy group" are 1 to 50, preferably 1 to 30, and more preferably 1 to 18, unless otherwise specified.

Specific examples of the "alkylthio group" described in this specification include a group represented by —S(G3), where G3 is the "alkyl group" described in the specific example group G3. The number of carbon atoms of the "unsubstituted alkylthio group" are 1 to 50, preferably 1 to 30, and more preferably 1 to 18, unless otherwise specified.

Specific examples of the "aryloxy group" described in this specification include a group represented by —O(G1), where G1 is the "aryl group" described in the specific example group G1. The number of ring carbon atoms of the "unsubstituted aryloxy group" are 6 to 50, preferably 6 to 30, and more preferably 6 to 18, unless otherwise specified.

Specific examples of the "arylthio group" described in this specification include a group represented by —S(G1), where G1 is the "aryl group" described in the specific example group G1. The number of ring carbon atoms of the "unsubstituted arylthio group" are 6 to 50, preferably 6 to 30, and more preferably 6 to 18, unless otherwise specified.

Specific examples of the "aralkyl group" described in this specification include a group represented by -(G3)-(G1), where G3 is the "alkyl group" described in the specific example group G3, and G1 is the "aryl group" described in the specific example group G1. Accordingly, the "aralkyl group" is one embodiment of the "substituted alkyl group" substituted by the "aryl group". The number of carbon atoms of the "unsubstituted aralkyl group," which is the "unsubstituted alkyl group" substituted by the "unsubstituted aryl group," are 7 to 50, preferably 7 to 30, and more preferably 7 to 18, unless otherwise specified.

Specific example of the "aralkyl group" include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, and a 2-β-naphthylisopropyl group.

The substituted or unsubstituted aryl group described in this specification is, unless otherwise specified, preferably a phenyl group, a p-biphenyl group, a m-biphenyl group, an o-biphenyl group, a p-terphenyl-4-yl group, a p-terphenyl-3-yl group, a p-terphenyl-2-yl group, a m-terphenyl-4-yl group, a m-terphenyl-3-yl group, a m-terphenyl-2-yl group, an o-terphenyl-4-yl group, an o-terphenyl-3-yl group, an o-terphenyl-2-yl group, a 1-naphthyl group, a 2-naphthyl group, an anthryl group, a phenanthryl group, a pyrenyl group, a chrysenyl group, a triphenylenyl group, a fluorenyl group, a 9,9'-spirobifluorenyl group, a 9,9-diphenylfluorenyl group, or the like.

The substituted or unsubstituted heterocyclic group described in this specification is, unless otherwise specified, preferably a pyridyl group, a pyrimidinyl group, a triazinyl group, a quinolyl group, an isoquinolyl group, a quinazolinyl group, a benzimidazolyl group, a phenanthrolinyl group, a carbazolyl group (a 1-carbazolyl group, a 2-carbazolyl group, a 3-carbazolyl group, a 4-carbazolyl group, or a 9-carbazolyl group), a benzocarbazolyl group, an azacarbazolyl group, a diazacarbazolyl group, a dibenzofuranyl group, a naphthobenzofuranyl group, an azadibenzofuranyl group, a diazadibenzofuranyl group, a dibenzothiophenyl group, a naphthobenzothiophenyl group, an azadibenzothiophenyl group, a diazadibenzothiophenyl group, a (9-pheny)carbazolyl group (a (9-pheny)carbazol-1-yl group, a (9-pheny)carbazol-2-yl group, a (9-pheny)carbazol-3-yl group, or a (9-pheny)carbazol-4-yl group), a (9-biphenyly)carbazolyl group, a (9-pheny)phenylcarbazolyl group, a diphenylcarbazole-9-yl group, a phenylcarbazol-9-yl group, a phenyltriazinyl group, a biphenylyltriazinyl group, diphenyltriazinyl group, a phenyldibenzofuranyl group, a phenyldibenzothiophenyl group, an indrocarbazolyl group, a pyrazinyl group, a pyridazinyl group, a quinazolinyl group, a cinnolinyl group, a phthalazinyl group, a quinoxalinyl group, a pyrrolyl group, an indolyl group, a pyrrolo[3,2,1-jk]carbazolyl group, a furanyl group, a benzofuranyl group, a thiophenyl group, a benzothiophenyl group, a pyrazolyl group, an imidazolyl group, a benzimidazolyl group, a triazolyl group, an oxazolyl group, a benzoxazolyl group, a thiazolyl group, a benzothiazolyl group, an isothiazolyl group, a benzisothiazolyl group, a thiadiazolyl group, an isoxazolyl group, a benzisoxazolyl group, a pyrrolidinyl group, a piperidinyl group, a piperazinyl group, an imidazolidinyl group, an indro[3,2,1-jk]carbazolyl group, a dibenzothiophenyl group, or the like.

The dibenzofuranyl group and the dibenzothiophenyl group as described above are specifically any group described below, unless otherwise specified.

(XY-76)

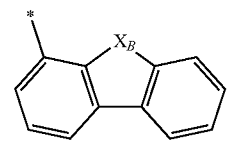

(XY-77)

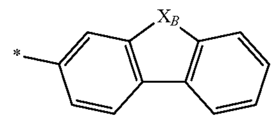

(XY-78)

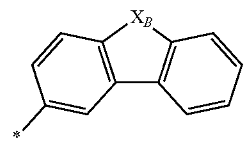

(XY-79)

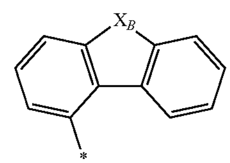

In the formulas (XY-76) to (XY-79), $X_B$ is an oxygen atom or a sulfur atom.

The substituted or unsubstituted alkyl group described in this specification is, unless otherwise specified, preferably a methyl group, an ethyl group, a propyl group, an isopropyl group, a n-butyl group, an isobutyl group, a t-butyl group, or the like.

The "substituted or unsubstituted arylene group" descried in this specification refers to a group in which the above-described "aryl group" is converted into divalence, unless otherwise specified. Specific examples (specific example group G12) of the "substituted or unsubstituted arylene group" include a group in which the "aryl group" described in the specific example group G1 is converted into divalence. Namely, specific examples (specific example group G12) of the "substituted or unsubstituted arylene group" refer to a group derived from the "aryl group" described in specific example group G1 by removal of one hydrogen atom bonded to the ring carbon atoms thereof.

Specific examples (specific example group G13) of the "substituted or unsubstituted divalent heterocyclic group" include a group in which the "heterocyclic group" described in the specific example group G2 is converted into divalence. Namely, specific examples (specific example group G13) of the "substituted or unsubstituted divalent heterocyclic group" refer to a group derived from the "heterocyclic group" described in specific example group G2 by removal of one hydrogen atom bonded to the ring atoms thereof.

Specific examples (specific example group G14) of the "substituted or unsubstituted alkylene group" include a group in which the "alkyl group" described in the specific example group G3 is converted into divalence. Namely, specific examples (specific example group G14) of the "substituted or unsubstituted alkylene group" refer to a group derived from the "alkyl group" described in specific example group G3 by removal of one hydrogen atom bonded to the carbon atoms constituting the alkane structure thereof.

The substituted or unsubstituted arylene group described in this specification is any group described below, unless otherwise specified.

(XY-20)

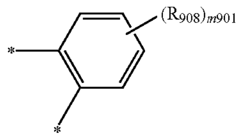

(XY-21)

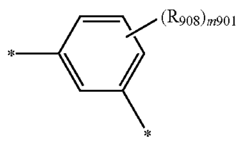

(XY-22)

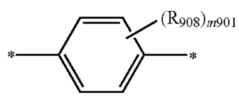

(XY-23)

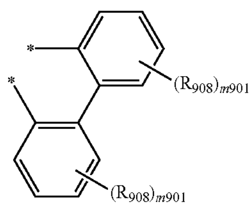

(XY-24)

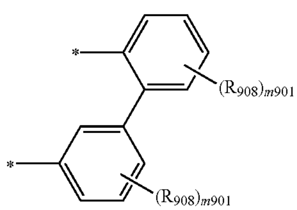

(XY-25)

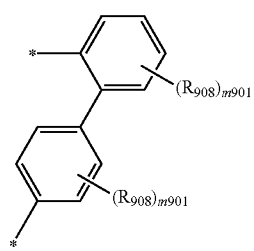

(XY-26)

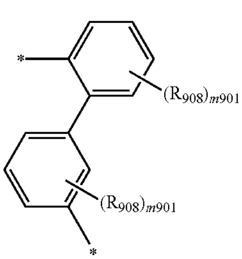

-continued (XY-27)

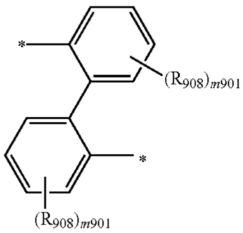

(XY-28)

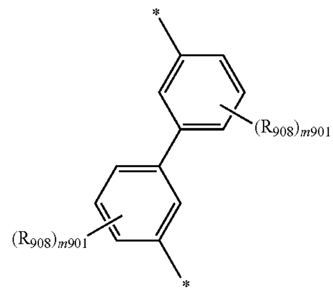

(XY-29)

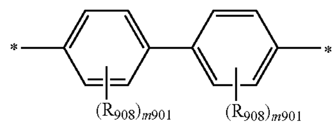

(XY-83)

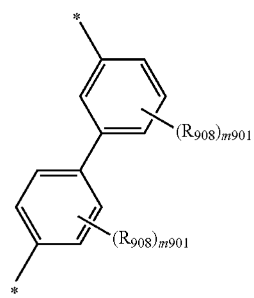

(XY-84)

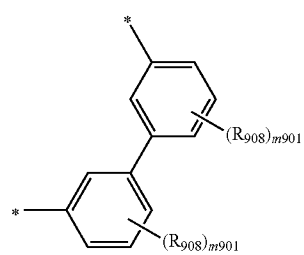

In the formulas (XY-20) to (XY-29), (XY-83) and (XY-84), $R_{908}$ is a substituent.

Then, m901 is an integer of 0 to 4, and when m901 is 2 or more, a plurality of $R_{908}$ may be the same as or different from each other.

(XY-30)

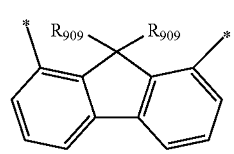

-continued
(XY-31)
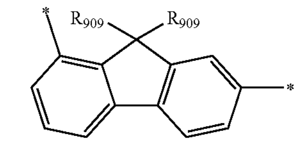
(XY-32)
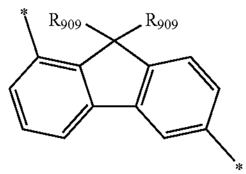
(XY-33)
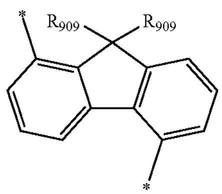
(XY-34)
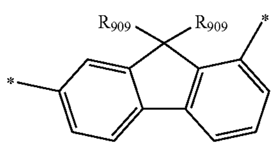
(XY-35)
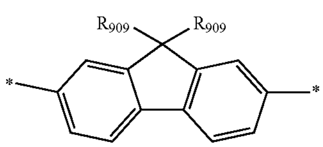
(XY-36)
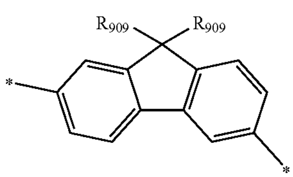
(XY-37)
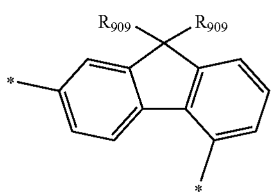
(XY-38)
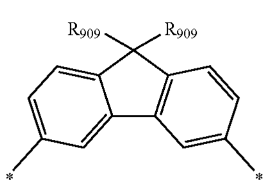
-continued
(XY-39)
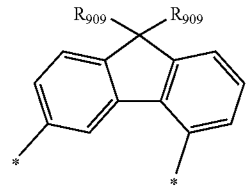
(XY-40)
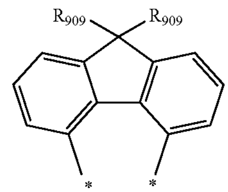
In the formulas (XY-30) to (XY-40), $R_{909}$'s are independently a hydrogen atom or a substituent. Two of $R_{909}$ may form a ring by bonding with each other through a single bond.
(XY-41)
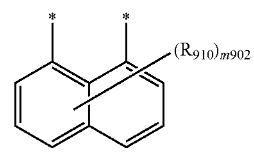
(XY-42)
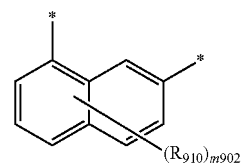
(XY-43)
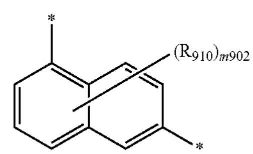
(XY-44)
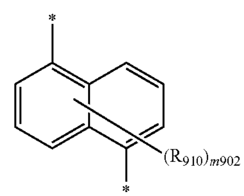
(XY-45)
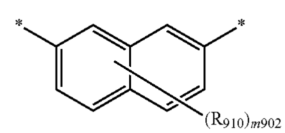
(XY-46)
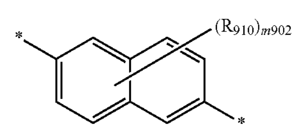

In the formulas (XY-41) to (XY-46), $R_{910}$ is a substituent.
Then, m902 is an integer of 0 to 6. When m902 is 2 or more, a plurality of $R_{910}$ may be the same as or different from each other.
The substituted or unsubstituted divalent heterocyclic group described in this specification is preferably any group described below, unless otherwise specified.
(XY-50)
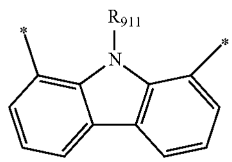
(XY-51)
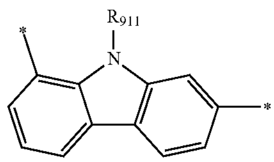
(XY-52)
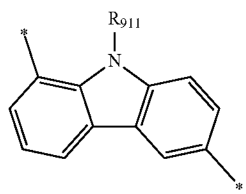
(XY-53)
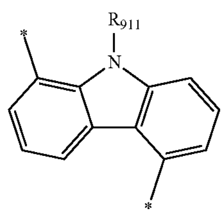
(XY-54)
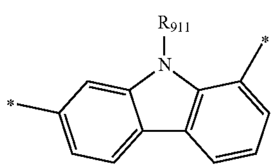
(XY-55)
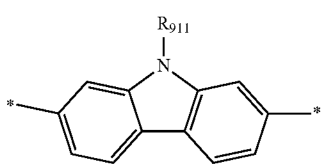
(XY-56)
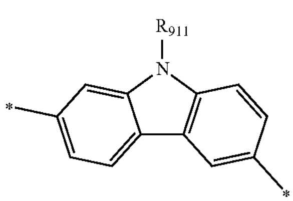
-continued
(XY-57)
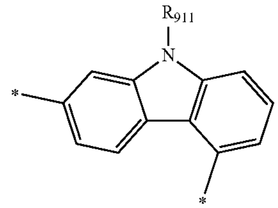
(XY-58)
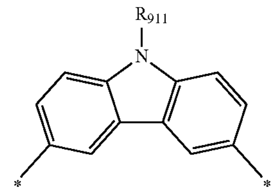
(XY-59)
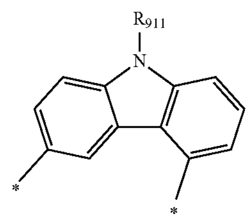
(XY-60)
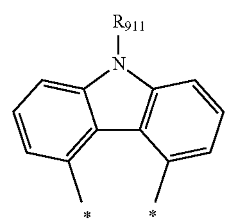
(XY-61)
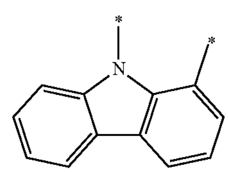
(XY-62)
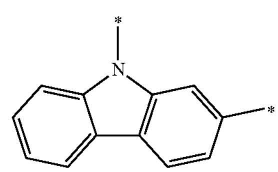
(XY-63)
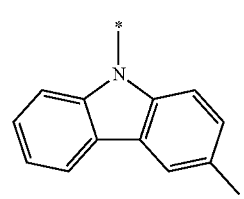

-continued (XY-64)

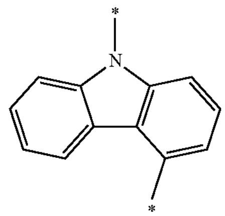

In the formulas (XY-50) to (XY-60), $R_{911}$ is a hydrogen atom or a substituent.

(XY-65)

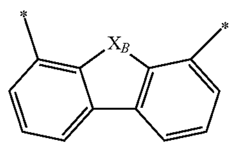

(XY-66)

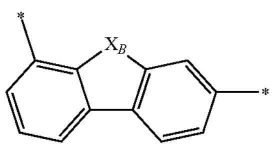

(XY-67)

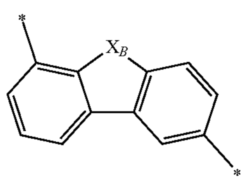

(XY-68)

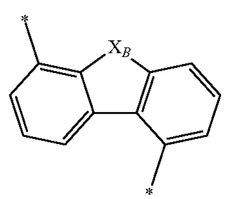

(XY-69)

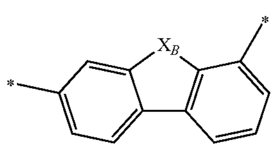

(XY-70)

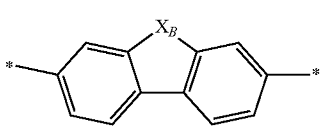

(XY-71)

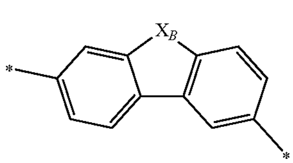

-continued (XY-72)

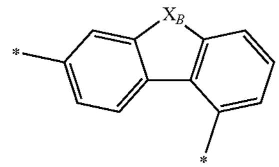

(XY-73)

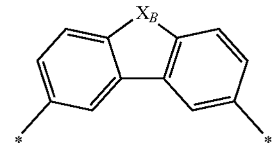

(XY-74)

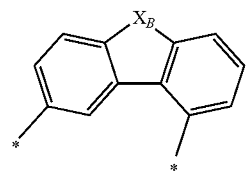

(XY-75)

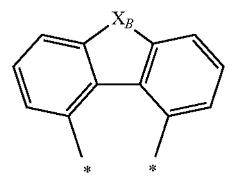

In the formulas (XY-65) to (XY-75), $X_B$ is an oxygen atom or a sulfur atom.

In this specification, a case where "one or more sets of two or more groups adjacent to each other form a substituted or unsubstituted and saturated or unsaturated ring by bonding with each other" will be described by taking, as an example, a case of an anthracene compound represented by the following formula (XY-80) in which a mother skeleton is an anthracene ring.

(XY-80)

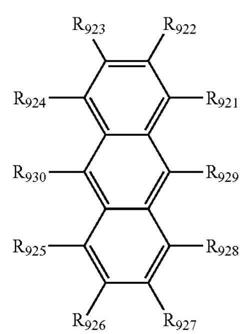

For example, two adjacent to each other into one set when "one or more sets of two or more groups adjacent to each other form the ring by bonding with each other" among $R_{921}$ to $R_{930}$ include $R_{921}$ and $R_{922}$, $R_{922}$ and $R_{923}$, $R_{923}$ and $R_{924}$, $R_{924}$ and $R_{930}$, $R_{930}$ and $R_{925}$, $R_{925}$ and $R_{926}$, $R_{926}$ and $R_{927}$, $R_{927}$ and $R_{923}$, $R_{928}$ and $R_{929}$, and $R_{929}$ and $R_{921}$.

The above-described "one or more sets" means that two or more sets of two groups adjacent to each other may simultaneously form the ring. For example, a case where $R_{921}$ and $R_{922}$ form a ring A by bonding with each other, and simultaneously $R_{925}$ and $R_{926}$ form a ring B by bonding with each other is represented by the following formula (XY-81).

(XY-81)

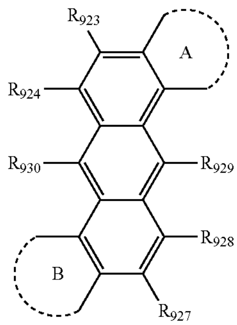

A case where "two or more groups adjacent to each other" form a ring means that, for example, $R_{921}$ and $R_2$ forma ring A by bonding with each other, and $R_{922}$ and $R_{923}$ form a ring C by bonding with each other. A case where the ring A and ring C sharing $R_9$ are formed, in which the ring A and the ring C are fused to the anthracene mother skeleton by three of $R_{921}$ to $R_{923}$ adjacent to each other, is represented by the following (XY-82).

(XY-82)

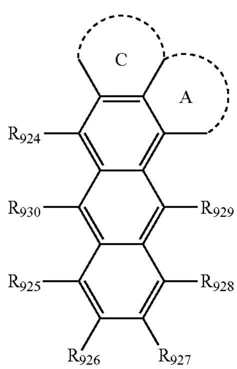

The rings A to C formed in the formulas (XY-81) and (XY-82) are a saturated or unsaturated ring.

A term "unsaturated ring" means an aromatic hydrocarbon ring or an aromatic heterocyclic ring. A term "saturated ring" means an aliphatic hydrocarbon ring or an aliphatic heterocyclic ring.

For example, the ring A formed by $R_{921}$ and $R_{902}$ being bonded with each other, represented by the formula (XY-81), means a ring formed by a carbon atom of the anthracene skeleton bonded with $R_{921}$, a carbon atom of the anthracene skeleton bonded with $R_{922}$, and one or more arbitrary elements. Specific examples include, when the ring A is formed by $R_{921}$ and $R_{922}$, a case where an unsaturated ring is formed of a carbon atom of an anthracene skeleton bonded with $R_{921}$, a carbon atom of the anthracene skeleton bonded with $R_{922}$, and four carbon atoms, in which a ring formed by $R_{921}$ and $R_{222}$ is formed into a benzene ring. Further, when a saturated ring is formed, the ring is formed into a cyclohexane ring.

Here, "arbitrary elements" are preferably a C element, a N element, an O element and a S element. In the arbitrary elements (for example, a case of the C element or the N element), the bond(s) that is(are) not involved in the formation of the ring may be terminated by a hydrogen atom, or may be substituted by an arbitrary substituent. Men the ring contains the arbitrary elements other than the C element, the ring to be formed is a heterocyclic ring.

The number of "one or more arbitrary elements" forming the saturated or unsaturated ring is preferably 2 or more and 15 or less, more preferably 3 or more and 12 or less, and further preferably 3 or more and 5 or less.

As specific examples of the aromatic hydrocarbon ring, a structure in which the aryl group described in specific example group G1 is terminated with a hydrogen atom may be mentioned.

As specific examples of the aromatic heterocyclic ring, a structure in which the aromatic heterocyclic group described in specific example group G2 is terminated with a hydrogen atom may be mentioned.

As specific examples of the aliphatic hydrocarbon ring, a structure in which the cycloalkyl group described in specific example group G6 is terminated with a hydrogen atom may be mentioned.

When the above-described "saturated or unsaturated ring" has a substituent, the substituent is an "arbitrary substituent" as described below, for example. When the above-mentioned "saturated or unsaturated ring" has a substituent, specific examples of the substituent refer to the substituents described in above-mentioned "the substituent described herein".

In one embodiment of this specification, the substituent (hereinafter, referred to as an "arbitrary substituent" in several cases) in the case of the "substituted or unsubstituted" is a group selected from the group consisting of an unsubstituted alkyl group including 1 to 50 carbon atoms, an unsubstituted alkenyl group including 2 to 50 carbon atoms, an unsubstituted alkynyl group including 2 to 50 carbon atoms, an unsubstituted cycloalkyl group including 3 to 50 ring carbon atoms, —Si($R_{901}$)($R_{902}$)($R_{900}$),

—O—($R_{904}$),

—S—($R_{905}$)

—N($R_{905}$)($R_{907}$)

wherein, $R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms; and when two or more of $R_{901}$ to $R_{900}$ exist, two or more of $R_{901}$ to $R_{907}$ may be the same as or different from each other, a halogen atom, a cyano group, a nitro group, an unsubstituted aryl group including 6 to 50 ring carbon atoms, and an unsubstituted monovalent heterocyclic group including 5 to 50 ring atoms.

In one embodiment, the substituent in the case of "substituted or unsubstituted" is a group selected from the group consisting of an alkyl group including 1 to 50 carbon atoms, an aryl group including 6 to 50 ring carbon atoms, and a monovalent heterocyclic group including 5 to 50 ring atoms.

In one embodiment, the substituent in the case of "substituted or unsubstituted" is a group selected from the group consisting of an alkyl group including 1 to 18 carbon atoms, an aryl group including 6 to 18 ring carbon atoms, and a monovalent heterocyclic group including 5 to 18 ring atoms.

Specific examples of each group of the arbitrary substituent described above are as described above.

In this specification, unless otherwise specified, the saturated or unsaturated ring (preferably substituted or unsubstituted and saturated or unsaturated five-membered or six-membered ring, more preferably a benzene ring) may be formed by the arbitrary substituents adjacent to each other.

In this specification, unless otherwise specified, the arbitrary substituent may further have the substituent. Specific examples of the substituent that the arbitrary substituent further has include to the ones same as the arbitrary substituent described above.

[Organic EL Device]

An organic electroluminescence device according to an aspect of the invention includes a cathode; an anode; and an organic layer disposed between the cathode and the anode. The organic layer includes an emitting layer and a first layer, wherein the first layer is disposed between the cathode and the emitting layer, the emitting layer contains a compound represented by the formula (A1); and the first layer contains a compound represented by the formula (B1). IDC-A3 Sub AMD Schematic configuration of organic EL device according to one aspect of the invention will be explained referring to the FIGURE.

The organic EL device 1 according to an aspect of the invention includes a substrate 2, an anode 3, an emitting layer 5 as an organic layer, a cathode 10, an organic layer 4 between the anode 3 and the emitting layer 5, and an organic layer 6 between the emitting layer 5 and the cathode 10.

Each of the organic layer 4 and the organic layer 6 may be a single layer or may consist of a plurality of layers.

The first layer is arranged between the cathode 10 and the emitting layer 5, i.e. in the organic layer 6. The first layer has, for example, the function of an electron-transporting layer. When the organic layer 6 is composed of a plurality of layers, the first layer may be any of the plurality of layers. In addition to the first layer, the organic layer 6 may also include one or more layers containing a compound represented by the formula (B1).

The compound represented by the formula (A1) is contained in the emitting layer 5 between the anode 3 and the cathode 10.

The compound represented by the formula (B1) is contained in the first layer which is disposed between the cathode 10 and the emitting layer 5.

In one embodiment, the first layer may be directly adjacent to the emitting layer 5 or may not be directly adjacent to the emitting layer 5. For example, a second layer may be present between the emitting layer and the first layer. In this case, the emitting layer, the second layer, and the first layer are formed directly adjacent one another in this order, and the first layer and the second layer may independently comprise a compound represented by the formula (B1).

In one embodiment, the organic EL device further comprises a third layer, wherein the third layer is disposed between the anode 3 and the emitting layer 5, i.e. in the organic layer 4, and the third layer is directly adjacent to the emitting layer 5. The third layer has, for example, the function of a hole-transporting layer. The third layer may be directly adjacent to the emitting layer 5 or may not be directly adjacent to the emitting layer 5.

In one embodiment, a compound represented by the formula (C1) or (D1) is contained in the third layer, which is disposed between the anode 3 and the emitting layer 5, and adjacent to the emitting layer 5. Provided that the organic layer 4 may include a layer such as a hole-transporting layer in addition to the third layer. When the organic layer 4 has a plurality of layers, the layer directly adjacent to the emitting layer 5 may be referred to as an electron barrier layer.

Hereinafter, the compounds represented by each of the formulas (A1), (B1), (C1) and (D1) will be described.

(Compound Represented by the Formula (A1))

The compound represented by the following formula (A1) is contained in the emitting layer.

(A1)

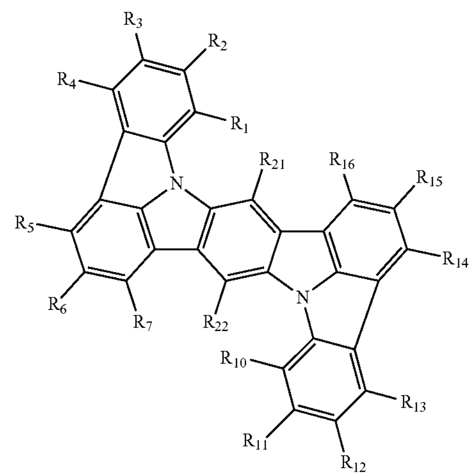

In the formula (A1), one or more sets of adjacent two or more of $R_1$ to $R_7$ and $R_{10}$ to $R_{16}$ form a substituted or unsubstituted, saturated or unsaturated ring by bonding with each other, or do not form a substituted or unsubstituted, saturated or unsaturated ring;

$R_1$ to $R_7$ and $R_{10}$ to $R_{16}$ which do not form the substituted or unsubstituted, saturated or unsaturated ring, and $R_{21}$ and $R_{22}$ are independently a hydrogen atom or a substituent.

The substituent is a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —$Si(R_{901})(R_{902})(R_{903})$,

—O—$(R_{904})$,

—S—$(R_{905})$,

—$N(R_{906})(R_{907})$, a halogen atom, a cyano group, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{907}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When two or more of each of $R_{901}$ to $R_{907}$ are present, the two or more of each of $R_{901}$ to $R_{907}$ may be the same or different.

Provided that the formula (A1) satisfies one or both of the following requirements (i) and (ii).

(i) One or more sets of adjacent two or more of $R_1$ to $R_7$ and $R_{10}$ to $R_{16}$ form a substituted or unsubstituted, saturated or unsaturated ring by bonding with each other.

(ii) One or more of $R_1$ to $R_7$, $R_{10}$ to $R_{16}$, $R_{21}$ and $R_{22}$ is the substituent.

Since an electron-transporting layer using the compound represented by the formula (B1) can suppress the amount of electron injection to be low, it is considered that a device using the compound has a long lifetime. However, when the energy transfer efficiency between the host and dopant used in the emitting layer in the device is low, such characteristics of the compound represented by the formula (B1) are not sufficiently exhibited.

Conventionally, a device in which a compound having no substituent or no fused ring structure in the central skeleton of the compound represented by the formula (A1) is combined with a compound represented by the formula (B1) has been known. However, since such a compound having no substituent or no fused ring structure in the central skeleton of the compound represented by the formula (A1) has strong intermolecular interaction and a short emitting wavelength, and the energy transfer efficiency from the host used in the light emitting layer is low, so that the effect of the compound represented by the formula (B1) was not sufficiently obtained.

In one embodiment of the invention, the compound having a substituent or a fused ring structure in the central skeleton represented by the formula (A1) is used in the emitting layer. The compound represented by the formula (A1) in which the intermolecular interaction is suppressed and which has a proper emitting wavelength range. As a result, it is considered that the compound represented by the formula (B1) exhibit sufficient effect of prolonging lifetime In one embodiment, the compound represented by the formula (A1) satisfies only the requirement (i).

In one embodiment, the compound represented by the formula (A1) satisfies only the requirement (ii).

In one embodiment, the compound represented by the formula (A1) satisfies the requirements (i) and (ii).

In one embodiment, one or more of $R_1$ to $R_7$ and $R_{10}$ to $R_{16}$ in the formula (A1) is —N($R_{905}$)($R_{907}$).

In one embodiment, two or more of $R_1$ to $R_7$ and $R_{10}$ to $R_{16}$ in the formula (A1) are —N($R_{906}$)($R_{907}$).

In one embodiment, the compound represented by the formula (A1) is a compound represented by the following formula (A10).

(A10)

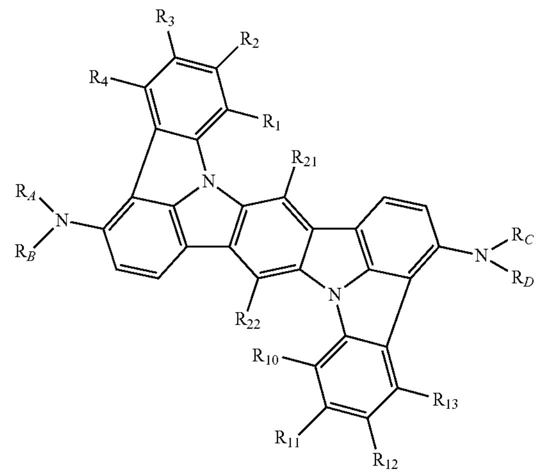

In the formula (A10), $R_1$ to $R_4$, $R_{10}$ to $R_{13}$, $R_{21}$ and $R_{22}$ are as defined in the formula (A1).

$R_A$, $R_B$, $R_C$ and $R_D$ are independently a substituted or unsubstituted aryl group including 6 to 18 ring carbon atoms, or a substituted or unsubstituted monovalent heterocyclic group including 5 to 18 ring atoms.

In one embodiment, the compound represented by the formula (A10) is a compound represented by the following formula (A11).

(A11)

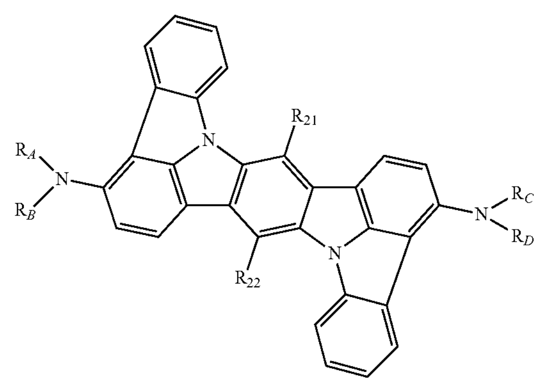

In the formula (A11), $R_{21}$, $R_{22}$, $R_A$, $R_B$, $R_C$ and $R_D$ are as defined in the formula (A10).

In one embodiment, $R_A$, $R_B$, $R_C$ and $R_D$ in the formula (A11) are independently a substituted or unsubstituted aryl group including 6 to 18 ring carbon atoms.

In one embodiment, $R_A$, $R_B$, $R_C$ and $R_D$ are independently a substituted or unsubstituted phenyl group.

In one embodiment, one or more sets selected from the group consisting of $R_1$ and $R_2$, $R_2$ and $R_3$, $R_3$ and $R_4$, $R_{10}$ and $R_{11}$, $R_{11}$ and $R_{12}$, and $R_{12}$ and $R_{13}$ in the formula (A1) form a ring represented by the following formula (X).

(X)

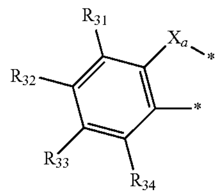

In the formula (X), two *'s are respectively bonded to $R_1$ and $R_2$, $R_2$ and $R_3$, $R_3$ and $R_4$, $R_{10}$ and $R_{11}$, $R_{11}$ and $R_{12}$ or $R_{12}$ and $R_{13}$ in the formula (A1).

$X_a$ is selected from the group consisting of O, S and $N(R_{35})$, and when two or more $X_a$'s are present, the plurality of $X_a$'s may be the same as or different from each other.

$R_{35}$ forms a substituted or unsubstituted, saturated or unsaturated ring by bonding with $R_{31}$, or does not form the ring.

$R_{31}$ which does not form the ring with $R_{35}$, and $R_{32}$ to $R_{34}$ are independently a hydrogen atom, a substituted or unsubstituted alkyl group including 1 to 50 carbon atoms, or a substituted or unsubstituted aryl group including 6 to 50 ring carbon atoms.

$R_{35}$ which does not form the ring is a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

In one embodiment, the compound represented by the formula (A1) is a compound represented by the following formula (A12).

(A12)

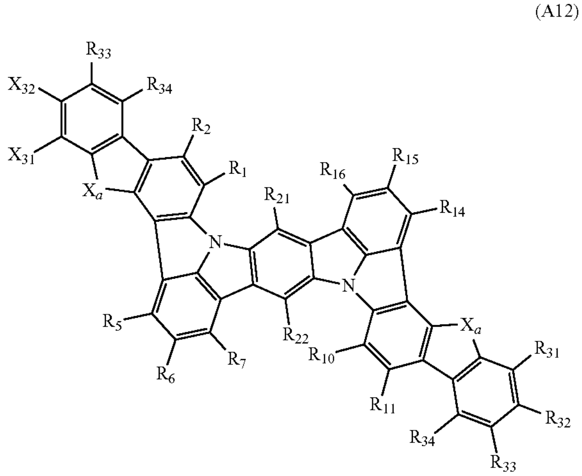

In the formula (A12), $R_1$, $R_2$, $R_5$ to $R_7$, $R_{10}$, $R_{11}$, $R_{14}$ to $R_{16}$, $R_{21}$, $R_{22}$, $R_{31}$ to $R_{34}$ and $X_a$ are as defined in the formula (A1) or the formula (X).

In one embodiment, the compound represented by the formula (A1) is a compound represented by the following formula (A13).

(A13)

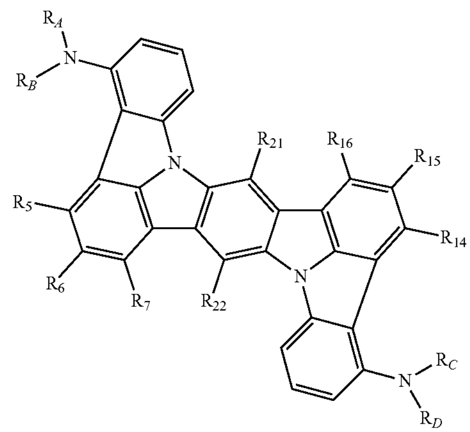

In the formula (A13), $R_5$ to $R_7$, $R_{14}$ to $R_{16}$, $R_{21}$, $R_{22}$, $R_A$, $R_B$, $R_C$ and $R_D$ are as defined in the formula (A1) or formula (A10).

In one embodiment, the compound represented by the formula (A13) is a compound represented by the following formula (A14).

(A14)

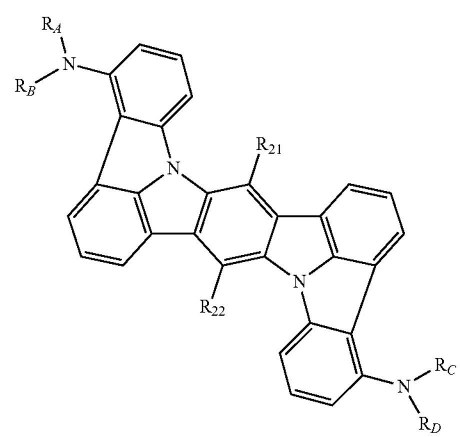

In the formula (A14), $R_{21}$, $R_{22}$, $R_A$, $R_B$, $R_C$ and $R_D$ are as defined in the formula (A1) or formula (A10).

In one embodiment, the compound represented by the formula (A1) is a compound represented by the following formula (A15).

(A15)

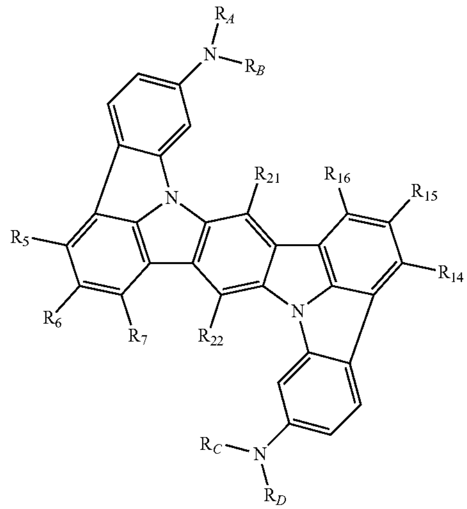

In the formula (A15), $R_5$ to $R_7$, $R_{14}$ to $R_{16}$, $R_{21}$, $R_{22}$, $R_A$, $R_B$, $R_C$ and $R_D$ are as defined in the formula (A1) or formula (A10).

In one embodiment, the compound represented by the formula (A15) is a compound represented by the following formula (A16).

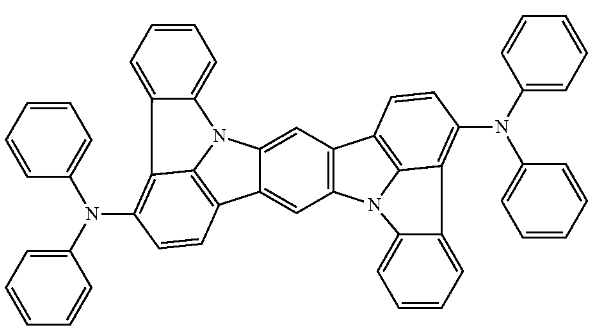

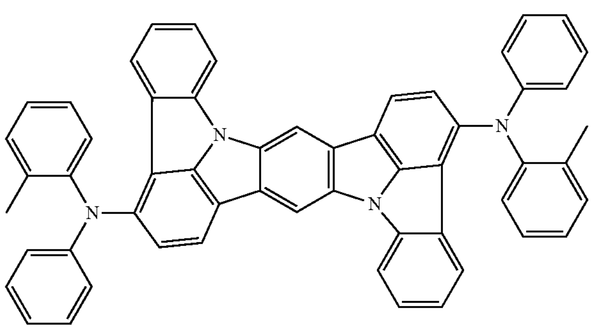

(A16)

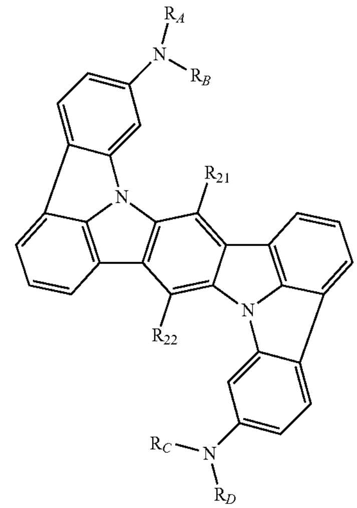

In the formula (A16), $R_{21}$, $R_{22}$, $R_A$, $R_B$, $R_C$ and $R_D$ are as defined in the formula (A1) or formula (A10).

In one embodiment, $R_{21}$ and $R_{22}$ in the formula (A1) are hydrogen atoms.

Details of each substituent in the above formulas, and each substituent in the case of "substituted or unsubstituted" are as defined in the section of [Definition] of this specification.

The compound represented by the formula (A1) can be synthesized in accordance with Synthesis Examples described below by using known alternative reactions or raw materials tailored to the target compound.

Specific examples of the compound represented by the formula (A1) include the following compounds. In the following specific examples, "Ph" represents a phenyl group, and "D" represents a deuterium atom.

-continued
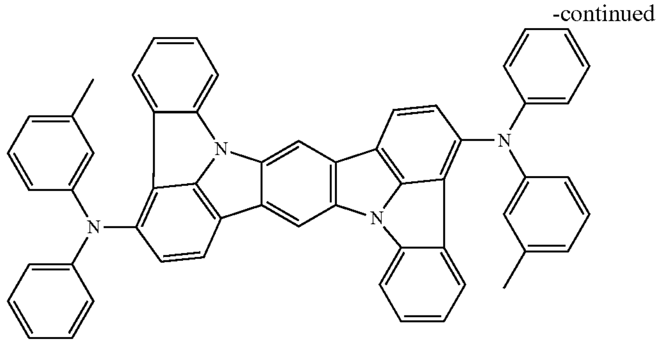
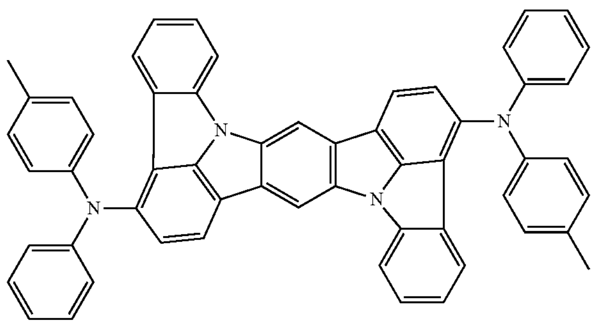
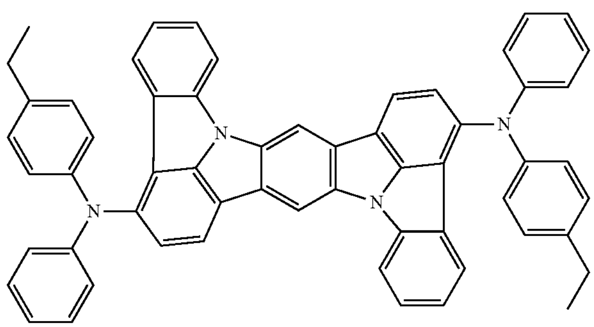
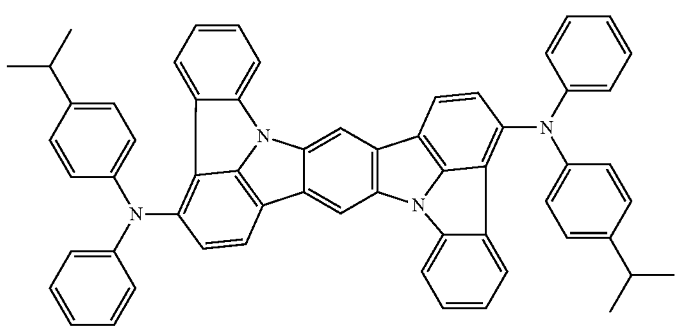
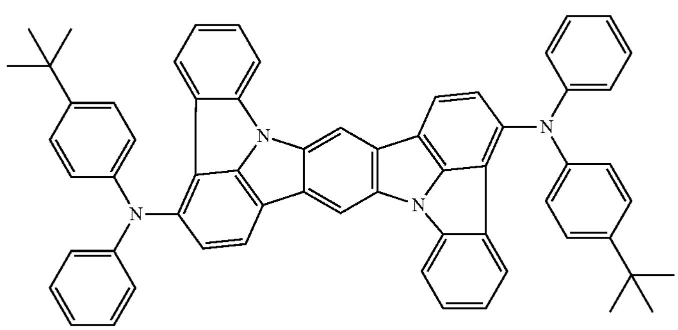

-continued
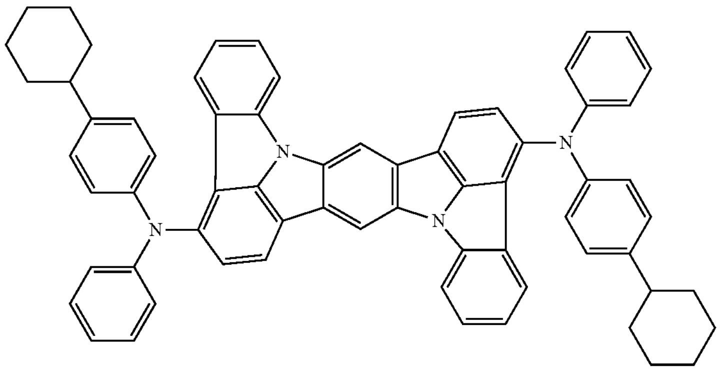
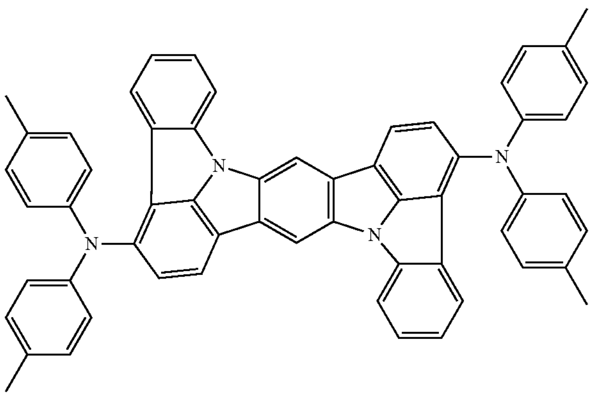
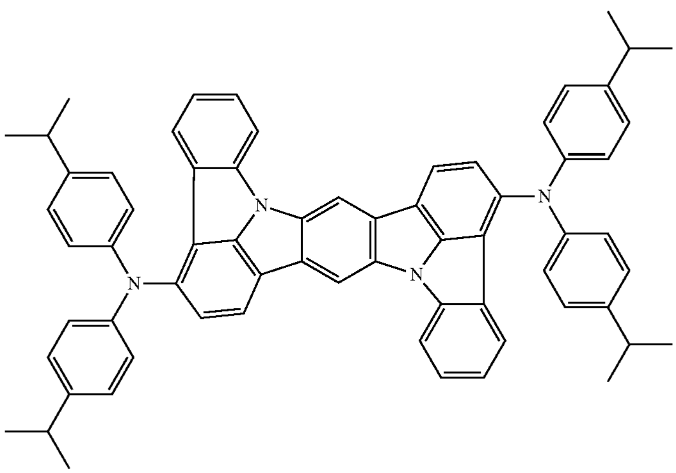
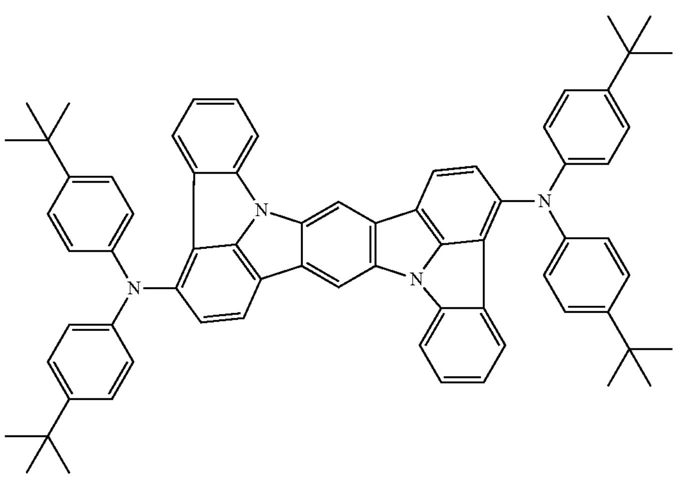

-continued
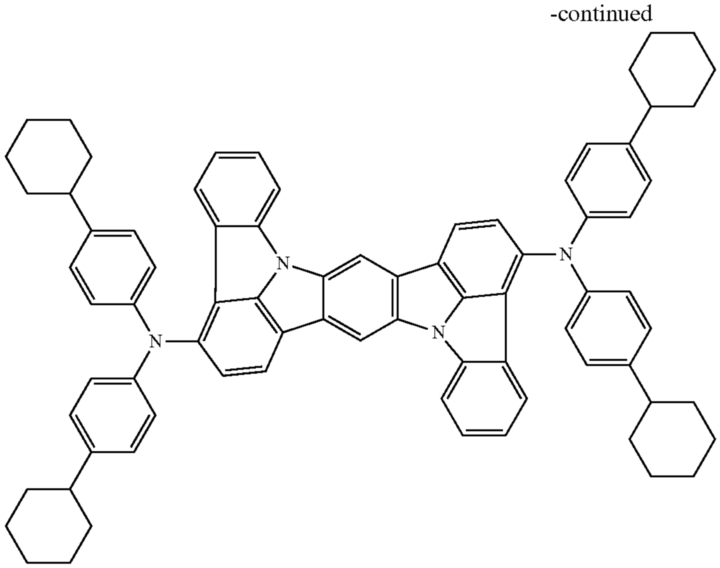
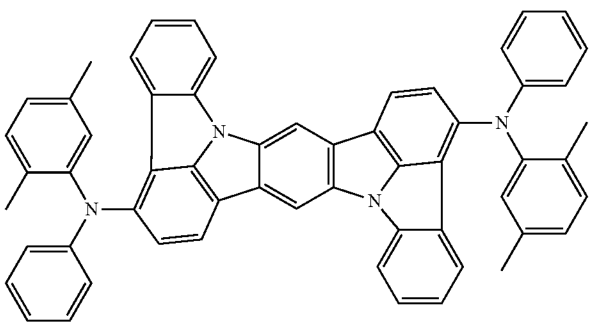
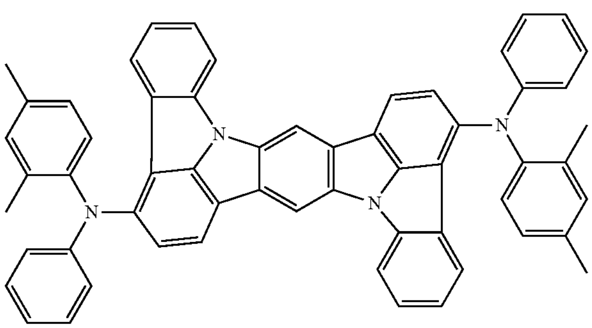
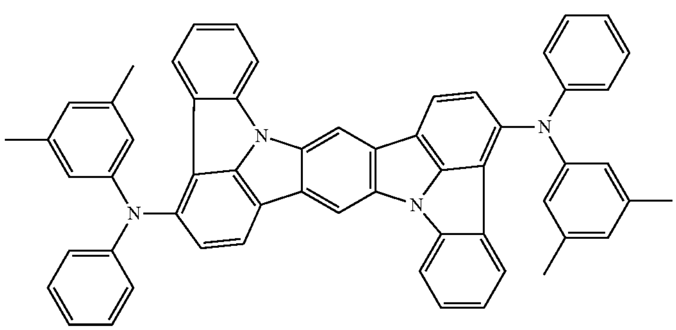

-continued
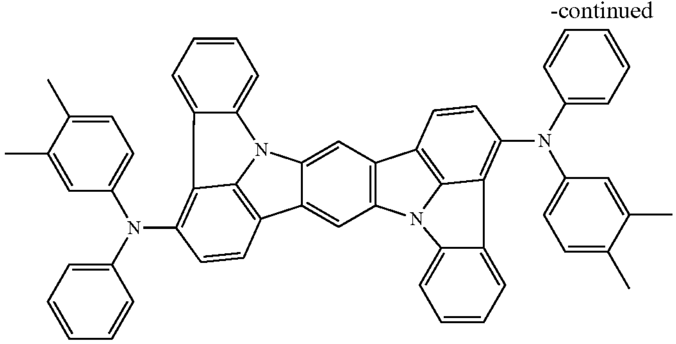
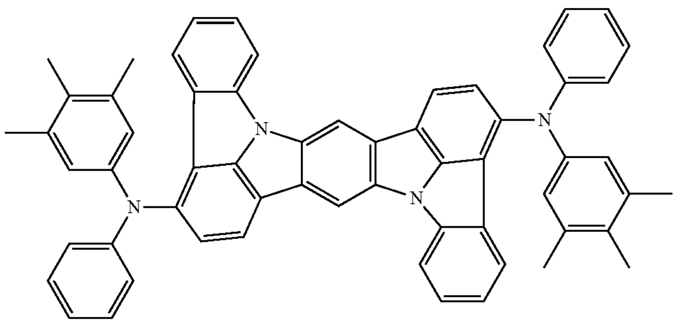
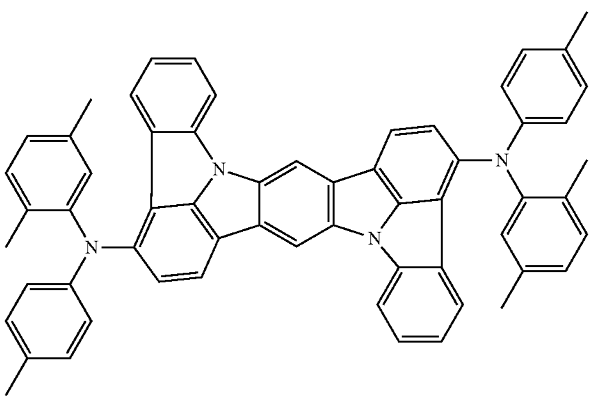
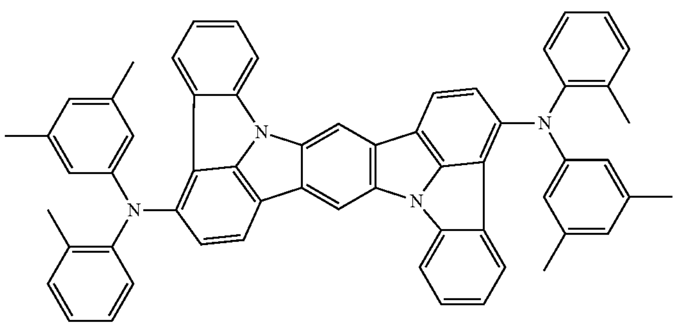
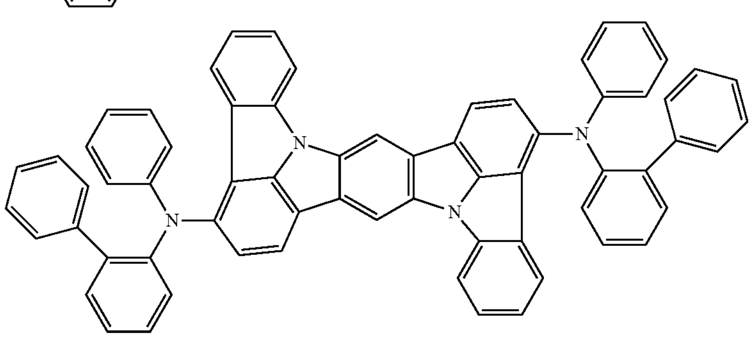

-continued
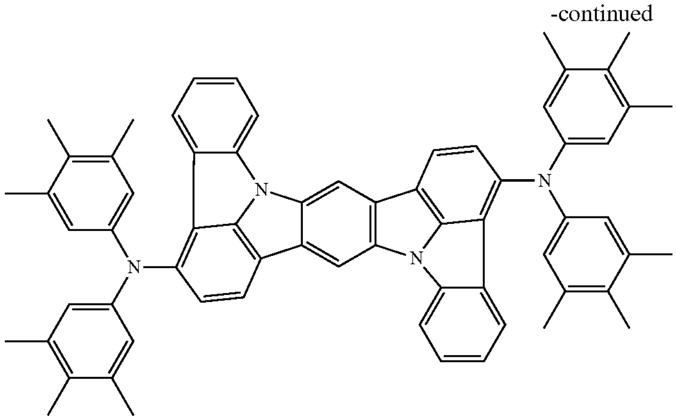
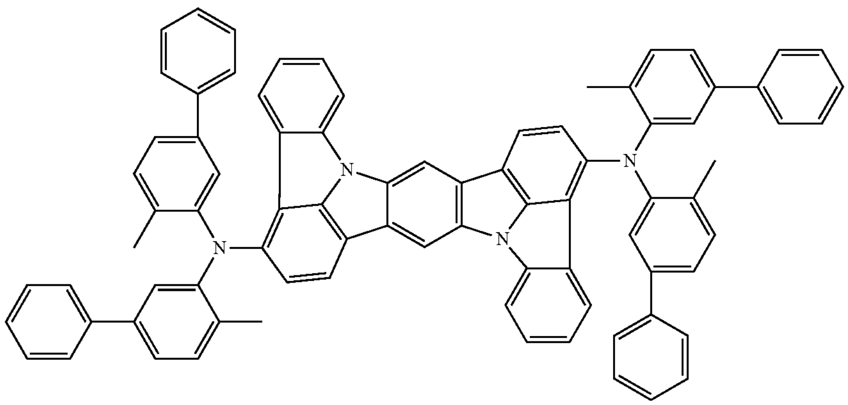
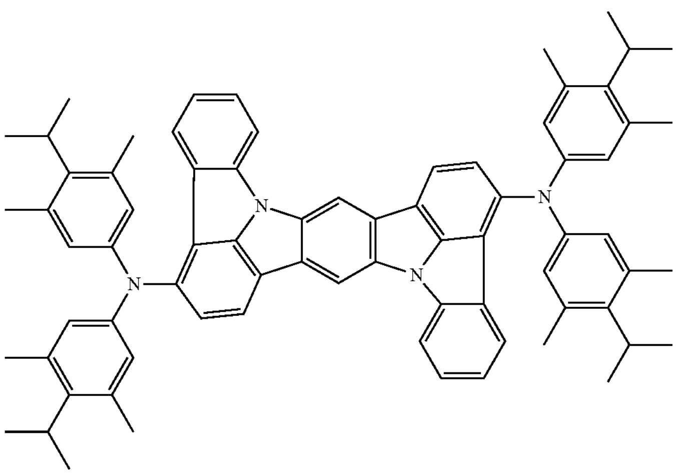
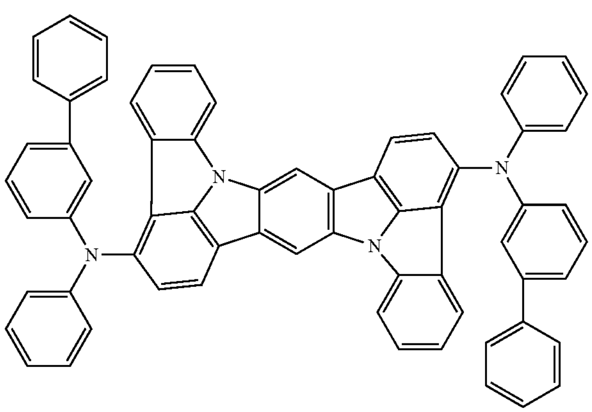

-continued
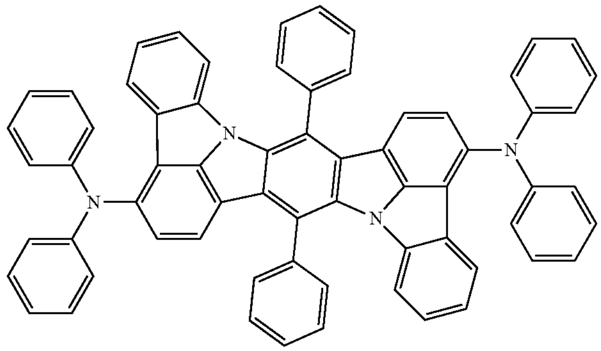
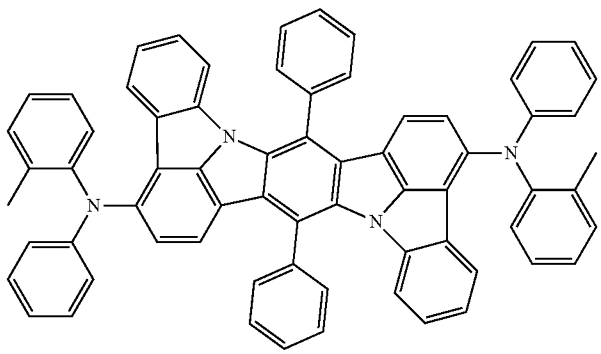
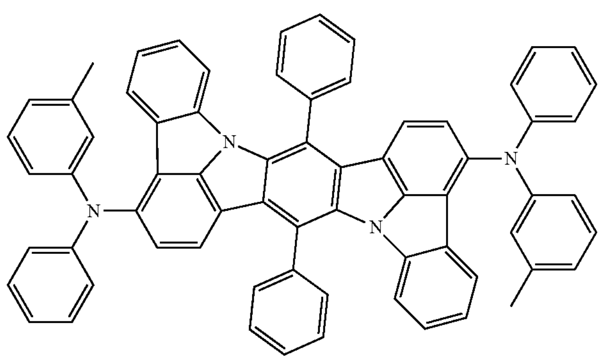
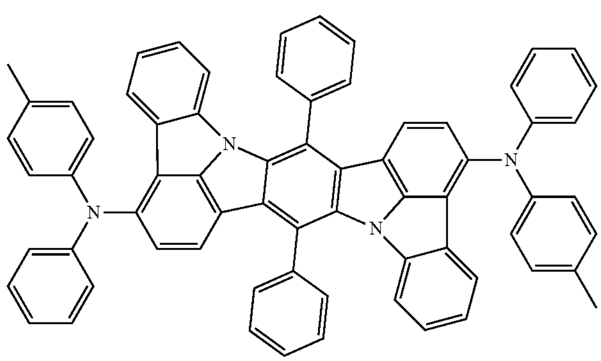

-continued
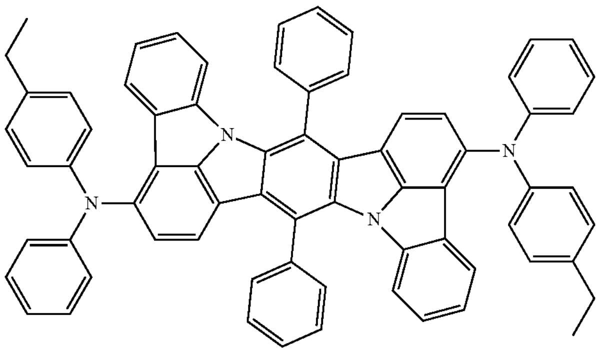
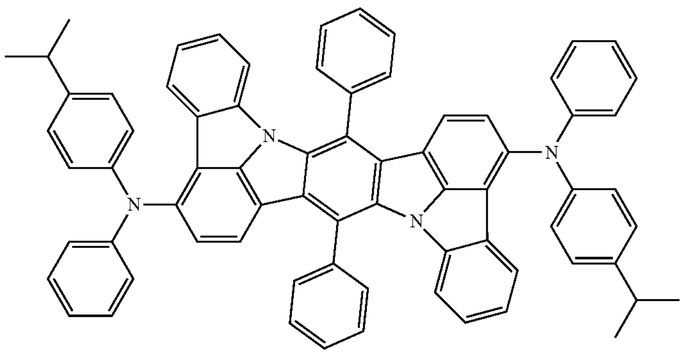
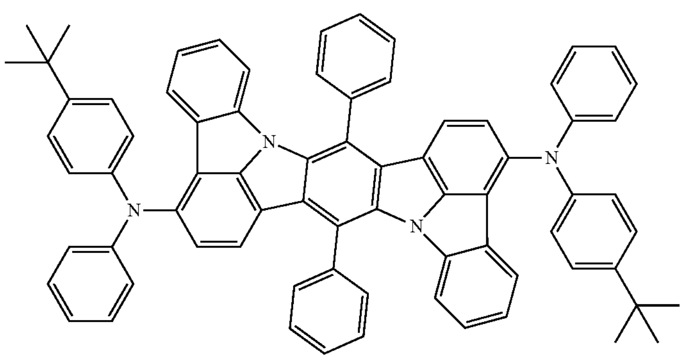
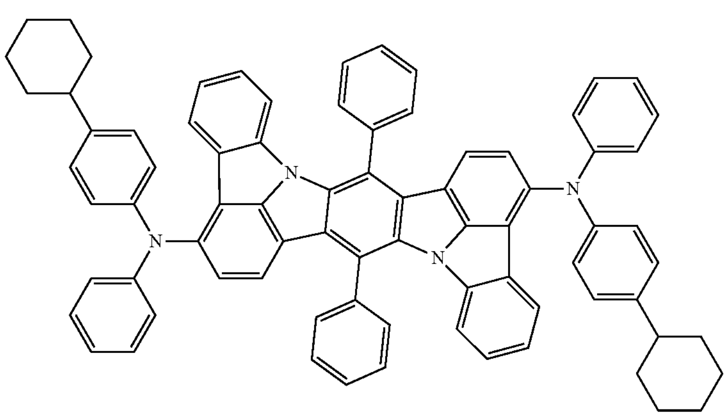

-continued
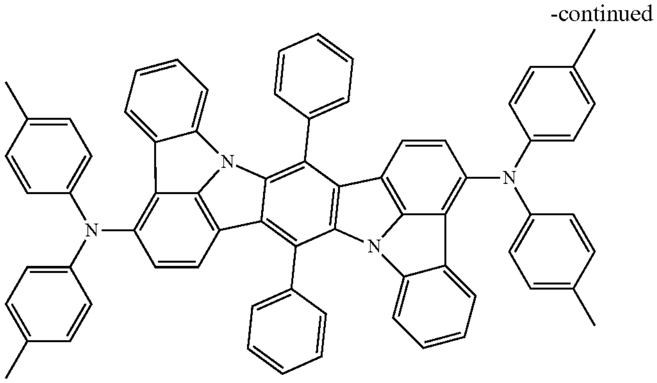
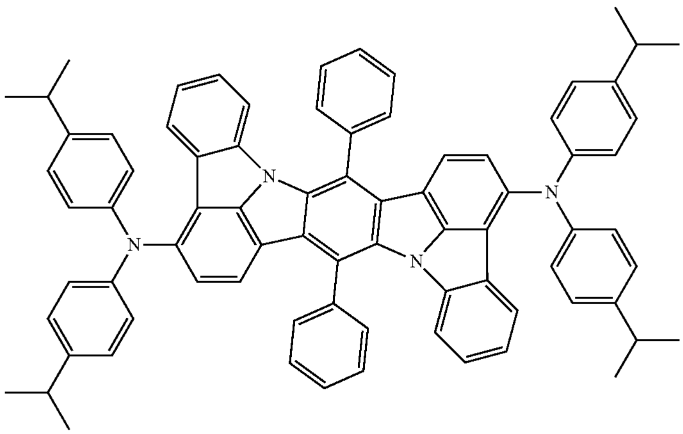
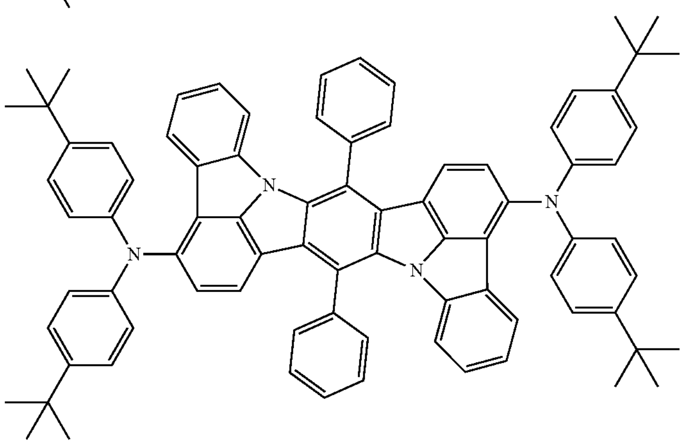
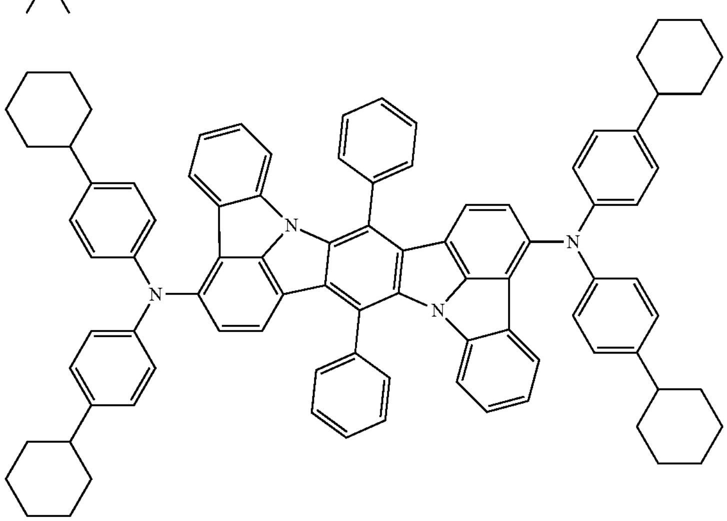

-continued
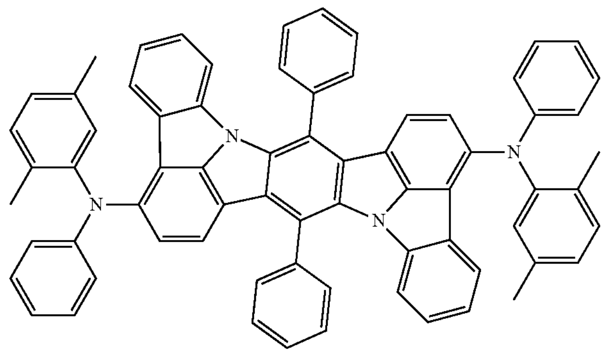
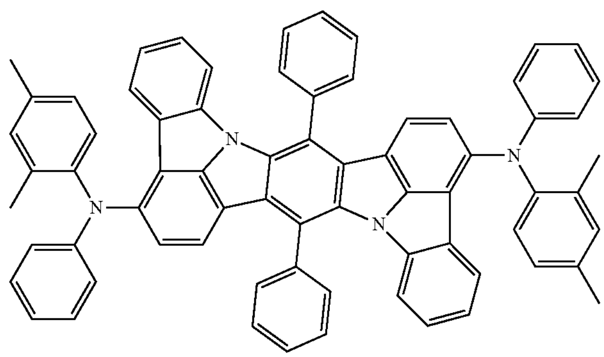
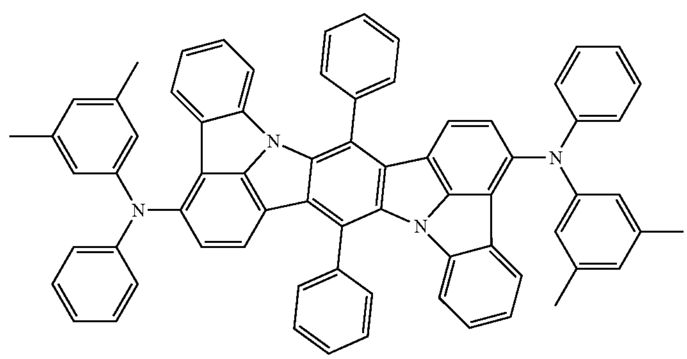
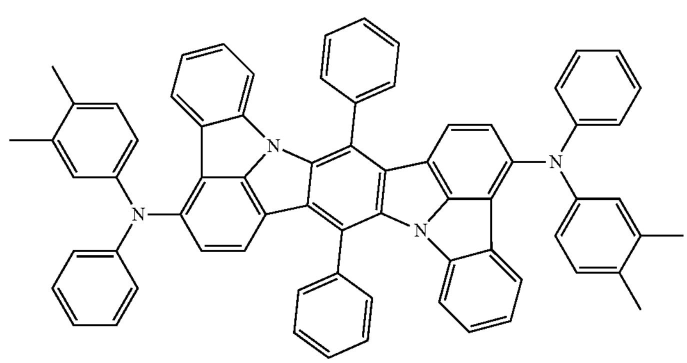

-continued
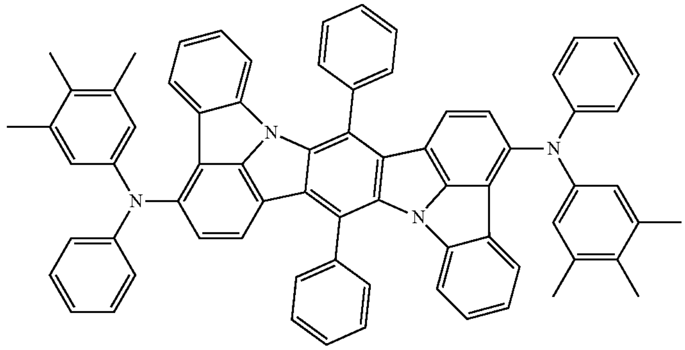
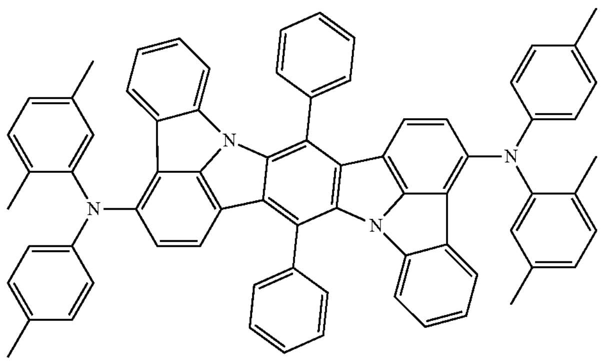
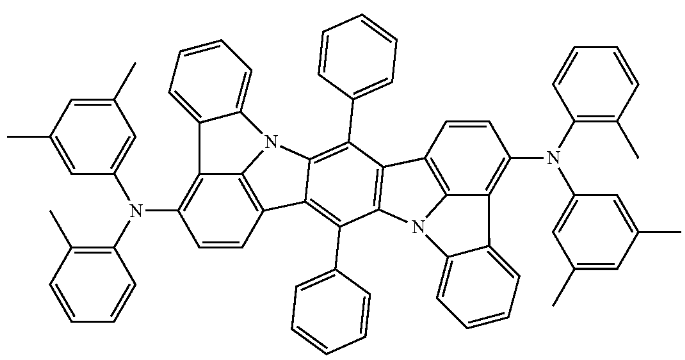
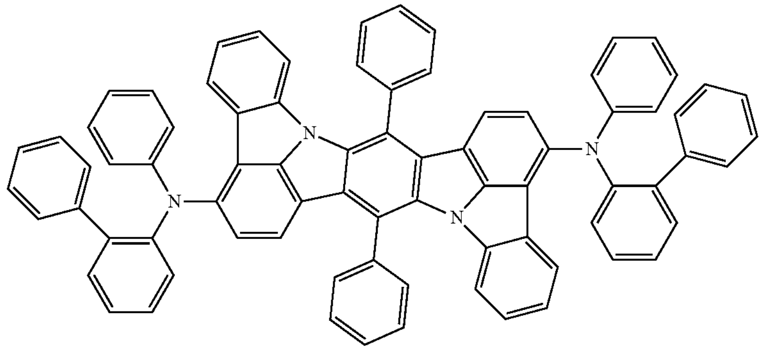

-continued
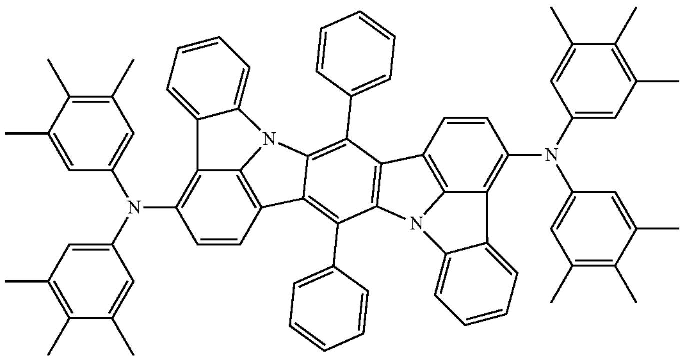
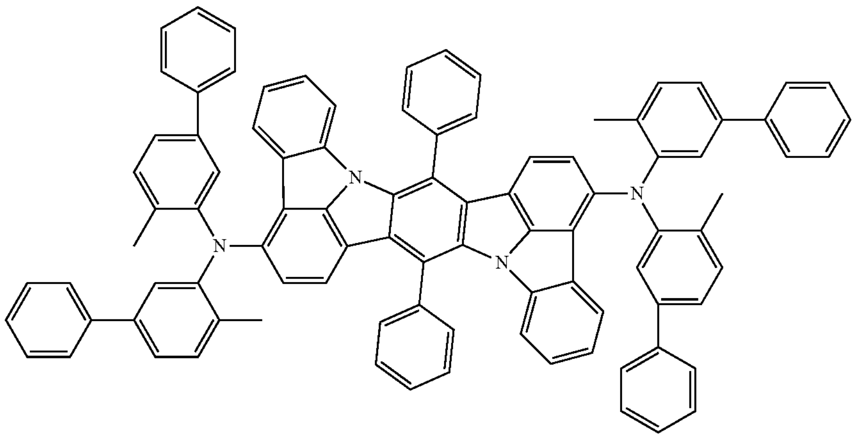
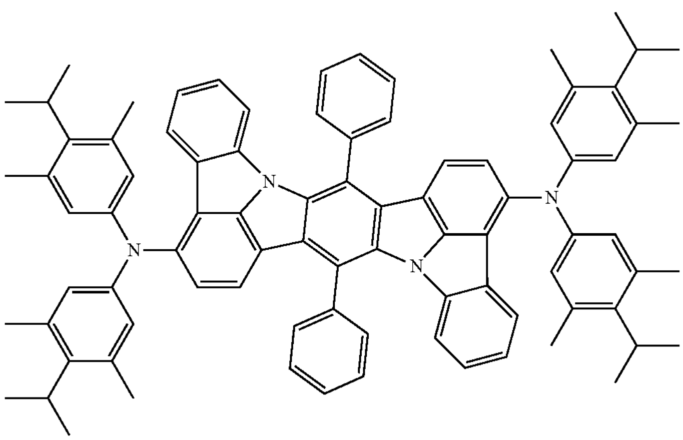
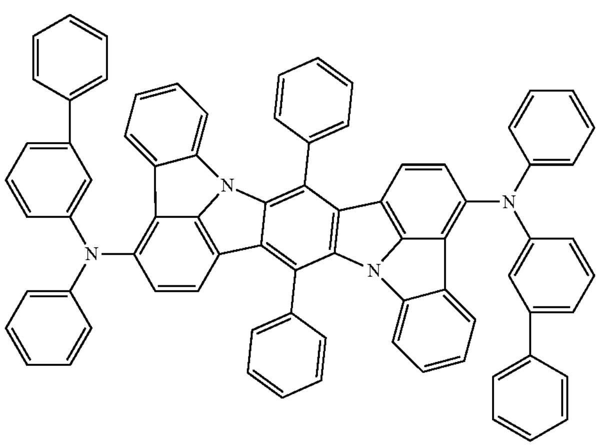

-continued
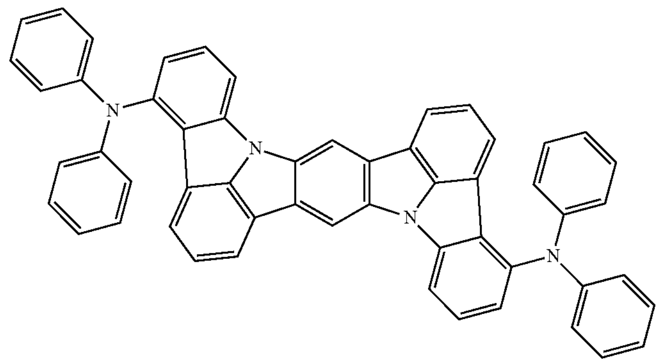
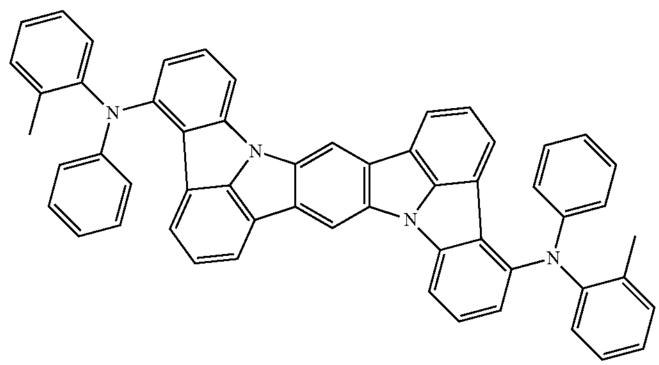
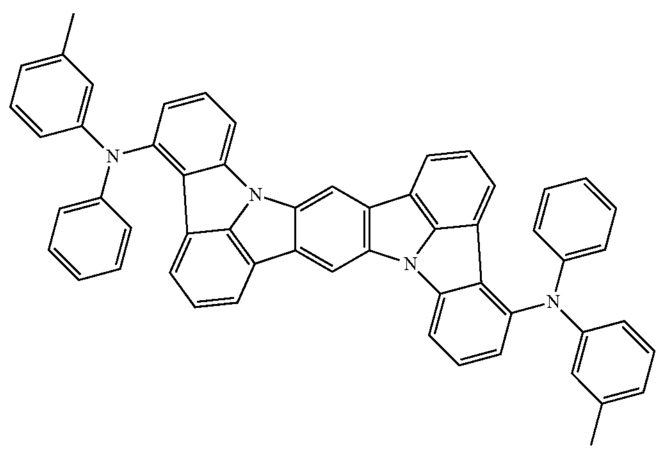
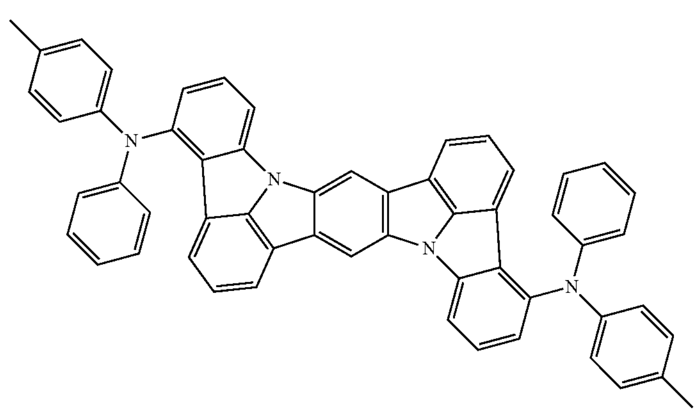

-continued
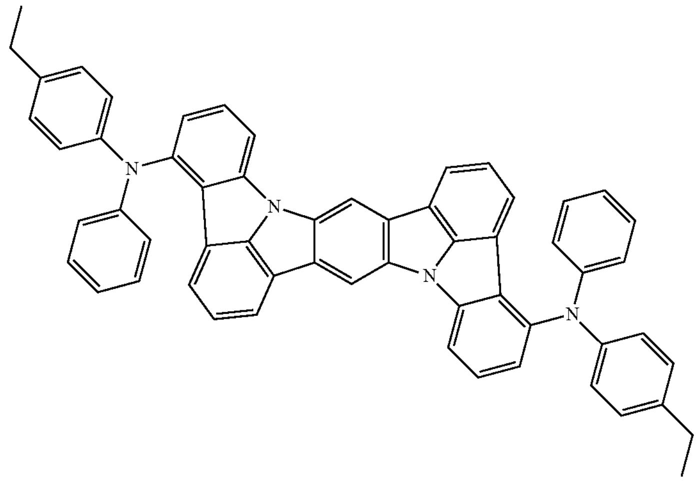
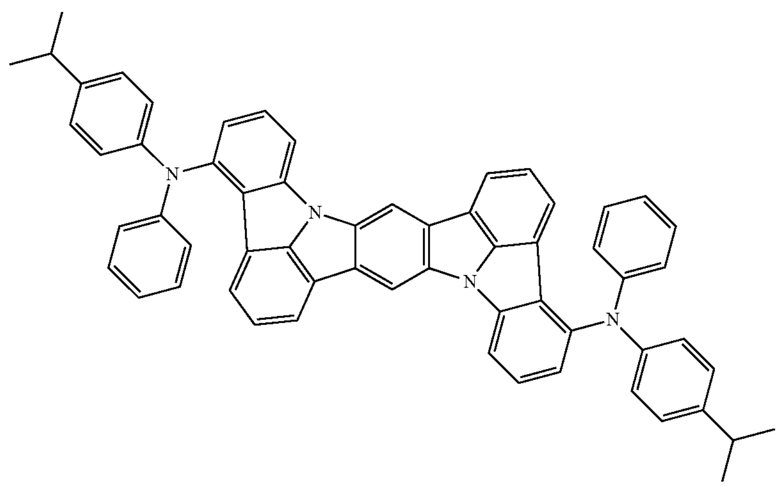
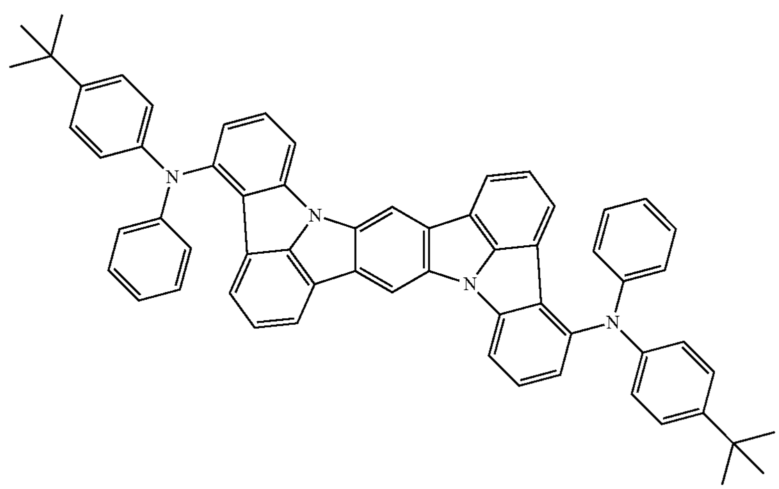

-continued
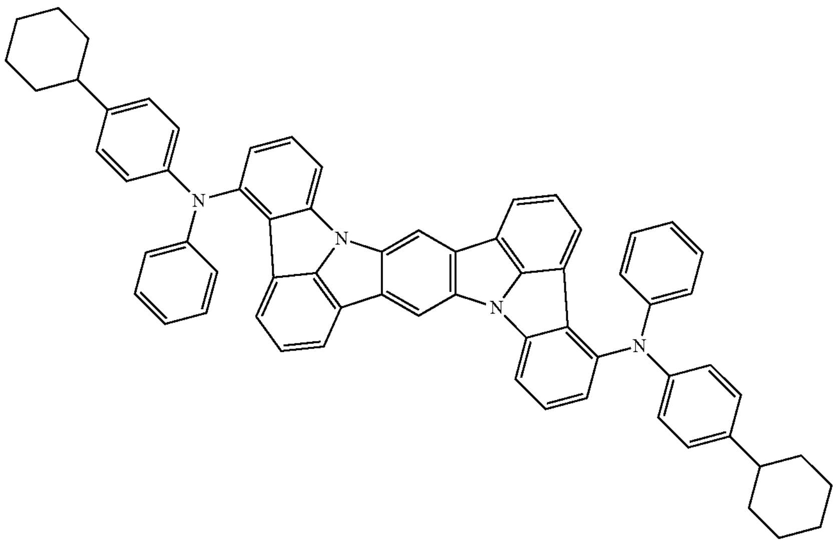
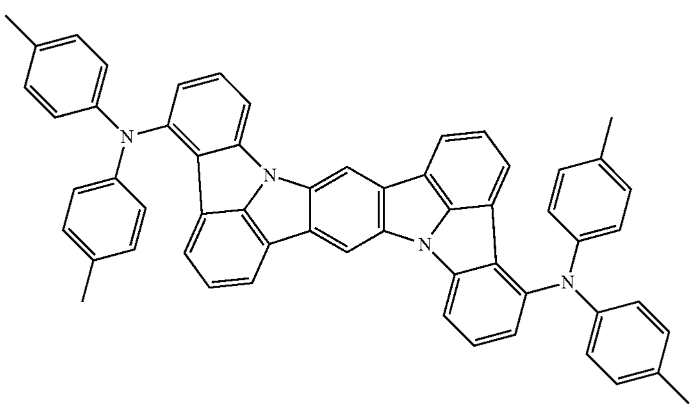
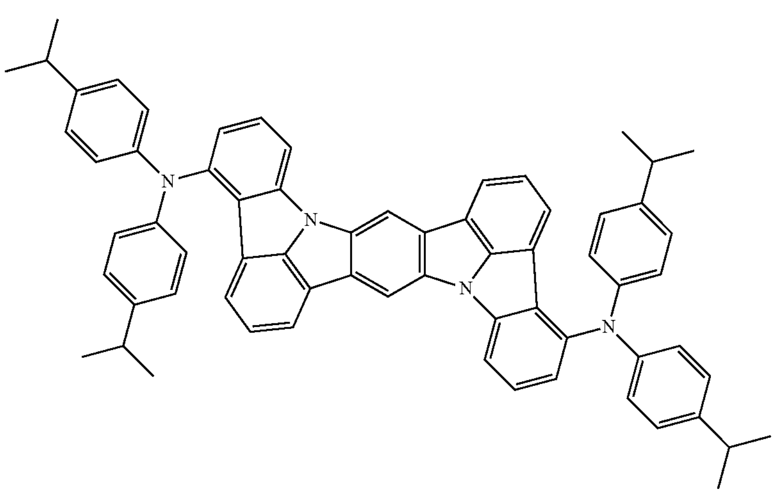

-continued
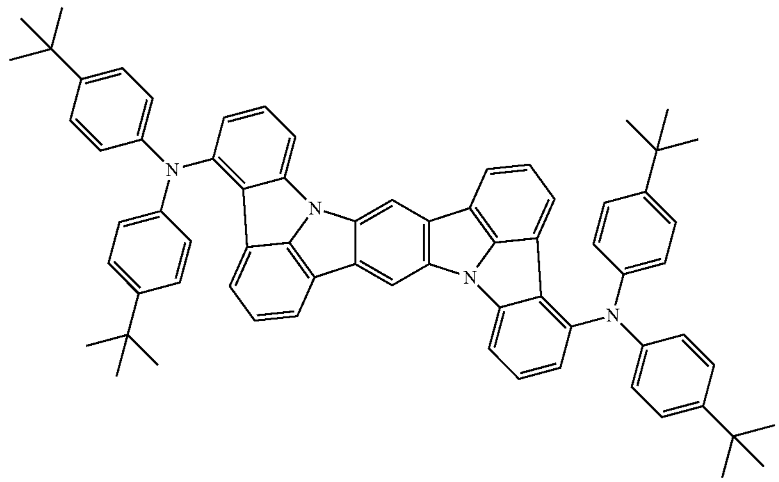
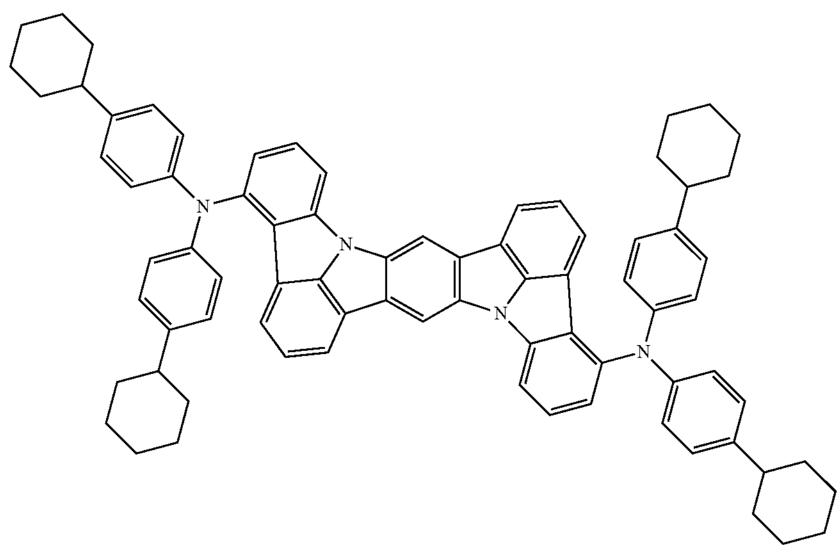
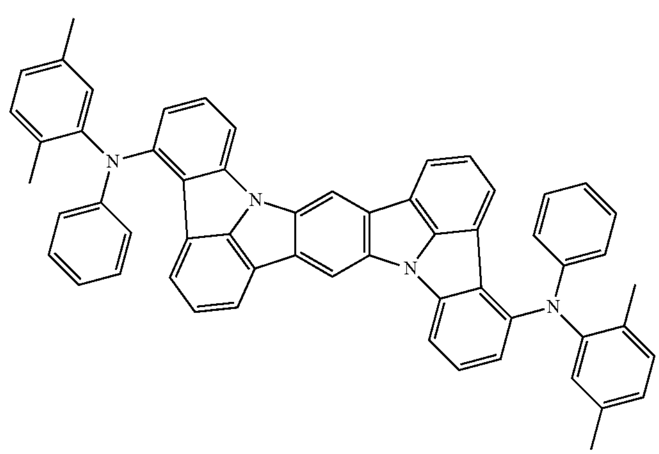

-continued
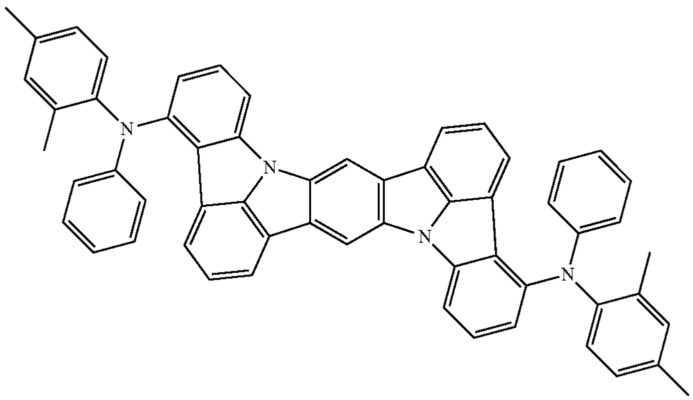
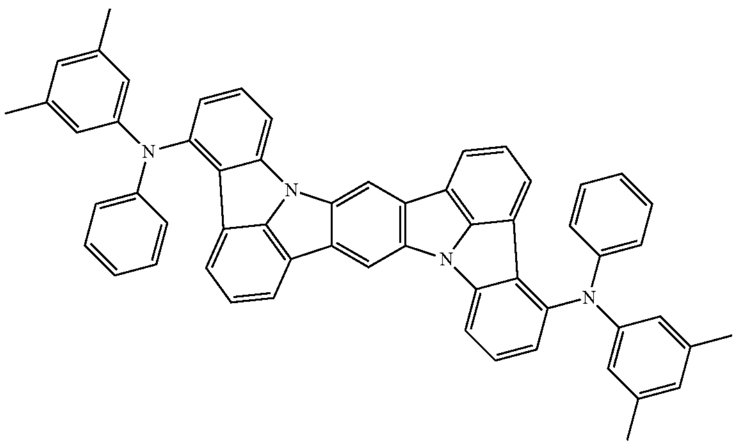
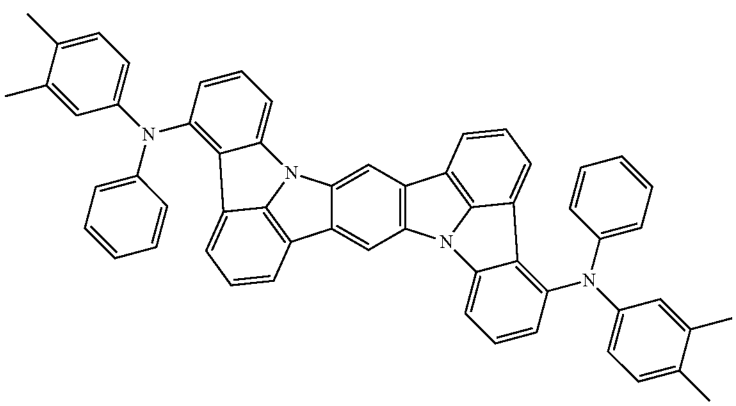
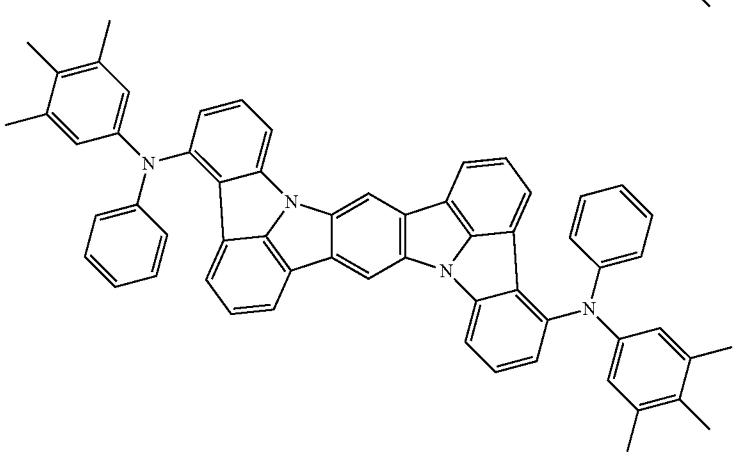

-continued
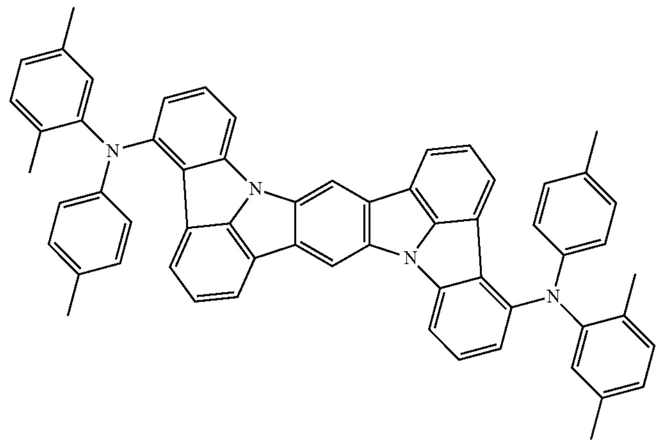
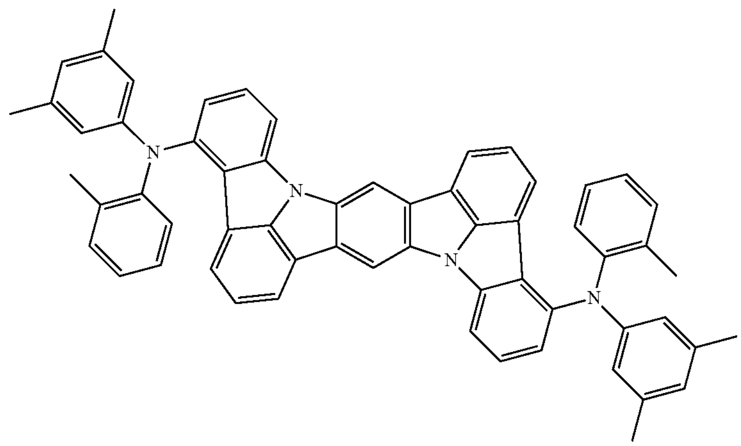
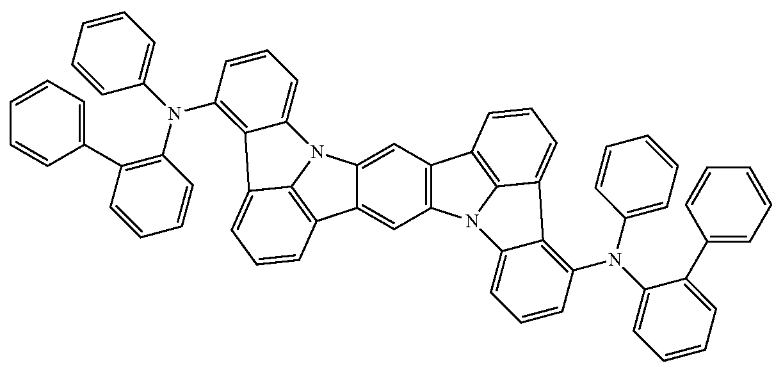
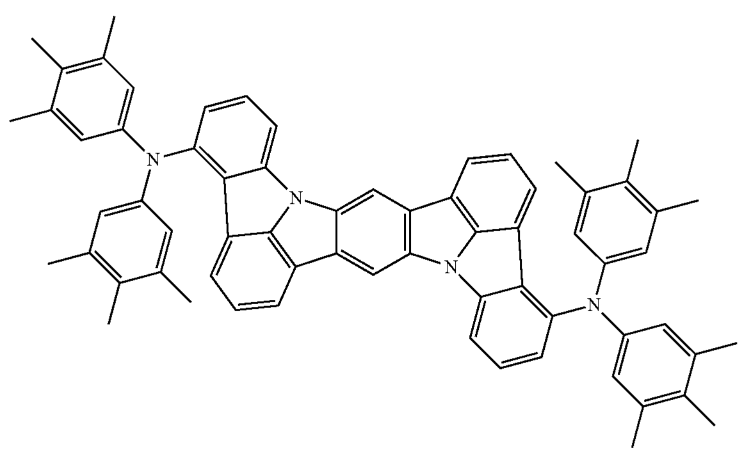

-continued
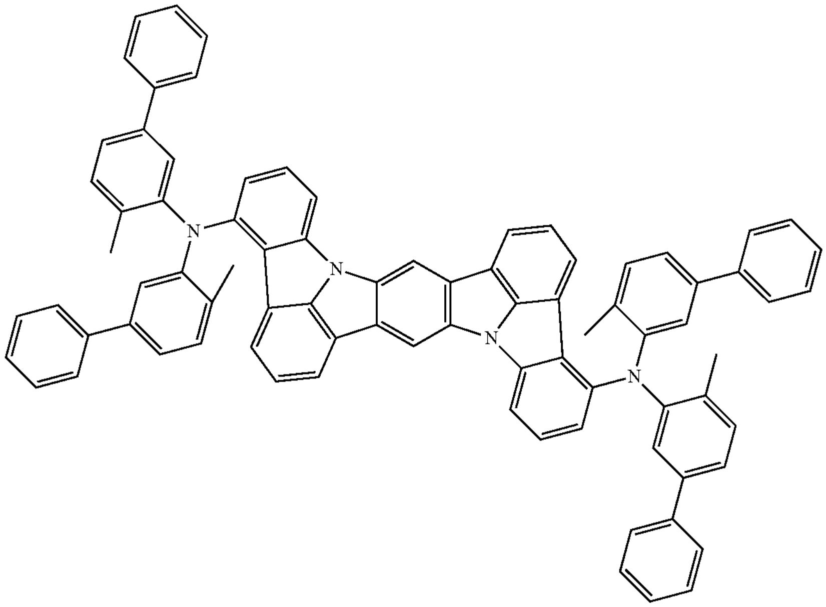
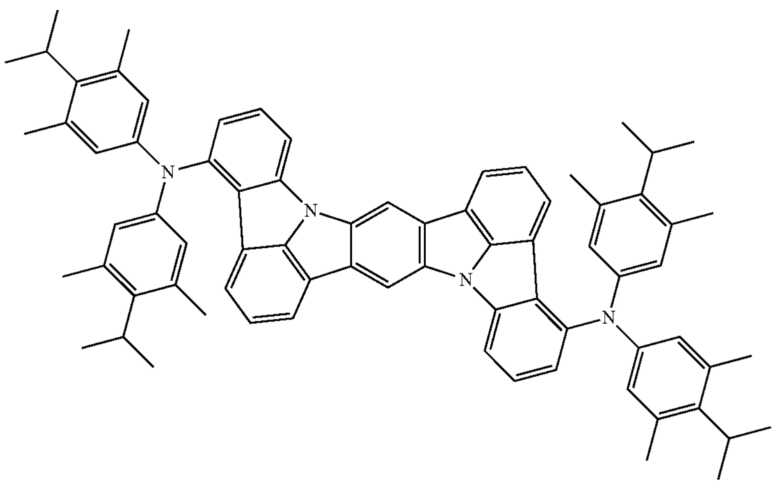
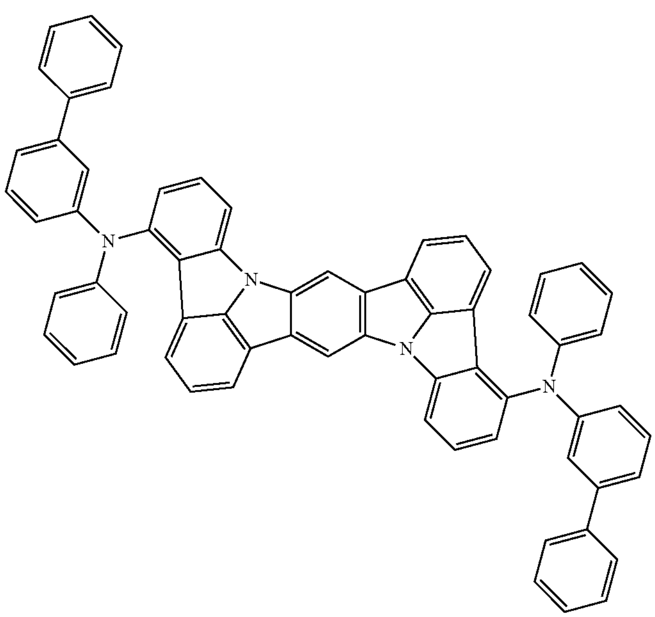

-continued
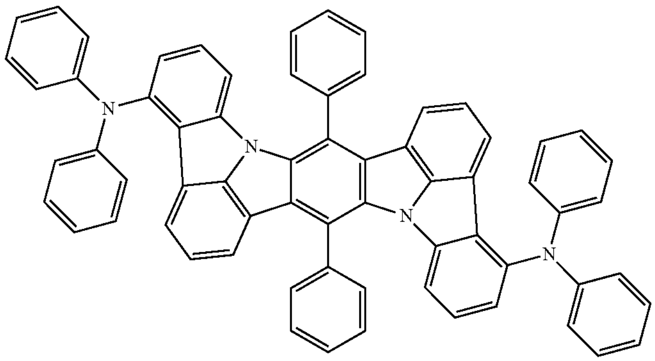
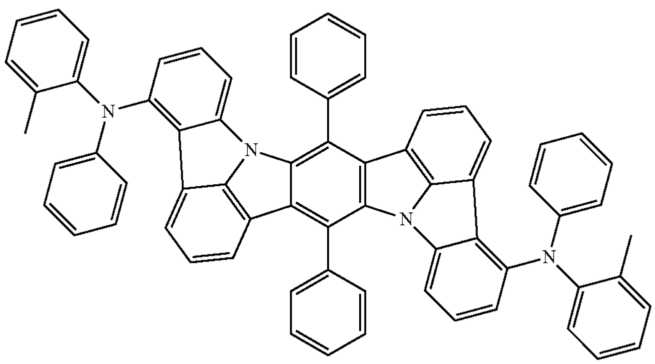
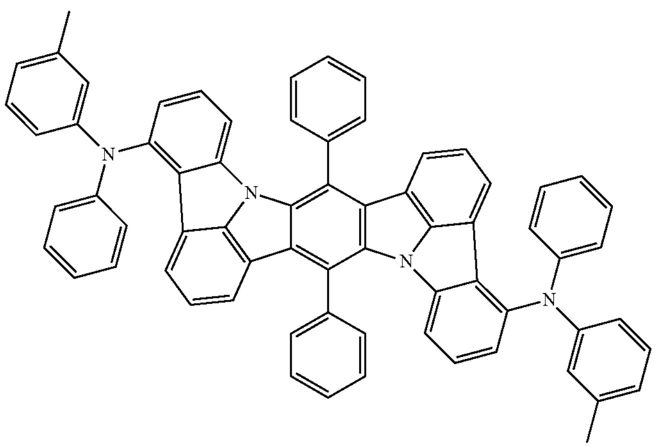
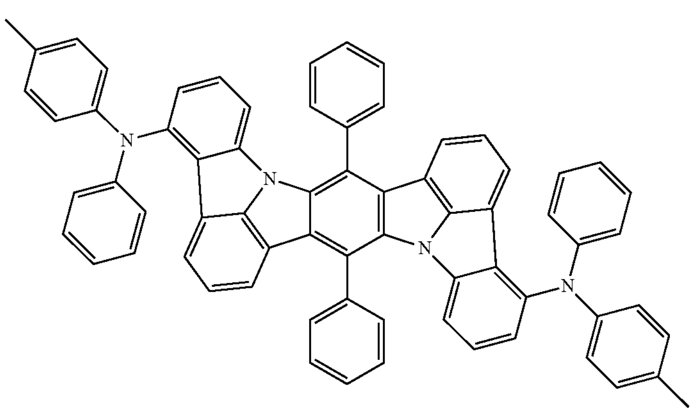

-continued
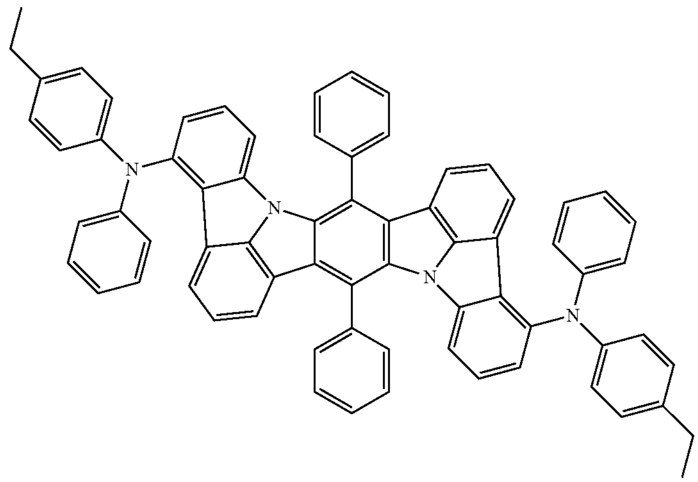
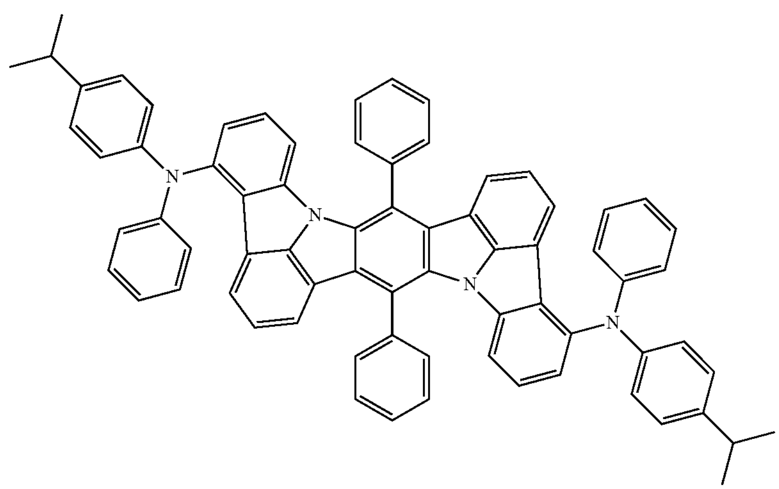
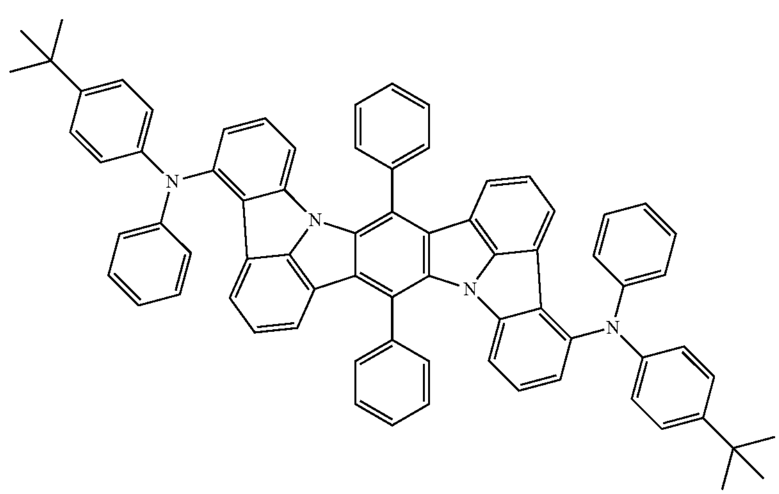

-continued
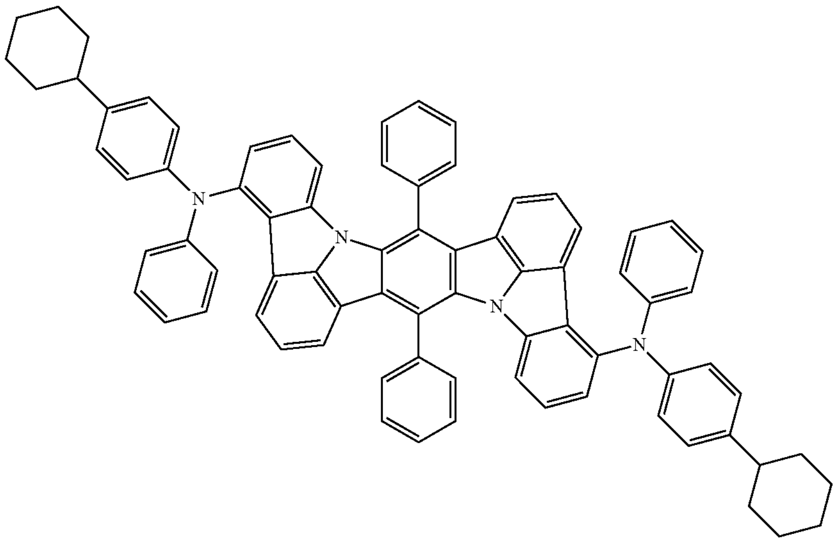
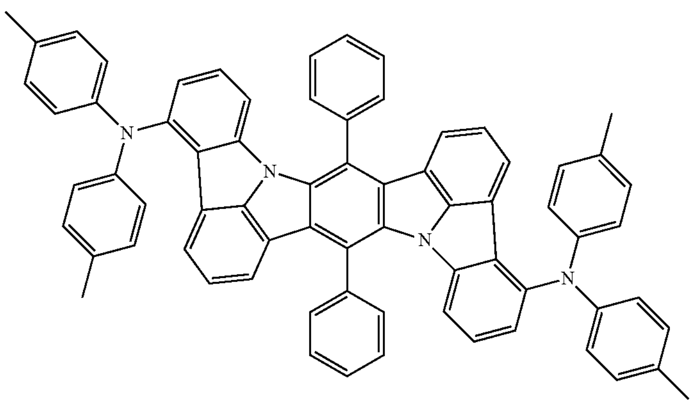
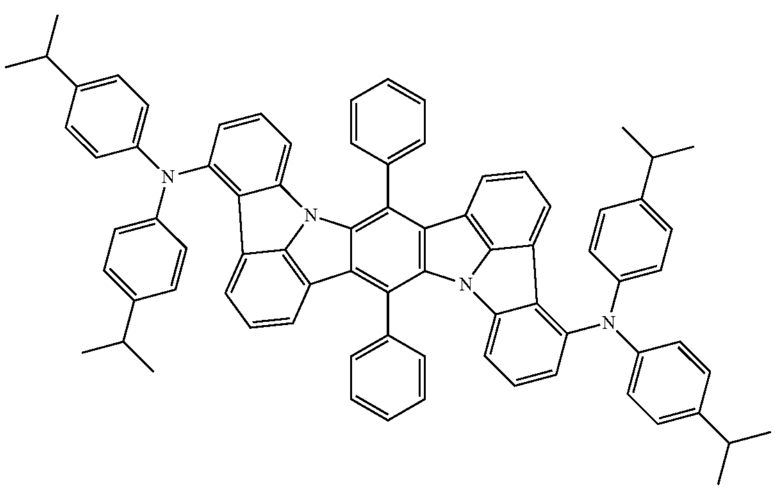

-continued
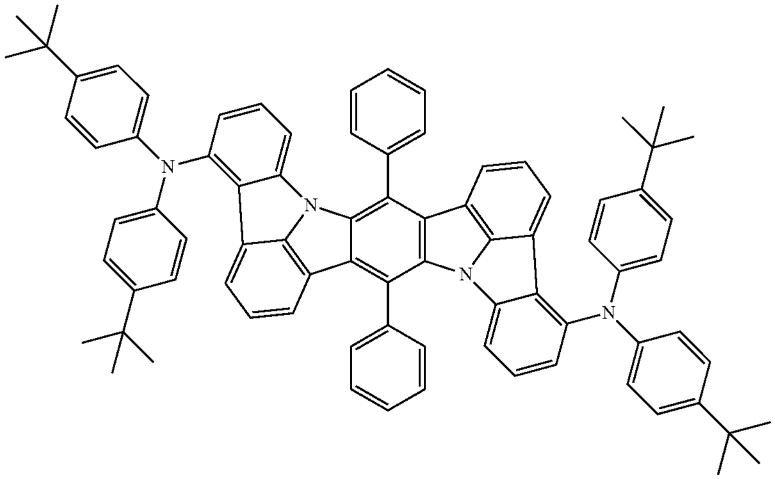
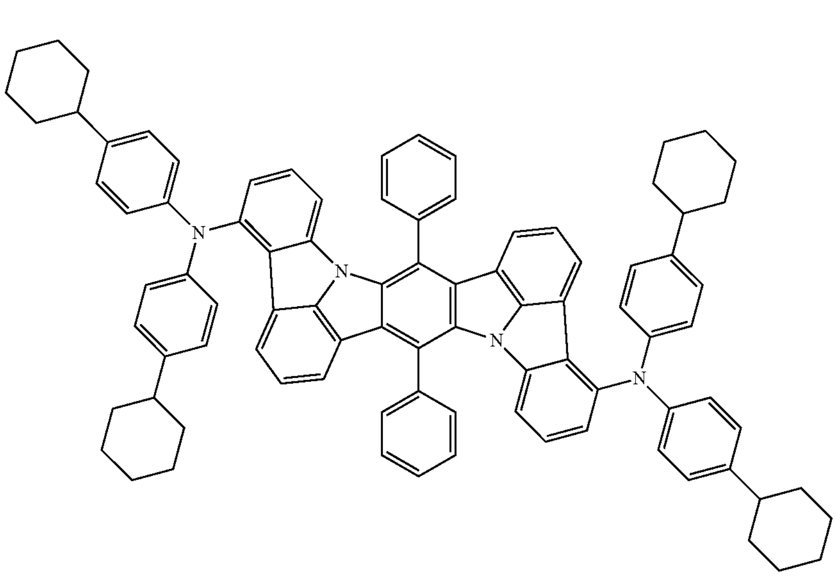
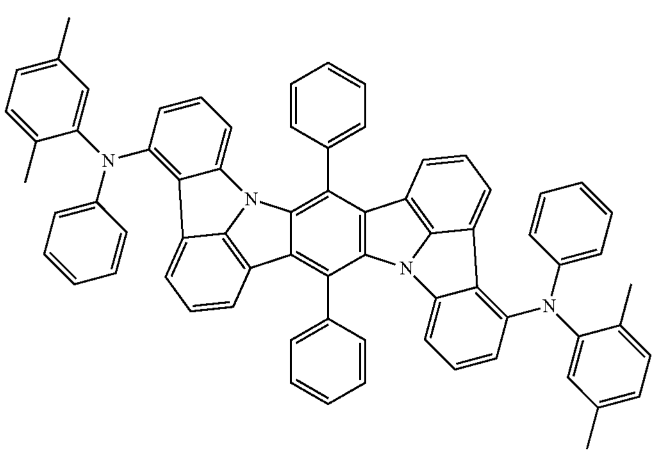

-continued
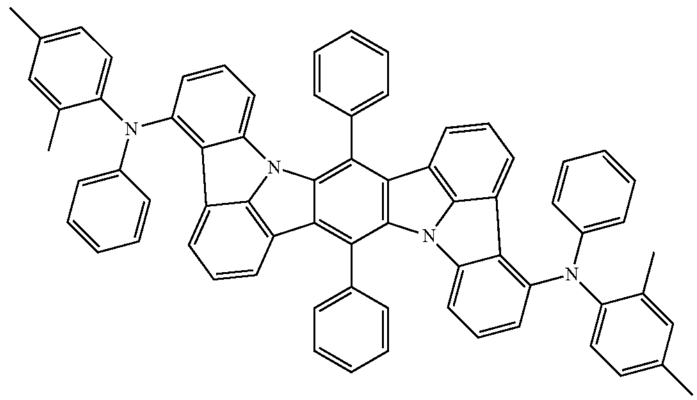
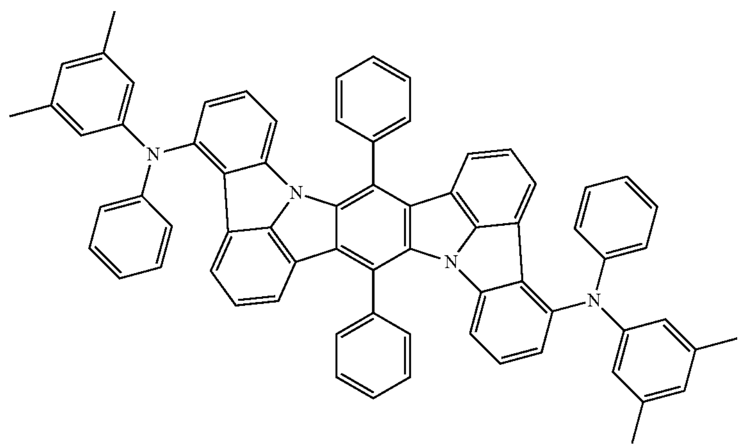
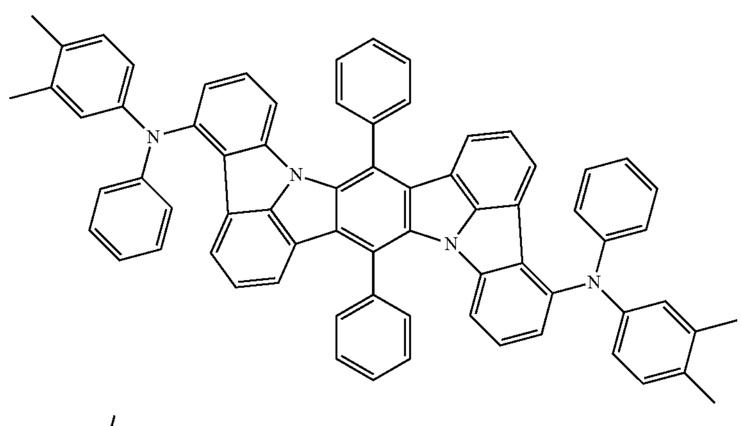
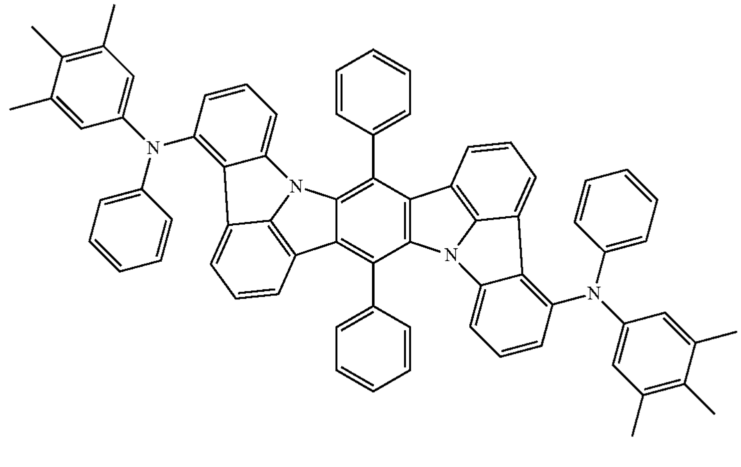

-continued
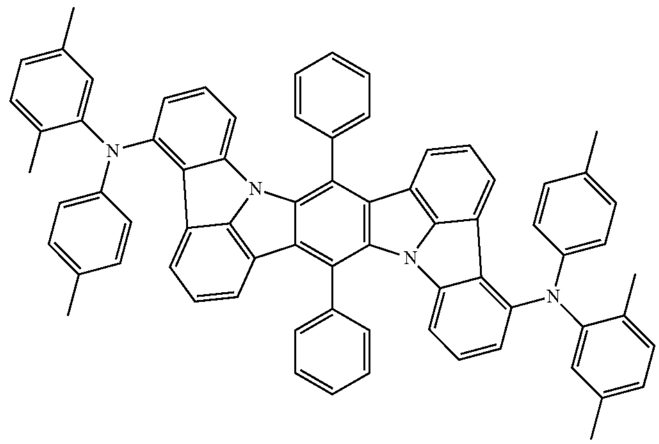
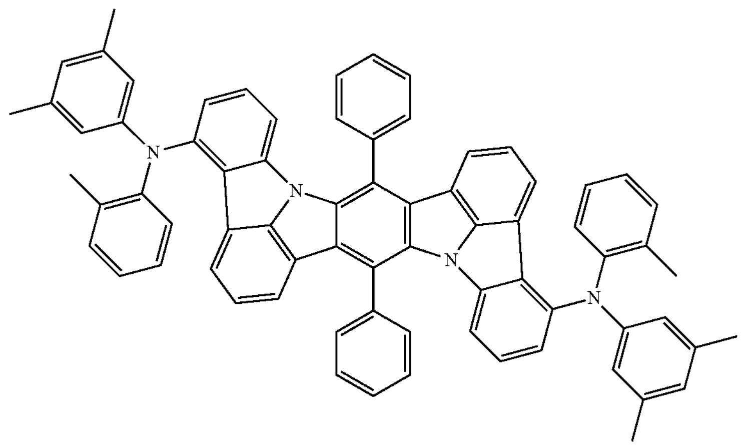
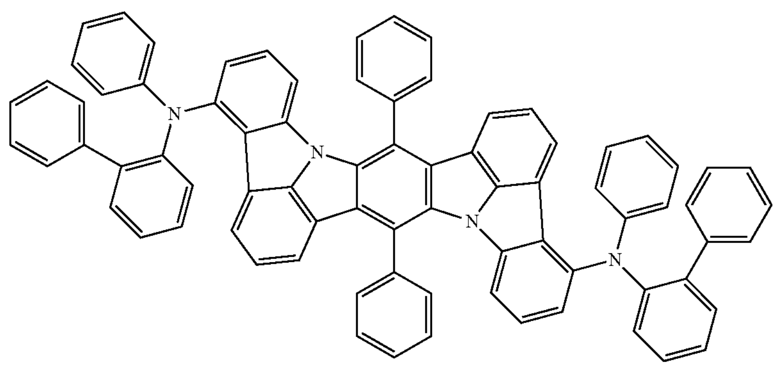
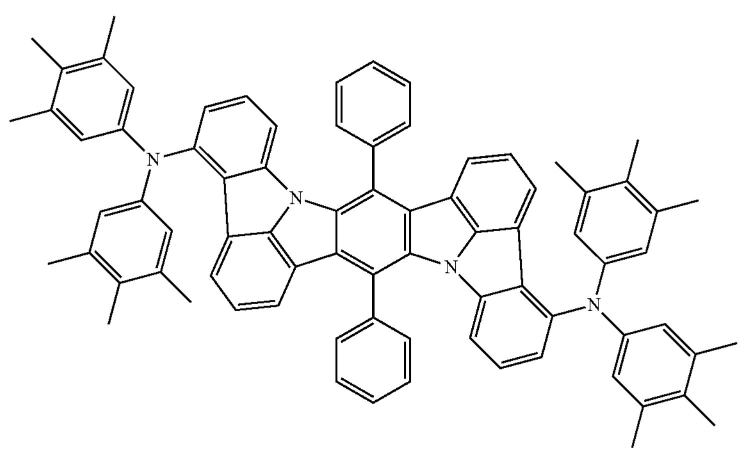

-continued
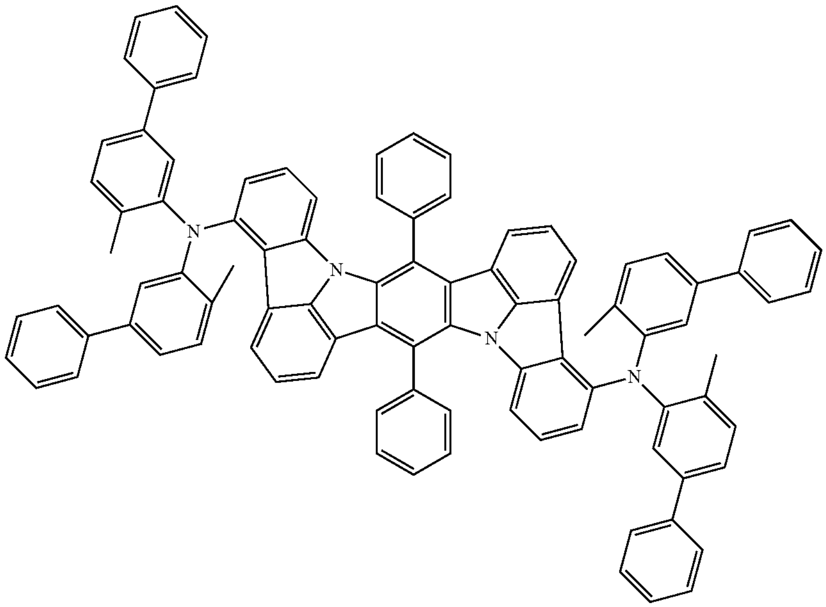
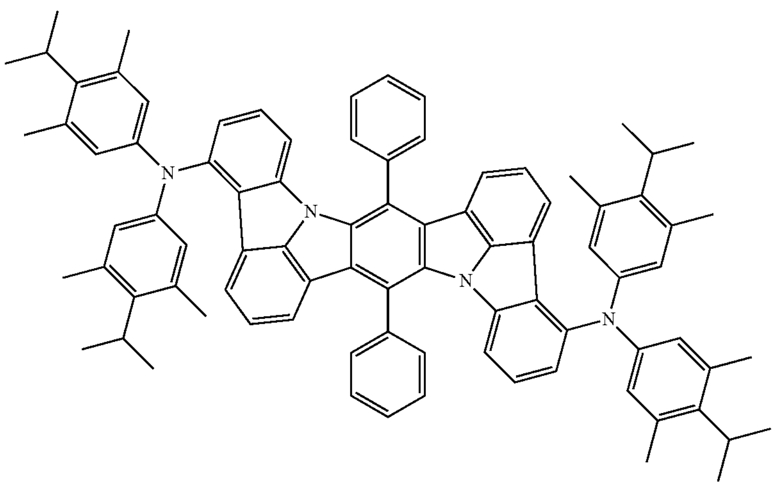
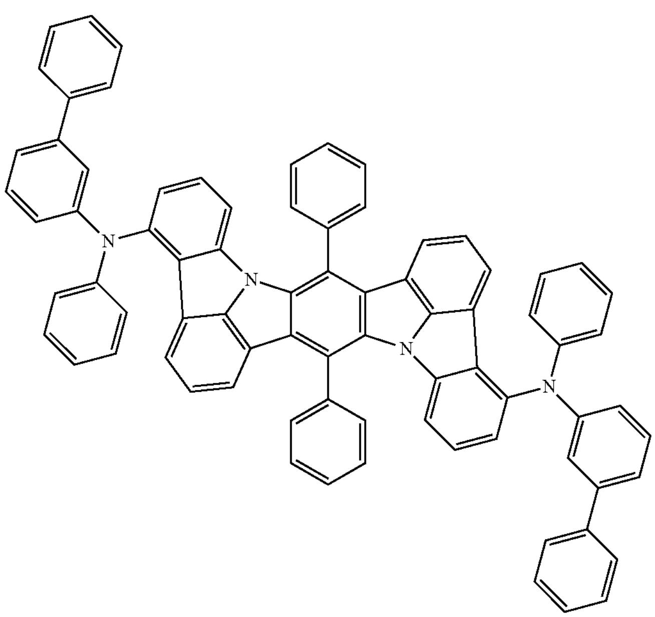

-continued
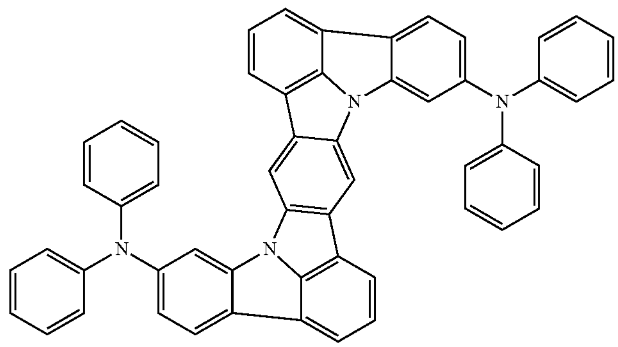
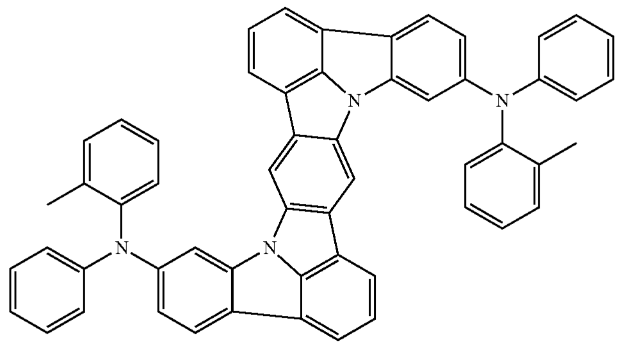
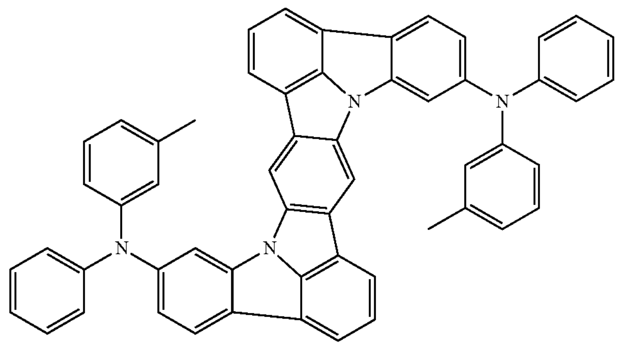
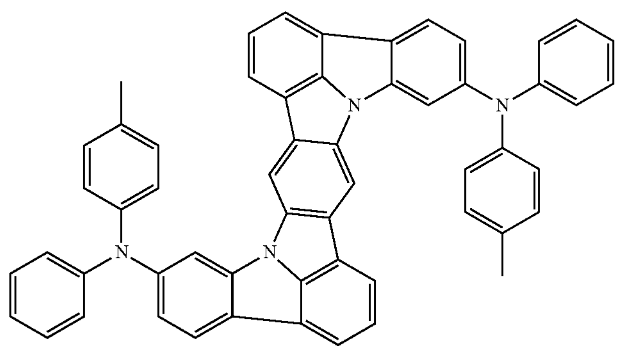
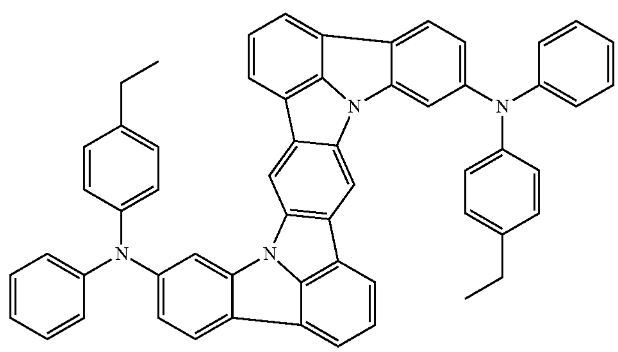

-continued
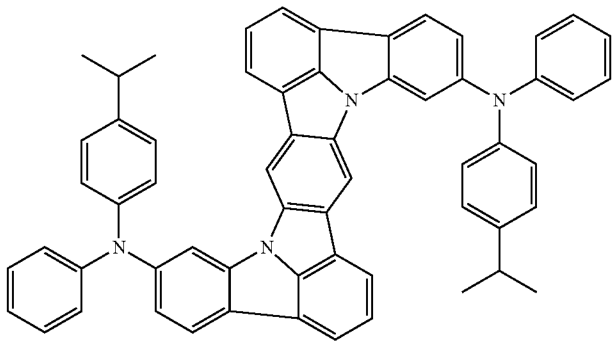
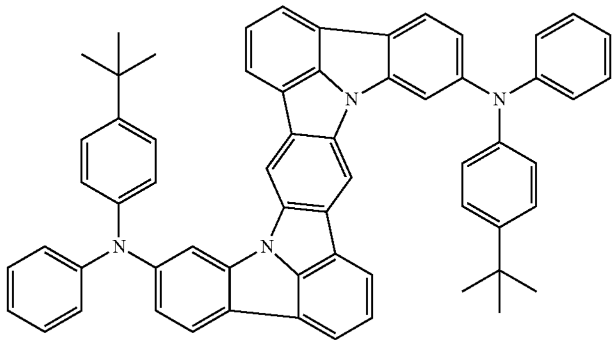
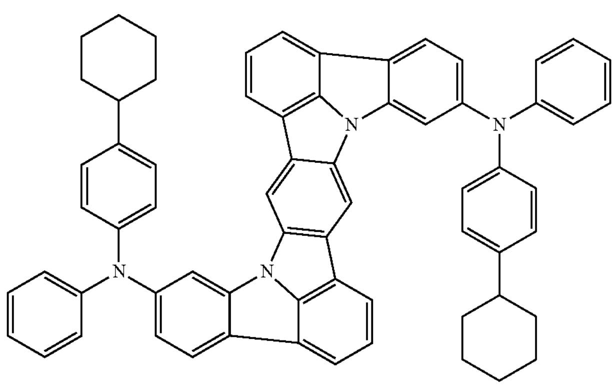
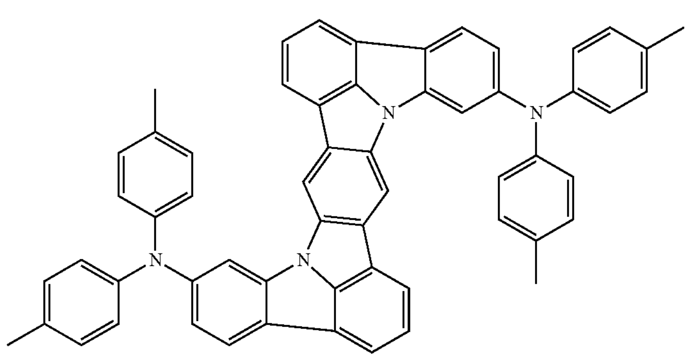

-continued
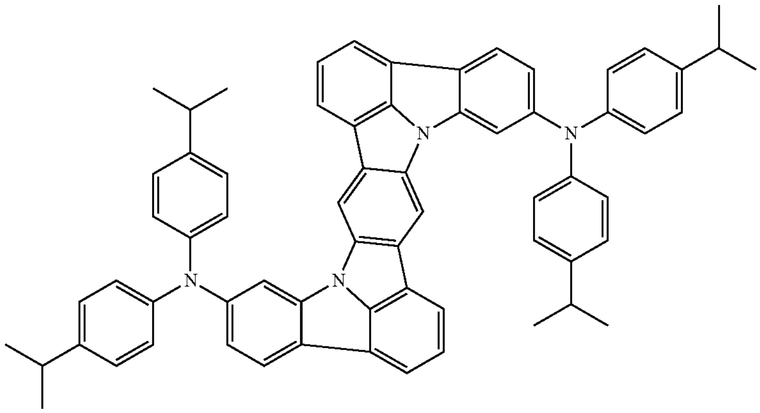
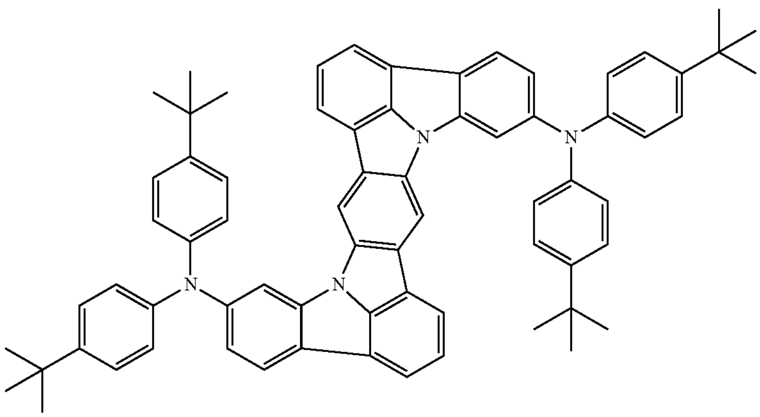
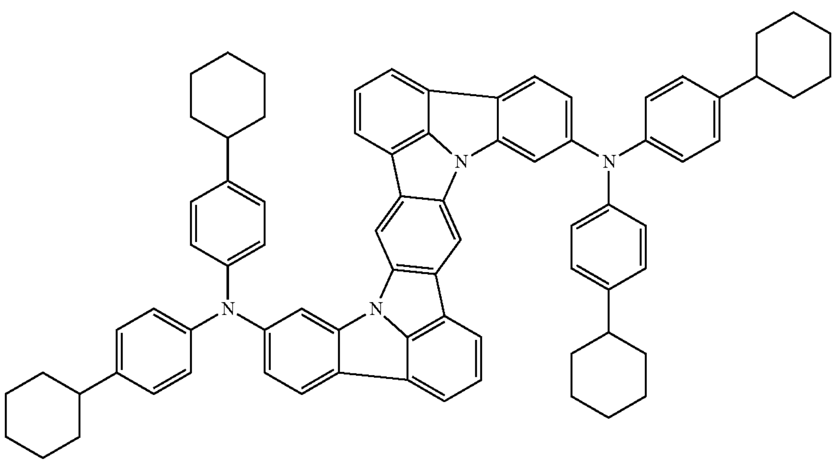
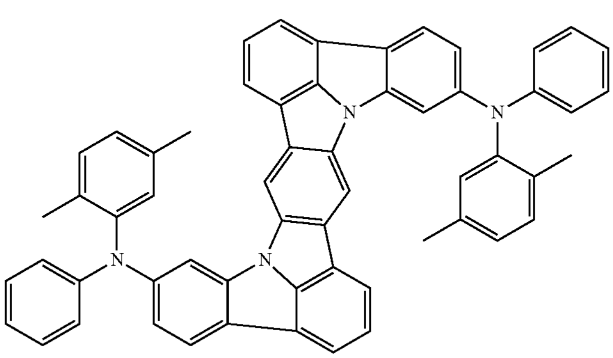

-continued
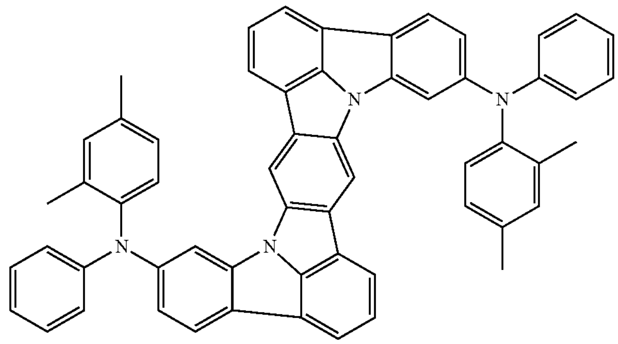
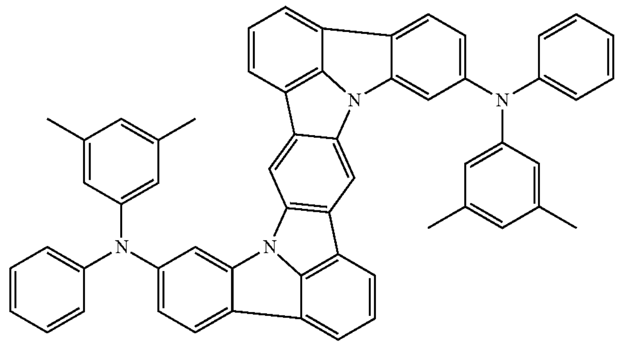
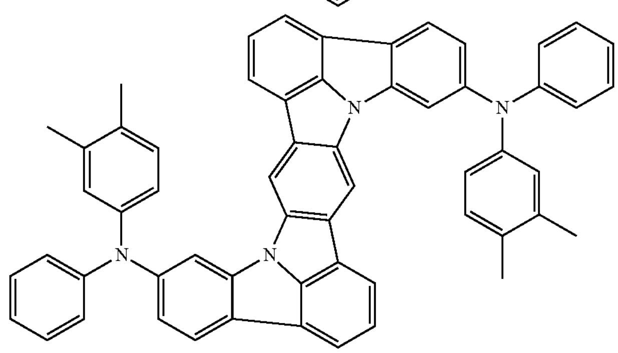
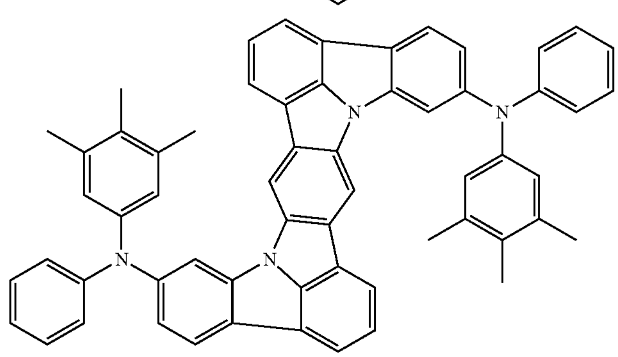
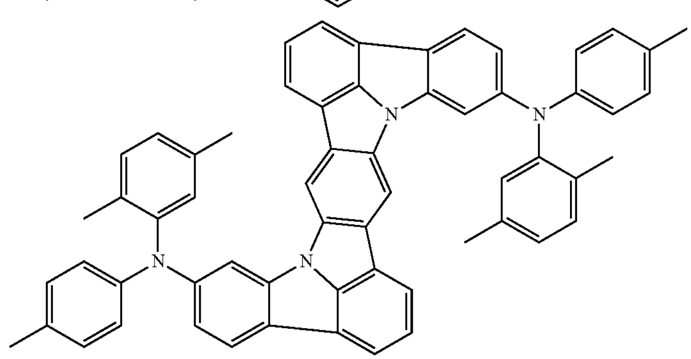

-continued
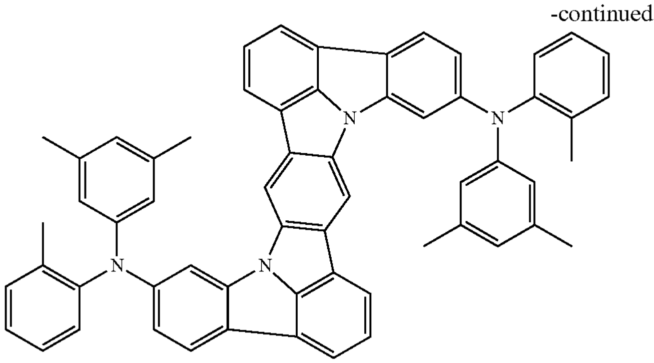
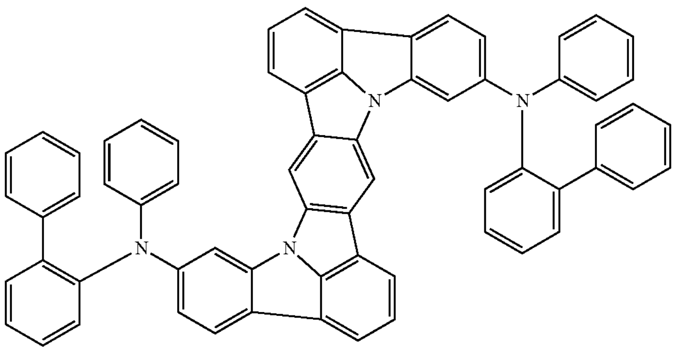
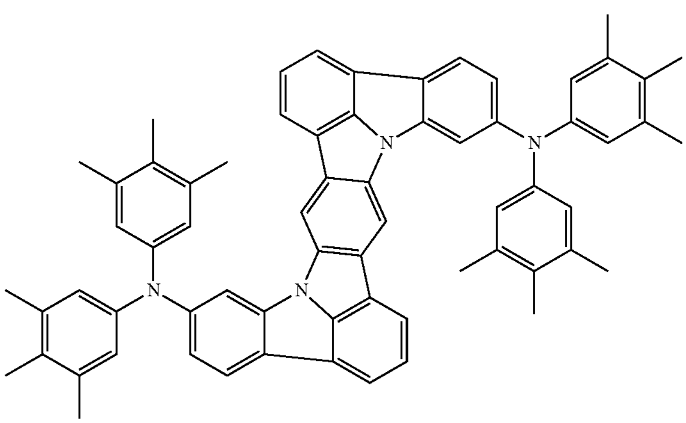
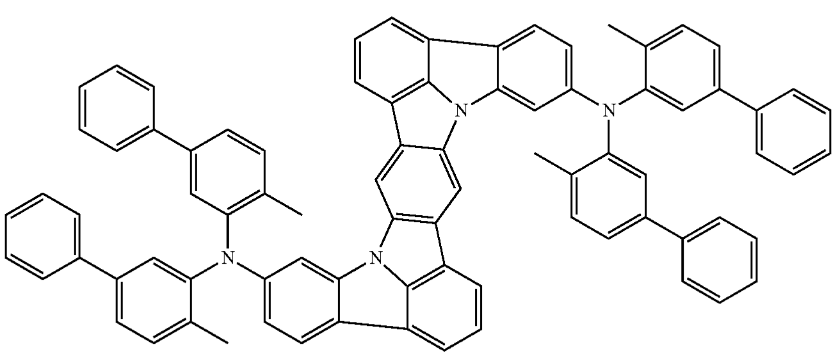

-continued
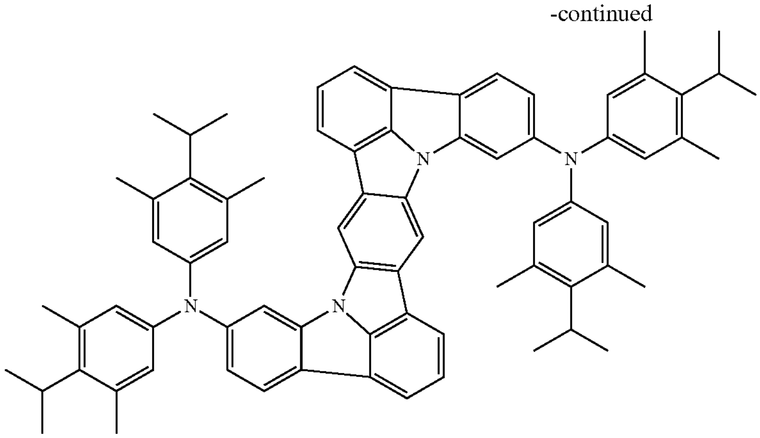
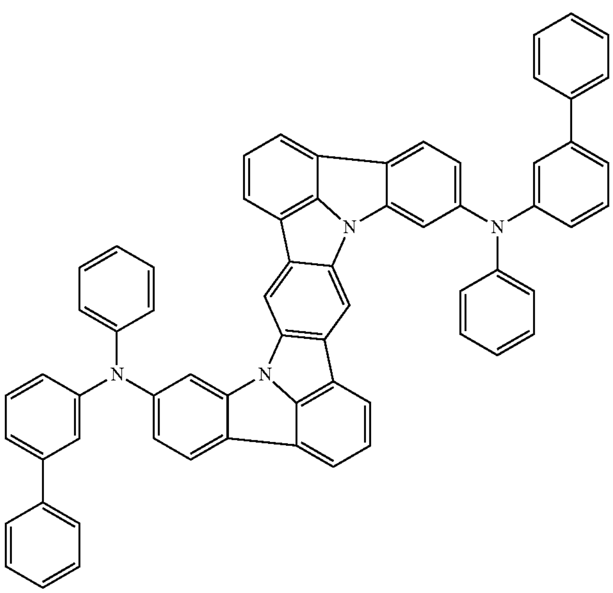
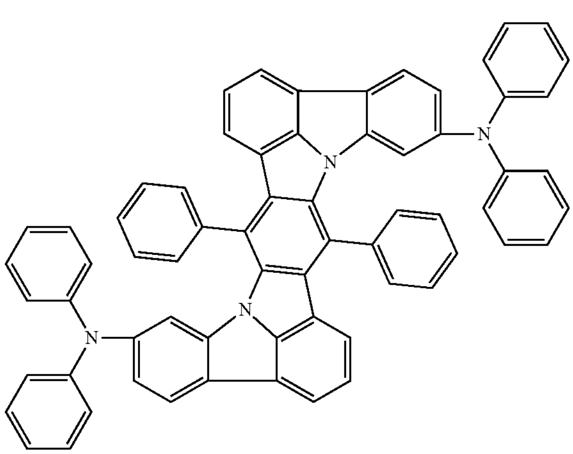

-continued
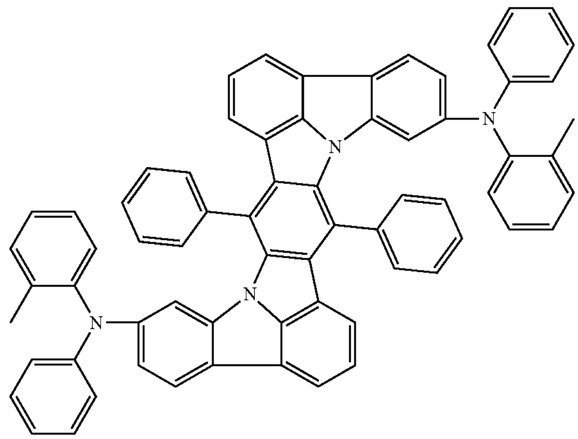
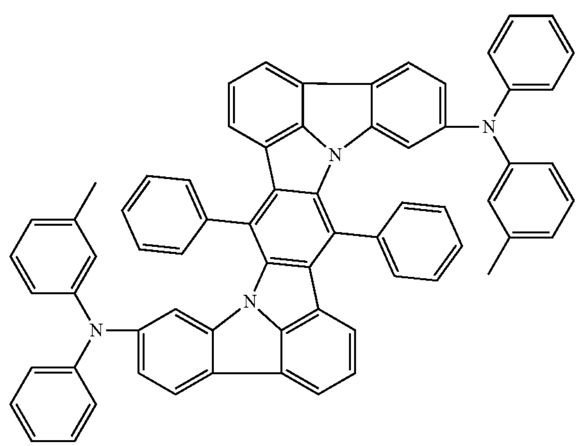
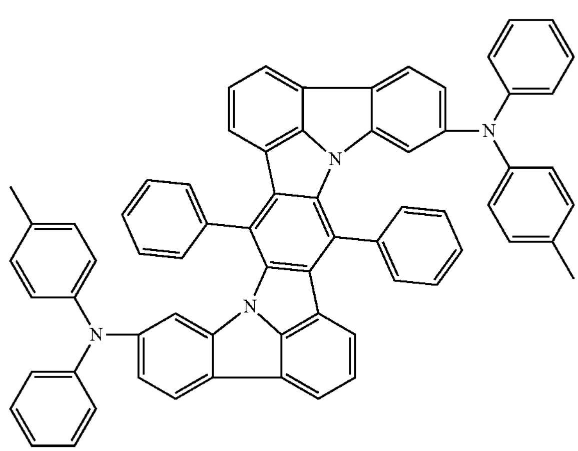

-continued
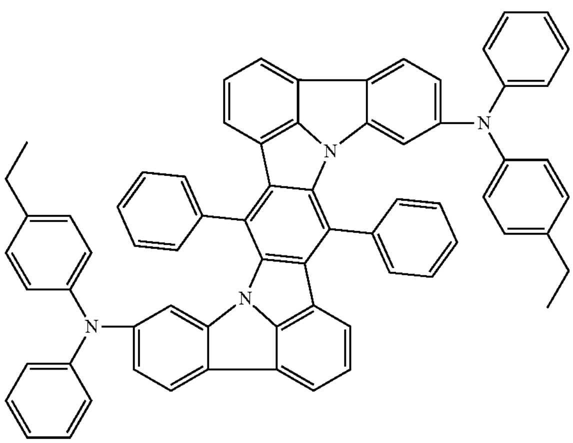
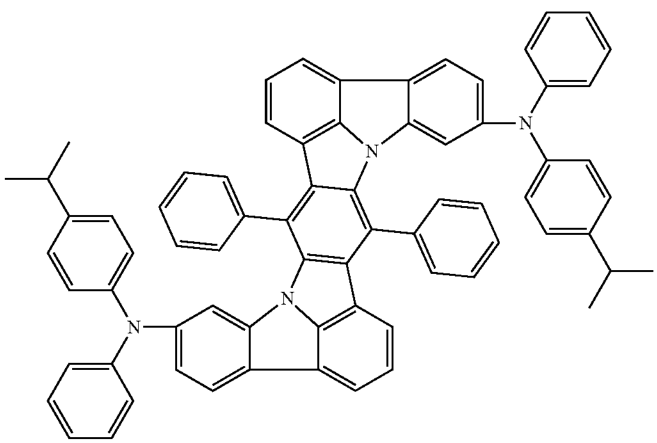
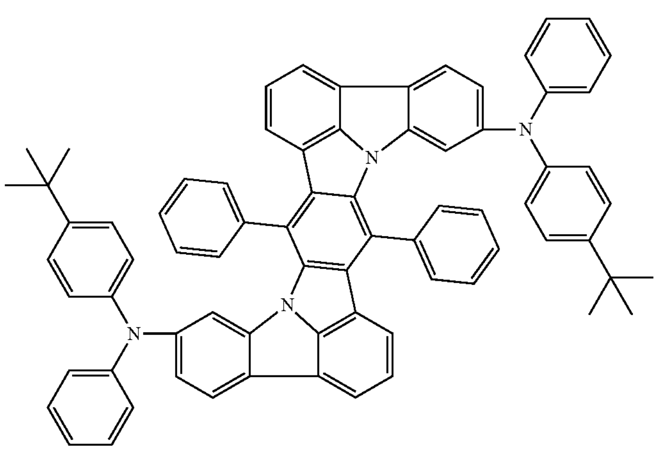

-continued
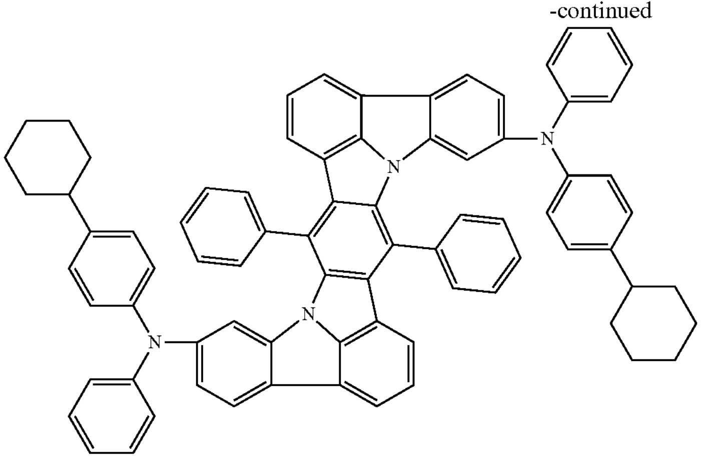
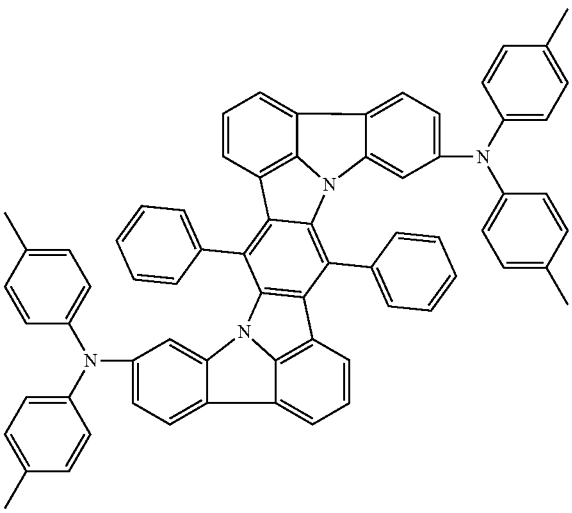
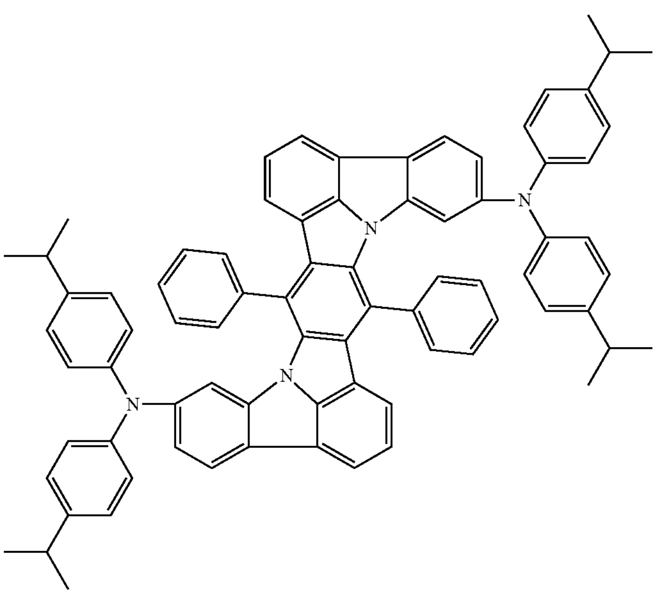

-continued
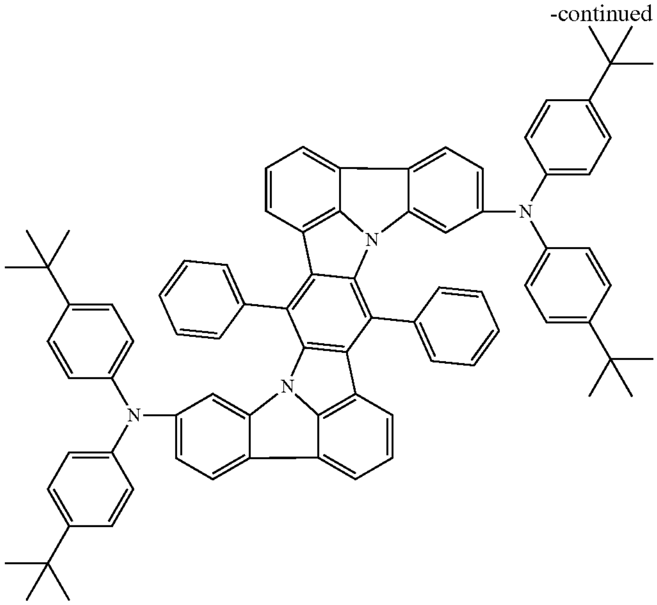
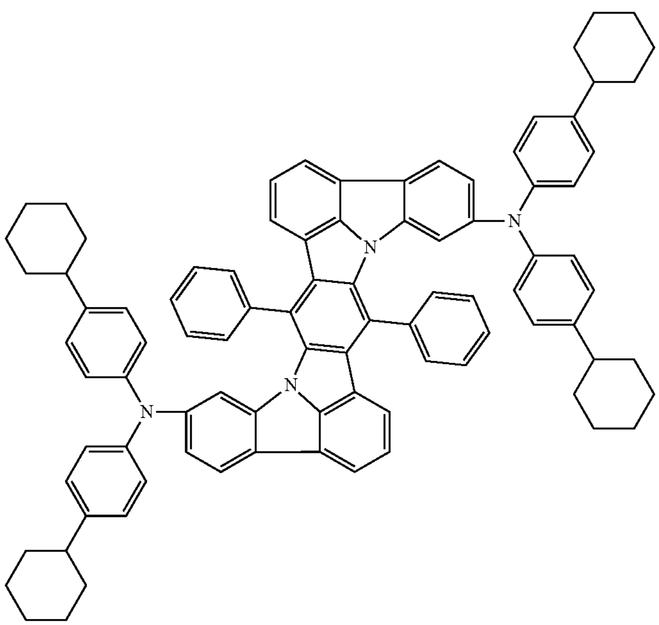
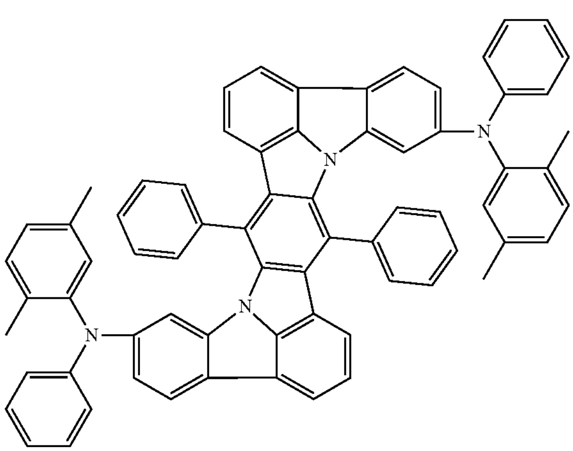

-continued
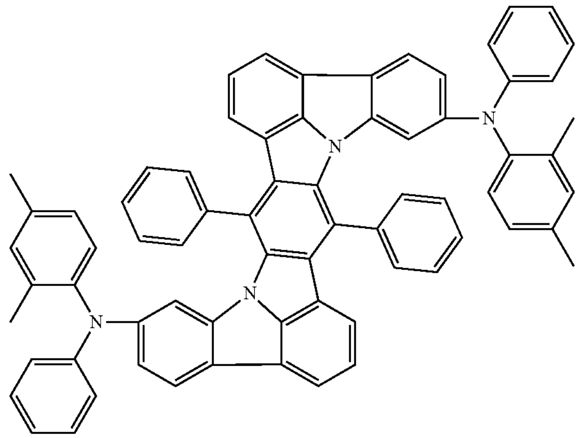
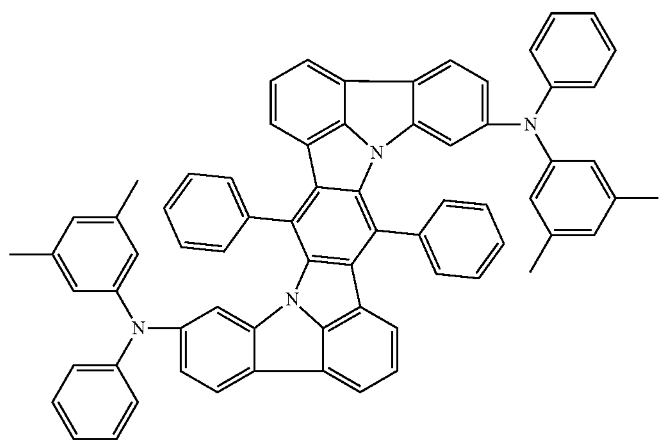
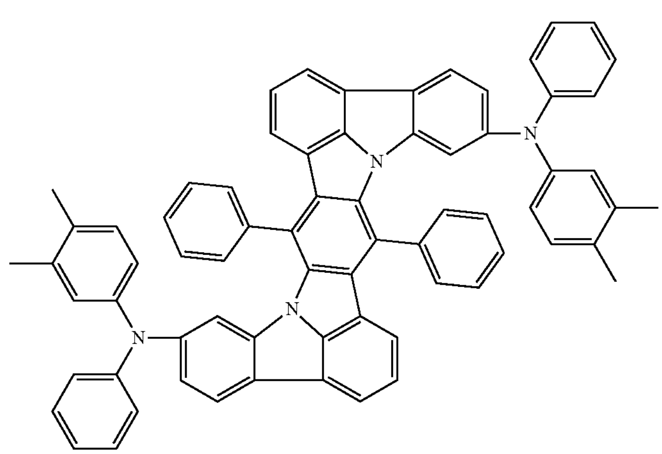

-continued
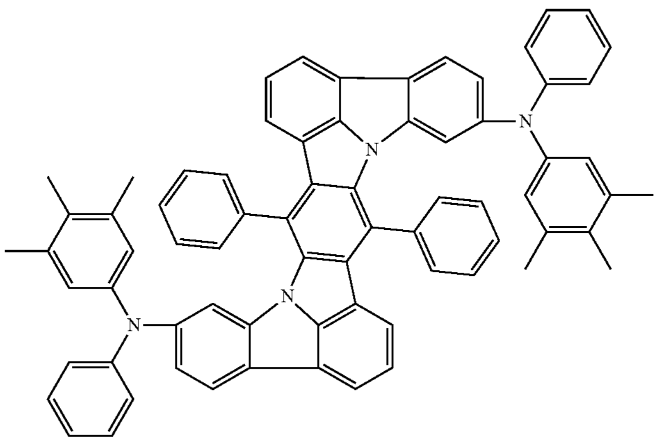
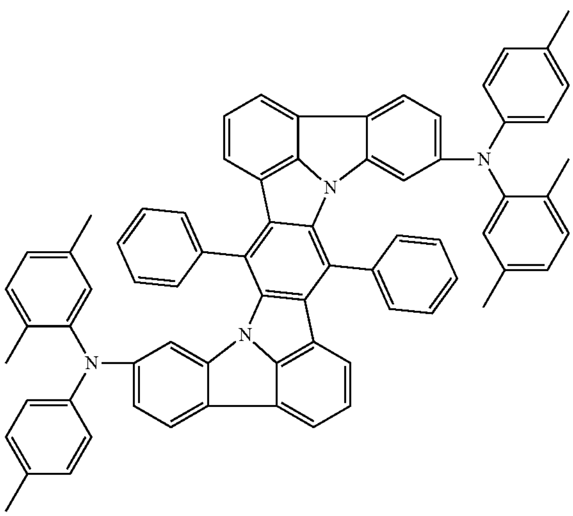
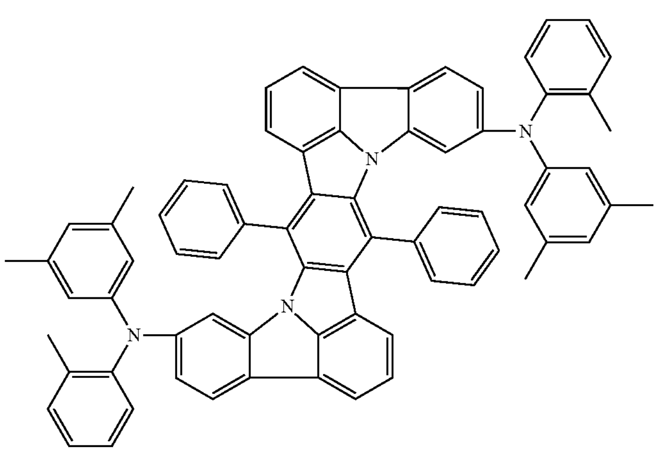

-continued
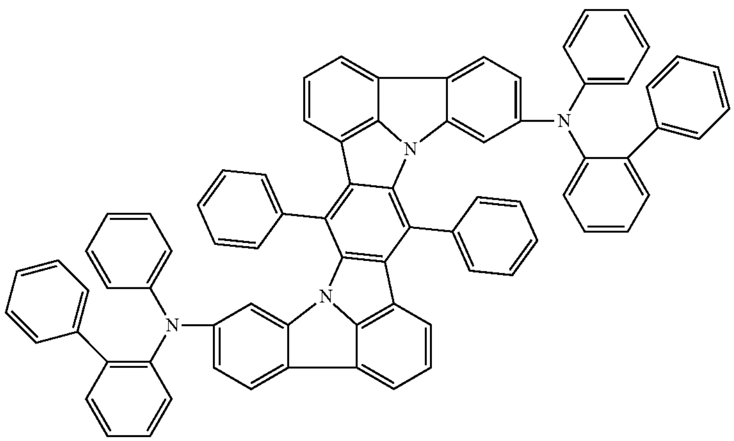
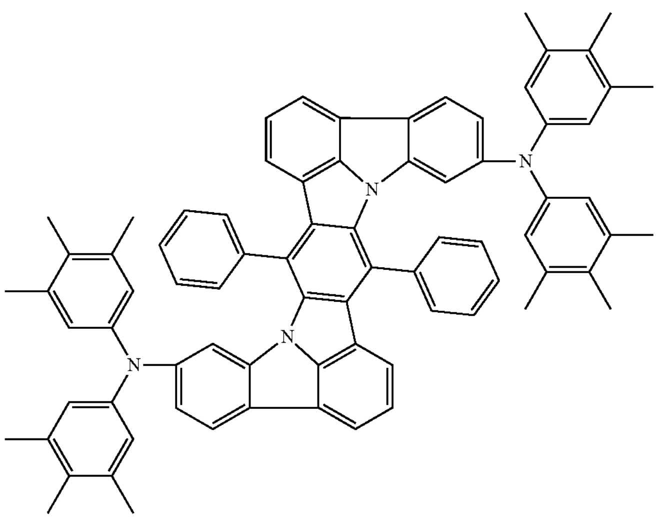
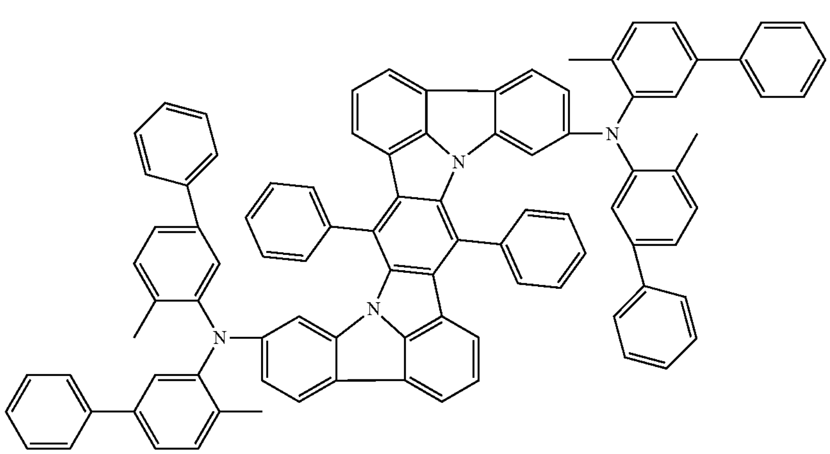

-continued
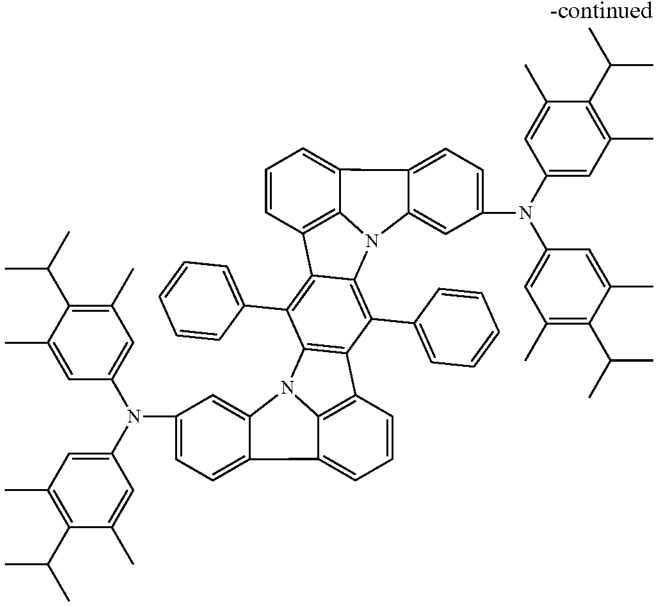
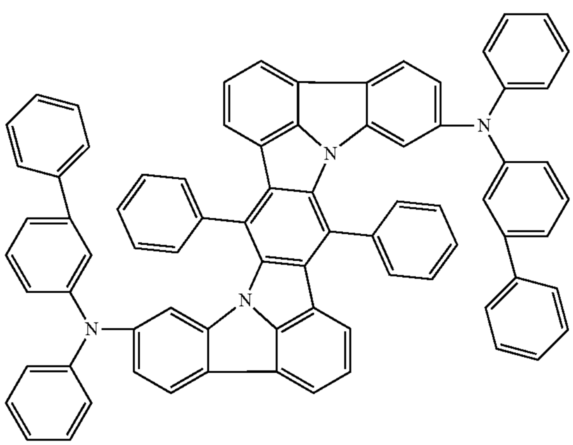
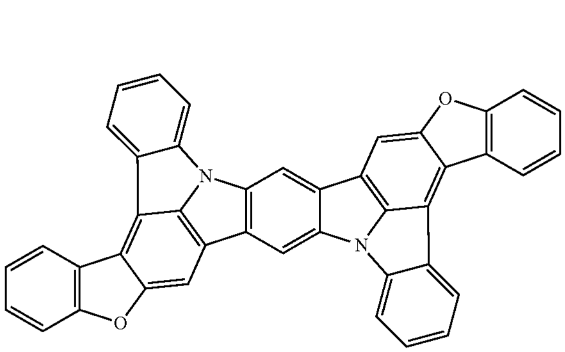
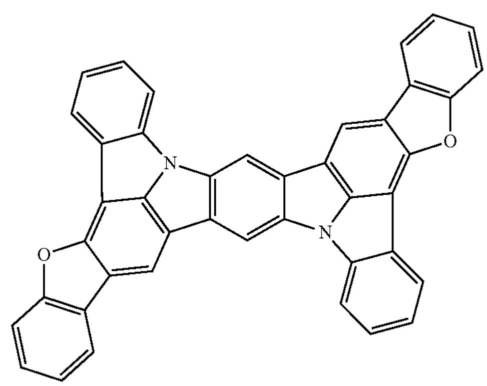

-continued
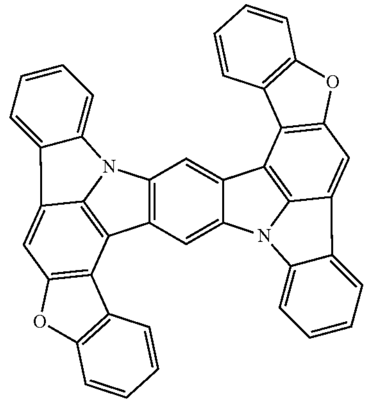
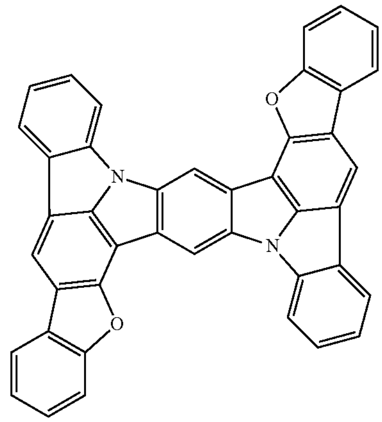
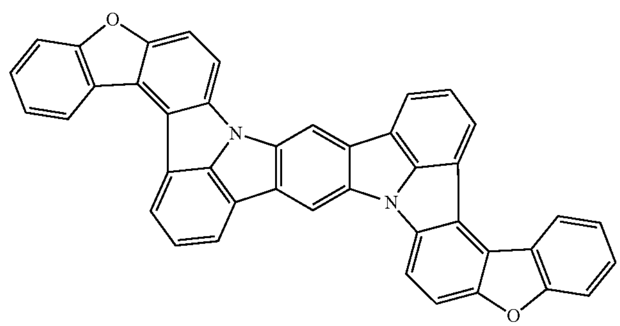
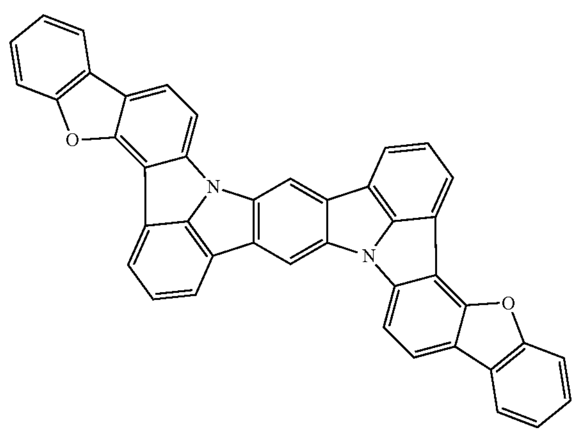
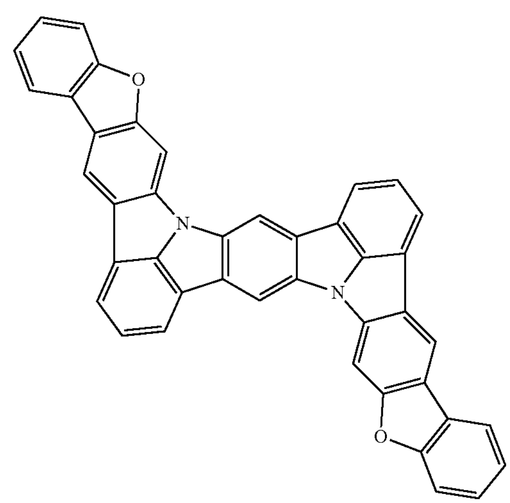

-continued
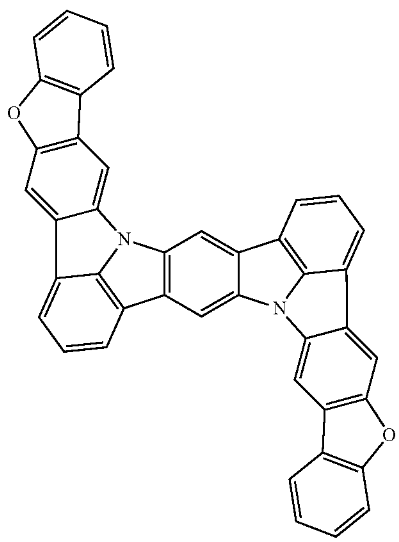
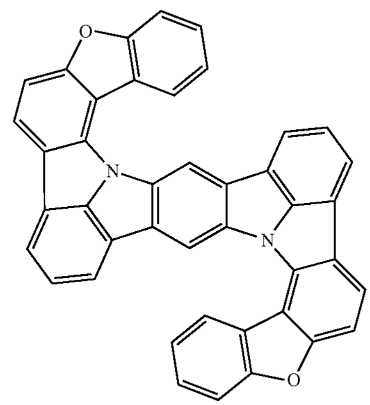
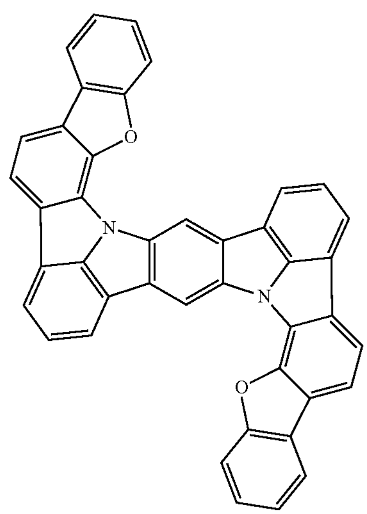
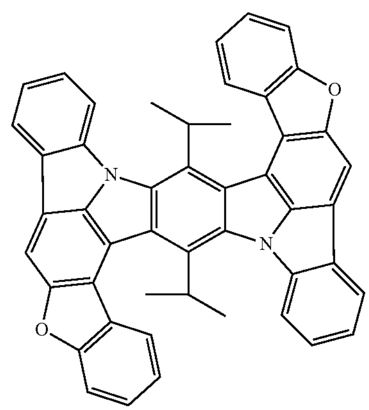
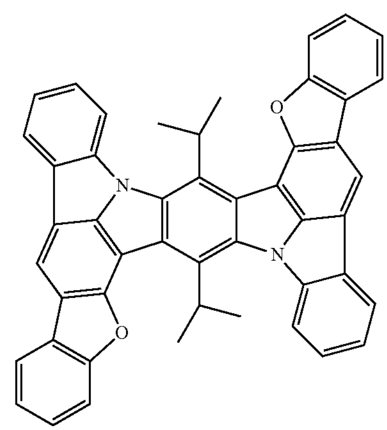
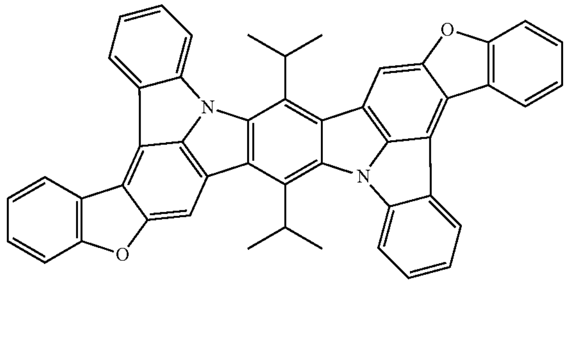
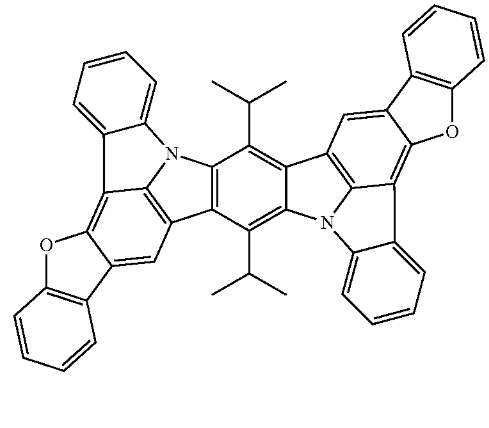

-continued
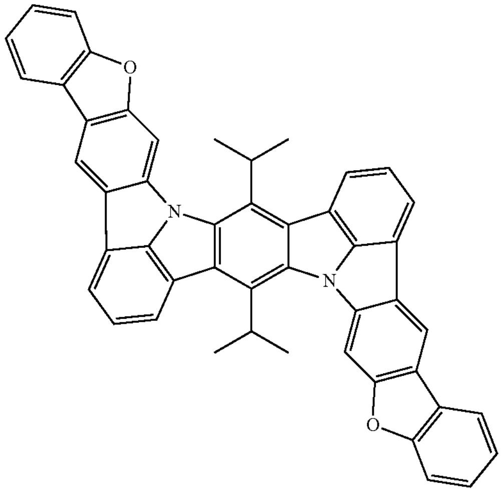
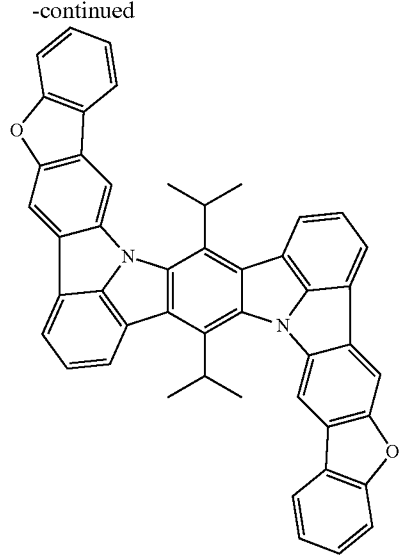
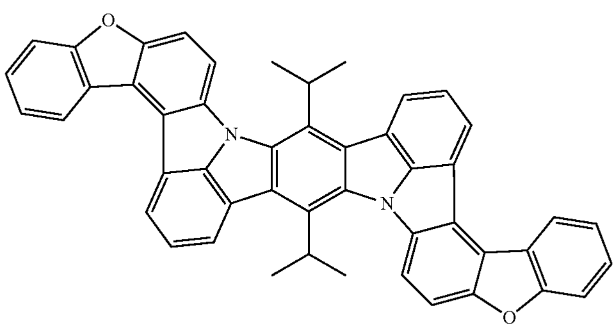
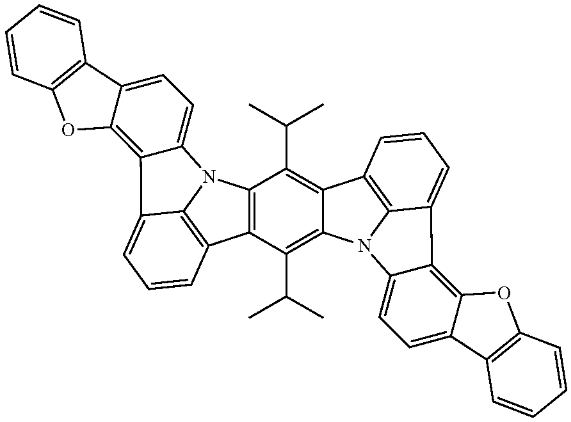
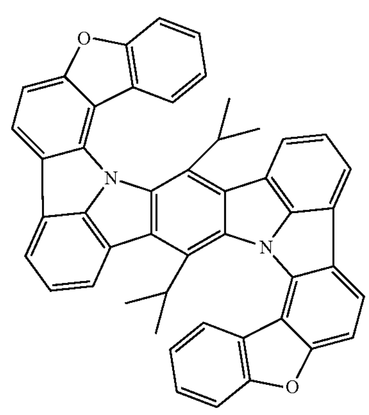

-continued
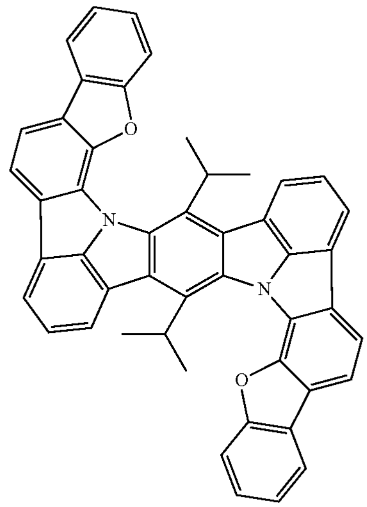
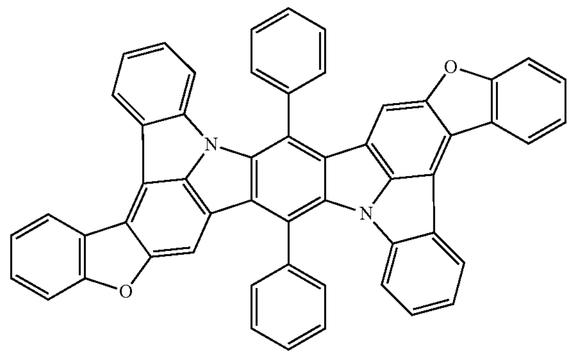
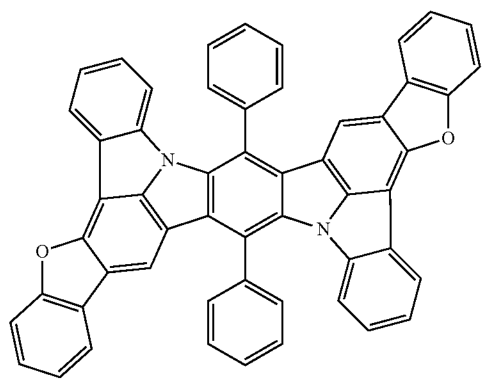
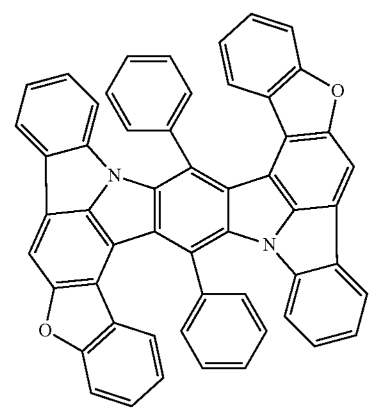
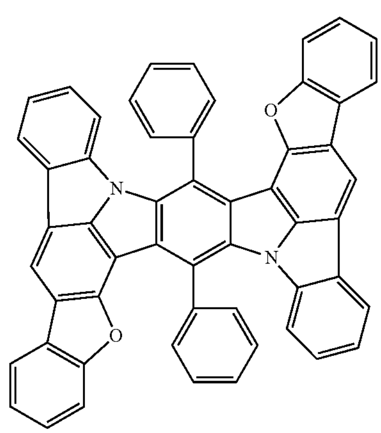
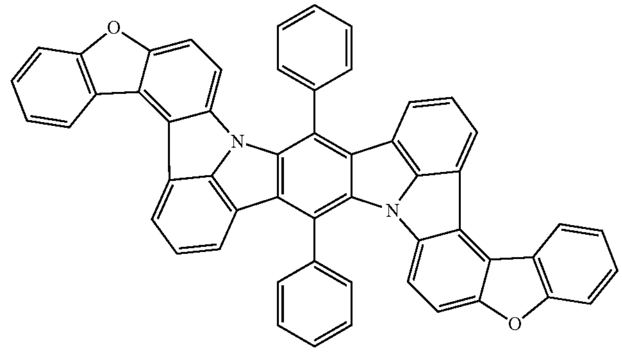

-continued
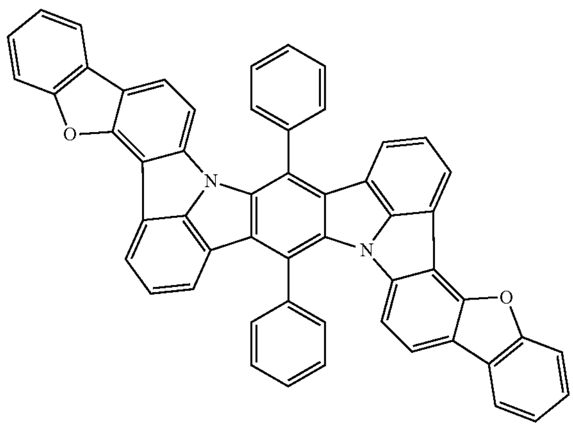
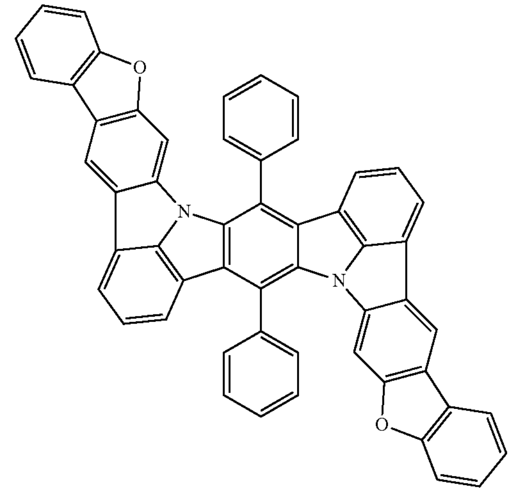
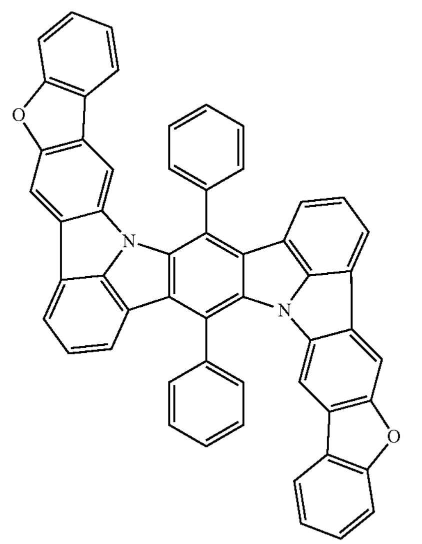
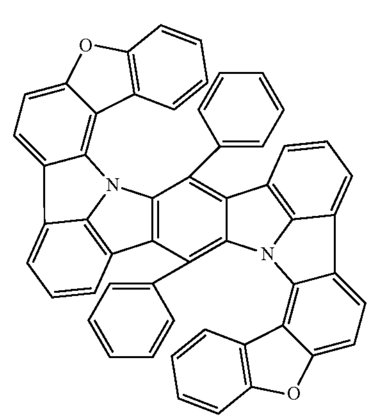
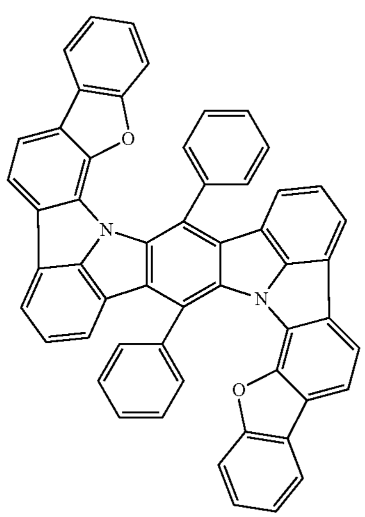
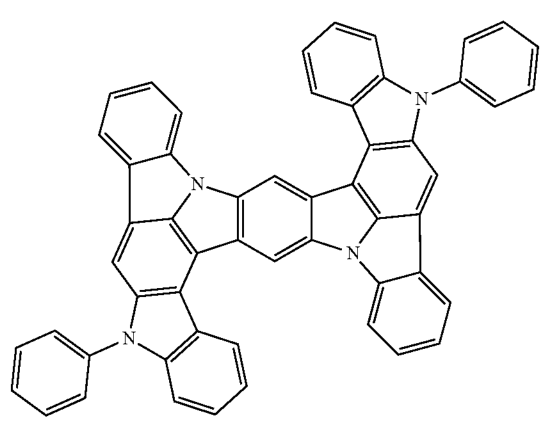

-continued
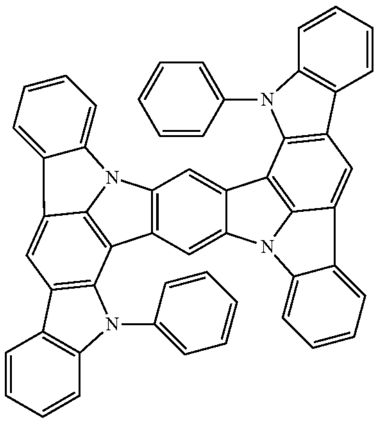
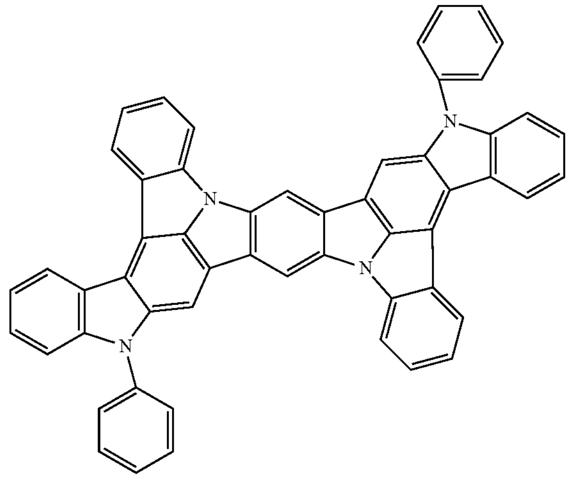
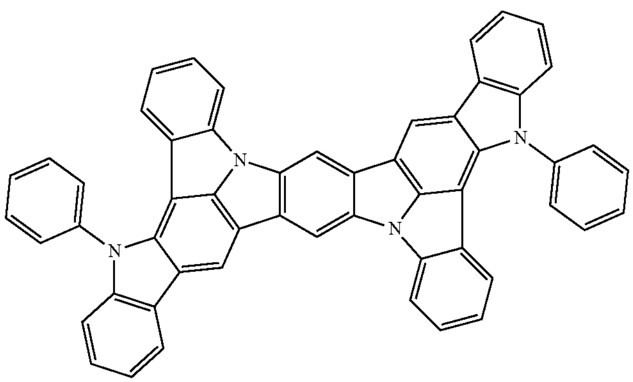
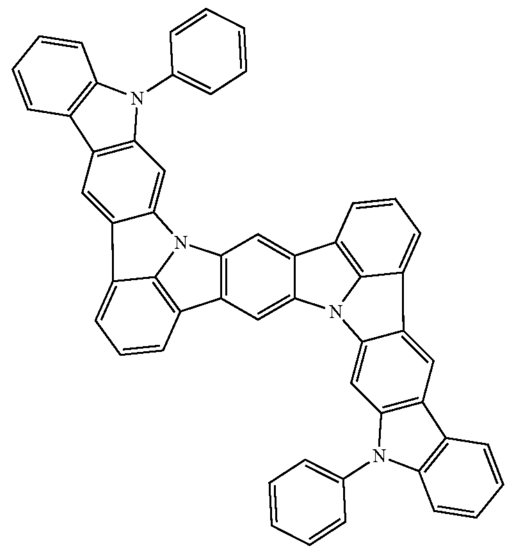
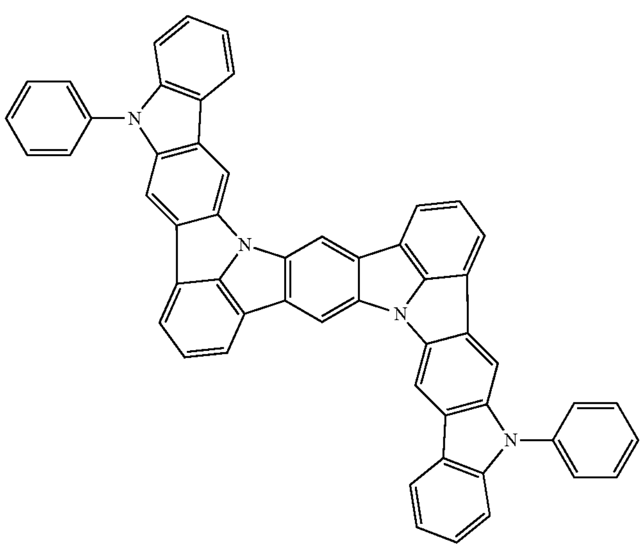

-continued
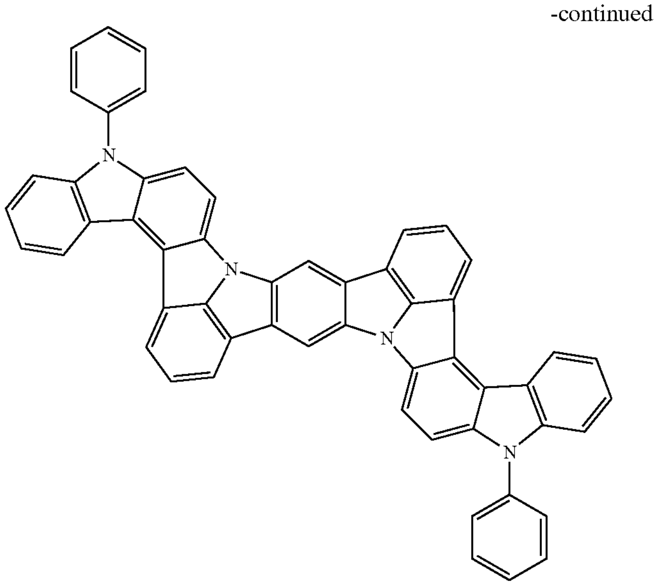
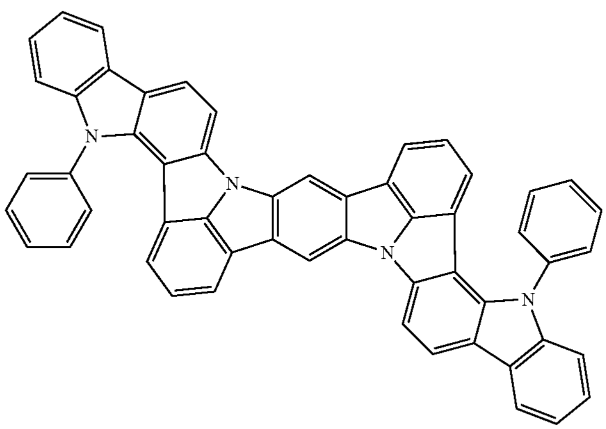
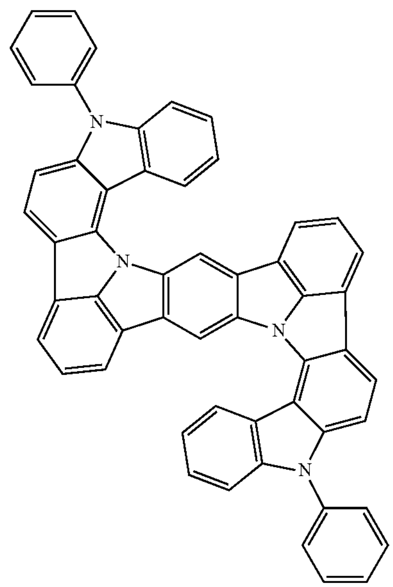
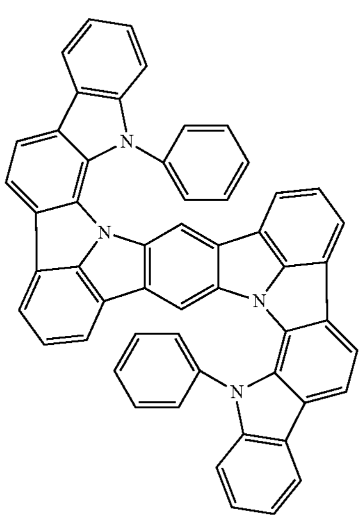
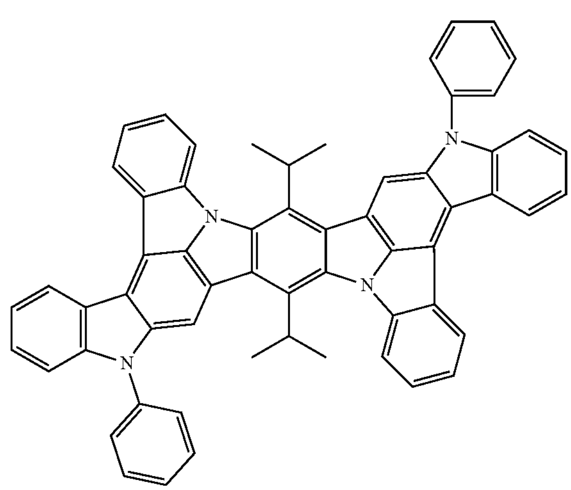

-continued
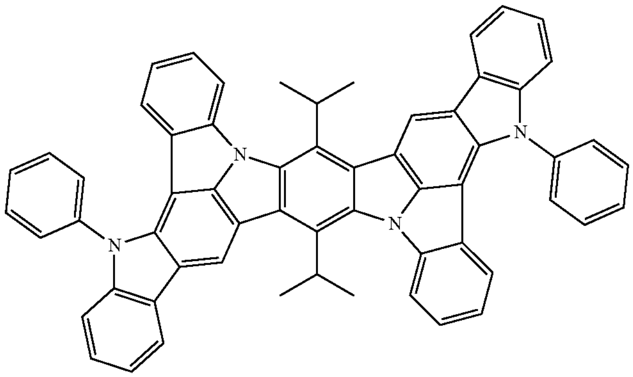
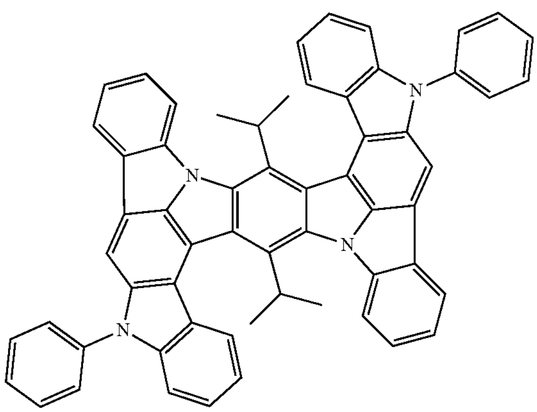
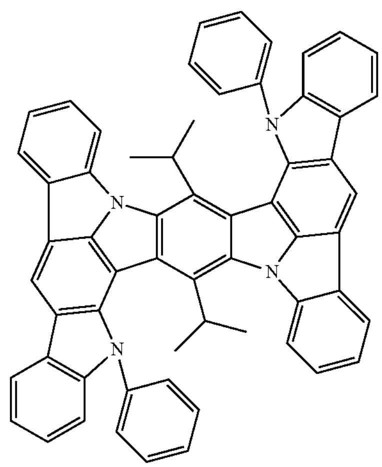
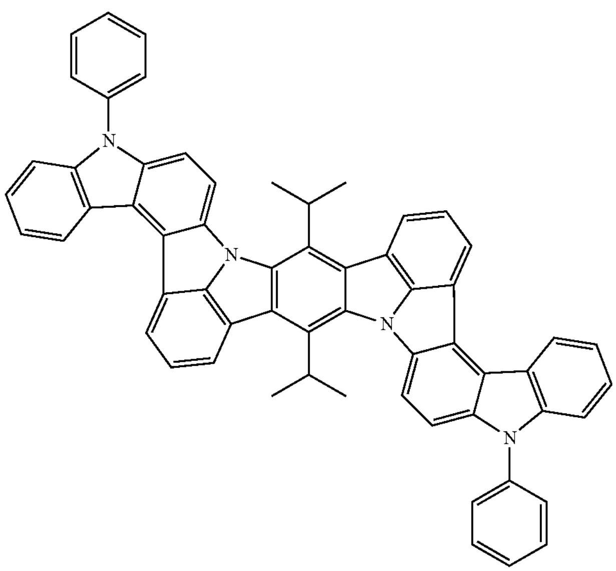

-continued
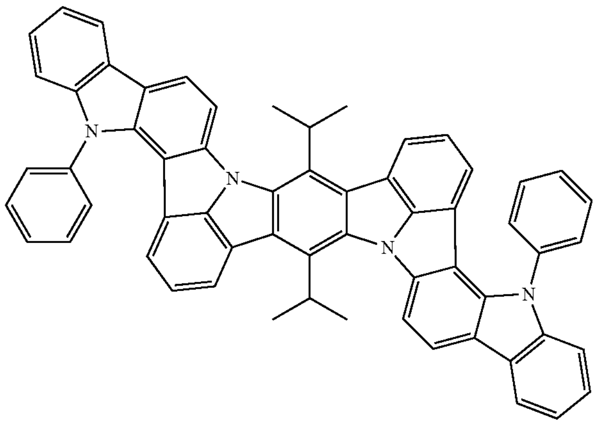
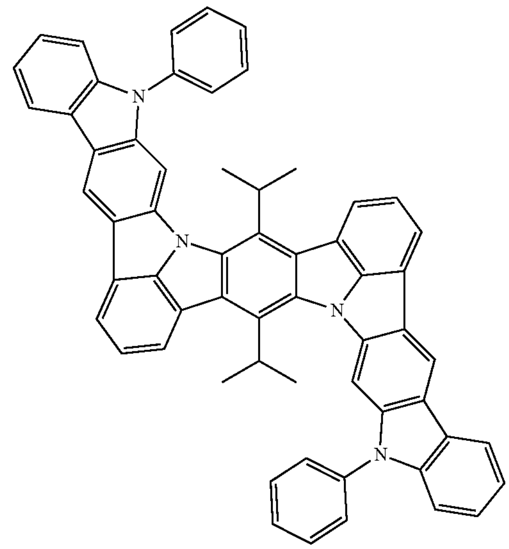
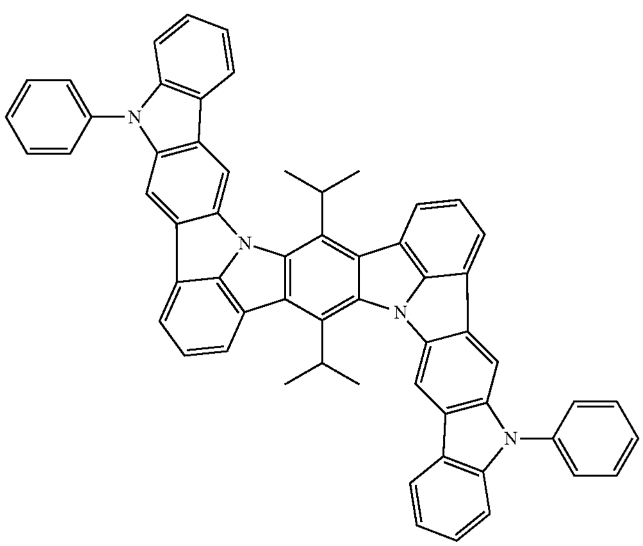
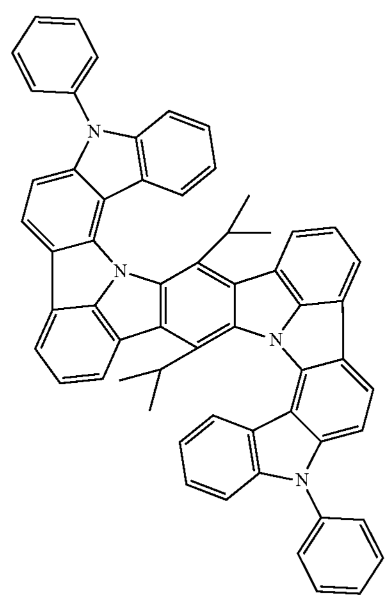

-continued
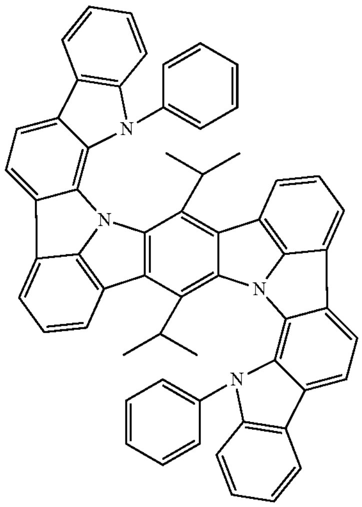
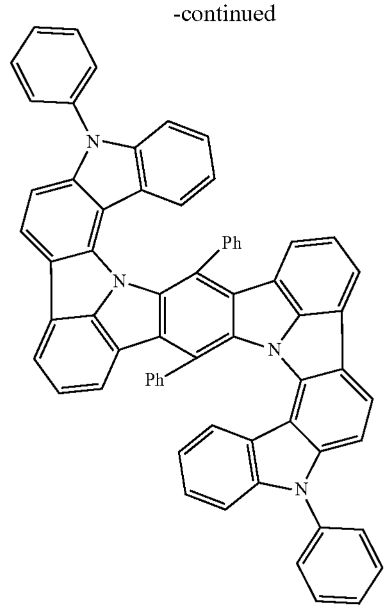
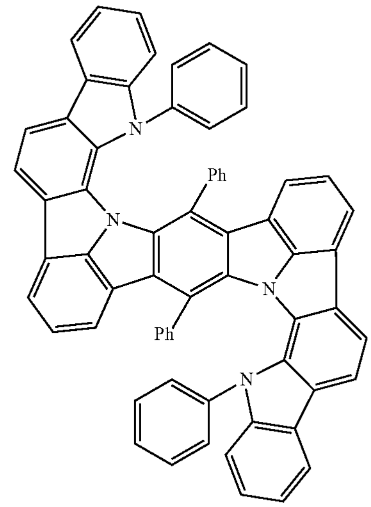
(In the formulas, 'Ph" represents a phenyl group.)
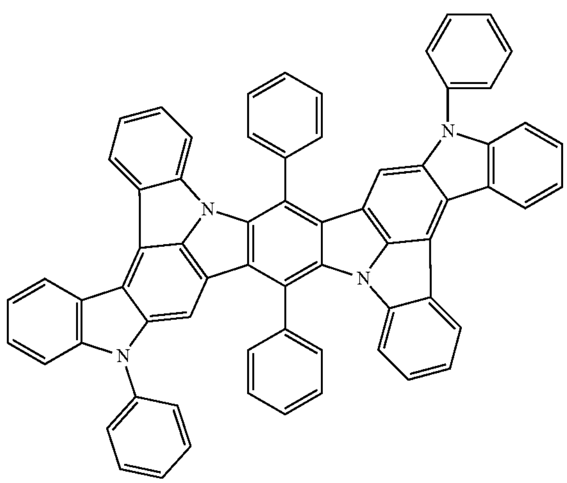
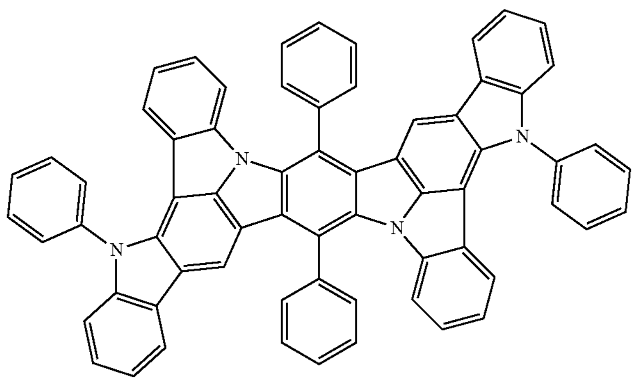

-continued
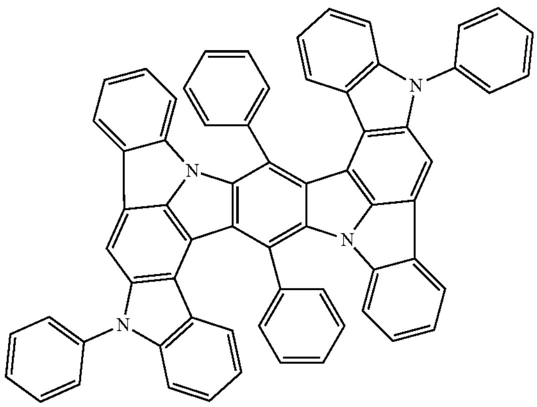
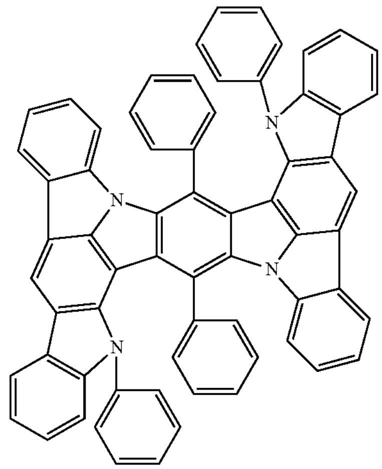
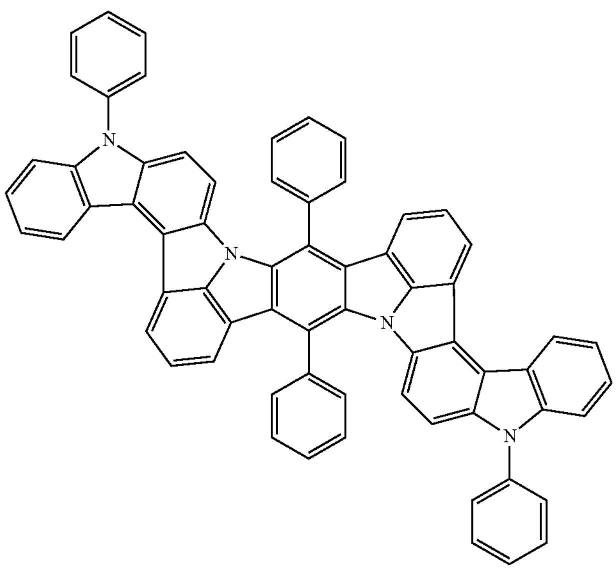
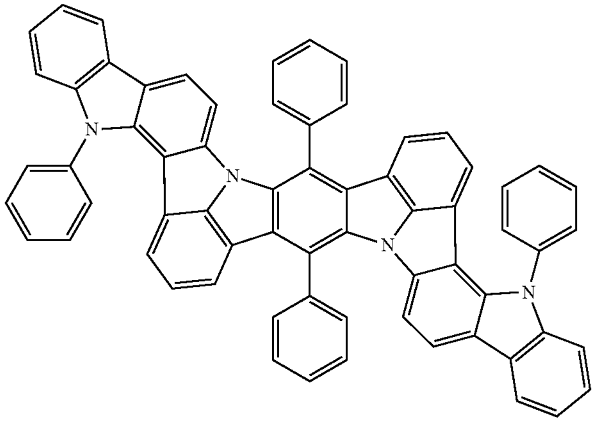
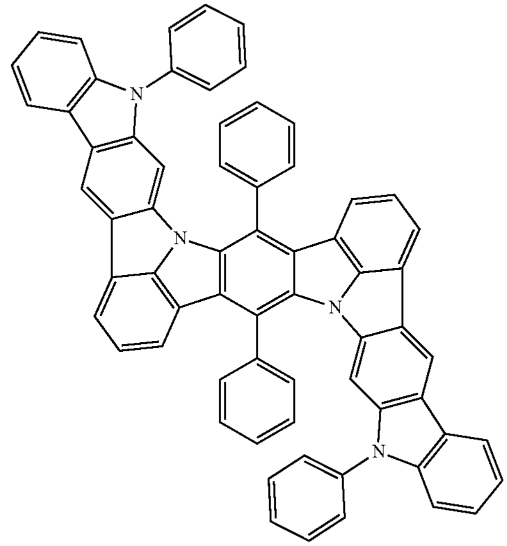

-continued
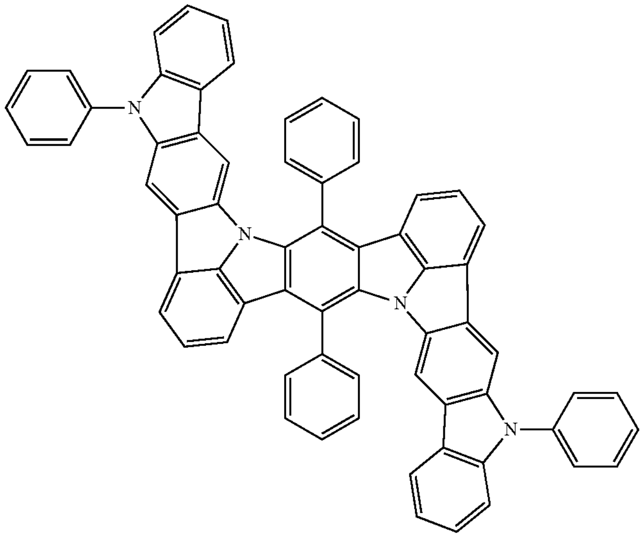
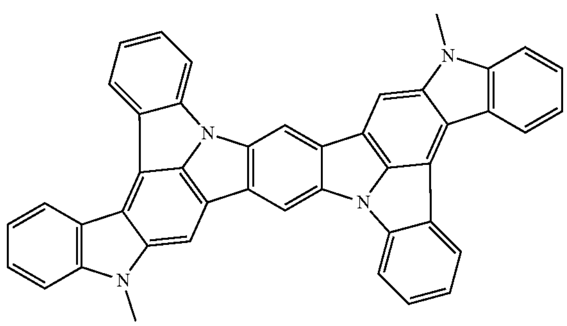
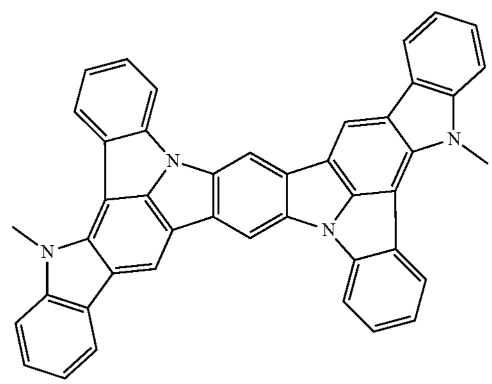
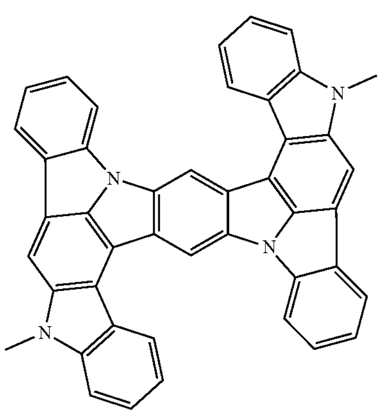
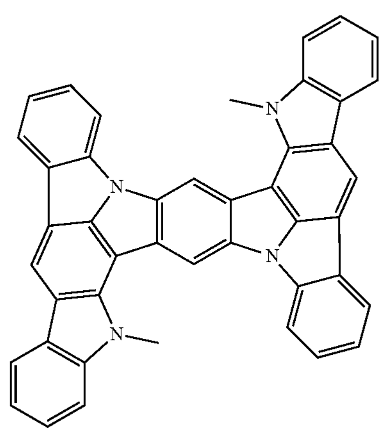

-continued
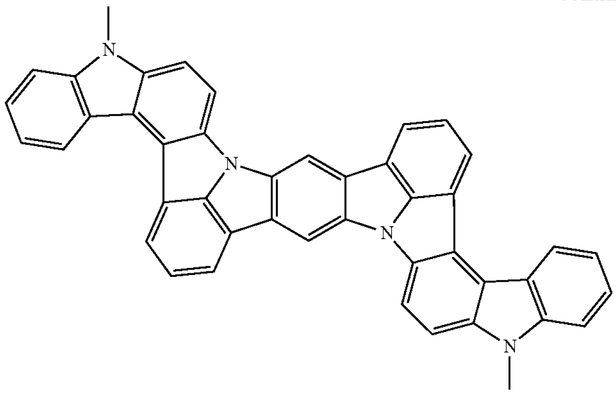
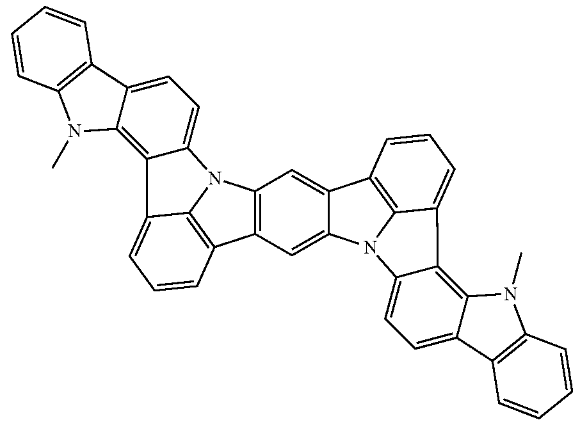
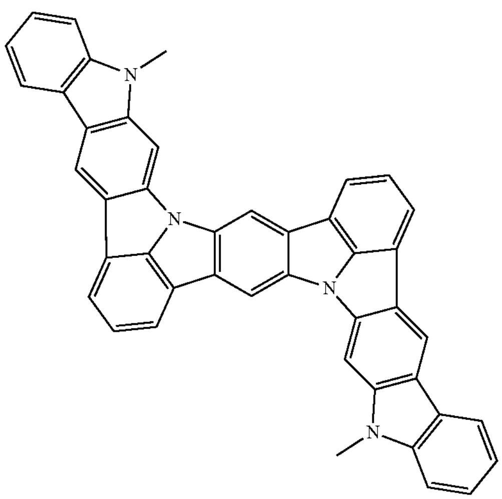
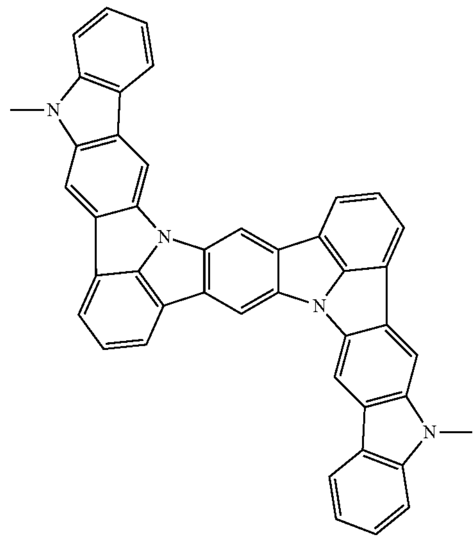
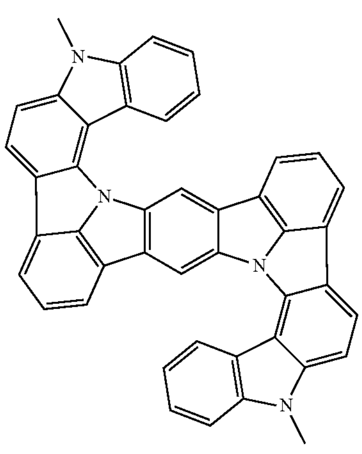
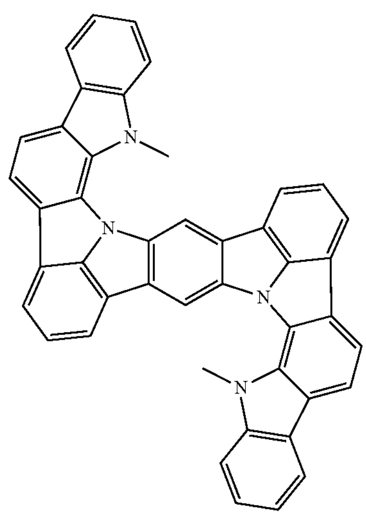

-continued
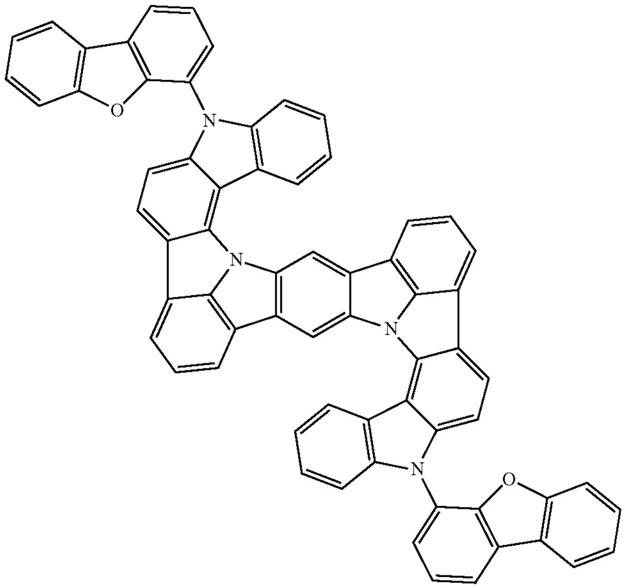
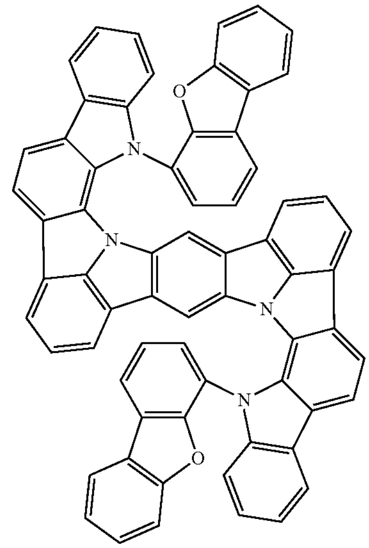
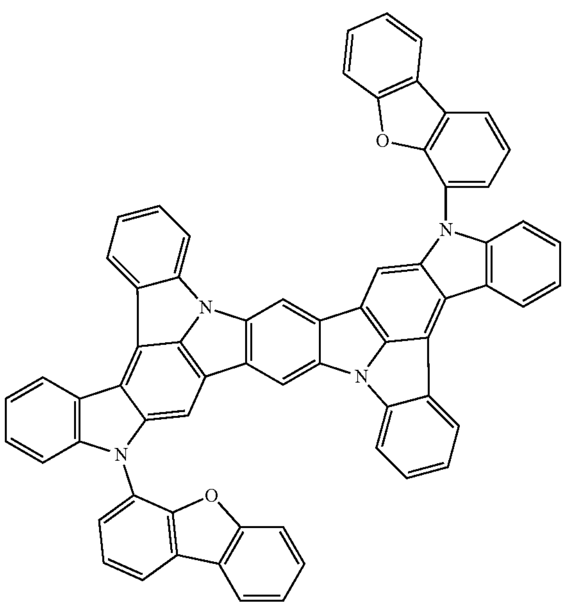
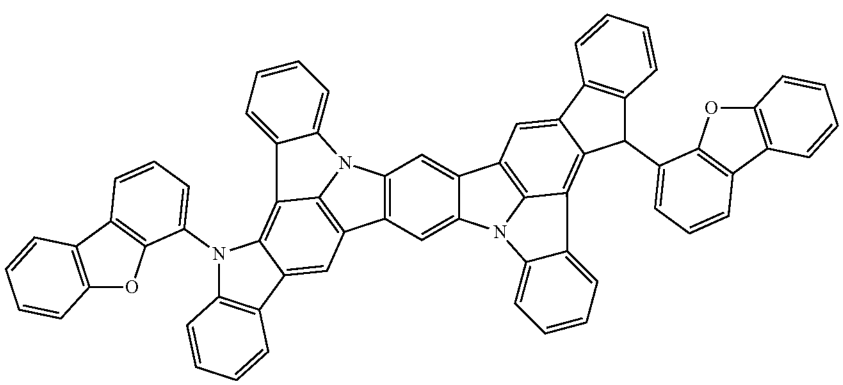

-continued
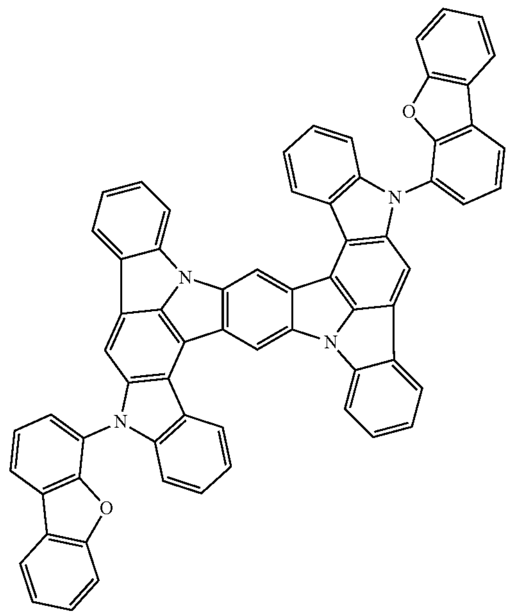
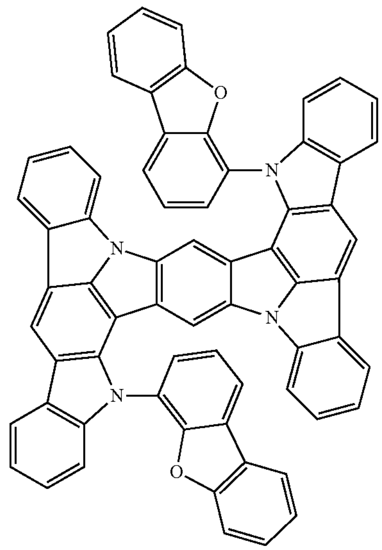
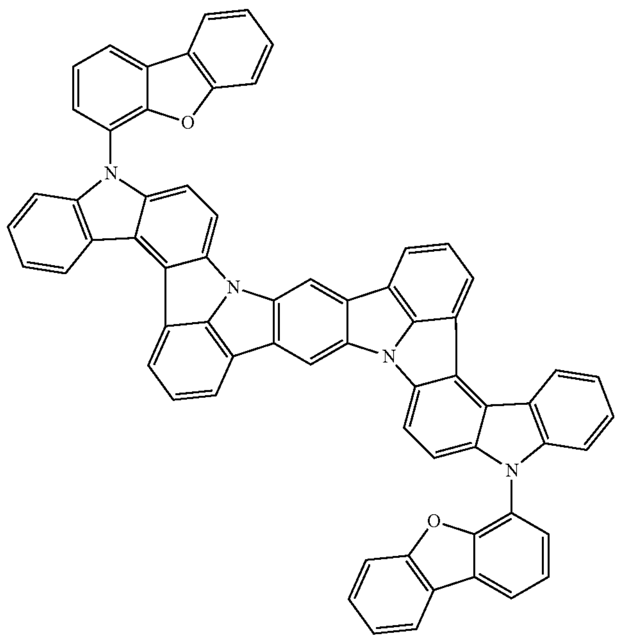
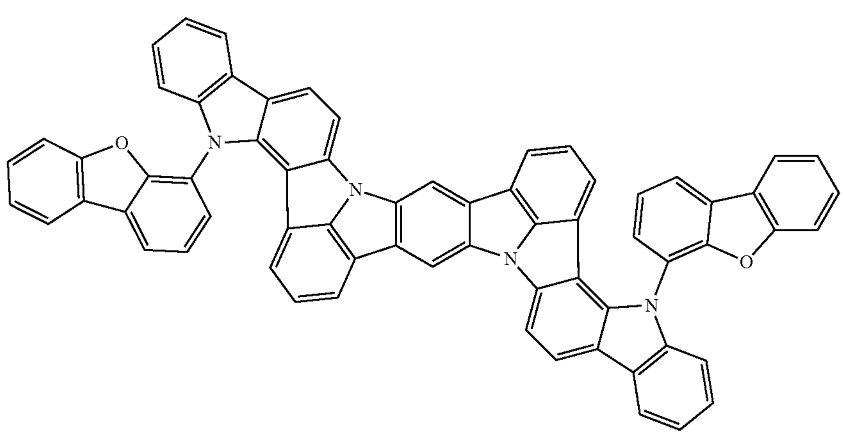

-continued
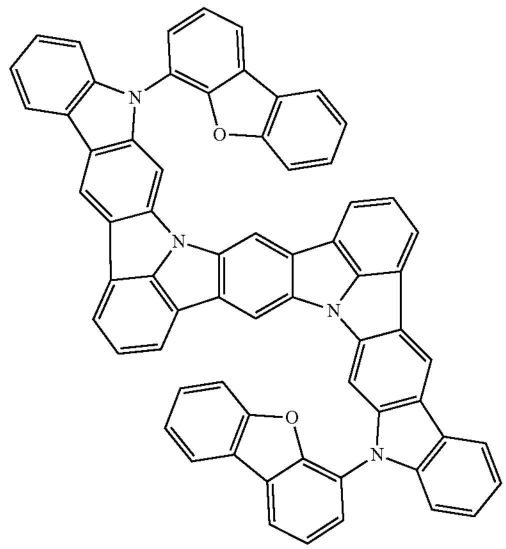
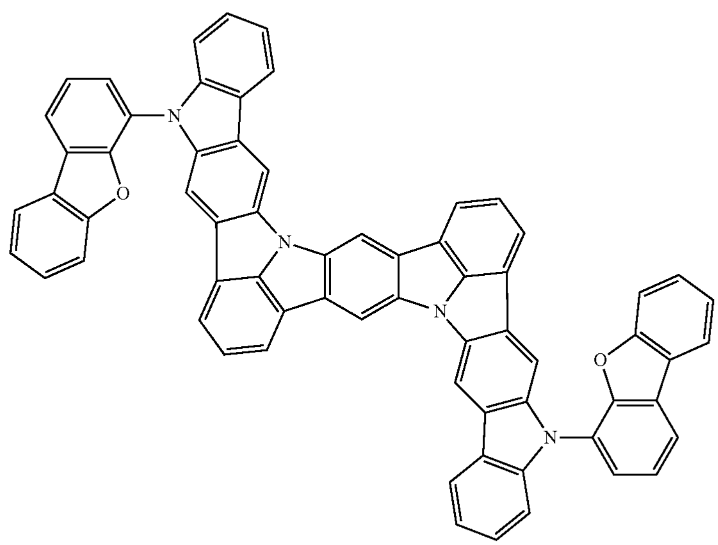
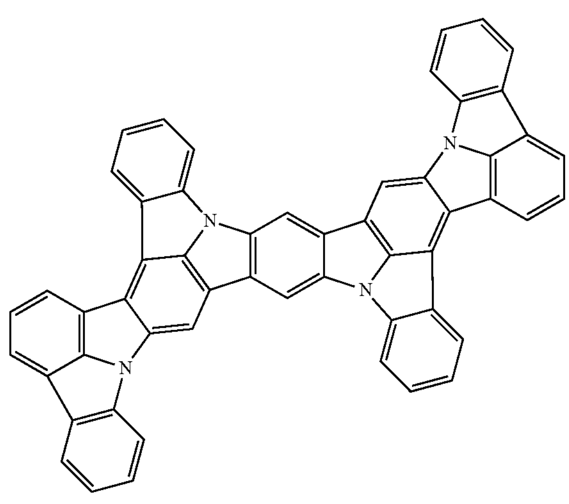

-continued
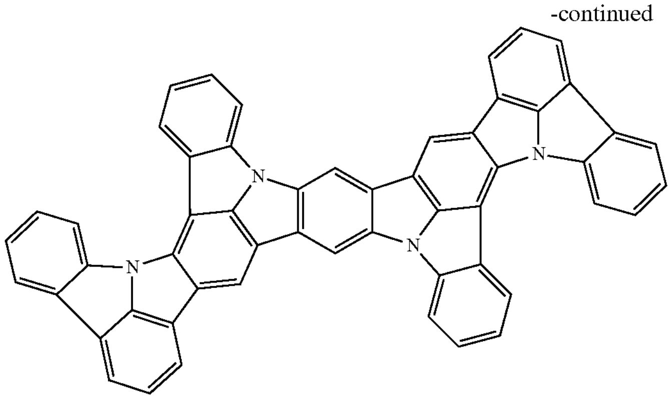
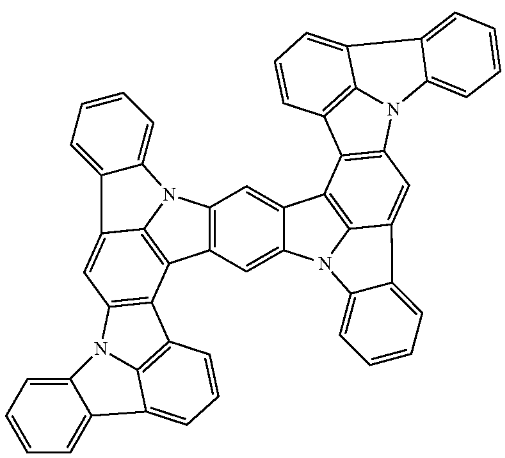
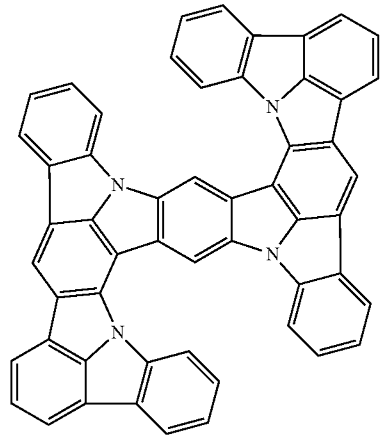
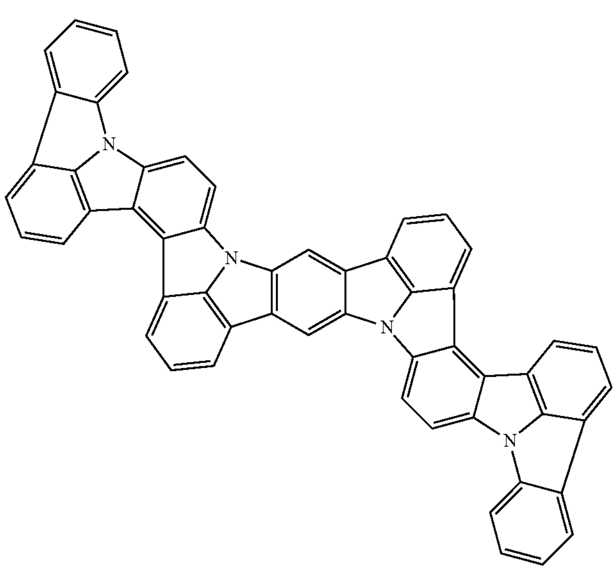

-continued
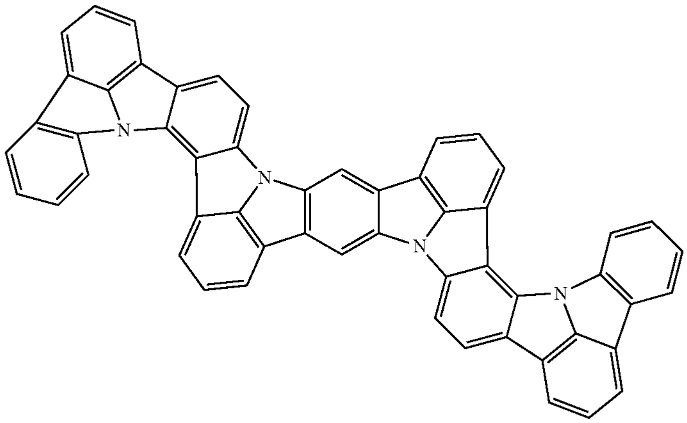
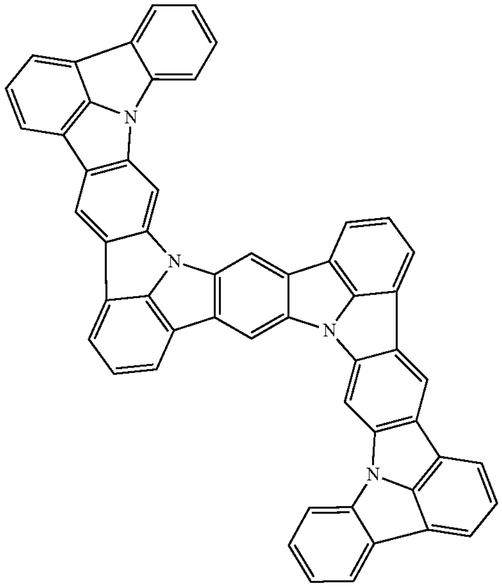
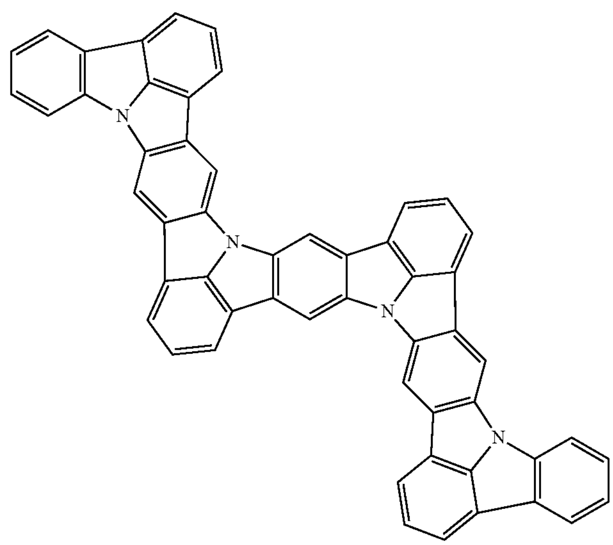
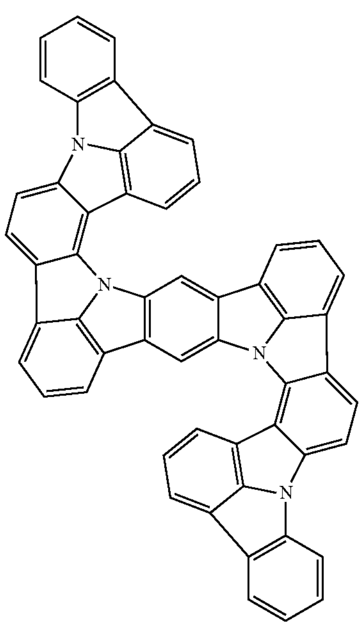
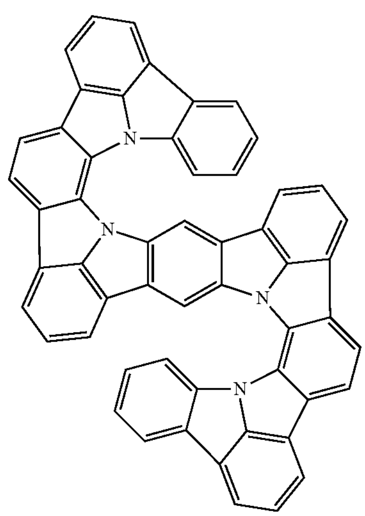

-continued
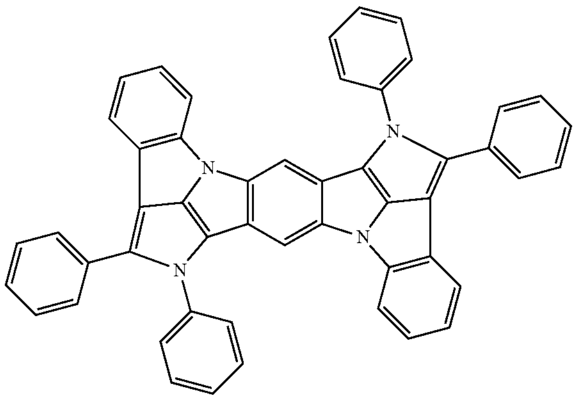
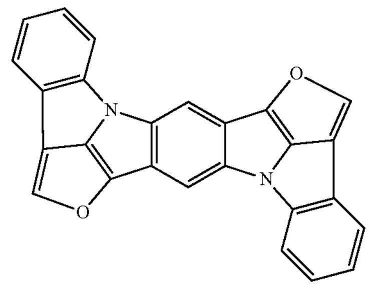
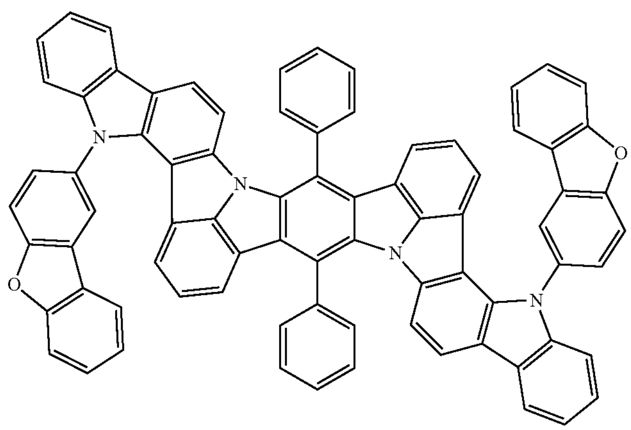
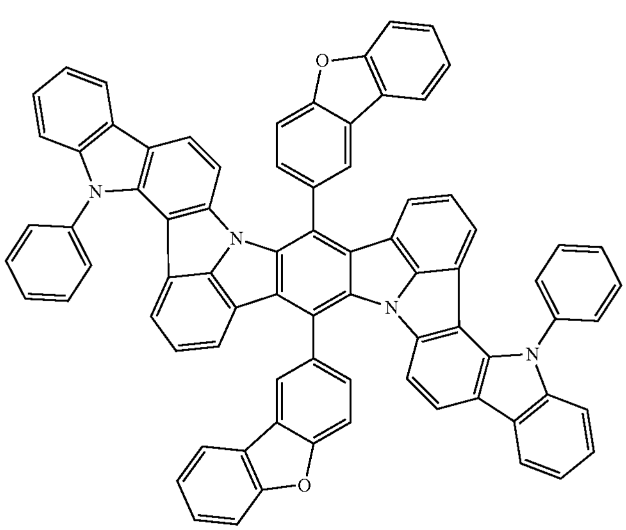
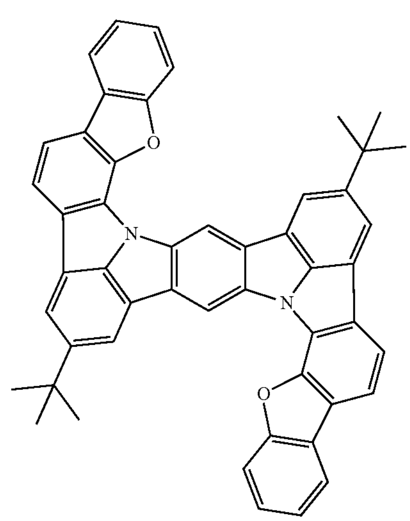

-continued

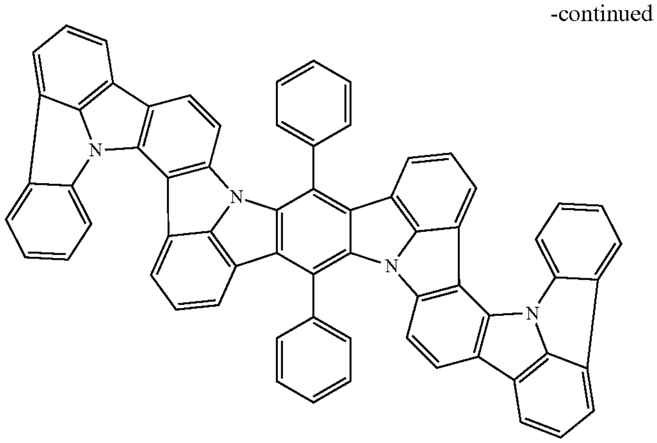

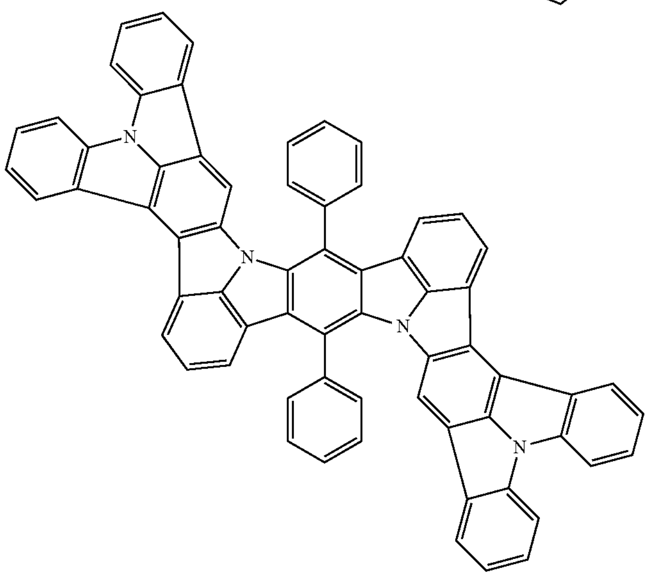

(Compound Represented by the Formula (B31))

A compound represented by the following formula (B31) is contained in the first layer.

(B1)

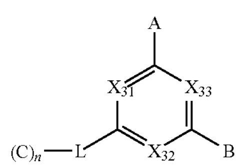

In the formula (B31), one or more of $X_{31}$ to $X_{33}$ is a nitrogen atom, and the others which are not a nitrogen atom are CR.

R is a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$) ($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are as defined in the formula (A1).

When a plurality of R's are present, the plurality of R's may be the same as or different from each other.

A is a substituted or unsubstituted aryl group including 6 to 18 ring carbon atoms, or a substituted or unsubstituted monovalent heterocyclic group including 5 to 13 ring atoms.

B is a substituted or unsubstituted aryl group including 6 to 18 ring carbon atoms, or a substituted or unsubstituted monovalent heterocyclic group including 5 to 13 ring atoms.

L is a single bond, a substituted or unsubstituted (n+1)-valent aromatic hydrocarbon ring group including 6 to 18 ring carbon atoms, or a substituted or unsubstituted (n+1)-valent heterocyclic group including 5 to 13 ring atoms. The aromatic hydrocarbon ring group may be a structure formed by bonding two or more different aromatic hydrocarbon rings.

C's are independently a substituted or unsubstituted aryl group including 6 to 30 ring carbon atoms, or a substituted or unsubstituted monovalent heterocyclic group including 5 to 60 ring atoms.

n is an integer of 1 to 3. When n is 2 or more, L is not a single bond.

Provided that when two of $X_{31}$ to $X_{33}$ are nitrogen atoms, n is 2, and L is a trivalent benzene ring, A and B are not unsubstituted m-biphenyl groups; when two of $X_{31}$ to $X_{33}$ are nitrogen atoms and A is a trivalent benzene ring, B and -L-(C)$_n$ are not unsubstituted m-biphenyl groups; and when two of $X_{31}$ to $X_{33}$ are nitrogen atoms and B is a trivalent benzene ring, A and -L-(C)$_n$ are not unsubstituted m-biphenyl groups.

In one embodiment, it is preferable that two of $X_{31}$ to $X_{33}$ in the formula (B1) be nitrogen atoms, and is more preferable that $X_{31}$ to $X_{33}$ be nitrogen atoms. In other words, a compound represented by the following formula (B10) is preferable.

(B10)

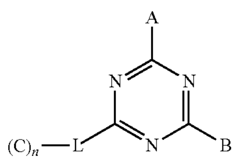

In the formula (B10), A, B, L, C, and n are as defined in the formula (B1).

In one embodiment, the compound represented by the formula (B1) is a compound represented by the following formula (B11a).

(B11a)

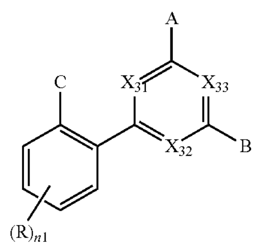

In the formula (B11a), A, B, C, $X_{31}$, $X_{32}$ and $X_{33}$ are as defined in the formula (B1) or the formula (B10).

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is

- a cyano group,
- a substituted or unsubstituted alkyl group including 1 to 50 carbon atoms,
- a substituted or unsubstituted cycloalkyl group including 3 to 50 ring carbon atoms,
- —Si($R_{901}$) ($R_{902}$)($R_{900}$),
- —O—($R_{904}$),
- a substituted or unsubstituted aryl group including 6 to 50 ring carbon atoms, or
- a substituted or unsubstituted monovalent heterocyclic group including 5 to 50 ring atoms.

$R_{901}$ to $R_{904}$ are as defined in the formula (A1).

n1 is an integer of 0 to 4.

When a plurality of R's is present, the plurality of R's may be the same as or different from each other.

In one embodiment, it is preferable that two of $X_{31}$ to $X_{33}$ in the formula (B11a) be nitrogen atoms, and is more preferable that $X_{31}$ to $X_{33}$ be nitrogen atoms, as shown by the following formula (B11).

(B11)

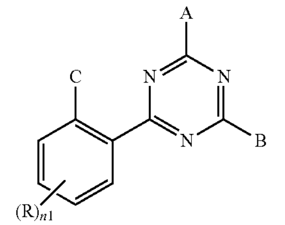

In the formula (B11), A, B, C, R and n1 are as defined in the formula (B11a).

In one embodiment, the compound represented by the formula (B1) is a compound represented by the following formula (B12a).

(B12a)

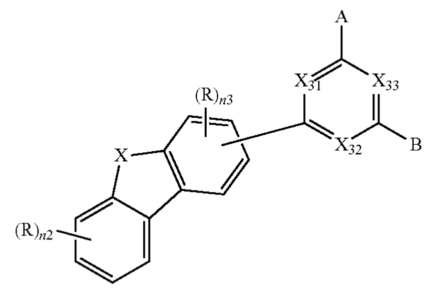

In the formula (B12a), A, B, $X_{31}$, $X_{32}$ and $X_{33}$ are as defined in the formula (B1).

X is $CR_{51}R_{52}$, $NR_{53}$, an oxygen atom or a sulfur atom.

When X is $CR_{51}R_{52}$, $R_{51}$ and $R_{52}$ form a substituted or unsubstituted, saturated or unsaturated ring by bonding with each other, or do not form a substituted or unsubstituted, saturated or unsaturated ring. When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R, $R_{51}$ and $R_{52}$ which do not form the substituted or unsubstituted, saturated or unsaturated ring, and $R_{53}$ are independently,

- a hydrogen atom,
- a cyano group,
- a substituted or unsubstituted alkyl group including 1 to 50 carbon atoms,
- a substituted or unsubstituted cycloalkyl group including 3 to 50 ring carbon atoms,
- —Si($R_{901}$)($R_{902}$)($R_{903}$)
- —O—($R_{904}$),
- a substituted or unsubstituted aryl group including 6 to 50 ring carbon atoms, or
- a substituted or unsubstituted monovalent heterocyclic group including 5 to 50 ring atoms.

$R_{901}$ to $R_{904}$ are as defined in the formula (A1).

n2 is an integer of 0 to 4, and n3 is an integer of 0 to 3.

When a plurality of R's is present, the plurality of R's may be the same as or different from each other.

In one embodiment, it is preferable that two of $X_{31}$ to $X_{33}$ in the formula (B12a) be nitrogen atoms, and is more preferable that $X_{31}$ to $X_{33}$ be nitrogen atoms, as shown by the following formula (B12).

(B12)

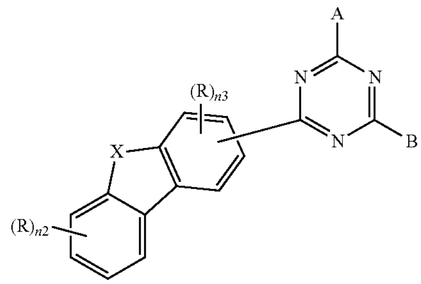

In the formula (B12), A, B, X, R, n2 and n3 are as defined in the formula (B12a).

In one embodiment, the compound represented by the formula (B12) is a compound represented by the following formula (B12-1).

(B12-1)

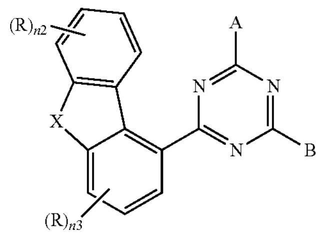

In the formula (B12-1), A, B, X, R, n2 and n3 are as defined in the formula (B12).

In one embodiment, the compound represented by the formula (B1) is a compound represented by the following formula (B13a).

(B13a)

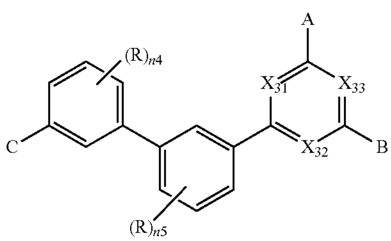

In the formula (B13a), A, B, C, $X_{31}$, $X_{32}$ and $X_{33}$ are as defined in the formula (B1).

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$) ($R_{902}$)($R_{900}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are as defined in the formula (A1).

n4 and n5 are independently, an integer of 0 to 4.

When a plurality of R's is present, the plurality of R's may be the same as or different from each other.

In one embodiment, it is preferable that two of $X_{31}$ to $X_{33}$ in the formula (B13a) be nitrogen atoms, and is more preferable that $X_{31}$ to $X_{33}$ be nitrogen atoms, as shown by the following formula (B13).

(B13)

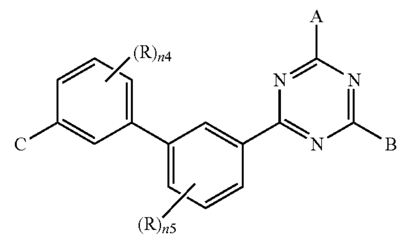

In the formula (B13), A, B, C, R, n4 and n5 are as defined in the formula (B13a).

In one embodiment, C in the formulas is preferably a substituted or unsubstituted monovalent heterocyclic group including 13 to 35 ring atoms, and is preferably a substituted or unsubstituted aryl group including 14 to 24 ring carbon atoms.

In one embodiment, the compound represented by the formula (B1) is a compound represented by the following formula (B14a).

(B14a)

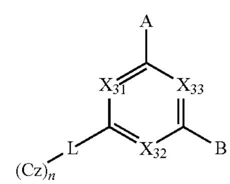

In the formula (B14a), A, B, L, $X_{31}$, $X_{32}$ and $X_{33}$ are as defined in the formula (B1).

Cz is a group represented by any one of the following formulas (Cz1), (Cz2) and (Cz3).

n is an integer of 1 to 3.

(Cz1)

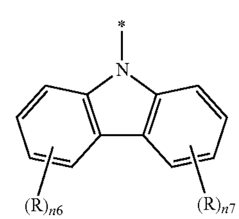

-continued (Cz2)

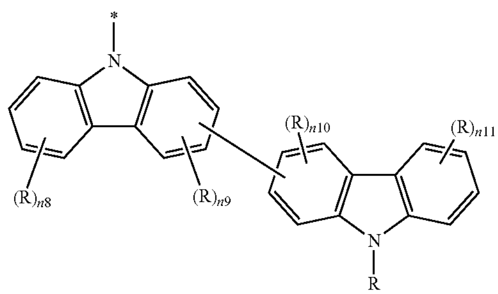

(Cz3)

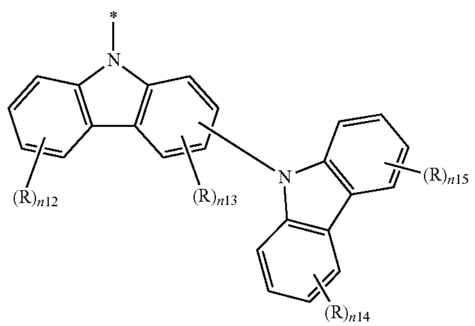

In the formulas (Cz1), (Cz2) and (Cz3), when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are as defined in the formula (A1).

n6 and n7 are independently an integer of 0 to 4.

n8 and n11 are independently an integer of 0 to 4, and n9 and n10 are independently an integer of 0 to 3.

n12, n14 and n15 are independently an integer of 0 to 4, and n13 is an integer of 0 to 3.

When a plurality of R's is present, the plurality of R's may be the same as or different from each other.

* is bonded to L.

In one embodiment, it is preferable that two of $X_{31}$ to $X_{33}$ in the formula (B14a) be nitrogen atoms, and is more preferable that $X_{31}$ to $X_{33}$ be nitrogen atoms, as shown by the following formula (B14).

(B14)

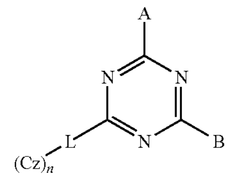

In the formula (B14), A, B, L, Cz, and n are as defined in the formula (B14a).

In one embodiment, the compound represented by the formula (B1) is a compound represented by the following formula (B15a).

(B15a)

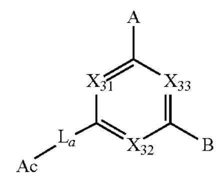

In the formula (B15a), A, B, $X_{31}$, $X_{32}$ and $X_{33}$ are as defined in the formula (B1).

$L_a$ is a single bond, a substituted or unsubstituted divalent aromatic hydrocarbon ring group including 6 to 18 ring carbon atoms, or a substituted or unsubstituted divalent heterocyclic group including 5 to 13 ring atoms.

Ac is a group represented by any one of the following formulas (Ac1), (Ac2) and (Ac3).

(Ac1)

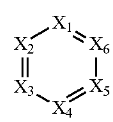

(Ac2)

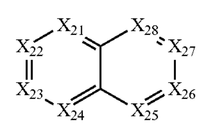

(Ac3)

$$*—D—(CN)_{n16}$$

In the formula (Ac1), one or more of $X_1$ to $X_6$ is a nitrogen atom, the others which are not a nitrogen atom are CR's, and one of R's is a single bond bonded to $L_a$.

R which is not a single bond bonded to $L_a$ is a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$) ($R_{902}$)($R_{900}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are as defined in the formula (A1).

When a plurality of R's is present, the plurality of R's may be the same as or different from each other.

In the formula (Ac2), one or more of $X_{21}$ to $X_{28}$ is a nitrogen atom, the others which are not a nitrogen atom are CR's, and one of R's is a single bond bonded to $L_a$.

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which is not a single bond bonded to $L_a$, and which does not form the substituted or unsubstituted, saturated or unsaturated ring is a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$), —O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are as defined in the formula (A1).

When a plurality of R's is present, the plurality of R's may be the same as or different from each other.

In the formula (Ac3),

D is an aryl group including 6 to 18 ring carbon atoms, which is substituted by n16 cyano groups, or a monovalent heterocyclic group including 5 to 13 ring atoms, which is substituted by n16 cyano groups. Provided that D may have a substituent other than a cyano group.

n16 represents the number of cyano groups which are substituents on D and is an integer of 1 to 9.

* is bonded to $L_a$.

In one embodiment, it is preferable that two of $X_{31}$ to $X_{33}$ in the formula (B15a) be nitrogen atoms, and is more preferable that $X_{31}$ to $X_{33}$ be nitrogen atoms, as shown by the following formula (B15).

(B15)

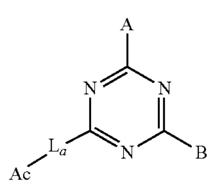

In the formula (B15), A, B, $L_a$ and Ac are as defined in the formula (B15a).

In one embodiment, the compound represented by the formula (B1) is a compound represented by the following formula (B16a).

(B16a)

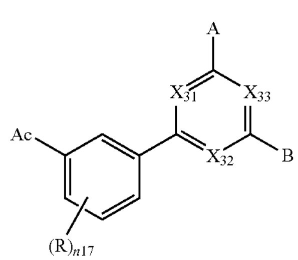

In the formula (B16a),

A, B, Ac, $X_{31}$, $X_{32}$ and $X_{33}$ are as defined in the formula (B15a). n17 is an integer of 0 to 4.

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which does not form the ring is a cyano group, a substituted or unsubstituted alkyl group including 1 to 50 carbon atoms, a substituted or unsubstituted cycloalkyl group including 3 to 50 ring carbon atoms, —Si($R_{901}$) ($R_{902}$)($R_{900}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are as defined in the formula (A1).

When a plurality of R's is present, the plurality of R's may be the same as or different from each other.

In one embodiment, it is preferable that two of $X_{31}$ to $X_{33}$ in the formula (B16a) be nitrogen atoms, and is more preferable that $X_{31}$ to $X_{33}$ be nitrogen atoms, as shown by the following formula (B16).

(B16)

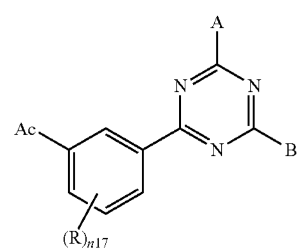

In the formula (B16), A, B, Ac, R and n17 are as defined in the formula (B16a).

In one embodiment, a compound represented by the following formula (B16-1) is preferred.

(B16-1)

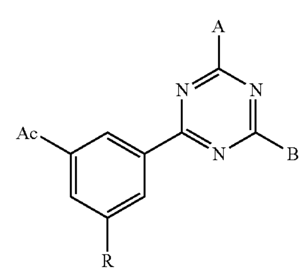

In the formula (B16-1), A, B, Ac and Rare as defined in the formula (B16a).

In one embodiment, L or $L_a$ in each of the formulas is an aromatic hydrocarbon ring group represented by the following formula (L1) or (L2).

(L1)

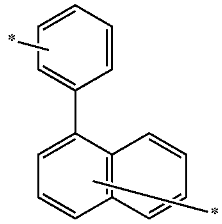

(L2)

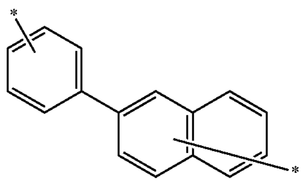

In the formulas (L1) and (L2), either one of two *s is bonded to the nitrogen-containing six-membered ring and the other is bonded to $(C)_n$, (Cz), or Ac. When n is an integer of 1 to 3, one to three bonds to (C), or (Cz), are present, respectively.

In one embodiment, L in each of the formulas is a single bond, or a substituted or unsubstituted (n+1)-valent aromatic hydrocarbon ring group including 6 to 12 ring carbon atoms.

In one embodiment, L or $L_a$ in each of the formulas is a single bond.

In one embodiment, A in each of the formulas is preferably a substituted or unsubstituted aryl group including 6 to 12 ring carbon atoms, and is more preferably a substituted or unsubstituted phenyl group, a substituted or unsubstituted biphenyl group, or a substituted or unsubstituted naphthyl group, and is still more preferably a phenyl group, a biphenyl group, or a naphthyl group.

In one embodiment, B in each of the formulas is preferably a substituted or unsubstituted aryl group including 6 to 12 ring carbon atoms, and is more preferably a substituted or unsubstituted phenyl group, a substituted or unsubstituted biphenyl group, or a substituted or unsubstituted naphthyl group, and is still more preferably a phenyl group, a biphenyl group, or a naphthyl group.

Specific examples of the compound represented by the formula (B1) include the following compounds.

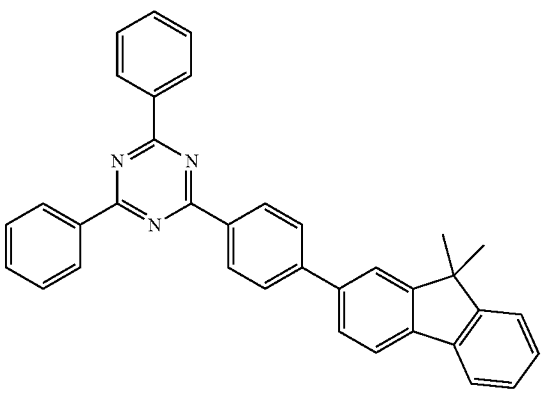

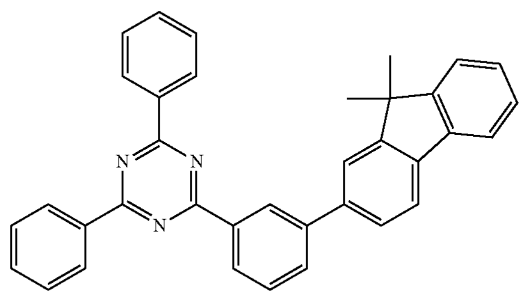

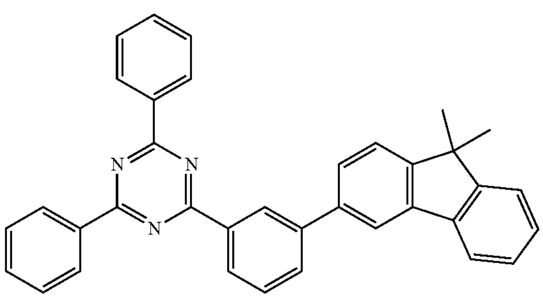

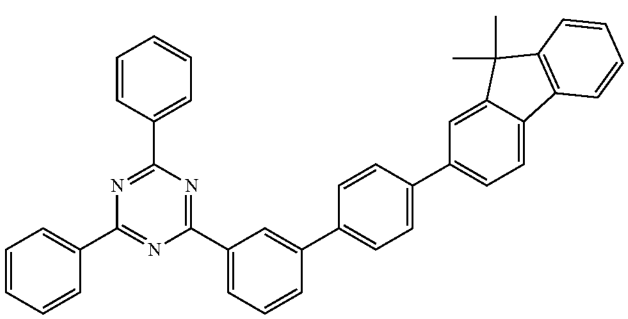

-continued
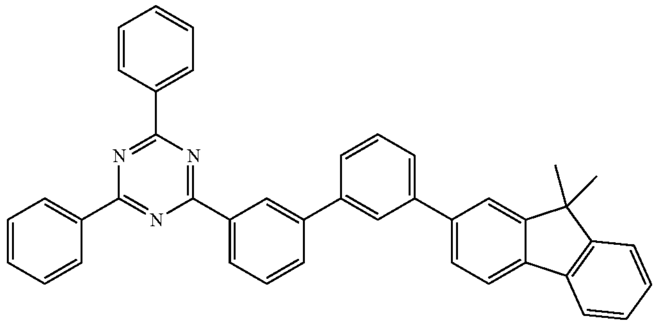
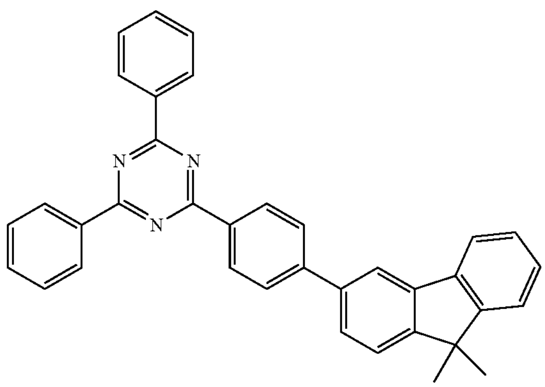
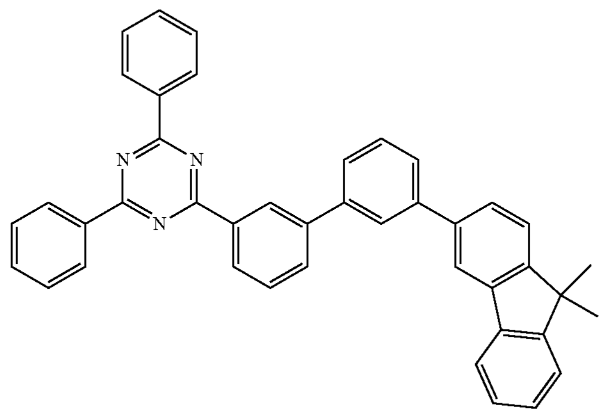
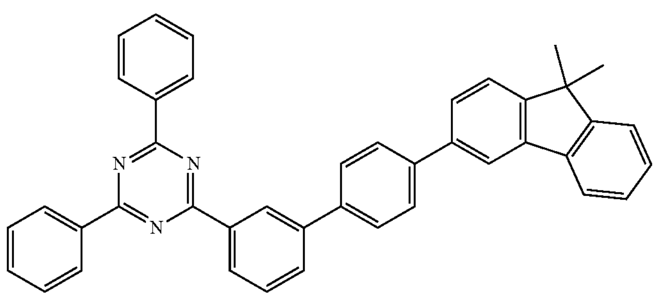
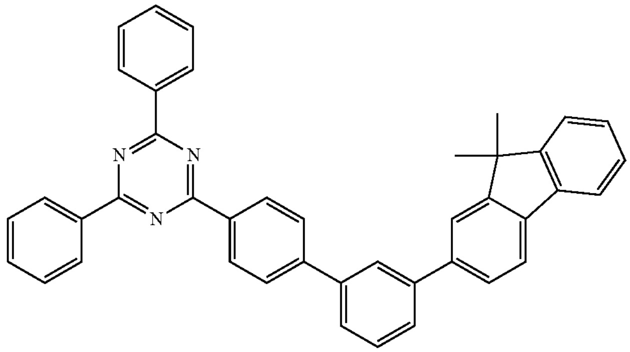

-continued
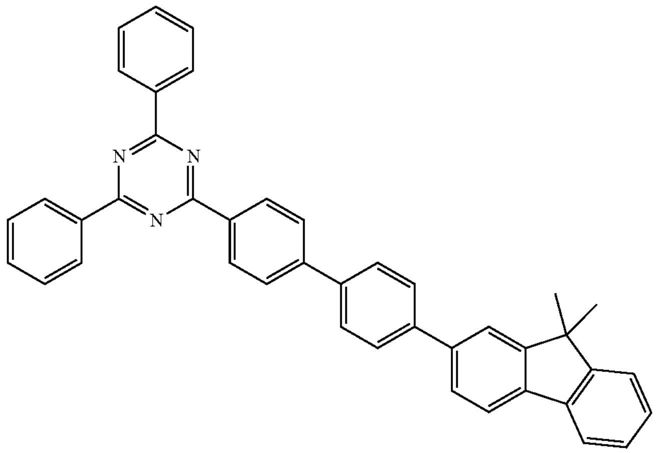
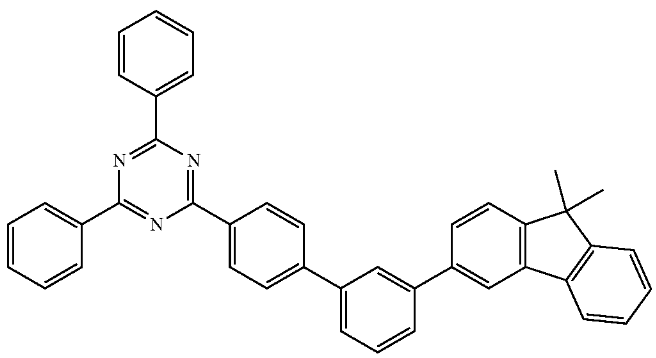
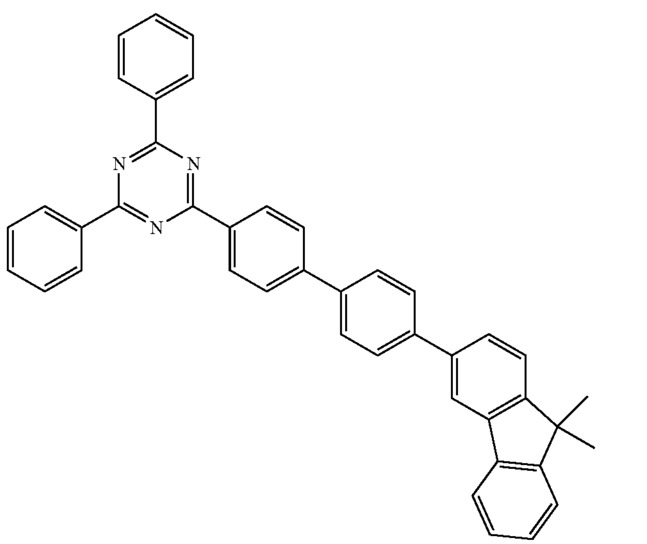
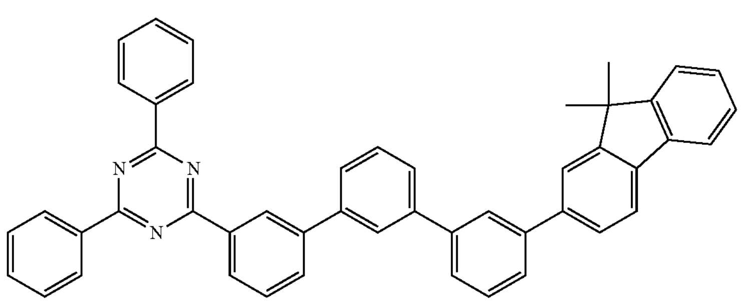

-continued
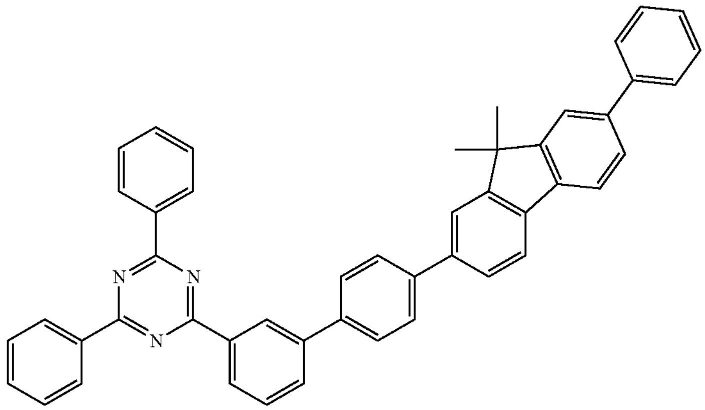
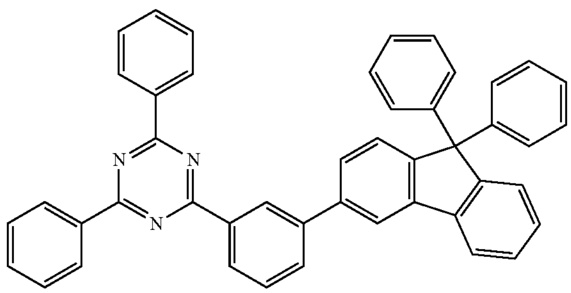
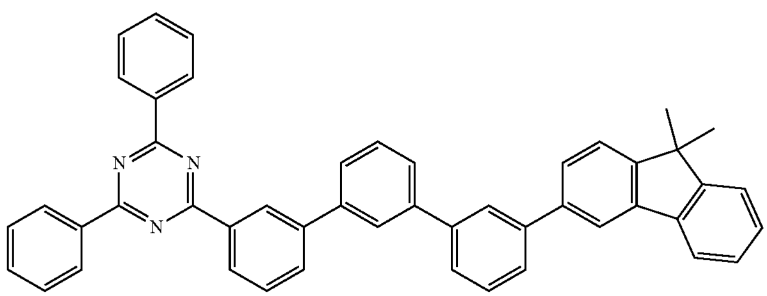
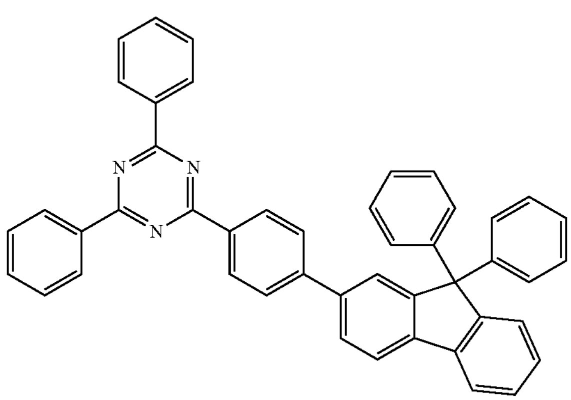
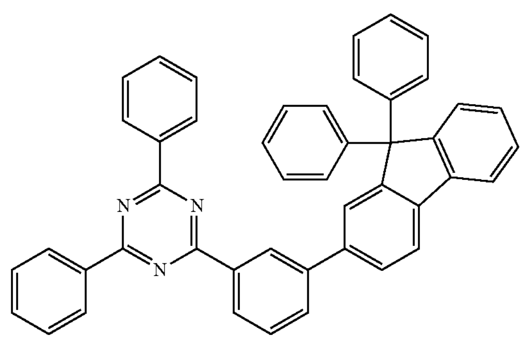

-continued
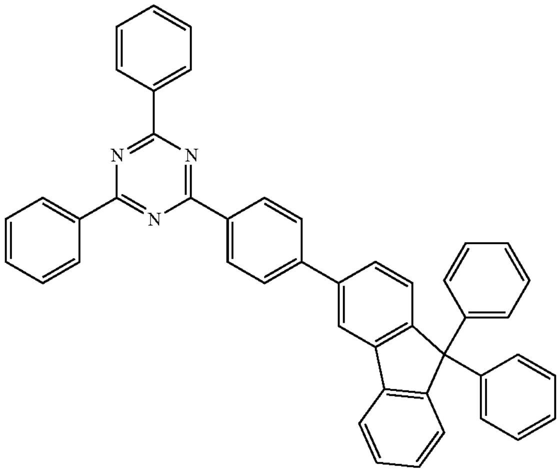
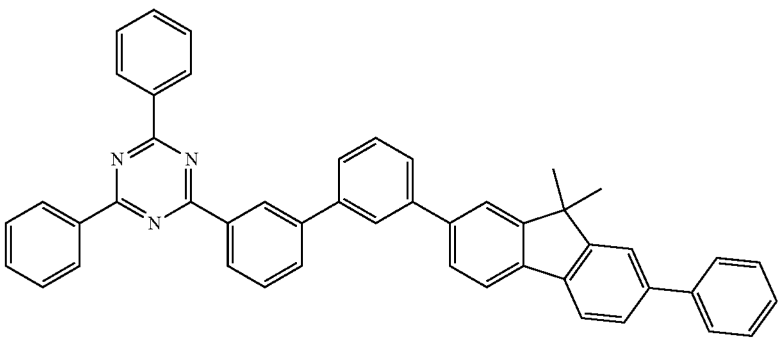
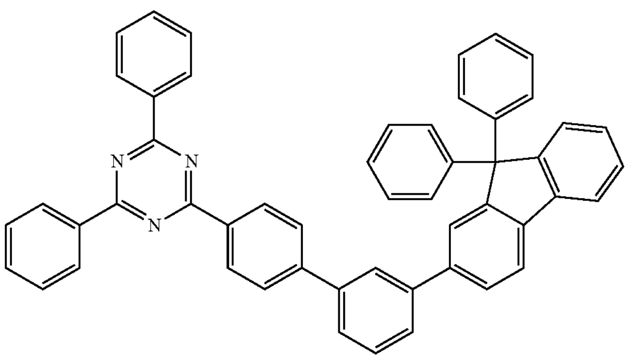
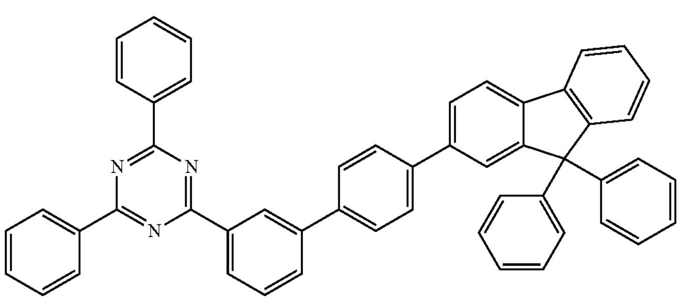

-continued
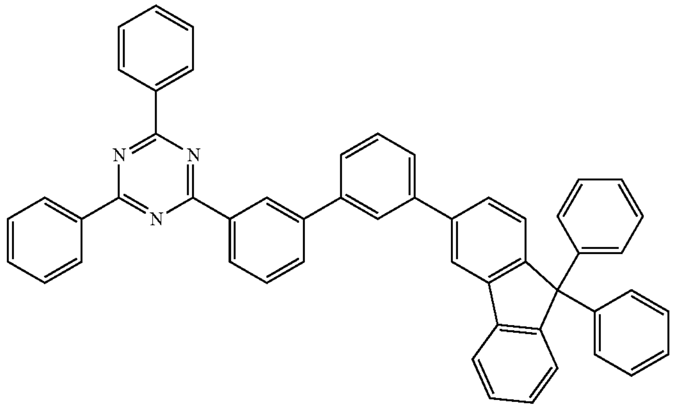
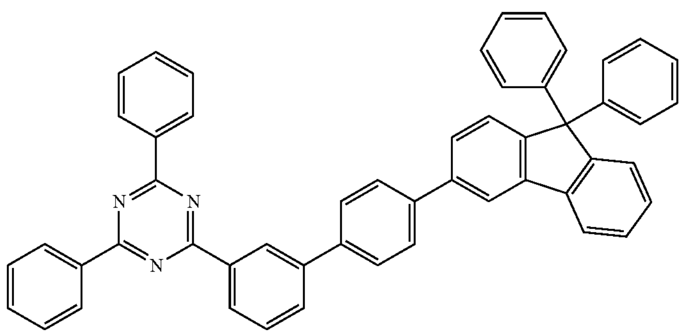
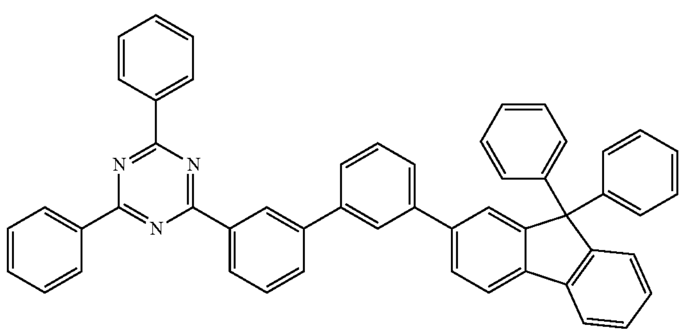
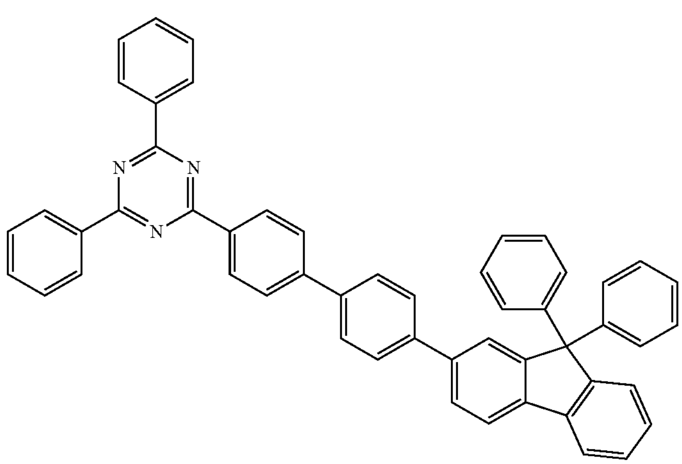

-continued
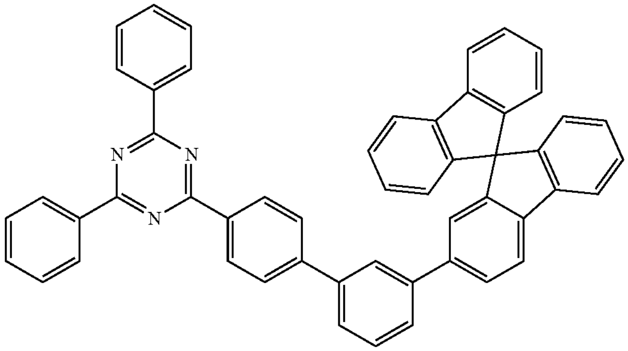
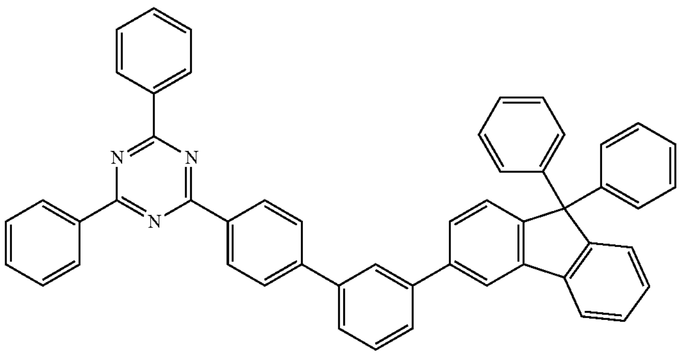
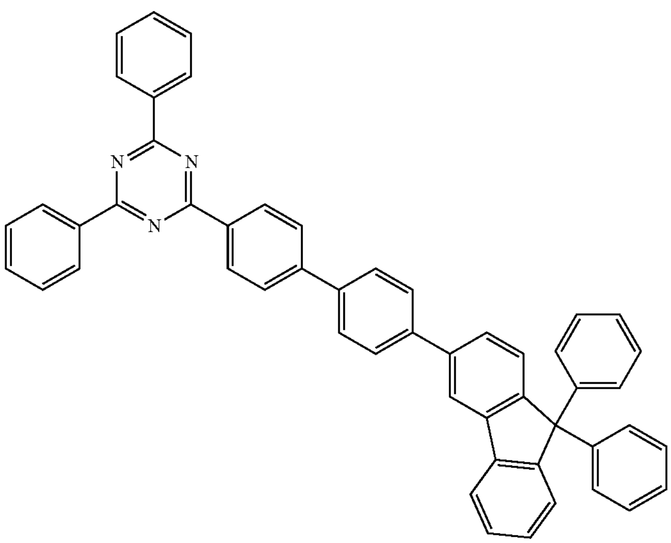
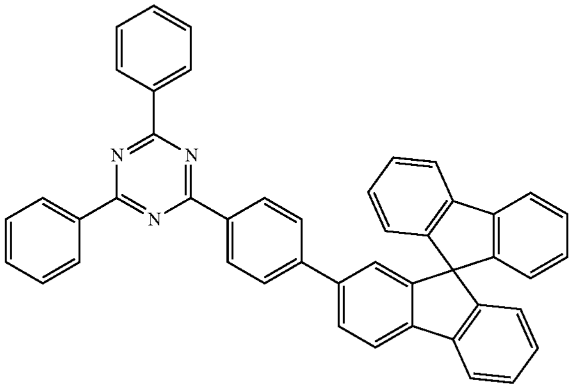
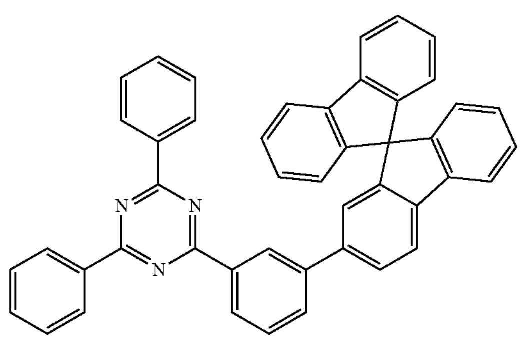

-continued
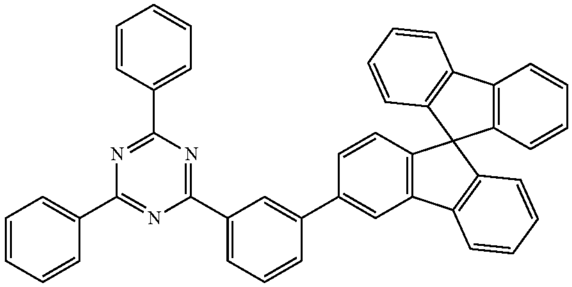
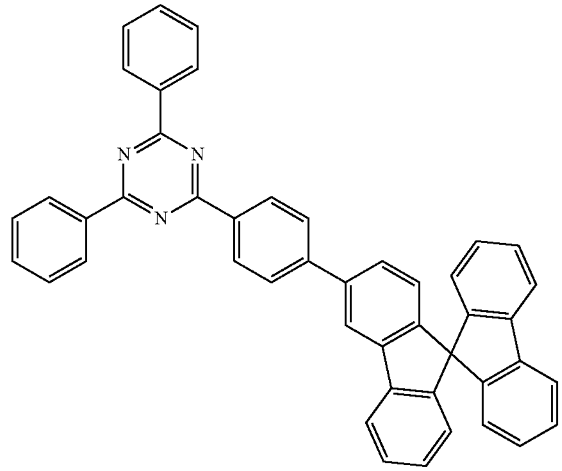
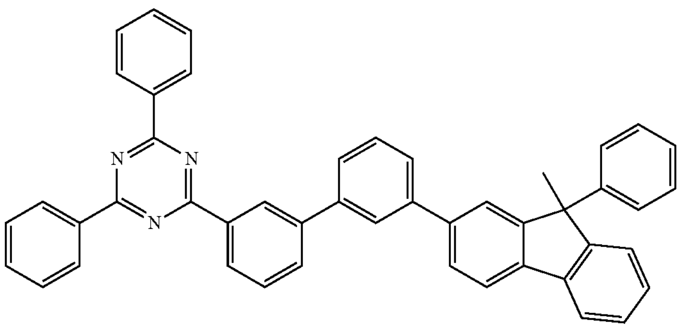
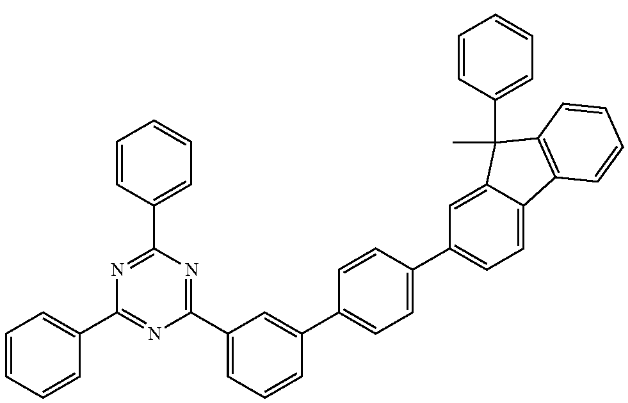
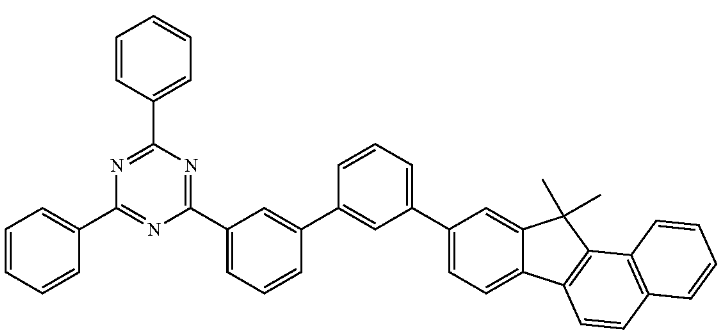

-continued
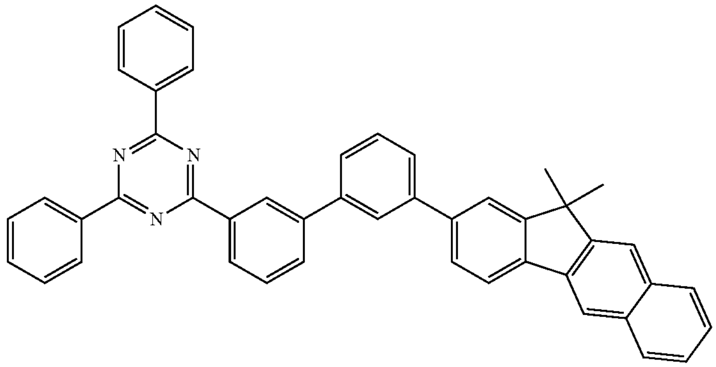
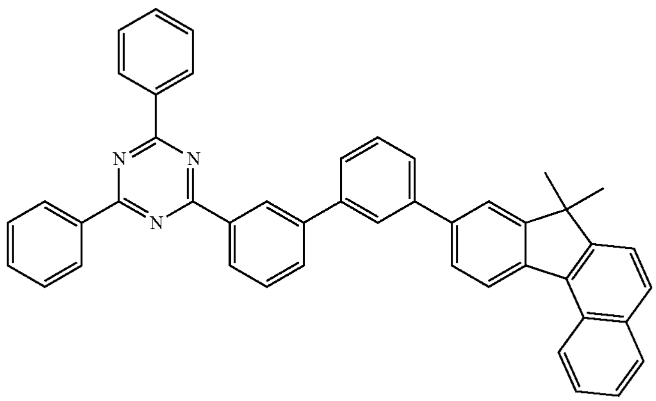
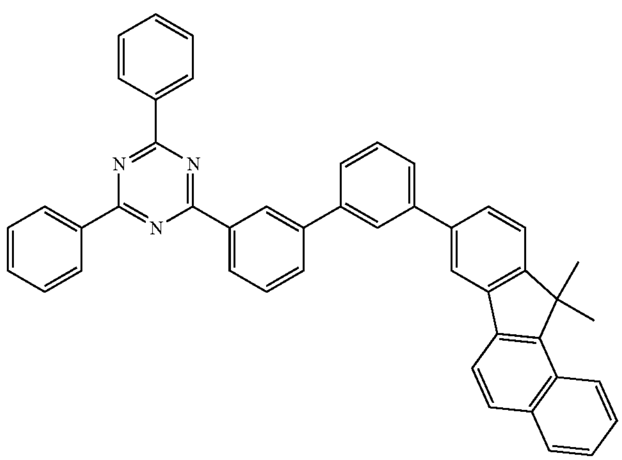
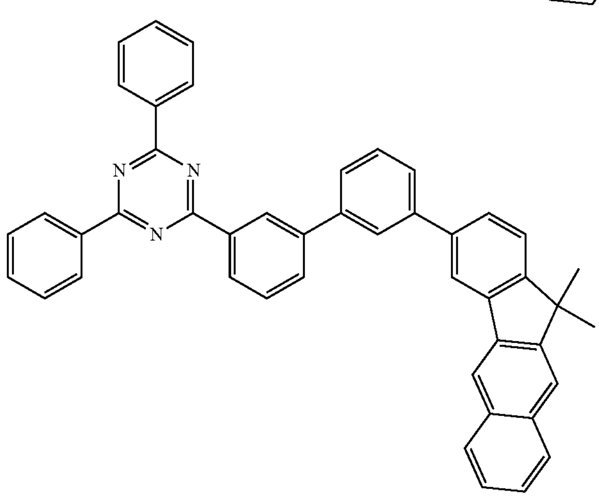

-continued
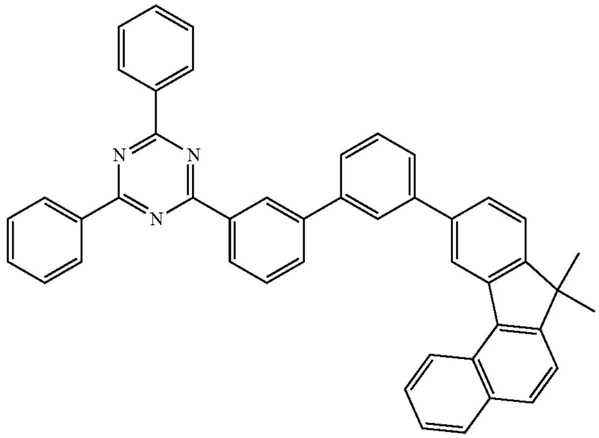
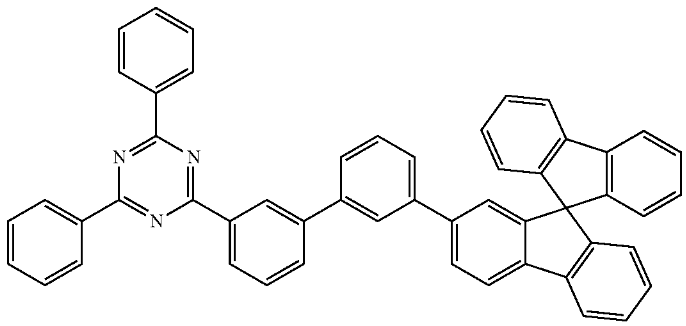
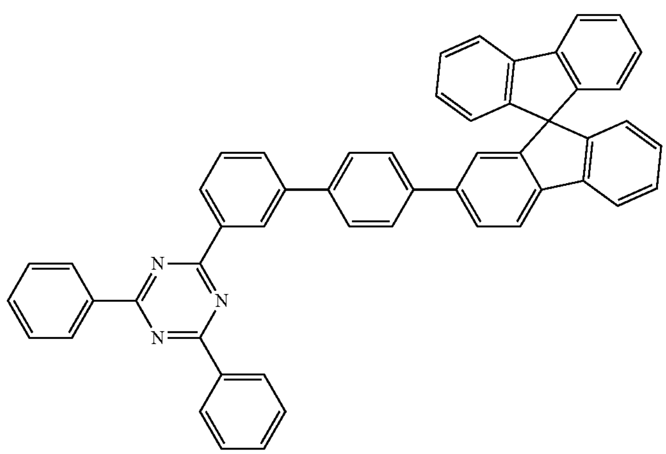
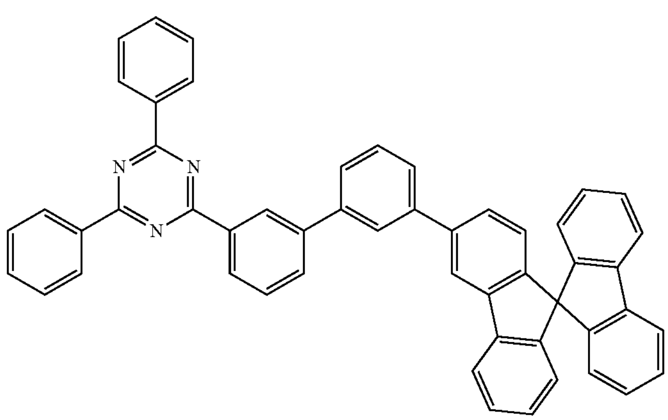

-continued
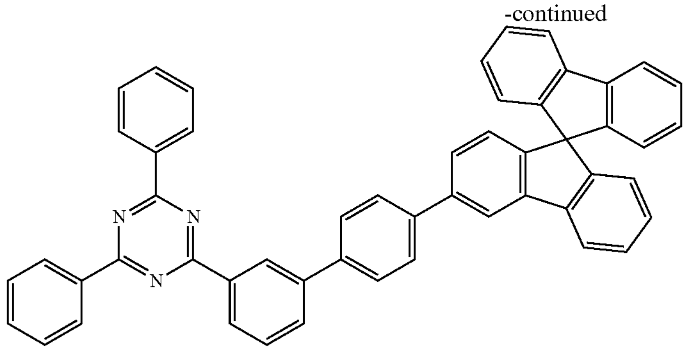
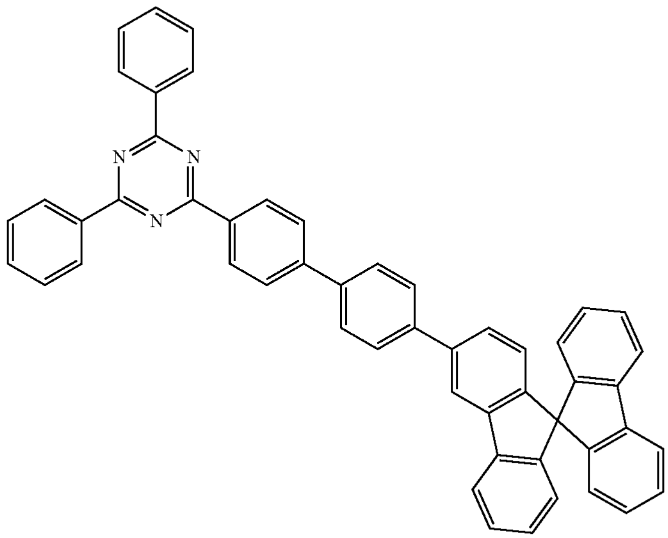
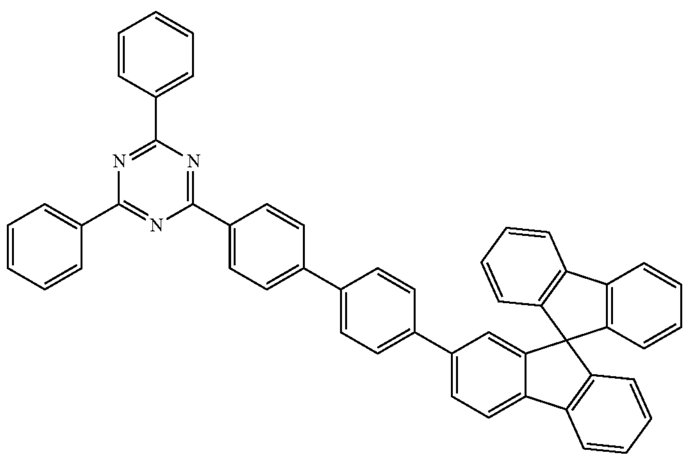
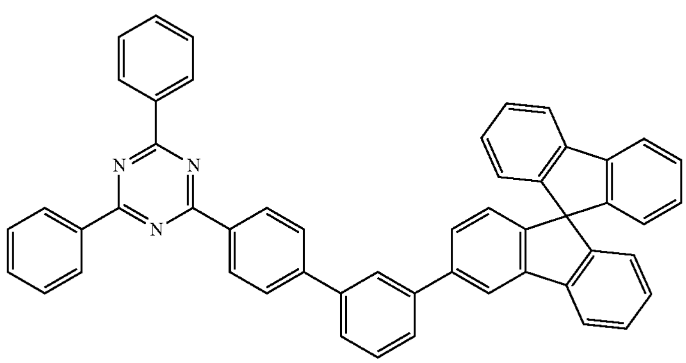

-continued
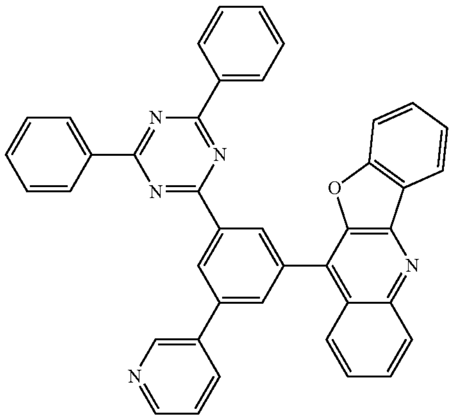
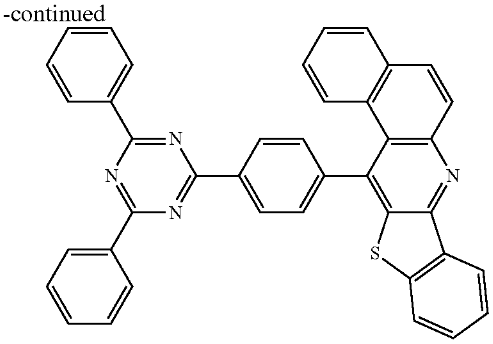
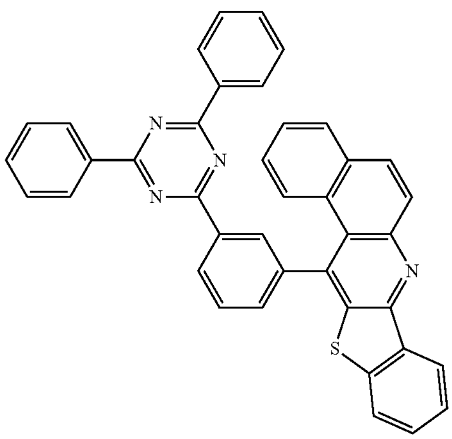
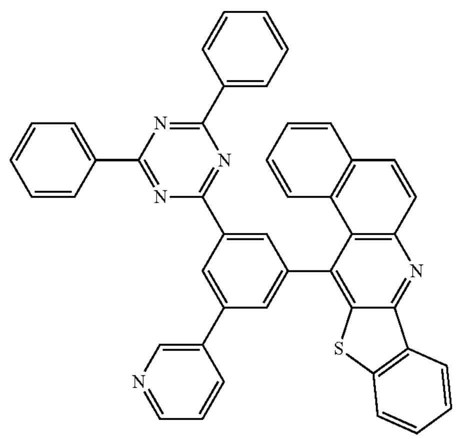
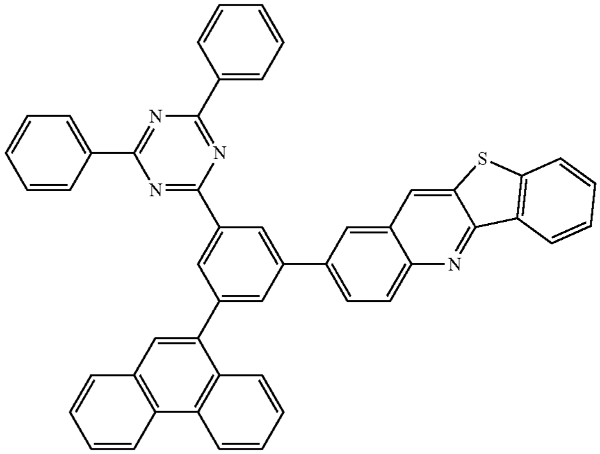

-continued
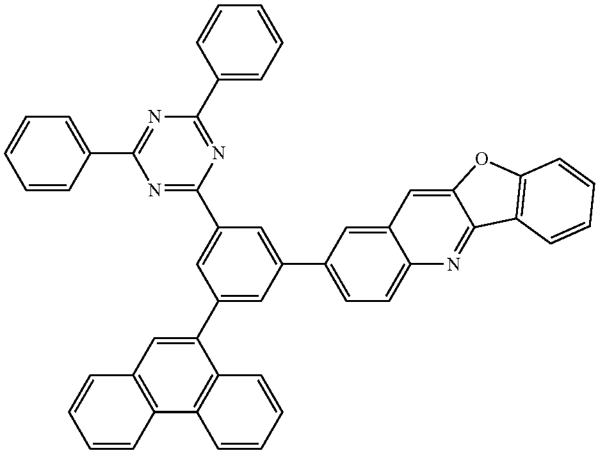
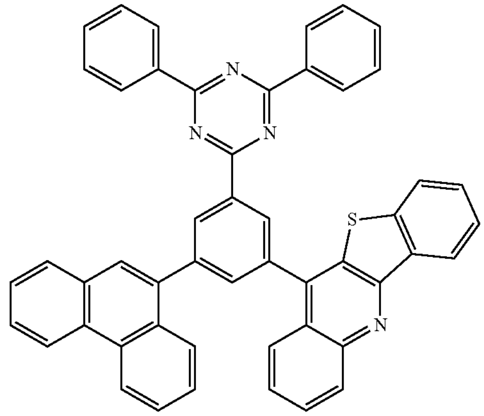
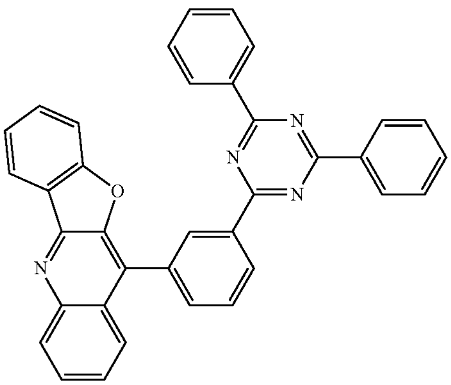
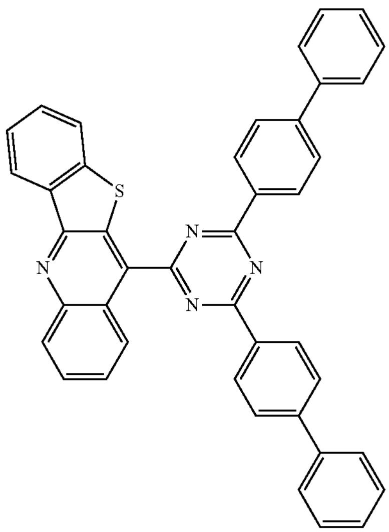
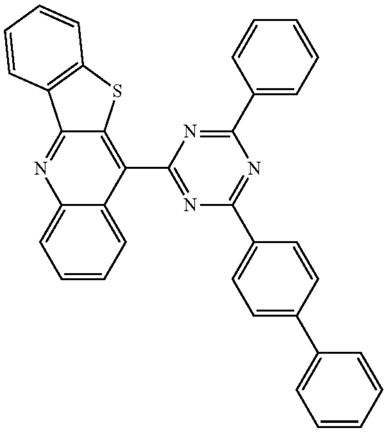
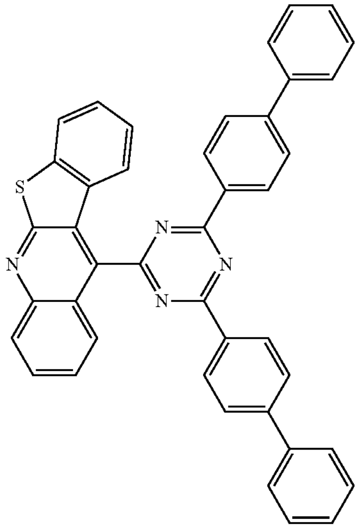

-continued
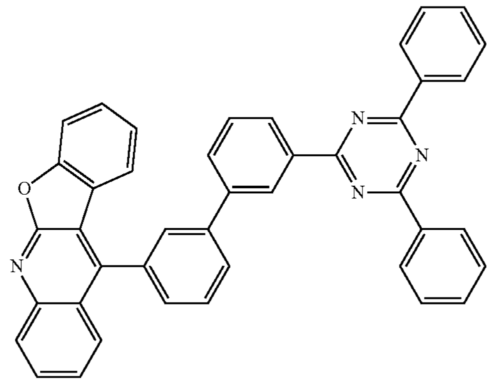
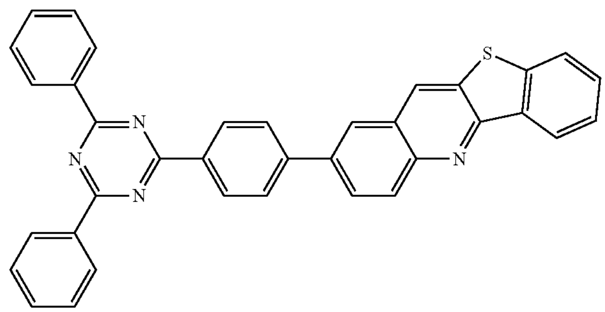
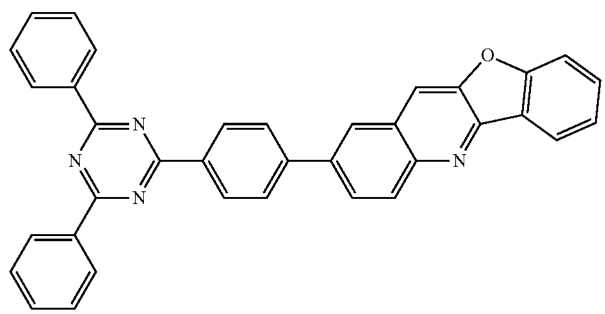
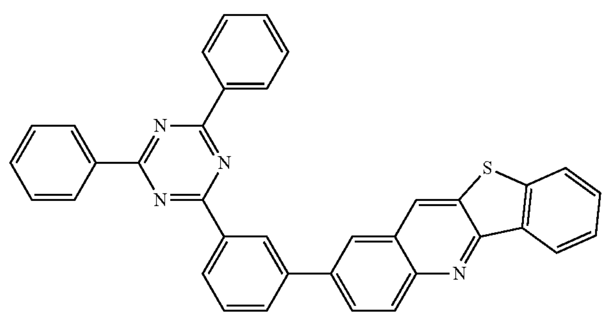
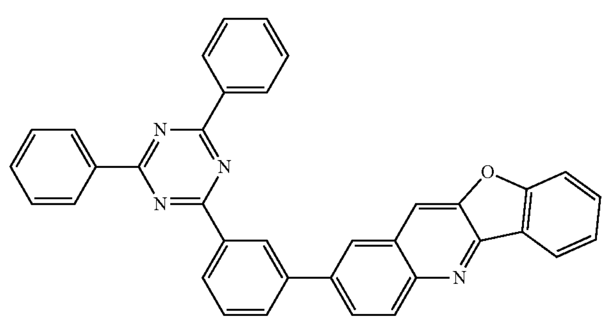

-continued
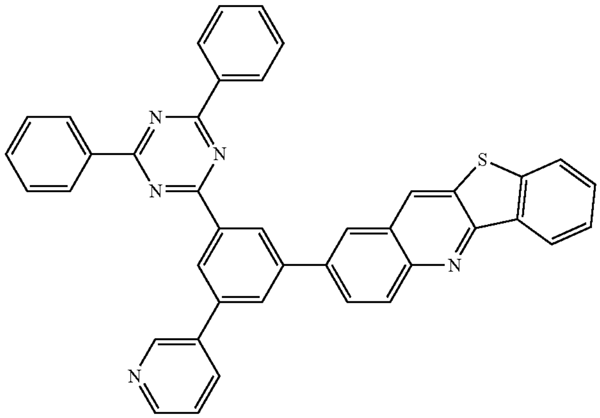
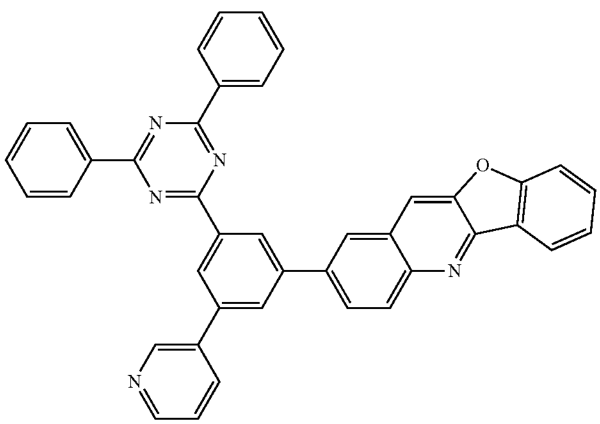
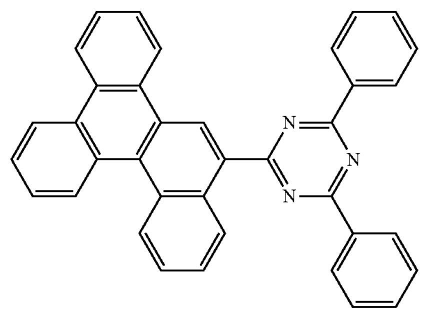
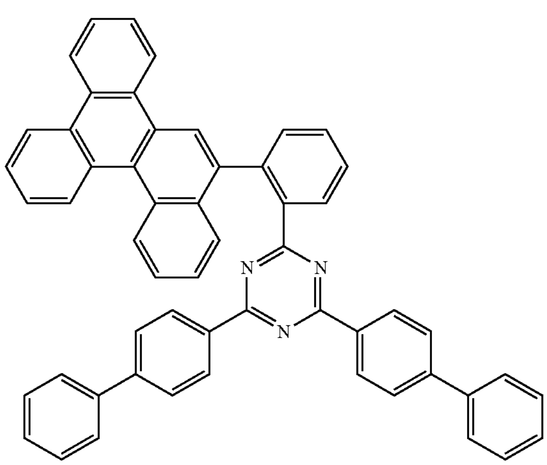
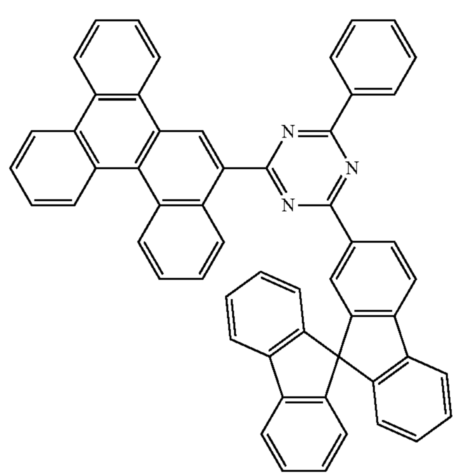

-continued
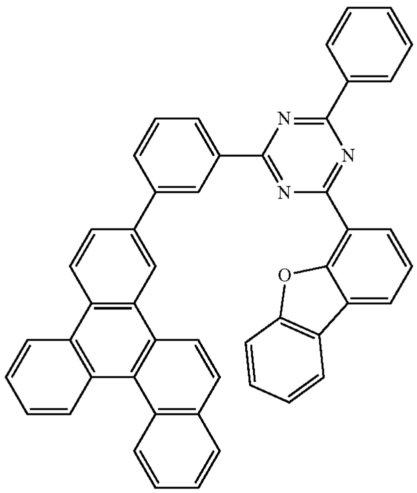
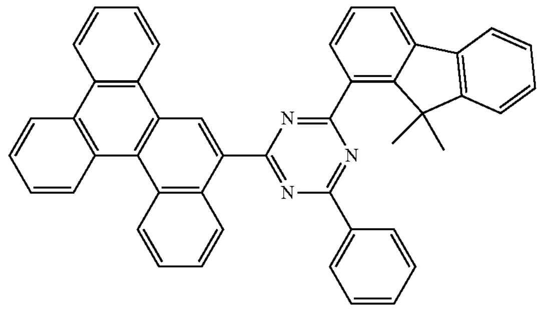
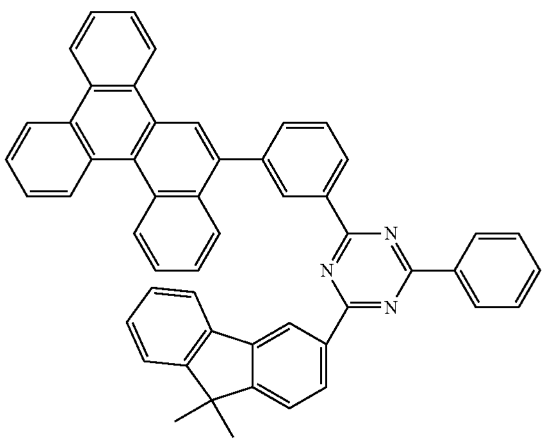
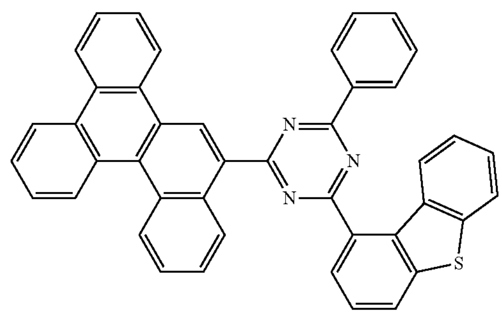
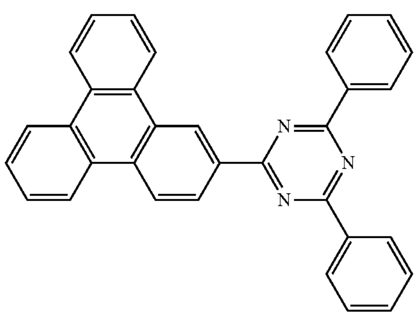
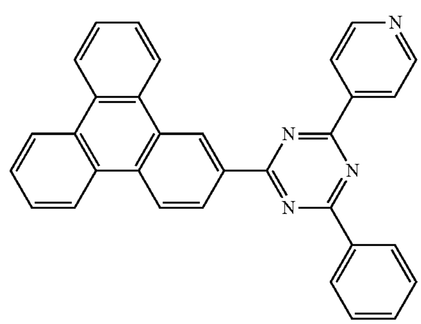
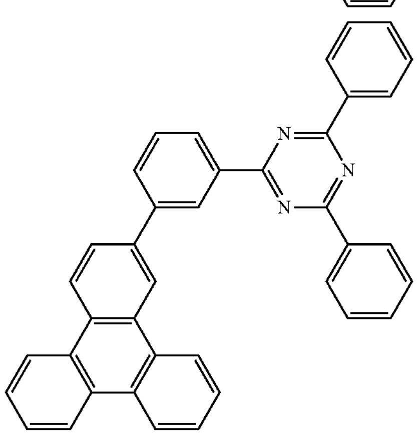
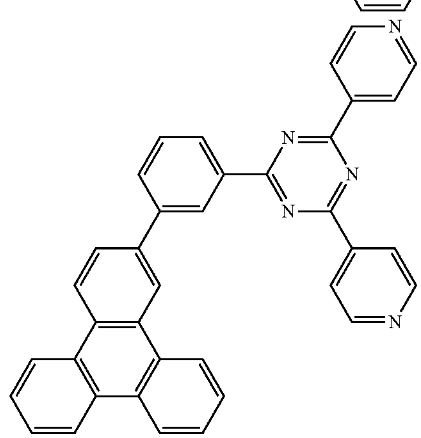

-continued
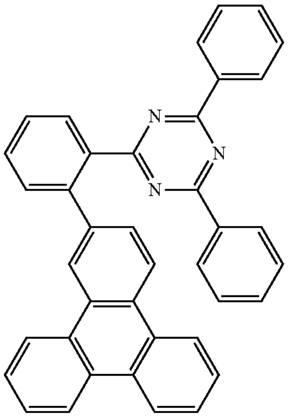
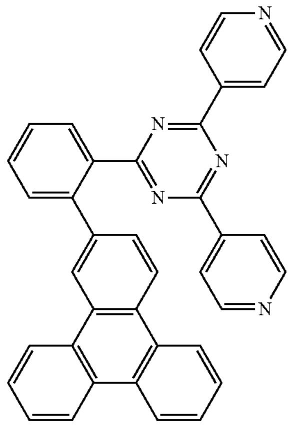
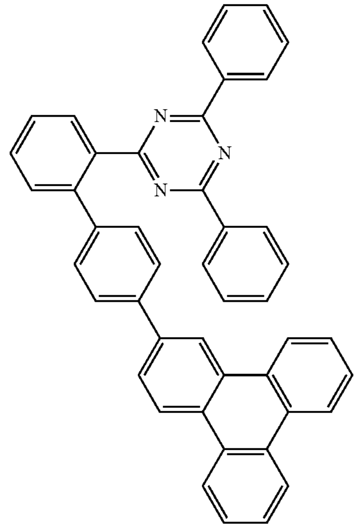
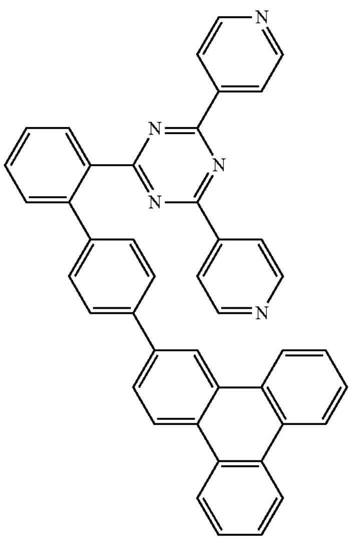
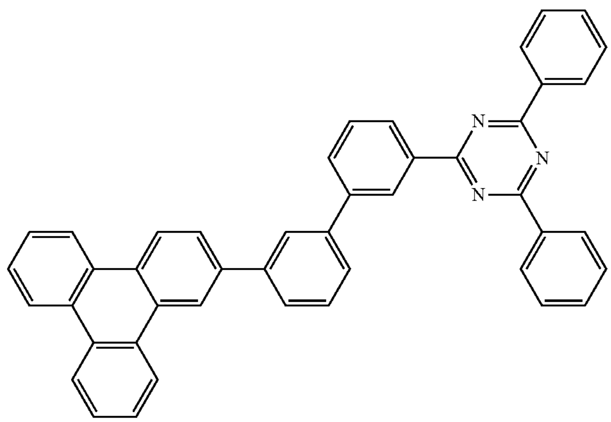
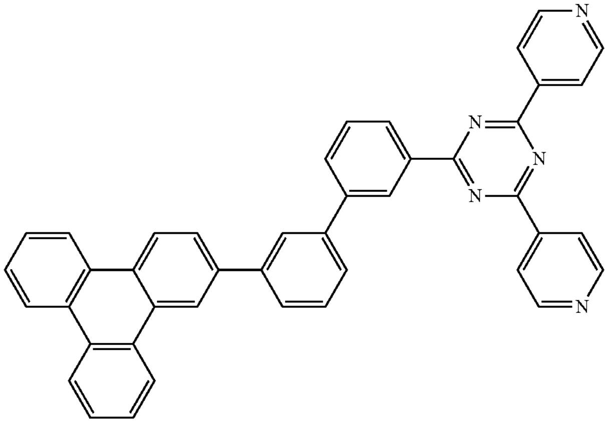

-continued
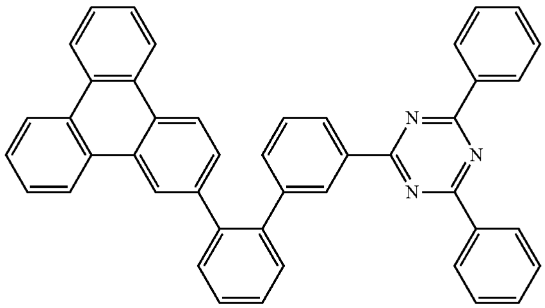
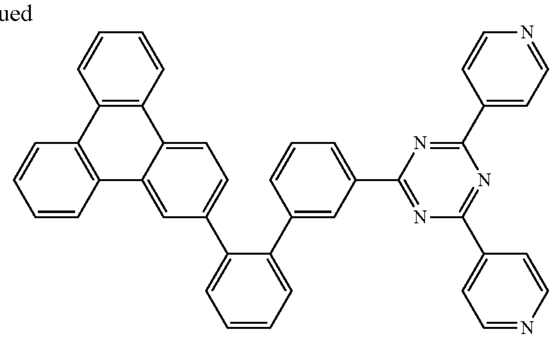
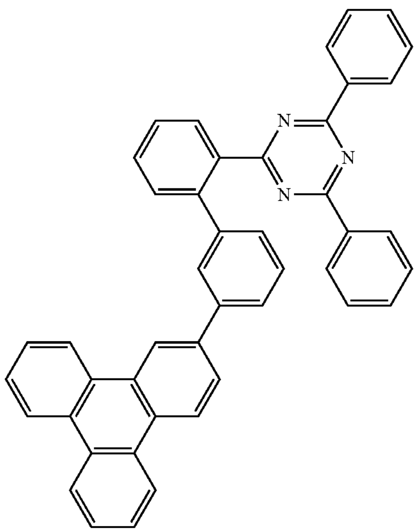
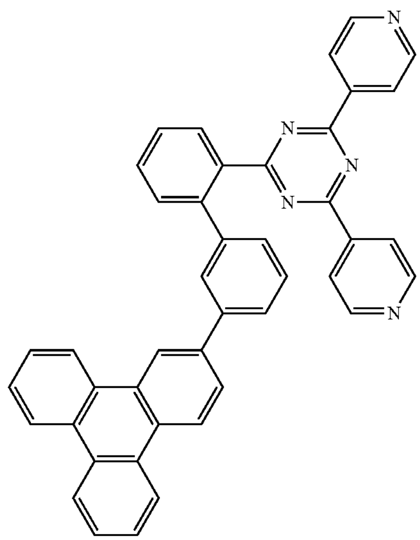
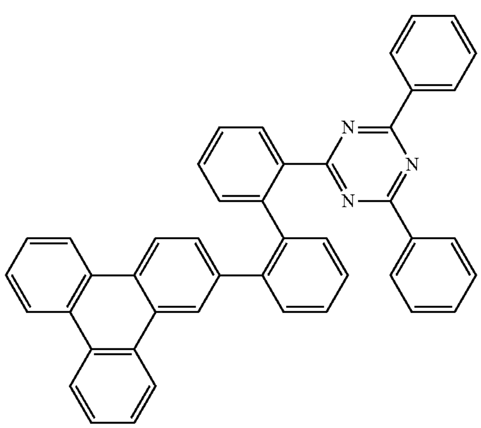
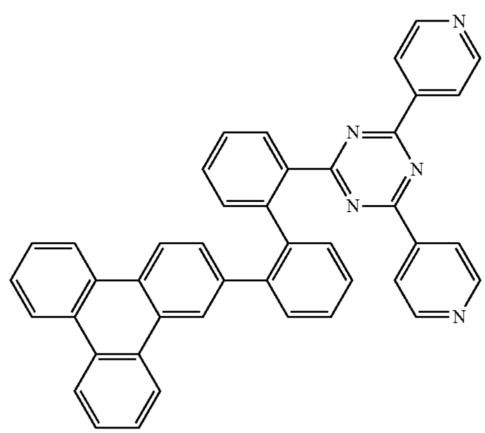
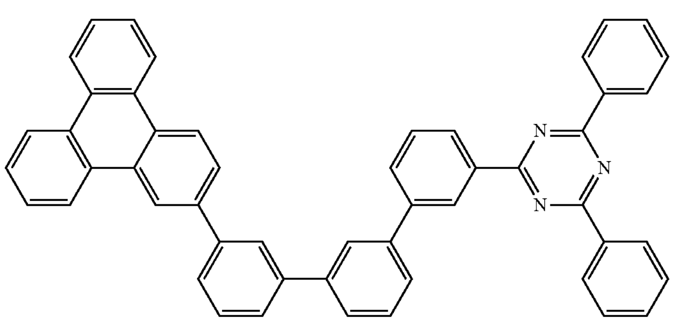

-continued
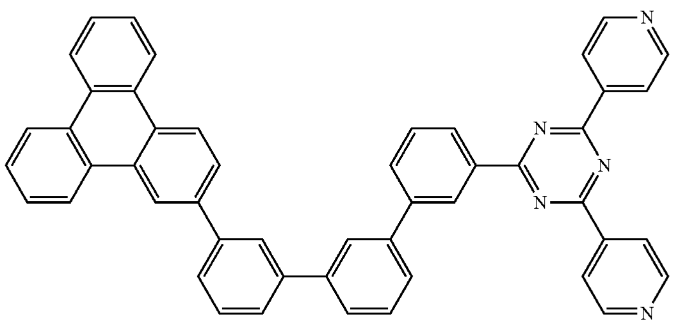
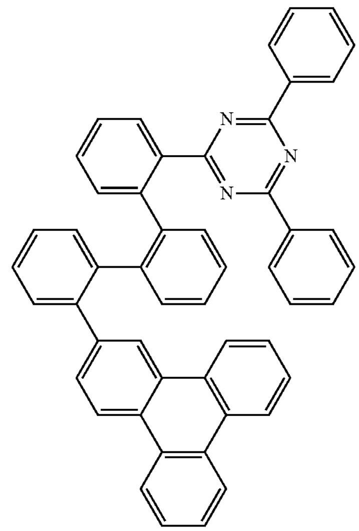
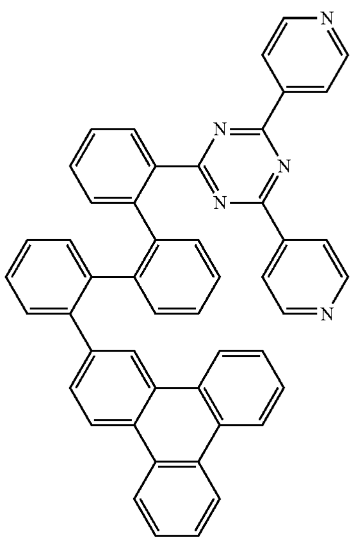
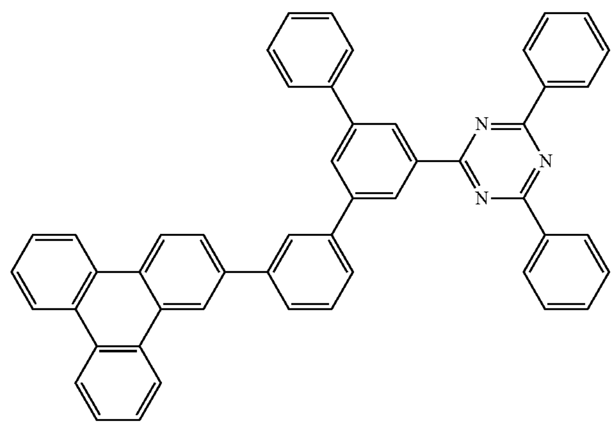
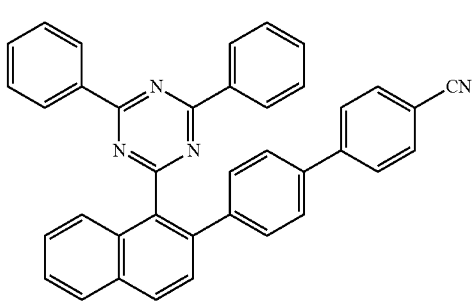
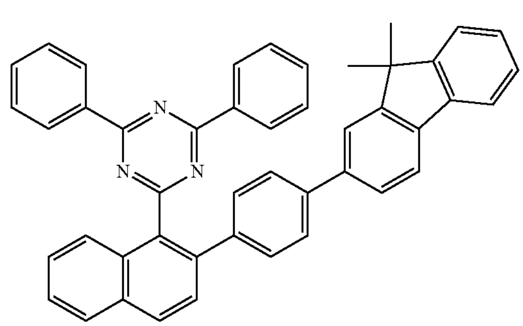

-continued
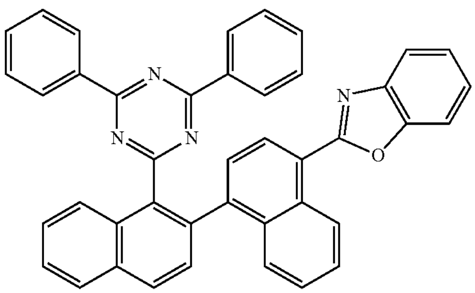
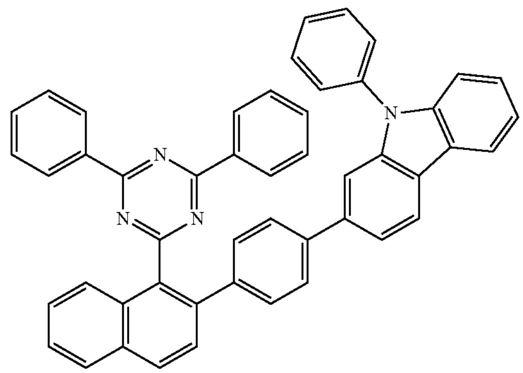
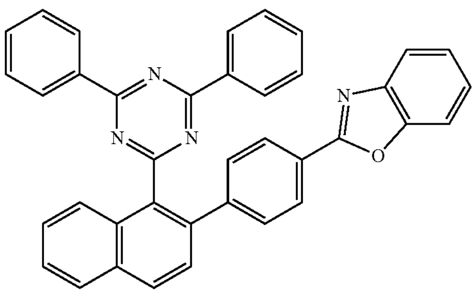
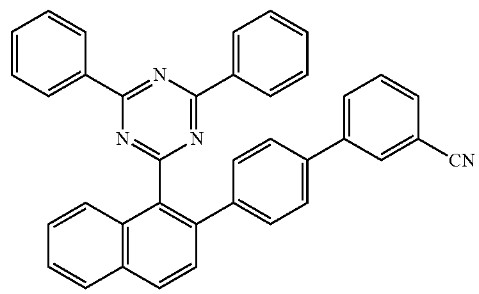
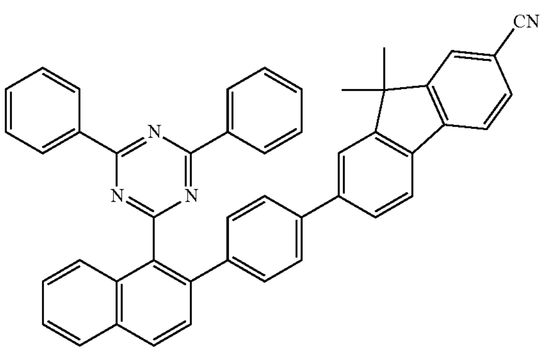
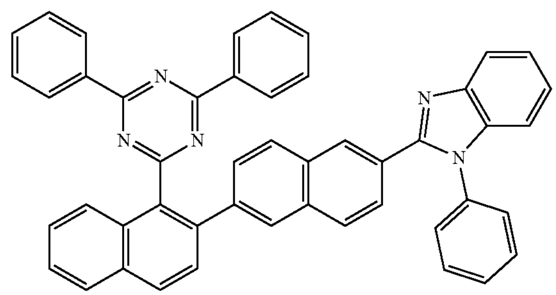
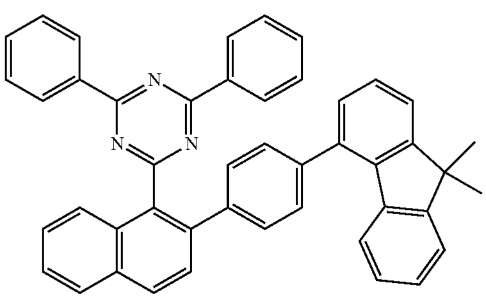
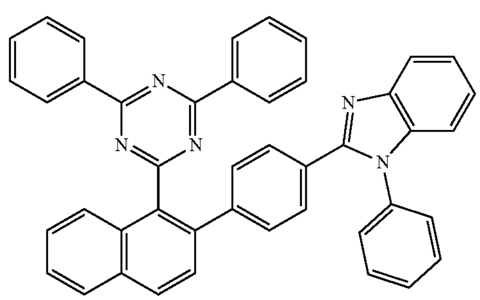
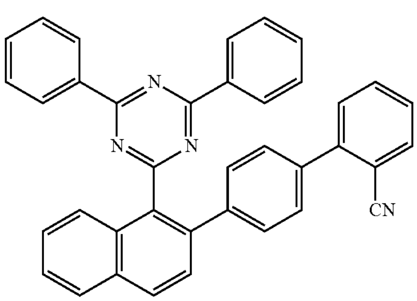
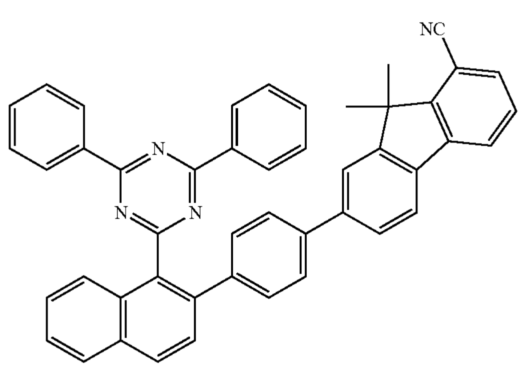

-continued
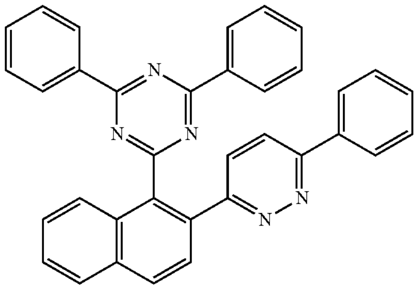
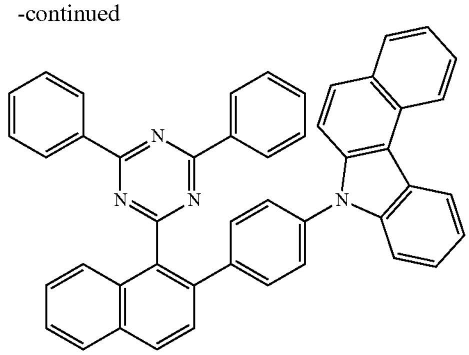
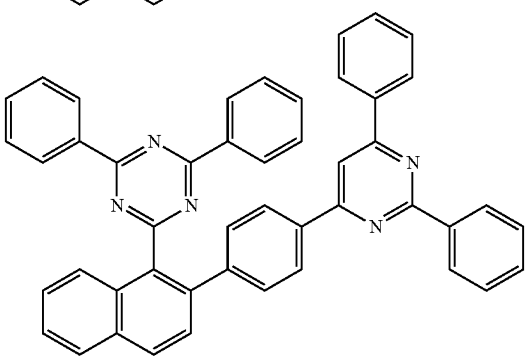
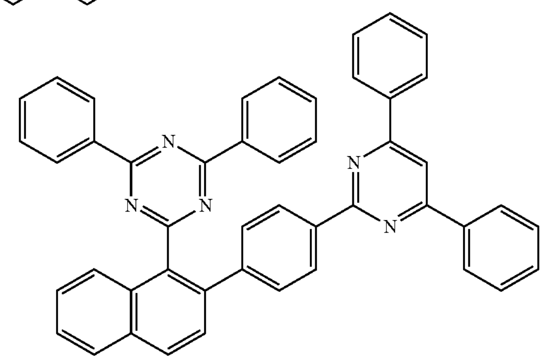
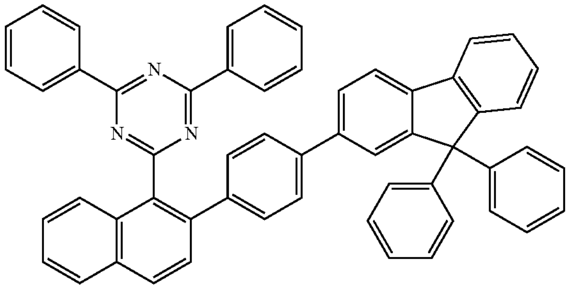
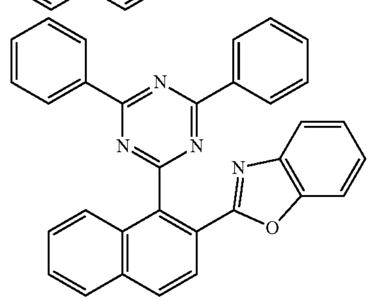
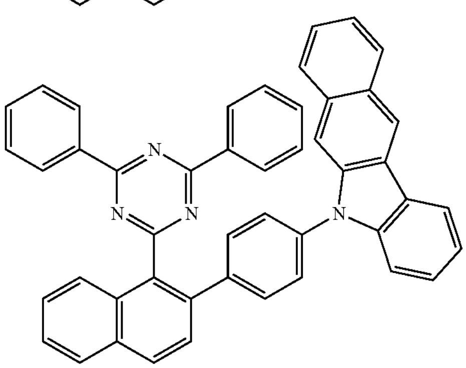
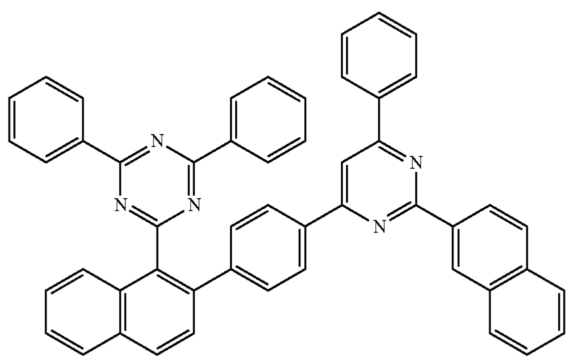
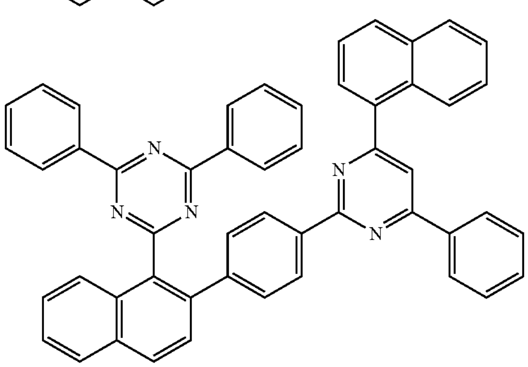
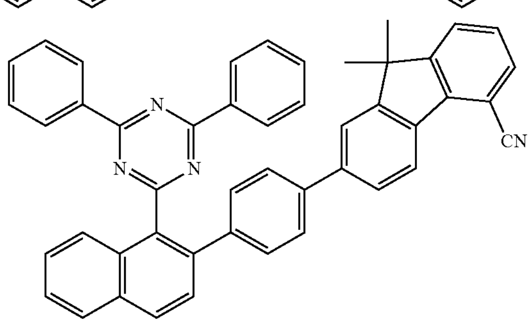

-continued
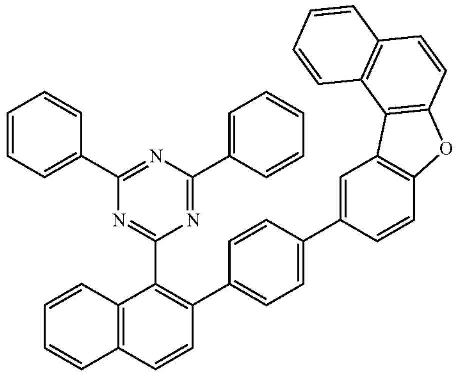
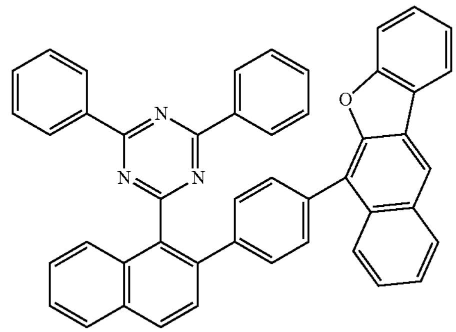
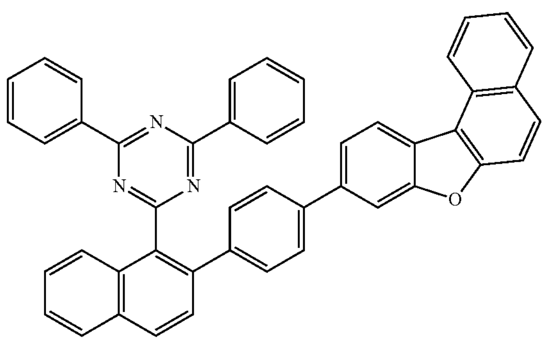
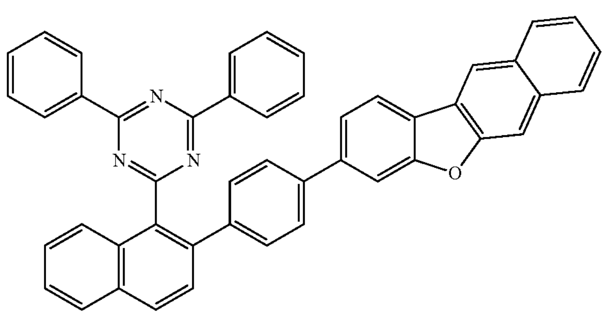
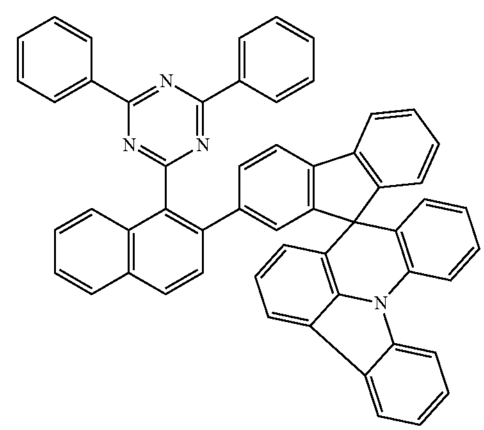
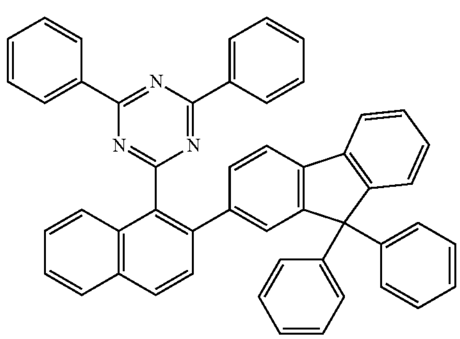
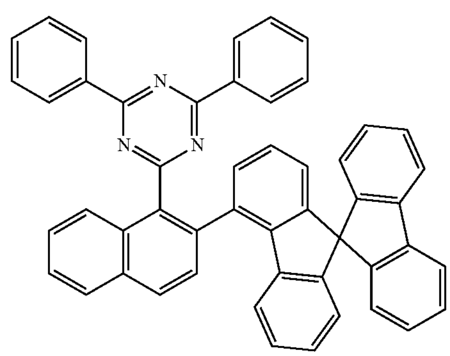

-continued
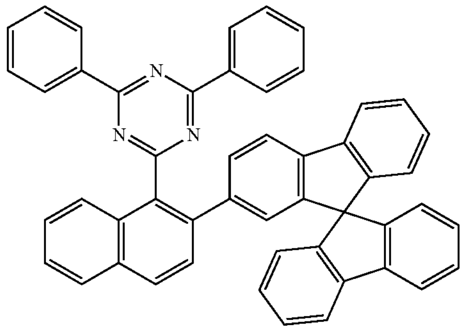
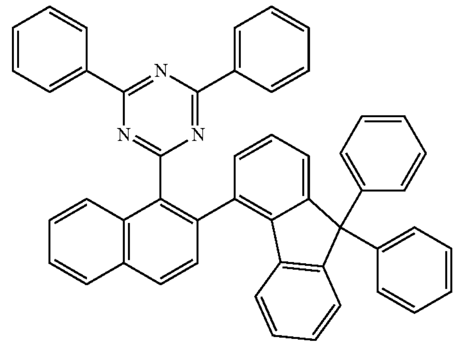
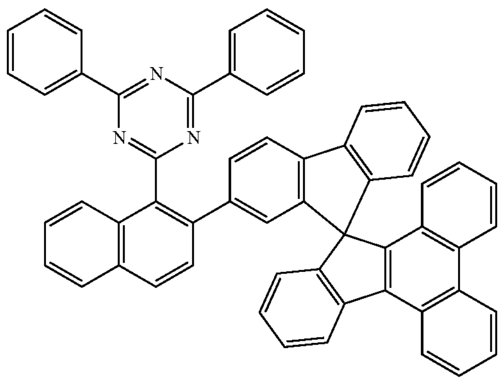
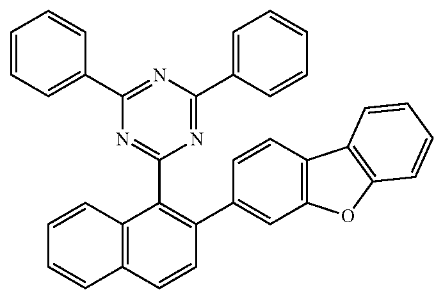
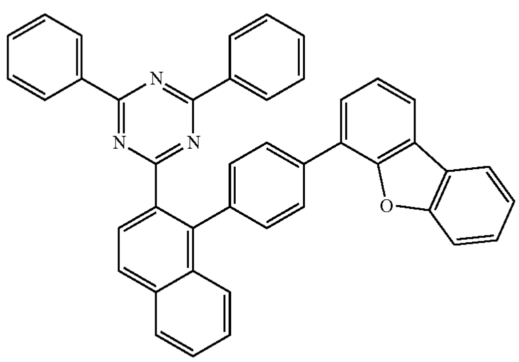
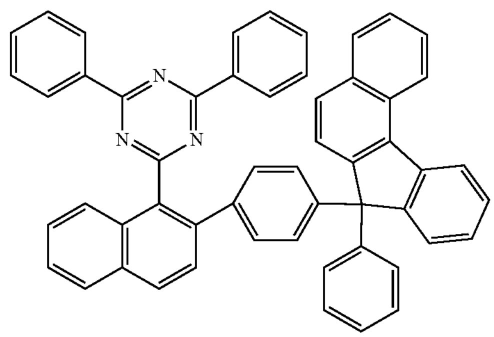
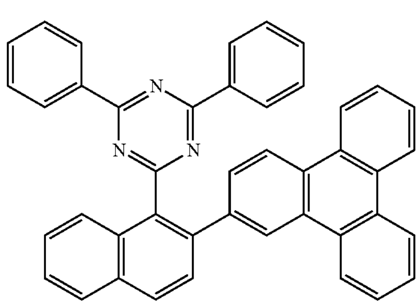
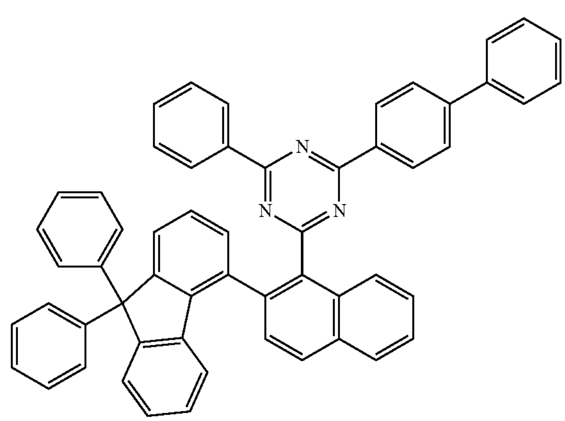

-continued
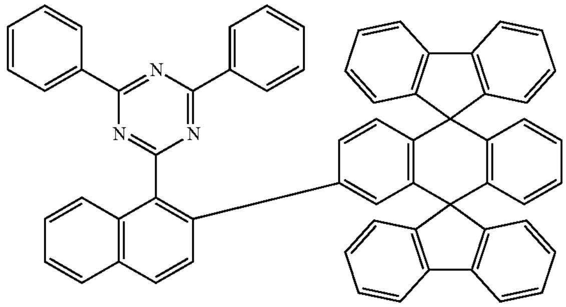
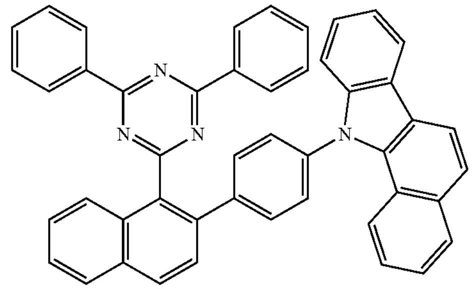
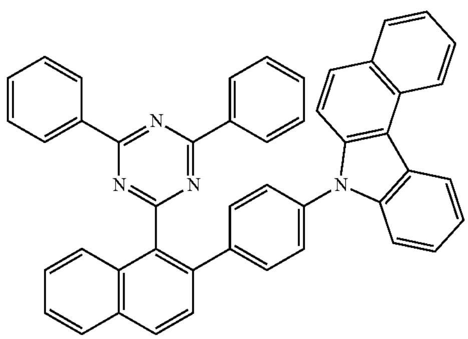
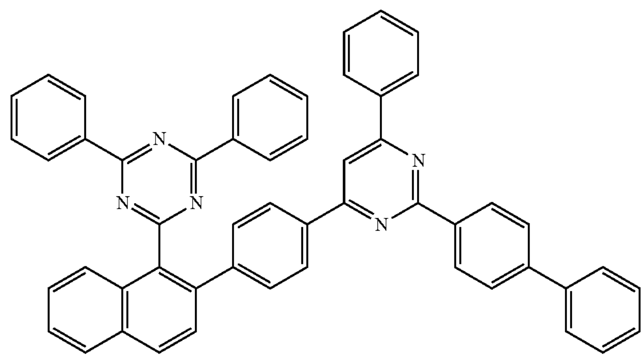
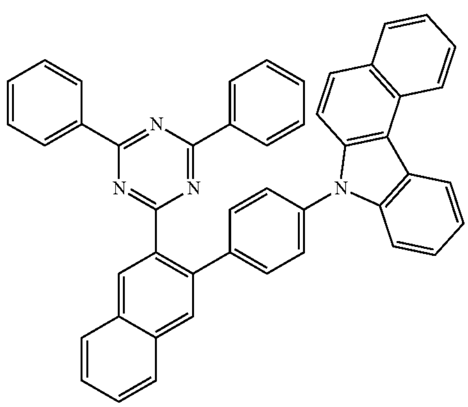
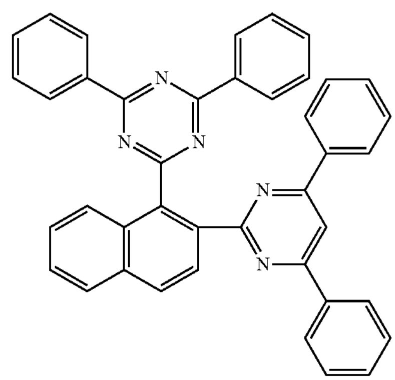
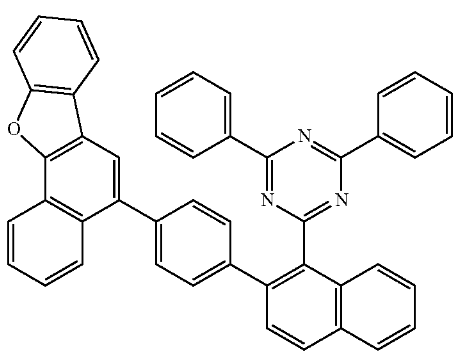
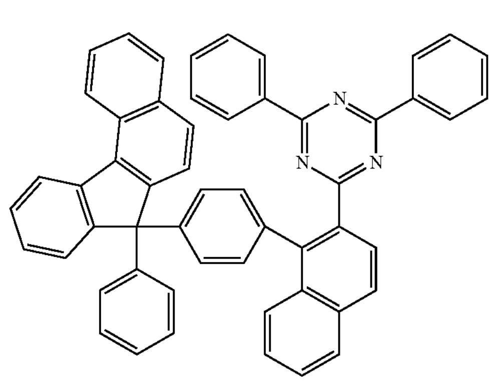

-continued
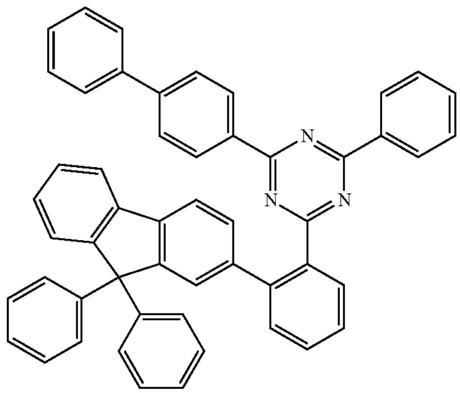
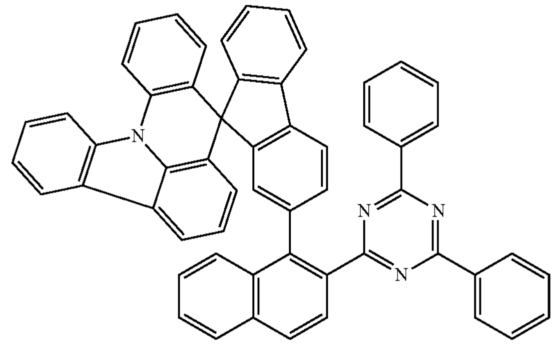
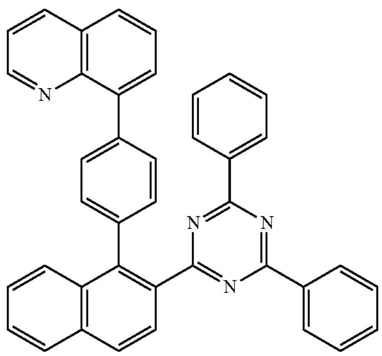
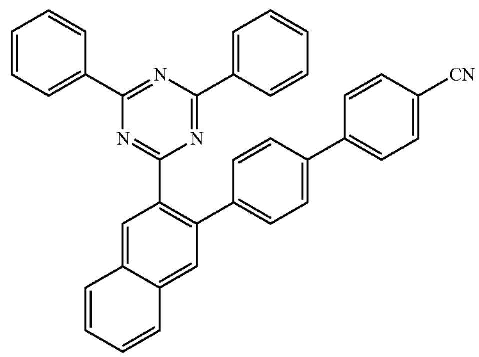
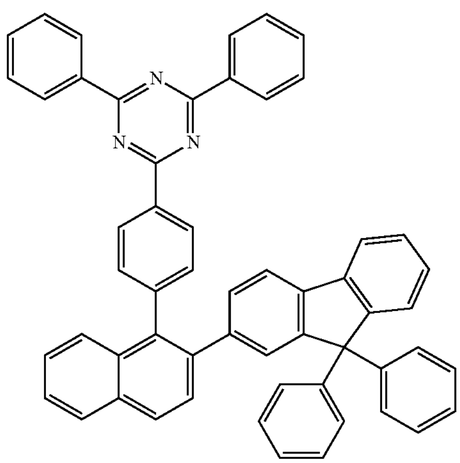
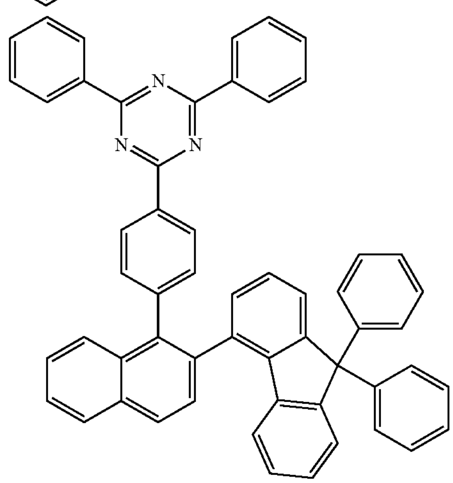
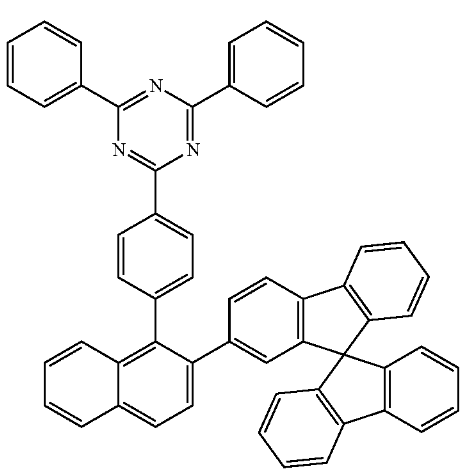
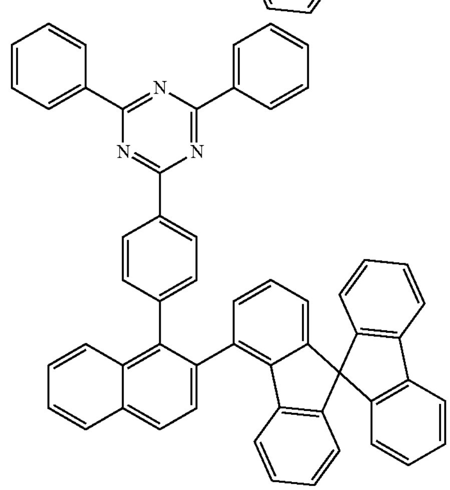

-continued
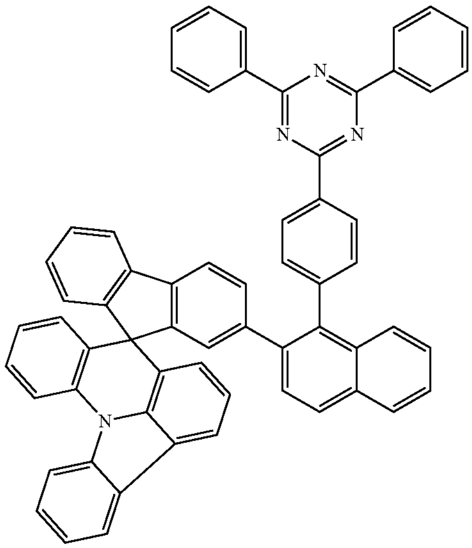
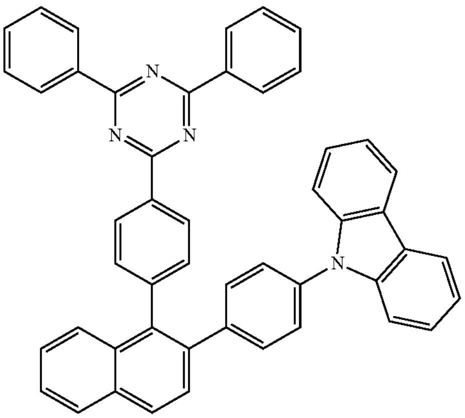
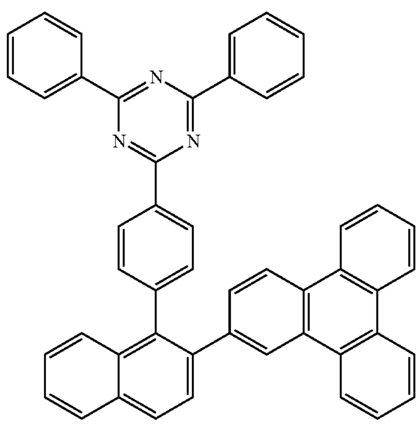
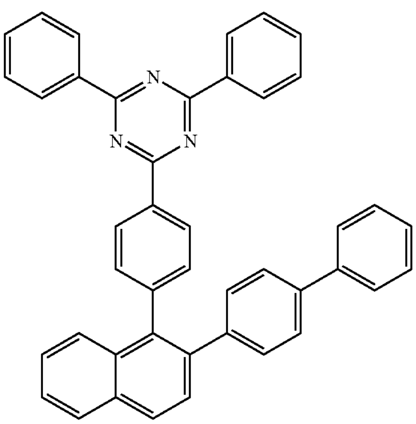
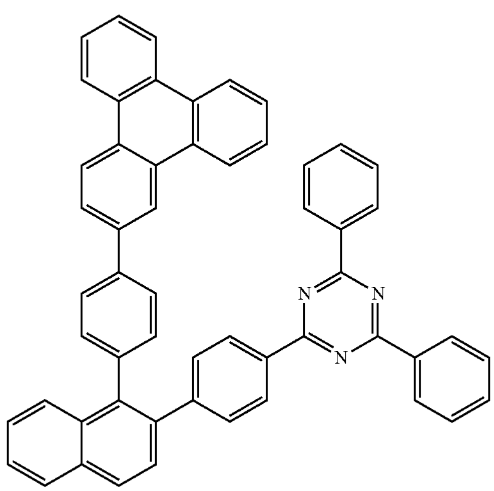
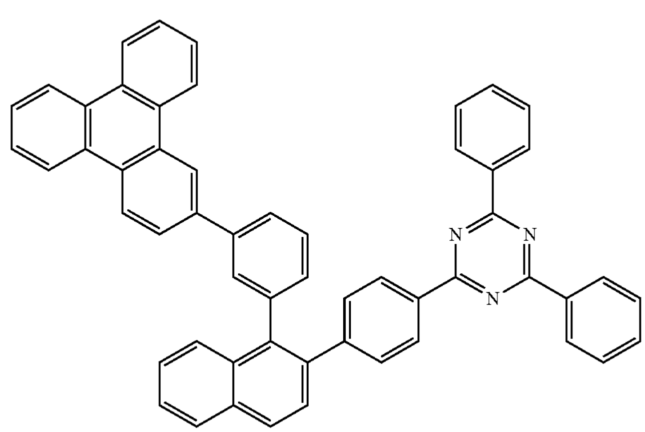

-continued
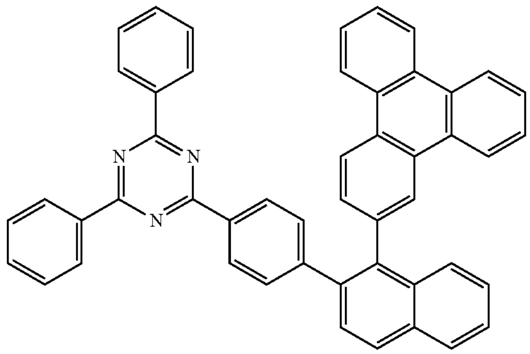
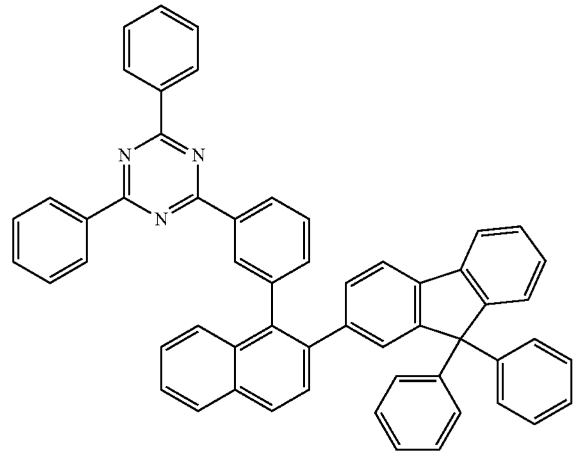
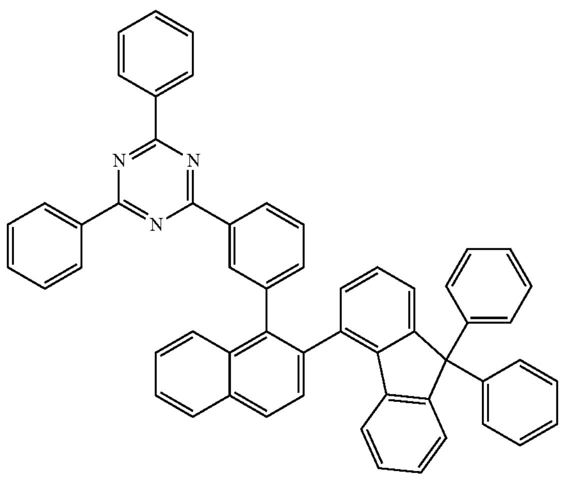
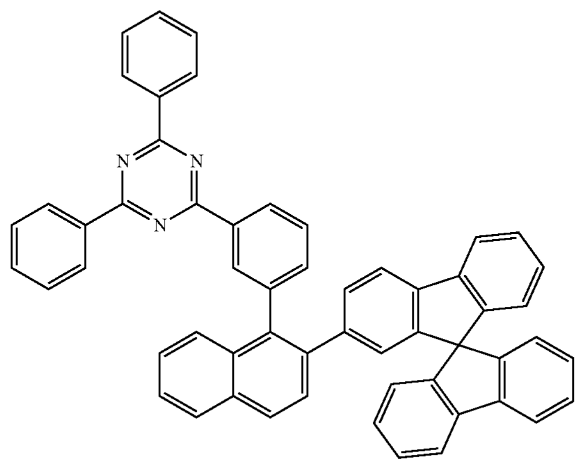
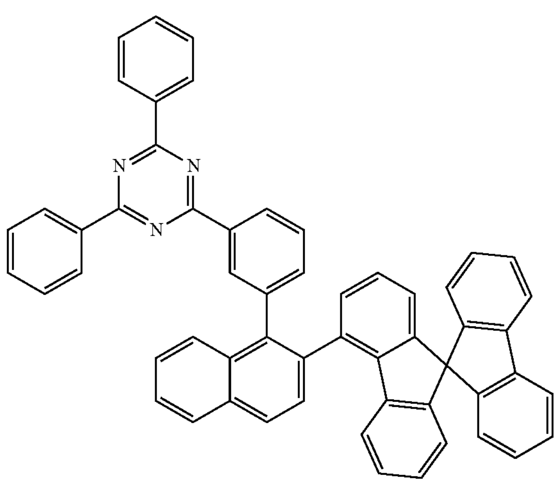
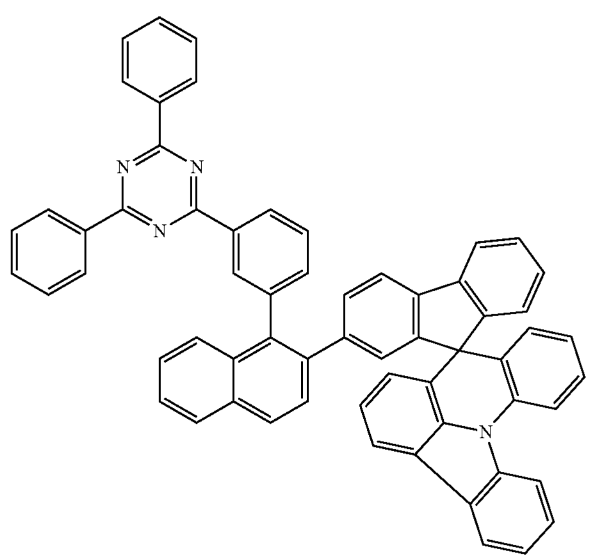

-continued
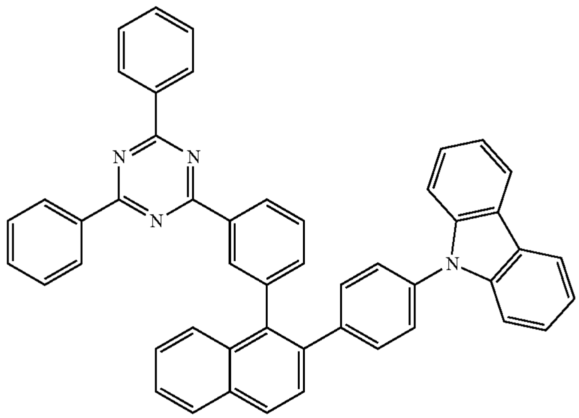
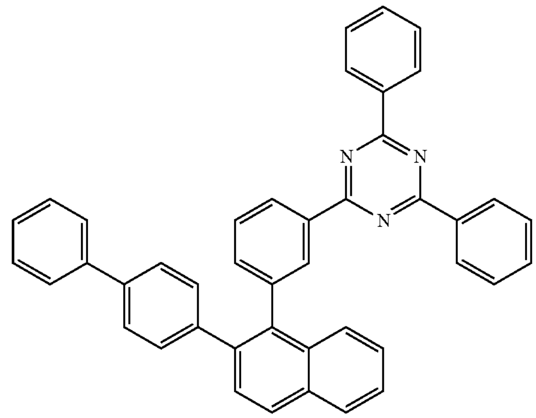
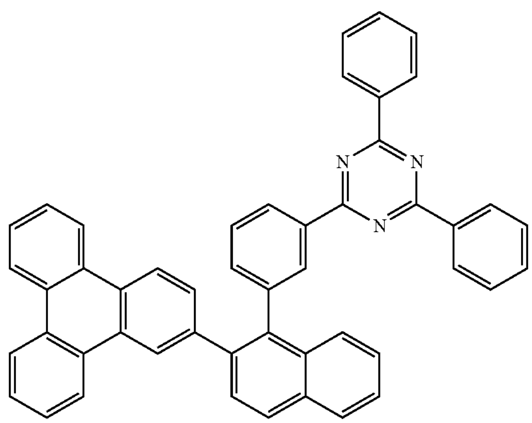
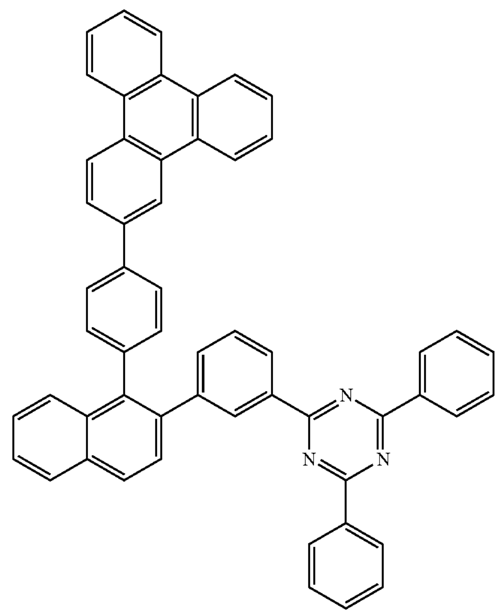
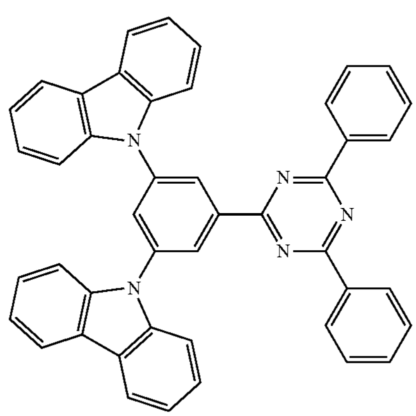
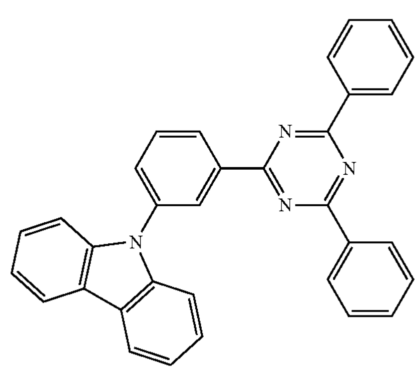

-continued
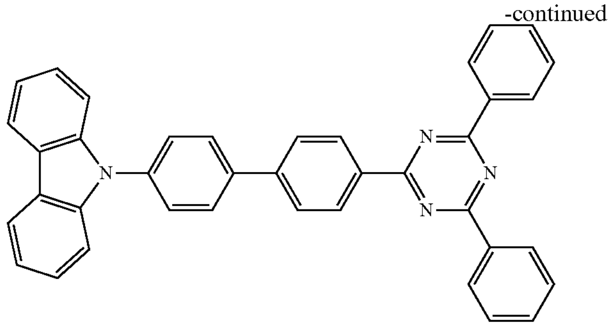
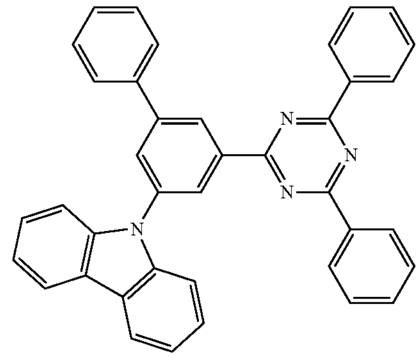
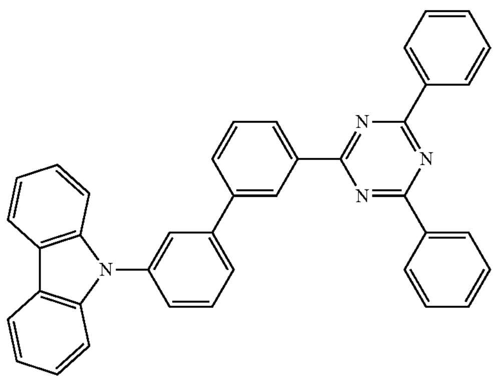
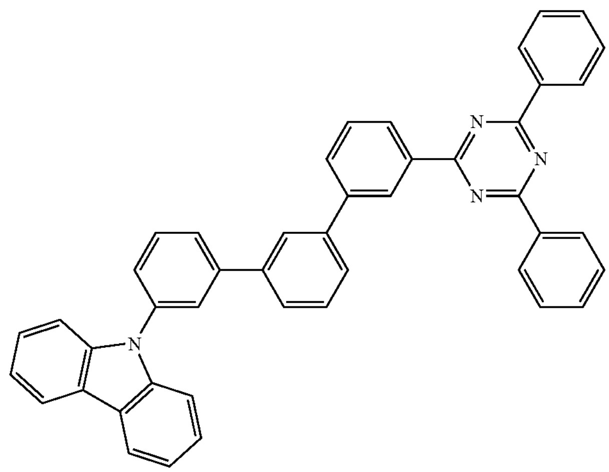
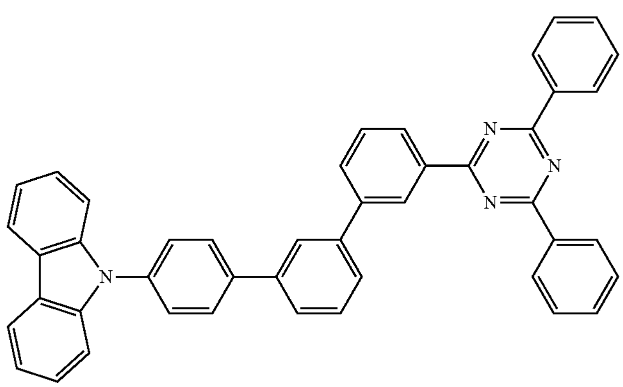
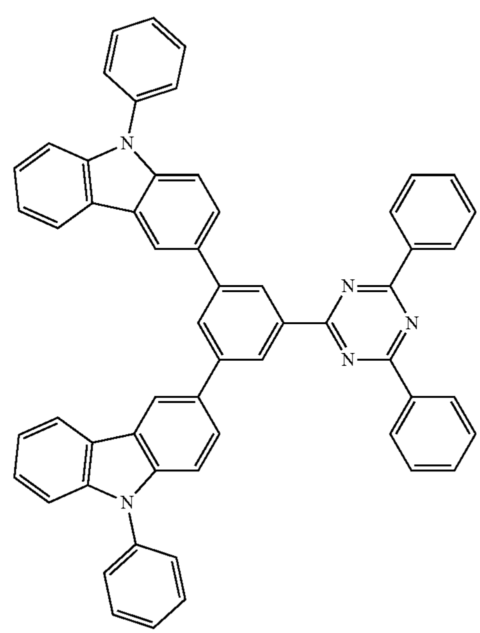

-continued
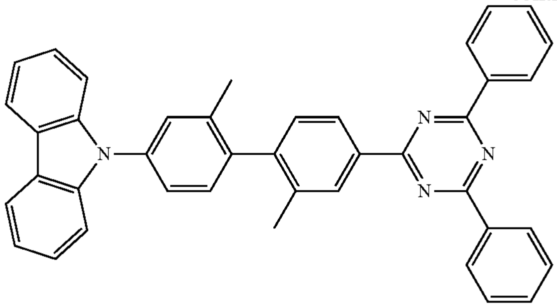
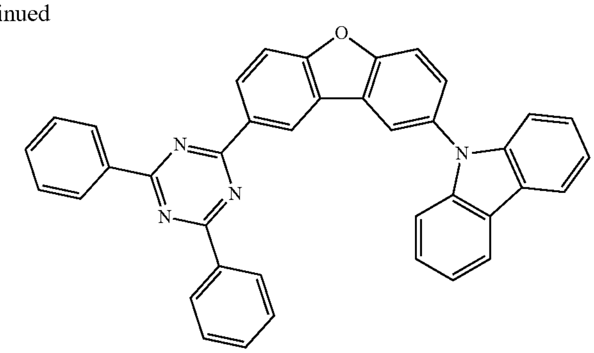
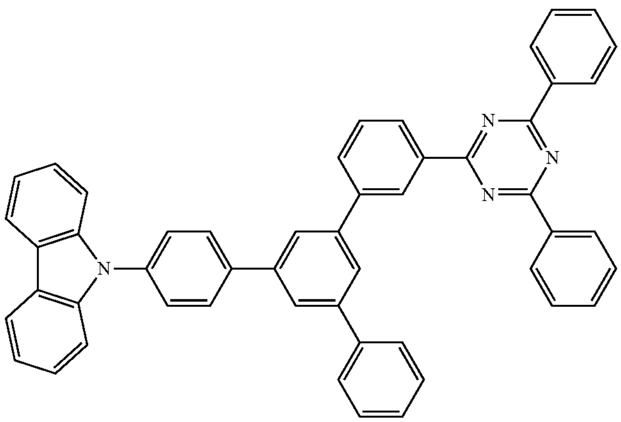
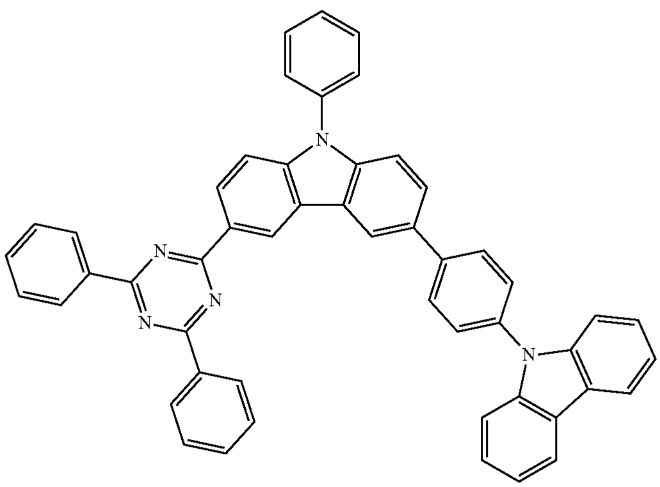
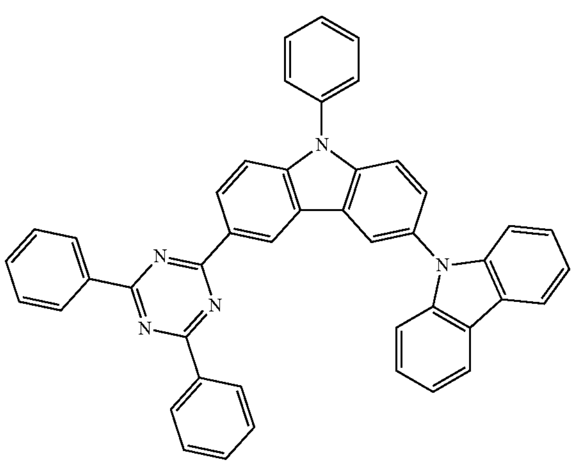
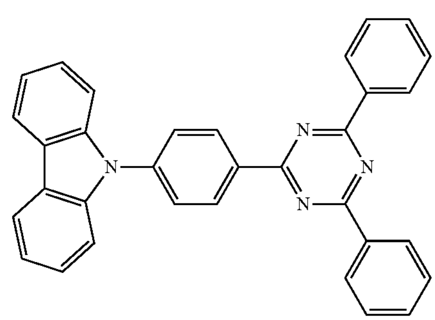

-continued
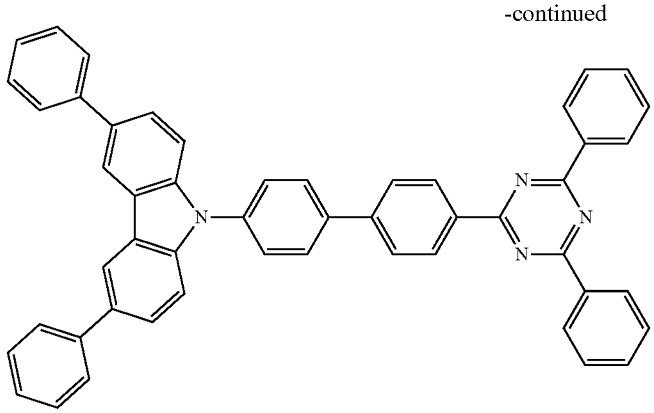
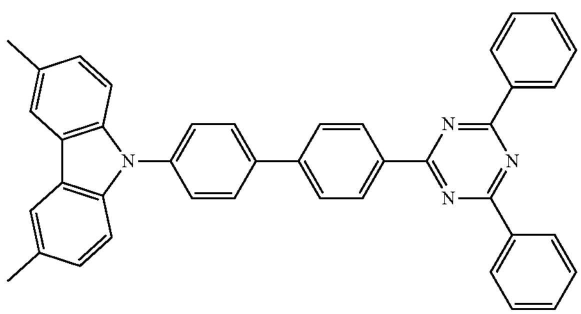
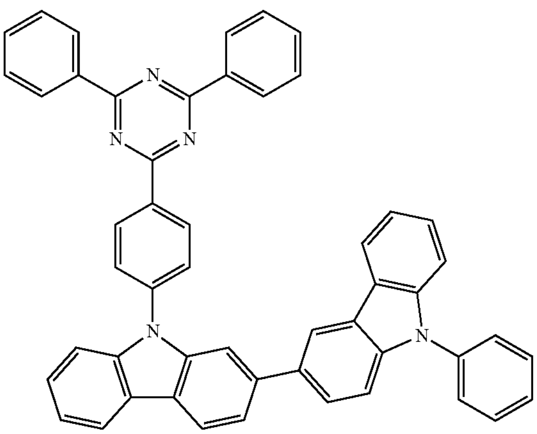
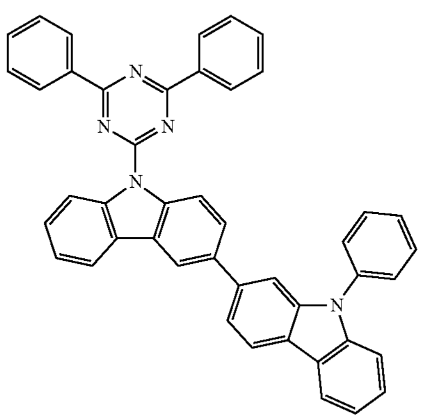
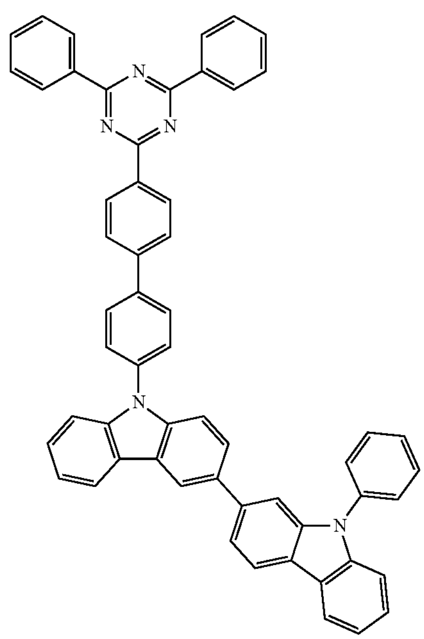

-continued
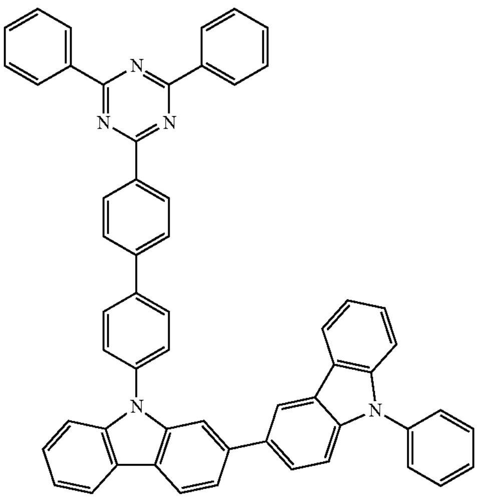
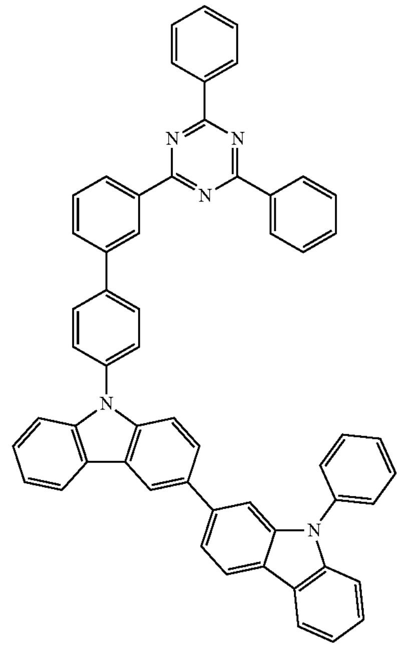
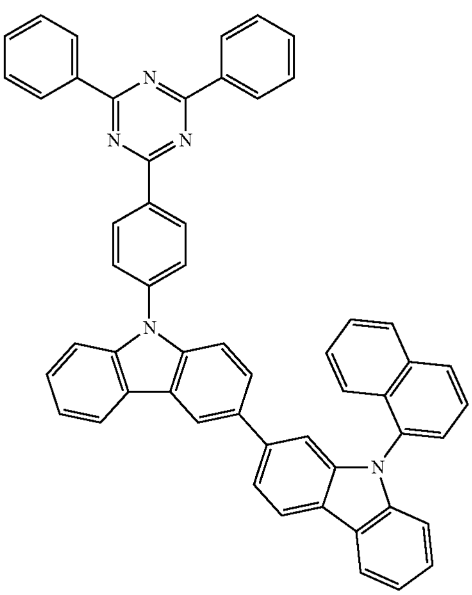
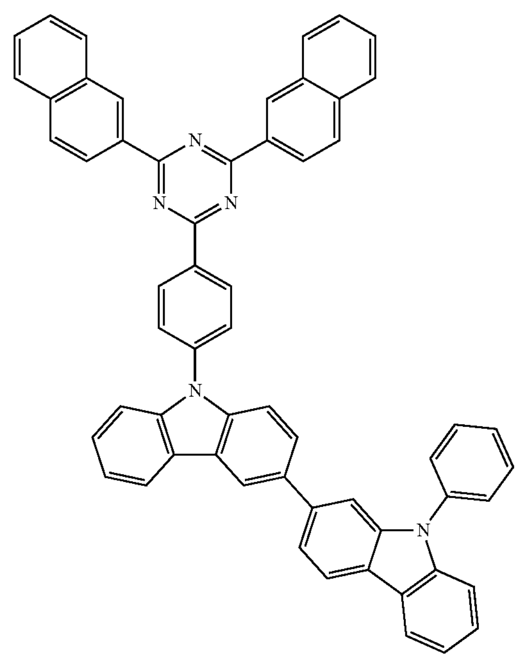

-continued
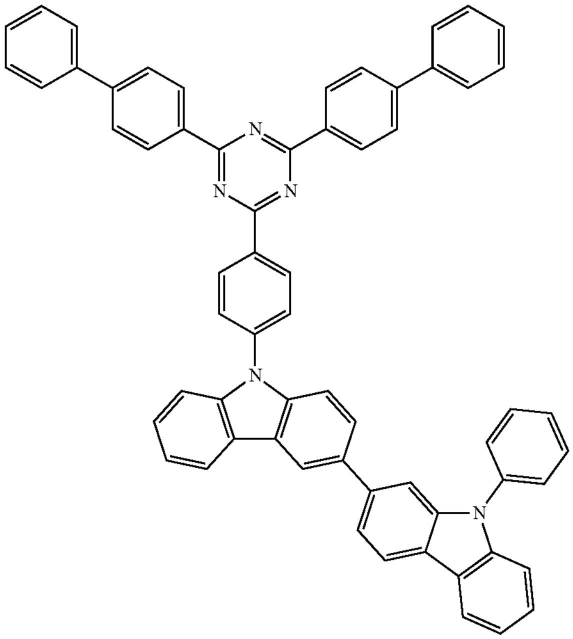
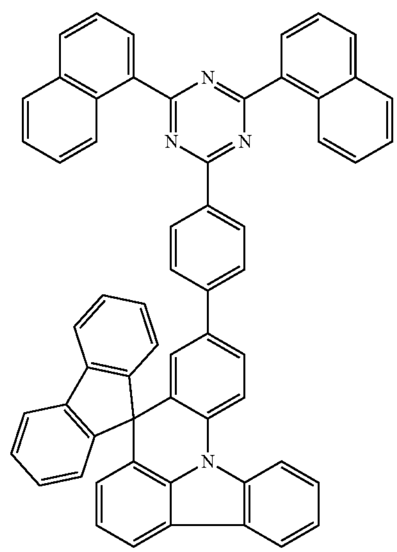
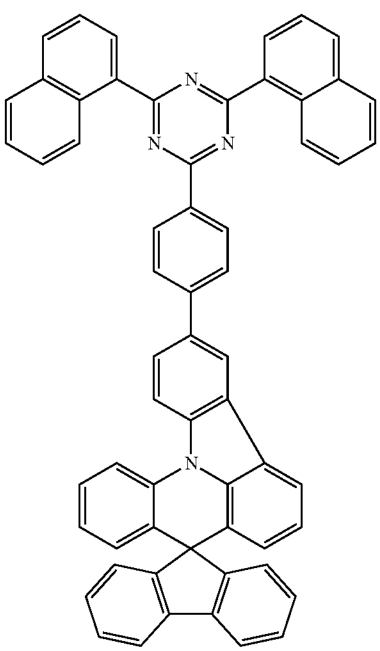
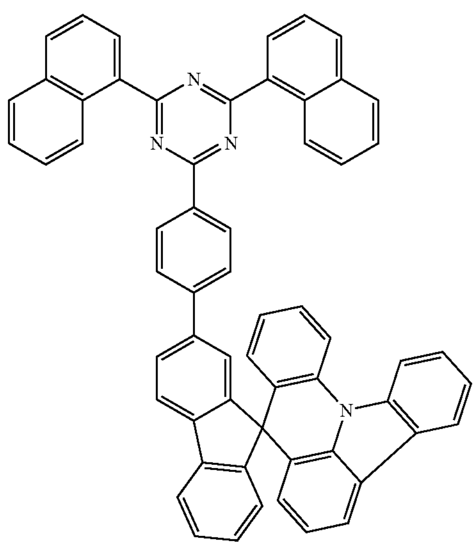

-continued
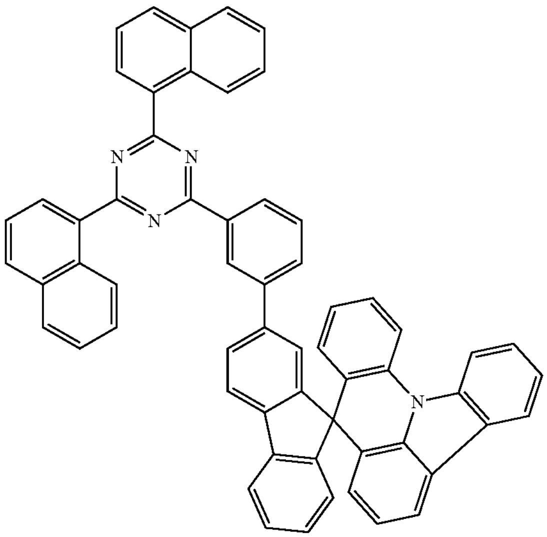
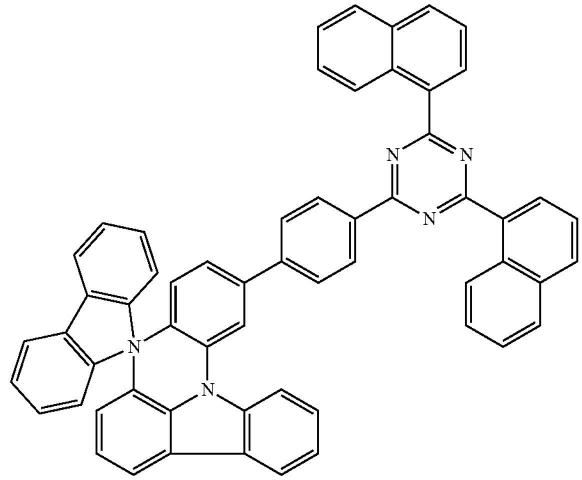
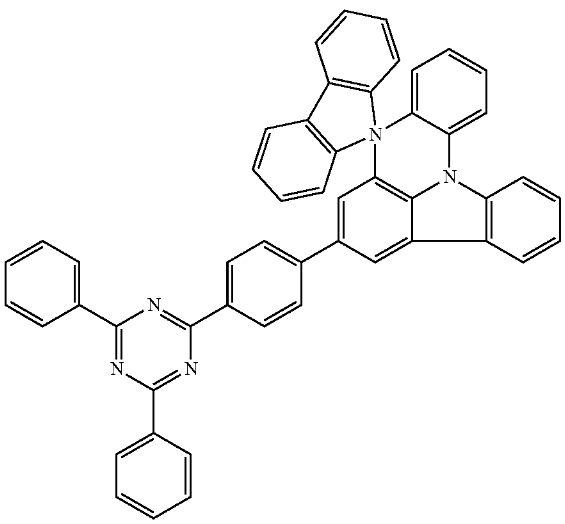
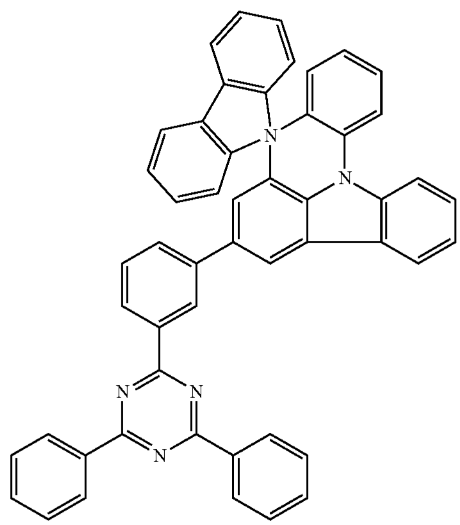
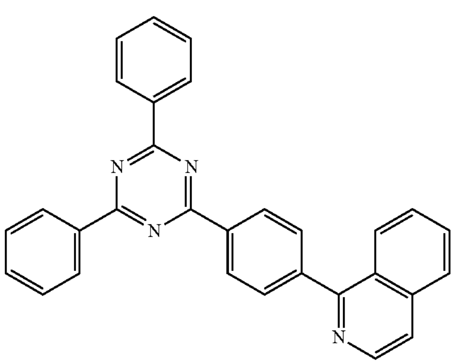
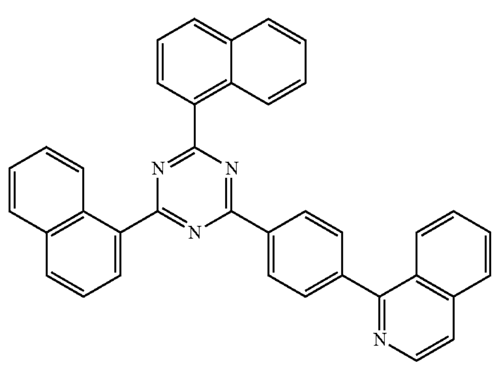

-continued
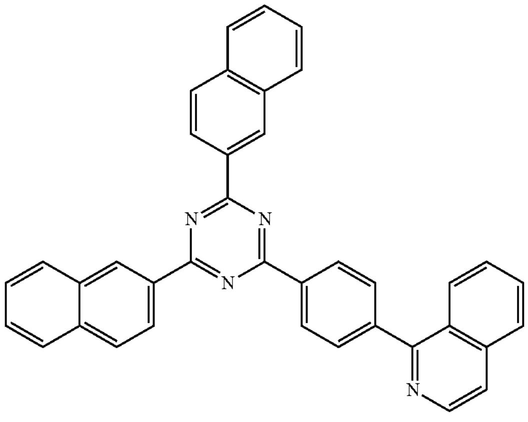
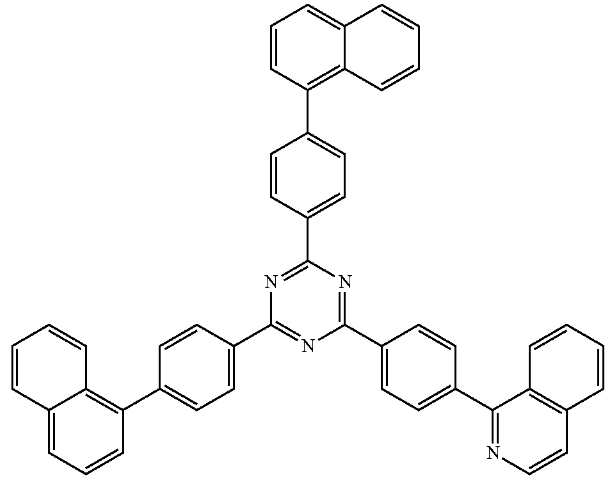
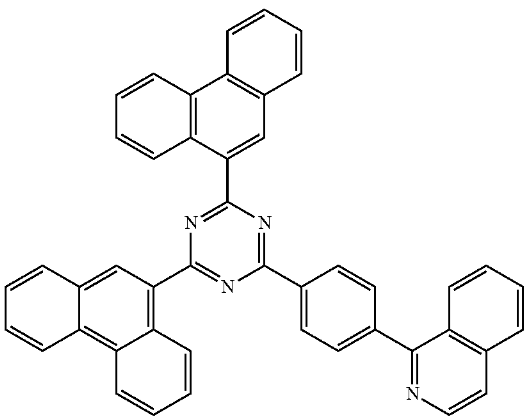
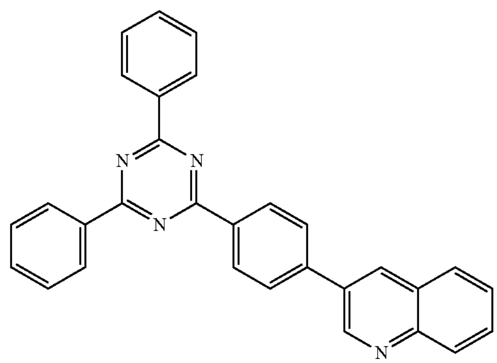
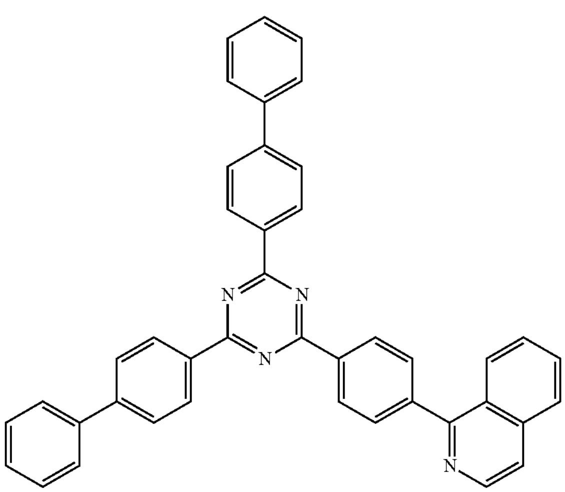
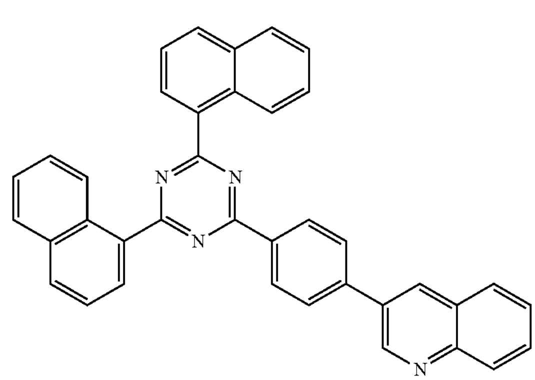

-continued
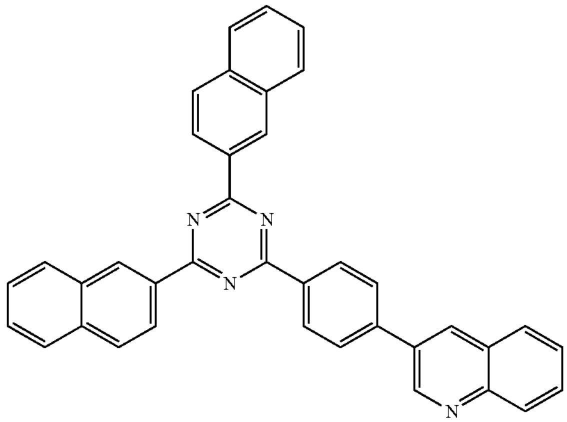
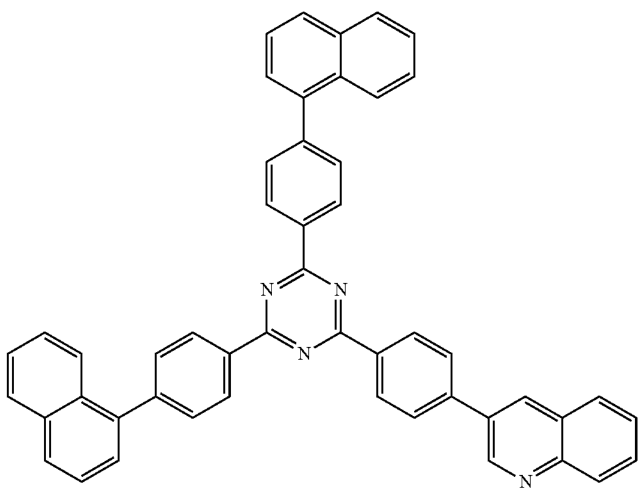
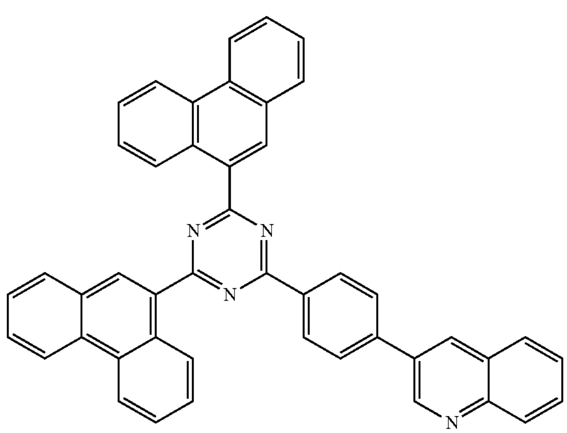
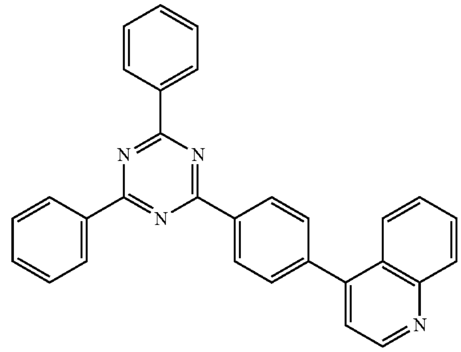

-continued
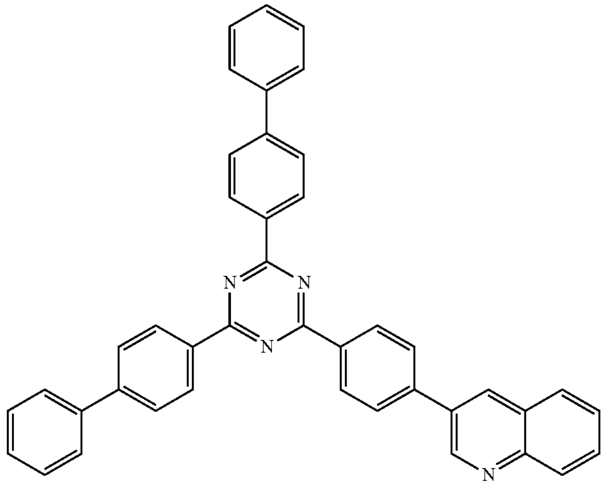
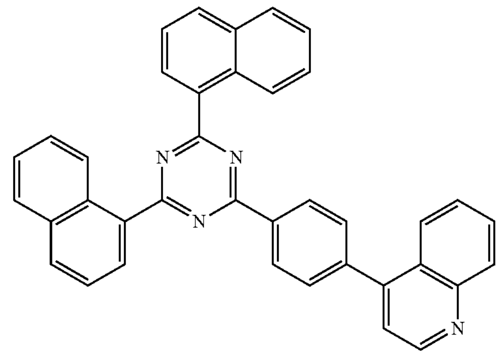
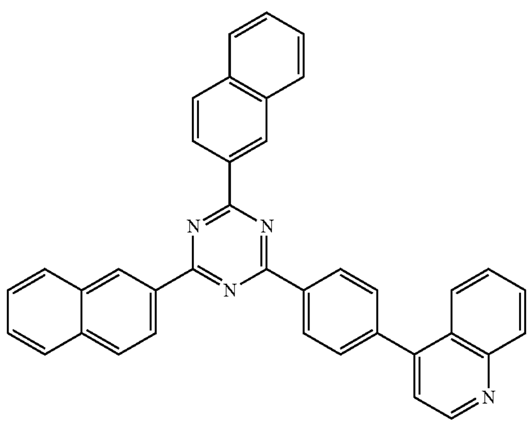
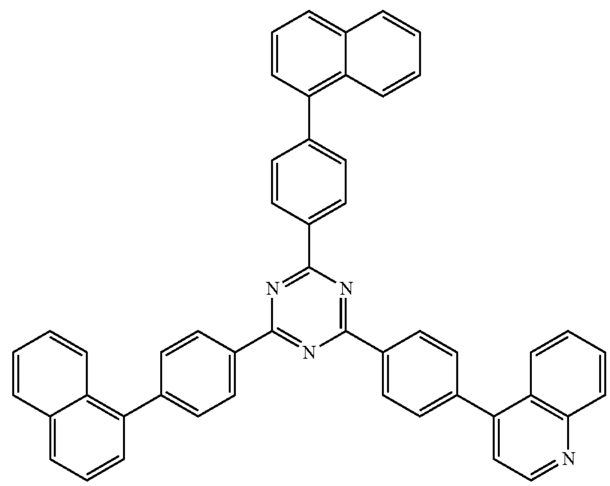
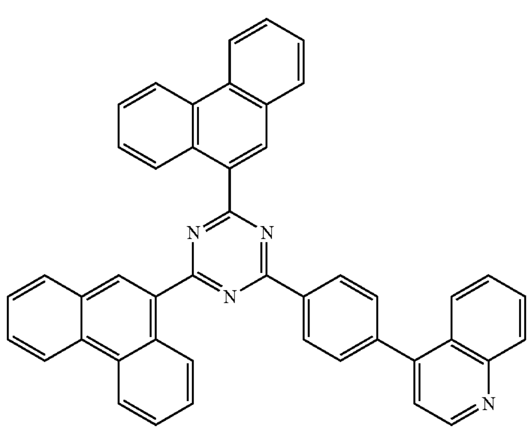
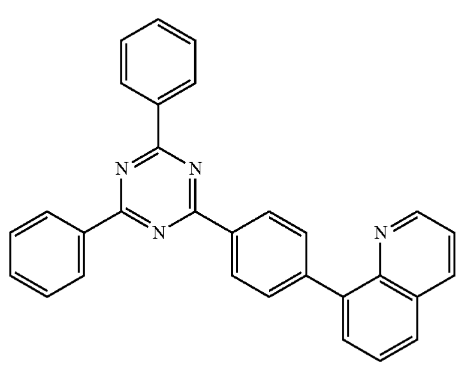

-continued
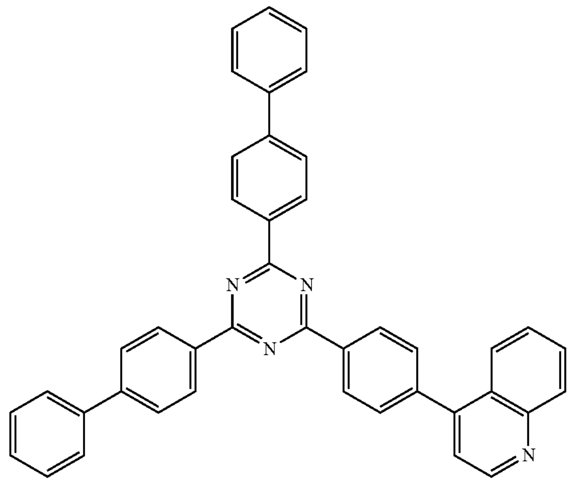
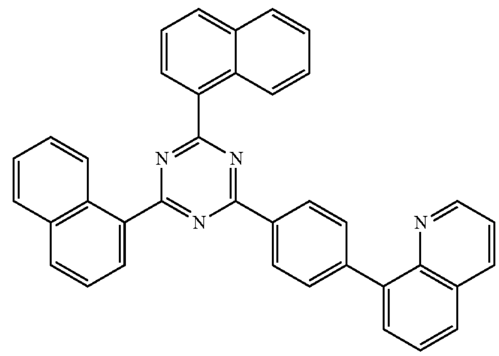
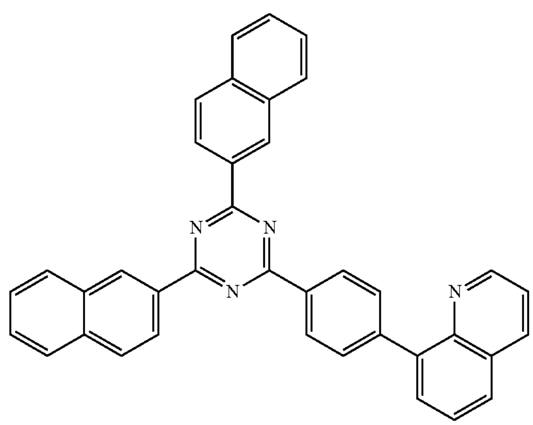
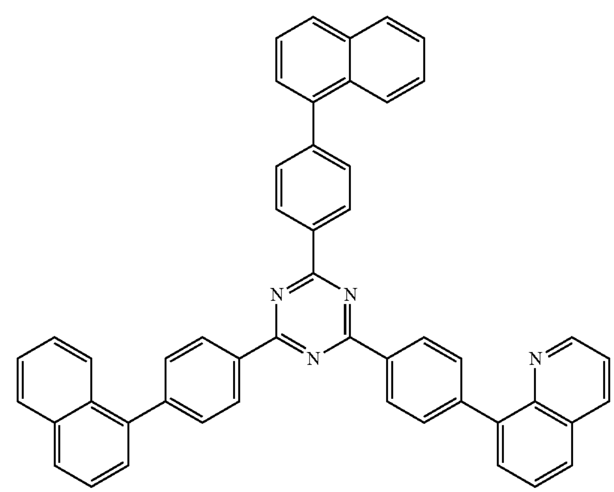
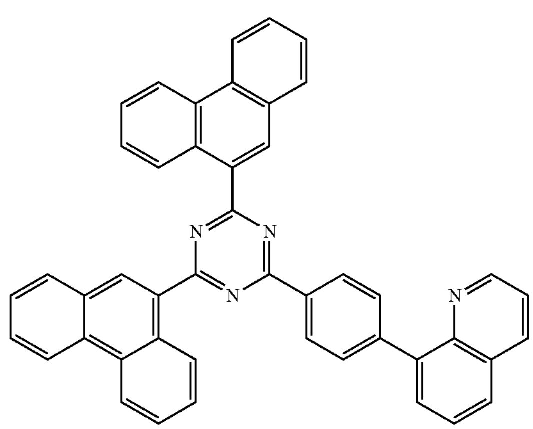
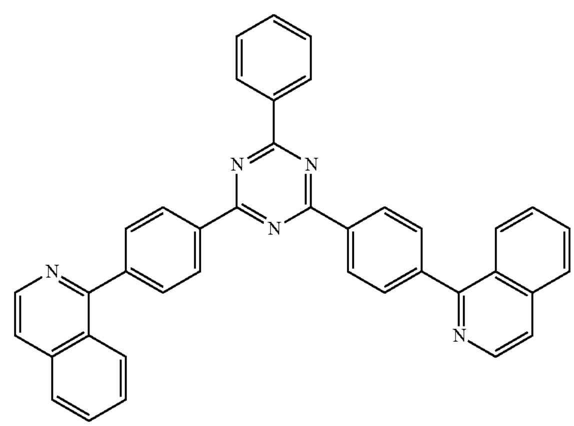

-continued
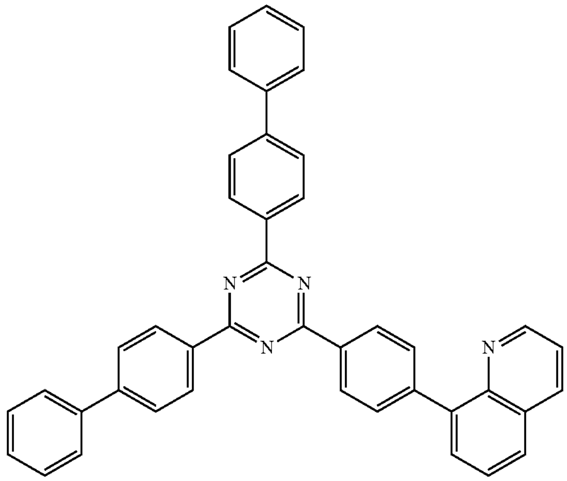
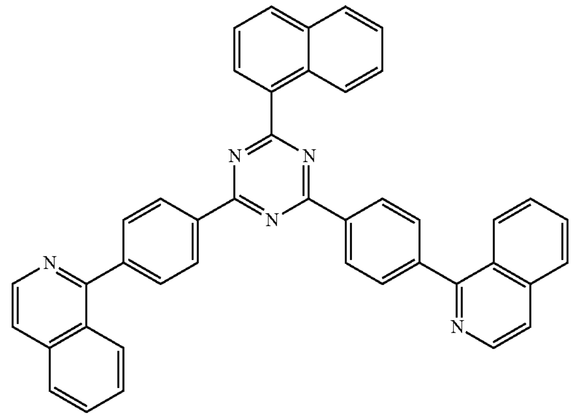
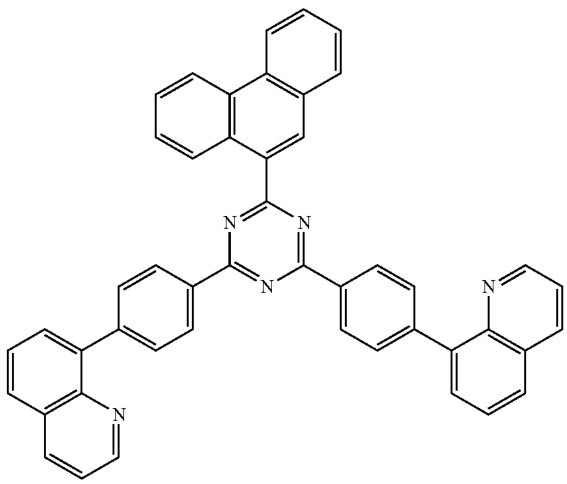
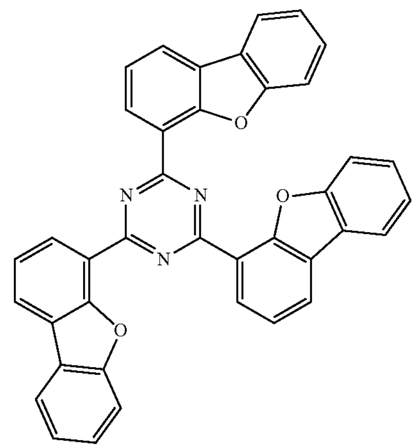
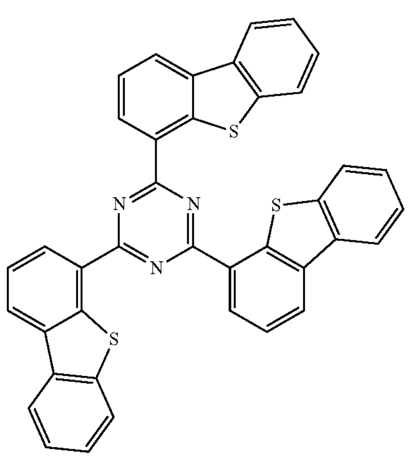
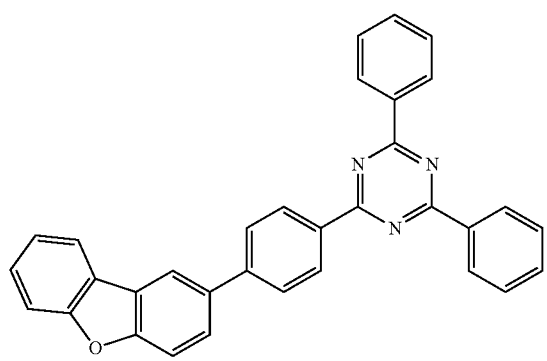

-continued
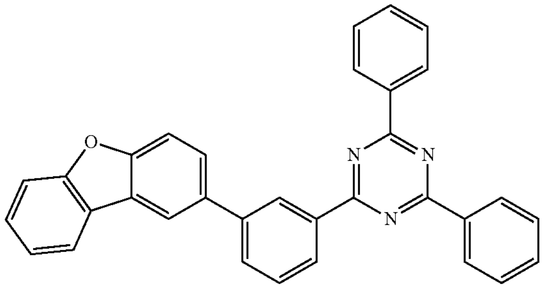
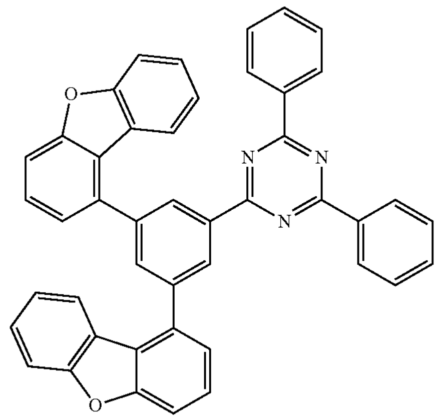
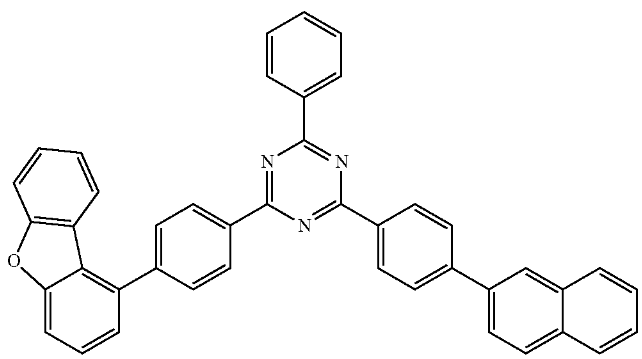
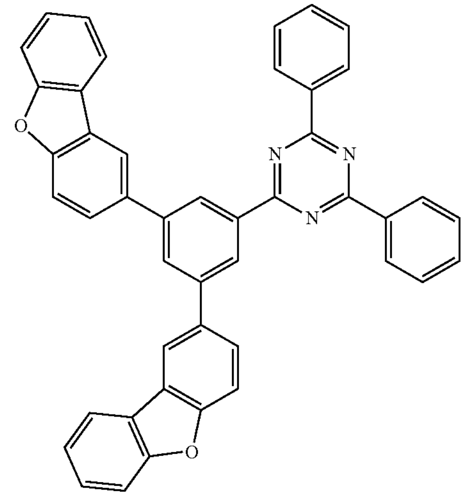
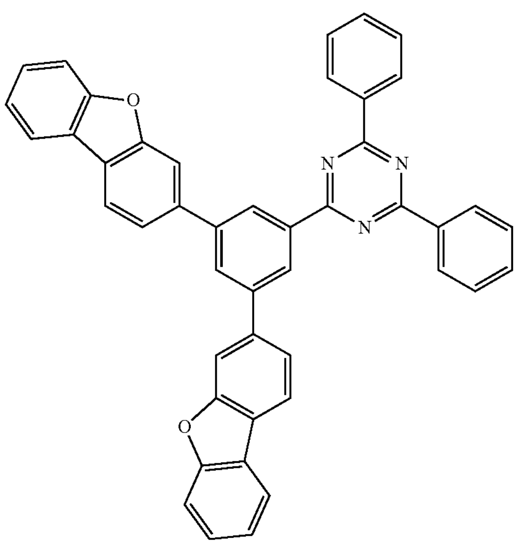

-continued
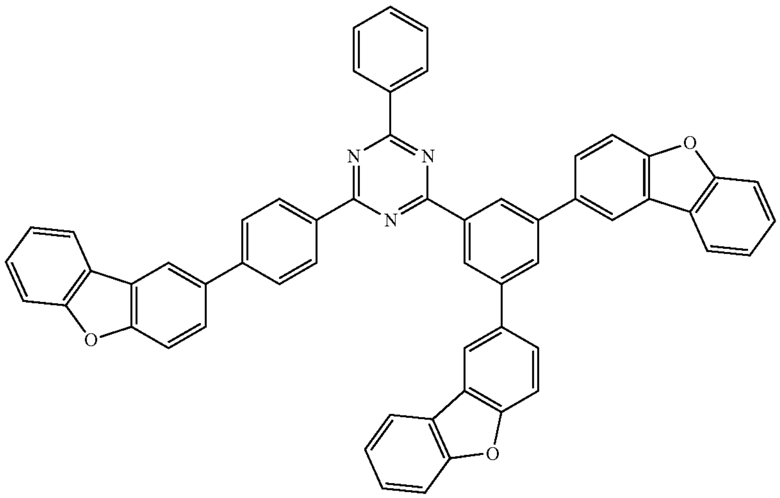
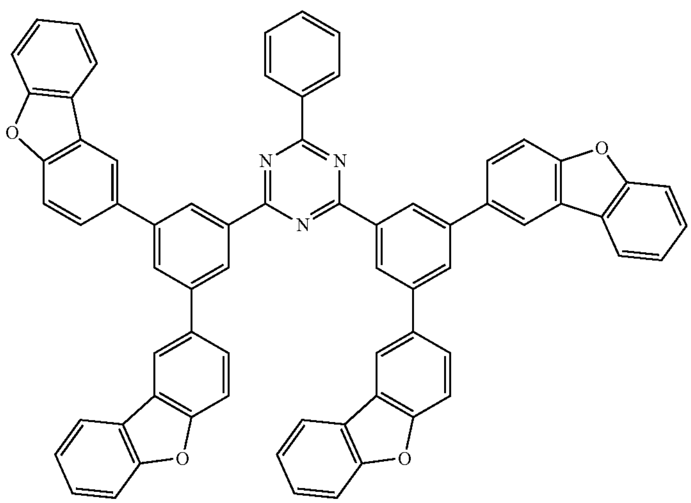
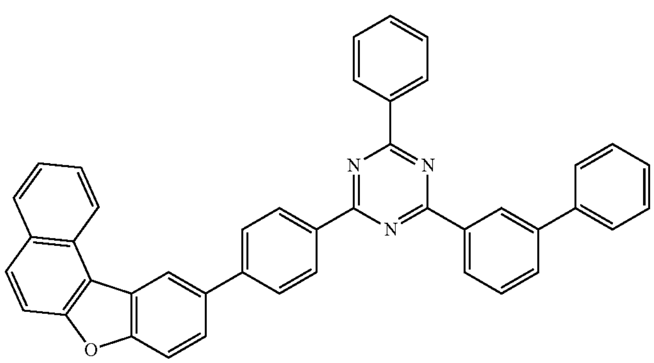

-continued
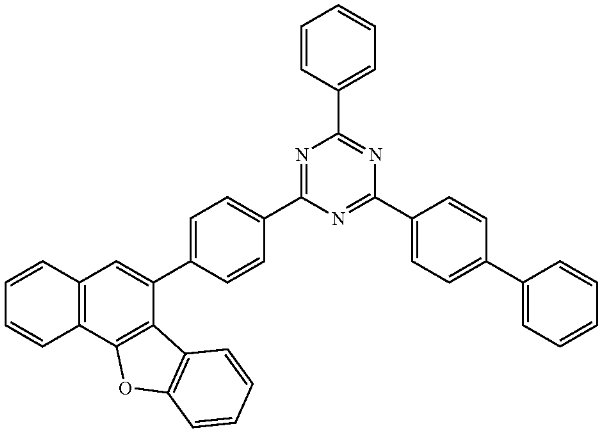
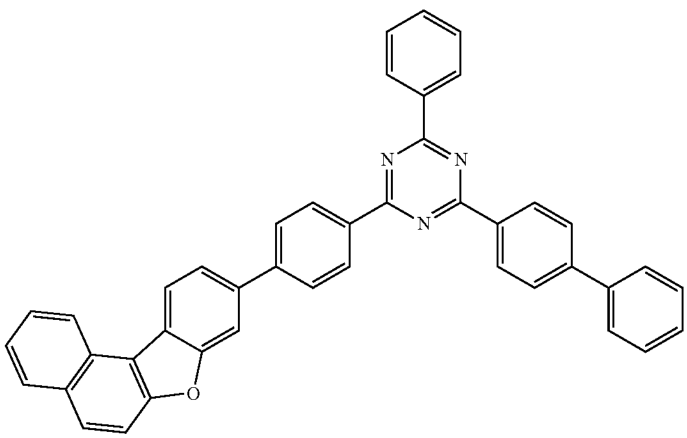
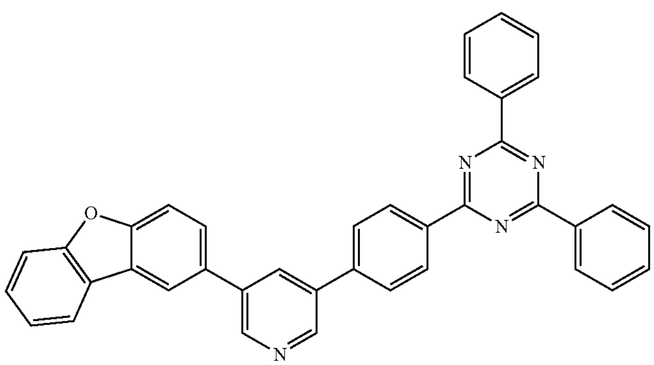
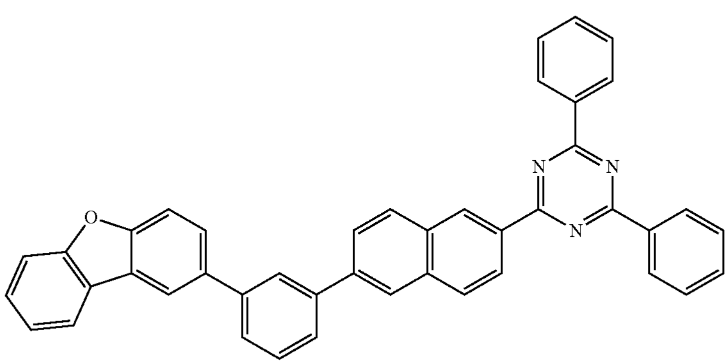

-continued
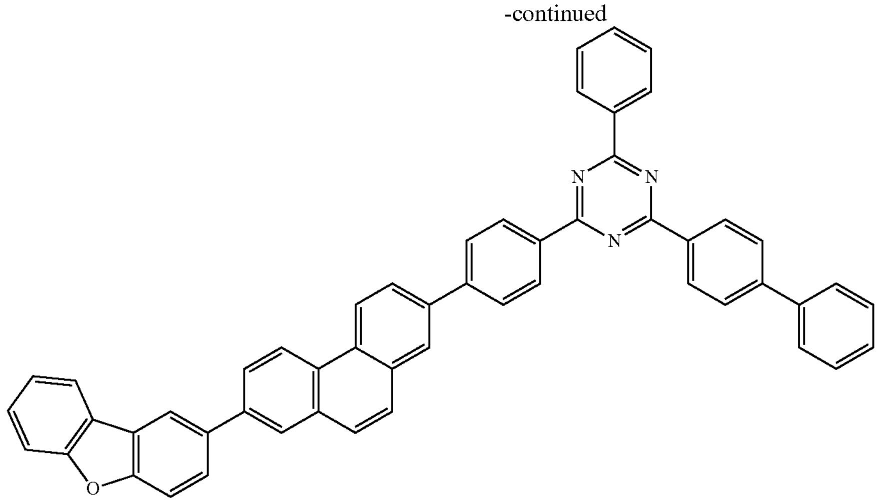
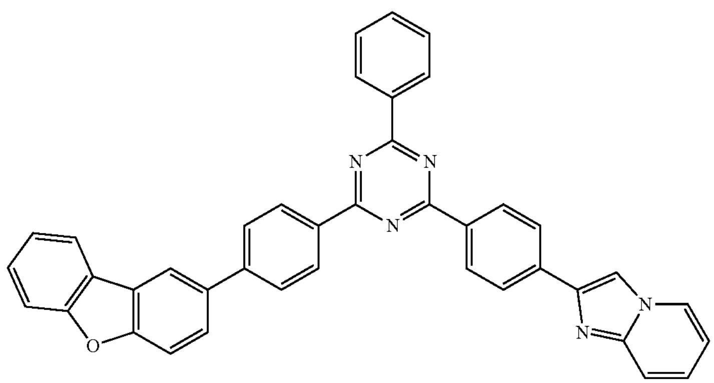
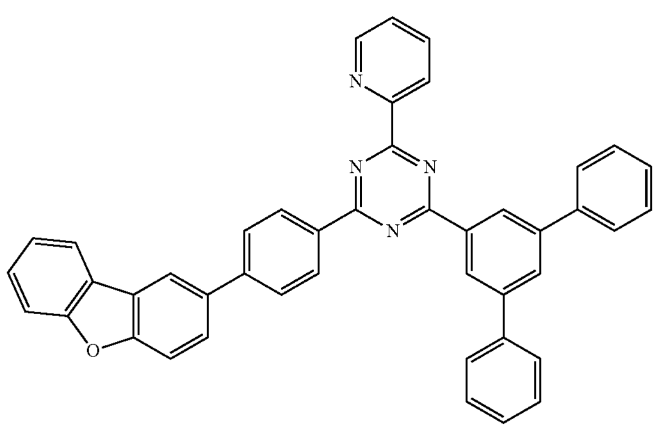
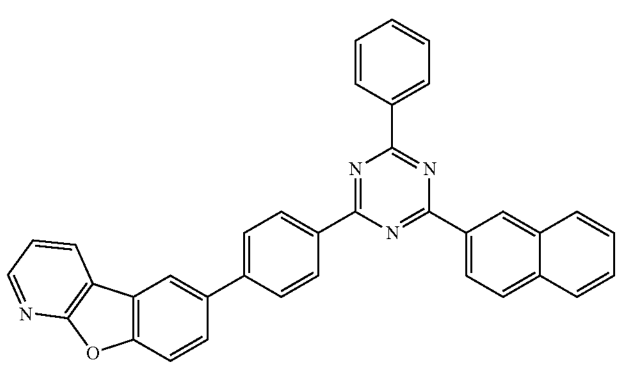

-continued
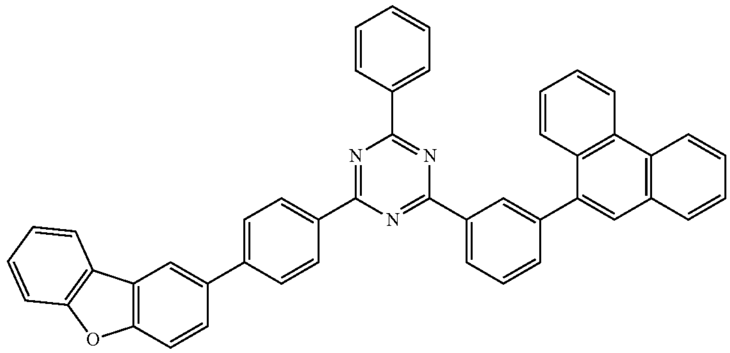
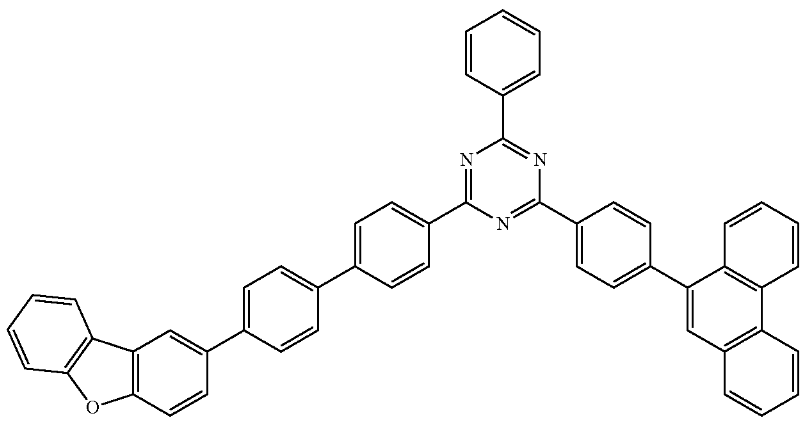
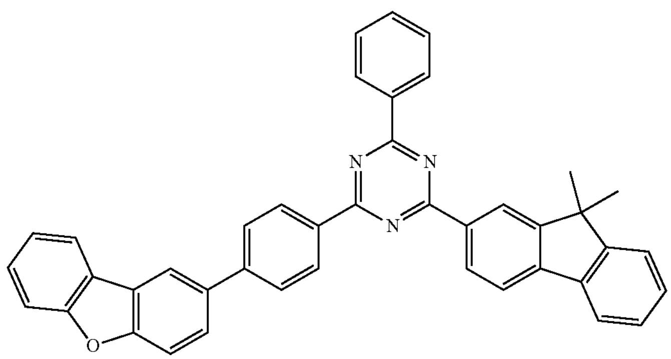
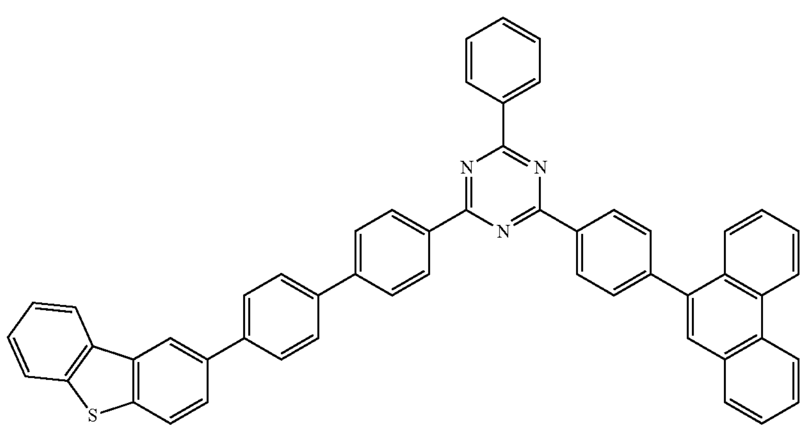

-continued
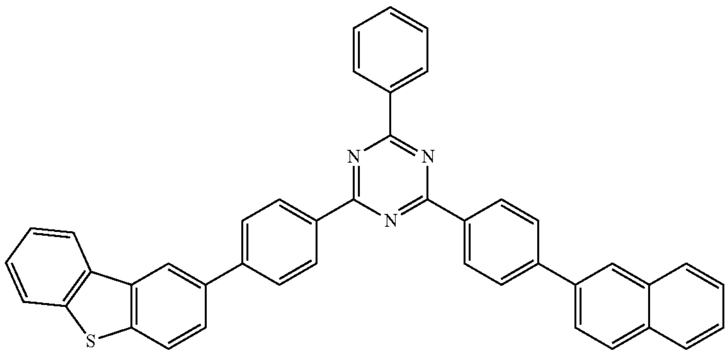
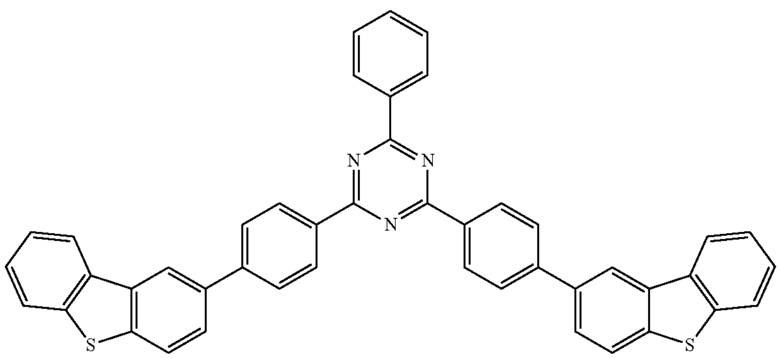
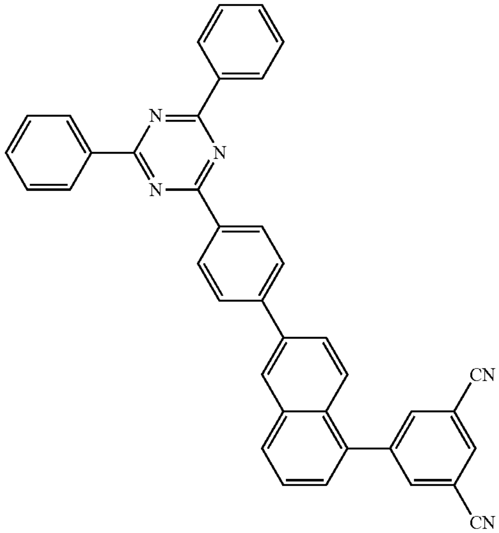
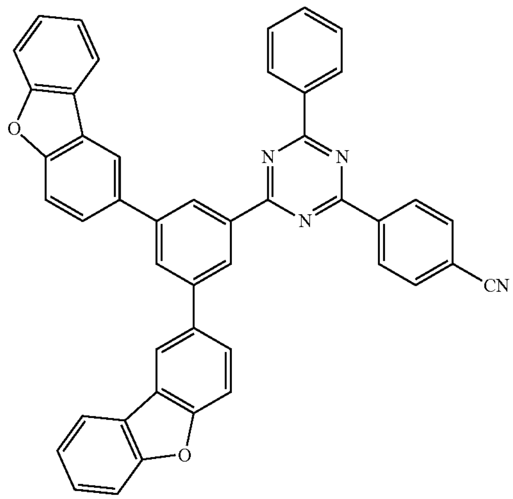

-continued
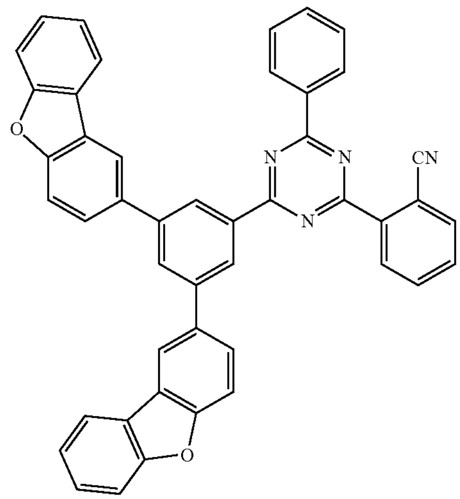
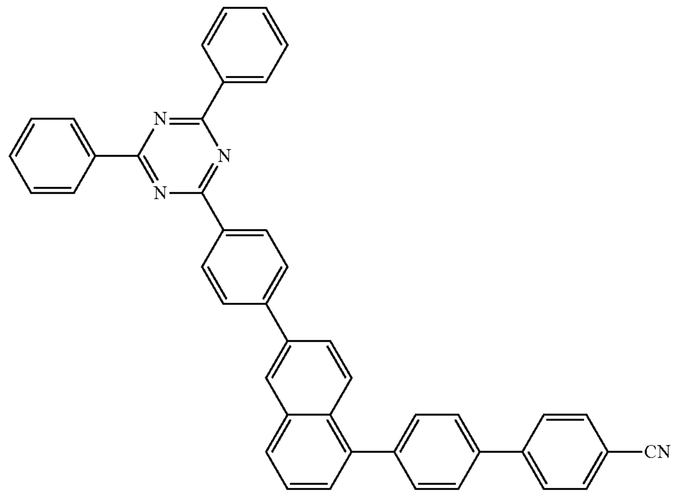
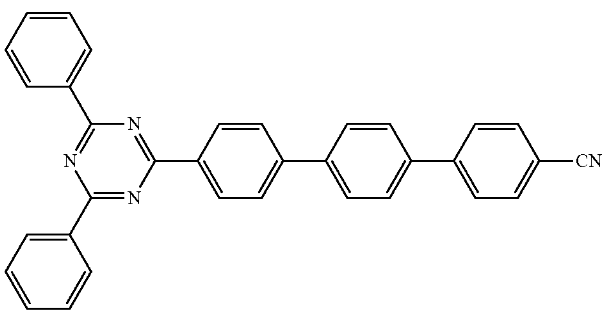
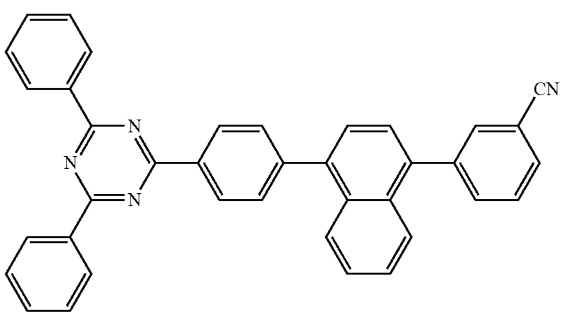
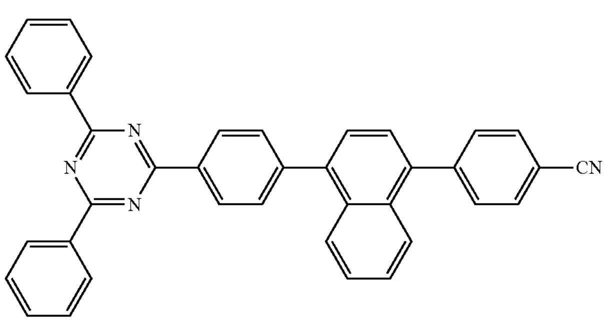

-continued
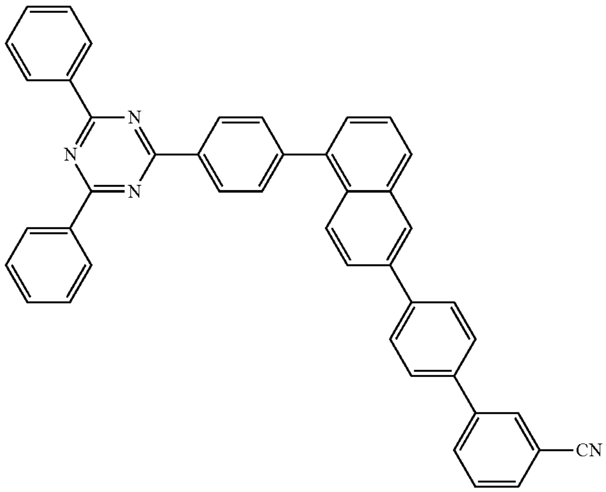
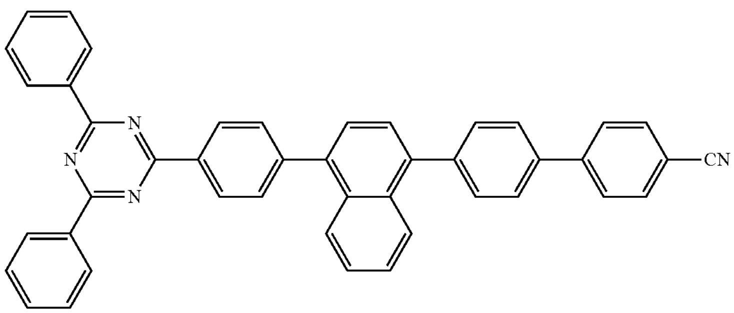
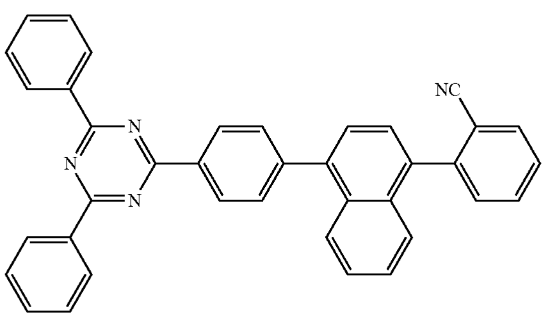
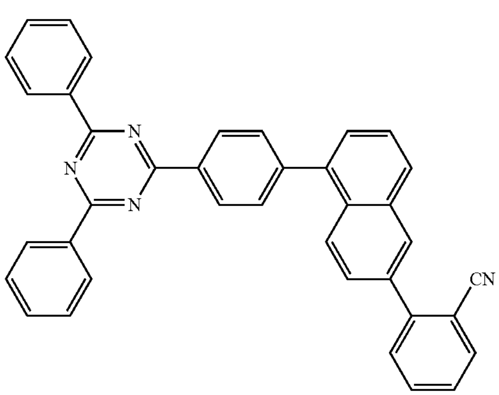
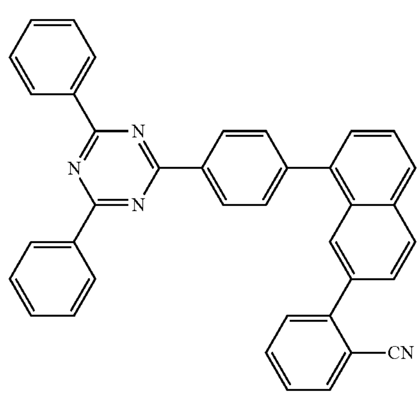

-continued
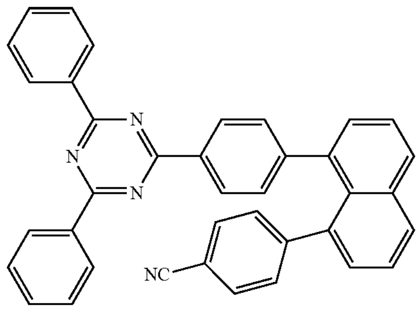
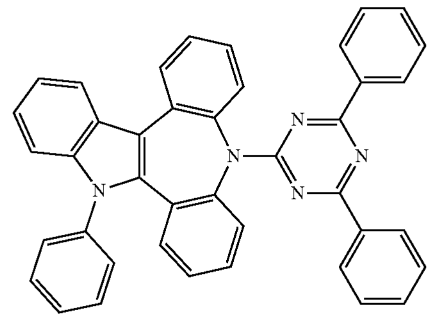
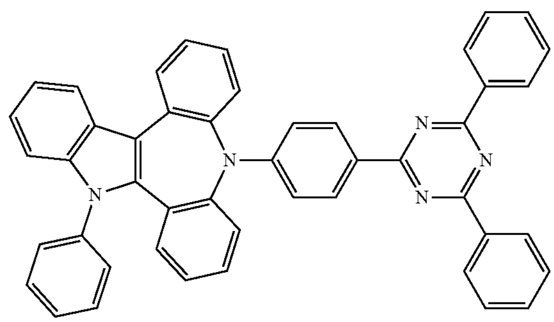
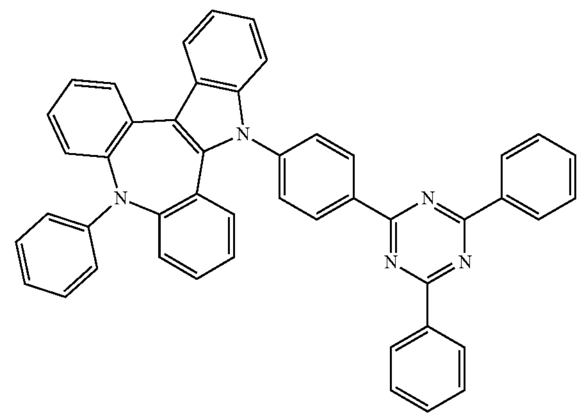
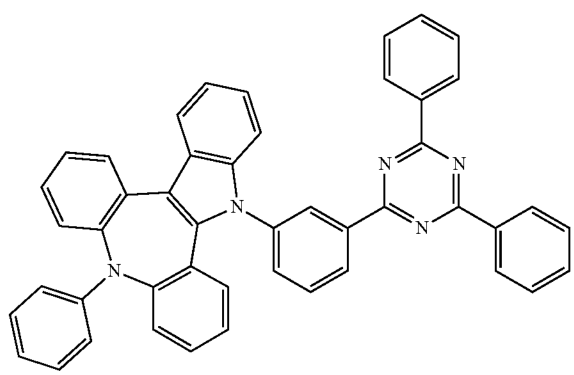
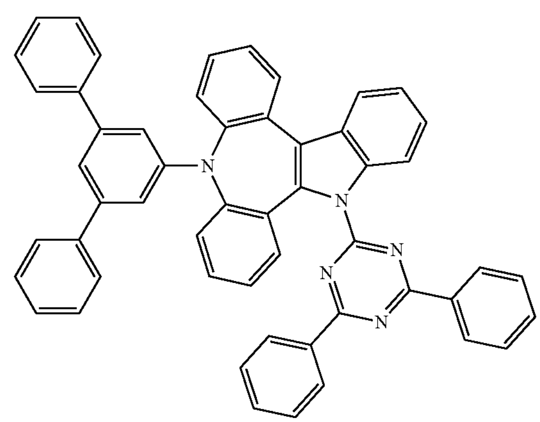
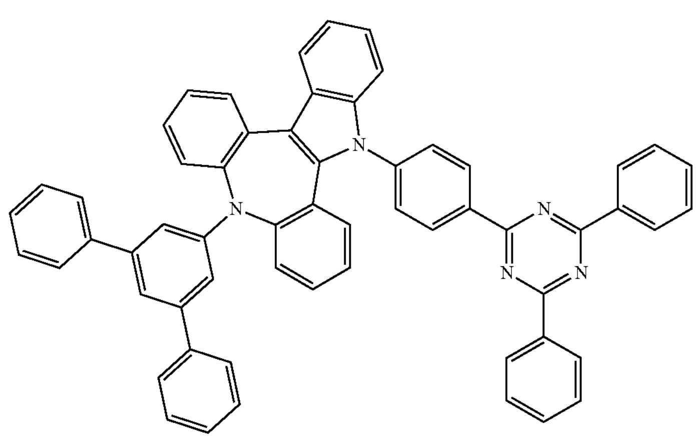

-continued
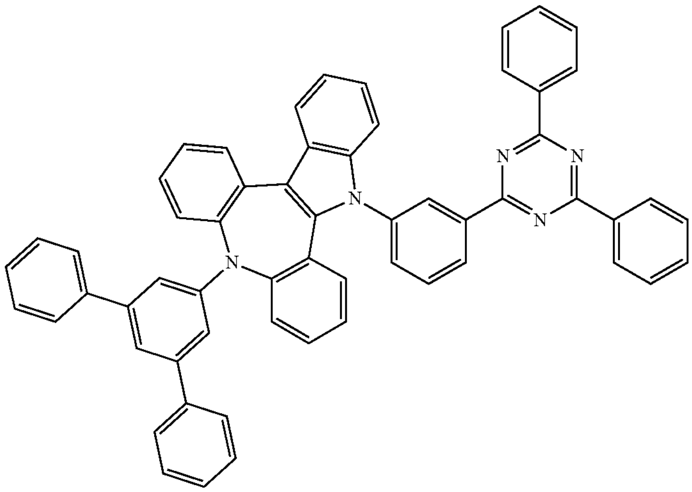
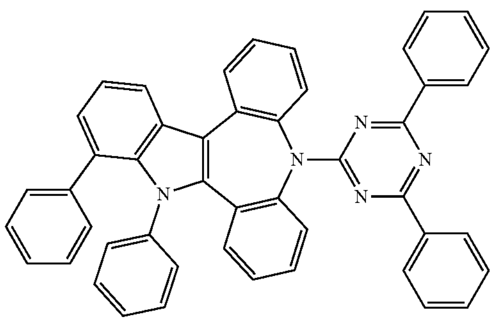
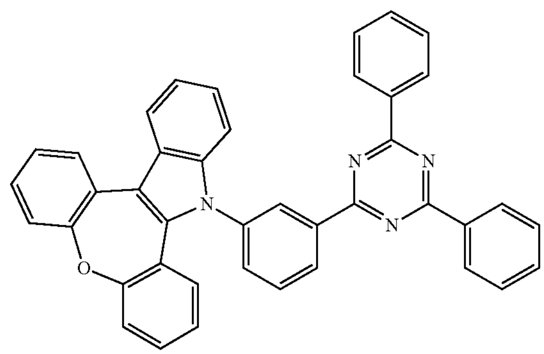
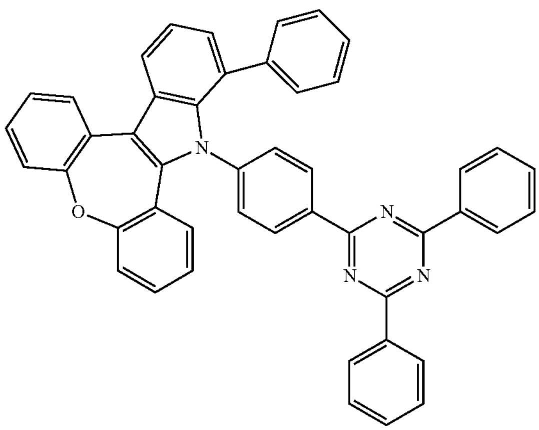
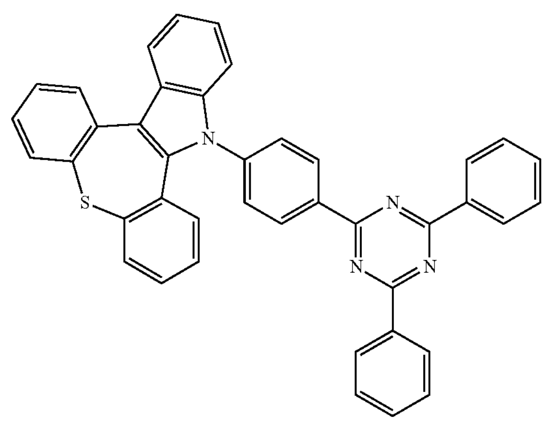
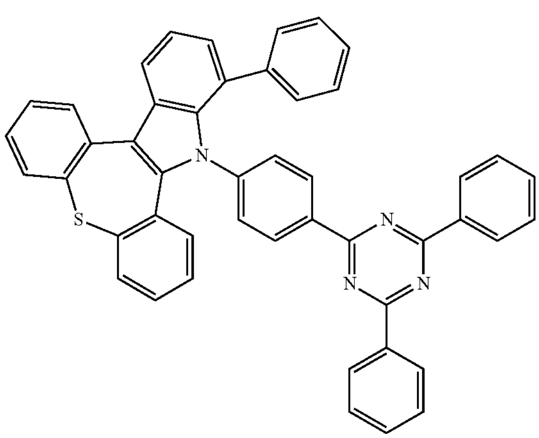
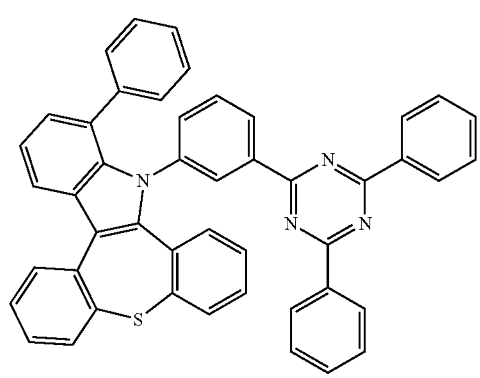

-continued
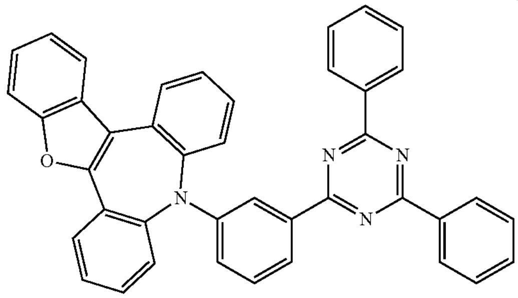
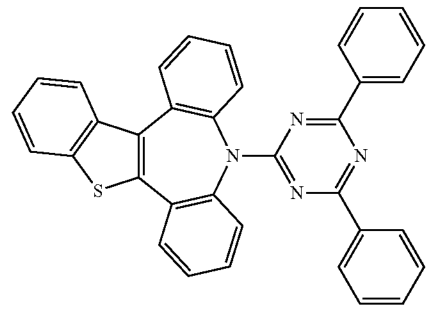
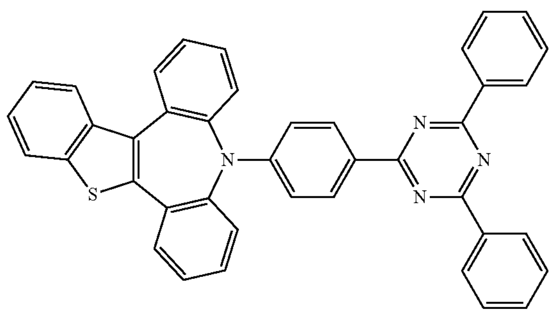
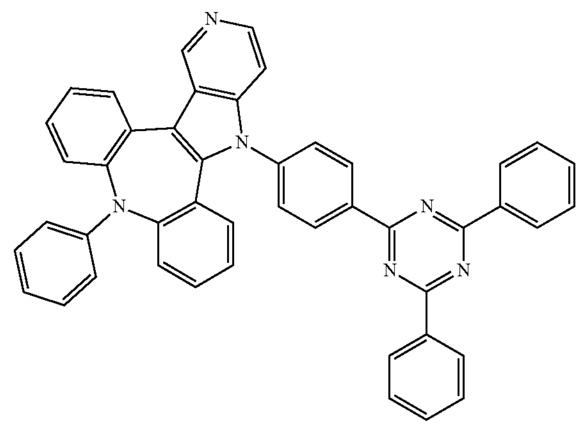
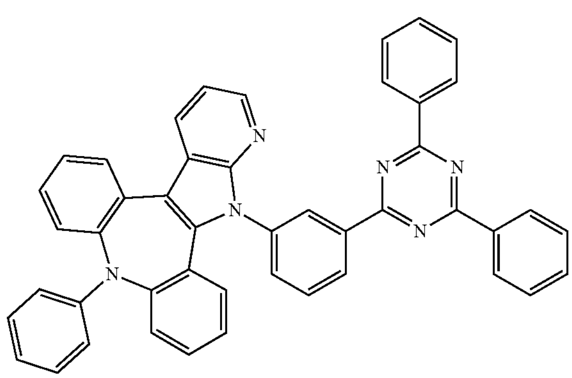
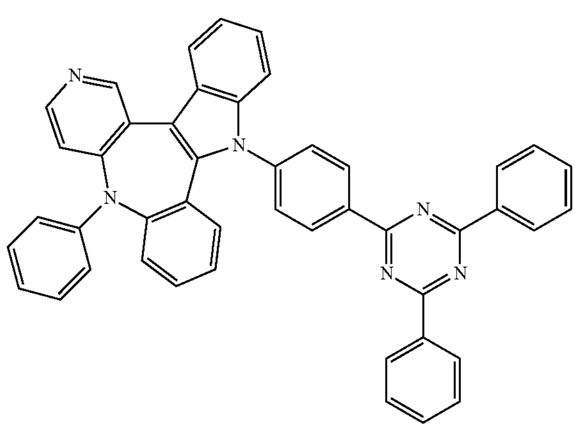
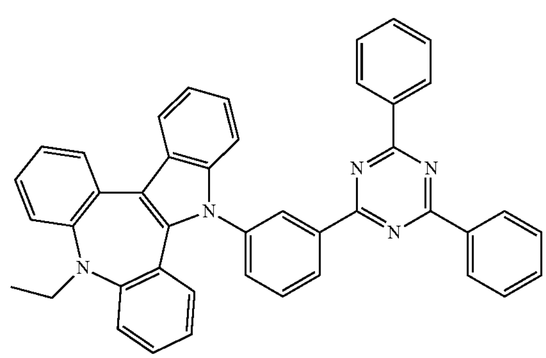

-continued
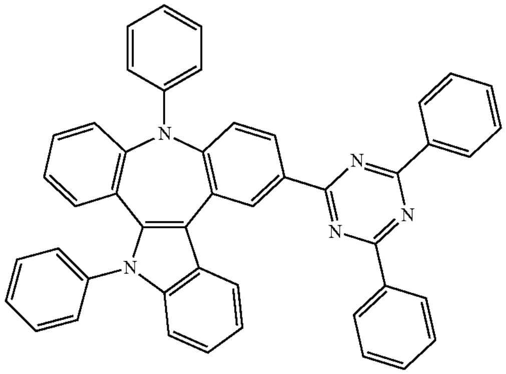
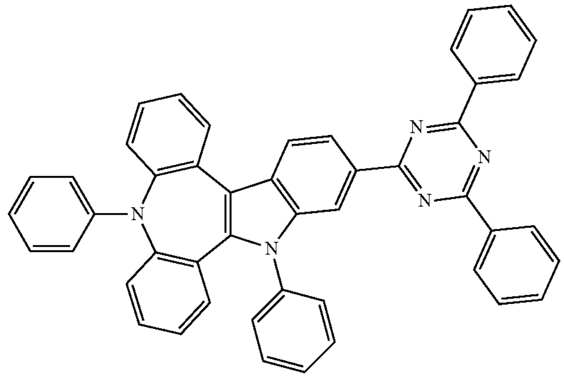
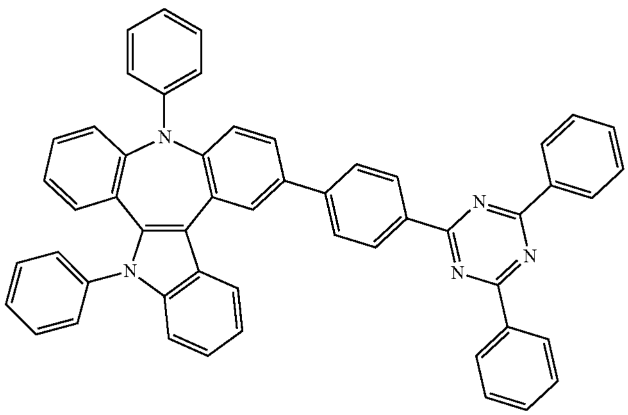
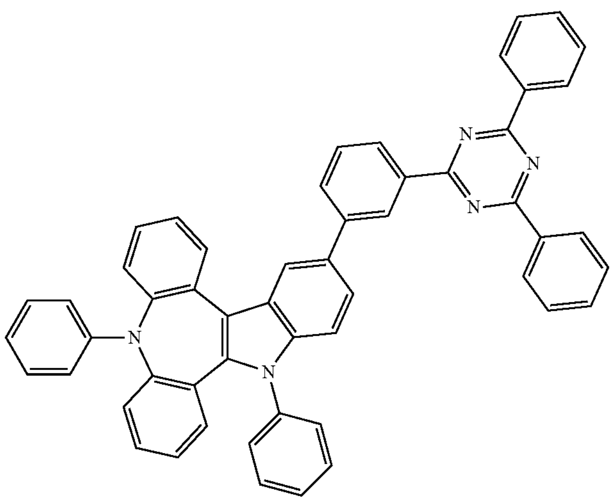
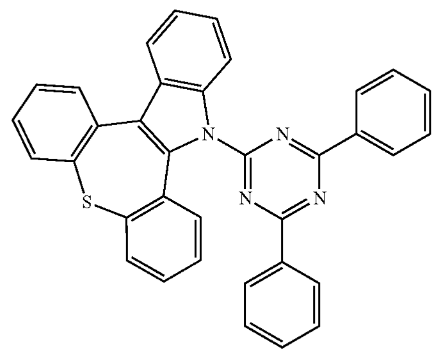
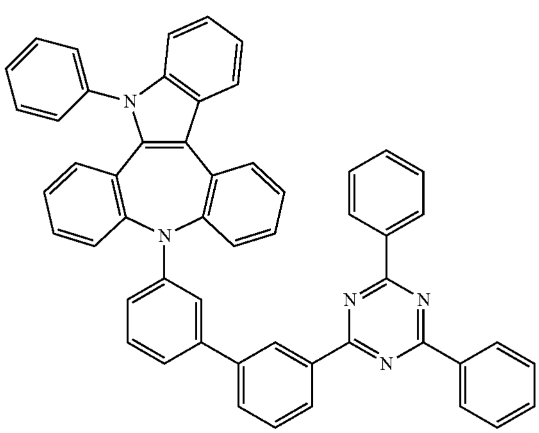

-continued
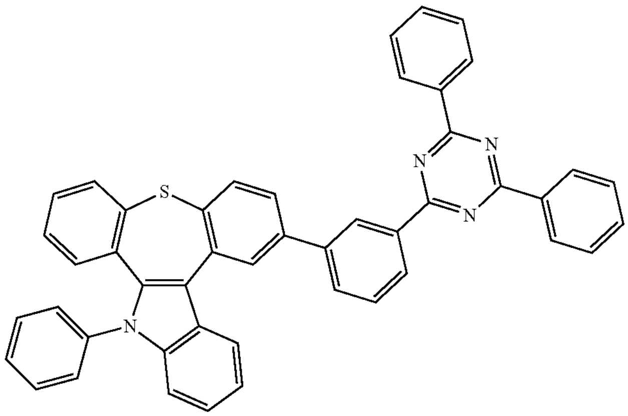
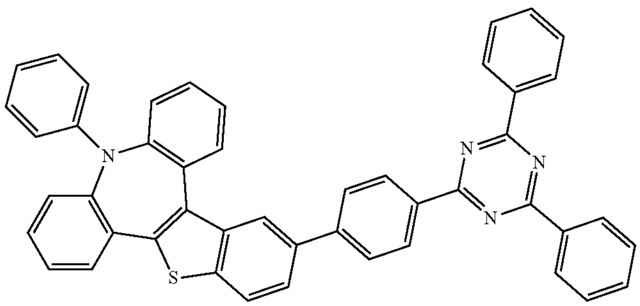
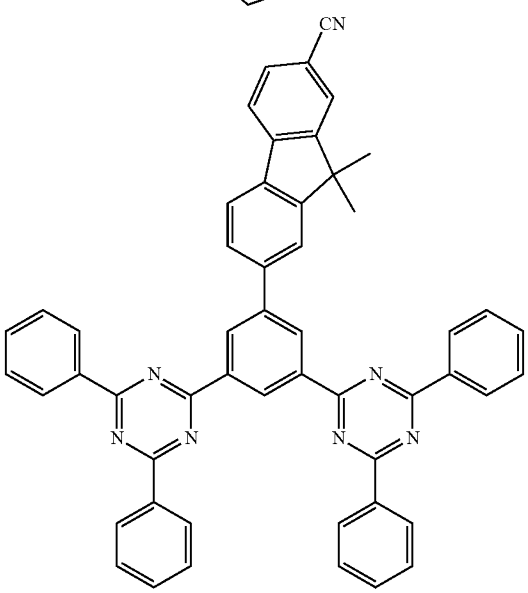
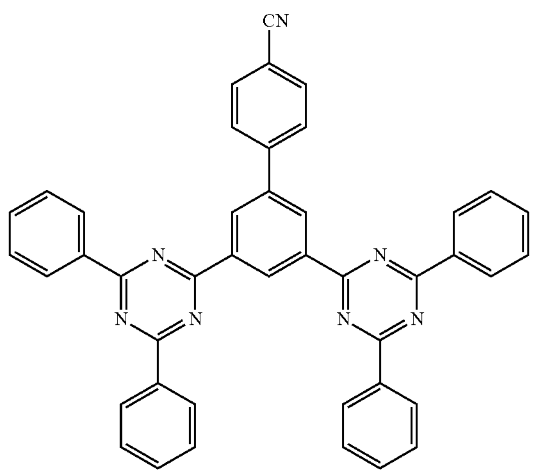
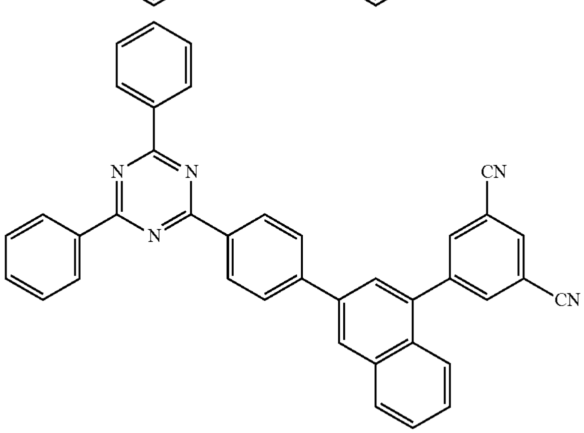

-continued
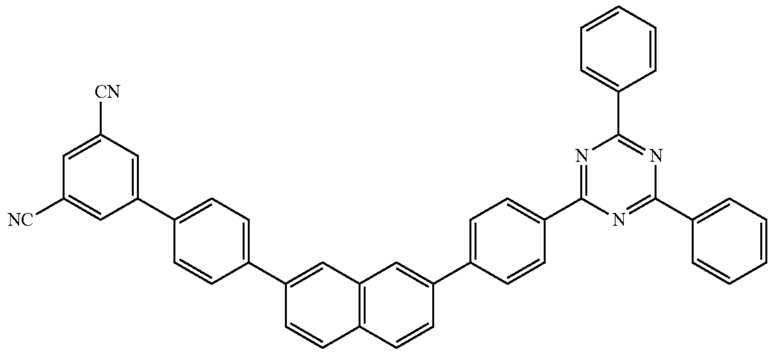
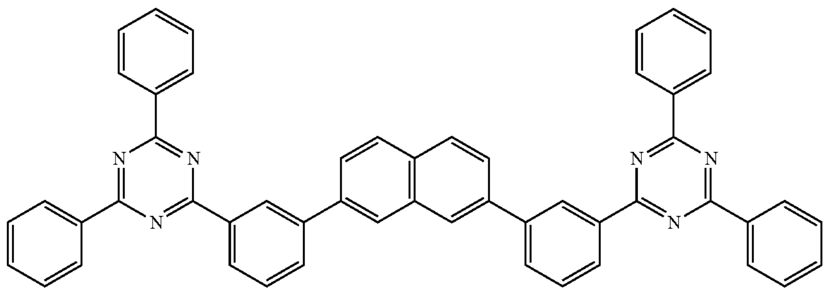
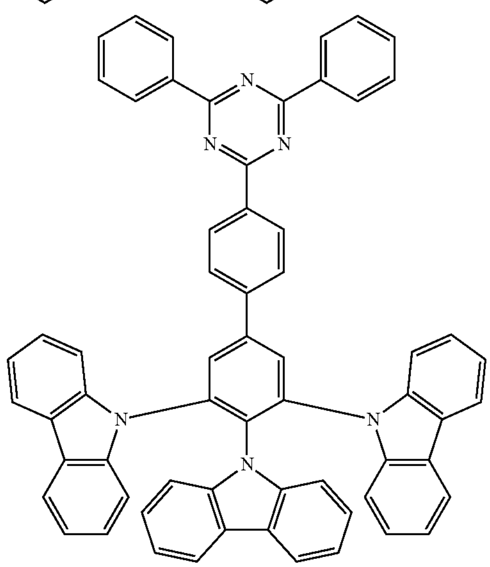
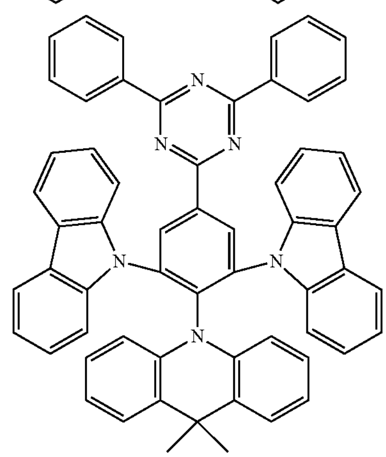
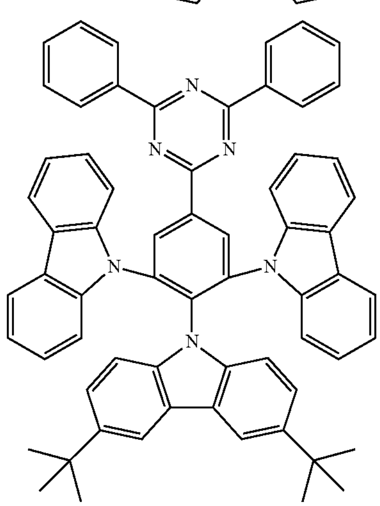
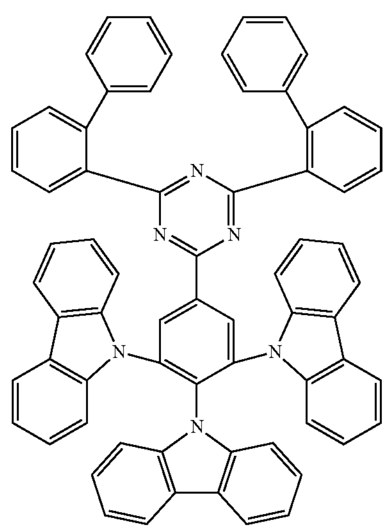

-continued
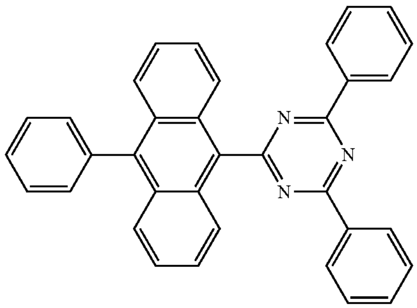
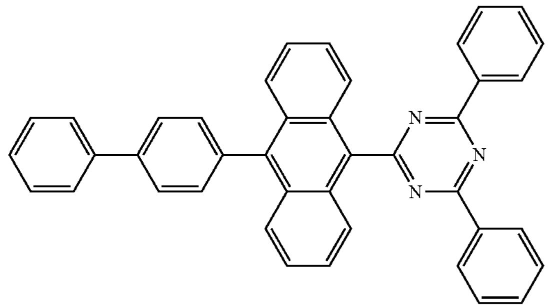
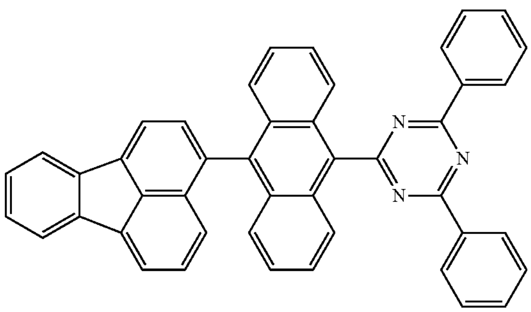
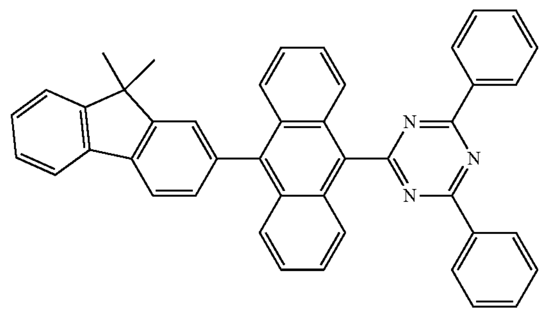
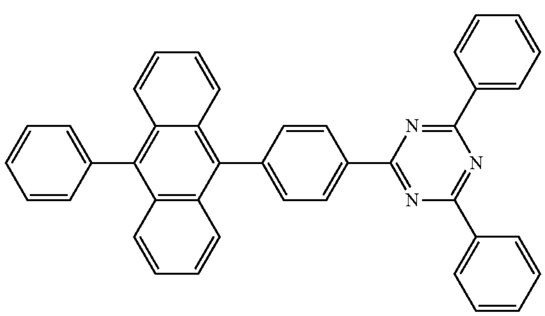
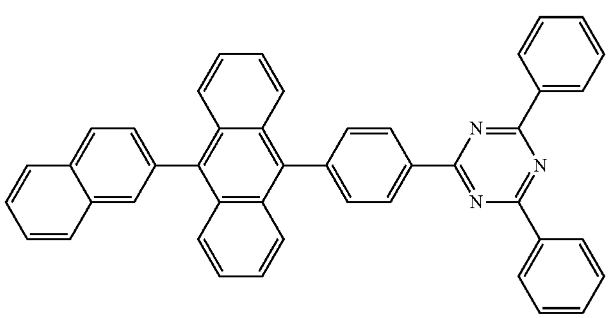
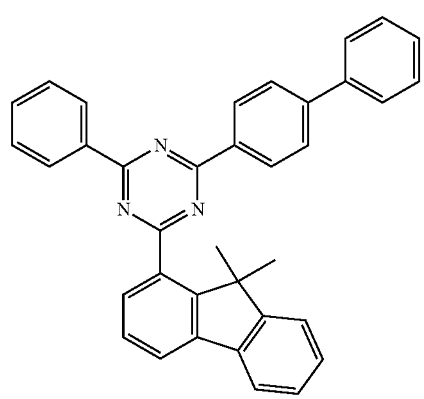

-continued
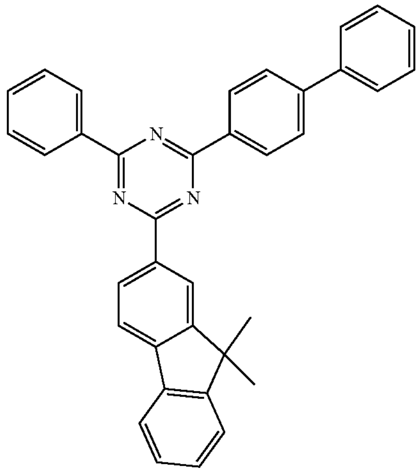
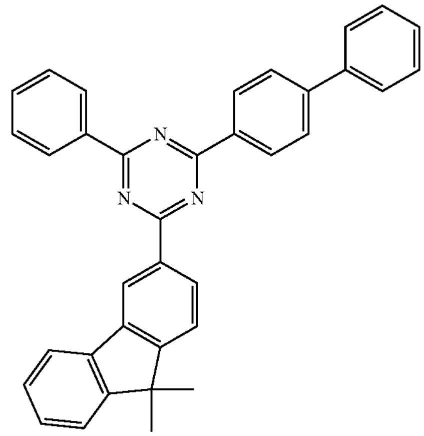
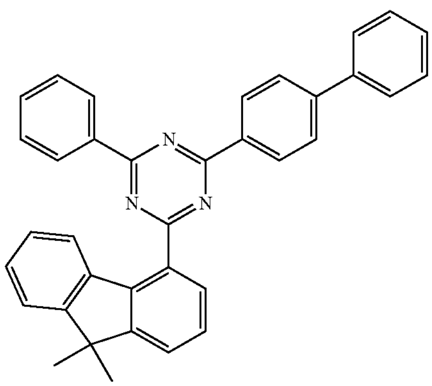
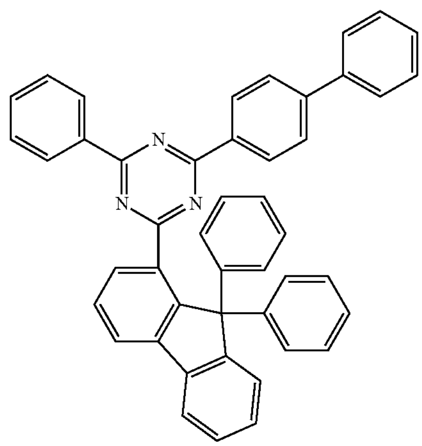
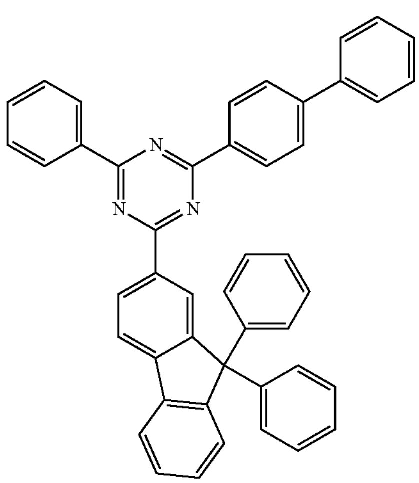
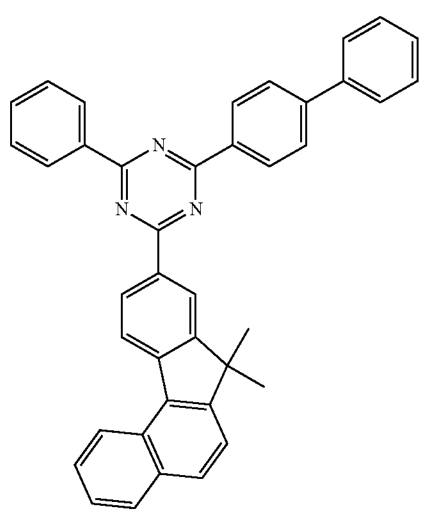

-continued
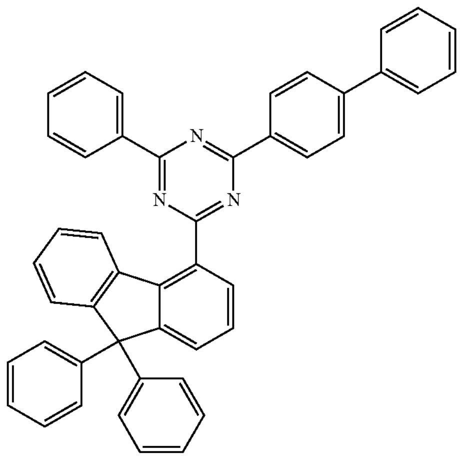
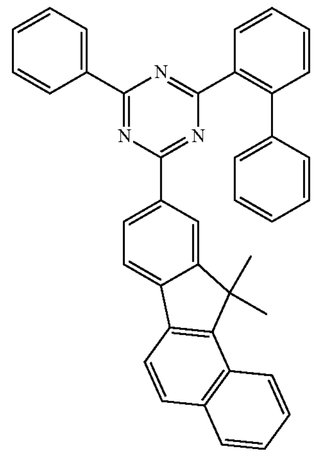
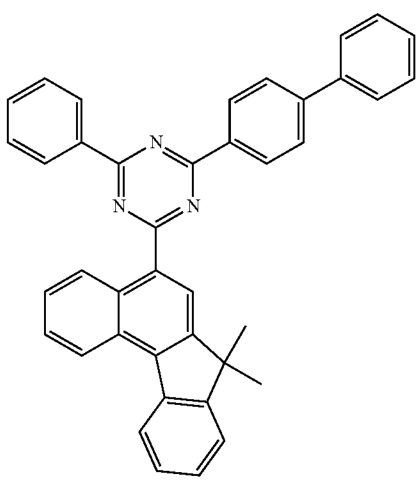
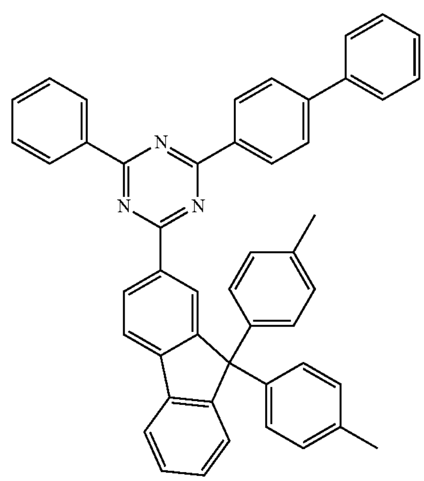
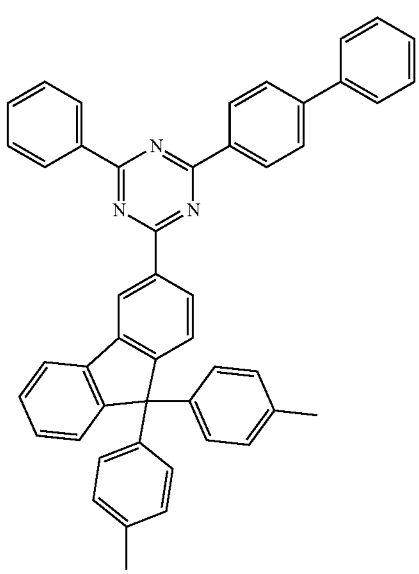
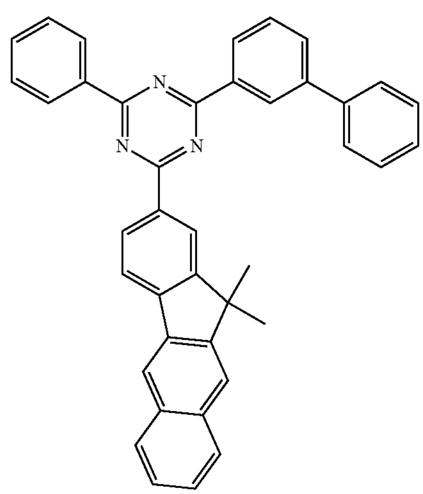

-continued
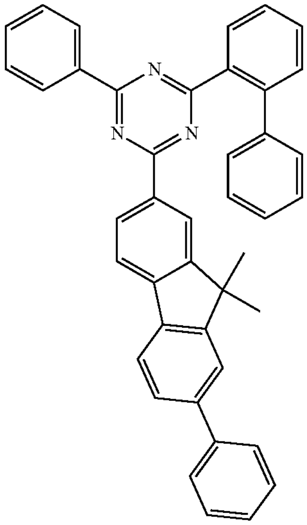
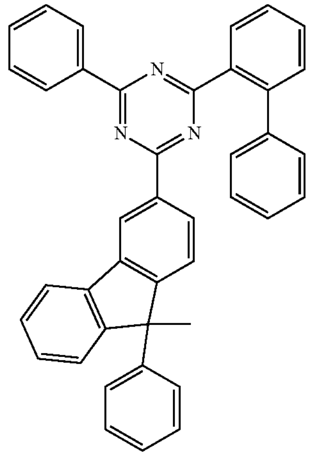
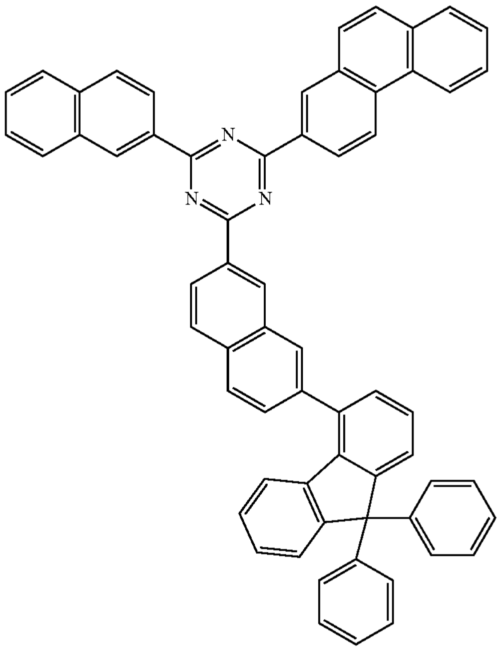
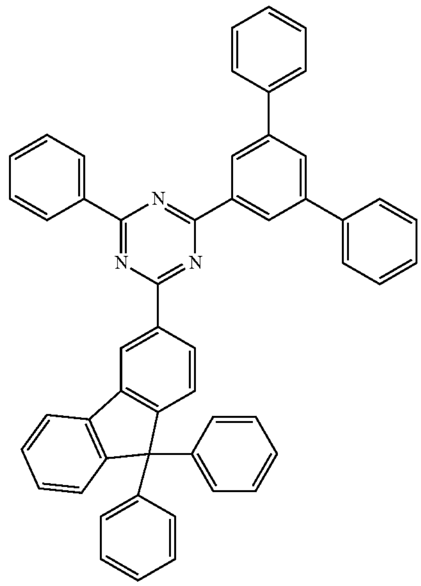
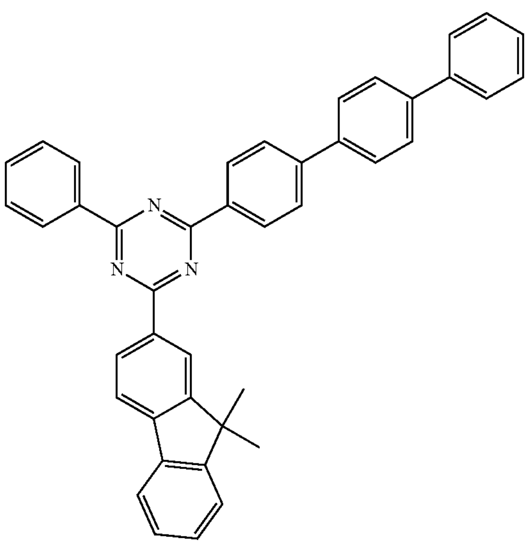
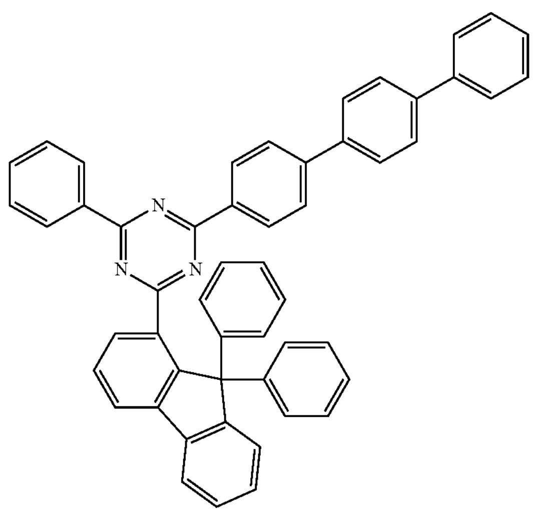

-continued
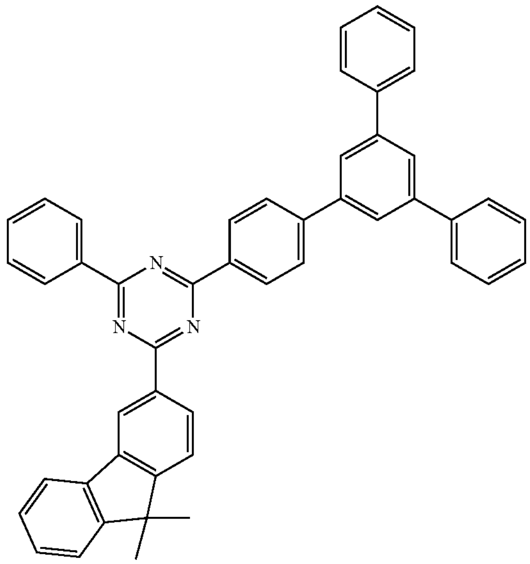
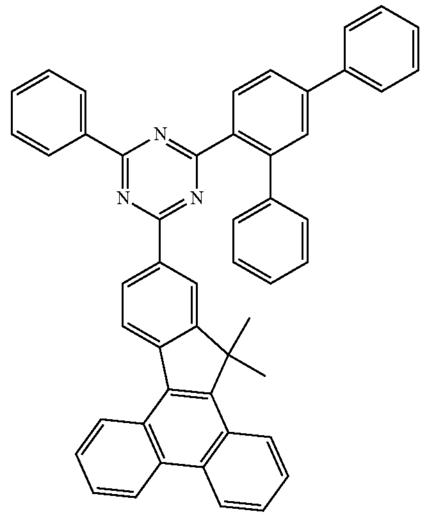
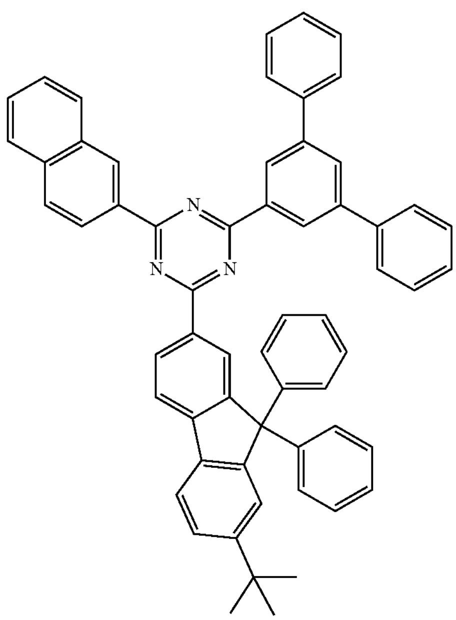
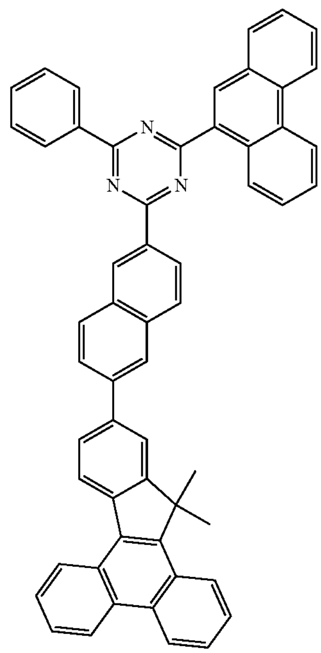
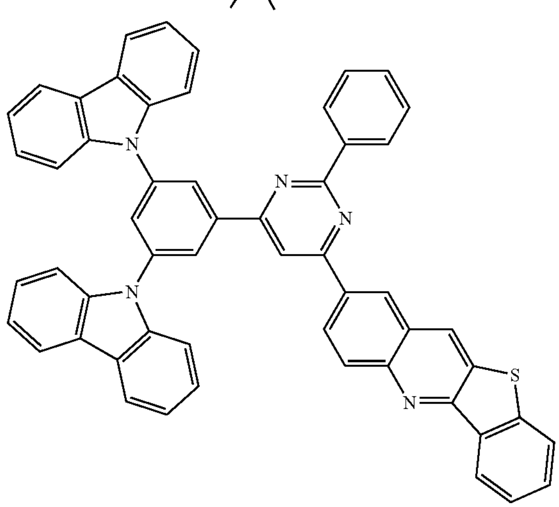
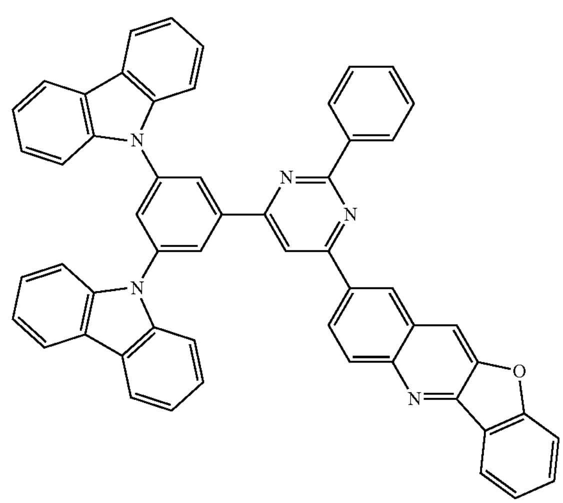

-continued
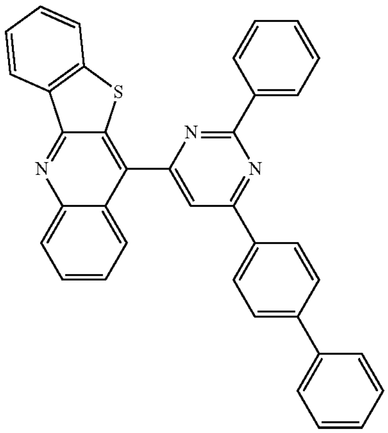
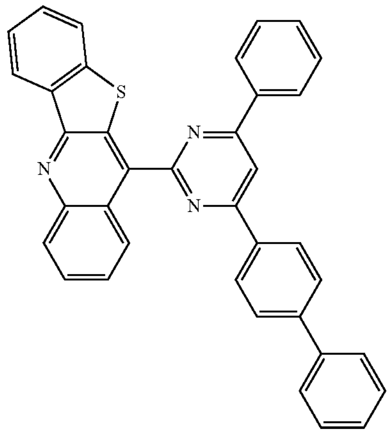
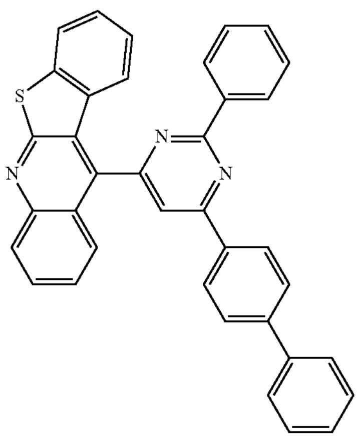
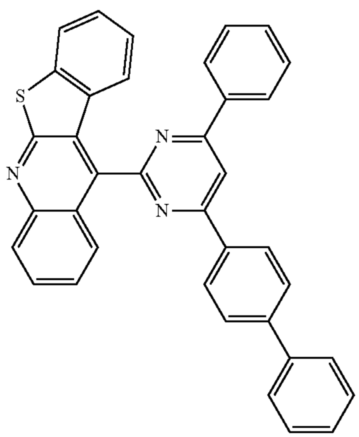
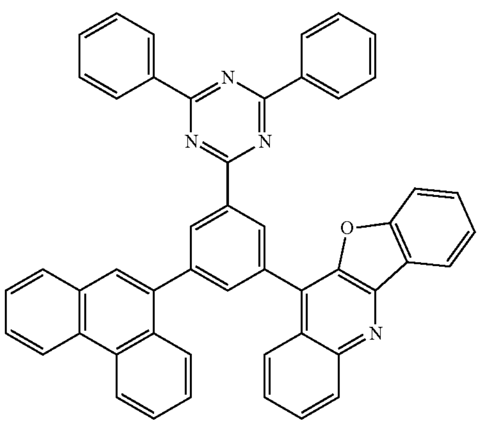
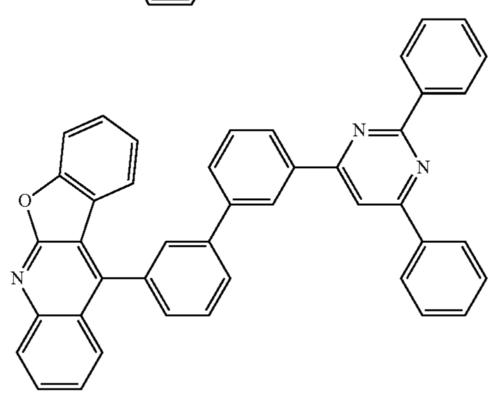
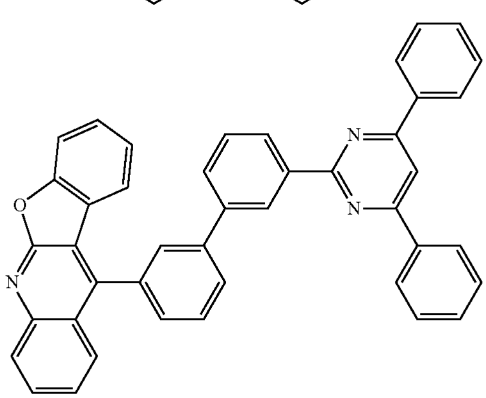
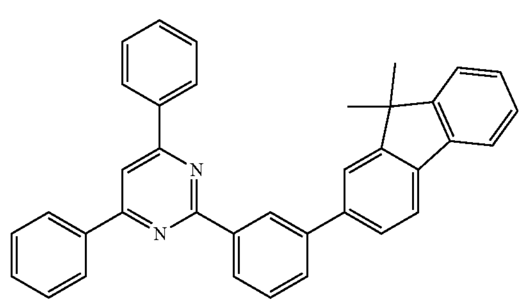

-continued
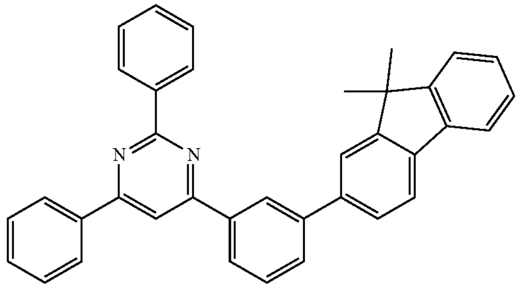
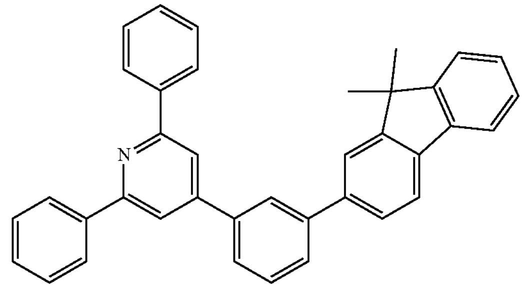
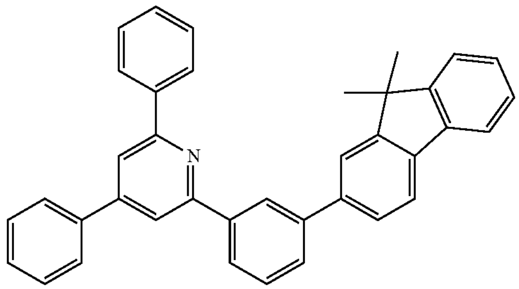
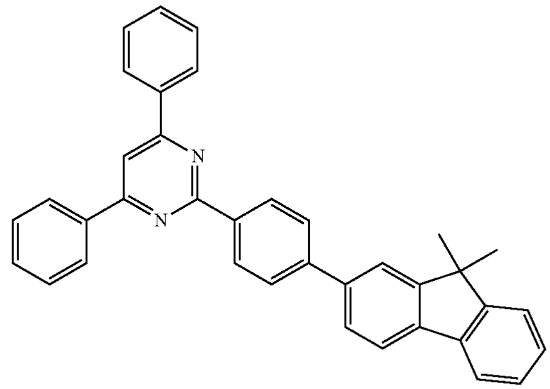
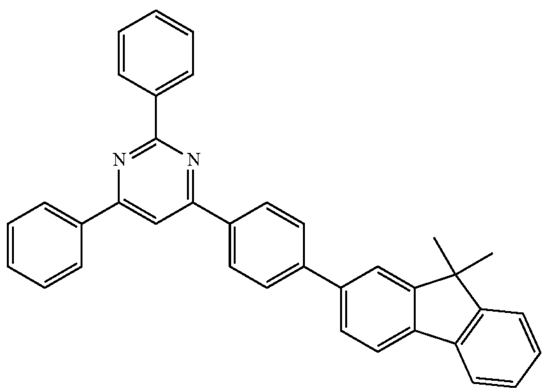
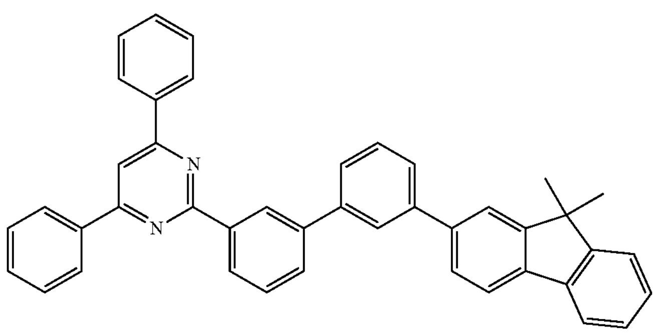
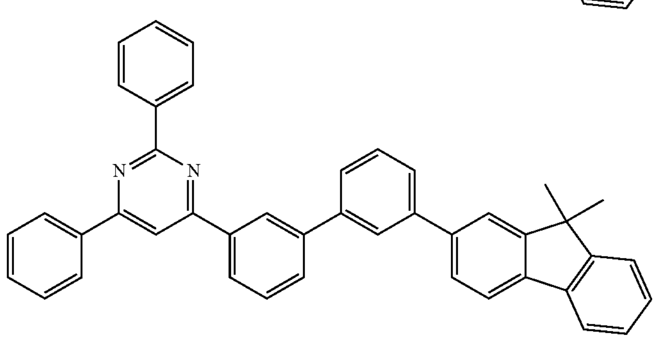

-continued
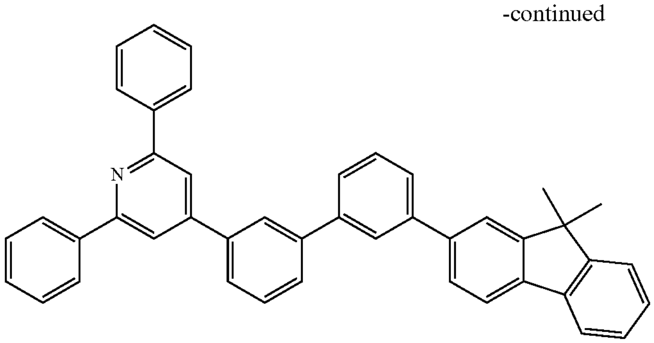
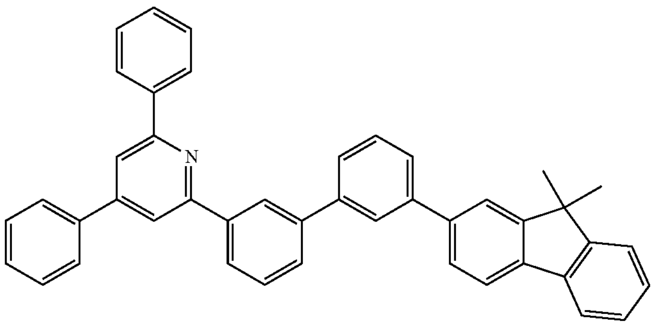
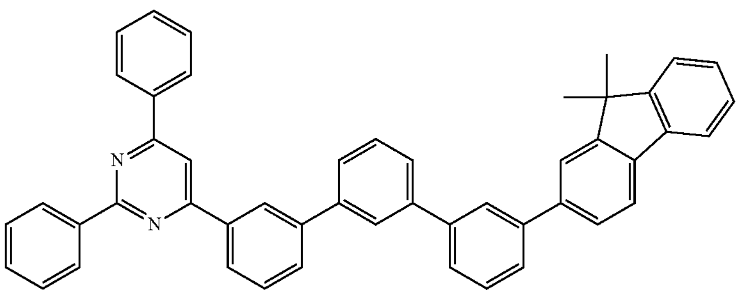
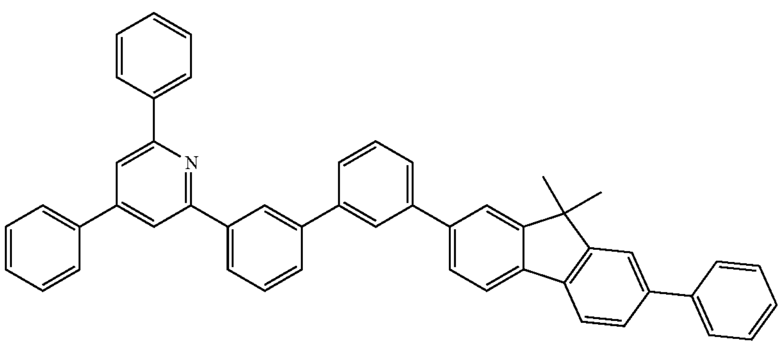
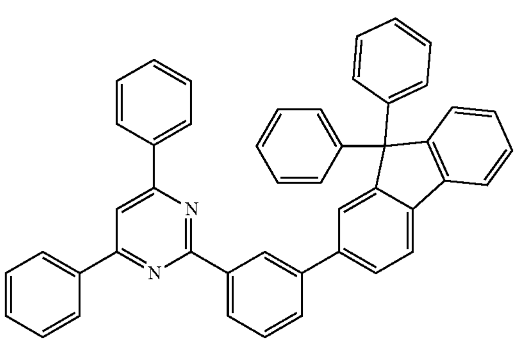
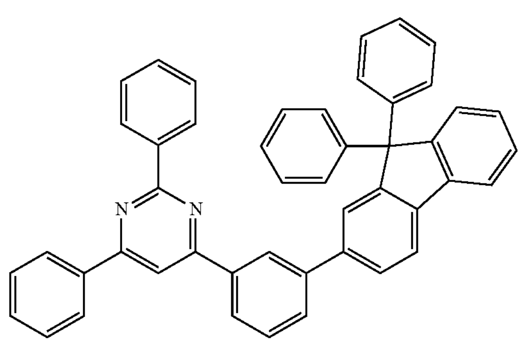

-continued
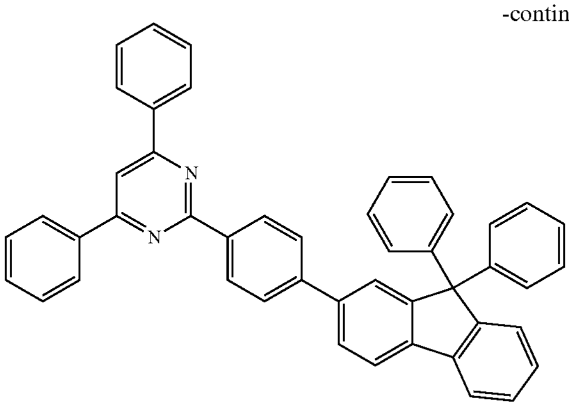
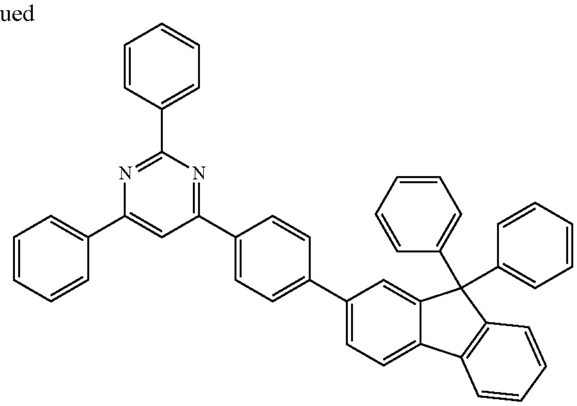
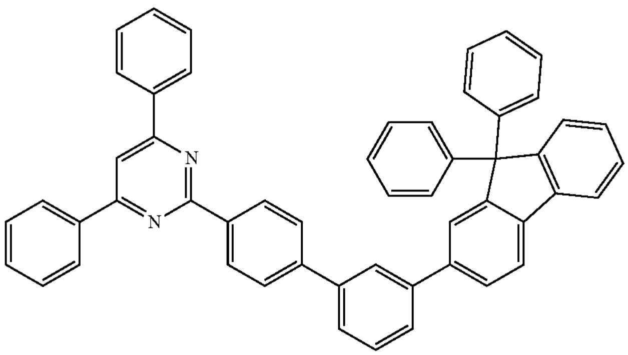
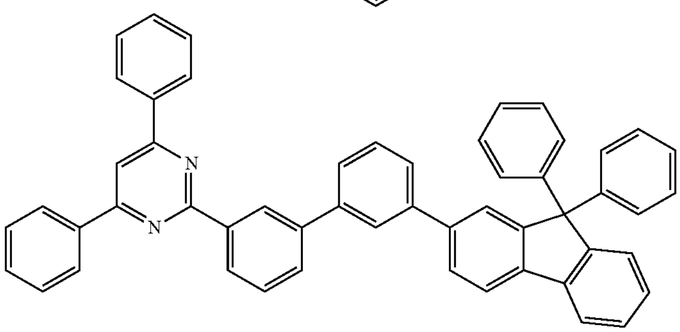
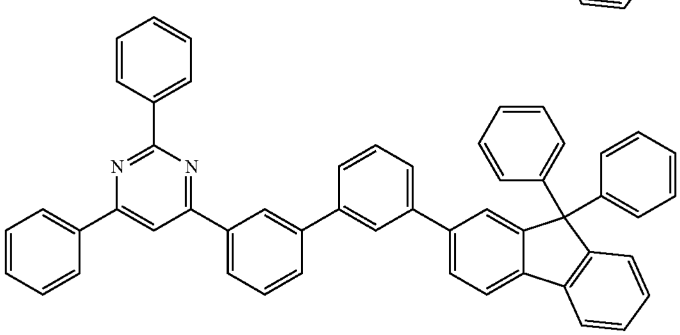
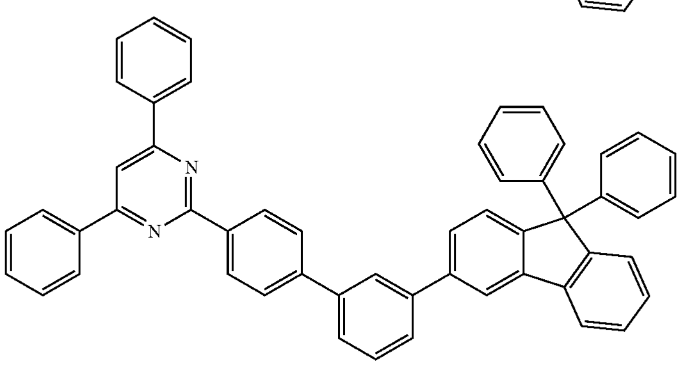

-continued
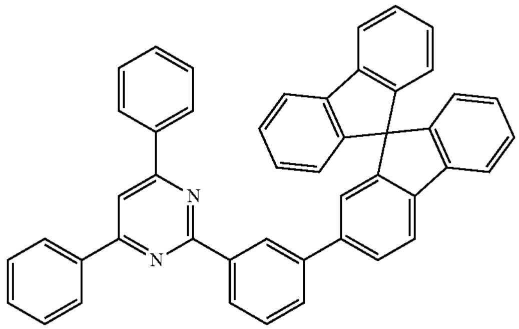
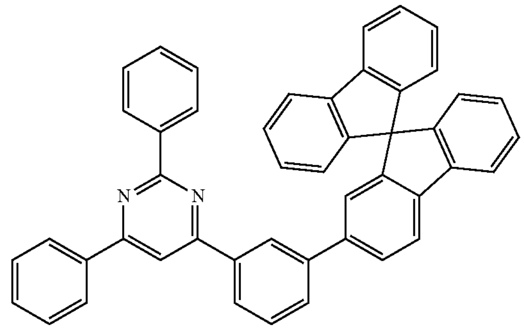
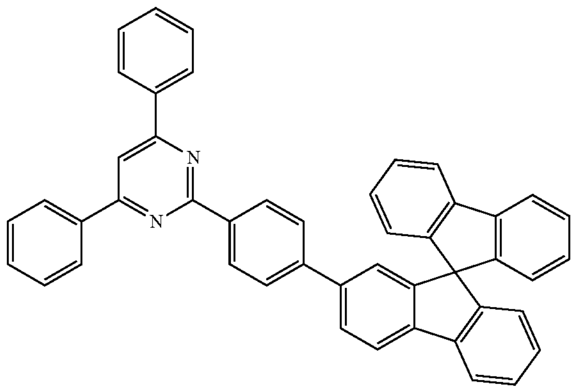
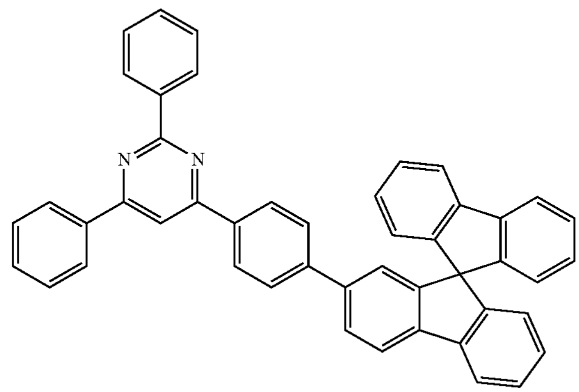
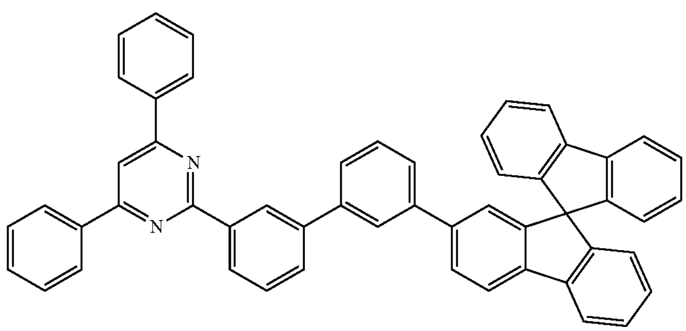
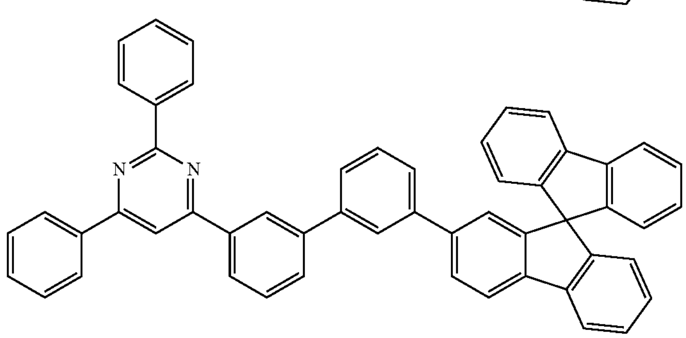
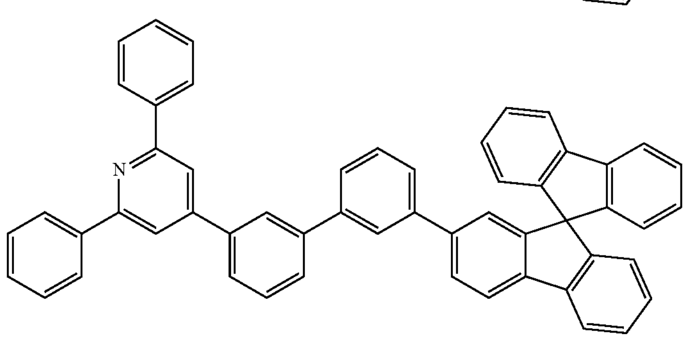

-continued
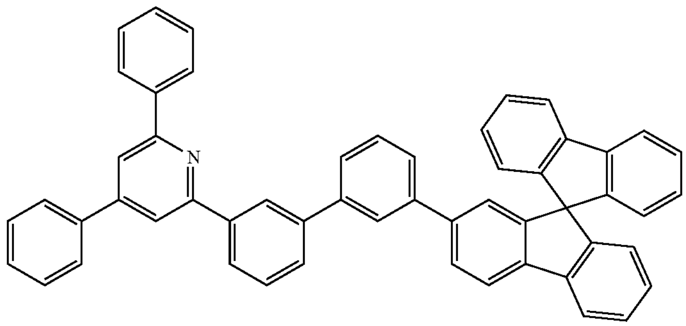
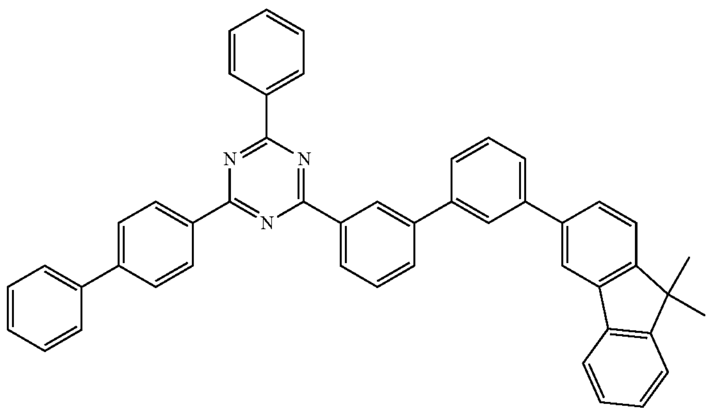
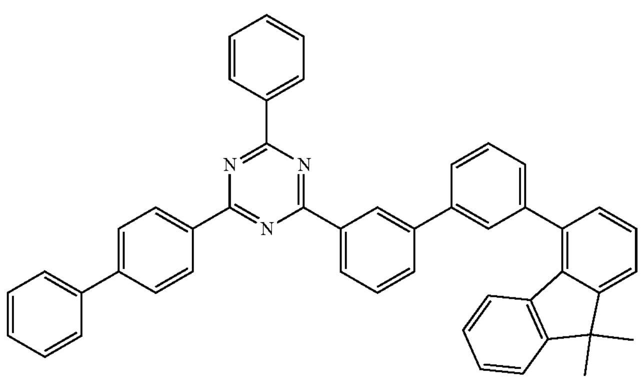
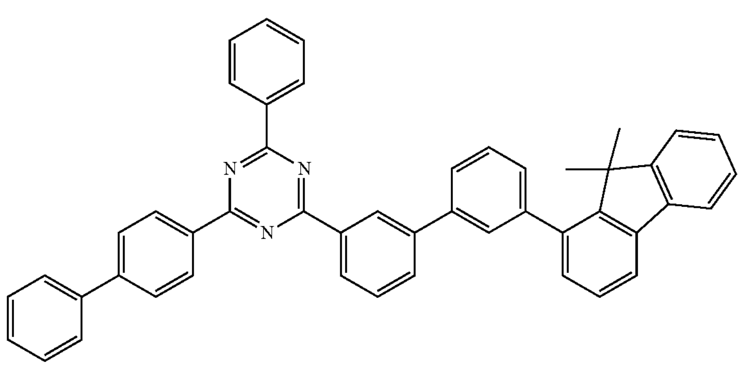

-continued
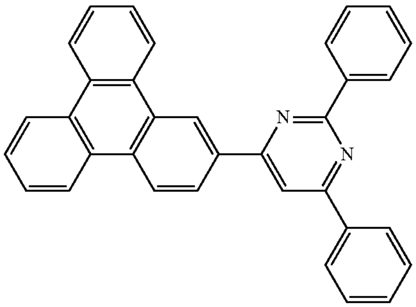
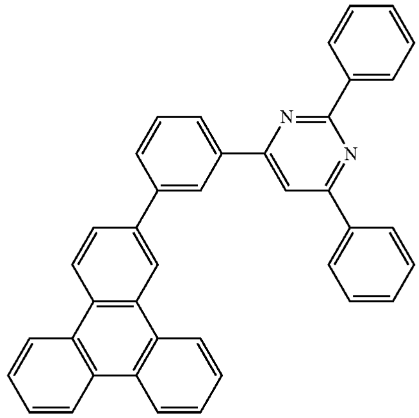
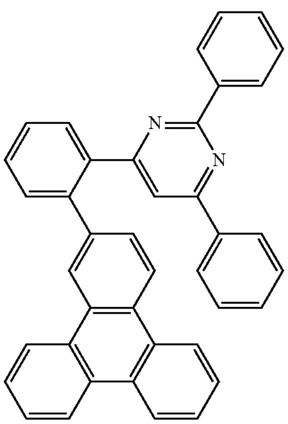
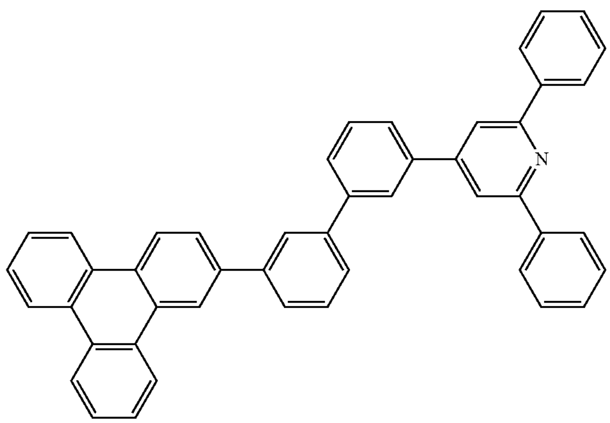
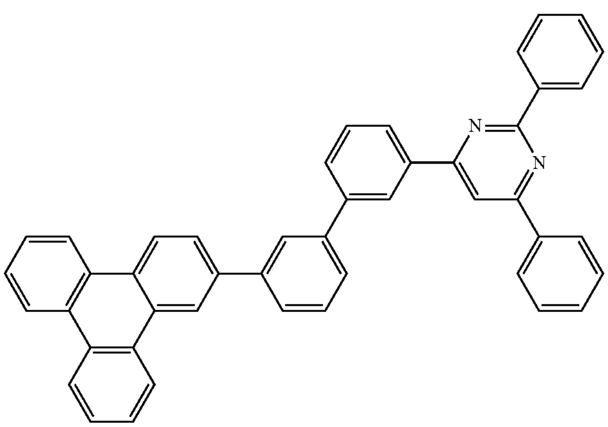

-continued
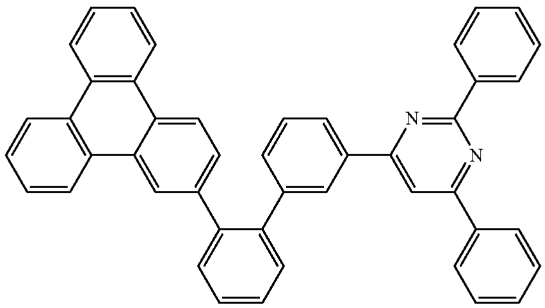
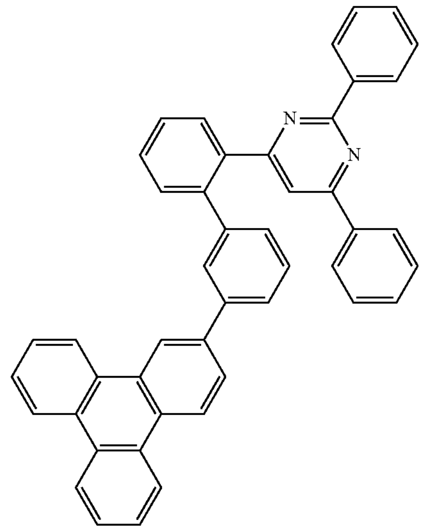
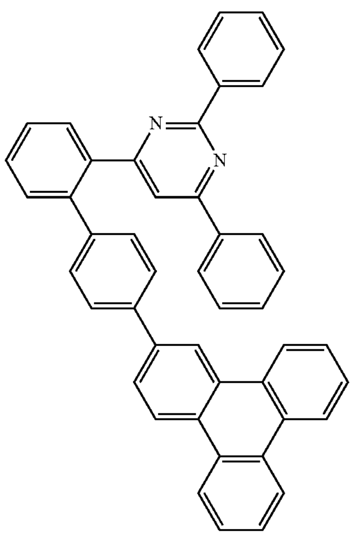
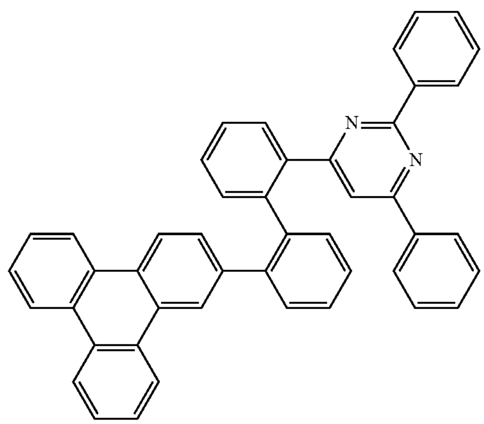
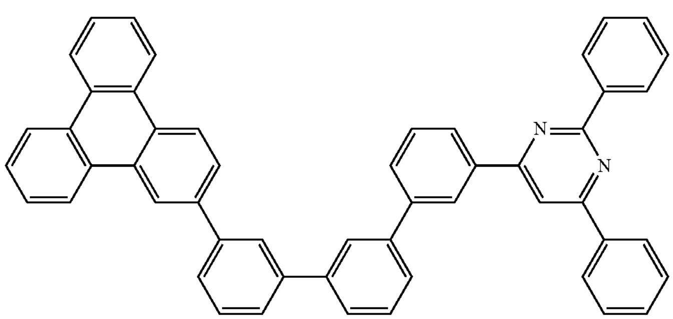
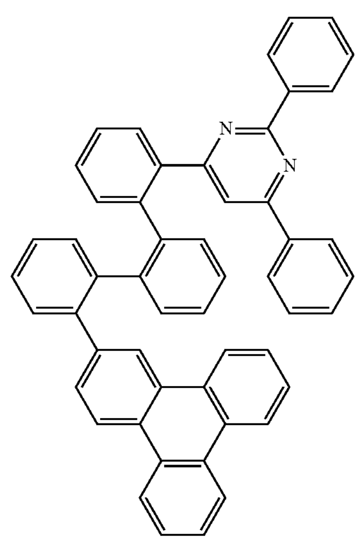

-continued
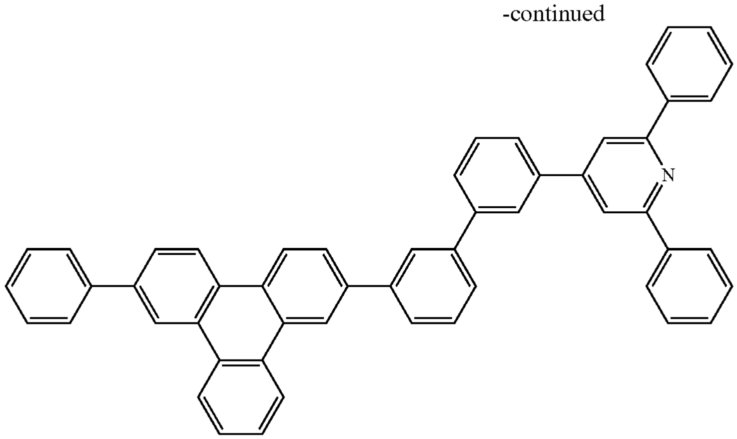
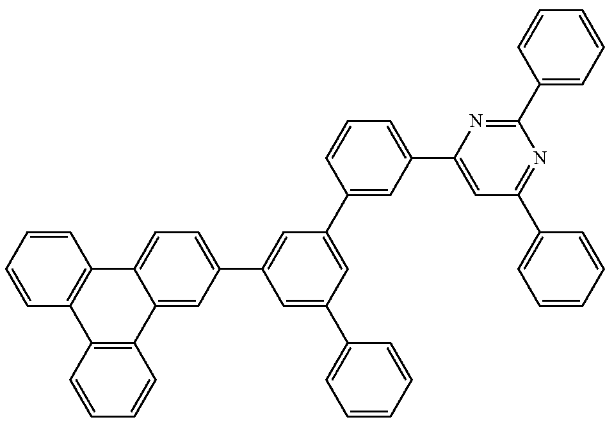
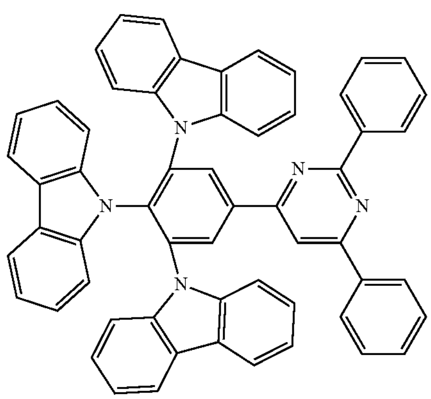
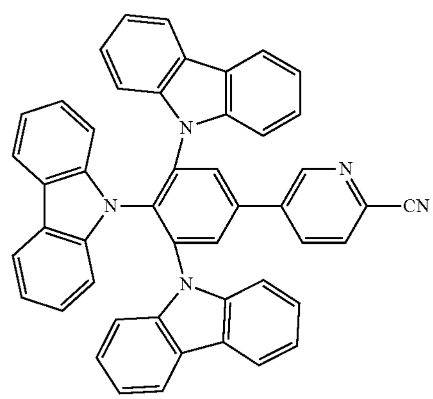
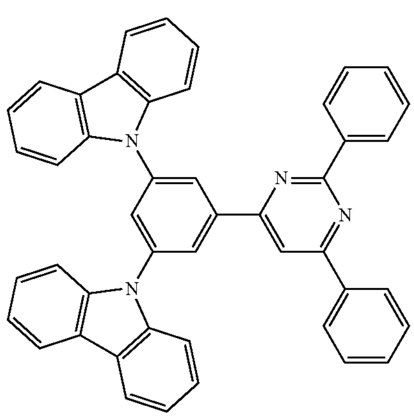
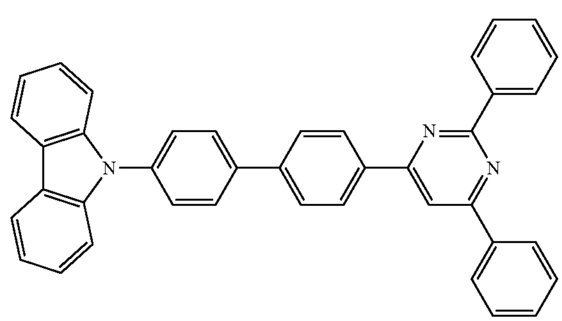

-continued
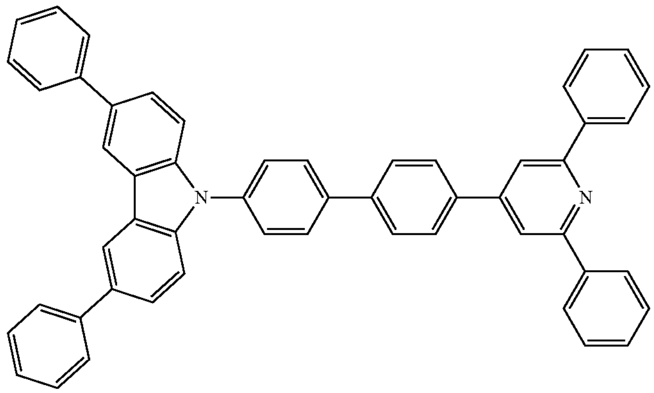
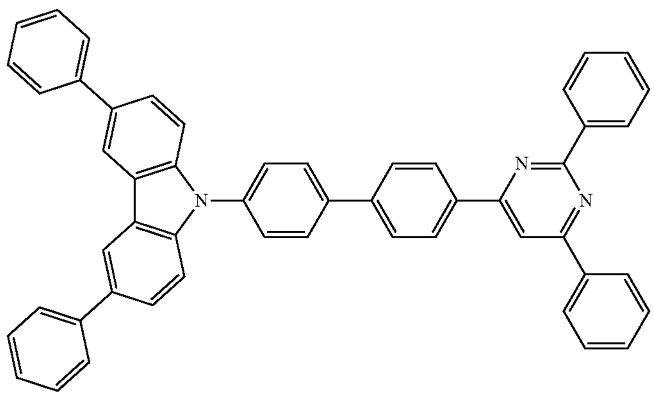
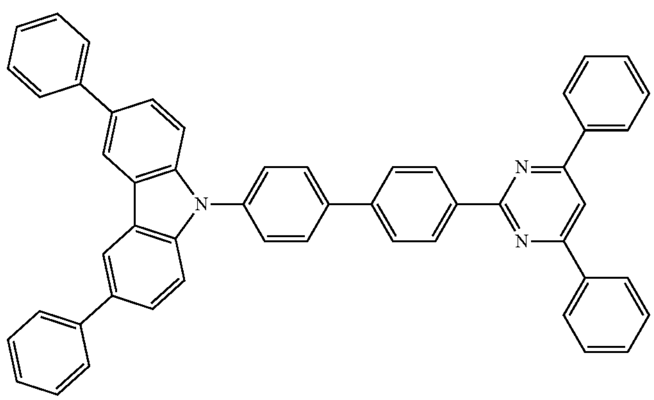
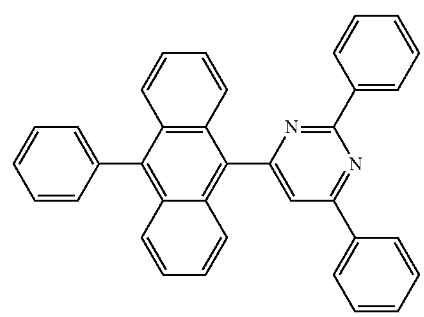
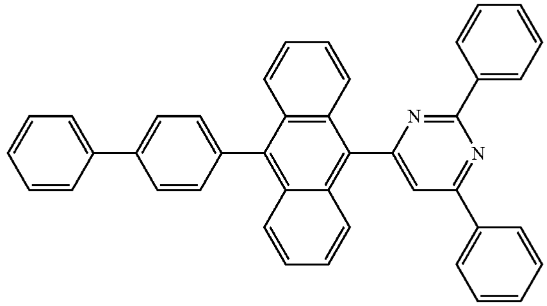
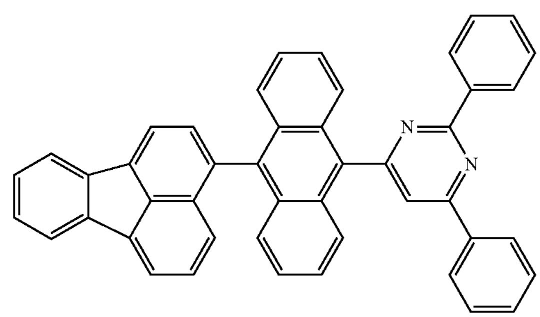

-continued
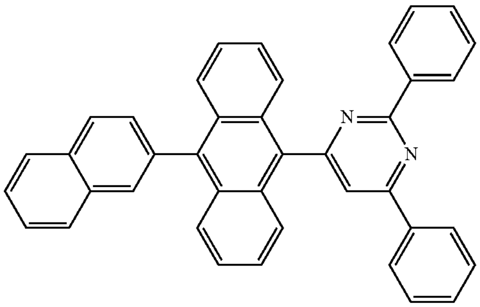
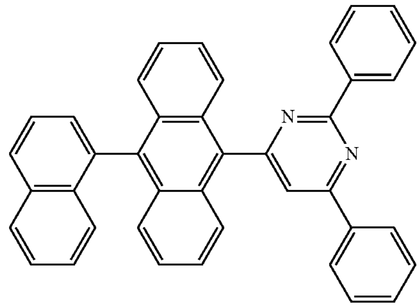
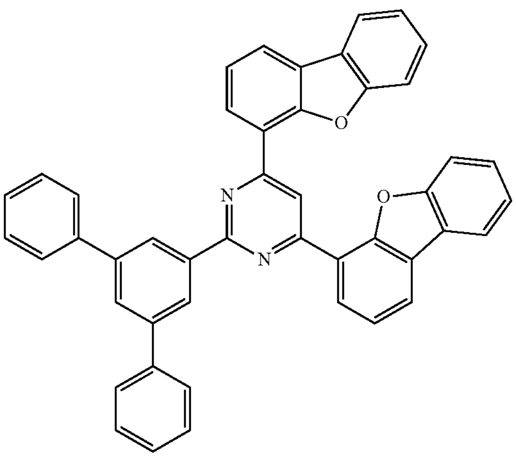
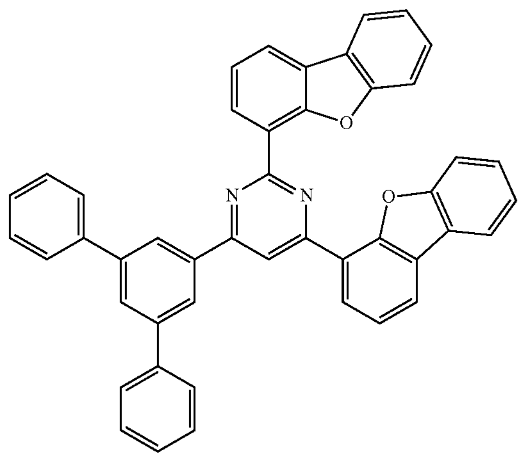
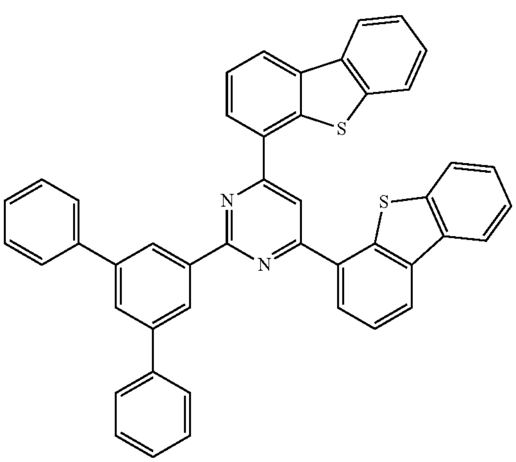
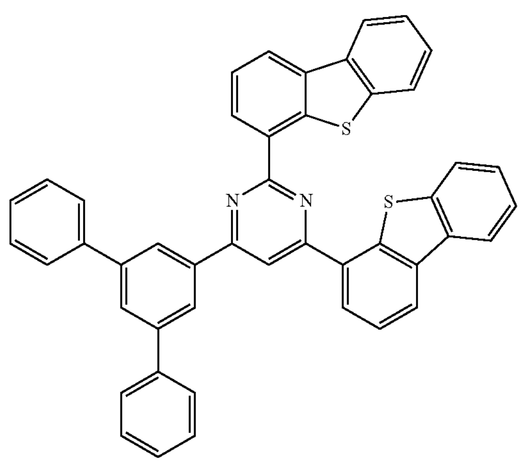

-continued
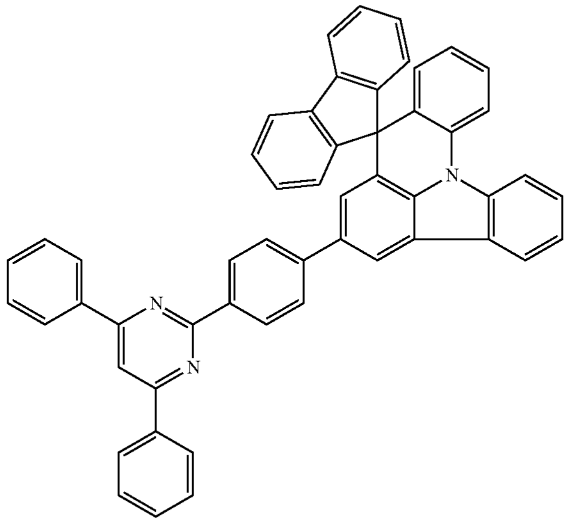
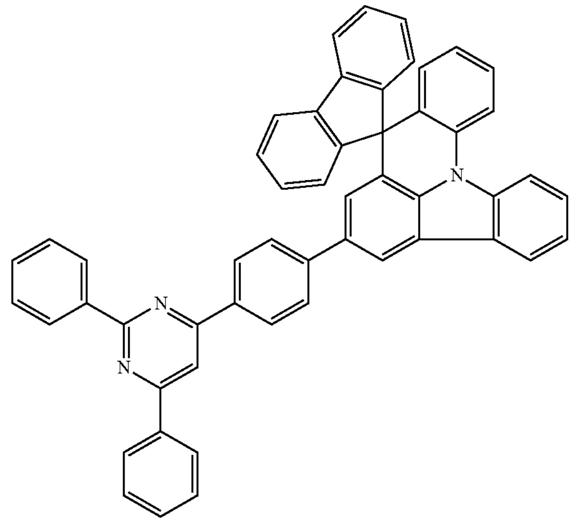
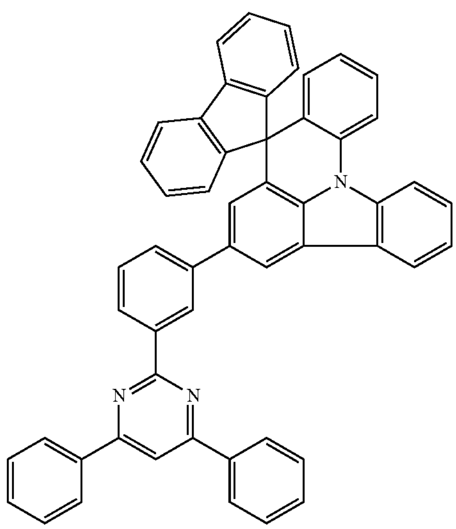
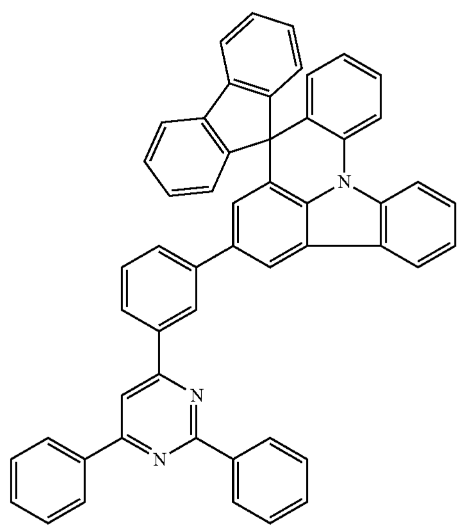
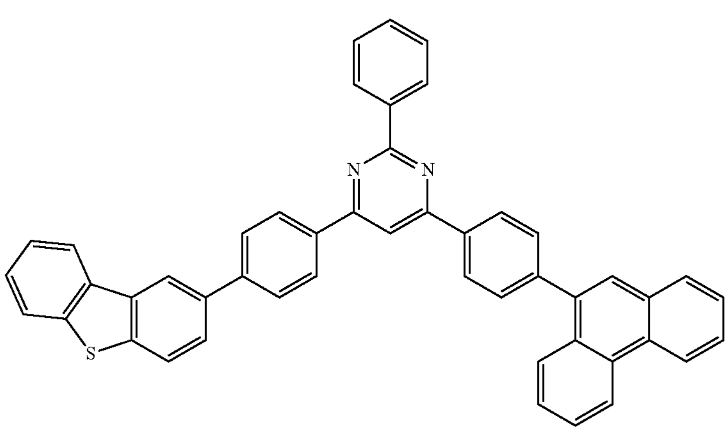

-continued
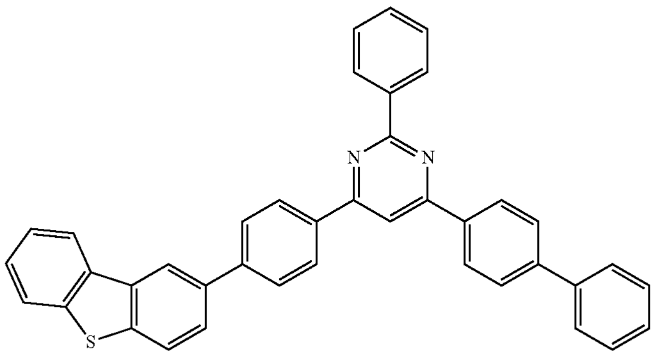
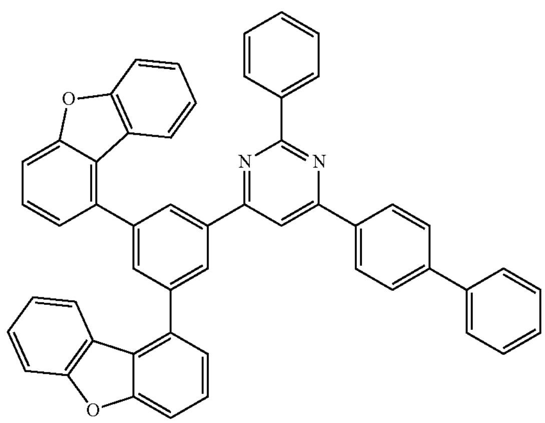
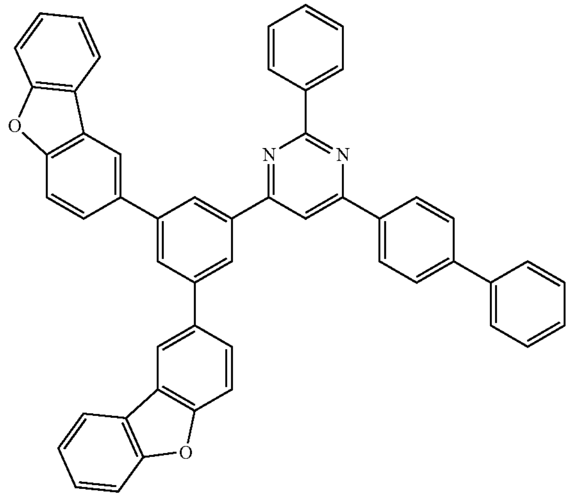
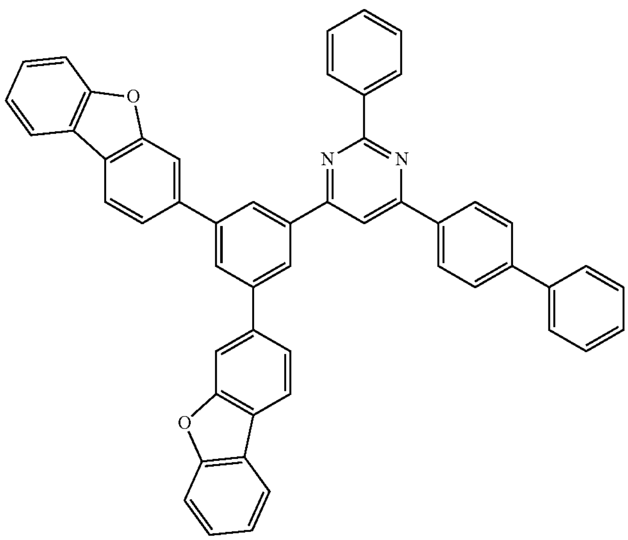
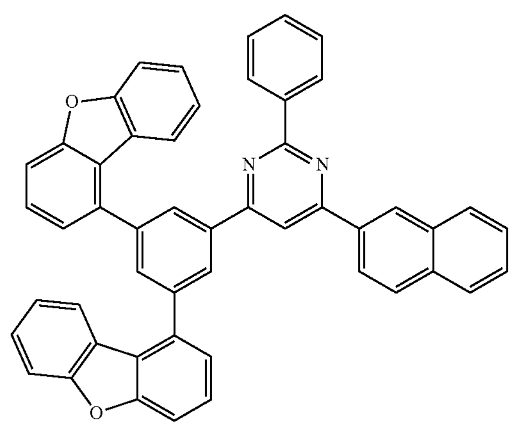

-continued
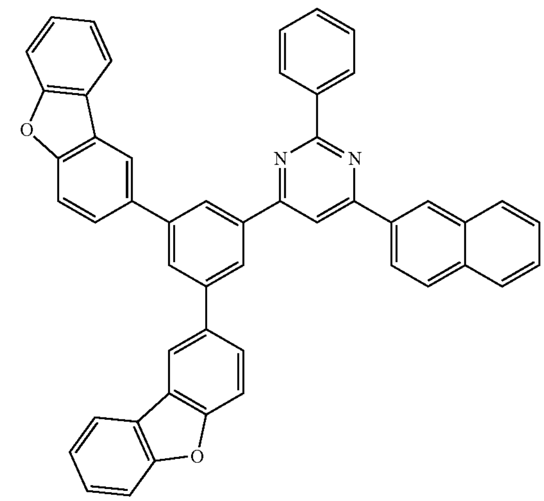
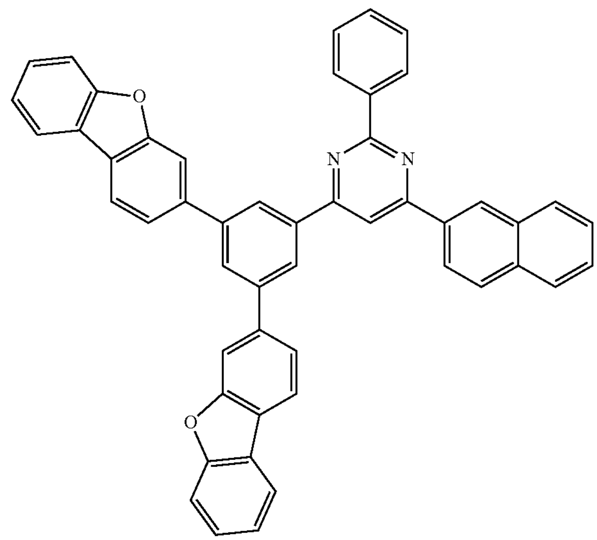
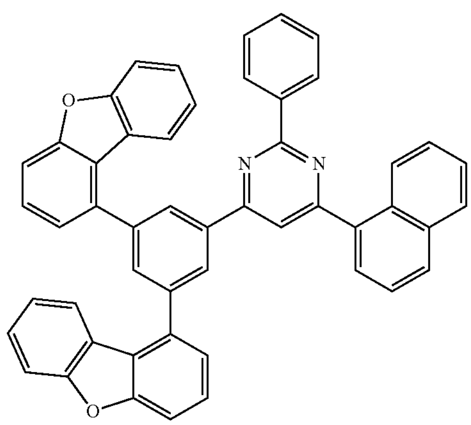
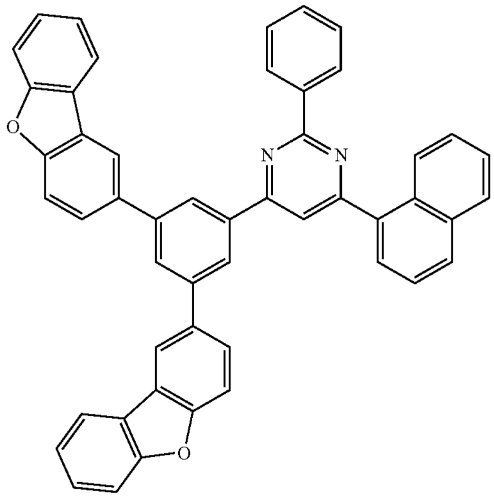
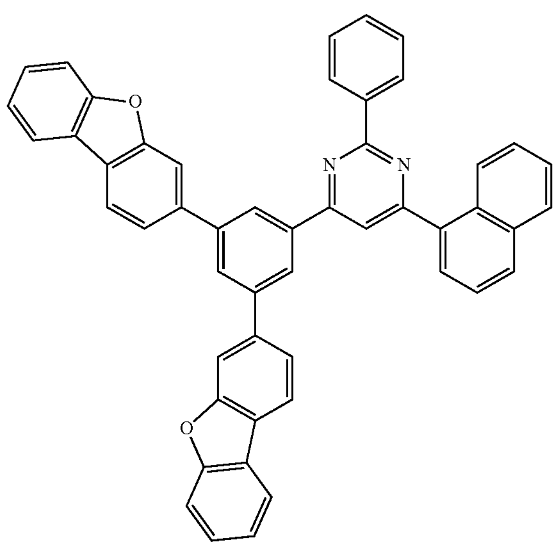
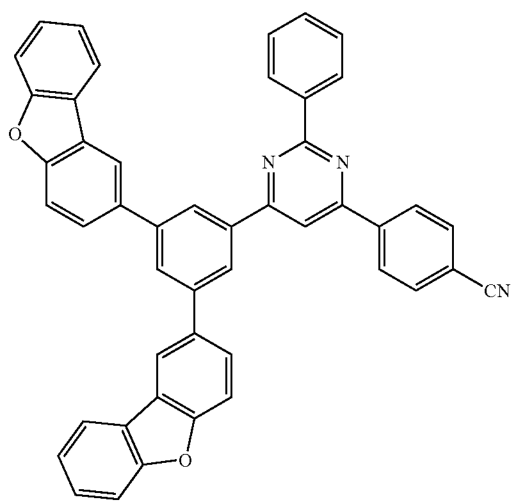

-continued
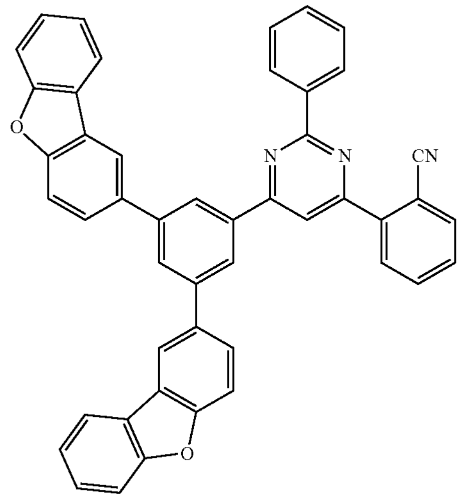
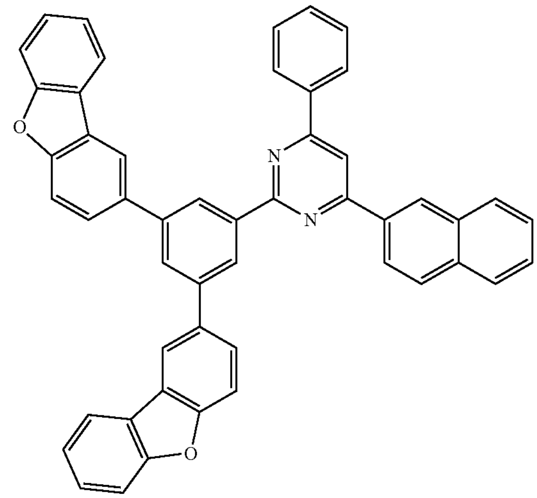
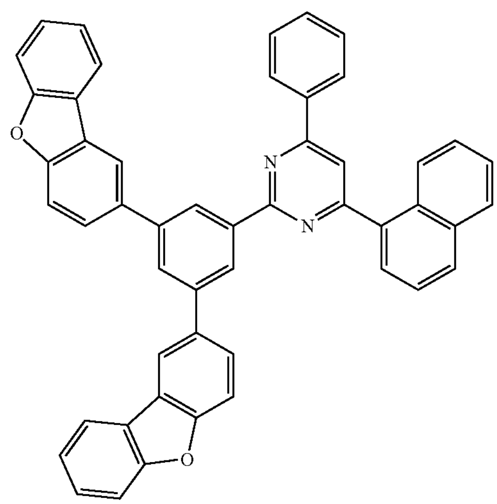
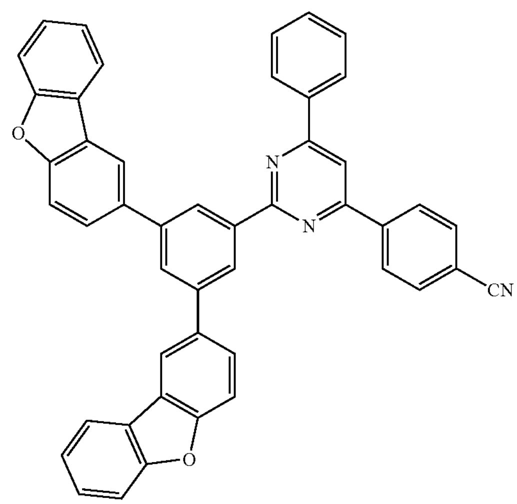
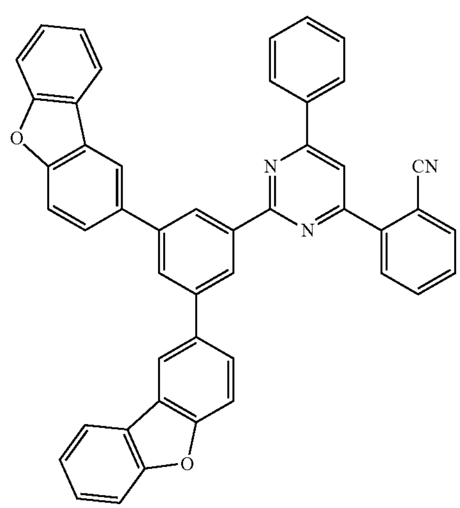
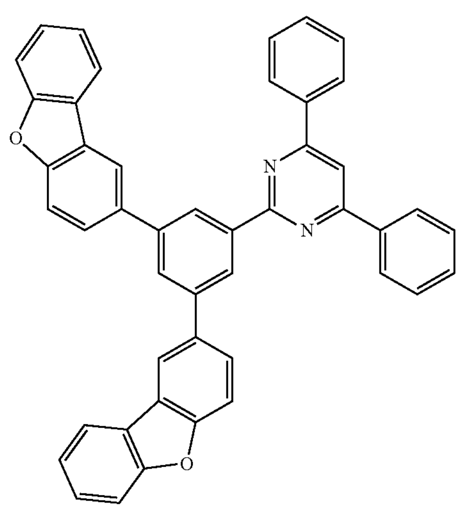

-continued
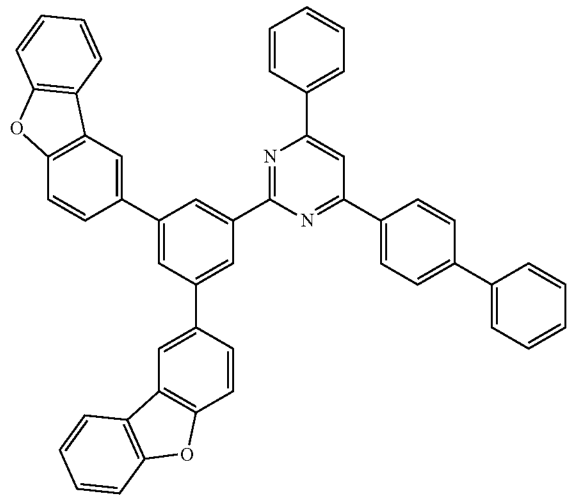
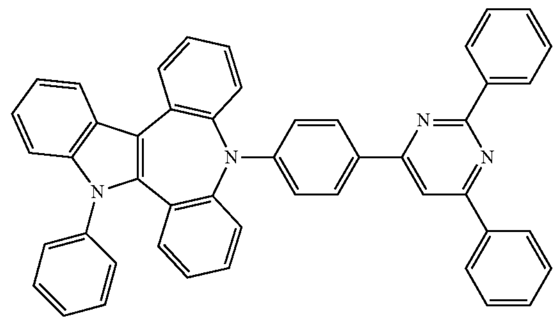
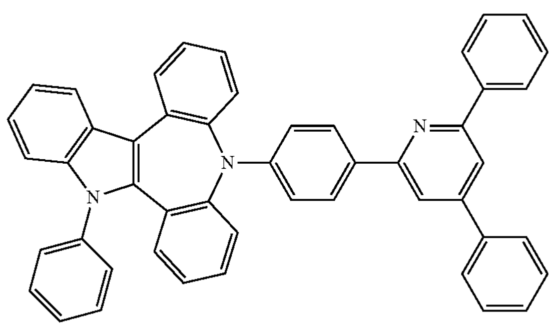
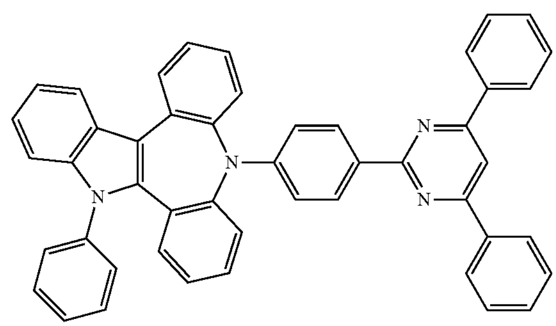
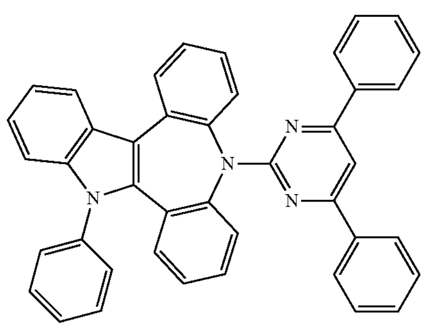
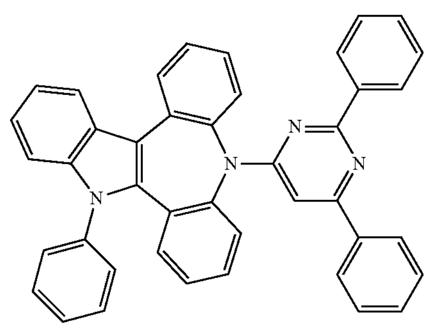
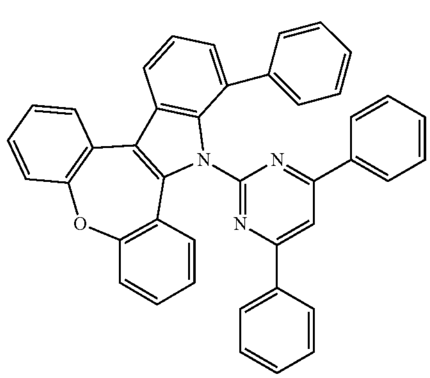
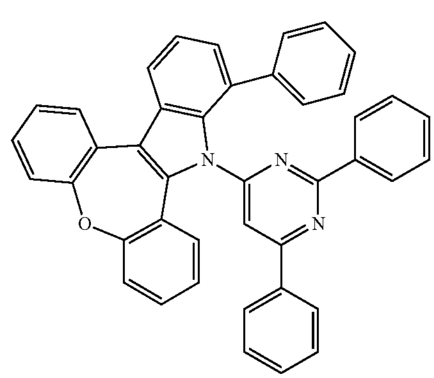

-continued
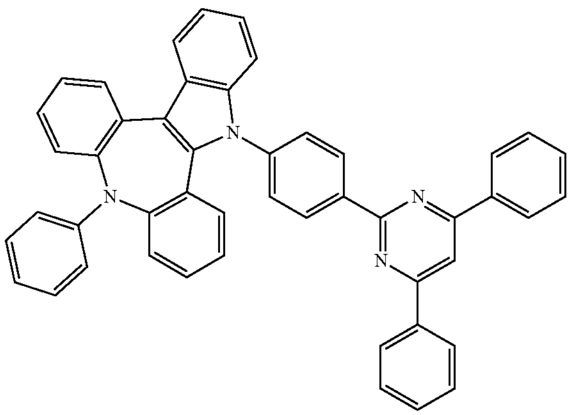
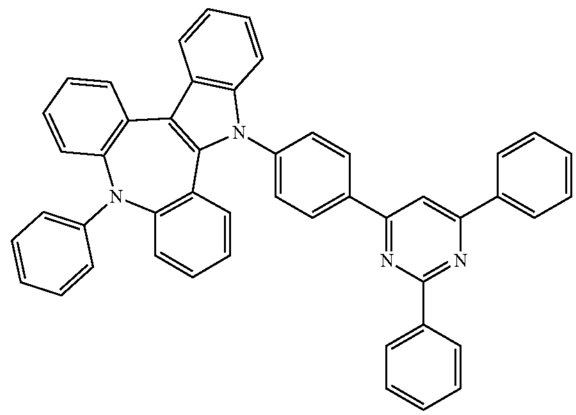
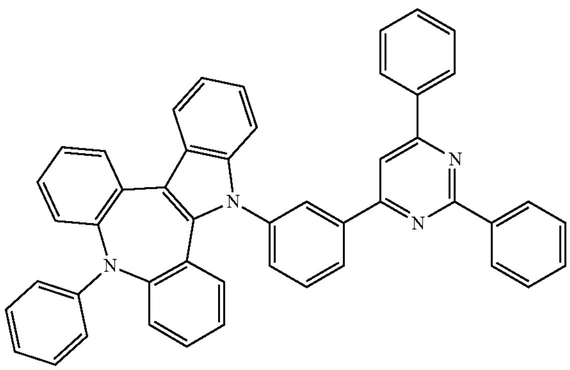
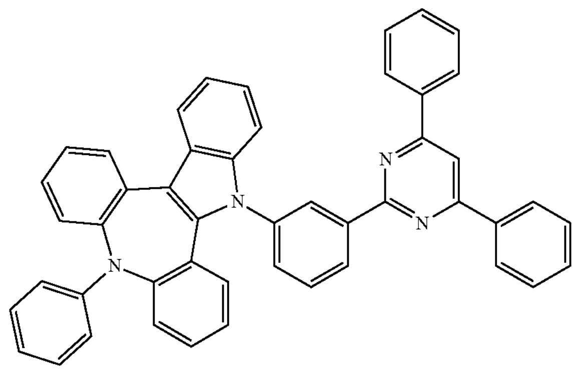
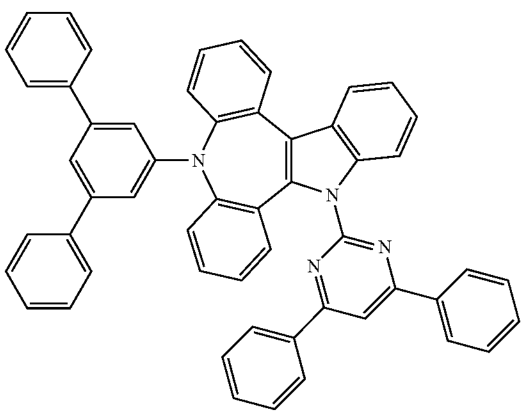
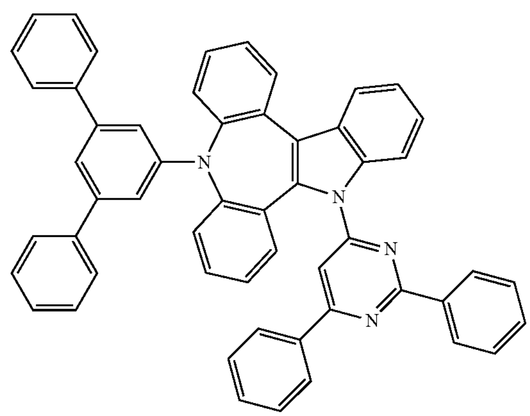
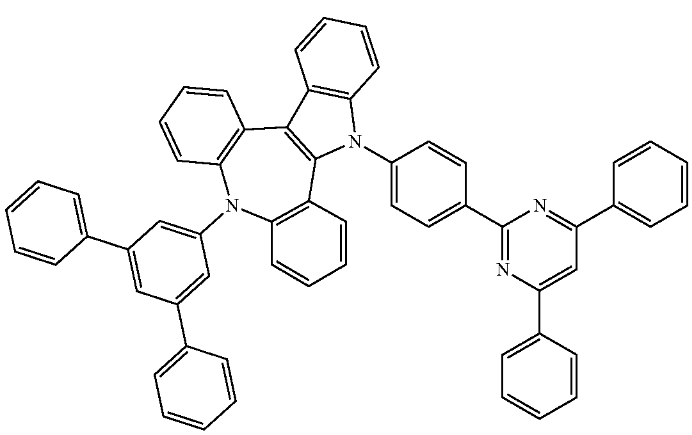

-continued
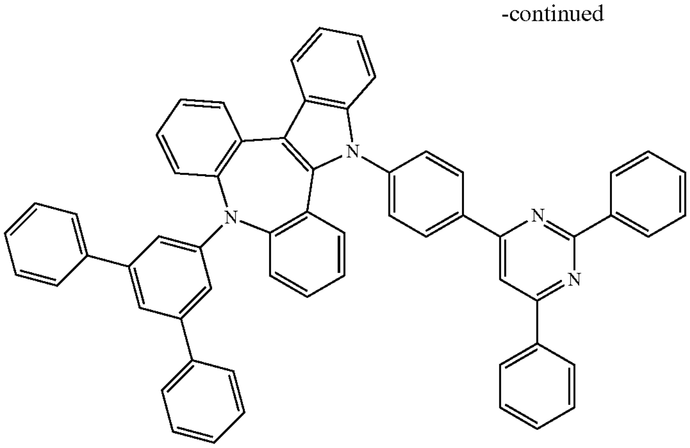
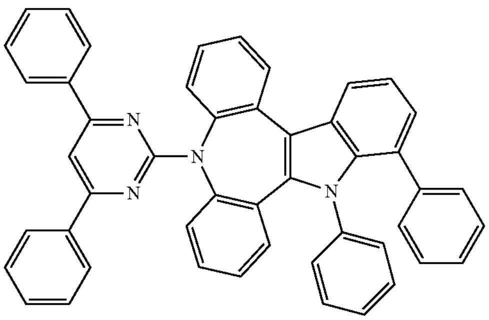
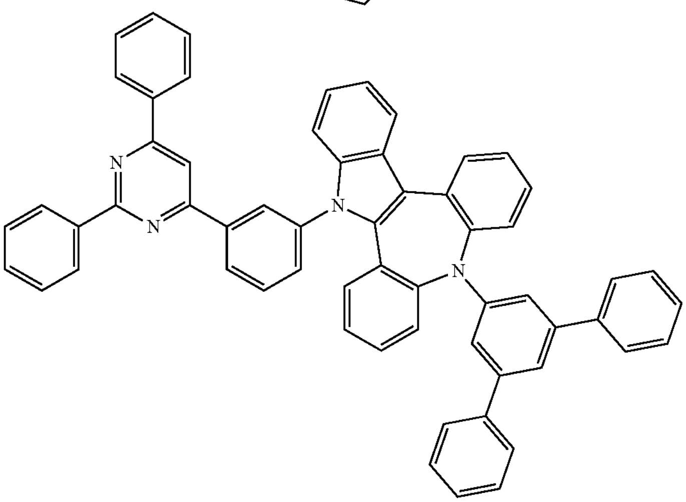
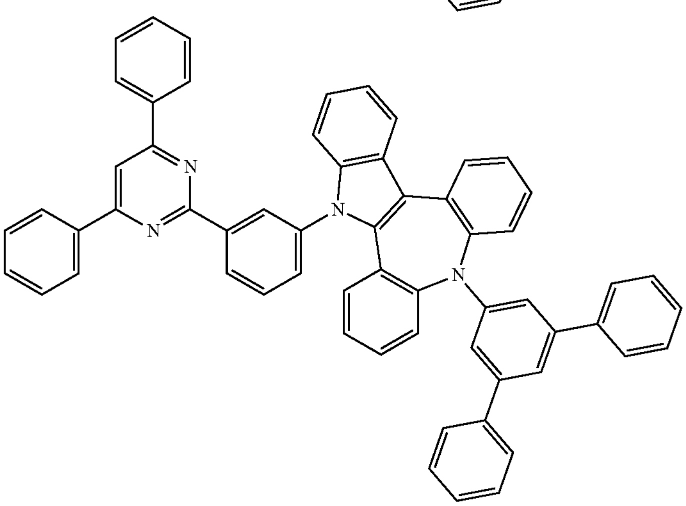

-continued
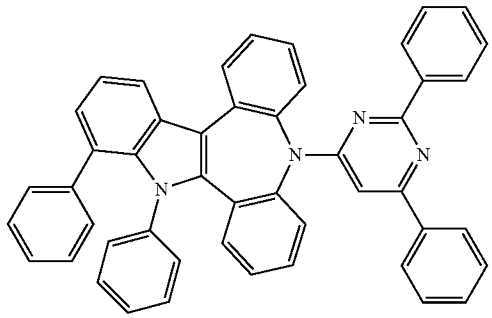
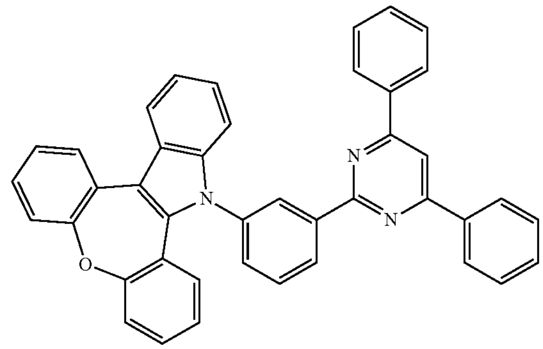
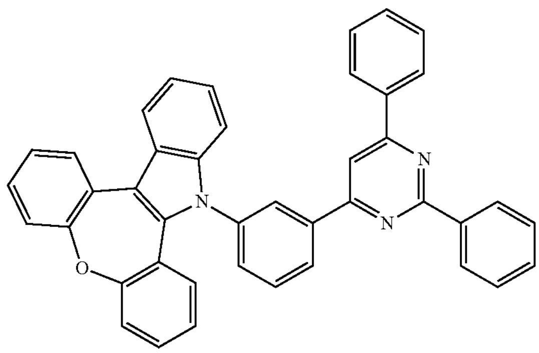
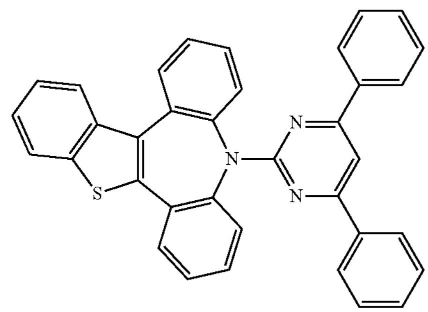
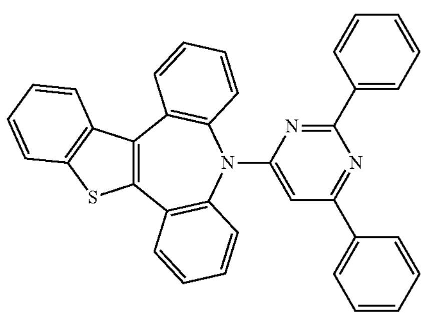
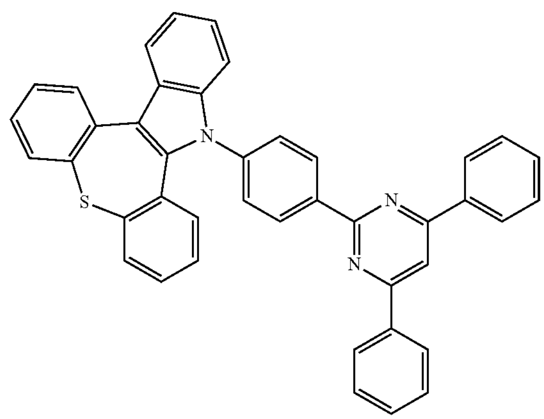
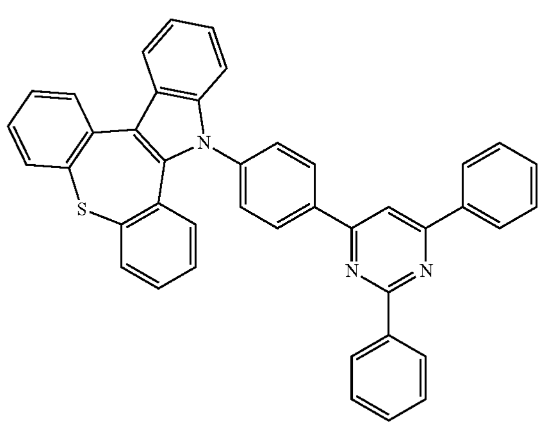
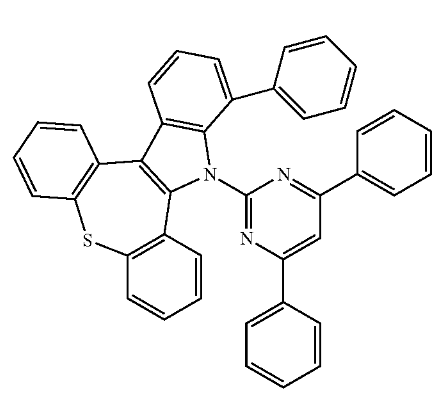

-continued
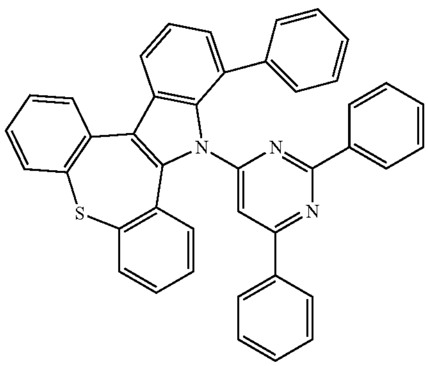
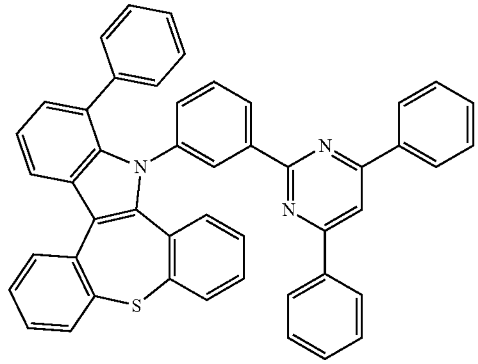
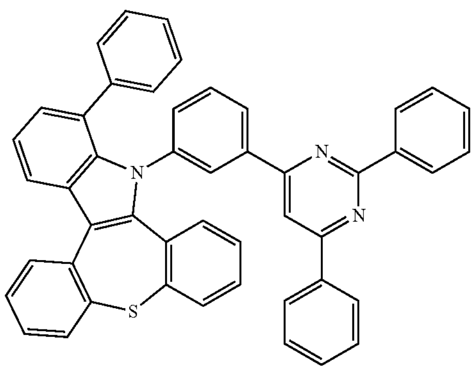
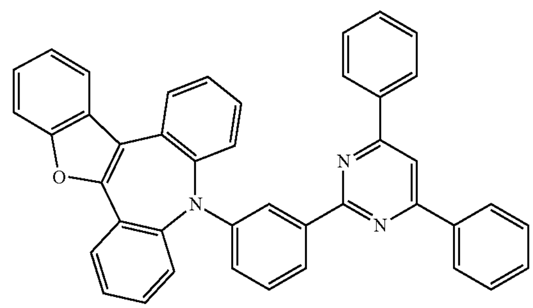
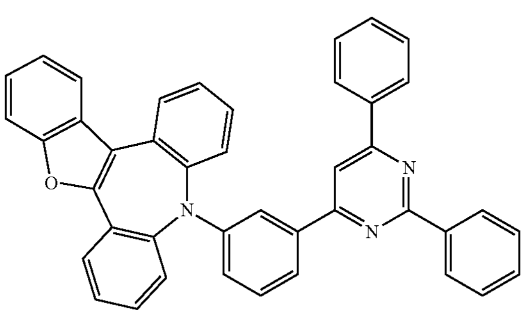
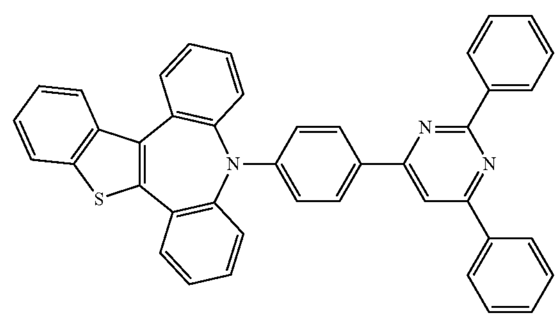
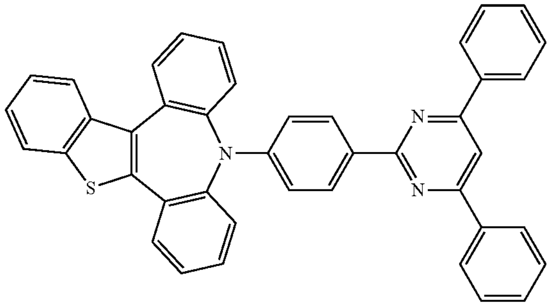
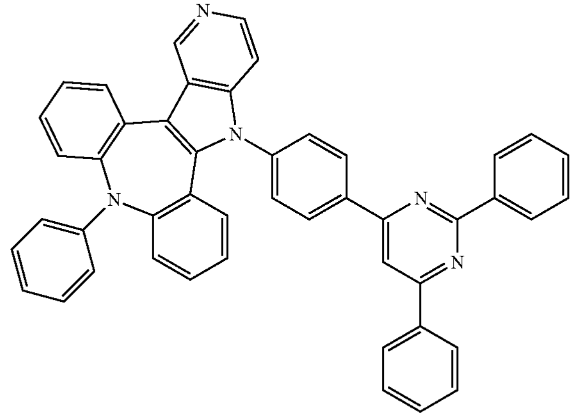

-continued
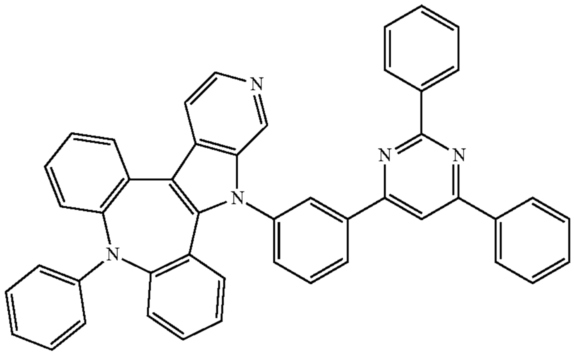
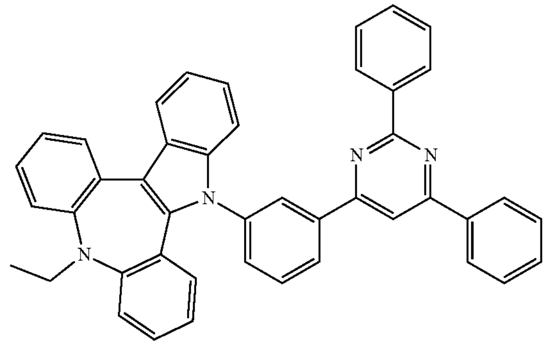
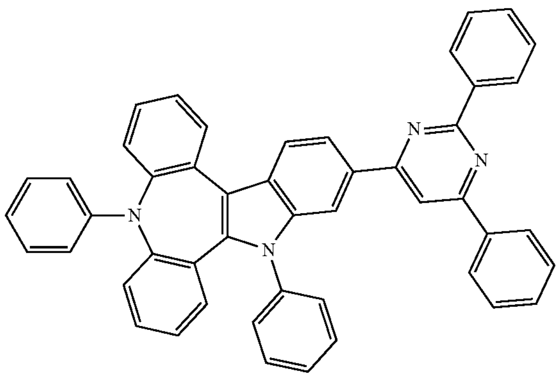
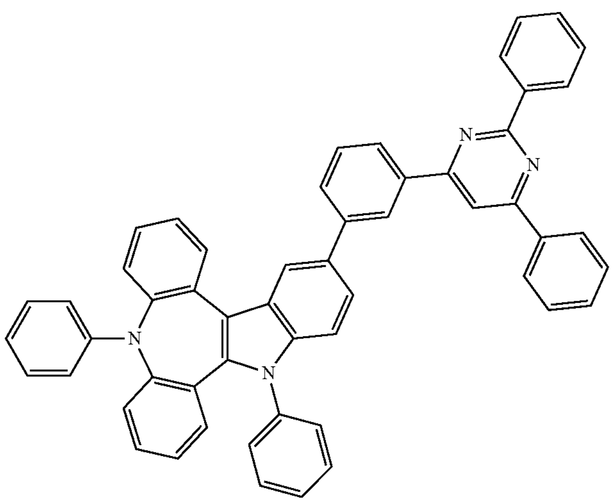
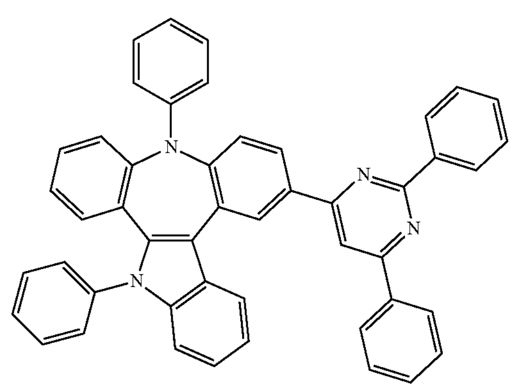
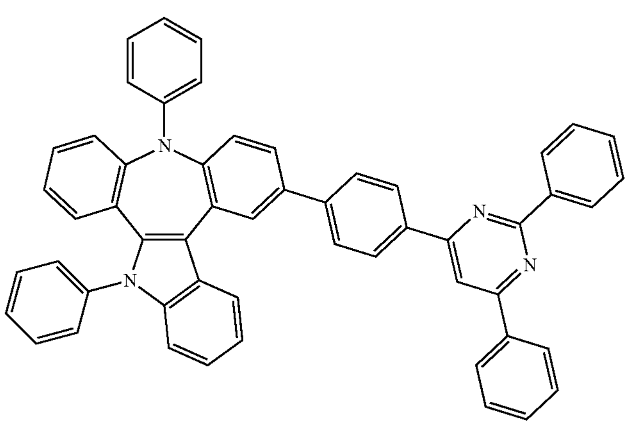

-continued
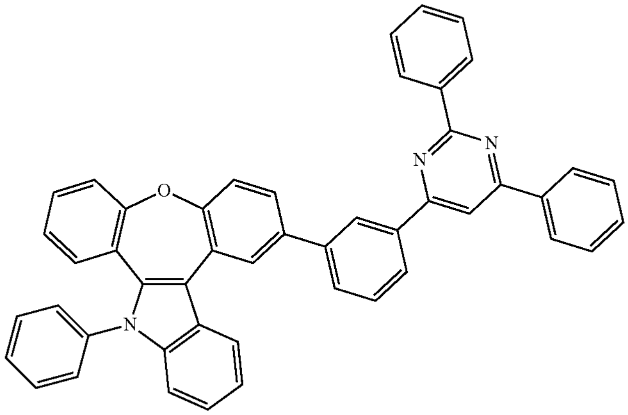
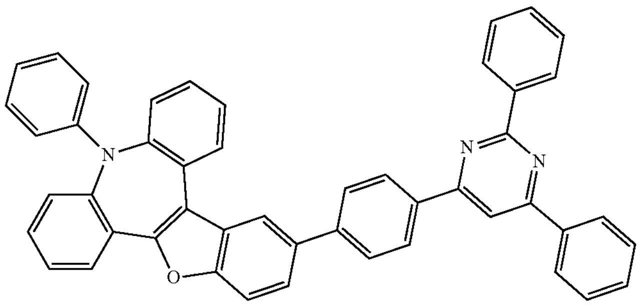
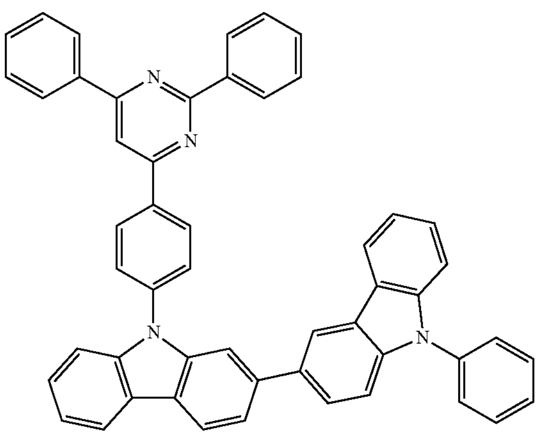
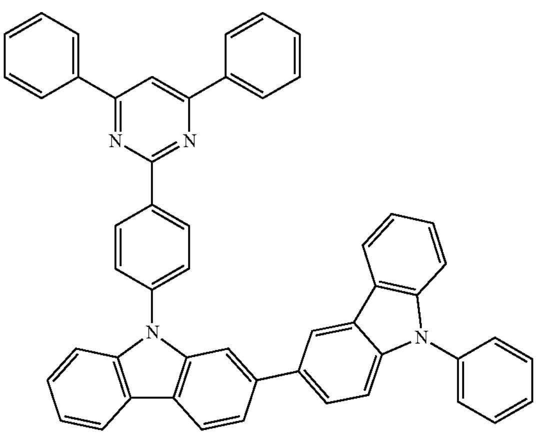
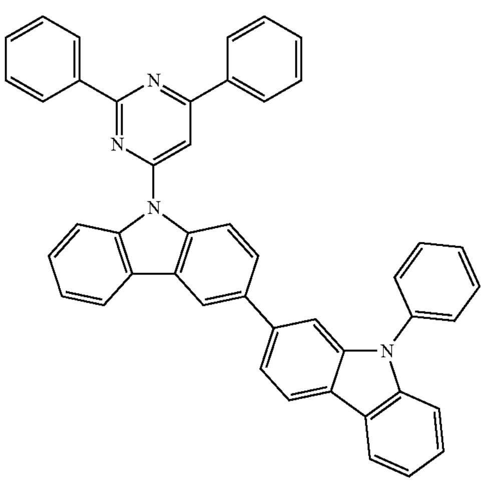
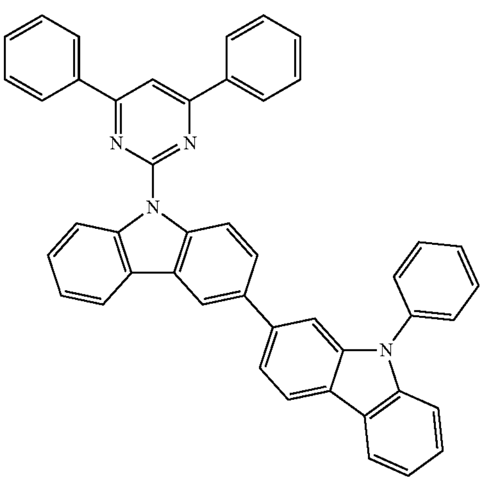

-continued
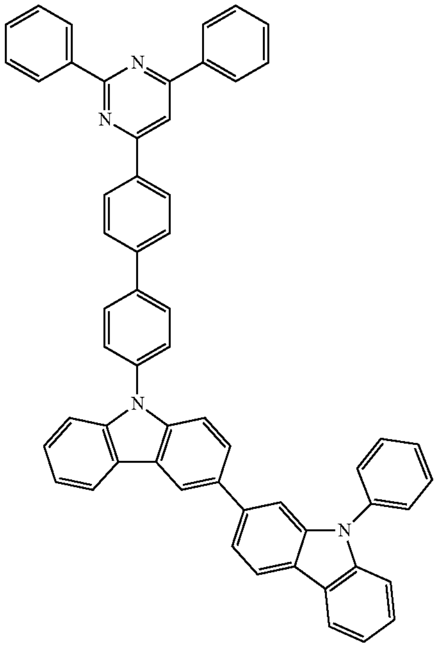
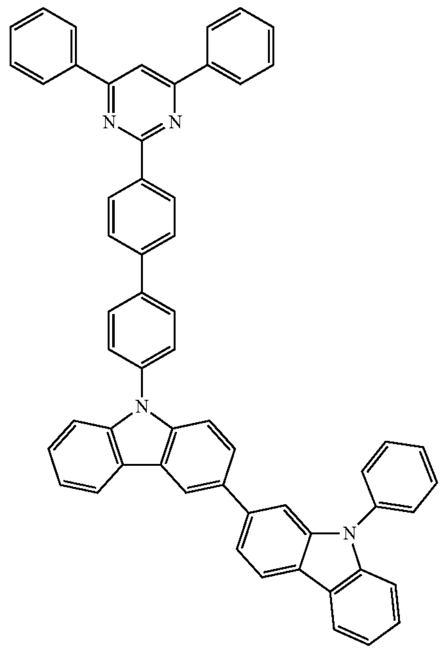
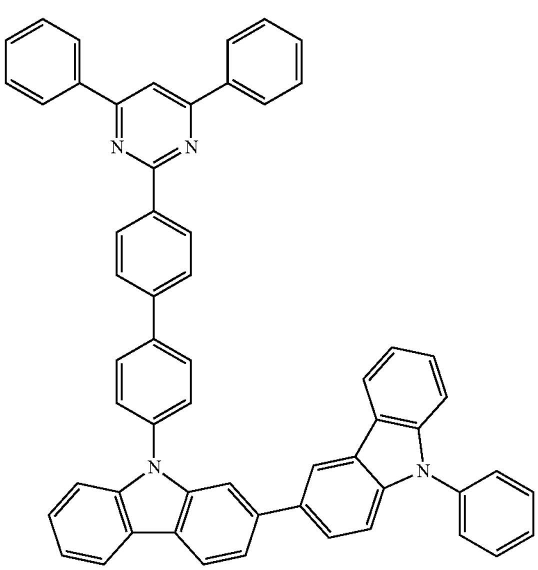
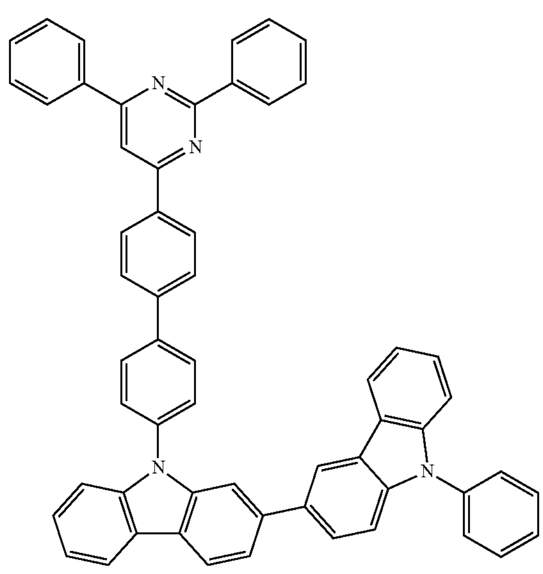

-continued
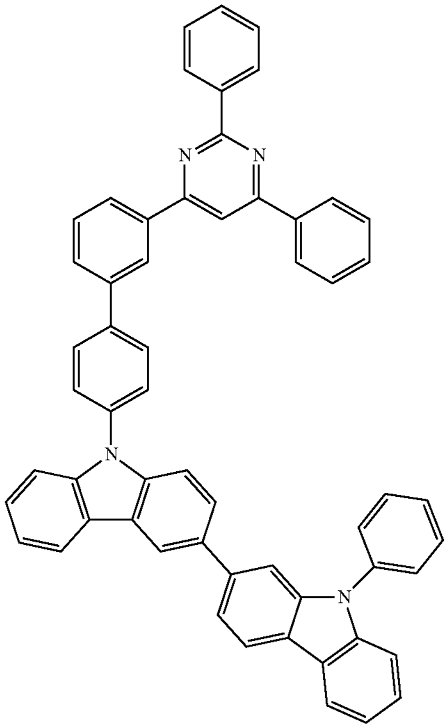
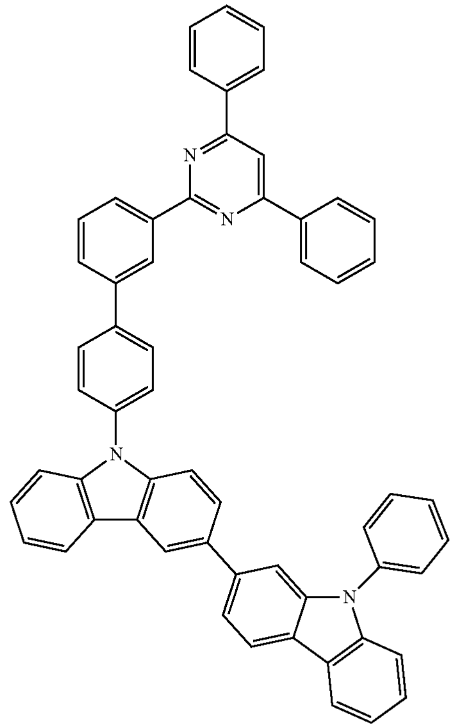
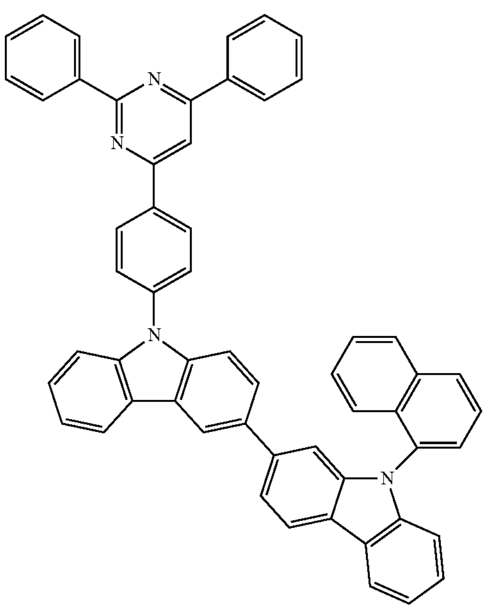
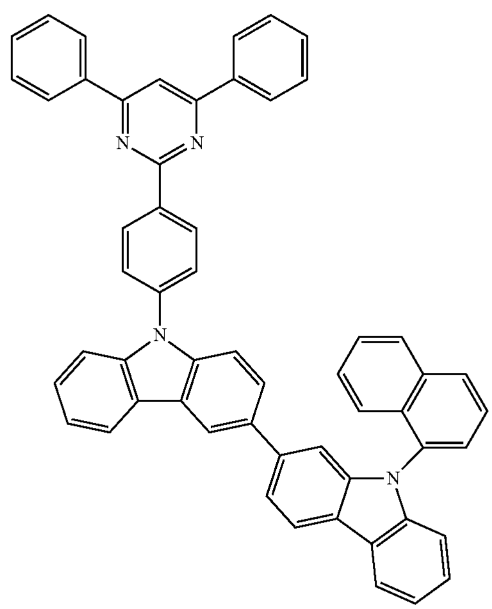

-continued

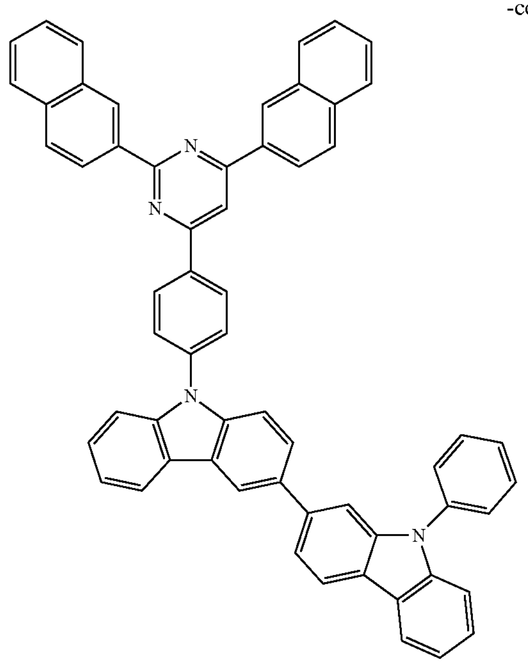

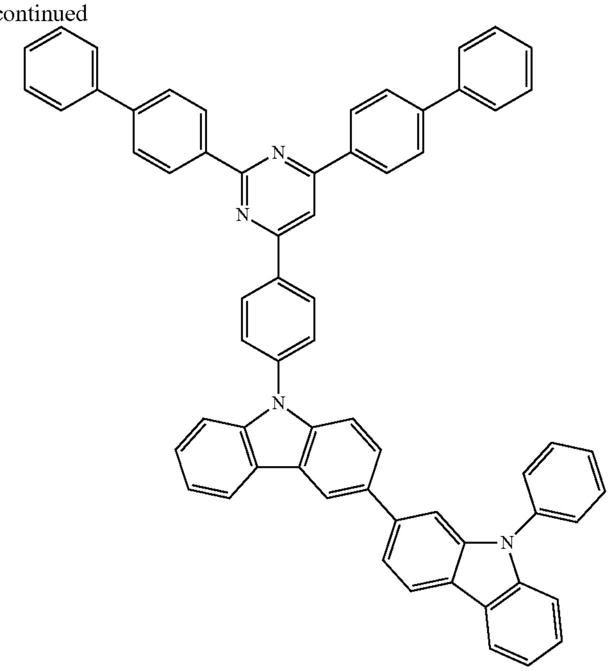

(Compound Represented by the Formula (C-1))

In one embodiment, the third layer contains a compound represented by the following formula (C1).

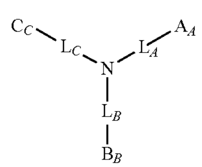

(C1)

In the formula (C1), $L_A$, $L_B$ and $L_C$ are independently a single bond, a substituted or unsubstituted arylene group including 6 to 18 ring carbon atoms, or a substituted or unsubstituted divalent heterocyclic group including 5 to 13 ring atoms.

$A_A$, $B_B$ and $C_C$ are independently a substituted or unsubstituted aryl group including 6 to 30 ring carbon atoms, a substituted or unsubstituted monovalent heterocyclic group including 5 to 30 ring atoms, or —Si(R'$_{901}$)(R'$_{902}$)(R'$_{903}$).

R'$_{901}$ to R'$_{903}$ are independently a substituted or unsubstituted aryl group including 6 to 30 ring carbon atoms.

When two or more of each of one or more of R'$_{901}$ to R'$_{903}$ are present, each of the two or more R'$_{901}$ to R'$_{903}$ may be the same or different.

In one embodiment, the compound represented by the formula (C1) is a compound represented by the following formula (C11).

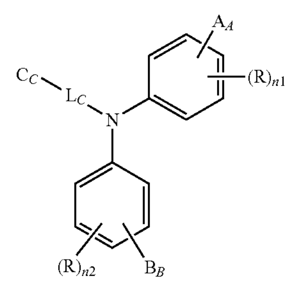

(C11)

In the formula (C11), $A_A$, $B_B$, $C_C$ and $L_C$ are as defined in the formula (C1).

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$) ($R_{902}$)($R_{900}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When two or more of each of one or more of $R_{901}$ to $R_{904}$ are present, the two or more of each of $R_{901}$ to $R_{904}$ may be the same or different.

n1 and n2 are independently an integer of 0 to 4.

When a plurality of R's is present, the plurality of R's may be the same as or different from each other.

In one embodiment, two of A to C in the compound represented by the formula (C1) or (C11) are groups represented by the following formula (Y). The two groups represented by the formula (Y) may be the same or different.

(Y)

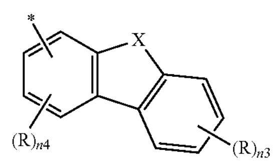

In the formula (Y), X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R, $R_1$ and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —Si($R_{901}$) ($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When two or more of each of one or more of $R_{901}$ to $R_{90}4$ are present, the two or more of each of $R_{901}$ to $R_{904}$ may be the same or different.

n3 is an integer of 0 to 4, and n4 is an integer of 0 to 3.

When a plurality of R's is present, the plurality of R's may be the same as or different from each other.

* is bonded to any of $L_A$, $L_B$ and Le in the formula (C1), or bonded to a benzene ring in the formula (C11).

In one embodiment, the compound represented by the formula (C1) is a compound represented by the following formula (C12) or (C13).

(C12)

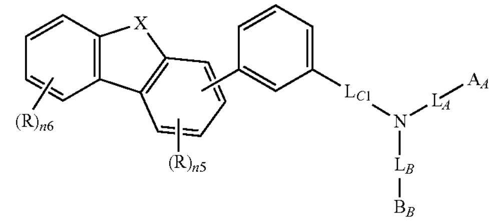

(C13)

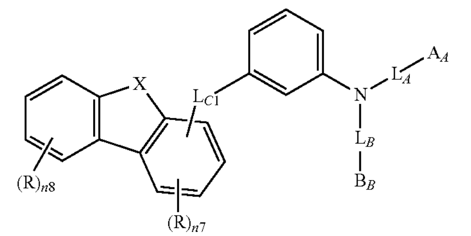

In the formulas (C12) and (C13), $L_A$, $L_B$, $A_A$ and $B_B$ are as defined in the formula (C1).

$L_{C1}$ is an arylene group including 6 to 12 ring carbon atoms.

X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R, $R_1$ and $R_2$ which do not form the substituted or unsubstituted, saturated or unsaturated ring, and $R_3$ are independently a cyano group, a substituted or unsubstituted alkyl group including 1 to 50 carbon atoms, a substituted or unsubstituted cycloalkyl group including 3 to 50 ring carbon atoms, —Si($R_{901}$) ($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms.

$R_{901}$ to $R_{904}$ are independently a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

When two or more of each of one or more of $R_{901}$ to $R_{904}$ are present, the two or more of each of $R_{901}$ to $R_{904}$ may be the same or different.

n5 and n7 are independently an integer of 0 to 3, and n6 and n8 are independently an integer of 0 to 4.

When a plurality of R's is present, the plurality of R's may be the same as or different from each other.

In one embodiment, the compound represented by the formula (C1) is a compound represented by the following formula (C14) or (C15).

(C14)

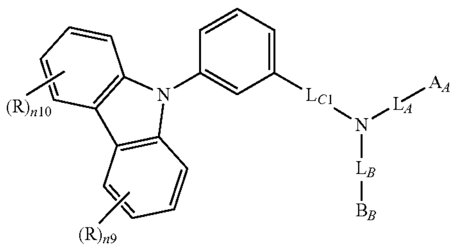

(C15)

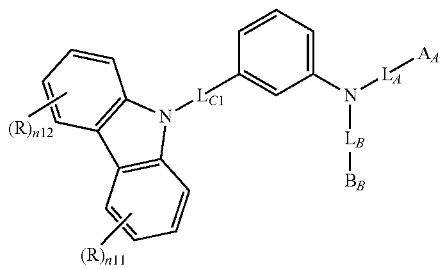

In the formulas (C14) and (C15), $L_A$, $L_B$, $A_A$ and $B_B$ are as defined in the formula (C1).

$L_{C1}$ is an arylene group including 6 to 12 ring carbon atoms.

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is

- a cyano group,
- a substituted or unsubstituted alkyl group including 1 to 50 carbon atoms,
- a substituted or unsubstituted cycloalkyl group including 3 to 50 ring carbon atoms,
- —Si($R_{901}$) ($R_{902}$)($R_{900}$),
- —O—($R_{904}$),
- a substituted or unsubstituted aryl group including 6 to 50 ring carbon atoms, or
- a substituted or unsubstituted monovalent heterocyclic group including 5 to 50 ring atoms.

$R_{901}$ to $R_{904}$ are independently

- a hydrogen atom,
- a substituted or unsubstituted alkyl group including 1 to 50 carbon atoms,
- a substituted or unsubstituted cycloalkyl group including 3 to 50 ring carbon atoms,
- a substituted or unsubstituted aryl group including 6 to 50 ring carbon atoms, or
- a substituted or unsubstituted monovalent heterocyclic group including 5 to 50 ring atoms.

When two or more of each of one or more of $R_{901}$ to $R_{904}$ are present, the two or more of each of $R_{901}$ to $R_{904}$ may be the same or different.

n9 to n12 are independently an integer of 0 to 4.

When a plurality of R's is present, the plurality of R's may be the same as or different from each other.

In one embodiment, the compound represented by the formula (C1) is a compound represented by the following formula (C16) or (C17).

(C16)

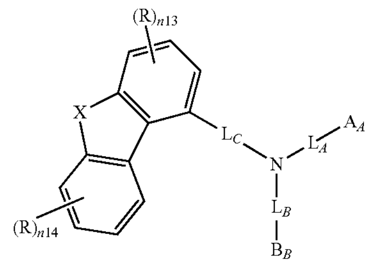

(C17)

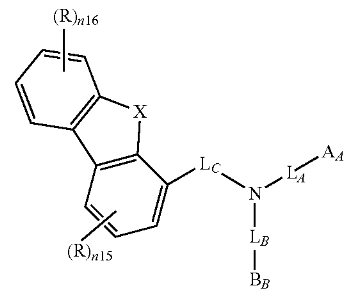

In the formulas (C16) and (C17), $L_A$, $L_B$, $L_C$, $A_A$ and $B_B$ are as defined in the formula (C1).

X is $CR_1R_2$, $NR_3$, an oxygen atom, or a sulfur atom.

When X is $CR_1R_2$, $R_1$ and $R_2$ form a substituted or unsubstituted, saturated or unsaturated ring by bonding with each other, or do not form a substituted or unsubstituted, saturated or unsaturated ring.

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R, $R_1$ and $R_2$ which do not form the substituted or unsubstituted, saturated or unsaturated ring, and $R_3$ are independently

- a cyano group,
- a substituted or unsubstituted alkyl group including 1 to 50 carbon atoms,
- a substituted or unsubstituted cycloalkyl group including 3 to 50 ring carbon atoms,
- —Si($R_{901}$) ($R_{902}$)($R_{903}$),
- —O—($R_{904}$),
- a substituted or unsubstituted aryl group including 6 to 50 ring carbon atoms, or
- a substituted or unsubstituted monovalent heterocyclic group including 5 to 50 ring atoms.

$R_{901}$ to $R_{904}$ are independently

- a hydrogen atom,
- a substituted or unsubstituted alkyl group including 1 to 50 carbon atoms,
- a substituted or unsubstituted cycloalkyl group including 3 to 50 ring carbon atoms,
- a substituted or unsubstituted aryl group including 6 to 50 ring carbon atoms, or a substituted or unsubstituted monovalent heterocyclic group including 5 to 50 ring atoms.

When two or more of each of one or more of $R_{901}$ to $R_{904}$ are present, the two or more of each of $R_{901}$ to $R_{904}$ may be the same or different.

n13 and n15 are independently an integer of 0 to 3, and n14 and n16 are independently an integer of 0 to 4.

When a plurality of R's is present, the plurality of R's may be the same as or different from each other.

In the compounds represented by each of the formulas (C12) to (C17), it is preferable that $L_{C1}$ be a single bond.

In the compounds represented by each of formulas (C16) to (C17), it is preferable that $L_{C1}$ be a phenylene group.

In one embodiment, the compound represented by the formula (C1) is a compound represented by the following formula (C18).

(C18)

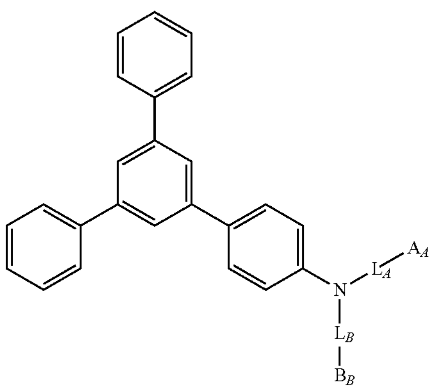

In the formula (C18), $L_A$, $L_B$, $A_A$, and $B_B$ are as defined in the formula (C1).

In one embodiment, the compound represented by the formula (C1) is a compound represented by the following formula (C19).

(C19)

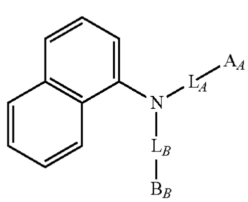

In the formula (C19), $L_A$, $L_B$, $A_A$, and $B_B$ are as defined in the formula (C1).

In the compound represented by the formula (C1) or (011), it is preferable that $L_A$, $L_B$ and $L_C$ be independently an aromatic hydrocarbon ring group represented by the following formula (L1) or (L2).

(L1)

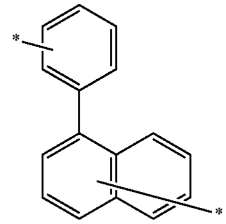

(L2)

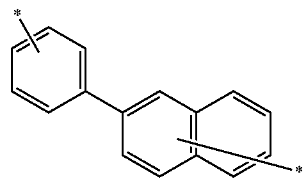

In the formula (L-1) or (L-2), one of two *'s is bonded to a nitrogen atom in the formula (C1) and the other is bonded to any one of $A_A$ to $C_C$ in the formula (C1).

In the compounds represented by each of the formulas (C1) and (C11) to (C19), it is preferable that $L_A$, $L_B$ and $L_C$ be independently a single bond, or a substituted or unsubstituted arylene group including 6 to 12 ring carbon atoms.

In the compounds represented by each of the formulas (C1) and (C11) to (C19), it is preferable that $A_A$ be a substituted or unsubstituted aryl group including 6 to 12 ring carbon atoms.

In the compounds represented by each of the formulas (C1), (C11) to (C19), it is preferable that $A_A$ be a substituted or unsubstituted phenyl group, a substituted or unsubstituted biphenyl group, or a substituted or unsubstituted naphthyl group.

In the compounds represented by each of the formulas (C1), (C11) to (C19), it is preferable that $A_A$ be a phenyl group, a biphenyl group, or a naphthyl group.

In the compounds represented by each of the formulas (C1), (C11) to (C19), it is preferable that $B_B$ be a substituted or unsubstituted aryl group including 6 to 12 ring carbon atoms.

In the compounds represented by each of the formulas (C1), (C11) to (C19), it is preferable that $B_B$ be a substituted or unsubstituted phenyl group, a substituted or unsubstituted biphenyl group, or a substituted or unsubstituted naphthyl group.

In the compounds represented by each of the formulas (C1), (C11) to (C19), it is preferable that $B_B$ be a phenyl group, a biphenyl group, or a naphthyl group.

Specific examples of the compound represented by the formula (C1) include the following compounds.

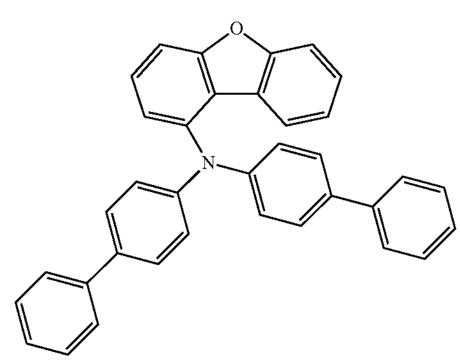

-continued
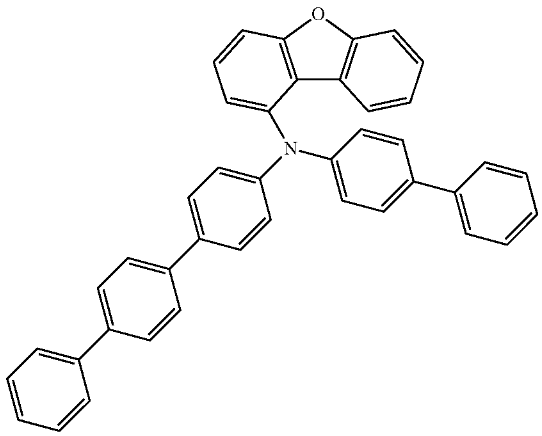
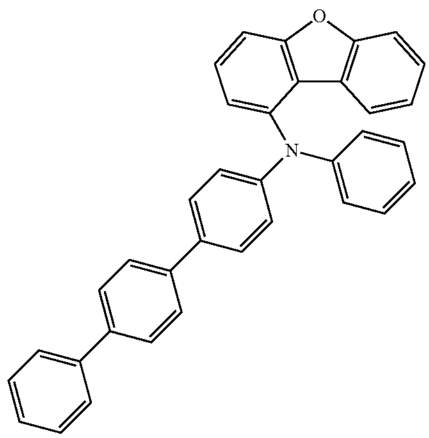
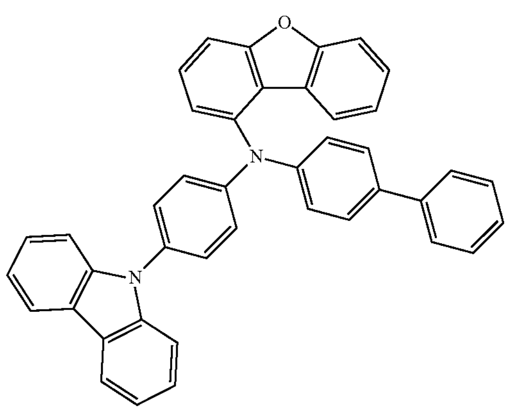
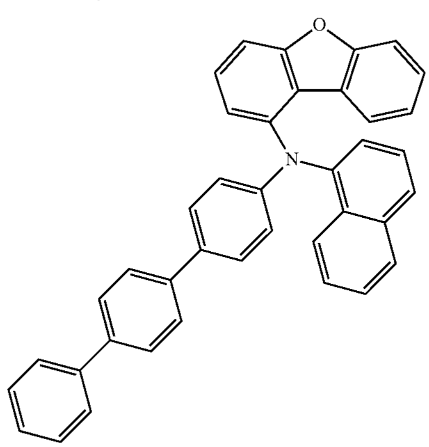
-continued
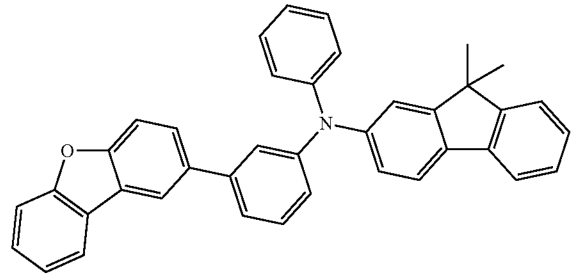
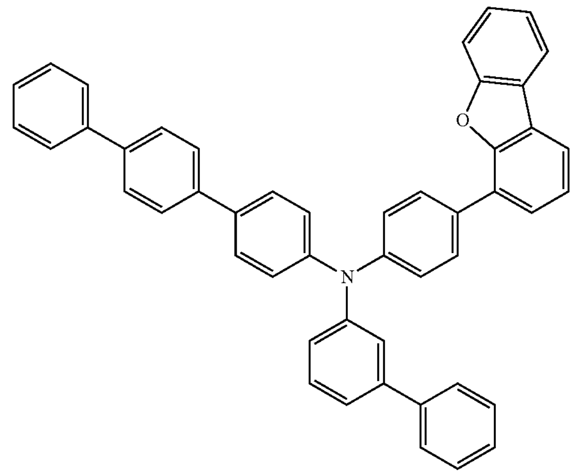
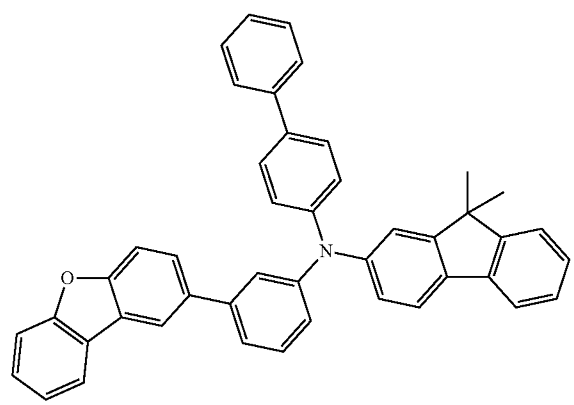
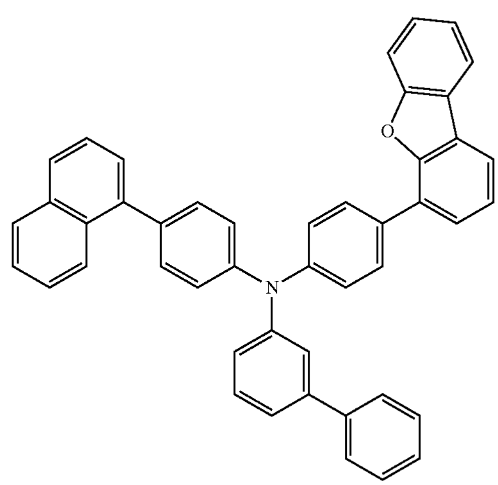

-continued
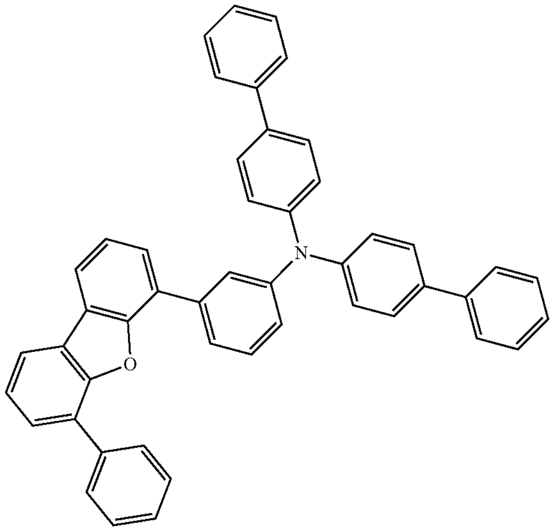
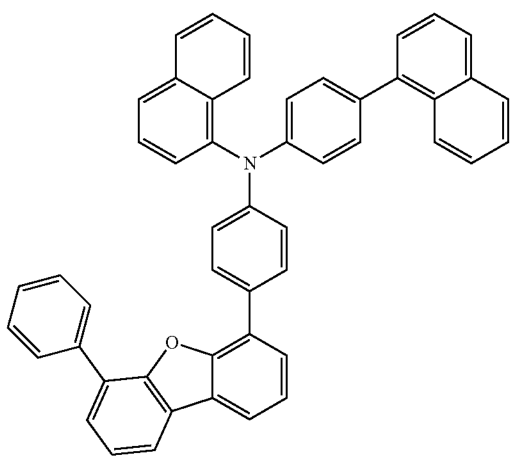
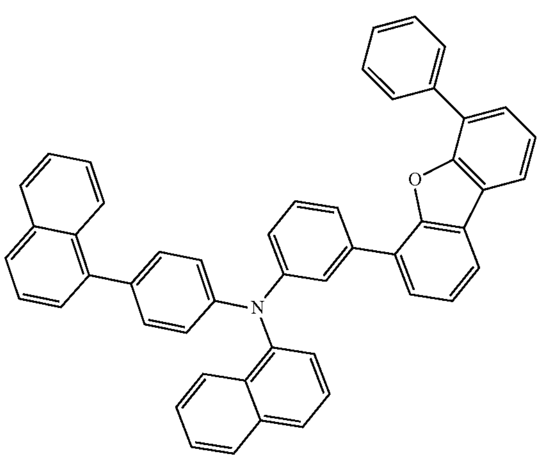
-continued
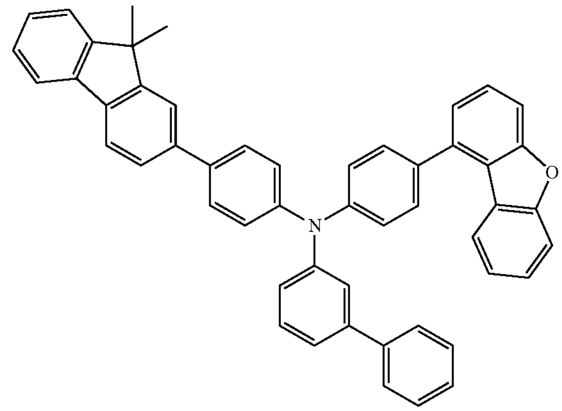
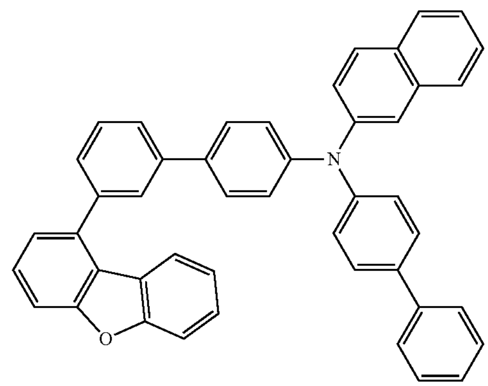
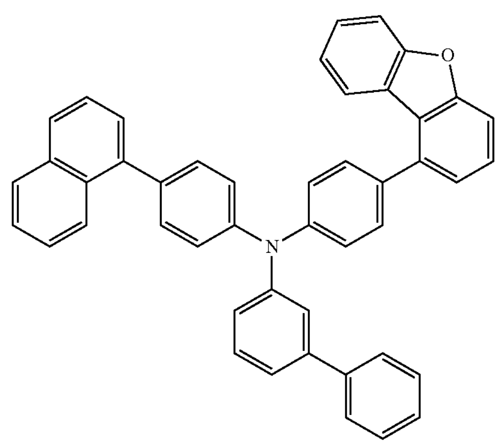
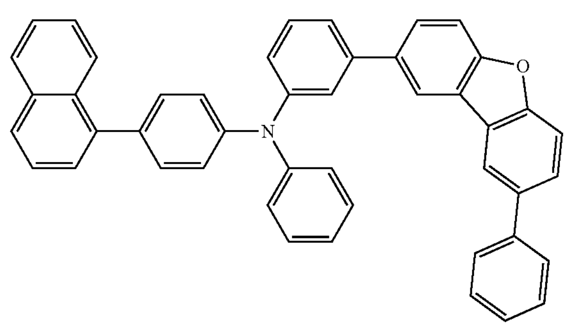

-continued
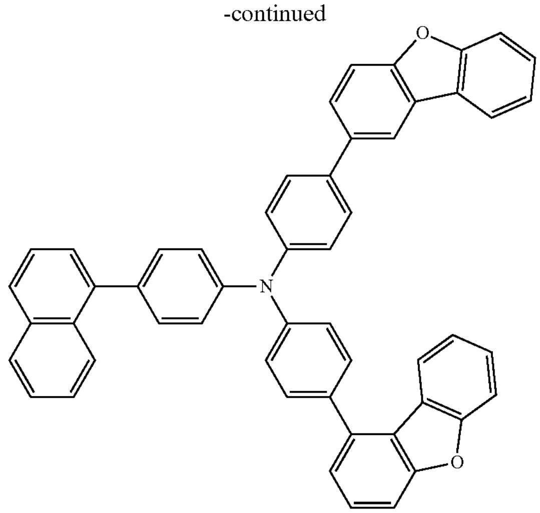
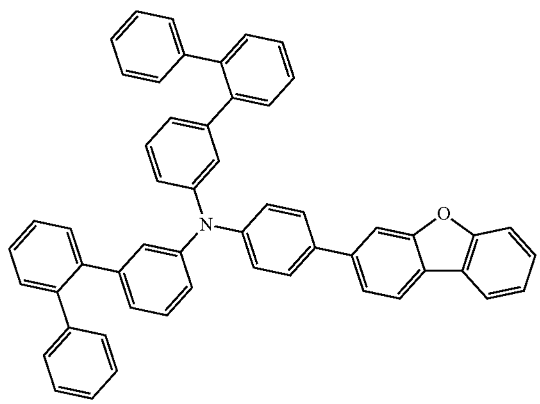
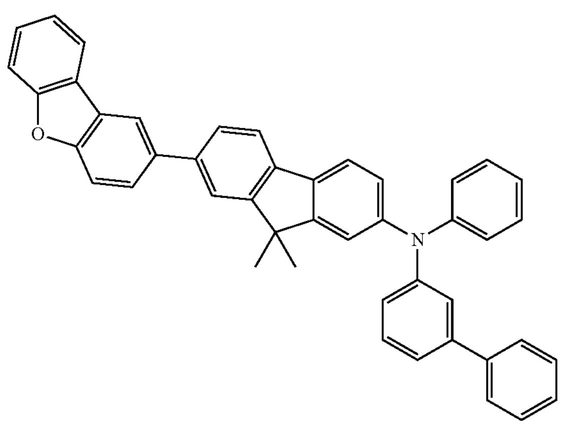
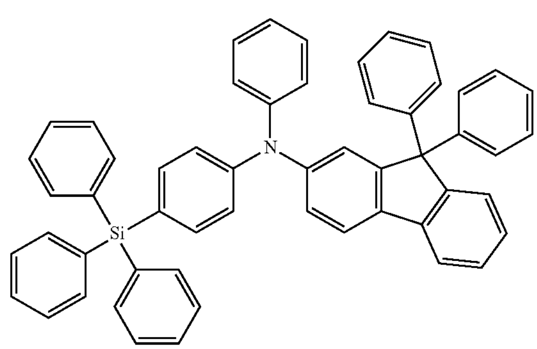
-continued
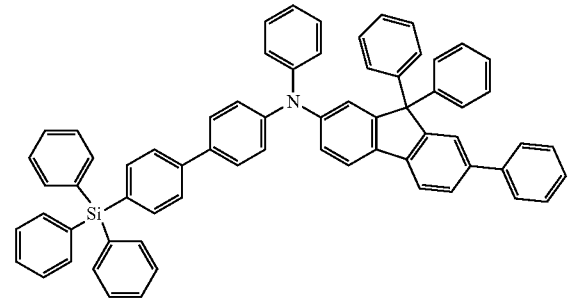
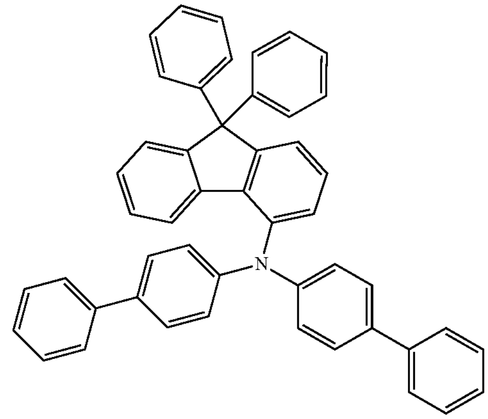
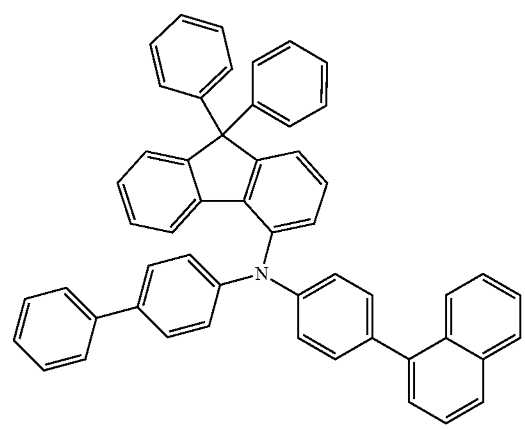
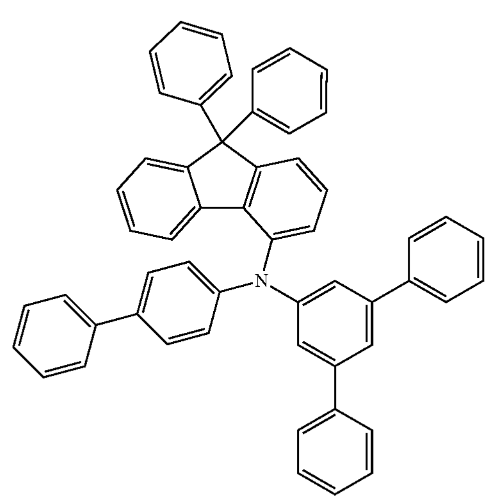

-continued
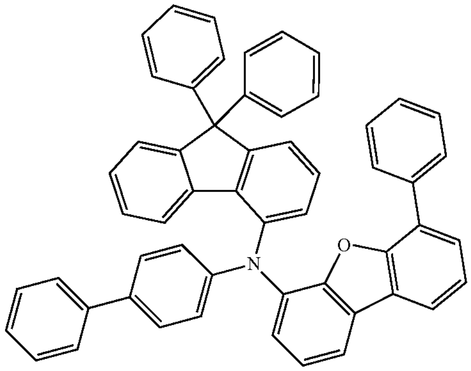
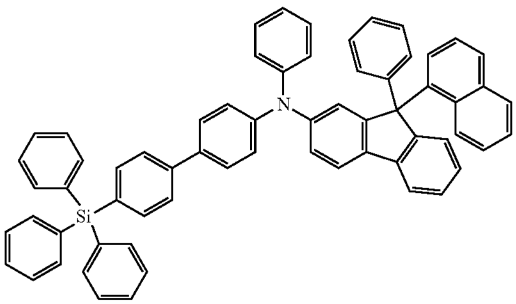
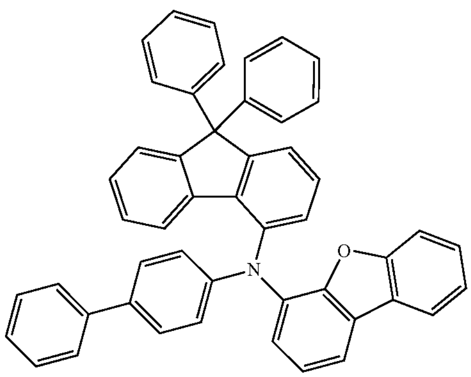
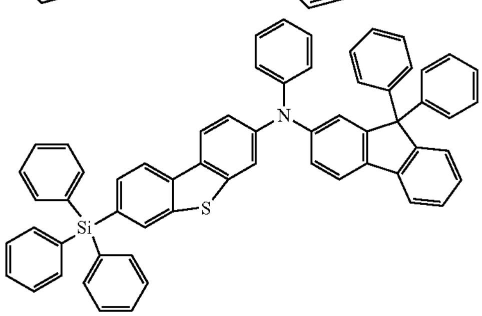
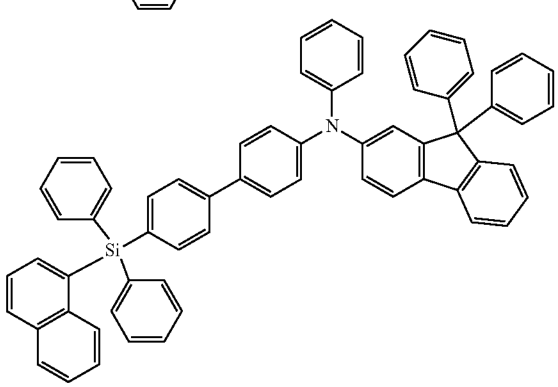
-continued
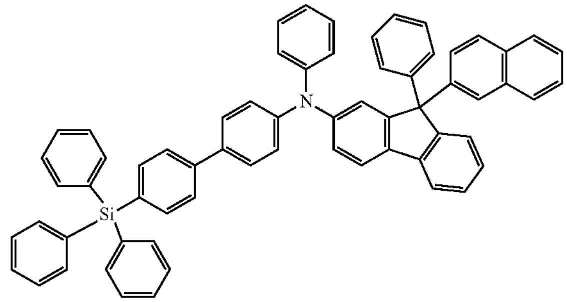
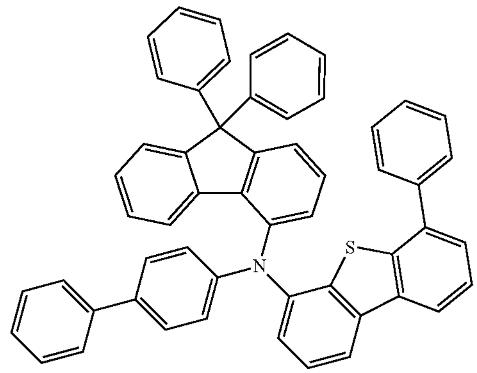
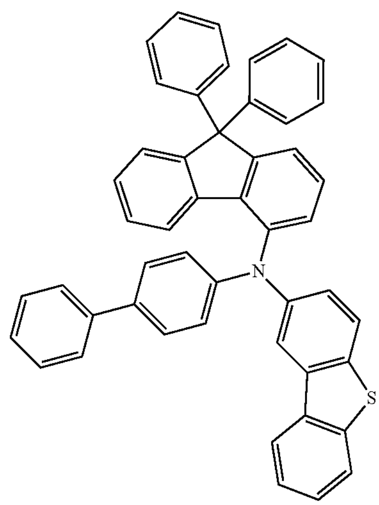
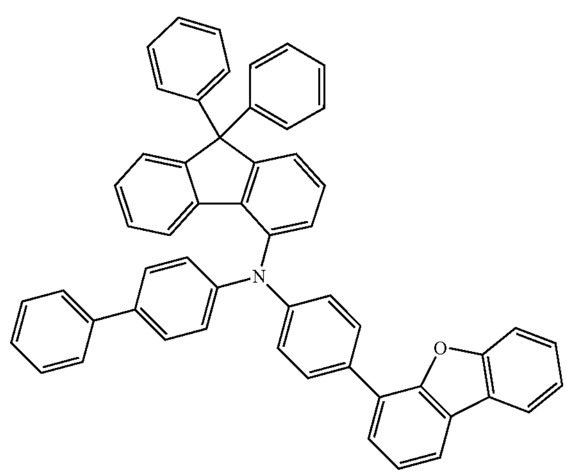

-continued
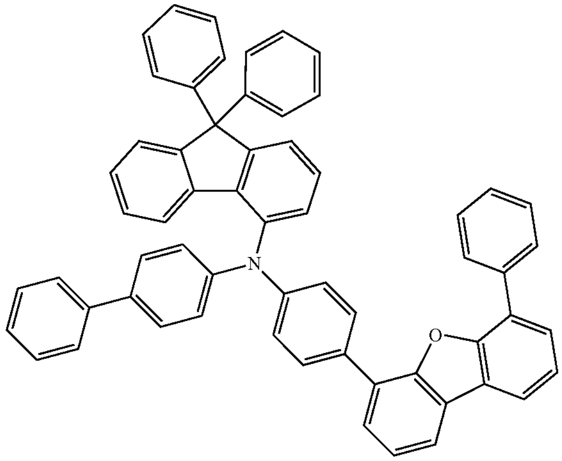
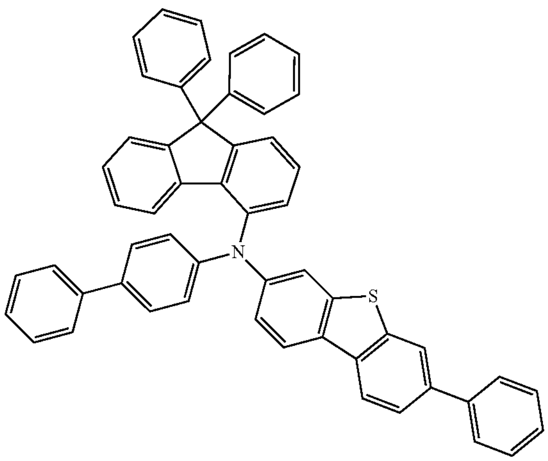
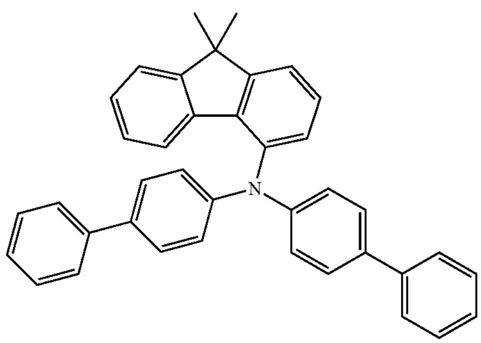
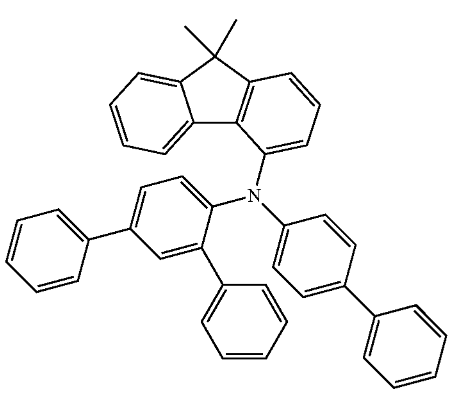
-continued
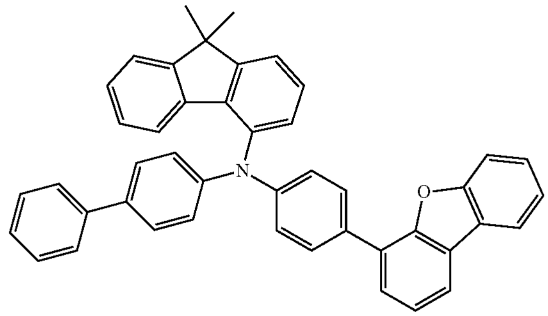
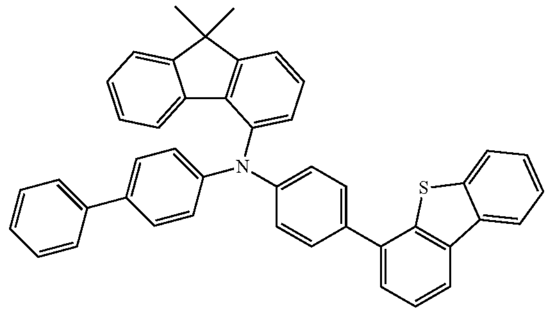
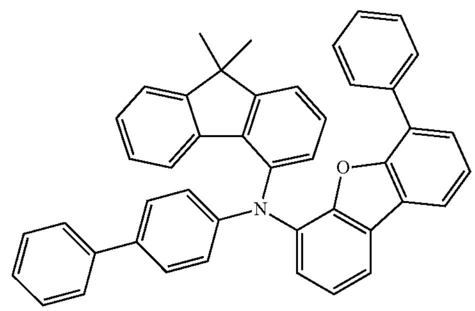
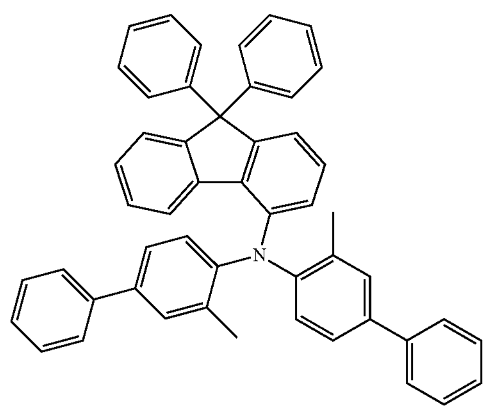
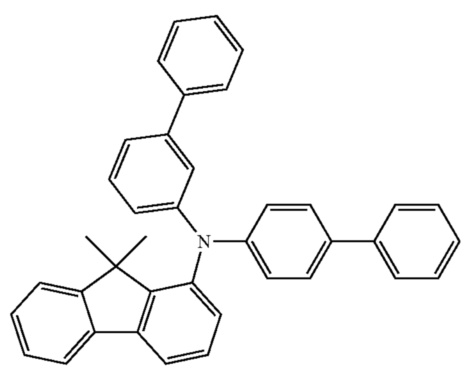

-continued
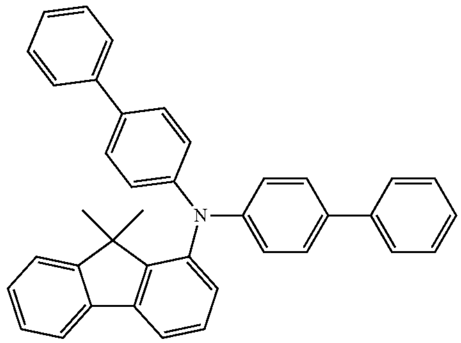
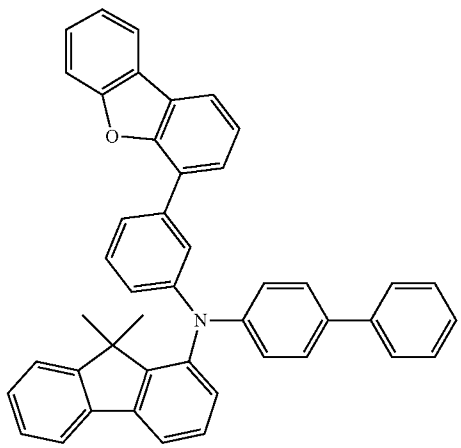
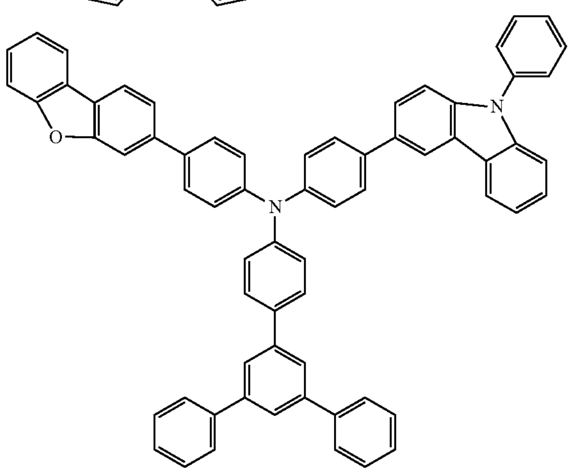
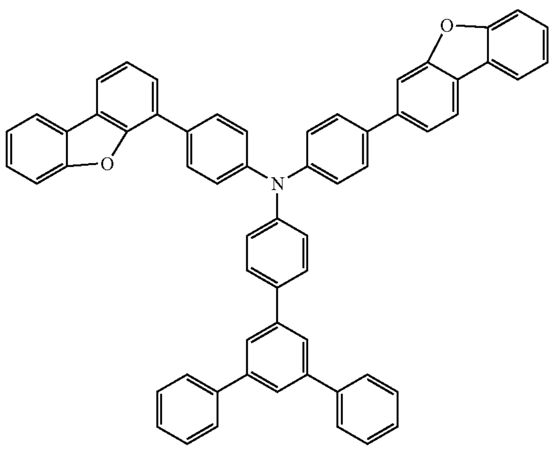
-continued
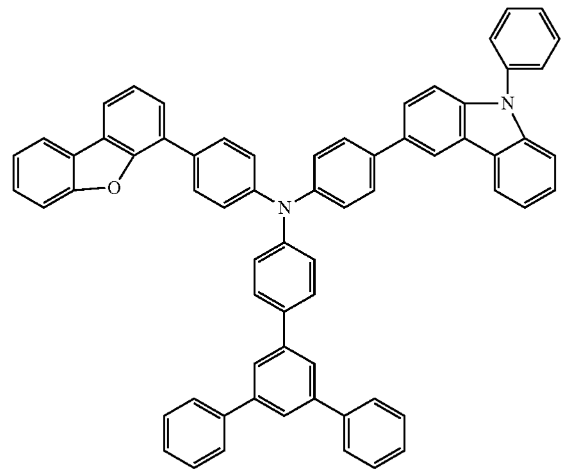
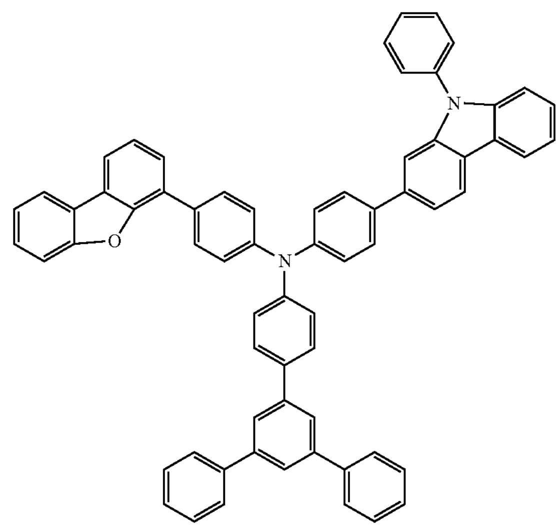
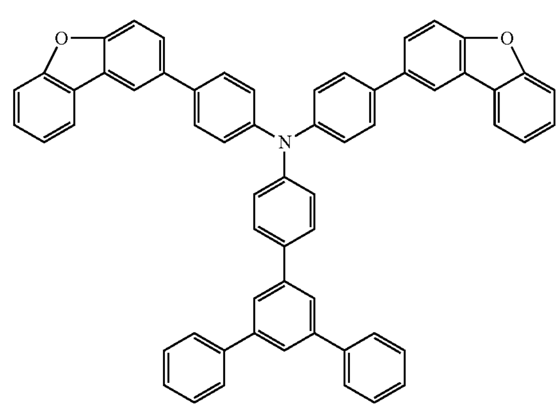

-continued
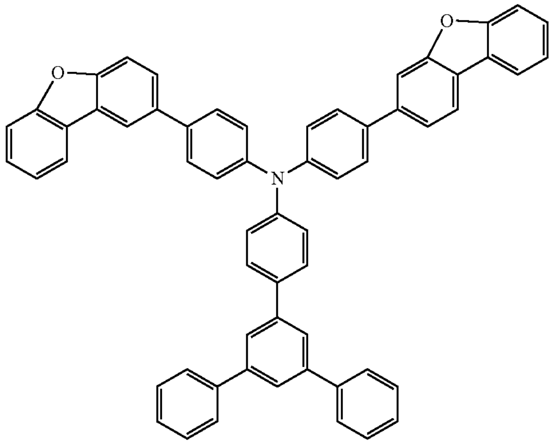
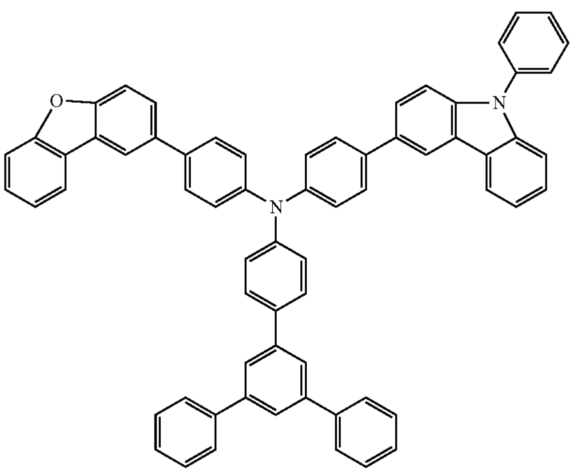
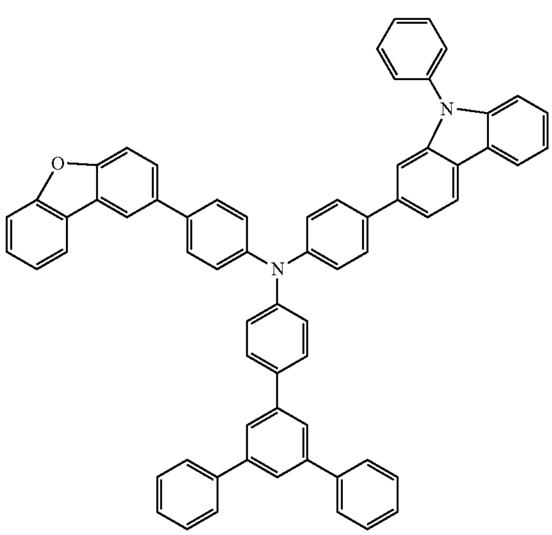
-continued
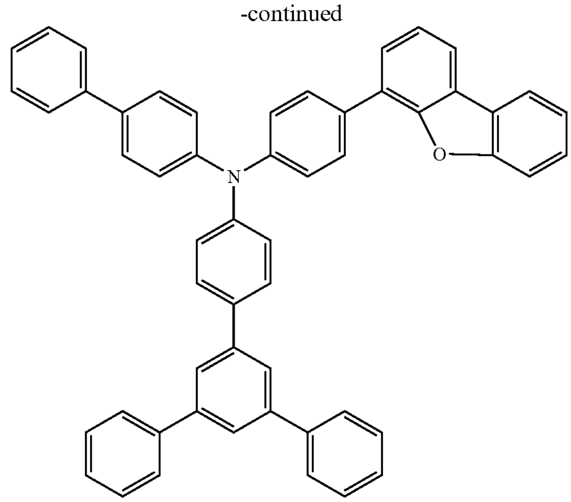
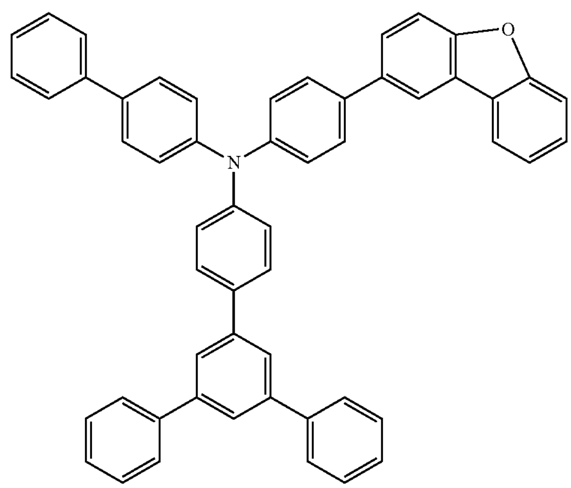
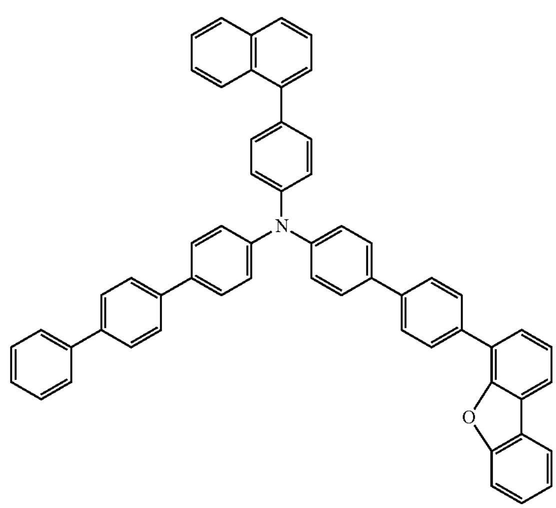

-continued
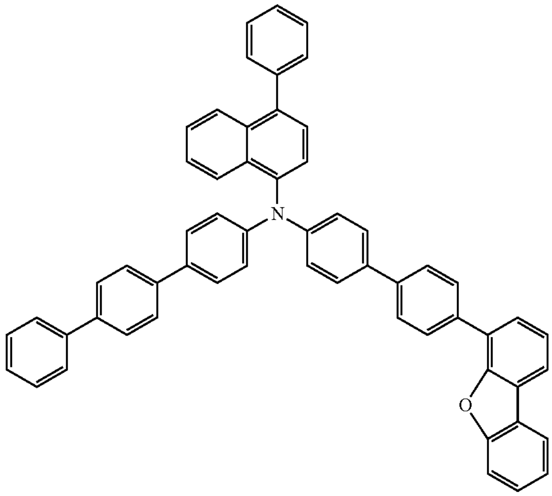
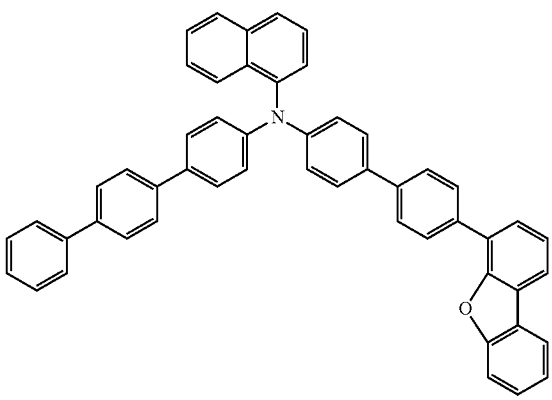
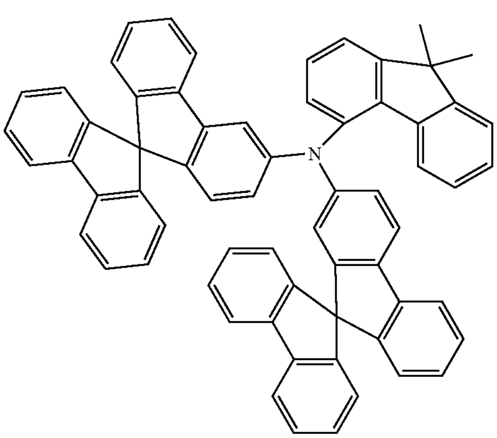
-continued
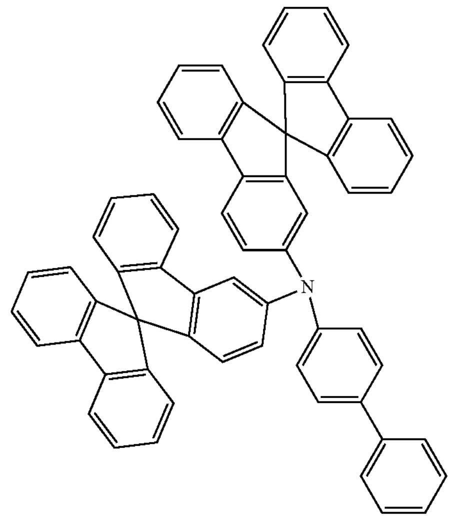
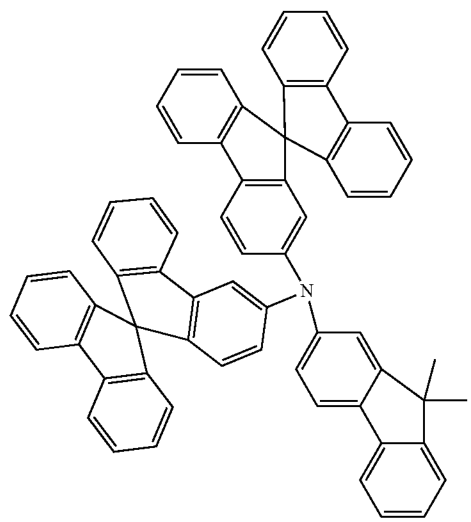
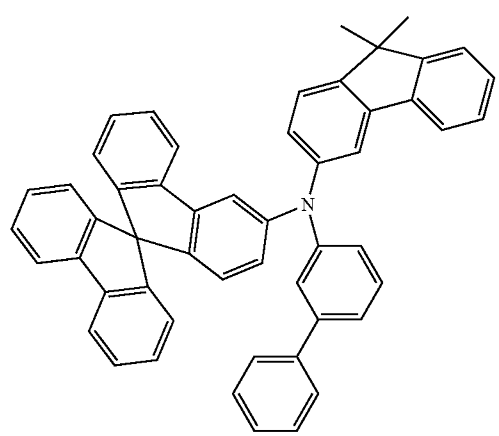

-continued
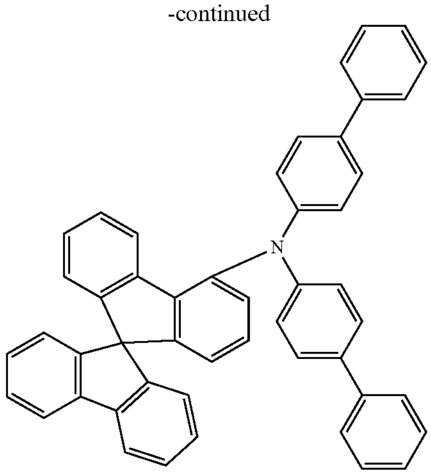
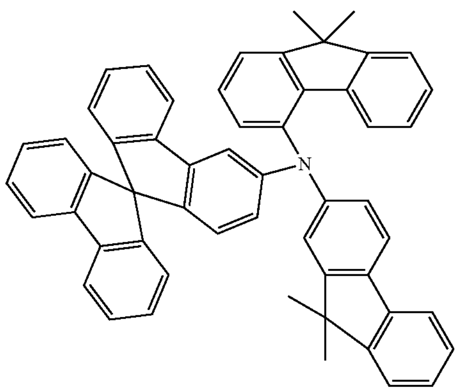
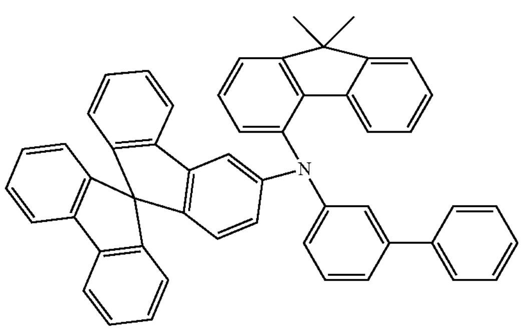
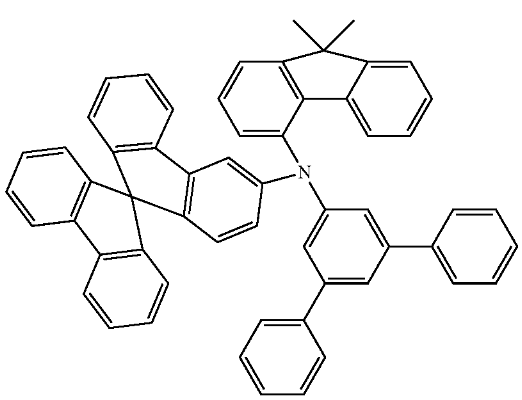
-continued
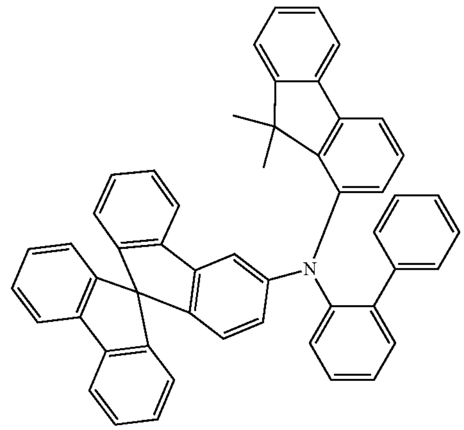
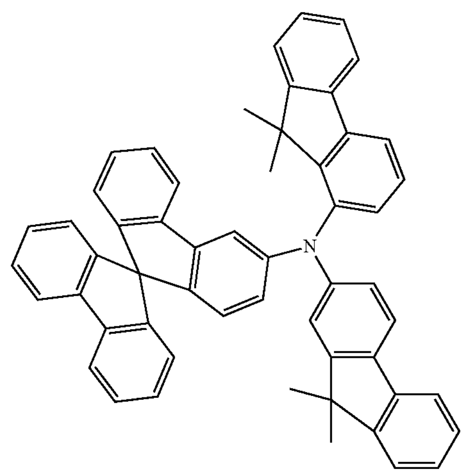
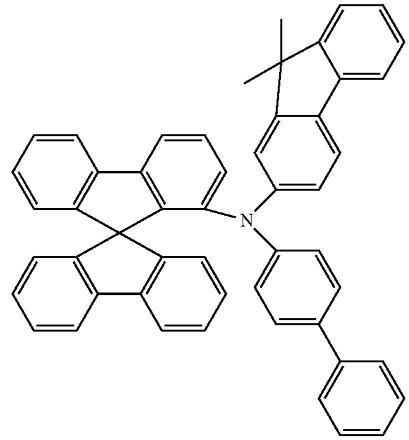

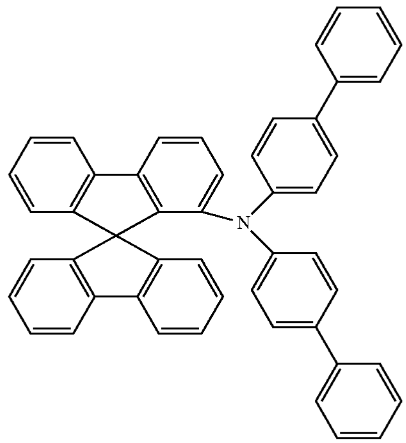
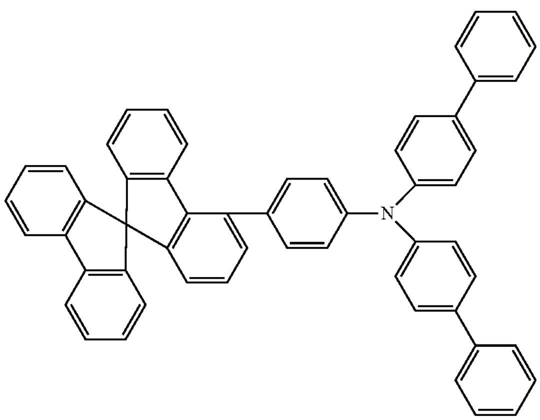
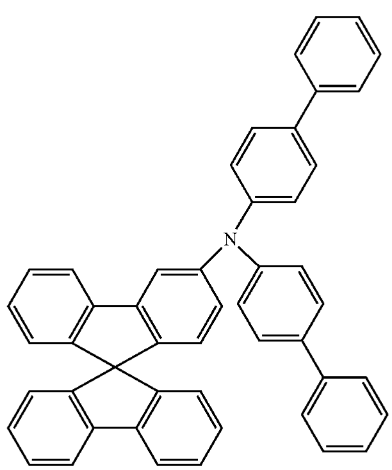
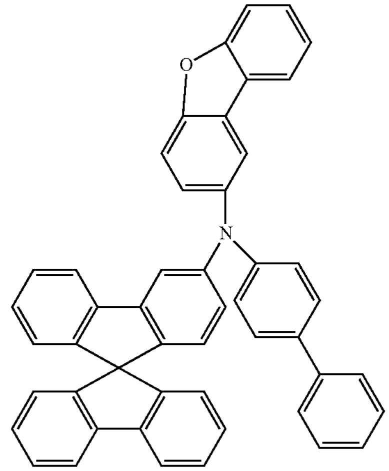
O
N
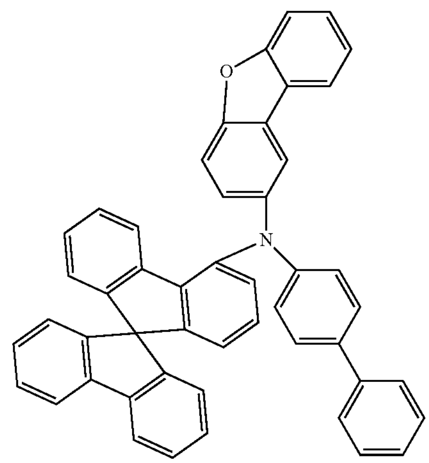
O
N
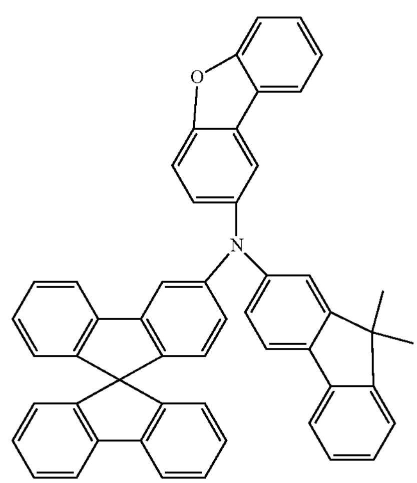
O
N -continued
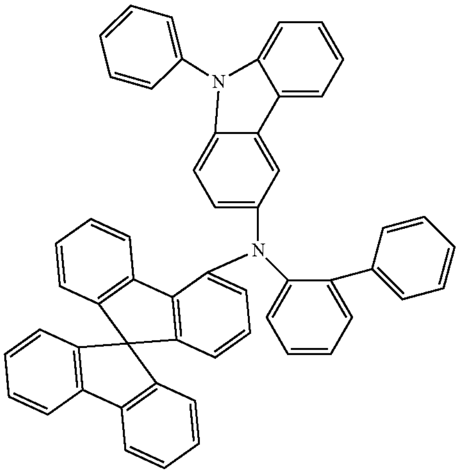
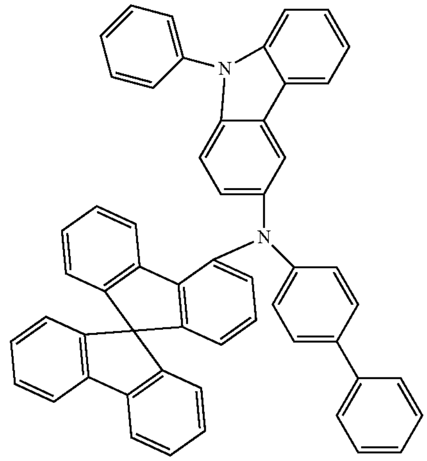
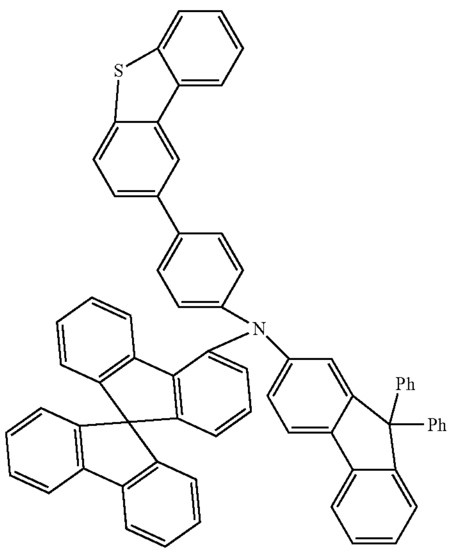
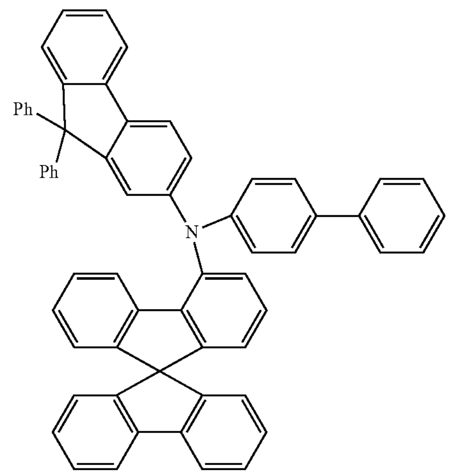
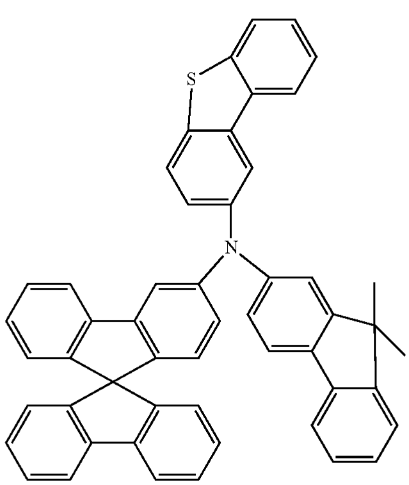
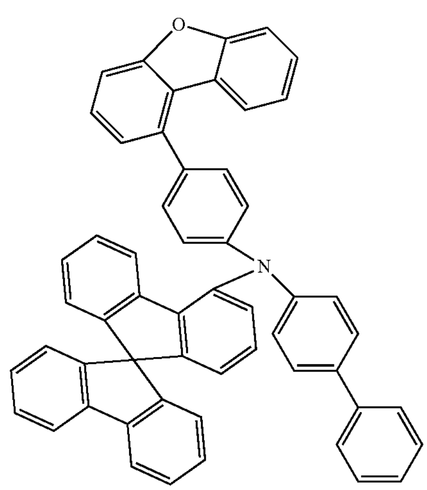

-continued
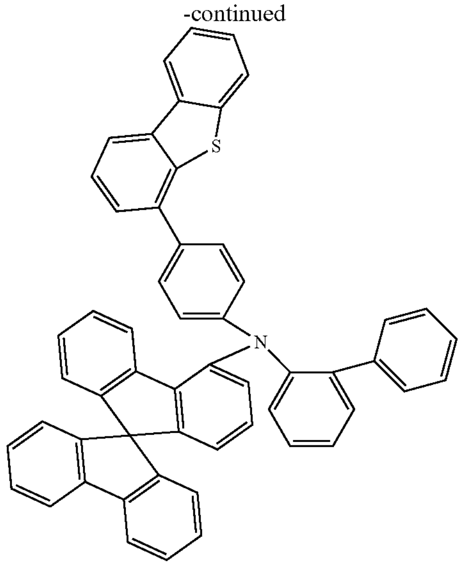
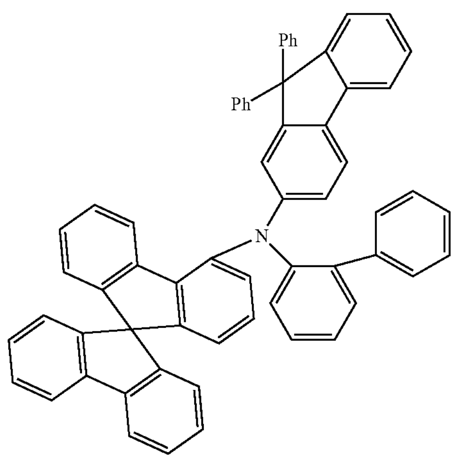
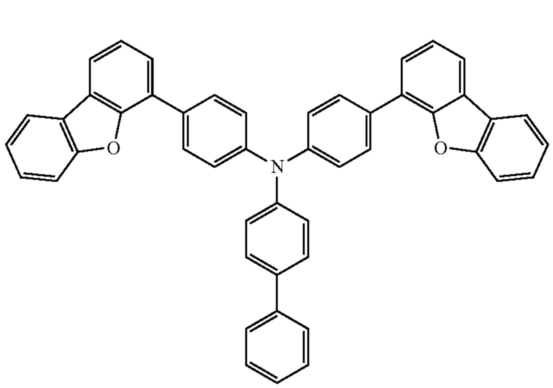
-continued
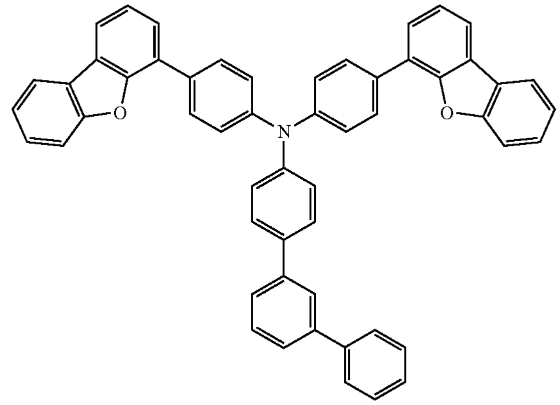
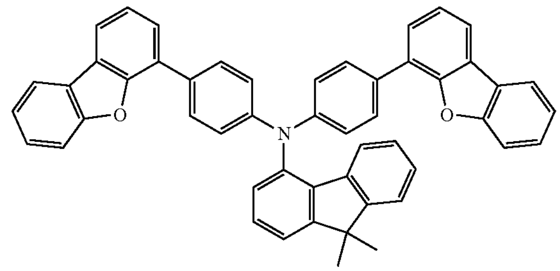
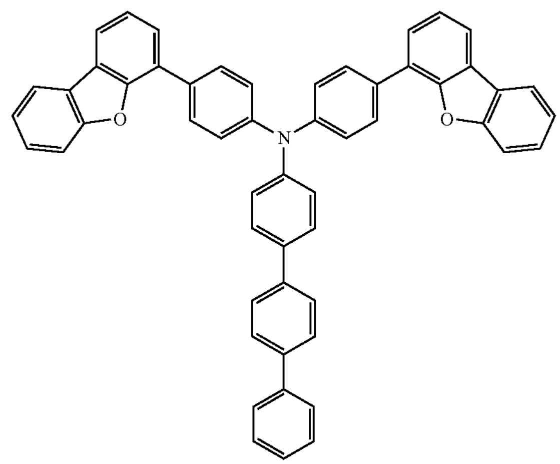
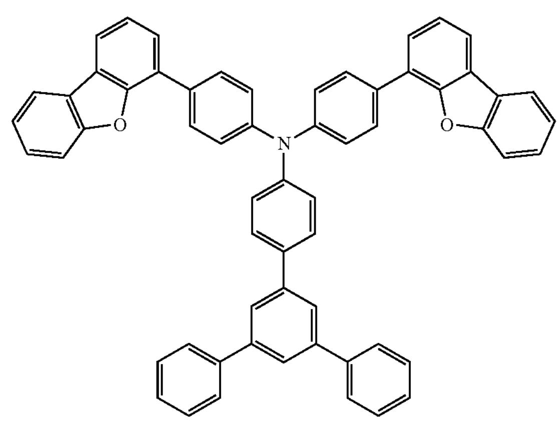

(Compound Represented by the Formula (D1))

In one embodiment, the third layer contains a compound represented by the following formula (D1).

(D1)

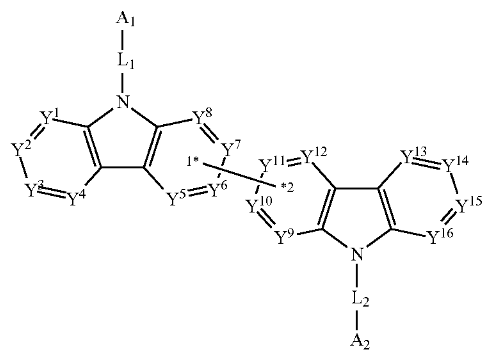

In the formula (D1), $A^1$ and $A^2$ are independently a substituted or unsubstituted aryl group including 6 to 30 ring carbon atoms, or a substituted or unsubstituted monovalent heterocyclic group including 5 to 30 ring atoms.

One of $Y^5$ to $Y^8$ is a carbon atom which is bonded to *1.

One of $Y^9$ to $Y^{12}$ is a carbon atom which is bonded to *2.

$Y^1$ to $Y^4$, $Y^{13}$ to $Y^{16}$, $Y^5$ to $Y^6$ which are not bonded to *1, and $Y^9$ to $Y^{12}$ which are not bonded to *2 are independently CR.

When a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring.

R which does not form the substituted or unsubstituted, saturated or unsaturated ring is a hydrogen atom, a cyano group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$) ($R_{902}$)($R_{903}$),

—O—($R_{904}$), a halogen atom, a nitro group, a substituted or unsubstituted aryl group including 6 to 50 ring carbon atoms, or a substituted or unsubstituted monovalent heterocyclic group including 5 to 50 ring atoms.

$R_{901}$ to $R_{904}$ are as defined in the formula (A1).

When a plurality of R's is present, the plurality of R's may be the same as or different from each other.

$L^1$ and $L^2$ are independently a single bond, a substituted or unsubstituted arylene group including 6 to 30 ring carbon atoms, or a substituted or unsubstituted divalent heterocyclic group including 5 to 30 ring atoms.

In one embodiment, the compound represented by the formula (D1) is a compound represented by the following formula (D10), (D11), or (D12).

(D10)

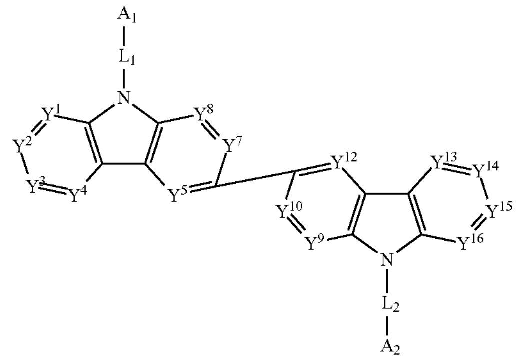

(D11)

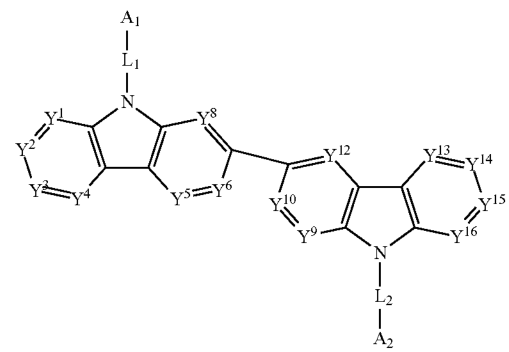

(D12)

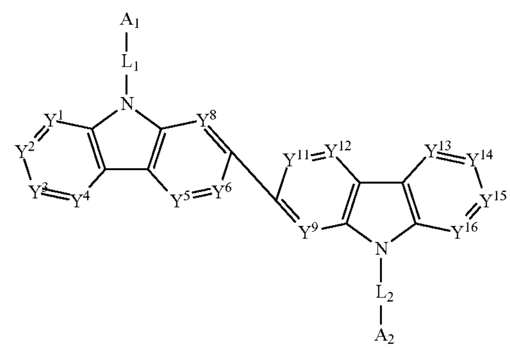

In the formulas (D10), (D11), and (D12), $Y^1$ to $Y^{16}$, $A^1$, $A^2$, $L^1$ and $L^2$ are as defined in the formula (D1).

In the formula (D1), (D10), (D11) or (D12), it is preferable that one of $A^1$ and $A^2$ be a substituted or unsubstituted aryl group including 6 to 30 ring carbon atoms, and the other of $A^1$ and $A^2$ be a substituted or unsubstituted phenyl group, a substituted or unsubstituted biphenyl group, a substituted or unsubstituted terphenyl group, a substituted or unsubstituted naphthyl group, a naphthylphenyl group, a triphenylenyl group, or a 9,9-biphenylfluorenyl group.

In the formula (D1), (D10), (D11) or (D12), it is preferable that one of $A^1$ and $A^2$ be a substituted or unsubstituted aryl group including 6 to 30 ring carbon atoms, and the other of $A^1$ and $A^2$ be a substituted or unsubstituted phenyl group, a substituted or unsubstituted p-biphenyl group group, a substituted or unsubstituted m-biphenyl group, a substituted or unsubstituted o-biphenyl group, a substituted or unsubstituted 3-naphthylphenyl group, a triphenylenyl group, or a 9,9-biphenylfluorenyl group.

Specific examples of the compound represented by the formula (D1) include the following compounds.

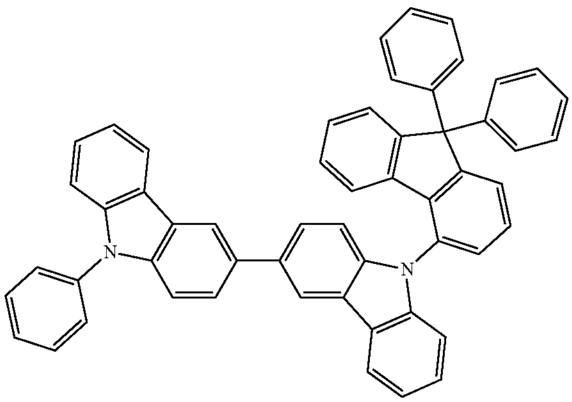

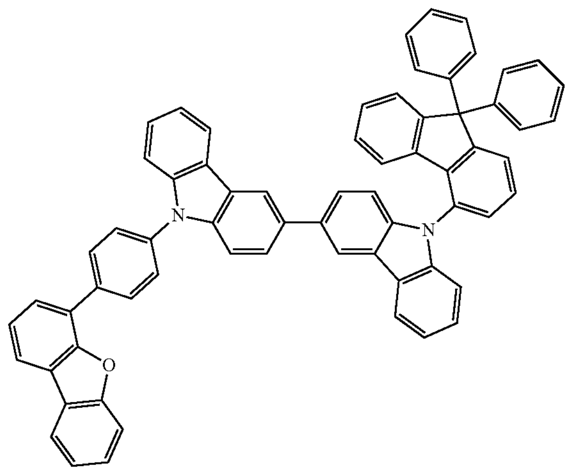

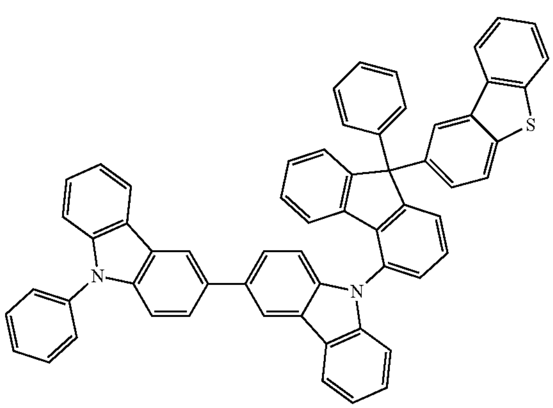

-continued

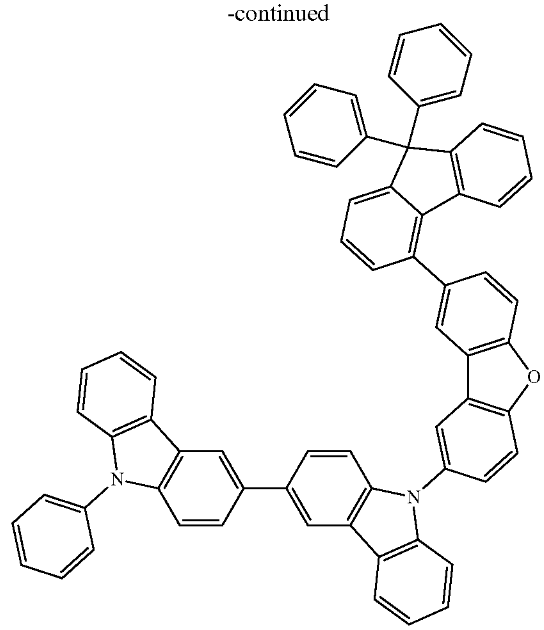

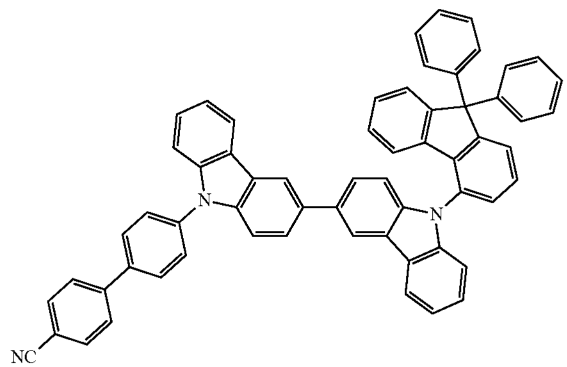 [SMILES: N#Cc1ccc(-c2ccc(-n3c4ccccc4c4cc(-c5ccc6c(c5)c5ccccc5n6-c5cccc6c5-c5ccccc5C6(c5ccccc5)c5ccccc5)ccc43)cc2)cc1]

In one embodiment, in the compound represented by the formulas (A1) to (D1), the substituent in the case of "substituted or unsubstituted" is a group selected from the group consisting of:

an alkyl group including 1 to 50 carbon atoms, an aryl group including 6 to 50 ring carbon atoms, and a monovalent heterocyclic group including 5 to 50 ring atoms.

In one embodiment, in the compounds represented by each of the formulas (A1) to (D1), the substituent in the case of "substituted or unsubstituted" is a group selected from the group consisting of:

an alkyl group including 1 to 18 carbon atoms, an aryl group including 6 to 18 ring carbon atoms, and a monovalent heterocyclic group including 5 to 18 ring atoms.

Specific examples of each group in the formulas (A1) to (D1) are as described in the section of [Definition] of this specification.

As described above, known materials and device configurations may be applied to the organic EL device according to an aspect of the invention, as long as the device includes a cathode, an anode, and an organic layer between the cathode and the anode, wherein the organic layer includes an emitting layer and a first layer; the first layer is disposed between the cathode and the emitting layer; the emitting layer contains a compound represented by the formula (A1), and the first layer contains a compound represented by the formula (B1), and the effect of the invention is not impaired.

Parts which can be used in the organic EL device according to an aspect of the invention, materials for forming respective layers, other than the above-mentioned compounds, and the like, will be described below.

(Substrate)

A substrate is used as a support of an emitting device. As the substrate, glass, quartz, plastic, and the like can be used, for example. Further, a flexible substrate may be used. The "flexible substrate" means a bendable (flexible) substrate, and specific examples thereof include a plastic substrate formed of polycarbonate, polyvinyl chloride, or the like.

(Anode)

For the anode formed on the substrate, metals, alloys, electrically conductive compounds, mixtures thereof, and the like, which have a large work function (specifically 4.0 eV or more) are preferably used. Specific examples thereof include indium oxide-tin oxide (ITO: Indium Tin Oxide), indium oxide-tin oxide containing silicon or silicon oxide, indium oxide-zinc oxide, tungsten oxide, indium oxide containing zinc oxide, graphene, and the like. In addition thereto, specific examples thereof include gold (Au), platinum (Pt), a nitride of a metallic material (for example, titanium nitride), and the like.

(Hole-Injecting Layer)

The hole-injecting layer is a layer containing a substance having a high hole-injecting property. As such a substance having a high hole-injecting property, molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, an aromatic amine compound, or a polymer compound (oligomers, dendrimers, polymers, etc.) can be given.

(Hole-Transporting Layer)

The hole-transporting layer is a layer containing a substance having a high hole-transporting property. For the hole-transporting layer, an aromatic amine compound, a carbazole derivative, an anthracene derivative, and the like can be used. Polymer compounds such as poly(N-vinylcarbazole) (abbreviation: PVK) and poly(4-vinyltriphenylamine) (abbreviation: PVTPA) can also be used. However, a substance other than the above-described substances may be used as long as the substance has a higher hole-transporting property in comparison with an electron-transporting property. It should be noted that the layer containing the substance having a high hole-transporting property may be not only a single layer, but also a layer in which two or more layers formed of the above-described substances are stacked.

(Guest Material for Emitting Layer)

The emitting layer is a layer containing a substance having a high emitting property, and can be formed by the use of various materials. For example, as the substance having a high emitting property, a fluorescent compound which emits fluorescence or a phosphorescent compound which emits phosphorescence can be used. The fluorescent compound is a compound which can emit from a singlet excited state, and the phosphorescent compound is a compound which can emit from a triplet excited state.

As a blue fluorescent emitting material which can be used for an emitting layer, a pyrene derivative, a styrylamine derivative, a chrysene derivative, a fluoranthene derivative, a fluorene derivative, a diamine derivative, a triarylamine derivative, and the like can be used. As a green fluorescent emitting material which can be used for an emitting layer, an aromatic amine derivative and the like can be used. As a red fluorescent emitting material which can be used for an emitting layer, a tetracene derivative, a diamine derivative and the like can be used.

As a blue phosphorescent emitting material which can be used for an emitting layer, metal complexes such as an iridium complex, an osmium complex, a platinum complex and the like are used. As a green phosphorescent emitting material which can be used for an emitting layer, an iridium complex and the like are used. As a red phosphorescent emitting material which can be used for an emitting layer, metal complexes such as an iridium complex, a platinum complex, a terbium complex, an europium complex and the like are used.

(Host Material for Emitting Layer)

The emitting layer may have a constitution in which the above-mentioned substance having a high emitting property (guest material) is dispersed in another substance (host material). As a substance for dispersing the substance having a high emitting property, a variety of substances can be used, and it is preferable to use a substance having a higher lowest unoccupied orbital level (LUMO level) and a lower highest occupied orbital level (HOMO level) rather than the substance having a high emitting property.

As such a substance for dispersing the substance having a high emitting property (host material), 1) metal complexes such as an aluminum complex, a beryllium complex, a zinc complex, and the like; 2) heterocyclic compounds such as an oxadiazole derivative, a benzimidazole derivative, a phenanthroline derivative, and the like; 3) fused aromatic compounds such as a carbazole derivative, an anthracene derivative, a phenanthrene derivative, a pyrene derivative, a chrysene derivative, and the like; and 4) aromatic amine compounds such as a triarylamine derivative, a fused aromatic amine derivative, and the like are used.

(Electron-Transporting Layer)

An electron-transporting layer is a layer which contains a substance having a high electron-transporting property. For the electron-transporting layer, 1) metal complexes such as an aluminum complex, a beryllium complex, a zinc complex, and the like; 2) heteroaromatic complexes such as an imidazole derivative, a benzimidazole derivative, an azine derivative, a carbazole derivative, a phenanthroline derivative, and the like; and 3) polymer compounds can be used.

(Electron-Injecting Layer)

An electron-injecting layer is a layer which contains a substance having a high electron-injecting property. For the electron-injecting layer, lithium (Li), ytterbium (Yb), lithium fluoride (LiF), cesium fluoride (CsF), calcium fluoride ($CaF_2$), metal complex compounds such as 8-hydroxyquinolinolato-lithium (Liq), alkali metal oxides such as lithium oxide ($LiO_x$); alkaline earth metal oxides; compounds of an alkali metal; or compounds of an alkaline earth metal can be used.

(Cathode)

For the cathode, metals, alloys, electrically conductive compounds, mixtures thereof, and the like having a small work function (specifically, 3.8 eV or lower) are preferably used. Specific examples of such a cathode material include elements belonging to Group 1 or Group 2 of the Periodic Table of the Elements, i.e., alkali metals such as lithium (Li) and cesium (Cs), alkaline earth metals such as magnesium (Mg), calcium (Ca) and strontium (Sr), and alloys containing these metals (e.g., MgAg and AlLi); rare earth metals such as europium (Eu) and ytterbium (Yb), and alloys containing these metals.

In the organic EL device according to an aspect of the invention, the methods for forming the respective layers are not particularly limited. A conventionally-known method for forming each layer according to a vacuum deposition process, a spin coating process or the like can be used. Each layer such as the emitting layer can be formed by a known method such as a vacuum deposition process, a molecular beam deposition process (MBE process), or an application process such as a dipping process, a spin coating process, a casting process, a bar coating process or a roll coating process, using a solution prepared by dissolving the material in a solvent.

In the organic EL device according to an aspect of the invention, the thickness of each layer is not particularly limited, but is generally preferable that the thickness be in the range of several nm to 1 μm in order to suppress defects such as pinholes, to suppress applied voltages to be low, and to increase luminous efficiency.

[Electronic Apparatus]

The electronic apparatus according to an aspect of the invention is characterized in that the organic EL device according to an aspect of the invention is equipped with.

Specific examples of the electronic apparatus include display components such as an organic EL panel module, and the like; display devices for a television, a cellular phone, a personal computer, and the like; and emitting devices such as a light, a vehicular lamp, and the like.

EXAMPLES

Next, the invention will be explained in more detail with reference to Examples and Comparative Examples. The invention is not limited to the description of these Examples in anyway.

<Compounds>

The compounds represented by the formula (A1) used for fabricating organic EL devices of Examples 1 to 165 are shown below.

BD-1

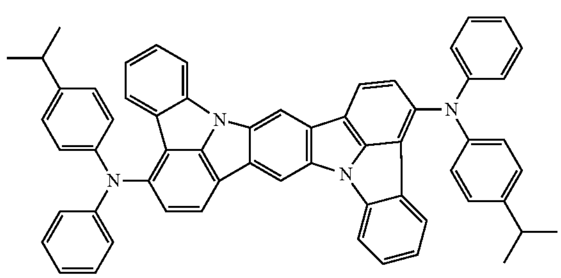

BD-2

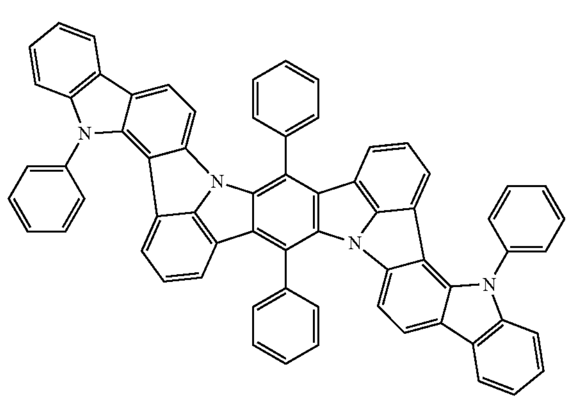

-continued

BD-3

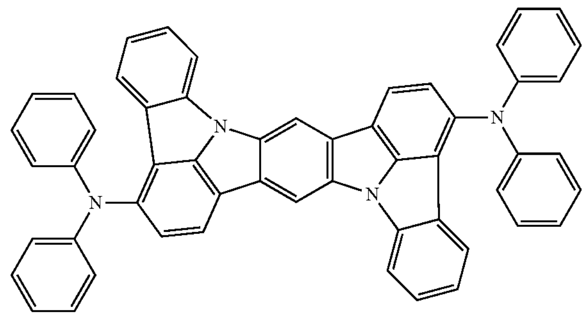

BD-4

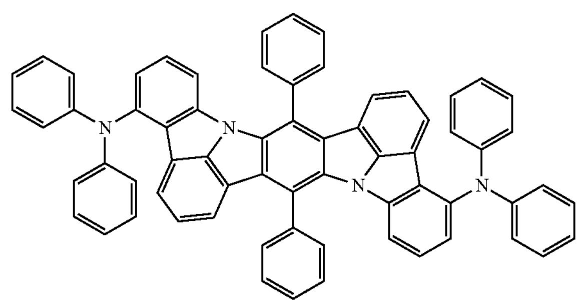

BD-5

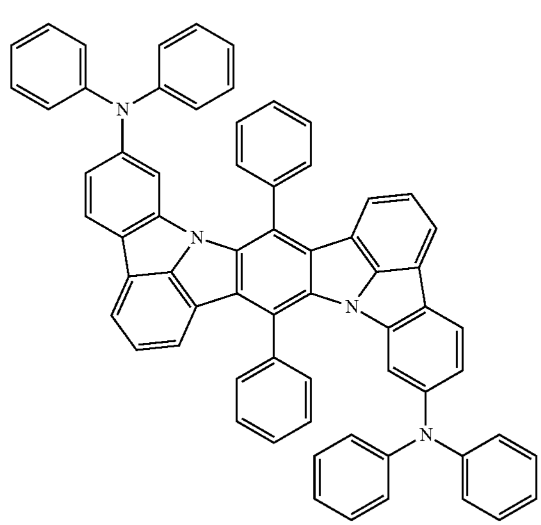

-continued
BD-6
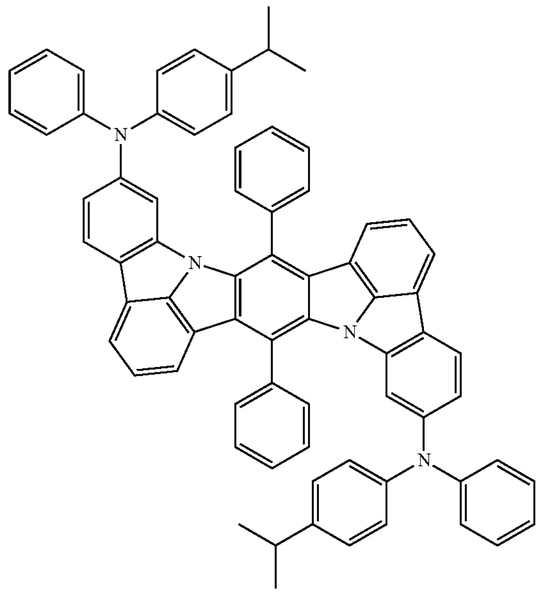
BD-7
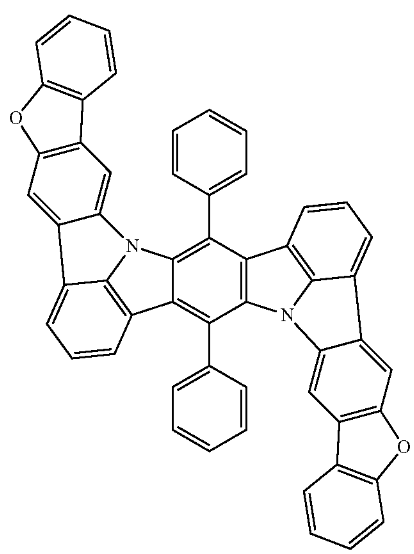
The compounds represented by the formula (B1) used for fabricating organic EL devices of Examples 1 to 165 are shown below.
ET-1
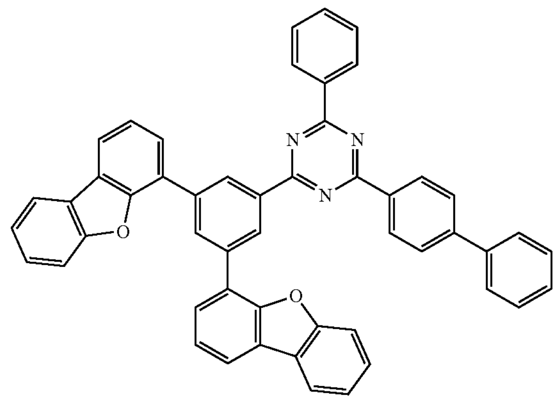
ET-2
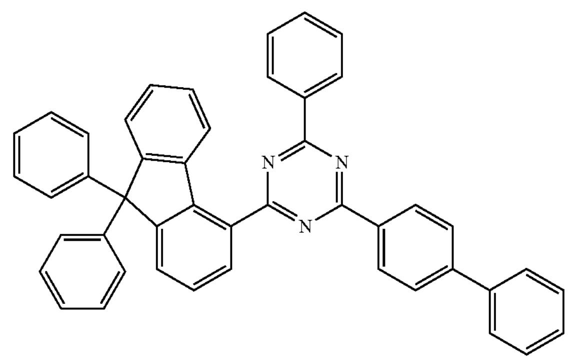
ET-3
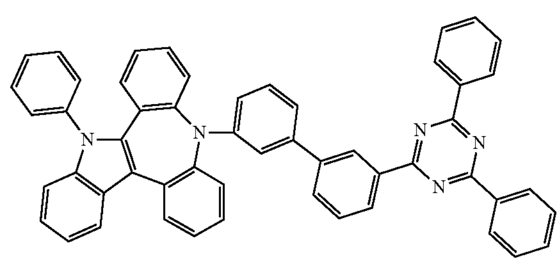
ET-4
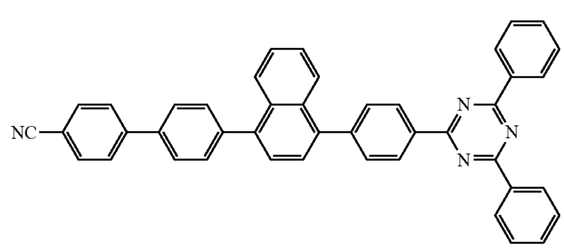

-continued
ET-5
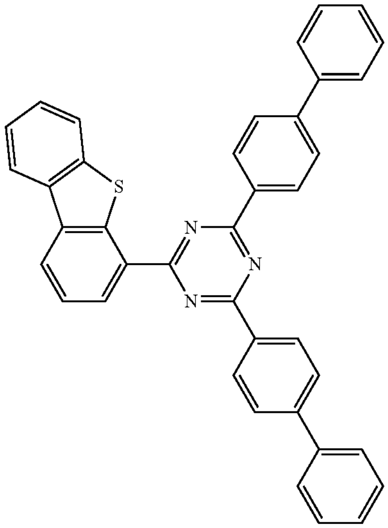
ET-6
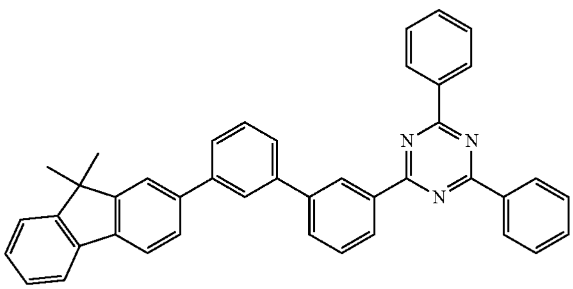
ET-7
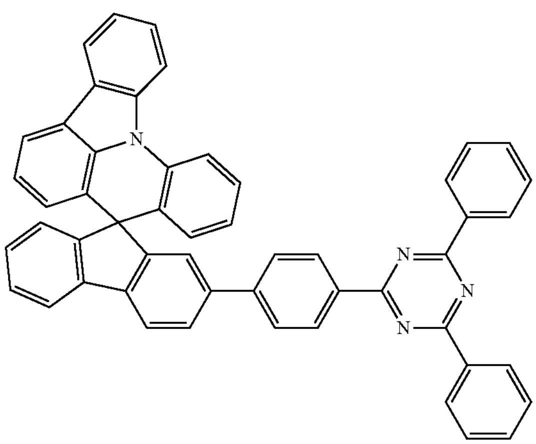
ET-8
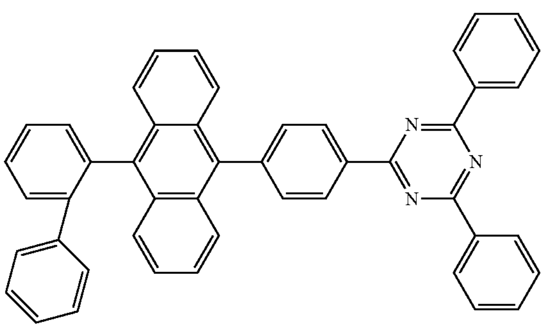
-continued
ET-9
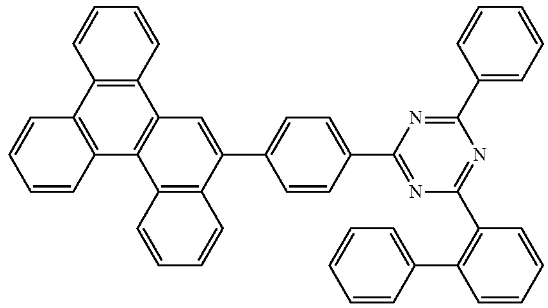
ET-10
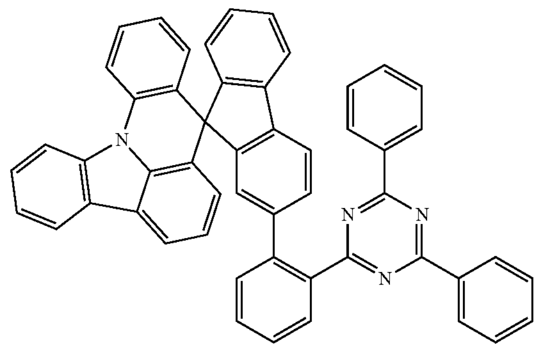
ET-11
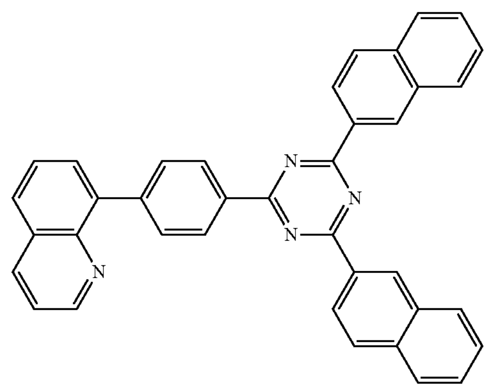
ET-12
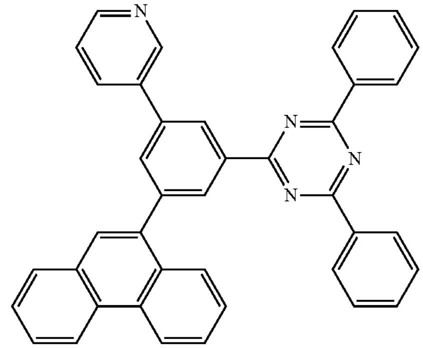

-continued
ET-13
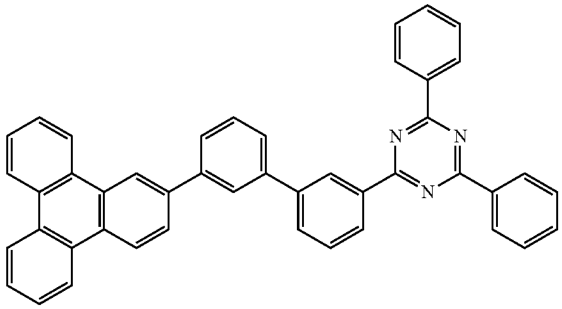
ET-14
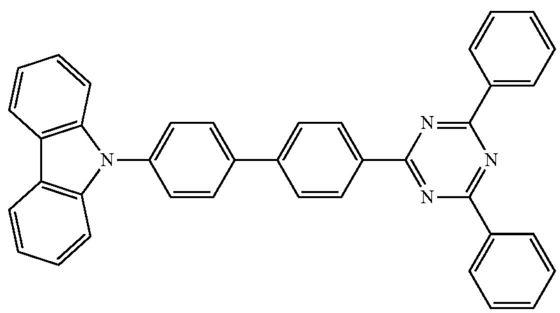
ET-15
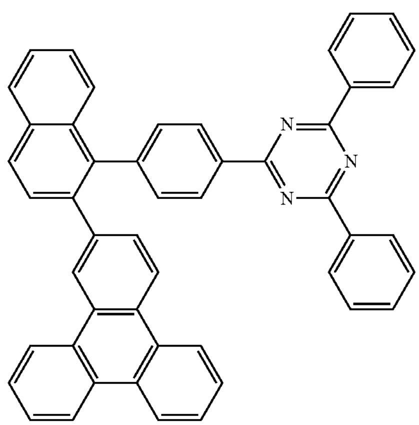
ET-16
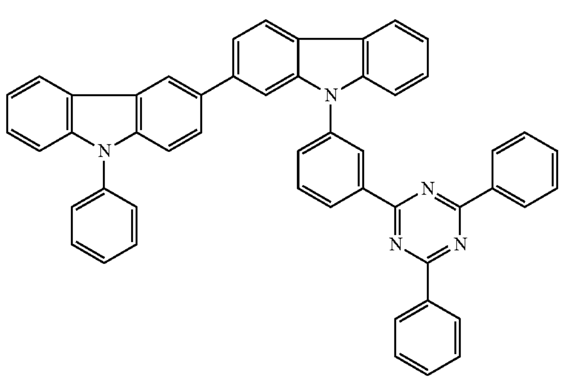
-continued
ET-17
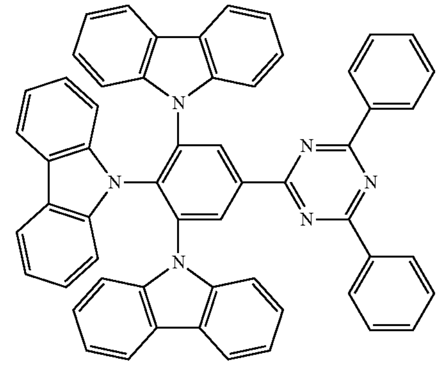
ET-18
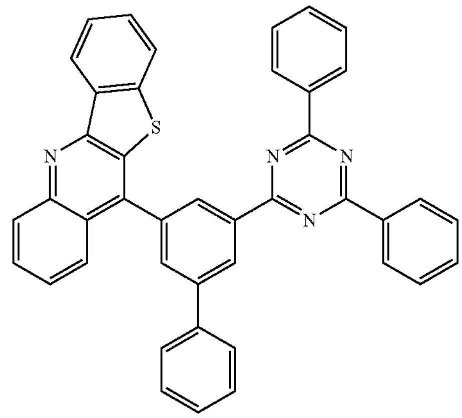
ET-19
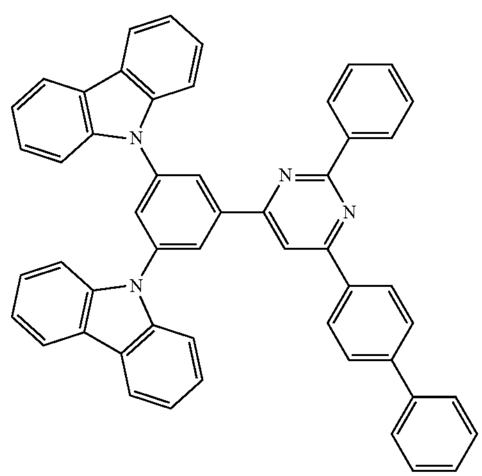

-continued
ET-20
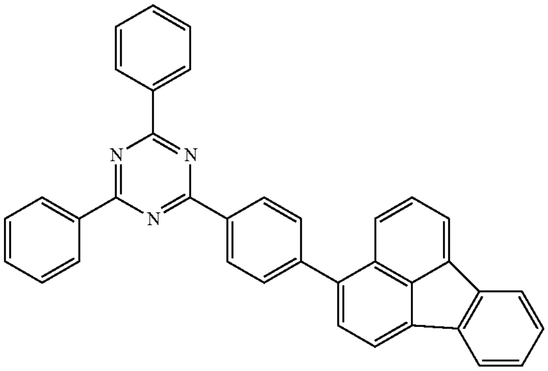
ET-21
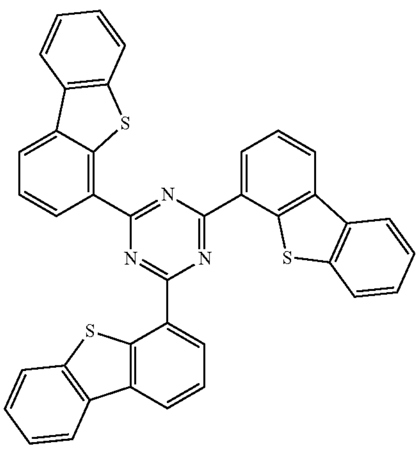
ET-22
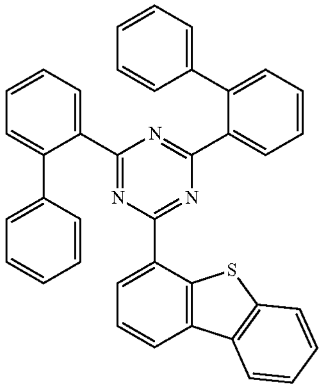
-continued
ET-23
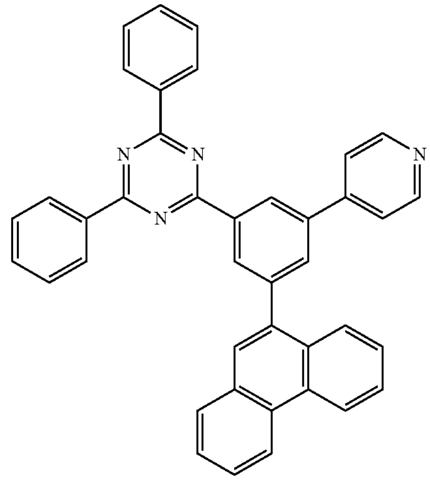
ET-24
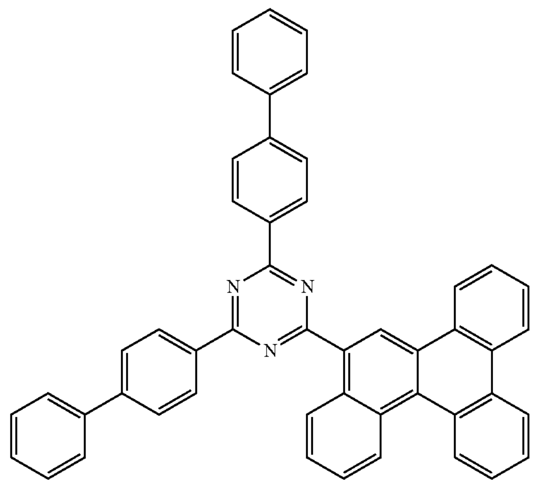
ET-25
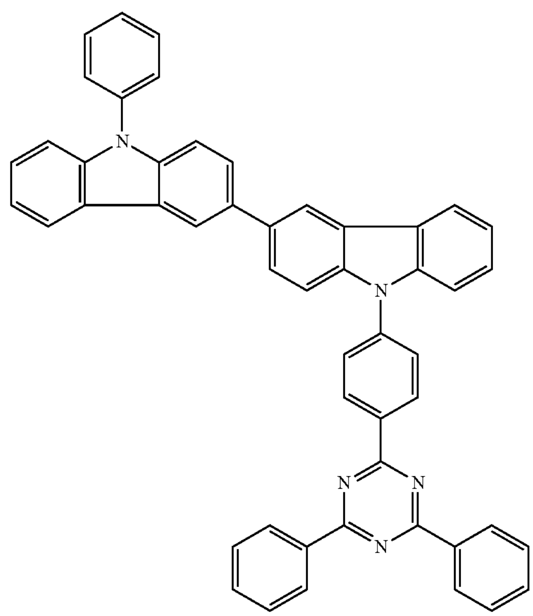

The compounds represented by the formula (C1) used for fabricating organic EL devices of Examples 1 to 165 are shown below.

HT

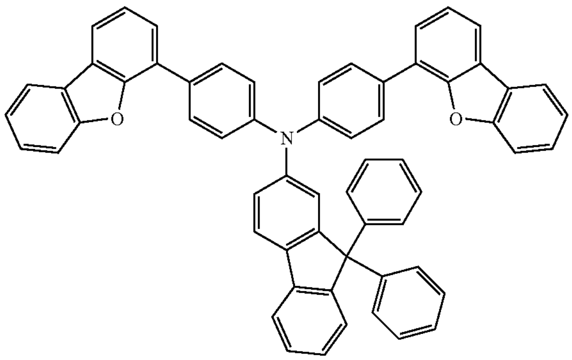

Comparative compounds used for fabricating organic EL devices of Comparative Examples 1 to 67 are shown below.

Comparative Compound-1

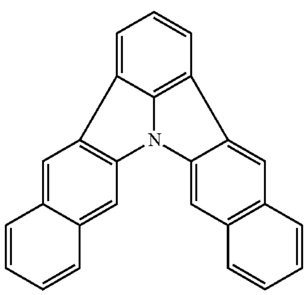

Comparative Compound-2

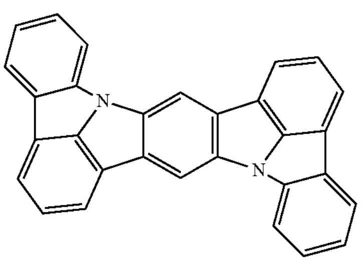

Comparative Compound-3

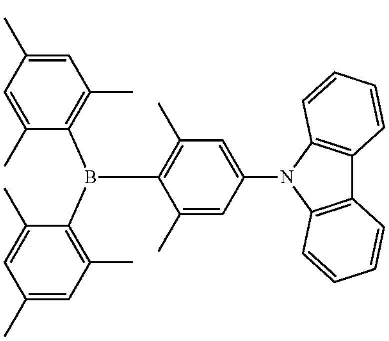

The structure of the other compounds used for fabricating the organic EL device of Examples 1 to 165 and Comparative Examples 1 to 67 are shown below. Compound HBL was used in Examples 39 to 48 and 51 to 58.

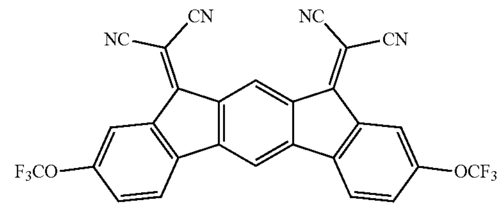

HA

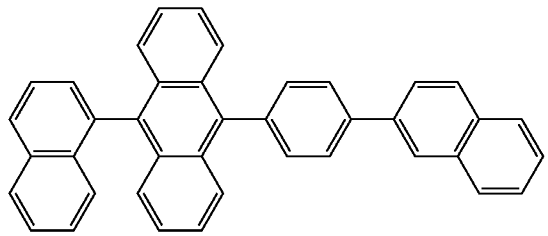

BH

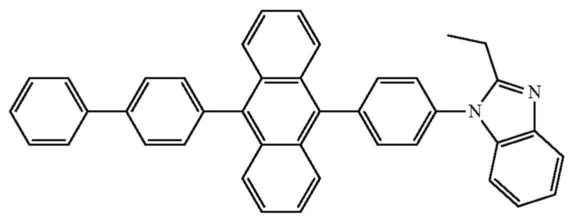

ET

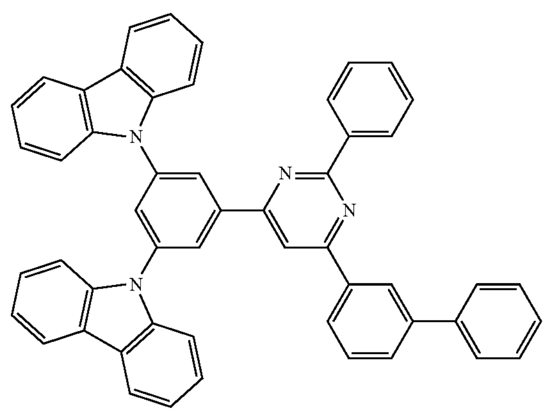

HBL

<Fabrication of Organic EL Device>

An organic EL device was fabricated and evaluated as follows.

Example 1

(Fabrication of Organic EL Device)

A 25 mm×75 mm×1.1 mm-thick glass substrate with an ITO transparent electrode (anode) (manufactured by GEOMATEC Co., Ltd.) was subjected to ultrasonic cleaning in isopropyl alcohol for 5 minutes, and then subjected to UV-ozone cleaning for 30 minutes. The thickness of the ITO film was 130 nm.

The glass substrate with the transparent electrode after being cleaned was mounted onto a substrate holder in a vacuum vapor deposition apparatus. First, a compound HA was deposited on a surface on the side on which the transparent electrode was formed so as to cover the transparent electrode to form an HA film having a thickness of 5 nm. The HA film functions as a hole-injecting layer.

A compound HT was deposited on the HA film to form an HT film (a third layer) having a thickness of 90 nm. The HT film functions as a hole-transporting layer (hereinafter, also referred to as an HT layer).

A compound BH (host material) and a compound BD-1 (dopant material) were co-deposited on this HT film such that the proportion of the compound BD-1 became 4% by mass, and a BH:BD-1 film having a thickness of 25 nm was formed. The BH:BD-1 film functions as an emitting layer.

A compound ET-1 was deposited on the emitting layer to form an ET-1 film (a first layer) having a thickness of 10 nm. This ET-1 film functions as a first electron-transporting layer.

A compound ET was deposited on the ET-1 film to form an ET film having a thickness of 15 nm. The ET film functions as a second electron-transporting layer.

LiF was deposited on the ET film to form a LiF film having a thickness of 1 nm.

Al metal was deposited on the LiF film to form a metal cathode having a thickness of 80 nm to obtain an organic EL device.

The layer configuration of the obtained organic EL device is as follows. ITO(130)/HA(5)/HT(90)/BH:BD-1 (25:4% by mass)/ET-1(10)/ET(15)/LiF(1)/Al(80)

Numerical values in parentheses indicate film thickness (unit: nm).

(Evaluation of Organic EL Device)

A voltage was applied to the obtained organic EL device so that the current density became 50 mA/cm$^2$, and the time until the luminance became 95% of the initial luminance (LT95 (unit: hours)) was measured. The results are shown in Table 1.

Examples 2 to 19

The organic EL devices were fabricated and evaluated in the same manner as in Example 1 except that the compounds shown in Table 1 were used as materials of the first layer. The results are shown in Table 1.

Comparative Examples 1 to 19

The organic EL devices were fabricated and evaluated in the same manner as in Example 1 except that the comparative compound 1 was used in place of the compound BD-1 (dopant material) and the compounds shown in Table 1 were used as materials of the first layer. The results are shown in Table 1.

TABLE 1

| | Dopant | First layer | LT95(hr) | | Dopant | First layer | LT95(hr) |
|---|---|---|---|---|---|---|---|
| Ex. 1 | BD-1 | ET-1 | 40 | Comp. Ex. 1 | Comparative compound-1 | ET-1 | 10 |
| Ex. 2 | BD-1 | ET-2 | 60 | Comp. Ex. 2 | Comparative compound-1 | ET-2 | 10 |
| Ex. 3 | BD-1 | ET-3 | 38 | Comp. Ex. 3 | Comparative compound-1 | ET-3 | 6 |
| Ex. 4 | BD-1 | ET-4 | 77 | Comp. Ex. 4 | Comparative compound-1 | ET-4 | 15 |
| Ex. 5 | BD-1 | ET-5 | 130 | Comp. Ex. 5 | Comparative compound-1 | ET-5 | 25 |
| Ex. 6 | BD-1 | ET-6 | 40 | Comp. Ex. 6 | Comparative compound-1 | ET-6 | 10 |
| Ex. 7 | BD-1 | ET-7 | 47 | Comp. Ex. 7 | Comparative compound-1 | ET-7 | 10 |
| Ex. 8 | BD-1 | ET-8 | 39 | Comp. Ex. 8 | Comparative compound-1 | ET-8 | 8 |
| Ex. 9 | BD-1 | ET-9 | 30 | Comp. Ex. 9 | Comparative compound-1 | ET-9 | 5 |
| Ex. 10 | BD-1 | ET-10 | 32 | Comp. Ex. 10 | Comparative compound-1 | ET-10 | 5 |
| Ex. 11 | BD-1 | ET-11 | 50 | Comp. Ex. 11 | Comparative compound-1 | ET-11 | 8 |
| Ex. 12 | BD-1 | ET-12 | 180 | Comp. Ex. 12 | Comparative compound-1 | ET-12 | 35 |
| Ex. 13 | BD-1 | ET-13 | 20 | Comp. Ex. 13 | Comparative compound-1 | ET-13 | 5 |
| Ex. 14 | BD-1 | ET-14 | 56 | Comp. Ex. 14 | Comparative compound-1 | ET-14 | 12 |
| Ex. 15 | BD-1 | ET-15 | 30 | Comp. Ex. 15 | Comparative compound-1 | ET-15 | 5 |
| Ex. 16 | BD-1 | ET-16 | 160 | Comp. Ex. 16 | Comparative compound-1 | ET-16 | 30 |
| Ex. 17 | BD-1 | ET-17 | 186 | Comp. Ex. 17 | Comparative compound-1 | ET-17 | 35 |
| Ex. 18 | BD-1 | ET-18 | 165 | Comp. Ex. 18 | Comparative compound-1 | ET-18 | 34 |
| Ex. 19 | BD-1 | ET-19 | 17 | Comp. Ex. 19 | Comparative compound-1 | ET-19 | 2 |

Examples 20 to 38

The organic EL devices were fabricated and evaluated in the same manner as in Example 1 except that the compound BD-2 was used in place of the compound BD-1 and the compounds shown in Table 2 were used as materials of the first layer. The results are shown in Table 2.

Comparative Examples 20 to 38

The organic EL devices were fabricated and evaluated in the same manner as in Example 1 except that the comparative compound 2 was used in place of the compound BD-1 (dopant material) and the compounds shown in Table 2 were used as materials of the first layer. The results are shown in Table 2.

TABLE 2

| | Dopant | First layer | LT95(hr) | | Dopant | First layer | LT95(hr) |
|---|---|---|---|---|---|---|---|
| Ex. 20 | BD-2 | ET-1 | 30 | Comp. Ex. 20 | Comparative compound-2 | ET-1 | 20 |
| Ex. 21 | BD-2 | ET-2 | 40 | Comp. Ex. 21 | Comparative compound-2 | ET-2 | 25 |
| Ex. 22 | BD-2 | ET-3 | 27 | Comp. Ex. 22 | Comparative compound-2 | ET-3 | 18 |
| Ex. 23 | BD-2 | ET-4 | 53 | Comp. Ex. 23 | Comparative compound-2 | ET-4 | 35 |
| Ex. 24 | BD-2 | ET-5 | 90 | Comp. Ex. 24 | Comparative compound-2 | ET-5 | 64 |
| Ex. 25 | BD-2 | ET-6 | 37 | Comp. Ex. 25 | Comparative compound-2 | ET-6 | 18 |
| Ex. 26 | BD-2 | ET-7 | 40 | Comp. Ex. 26 | Comparative compound-2 | ET-7 | 25 |
| Ex. 27 | BD-2 | ET-8 | 23 | Comp. Ex. 27 | Comparative compound-2 | ET-8 | 19 |
| Ex. 28 | BD-2 | ET-9 | 18 | Comp. Ex. 28 | Comparative compound-2 | ET-9 | 11 |
| Ex. 29 | BD-2 | ET-10 | 27 | Comp. Ex. 29 | Comparative compound-2 | ET-10 | 15 |
| Ex. 30 | BD-2 | ET-11 | 37 | Comp. Ex. 30 | Comparative compound-2 | ET-11 | 23 |
| Ex. 31 | BD-2 | ET-12 | 127 | Comp. Ex. 31 | Comparative compound-2 | ET-12 | 85 |
| Ex. 32 | BD-2 | ET-13 | 20 | Comp. Ex. 32 | Comparative compound-2 | ET-13 | 10 |
| Ex. 33 | BD-2 | ET-14 | 40 | Comp. Ex. 33 | Comparative compound-2 | ET-14 | 25 |
| Ex. 34 | BD-2 | ET-15 | 25 | Comp. Ex. 34 | Comparative compound-2 | ET-15 | 15 |
| Ex. 35 | BD-2 | ET-16 | 110 | Comp. Ex. 35 | Comparative compound-2 | ET-16 | 75 |
| Ex. 36 | BD-2 | ET-17 | 130 | Comp. Ex. 36 | Comparative compound-2 | ET-17 | 91 |
| Ex. 37 | BD-2 | ET-18 | 125 | Comp. Ex. 37 | Comparative compound-2 | ET-18 | 78 |
| Ex. 38 | BD-2 | ET-19 | 10 | Comp. Ex. 38 | Comparative compound-2 | ET-19 | 6 |

Example 39

An organic device was fabricated in the same manner as in Example 1 until the formation of the emitting layer.

A compound HBL was deposited on the emitting layer to form an HBL film (second layer) having a thickness of 10 nm. This HBL film functions as a first electron-transporting layer.

A compound ET-2 and (8-quinolinolato)lithium (hereinafter, also referred to as Liq) were co-deposited on this HBL film such that the proportion of Liq became 50% by mass to form an ET-2:Liq film having a thickness of 15 nm. This ET-2:Liq film (first layer) functions as a second electron-transporting layer.

On this ET-2:Liq film, LiF was deposited to form a LiF film having a thickness of 1 nm.

Al metal was deposited on this LiF film to form a metal cathode having a thickness of 80 nm to obtain an organic EL device.

The layer structure of the obtained organic EL device is as follows. ITO(130)/HA(5)/HT(80)/BH:BD-1(25:4% by mass)/HBL(10)/ET-2:Liq(15: 50% by mass)/LiF(1)/Al(80) Numerical values in parentheses indicate film thickness (unit: nm).

LT95 (unit: hours) were measured for the obtained organic EL devices. The results are shown in Table 3.

Examples 40 to 43

The organic EL devices were fabricated and evaluated in the same manner as in Example 39 except that the compounds shown in Table 3 were used in place of ET-2 and Liq as materials of the first layer. The results are shown in Table 3.

Comparative Examples 39 to 43

The organic EL devices were fabricated and evaluated in the same manner as in Example 39 except that the comparative compound 1 was used in place of the compound BD-1 (dopant material) and the compounds shown in Table 3 were used in place of ET-2 and Liq as materials of the first layer. A compound BH (host material) and a comparative compound 1 (dopant material) were co-deposited to form an emitting layer having a thickness of 25 nm such that the proportion of the comparative compound 1 became 4% by mass. The results are shown in Table 3.

Examples 44 to 48

The organic EL devices were fabricated and evaluated in the same manner as in Example 39 except that the compound BD-2 was used in place of the compound BD-1, and the compounds shown in Table 3 were used in place of ET-2 and Liq as materials of the first layer. A compound BH (host material) and a compound BD-2 (dopant material) were co-deposited to form an emitting layer such that the proportion of the compound BD-2 became 4% by mass, and a film having a thickness of 25 nm was formed. The results are shown in Table 3.

Comparative Examples 44 to 48

The organic EL devices were fabricated and evaluated in the same manner as in Example 39 except that the comparative compound 2 was used in place of the compound BD-1 (dopant material) and the compounds shown in Table 3 were used in place of ET-2 and Liq as materials of the first layer. A compound BH (host material) and a comparative compound 2 (dopant material) were co-deposited to form an emitting layer having a thickness of 25 nm such that the proportion of the comparative compound 2 became 4% by mass. The results are shown in Table 3.

TABLE 3

| | Dopant | First layer (mass ratio) | LT95(hr) | | Dopant | First layer (mass ratio) | LT95(hr) |
|---|---|---|---|---|---|---|---|
| Ex. 39 | BD-1 | ET-2:Liq (50:50) | 66 | Comp. Ex. 39 | Comparative compound-1 | ET-2:Liq (50:50) | 13 |
| Ex. 40 | BD-1 | ET-4:Liq (50:50) | 99 | Comp. Ex. 40 | Comparative compound-1 | ET-4:Liq (50:50) | 20 |

TABLE 3-continued

| | Dopant | First layer (mass ratio) | LT95(hr) | | Dopant | First layer (mass ratio) | LT95(hr) |
|---|---|---|---|---|---|---|---|
| Ex. 41 | BD-1 | ET-5:Liq (50:50) | 105 | Comp. Ex. 41 | Comparative compound-1 | ET-5:Liq (50:50) | 21 |
| Ex. 42 | BD-1 | ET-12:Liq (50:50) | 75 | Comp. Ex. 42 | Comparative compound-1 | ET-12:Liq (50:50) | 15 |
| Ex. 43 | BD-1 | ET-18:Liq (50:50) | 63 | Comp. Ex. 43 | Comparative compound-1 | ET-18:Liq (50:50) | 13 |
| Ex. 44 | BD-2 | ET-2:Liq (50:50) | 47 | Comp. Ex. 44 | Comparative compound-2 | ET-2:Liq (50:50) | 34 |
| Ex. 45 | BD-2 | ET-4:Liq (50:50) | 70 | Comp. Ex. 45 | Comparative compound-2 | ET-4:Liq (50:50) | 50 |
| Ex. 46 | BD-2 | ET-5:Liq (50:50) | 74 | Comp. Ex. 46 | Comparative compound-2 | ET-5:Liq (50:50) | 53 |
| Ex. 47 | BD-2 | ET-12:Liq (50:50) | 53 | Comp. Ex. 47 | Comparative compound-2 | ET-12:Liq (50:50) | 38 |
| Ex. 48 | BD-2 | ET-18:Liq (50:50) | 45 | Comp. Ex. 48 | Comparative compound-2 | ET-18:Liq (50:50) | 32 |

Example 49

The organic EL device was fabricated and evaluated in the same manner as in Example 1 except that the compound ET-20 was used as a material of the first layer. The results are shown in Table 4.

Comparative Example 49

The organic EL device was fabricated and evaluated in the same manner as in Example 49 except that the comparative compound 1 was used as a dopant material. The results are shown in Table 4.

Example 50

The organic EL device was fabricated and evaluated in the same manner as in Example 49 except that BD-2 was used as a dopant material. The results are shown in Table 4.

Comparative Example 50

The organic EL device was fabricated and evaluated in the same manner as in Example 50 except that the comparative compound 2 was used as a dopant material. The results are shown in Table 4.

TABLE 4

| | Dopant | First layer | LT95(hr) |
|---|---|---|---|
| Ex. 49 | BD-1 | ET-20 | 200 |
| Comp. Ex. 49 | Comparative compound-1 | ET-20 | 50 |
| Ex. 50 | BD-2 | ET-20 | 185 |
| Comp. Ex. 50 | Comparative compound-2 | ET-20 | 70 |

Example 51 to 54

The organic EL devices were fabricated and evaluated in the same manner as in Example 39 except that each of the compounds ET-21 to ET-24 and Liq were used in place of ET-2 and Liq as materials of the second electron-transporting layer (first layer) as shown in Table 5. The results are shown in Table 5.

Comparative Example 51 to 54

The organic EL devices were fabricated and evaluated in the same manner as in Example 39 except that the comparative compound 1 was used in place of the compound BD-1 (dopant material), and the compounds shown in Table 5 were used in place of ET-2 and Liq as materials of the first layer. The results are shown in Table 5.

Example 55 to 58

The organic EL devices were fabricated and evaluated in the same manner as in Example 39 except that the compound BD-2 was used in place of the compound BD-1, and the compounds shown in Table 5 were used in place of ET-2 and Liq as materials of the first layer. The results are shown in Table 5.

Comparative Example 55 to 58

The organic EL devices were fabricated and evaluated in the same manner as in Example 39 except that the comparative compound 2 was used in place of the compound BD-2, and the compounds shown in Table 5 were used in place of ET-2 and Liq as materials of the first layer. The results are shown in Table 5.

TABLE 5

| | Dopant | First layer (mass ratio) | LT95(hr) | | Dopant | First layer (mass ratio) | LT95(hr) |
|---|---|---|---|---|---|---|---|
| Ex. 51 | BD-1 | ET-21:Liq (50:50) | 140 | Comp. Ex. 51 | Comparative compound-1 | ET-21:Liq (50:50) | 27 |
| Ex. 52 | BD-1 | ET-22:Liq (50:50) | 142 | Comp. Ex. 52 | Comparative compound-1 | ET-22:Liq (50:50) | 28 |
| Ex. 53 | BD-1 | ET-23:Liq (50:50) | 130 | Comp. Ex. 53 | Comparative compound-1 | ET-23:Liq (50:50) | 24 |

TABLE 5-continued

| | Dopant | First layer (mass ratio) | LT95(hr) | | Dopant | First layer (mass ratio) | LT95(hr) |
|---|---|---|---|---|---|---|---|
| Ex. 54 | BD-1 | ET-24:Liq (50:50) | 160 | Comp. Ex. 54 | Comparative compound-1 | ET-24:Liq (50:50) | 33 |
| Ex. 55 | BD-2 | ET-21:Liq (50:50) | 97 | Comp. Ex. 55 | Comparative compound-2 | ET-21:Liq (50:50) | 70 |
| Ex. 56 | BD-2 | ET-22:Liq (50:50) | 105 | Comp. Ex. 56 | Comparative compound-2 | ET-22:Liq (50:50) | 75 |
| Ex. 57 | BD-2 | ET-23:Liq (50:50) | 90 | Comp. Ex. 57 | Comparative compound-2 | ET-23:Liq (50:50) | 62 |
| Ex. 58 | BD-2 | ET-24:Liq (50:50) | 113 | Comp. Ex. 58 | Comparative compound-2 | ET-24:Liq (50:50) | 74 |

Example 59

The organic EL device was fabricated and evaluated in the same manner as in Example 1, except that the compound ET-25 was used as a material of the first layer. The results are shown in Table 6.

Comparative Example 59

The organic EL device was fabricated and evaluated in the same manner as in Example 59, except that the comparative compound 1 was used as the dopant. The results are shown in Table 6.

Example 60

The organic EL device was fabricated and evaluated in the same manner as in Example 59, except that BD-2 was used as the dopant. The results are shown in Table 6.

Comparative Example 60

The organic EL device was fabricated and evaluated in the same manner as in Example 60, except that the comparative compound 2 was used as the dopant. The results are shown in Table 6.

TABLE 6

| | Dopant | First layer | LT95 (hr) |
|---|---|---|---|
| Ex. 59 | BD-1 | ET-25 | 132 |
| Comp. Ex. 59 | Comparative compound-1 | ET-25 | 29 |
| Ex. 60 | BD-2 | ET-25 | 95 |
| Comp. Ex. 60 | Comparative compound-2 | ET-25 | 38 |

Comparative Example 61

The organic EL device was fabricated and evaluated in the same manner as in Example 1, except that the comparative compound 3 was used as a material of the first layer. The results are shown in Table 7.

Comparative Examples 62 to 67

The organic EL devices were fabricated and evaluated in the same manner as in Comparative Example 61, except that the dopant material shown in Table 7 was used in place of the compound BD-1 (dopant material). The results are shown in Table 7.

TABLE 7

| | Dopant | First layer | LT95 (hr) |
|---|---|---|---|
| Comp. Ex. 61 | BD-1 | Comparative compound-3 | 4 |
| Comp. Ex. 62 | BD-2 | Comparative compound-3 | 4 |
| Comp. Ex. 63 | BD-3 | Comparative compound-3 | 5 |
| Comp. Ex. 64 | BD-4 | Comparative compound-3 | 6 |
| Comp. Ex. 65 | BD-5 | Comparative compound-3 | 6 |
| Comp. Ex. 66 | BD-6 | Comparative compound-3 | 5 |
| Comp. Ex. 67 | BD-7 | Comparative compound-3 | 4 |

Example 61

The organic EL device was fabricated and evaluated in the same manner as in Example 1, except that BD-3 was used in place of BD-1 as the dopant material. The results are shown in Table 8. For comparison, the results of Comparative Examples 1 and 20 using the comparative compound 1 or 2 as the dopant material are also shown in Table 8.

Examples 62 to 81

The organic EL devices were fabricated and evaluated in the same manner as in Example 61, except that compounds shown in Table 8 were used in place of ET-1 as materials of the first layer. The results are shown in Table 8. Note that, for comparison, the results of Comparative Examples 1 to 38, 49, 50, 59, 60, and 63 using the comparative compound 1 or 2 as the dopant material are also reproduced.

TABLE 8

| Dopant: BD-3 | | | Dopant: Comparative compound-1 | | | Dopant: Comparative compound-2 | | |
|---|---|---|---|---|---|---|---|---|
| | First layer | LT95(hr) | | First layer | LT95(hr) | | First layer | LT95(hr) |
| Ex. 61 | ET-1 | 34 | Comp. Ex. 1 | ET-1 | 10 | Comp. Ex. 20 | ET-1 | 20 |
| Ex. 62 | ET-2 | 51 | Comp. Ex. 2 | ET-2 | 10 | Comp. Ex. 21 | ET-2 | 25 |
| Ex. 63 | ET-3 | 32 | Comp. Ex. 3 | ET-3 | 6 | Comp. Ex. 22 | ET-3 | 18 |
| Ex. 64 | ET-4 | 79 | Comp. Ex. 4 | ET-4 | 15 | Comp. Ex. 23 | ET-4 | 35 |
| Ex. 65 | ET-5 | 111 | Comp. Ex. 5 | ET-5 | 25 | Comp. Ex. 24 | ET-5 | 64 |

TABLE 8-continued

| Dopant: BD-3 | | | Dopant: Comparative compound-1 | | | Dopant: Comparative compound-2 | | |
|---|---|---|---|---|---|---|---|---|
| | First layer | LT95(hr) | | First layer | LT95(hr) | | First layer | LT95(hr) |
| Ex. 66 | ET-6 | 31 | Comp. Ex. 6 | ET-6 | 10 | Comp. Ex. 25 | ET-6 | 18 |
| Ex. 67 | ET-7 | 37 | Comp. Ex. 7 | ET-7 | 10 | Comp. Ex. 26 | ET-7 | 25 |
| Ex. 68 | ET-8 | 27 | Comp. Ex. 8 | ET-8 | 8 | Comp. Ex. 27 | ET-8 | 19 |
| Ex. 69 | ET-9 | 28 | Comp. Ex. 9 | ET-9 | 5 | Comp. Ex. 28 | ET-9 | 11 |
| Ex. 70 | ET-10 | 27 | Comp. Ex. 10 | ET-10 | 5 | Comp. Ex. 29 | ET-10 | 15 |
| Ex. 71 | ET-11 | 51 | Comp. Ex. 11 | ET-11 | 8 | Comp. Ex. 30 | ET-11 | 23 |
| Ex. 72 | ET-12 | 168 | Comp. Ex. 12 | ET-12 | 35 | Comp. Ex. 31 | ET-12 | 85 |
| Ex. 73 | ET-13 | 20 | Comp. Ex. 13 | ET-13 | 5 | Comp. Ex. 32 | ET-13 | 10 |
| Ex. 74 | ET-14 | 52 | Comp. Ex. 14 | ET-14 | 12 | Comp. Ex. 33 | ET-14 | 25 |
| Ex. 75 | ET-15 | 20 | Comp. Ex. 15 | ET-15 | 5 | Comp. Ex. 34 | ET-15 | 15 |
| Ex. 76 | ET-16 | 122 | Comp. Ex. 16 | ET-16 | 30 | Comp. Ex. 35 | ET-16 | 75 |
| Ex. 77 | ET-17 | 158 | Comp. Ex. 17 | ET-17 | 35 | Comp. Ex. 36 | ET-17 | 91 |
| Ex. 78 | ET-18 | 112 | Comp. Ex. 18 | ET-18 | 34 | Comp. Ex. 37 | ET-18 | 78 |
| Ex. 79 | ET-19 | 14 | Comp. Ex. 19 | ET-19 | 2 | Comp. Ex. 38 | ET-19 | 6 |
| Ex. 80 | ET-20 | 136 | Comp. Ex. 49 | ET-20 | 50 | Comp. Ex. 50 | ET-20 | 70 |
| Ex. 81 | ET-25 | 122 | Comp. Ex. 59 | ET-25 | 29 | Comp. Ex. 60 | ET-25 | 38 |
| Comp. Ex. 63 | Comparative compound-3 | 5 | | | | | | |

Examples 82 to 102

The organic EL devices were fabricated and evaluated in the same manner as in Example 1, except that BD-4 was used as the dopant material in place of BD-1, and compounds shown in Table 9 were used as materials of the first layer. The results are shown in Table 9. Note that, for comparison, the results of Comparative Examples 1 to 38, 49, 50, 59, 60, and 64 using the comparative compound 1 or 2 as the dopant material are also reproduced.

TABLE 9

| Dopant: BD-4 | | | Dopant: Comparative compound-1 | | | Dopant: Comparative compound-2 | | |
|---|---|---|---|---|---|---|---|---|
| | First layer | LT95(hr) | | First layer | LT95(hr) | | First layer | LT95(hr) |
| Ex. 82 | ET-1 | 49 | Comp. Ex. 1 | ET-1 | 10 | Comp. Ex. 20 | ET-1 | 20 |
| Ex. 83 | ET-2 | 49 | Comp. Ex. 2 | ET-2 | 10 | Comp. Ex. 21 | ET-2 | 25 |
| Ex. 84 | ET-3 | 43 | Comp. Ex. 3 | ET-3 | 6 | Comp. Ex. 22 | ET-3 | 18 |
| Ex. 85 | ET-4 | 71 | Comp. Ex. 4 | ET-4 | 15 | Comp. Ex. 23 | ET-4 | 35 |
| Ex. 86 | ET-5 | 160 | Comp. Ex. 5 | ET-5 | 25 | Comp. Ex. 24 | ET-5 | 64 |
| Ex. 87 | ET-6 | 49 | Comp. Ex. 6 | ET-6 | 10 | Comp. Ex. 25 | ET-6 | 18 |
| Ex. 88 | ET-7 | 43 | Comp. Ex. 7 | ET-7 | 10 | Comp. Ex. 26 | ET-7 | 25 |
| Ex. 89 | ET-8 | 44 | Comp. Ex. 8 | ET-8 | 8 | Comp. Ex. 27 | ET-8 | 19 |
| Ex. 90 | ET-9 | 28 | Comp. Ex. 9 | ET-9 | 5 | Comp. Ex. 28 | ET-9 | 11 |
| Ex. 91 | ET-10 | 36 | Comp. Ex. 10 | ET-10 | 5 | Comp. Ex. 29 | ET-10 | 15 |
| Ex. 92 | ET-11 | 61 | Comp. Ex. 11 | ET-11 | 8 | Comp. Ex. 30 | ET-11 | 23 |
| Ex. 93 | ET-12 | 166 | Comp. Ex. 12 | ET-12 | 35 | Comp. Ex. 31 | ET-12 | 85 |
| Ex. 94 | ET-13 | 18 | Comp. Ex. 13 | ET-13 | 5 | Comp. Ex. 32 | ET-13 | 10 |
| Ex. 95 | ET-14 | 52 | Comp. Ex. 14 | ET-14 | 12 | Comp. Ex. 33 | ET-14 | 25 |
| Ex. 96 | ET-15 | 28 | Comp. Ex. 15 | ET-15 | 5 | Comp. Ex. 34 | ET-15 | 15 |
| Ex. 97 | ET-16 | 180 | Comp. Ex. 16 | ET-16 | 30 | Comp. Ex. 35 | ET-16 | 75 |
| Ex. 98 | ET-17 | 190 | Comp. Ex. 17 | ET-17 | 35 | Comp. Ex. 36 | ET-17 | 91 |
| Ex. 99 | ET-18 | 152 | Comp. Ex. 18 | ET-18 | 34 | Comp. Ex. 37 | ET-18 | 78 |
| Ex. 100 | ET-19 | 19 | Comp. Ex. 19 | ET-19 | 2 | Comp. Ex. 38 | ET-19 | 6 |
| Ex. 101 | ET-20 | 246 | Comp. Ex. 49 | ET-20 | 50 | Comp. Ex. 50 | ET-20 | 70 |
| Ex. 102 | ET-25 | 123 | Comp. Ex. 59 | ET-25 | 29 | Comp. Ex. 60 | ET-25 | 38 |
| Comp. Ex. 64 | Comparative compound-3 | 6 | | | | | | |

Example s103 to 123

The organic EL devices were fabricated and evaluated in the same manner as in Example 1, except that BD-5 was used as the dopant material in place of BD-1, and compounds shown in Table 10 were used as materials of the first layer. The results are shown in Table 10. Note that, for comparison, the results of Comparative Examples 1 to 38, 49, 50, 59, 60, and 65 using the comparative compound 1 or 2 as the dopant material are also reproduced.

TABLE 10

| Dopant: BD-5 | | | Dopant: Comparative compound-1 | | | Dopant: Comparative compound-2 | | |
|---|---|---|---|---|---|---|---|---|
| | First layer | LT95(hr) | | First layer | LT95(hr) | | First layer | LT95(hr) |
| Ex. 103 | ET-1 | 50 | Comp. Ex. 1 | ET-1 | 10 | Comp. Ex. 20 | ET-1 | 20 |
| Ex. 104 | ET-2 | 60 | Comp. Ex. 2 | ET-2 | 10 | Comp. Ex. 21 | ET-2 | 25 |
| Ex. 105 | ET-3 | 38 | Comp. Ex. 3 | ET-3 | 6 | Comp. Ex. 22 | ET-3 | 18 |
| Ex. 106 | ET-4 | 115 | Comp. Ex. 4 | ET-4 | 15 | Comp. Ex. 23 | ET-4 | 35 |
| Ex. 107 | ET-5 | 178 | Comp. Ex. 5 | ET-5 | 25 | Comp. Ex. 24 | ET-5 | 64 |
| Ex. 108 | ET-6 | 50 | Comp. Ex. 6 | ET-6 | 10 | Comp. Ex. 25 | ET-6 | 18 |
| Ex. 109 | ET-7 | 64 | Comp. Ex. 7 | ET-7 | 10 | Comp. Ex. 26 | ET-7 | 25 |
| Ex. 110 | ET-8 | 58 | Comp. Ex. 8 | ET-8 | 8 | Comp. Ex. 27 | ET-8 | 19 |
| Ex. 111 | ET-9 | 45 | Comp. Ex. 9 | ET-9 | 5 | Comp. Ex. 28 | ET-9 | 11 |
| Ex. 112 | ET-10 | 48 | Comp. Ex. 10 | ET-10 | 5 | Comp. Ex. 29 | ET-10 | 15 |
| Ex. 113 | ET-11 | 56 | Comp. Ex. 11 | ET-11 | 8 | Comp. Ex. 30 | ET-11 | 23 |
| Ex. 114 | ET-12 | 223 | Comp. Ex. 12 | ET-12 | 35 | Comp. Ex. 31 | ET-12 | 85 |
| Ex. 115 | ET-13 | 20 | Comp. Ex. 13 | ET-13 | 5 | Comp. Ex. 32 | ET-13 | 10 |
| Ex. 116 | ET-14 | 63 | Comp. Ex. 14 | ET-14 | 12 | Comp. Ex. 33 | ET-14 | 25 |
| Ex. 117 | ET-15 | 34 | Comp. Ex. 15 | ET-15 | 5 | Comp. Ex. 34 | ET-15 | 15 |
| Ex. 118 | ET-16 | 238 | Comp. Ex. 16 | ET-16 | 30 | Comp. Ex. 35 | ET-16 | 75 |
| Ex. 119 | ET-17 | 254 | Comp. Ex. 17 | ET-17 | 35 | Comp. Ex. 36 | ET-17 | 91 |
| Ex. 120 | ET-18 | 205 | Comp. Ex. 18 | ET-18 | 34 | Comp. Ex. 37 | ET-18 | 78 |
| Ex. 121 | ET-19 | 19 | Comp. Ex. 19 | ET-19 | 2 | Comp. Ex. 38 | ET-19 | 6 |
| Ex. 122 | ET-20 | 199 | Comp. Ex. 49 | ET-20 | 50 | Comp. Ex. 50 | ET-20 | 70 |
| Ex. 123 | ET-25 | 119 | Comp. Ex. 59 | ET-25 | 29 | Comp. Ex. 60 | ET-25 | 38 |
| Comp. Ex. 65 | Comparative compound-3 | 6 | | | | | | |

Examples 124 to 144

The organic EL devices were fabricated and evaluated in the same manner as in Example 1, except that BD-6 was used as the dopant material in place of BD-1, and compounds shown in Table 11 were used as materials of the first layer. The results are shown in Table 11. Note that, for comparison, the results of Comparative Examples 1 to 38, 49, 50, 59, 60, and 66 using the comparative compound 1 or 2 as the dopant material are also reproduced.

TABLE 11

| Dopant: BD-6 | | | Dopant: Comparative compound-1 | | | Dopant: Comparative compound-2 | | |
|---|---|---|---|---|---|---|---|---|
| | First layer | LT95(hr) | | First layer | LT95(hr) | | First layer | LT95(hr) |
| Ex. 124 | ET-1 | 53 | Comp. Ex. 1 | ET-1 | 10 | Comp. Ex. 20 | ET-1 | 20 |
| Ex. 125 | ET-2 | 71 | Comp. Ex. 2 | ET-2 | 10 | Comp. Ex. 21 | ET-2 | 25 |
| Ex. 126 | ET-3 | 51 | Comp. Ex. 3 | ET-3 | 6 | Comp. Ex. 22 | ET-3 | 18 |
| Ex. 127 | ET-4 | 114 | Comp. Ex. 4 | ET-4 | 15 | Comp. Ex. 23 | ET-4 | 35 |
| Ex. 128 | ET-5 | 212 | Comp. Ex. 5 | ET-5 | 25 | Comp. Ex. 24 | ET-5 | 64 |
| Ex. 129 | ET-6 | 71 | Comp. Ex. 6 | ET-6 | 10 | Comp. Ex. 25 | ET-6 | 18 |
| Ex. 130 | ET-7 | 84 | Comp. Ex. 7 | ET-7 | 10 | Comp. Ex. 26 | ET-7 | 25 |
| Ex. 131 | ET-8 | 69 | Comp. Ex. 8 | ET-8 | 8 | Comp. Ex. 27 | ET-8 | 19 |
| Ex. 132 | ET-9 | 36 | Comp. Ex. 9 | ET-9 | 5 | Comp. Ex. 28 | ET-9 | 11 |
| Ex. 133 | ET-10 | 43 | Comp. Ex. 10 | ET-10 | 5 | Comp. Ex. 29 | ET-10 | 15 |
| Ex. 134 | ET-11 | 89 | Comp. Ex. 11 | ET-11 | 8 | Comp. Ex. 30 | ET-11 | 23 |
| Ex. 135 | ET-12 | 240 | Comp. Ex. 12 | ET-12 | 35 | Comp. Ex. 31 | ET-12 | 85 |
| Ex. 136 | ET-13 | 27 | Comp. Ex. 13 | ET-13 | 5 | Comp. Ex. 32 | ET-13 | 10 |
| Ex. 137 | ET-14 | 75 | Comp. Ex. 14 | ET-14 | 12 | Comp. Ex. 33 | ET-14 | 25 |
| Ex. 138 | ET-15 | 44 | Comp. Ex. 15 | ET-15 | 5 | Comp. Ex. 34 | ET-15 | 15 |
| Ex. 139 | ET-16 | 261 | Comp. Ex. 16 | ET-16 | 30 | Comp. Ex. 35 | ET-16 | 75 |
| Ex. 140 | ET-17 | 221 | Comp. Ex. 17 | ET-17 | 35 | Comp. Ex. 36 | ET-17 | 91 |
| Ex. 141 | ET-18 | 196 | Comp. Ex. 18 | ET-18 | 34 | Comp. Ex. 37 | ET-18 | 78 |
| Ex. 142 | ET-19 | 23 | Comp. Ex. 19 | ET-19 | 2 | Comp. Ex. 38 | ET-19 | 6 |
| Ex. 143 | ET-20 | 297 | Comp. Ex. 49 | ET-20 | 50 | Comp. Ex. 50 | ET-20 | 70 |
| Ex. 144 | ET-25 | 214 | Comp. Ex. 59 | ET-25 | 29 | Comp. Ex. 60 | ET-25 | 38 |
| Comp. Ex. 66 | Comparative compound-3 | 5 | | | | | | |

Examples 145 to 165

The organic EL devices were fabricated and evaluated in the same manner as in Example 1, except that BD-7 was used as the dopant material in place of BD-1, and compounds shown in Table 12 were used as materials of the first layer. The results are shown in Table 12. Note that, for comparison, the results of Comparative Examples 1 to 38, 49, 50, 59, 60, and 67 using the comparative compound 1 or 2 as the dopant material are also reproduced.

TABLE 12

| Dopant: BD-7 | | | Dopant: Comparative compound-1 | | | Dopant: Comparative compound-2 | | |
|---|---|---|---|---|---|---|---|---|
| | First layer | LT95(hr) | | First layer | LT95(hr) | | First layer | LT95(hr) |
| Ex. 145 | ET-1 | 29 | Comp. Ex. 1 | ET-1 | 10 | Comp. Ex. 20 | ET-1 | 20 |
| Ex. 146 | ET-2 | 48 | Comp. Ex. 2 | ET-2 | 10 | Comp. Ex. 21 | ET-2 | 25 |
| Ex. 147 | ET-3 | 27 | Comp. Ex. 3 | ET-3 | 6 | Comp. Ex. 22 | ET-3 | 18 |
| Ex. 148 | ET-4 | 68 | Comp. Ex. 4 | ET-4 | 15 | Comp. Ex. 23 | ET-4 | 35 |
| Ex. 149 | ET-5 | 83 | Comp. Ex. 5 | ET-5 | 25 | Comp. Ex. 24 | ET-5 | 64 |
| Ex. 150 | ET-6 | 38 | Comp. Ex. 6 | ET-6 | 10 | Comp. Ex. 25 | ET-6 | 18 |
| Ex. 151 | ET-7 | 37 | Comp. Ex. 7 | ET-7 | 10 | Comp. Ex. 26 | ET-7 | 25 |
| Ex. 152 | ET-8 | 31 | Comp. Ex. 8 | ET-8 | 8 | Comp. Ex. 27 | ET-8 | 19 |
| Ex. 153 | ET-9 | 22 | Comp. Ex. 9 | ET-9 | 5 | Comp. Ex. 28 | ET-9 | 11 |
| Ex. 154 | ET-10 | 26 | Comp. Ex. 10 | ET-10 | 5 | Comp. Ex. 29 | ET-10 | 15 |
| Ex. 155 | ET-11 | 44 | Comp. Ex. 11 | ET-11 | 8 | Comp. Ex. 30 | ET-11 | 23 |
| Ex. 156 | ET-12 | 133 | Comp. Ex. 12 | ET-12 | 35 | Comp. Ex. 31 | ET-12 | 85 |
| Ex. 157 | ET-13 | 21 | Comp. Ex. 13 | ET-13 | 5 | Comp. Ex. 32 | ET-13 | 10 |
| Ex. 158 | ET-14 | 49 | Comp. Ex. 14 | ET-14 | 12 | Comp. Ex. 33 | ET-14 | 25 |
| Ex. 159 | ET-15 | 24 | Comp. Ex. 15 | ET-15 | 5 | Comp. Ex. 34 | ET-15 | 15 |
| Ex. 160 | ET-16 | 124 | Comp. Ex. 16 | ET-16 | 30 | Comp. Ex. 35 | ET-16 | 75 |
| Ex. 161 | ET-17 | 134 | Comp. Ex. 17 | ET-17 | 35 | Comp. Ex. 36 | ET-17 | 91 |
| Ex. 162 | ET-18 | 115 | Comp. Ex. 18 | ET-18 | 34 | Comp. Ex. 37 | ET-18 | 78 |
| Ex. 163 | ET-19 | 11 | Comp. Ex. 19 | ET-19 | 2 | Comp. Ex. 38 | ET-19 | 6 |
| Ex. 164 | ET-20 | 144 | Comp. Ex. 49 | ET-20 | 50 | Comp. Ex. 50 | ET-20 | 70 |
| Ex. 165 | ET-25 | 96 | Comp. Ex. 59 | ET-25 | 29 | Comp. Ex. 60 | ET-25 | 38 |
| Comp. Ex. 67 | Comparative compound-3 | 4 | | | | | | |

From the results in Tables 1 to 12, it can be seen that the organic EL devices of Examples, which contain a specific dopant material in the emitting layer and a specific material in the electron-transporting layer, has a long lifetime.

Synthesis of Compounds

Synthesis Example 1: Synthesis of Compound BD-1

BD-1 was synthesized in accordance with the synthetic route described below.

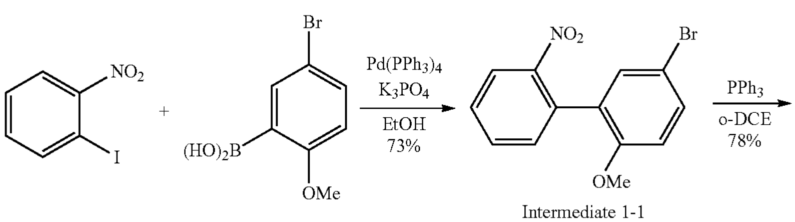

Intermediate 1-1

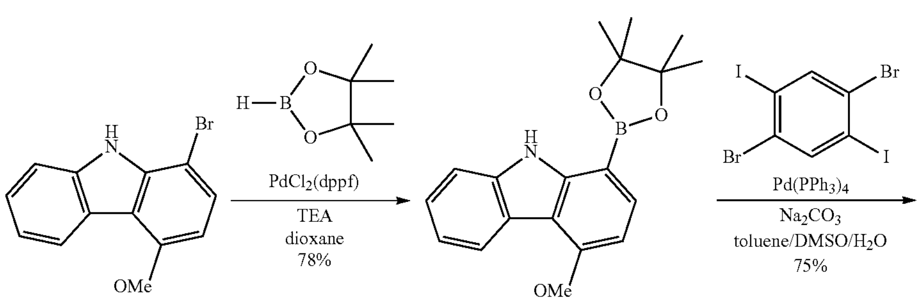

Intermediate 1-2

Intermediate 1-3

-continued

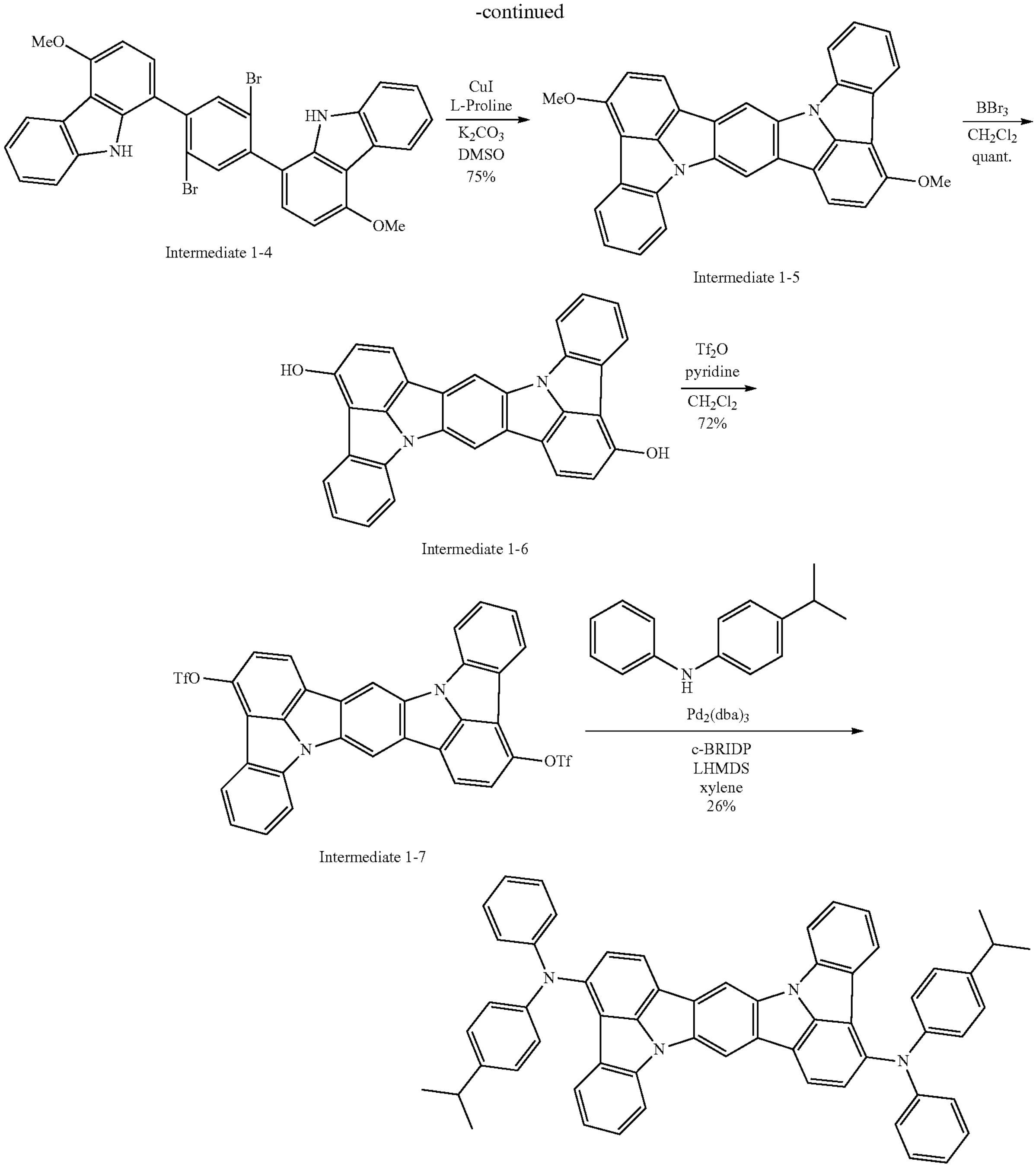

Synthesis of Intermediate 1-1

Under an argon atmosphere, 2-iodonitrobenzene (9.7 g, 39 mmol), 5-bromo-2-methoxyphenylboronic acid (9.2 g, 40 mmol), tetrakis(triphenylphosphine)palladium(0) (Pd $(PPh_3)_4$, 1.1 g, 0.975 mmol), and $K_3PO_4$ (21 g, 97 mmol) were dissolved in ethanol (95 mL), followed by reflux for 8 hours. After completion of the reaction, the solvent was concentrated and the residue was purified by column chromatography to obtain a yellow solid (8.8 g, yield: 73%). The obtained solid was intermediate 1-1, which was an intended product, and the result of mass spectrometric analysis was: m/e=308 for the molecular weight of 308.

Synthesis of Intermediate 1-2

Intermediate 1-1 (7.00 g, 22.7 mmol) was dissolved in o-dichlorobenzene (80 mL), and triphenylphosphine (14.9 g, 56.8 mmol) was added thereto, followed by reflux for 12 hours. After completion of the reaction, the solvent was concentrated, and the residue was purified by column chromatography to obtain a white solid (5.7 g, yield: 78%). The obtained solid was intermediate 1-2, which was an intended product, and the result of mass spectrometric analysis was: m/e=276 for the molecular weight of 276.

Synthesis of Intermediate 1-3

Under an argon atmosphere, intermediate 1-2 (5.7 g, 21 mmol), pinacol borane (7.9 g, 62 mmol), dichloro[1,1'-bis (diphenylphosphino)ferrooene]palladium ($PdCl_2$(dppf), 1.46 g, 2.0 mmol) was dissolved in dioxane (250 mL), and triethylamine (11.5 mL, 83 mmol) was added thereto, followed by reflux for 5 hours. After completion of the reaction, the solvent was concentrated and the residue was purified by column chromatography to obtain a yellow solid (5.0 g, yield: 75%). The obtained solid was intermediate 1-3, which was an intended product, and the result of mass spectrometric analysis was: m/e=323 for the molecular weight of 323.

Synthesis of Intermediate 1-4

Under an argon atmosphere, dibromodiiodobenzene (2.5 g, 5.1 mmol), intermediate 1-3 (4.97 g, 15.4 mmol), and tetrakis(triphenylphosphine)palladium(0) ($Pd(PPh_3)_4$, 237 mg, 0.205 mmol) were dissolved in toluene (250 mL) and dimethylsulfoxide (50 mL), and a 2M aqueous solution of $Na_2CO_3$ (13 mL) was added thereto, followed by heating with stirring at 90° C. for 24 hours. After completion of the reaction, toluene was removed under reduced pressure, and precipitated solids were collected by filtration. The solids were washed with methanol and ethyl acetate to obtain a white solid (2.5 g, yield: 75%). The obtained solid was intermediate 1-4, which was an intended product, and the result of mass spectrometric analysis was: m/e=626 for the molecular weight of 626.

Synthesis of Intermediate 1-5

Under an argon atmosphere, intermediate 1-4 (2.5 g, 3.99 mmol), CuI (76 mg, 0.40 mmol), L-proline (92 mg, 0.80 mmol), and $K_2CO_3$ (1.38 g, 10 mmol) were suspended in dimethylsulfoxide (80 mL), followed by heating with stirring at 150° C. for 6 hours. After completion of the reaction, precipitated solids were collected by filtration. The solids were washed with methanol and ethyl acetate to obtain a brown solid (1.4 g, yield: 75%). The obtained solid was compound 1-5, which was an intended product, and the result of mass spectrometric analysis was: m/e=464 for the molecular weight of 465.

Synthesis of Intermediate 1-6

Intermediate 1-5 (1.4 g, 3.0 mmol) was dissolved in dichloromethane (150 mL) and a 1M $BBr_3$ solution in dichloromethane (15 mL, 15 mmol) was added thereto, followed by reflux for 8 hours. After completion of the reaction, ice water (50 mL) was added thereto, and precipitates were collected by filtration. The precipitates were washed with methanol to obtain a white solid (1.4 g). The obtained solid was intermediate 1-6, which was an intended product, and the result of mass spectrometric analysis was: m/e=436 for the molecular weight of 437.

Synthesis of Intermediate 1-7

Intermediate 1-6 (1.4 g, 3.2 mmol) was suspended in dichloromethane (75 mL) and pyridine (75 mL), and anhydrous triflate (3.8 mL, 22.5 mmol) was added thereto, followed by stirring at room temperature for 8 hours. After completion of the reaction, water (50 mL) was added thereto and precipitates were collected by filtration. The precipitates were washed with methanol and ethyl acetate to obtain a white solid (1.8 g, yield: 72%). The obtained solid was intermediate 1-7, which was an intended product, and the result of mass spectrometric analysis was: m/e=700 for the molecular weight of 701.

Synthesis of BD-1

Under an argon atmosphere, intermediate 1-7 (1.00 g, 1.43 mmol), 4-iPr-N-phenylaniline (754 mg, 3.57 mmol), tris(dibenzylideneacetone)dipalladium(0) ($Pd_2(dba)_3$, 26 mg, 0.029 mmol), and di-tert-butyl(1-methyl-2,2-diphenylcyclopropylphosphine (40 mg, 0.11 mmol) were dissolved in xylene (120 mL), and 1M lithium bis(trimethylsilyl) amide solution in tetrahydrofuran (3.6 mL, 3.6 mmol) was added thereto, followed by reflux for 8 hours. After completion of the reaction, the reaction solution was subjected to celite filtration, followed by distillation of the solvent. The solid obtained was purified by column chromatography to obtain a yellow solid (300 mg, yield: 26%). The obtained solid was BD-1, which was an intended product, and the result of mass spectrometric analysis was: m/e=823 for the molecular weight of 823.

Synthesis Example 2: Synthesis of Compound BD-2

BD-2 was synthesized in accordance with the synthetic route described below.

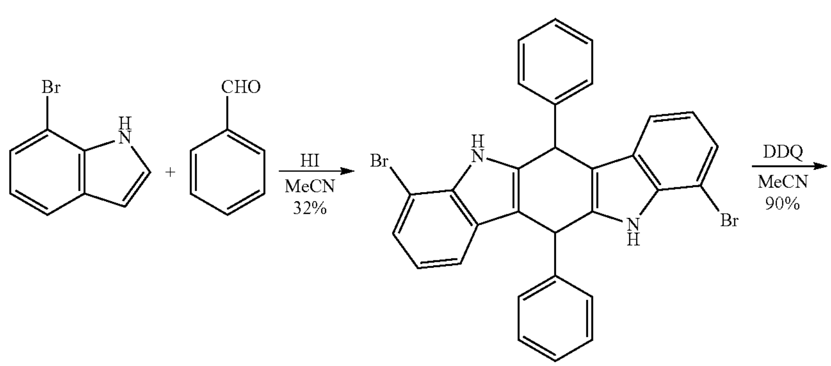

Intermediate 2-1

-continued
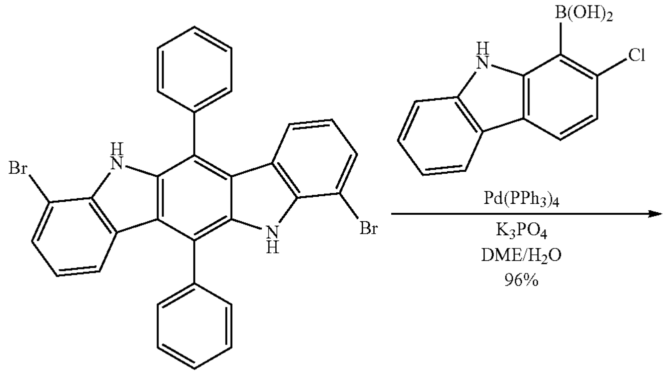
Intermediate 2-2
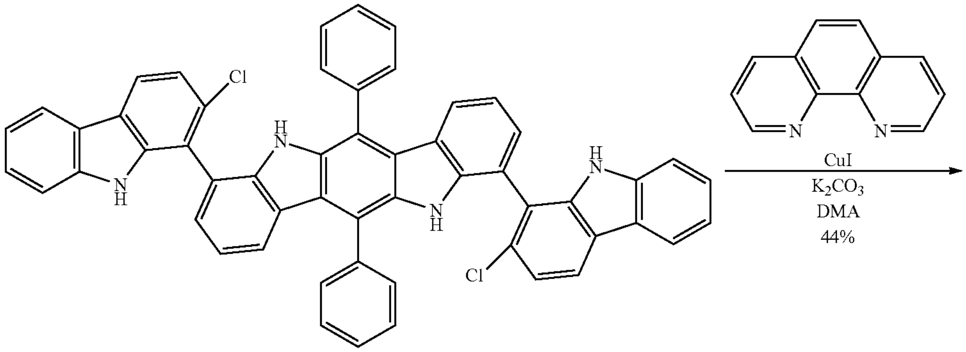
Intermediate 2-3
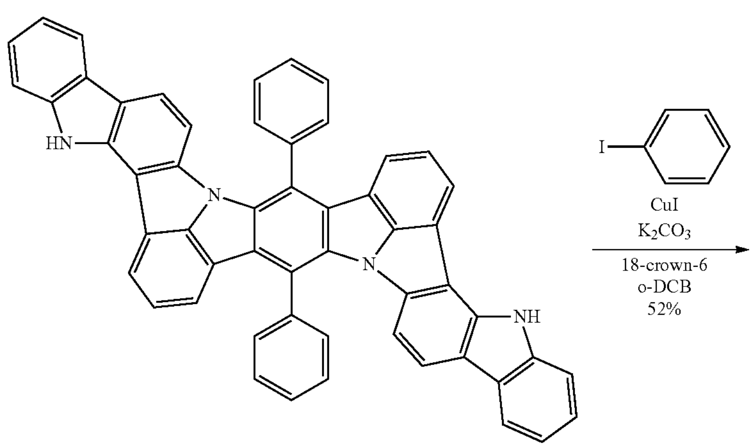
Intermediate 2-4

-continued

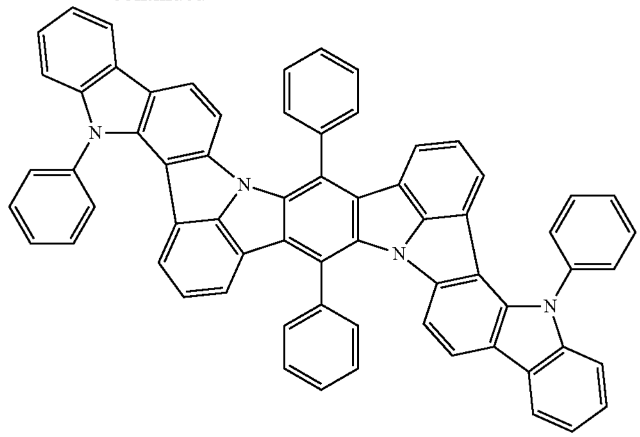

BD-2

Synthesis of Intermediate 2-1

7-bromo-1H-indole (10.0 g, 51.0 mmol) was dissolved in acetonitrile (200 mL), and benzaldehyde (5.41 g, 51.0 mmol) and 57% hydroiodic acid (2 mL) were added to the resulting solution, followed by stirring at 80° C. for 8 hours. After completion of the reaction, precipitated solids were collected by filtration, followed by washing with acetonitrile to obtain a light yellow solid (4.60 g, yield: 32%). The obtained solid was intermediate 2-1, which was an intended product, and the result of mass spectrometric analysis was: m/e=569 for the molecular weight of 568.

Synthesis of Intermediate 2-2

Intermediate 2-1 (4.5 g, 7.92 mmol) was suspended in acetonitrile (200 mL), and 2,3-dichloro-5,6-dicyano-p-benzoquinone (4.49 g, 19.8 mmol) was added thereto, followed by stirring at 80° C. for 16 hours. After completion of the reaction, solids were collected by filtration, and washed with acetonitrile to obtain a yellow solid (4.02 g, yield: 90%). The obtained solid was intermediate 2-2, which was an intended product, and the result of mass spectrometric analysis was: m/e=566 for the molecular weight of 566.

Synthesis of Intermediate 2-3

Under an argon atmosphere, 1,2-dimethoxyethane (80 mL) and water (20 mL) were added to a mixture of intermediate 2-2 (3.50 g, 6.18 mmol), 2-chloro-9H-carbazolylboronic acid (4.55 g, 18.5 mmol), tetrakis(triphenylphosphine)palladium(0) ($Pd(PPh_3)_4$, 970 mg, 0.839 mmol), and $K_3PO_4$ (7.87 g, 37.1 mmol), followed by stirring at 80° C. for 12 hours. After completion of the reaction, an organic phase was concentrated and solids were collected by filtration. The resulting solids were purified by column chromatography to obtain a yellow solid (4.82 g, yield: 96%). The obtained solid was intermediate 2-3, which was an intended product, and the result of mass spectrometric analysis was: m/e=806 for the molecular weight of 808.

Synthesis of Intermediate 2-4

Under an argon atmosphere, intermediates 2-3 (4.00 g, 4.95 mmol), iodide copper(I) (566 mg, 2.97 mmol), 1,10-phenanthroline (535 mg, 2.97 mmol), and $K_2CO_3$ (2.74 g, 19.8 mmol) were suspended in N,N-dimethylacetamide (80 mL), followed by heating with stirring at 160° C. for 8 hours. After completion of the reaction, water was added thereto, and precipitates were collected by filtration. The resulting precipitates were purified by column chromatography to obtain a yellow solid (1.62 g, yield: 44%). The obtained solid was intermediate 2-4, which was an intended product, and the result of mass spectrometric analysis was: m/e=735 for the molecular weight of 735.

Synthesis of BD-2

Under an argon atmosphere, intermediate 2-4 (1.00 g, 4.95 mmol), copper powder (346 mg, 5.44 mmol), $K_2CO_3$ (1.5 g, 10.9 mmol), and 18-crown-6-ether (144 mg, 0.544 mmol) were suspended in o-dichlorobenzene (10 mL), followed by heating with stirring at 170° C. for 12 hours. After completion of the reaction, precipitates were collected by filtration, followed by short pass column chromatography. The solvent was distilled off to obtain a yellow solid (630 mg, yield: 52%). The obtained solid was BD-2, which was an intended product, and the result of mass spectrometric analysis was: m/e=888 for the molecular weight of 887.

Synthesis Example 3: Synthesis of Compound BD-3

BD-3 was synthesized in accordance with the synthetic route described below.

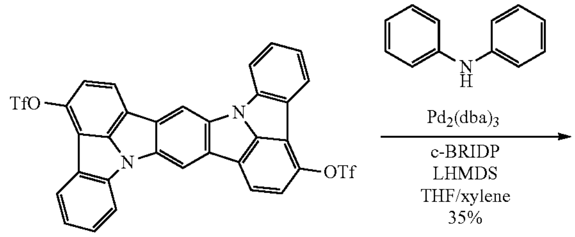

Intermediate 1-7

-continued

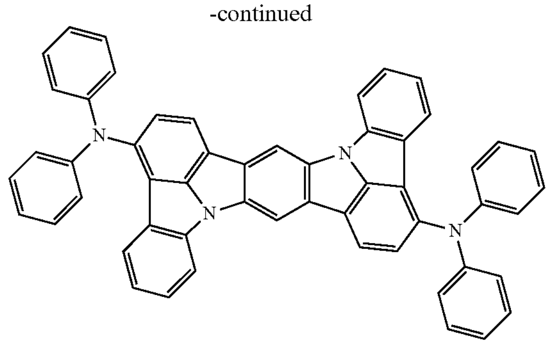

BD-3

Synthesis of BD-3

Under an argon atmosphere, intermediates 1-7 (0.70 g, 1.00 mmol), diphenylamine (0.420 g, 2.50 mmol), tris (dibenzylideneacetone) dipalladium(0) ($Pd_2(dba)_3$, 21 mg, 0.020 mmol), and di-tert-butyl(1-methyl-2,2-diphenylcyclopropy)phosphine (c-BRIDP, 28 mg, 0.08 mmol) were dissolved in xylene (85 mL), and 1M lithium bis(trimethylsilyl) amide (LHMDS) solution in tetrahydrofuran (2.5 mL, 2.5 mmol) was added thereto, followed by reflux for 8 hours. After completion of the reaction, the reaction solution was subjected to celite filtration, followed by distillation of the solvent. The resulting solids were purified by column chromatography to obtain a yellow solid (259 mg, yield: 35%). The obtained solid was BD-3, which was an intended product, and the result of mass spectrometric analysis was: m/e=738 for the molecular weight of 739.

Synthesis Example 4: Synthesis of Compound BD-4

BD-4 was synthesized in accordance with the synthetic route described below.

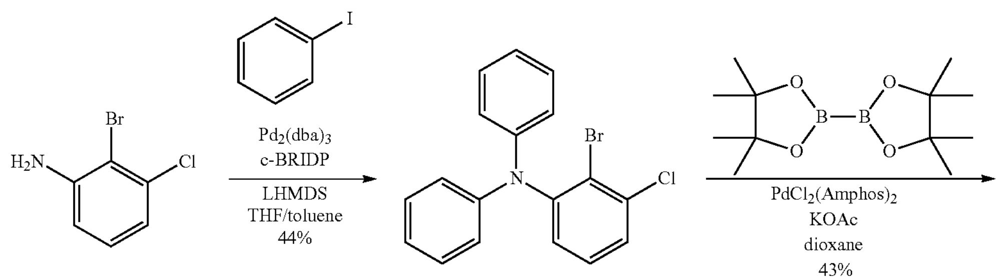

Intermediate 4-1

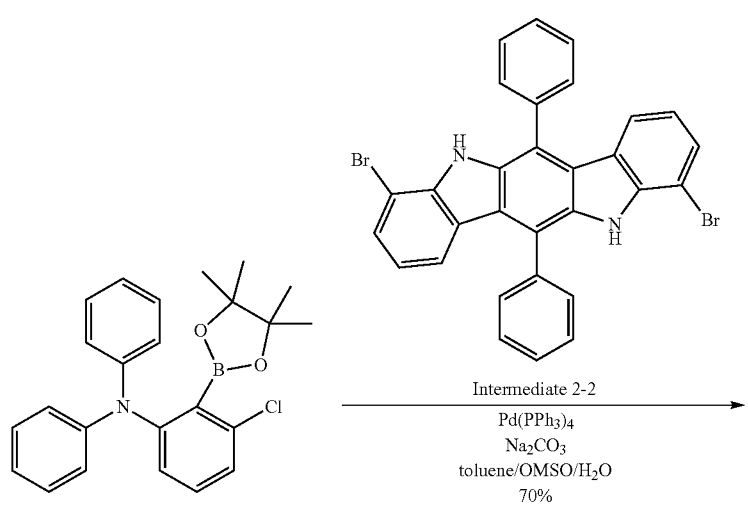

Intermediate 4-2

-continued

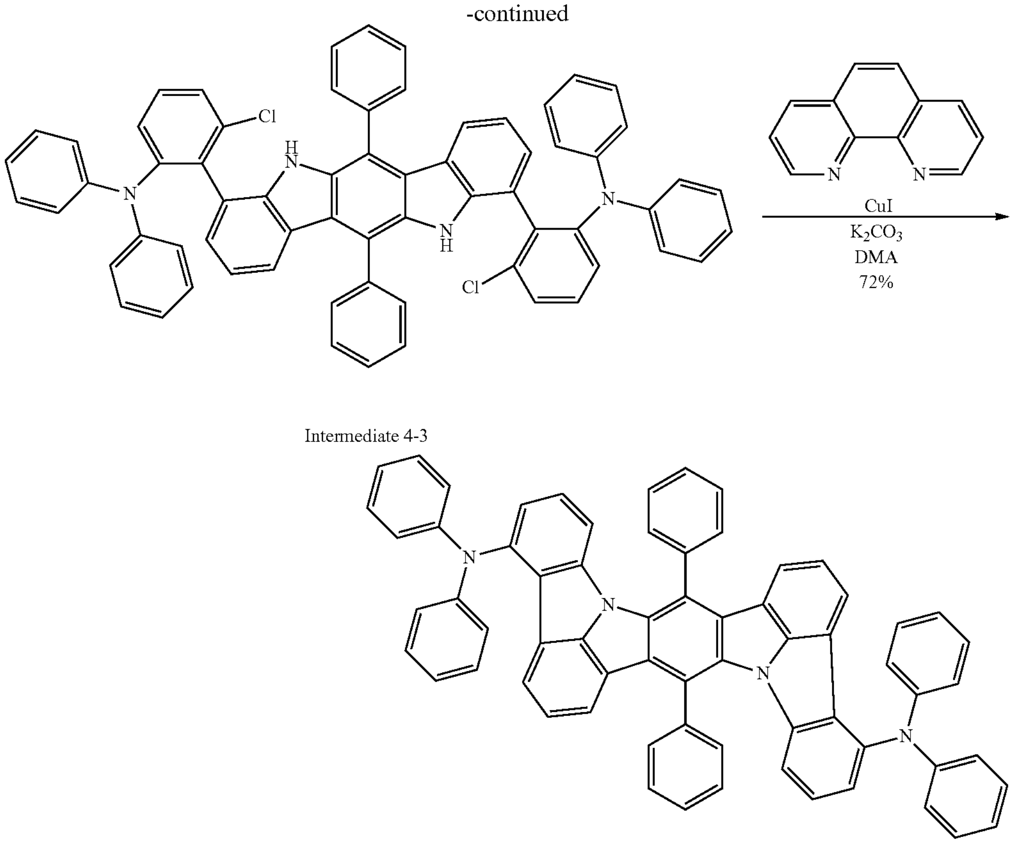

Synthesis of Intermediate 4-1

Under an argon atmosphere, 2-bromo-3-chloroaniline (6.19 g, 30.0 mmol), iodobenzene (13.5 g, 66.0 mmol), tris(dibenzylideneaoetone)dipalladium(0) ($Pd_2(dba)_3$, 1.37 g, 1.50 mmol), and di-tert-butyl(1-methyl-2,2-diphenylcyclopropyl)phosphine (2.12 g, 6.00 mmol) were suspended in toluene (1500 mL), followed by heating with stirring at 80° C. for 30 minutes. A 1 M lithium bis(trimethylsilyl)amide solution in tetrahydrofuran (75.0 mL, 75.0 mmol) was added dropwise to the reaction mixture, followed by heating with stirring at 110° C. for 6 hours. After completion of the reaction, the residue obtained by subjecting to celite filtration and concentration was purified by silica gel column chromatography to obtain a white solid (4.73 g, yield: 44%). The obtained solid was intermediate 4-1, which was an intended product, and the result of mass spectrometric analysis was: m/e=359 for the molecular weight of 359.

Synthesis of Intermediate 4-2

Under an argon atmosphere, intermediate 4-1 (4.66 g, 13.0 mmol), bis(pinacolato)diboron (3.63 g, 14.3 mmol), bis[di-(tert-butyl(4-dimethylaminophenyl)phosphine]dichloropalladium ($PdCl_2(Amphos)_2$, 276 mg, 0.39 mmol), and potassium acetate (3.83 g, 39 mmol) were suspended in dioxane (52 mL), followed by reflux for 8 hours. After completion of the reaction, the reaction mixture was subjected to short-pass silica gel column chromatography to distill off the solvent. The resulting solid was washed with methanol to obtain a white solid (2.27 g, yield: 43%). The obtained solid was intermediate 4-2, which was an intended product, and the result of mass spectrometric analysis was: m/e=405 for the molecular weight of 406.

Synthesis of Intermediate 4-3

Under an argon atmosphere, intermediate 2-2 (1.02 g, 1.80 mmol), intermediate 4-2 (2.19 g, 5.40 mmol), and tetrakis(triphenylphosphine)palladium(0) ($Pd(PPh_3)_4$, 208 mg, 0.18 mmol) were dissolved in toluene (50 mL) and dimethylsulfoxide (100 mL), and a 2M aqueous solution of $Na_2CO_3$ (27 mL) was added thereto, followed by heating with stirring at 100° C. for 6 hours. After completion of the reaction, the solvent of the suspension was concentrated by short-pass silica gel column chromatography. The resulting residue was washed with ethyl acetate and then washed with toluene to obtain a yellow solid (1.21 g, yield: 70%). The obtained solid was intermediate 4-3, which was an intended product, and the result of mass spectrometric analysis was: m/e=962 for the molecular weight of 964.

Synthesis of BD-4

Under an argon atmosphere, intermediate 4-3 (1.16 g, 1.20 mmol), iodide copper(I) (0.27 g, 1.44 mmol), 1,10-phenanthroline (0.26 g, 1.44 mmol), $K_2CO_3$ (1.33 g, 9.6 mmol) were suspended in N,N-dimethylacetamide (220 mL), followed by heating with stirring at 120° C. for 15 hours. After completion of the reaction, the solvent of the suspension was concentrated by short-pass silica gel column chromatography. The resulting residue was recrystallized with chlorobenzene, washed with toluene and then washed with methanol to obtain a yellow solid (0.77 g, yield: 72%). The obtained solid was BD-4, which was an intended product, and the result of mass spectrometric analysis was: m/e=890 for the molecular weight of 891.

Synthesis Example 5: Synthesis of Compound BD-5
BD-5 was synthesized in accordance with the synthetic route described below.
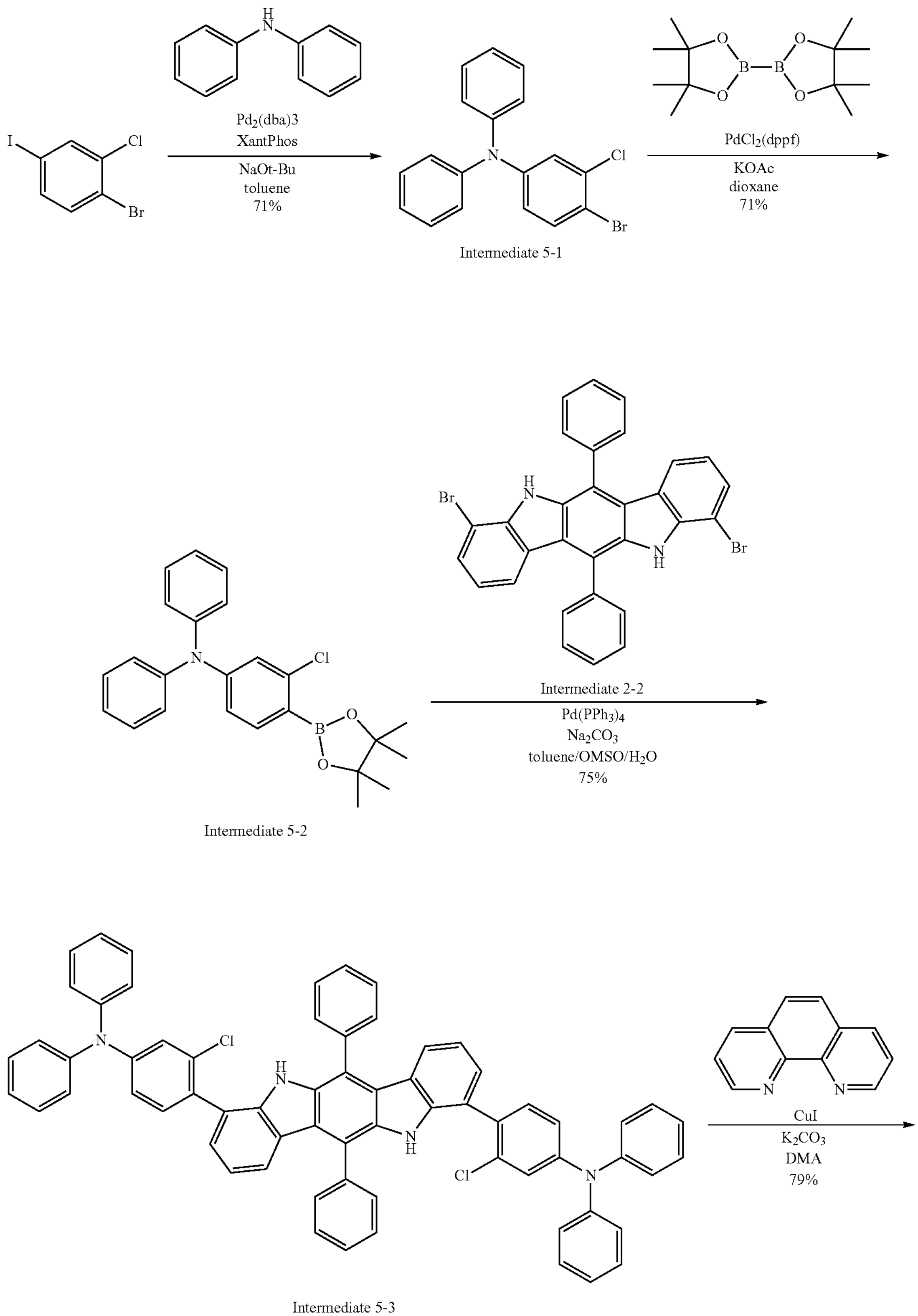

-continued

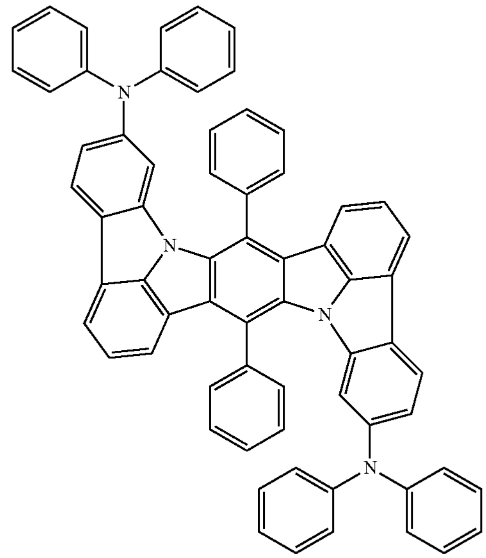

BD-5

Synthesis of Intermediate 5-1

Under an argon atmosphere, 1-bromo-2-chloro-4-iodobenzene (17.0 g, 53.6 mmol), diphenylamine (9.07 g, 53.6 mmol), tris(dibenzylideneacetone)dipalladium(0) ($Pd_2(dba)_3$, 981 mg, 1.07 mmol), 4,5'-bis(diphenylphosphino)-9,9'-dimethylxantene (XantPhos, 1.24 g, 2.14 mmol), and NaOt-Bu (5.15 g, 53.6 mmol) were refluxed in toluene (500 mL) for 8 hours. After completion of the reaction, the reaction solution was subjected to celite filtration, followed by concentration. The resulting residue was purified by silica gel column chromatography to obtain a white solid (13.6 g, yield: 71%). The obtained solid was intermediate 5-1, which was an intended product, and the result of mass spectrometric analysis was: m/e=359 for the molecular weight of 359.

Synthesis of Intermediate 5-2

Under an argon atmosphere, intermediate 5-1 (13.6 g, 38.0 mmol), bis(pinacolato)diboron (19.3 g, 76.0 mmol), dichloro[1,1'-bis(diphenylphosphino)ferrocene]palladium ($PdCl_2$(dppf), 557 mg, 0.761 mmol), and potassium acetate (7.46 g, 76 mmol) were suspended in dioxane (400 mL), followed by reflux for 7 hours. After completion of the reaction, the solvent of the suspension was concentrated by short-pass silica gel column chromatography. The resulting solids were washed with methanol to obtain a white solid (11.0 g, yield: 71%). The obtained solid was intermediate 5-2, which was an intended product, and the result of mass spectrometric analysis was: m/e=405 for the molecular weight of 406.

Synthesis of Intermediate 5-3

Under an argon atmosphere, intermediate 2-2 (5.00 g, 8.83 mmol), intermediate 5-2 (10.8 g, 26.5 mmol), and tetrakis(triphenylphosphine)palladium(0) ($Pd(PPh_3)_4$, 1.02 g, 0.883 mmol) were dissolved in toluene (250 mL) and dimethylsulfoxide (500 mL), and a 2M aqueous solution of $Na_2CO_3$ (130 mL) was added thereto, followed by heating with stirring at 100° C. for 6 hours. After completion of the reaction, the solvent of the suspension was concentrated by short-pass silica gel column chromatography. The resulting residue was washed with ethyl acetate and then washed with toluene to obtain a yellow solid (6.39 g, yield: 75%). The obtained solid was intermediate 5-3, which was an intended product, and the result of mass spectrometric analysis was: m/e=962 for the molecular weight of 964.

Synthesis of BD-5

Under an argon atmosphere, intermediates 5-3 (6.24 g, 6.47 mmol), iodide copper(I) (1.48 g, 7.77 30 mmol), 1,10-phenanthroline (1.40 g, 7.77 mmol), $K_2CO_3$ (7.16 g, 51.8 mmol) were suspended in N,N-dimethylacetamide (1.2 L), followed by heating with stirring at 120° C. for 15 hours. After completion of the reaction, the solvent of the suspension was concentrated by short-pass silica gel column chromatography. The resulting residue was recrystallized with chlorobenzene, washed with toluene and then washed with methanol to obtain a yellow solid (4.54 g, yield: 79%). The obtained solid was BD-5, which was an intended product, and the result of mass spectrometric analysis was: m/e=890 for the molecular weight of 891.

Synthesis Example 6: Synthesis of Compound BD-6
BD-6 was synthesized in accordance with the synthetic route described below.
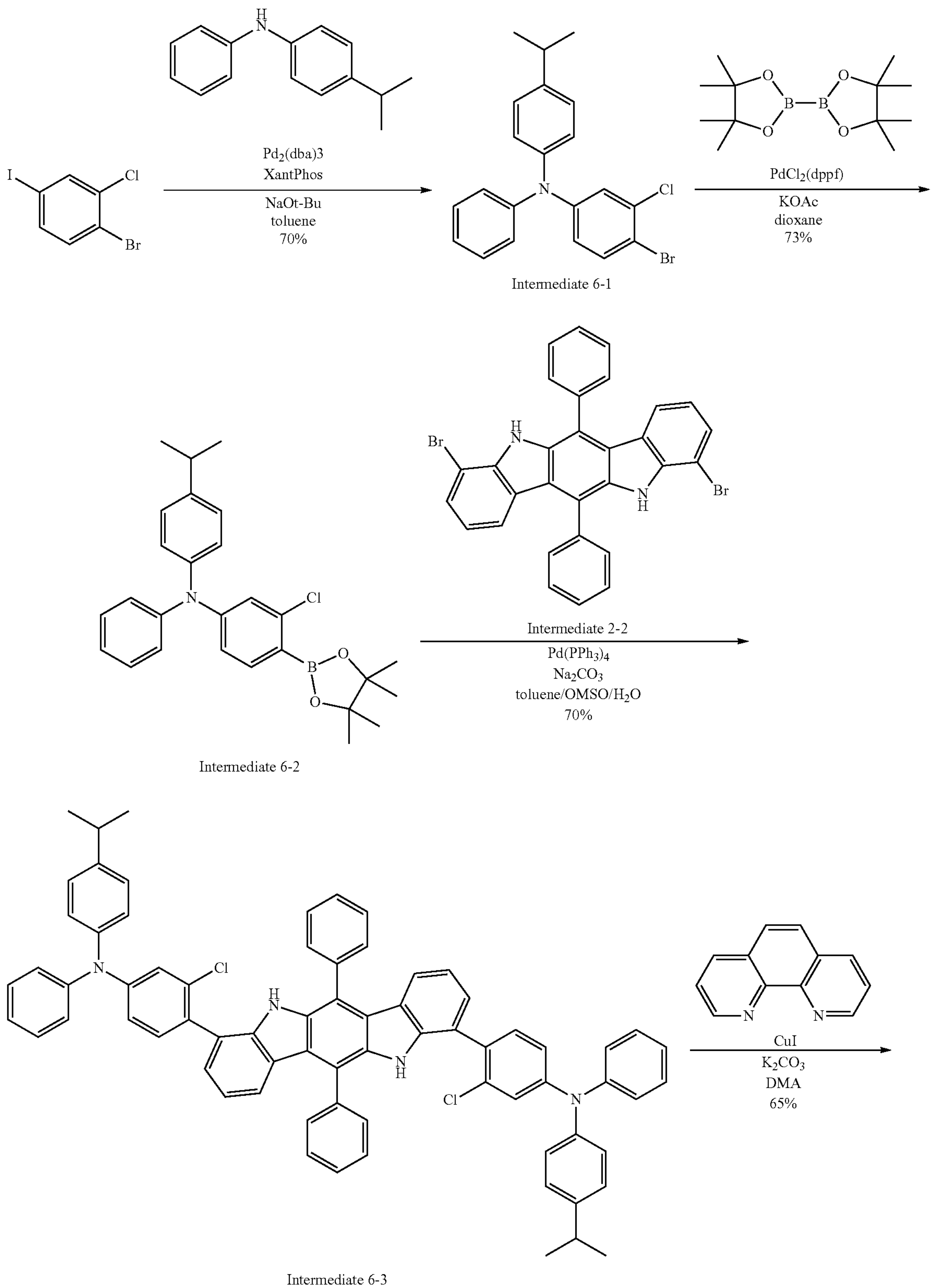

-continued

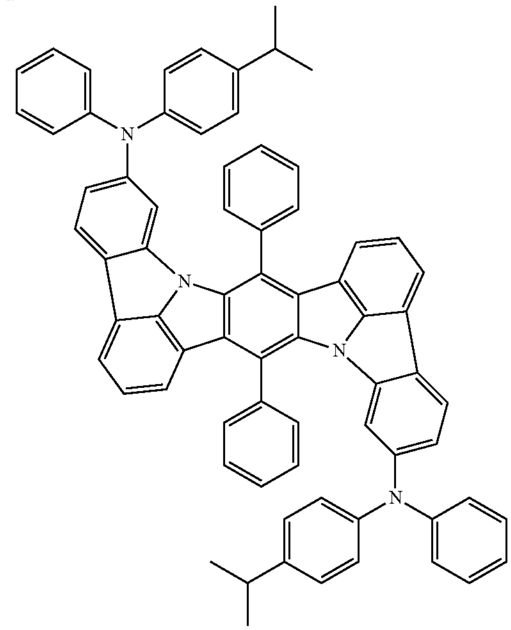

BD-6

Synthesis of Intermediate 6-1

Under an argon atmosphere, 1-bromo-2-chloro-4-iodo benzene (17.0 g, 53.6 mmol), 4-isopropyl-N-phenylaniline (11.3 g, 53.6 mmol), tris(dibenzylideneacetone)dipalladium (0) ($Pd_2(dba)_3$, 981 mg, 1.07 mmol), 4,5'-bis(diphenylphosphino)-9,9'-dimethylxanthene (XantPhos, 1.24 g, 2.14 mmol), and NaOt-Bu (5.15 g, 53.6 mmol) were refluxed in toluene (500 mL) for 8 hours. After completion of the reaction, the reaction solution was subjected to celite filtration, followed by concentration. The resulting residue was purified by silica gel column chromatography to obtain a white solid (15.0 g, yield: 70%). The obtained solid was intermediate 6-1, which was an intended product, and the result of mass spectrometric analysis was: m/e=401 for the molecular weight of 401.

Synthesis of Intermediate 6-2

Under an argon atmosphere, intermediate 6-1 (15.0 g, 37.5 mmol), bis(pinacolato)diboron (19.1 g, 75.0 mmol), dichloro[1,1'-bis(diphenylphosphino)ferrocene]palladium ($PdCl_2$(dppf), 550 mg, 0.75 mmol), and potassium acetate (7.36 g, 75 mmol) were suspended in dioxane (400 mL), followed by reflux for 7 hours. After completion of the reaction, the solvent of the suspension was concentrated by short-pass silica gel column chromatography. The resulting solids were washed with methanol to obtain a white solid (12.3 g, yield: 73%). The obtained solid was intermediate 6-2, which was an intended product, and the result of mass spectrometric analysis was: m/e=447 for the molecular weight of 448.

Synthesis of Intermediate 6-3

Under an argon atmosphere, intermediate 2-2 (5.10 g, 9.00 mmol), intermediate 6-2 (12.1 g, 27.0 mmol), and tetrakis(triphenylphosphine)palladium(0) ($Pd(PPh_3)_4$, 1.04 g, 0.90 mmol) were dissolved in toluene (250 mL) and dimethylsulfoxide (500 mL), and a 2M aqueous solution of $Na_2CO_3$ (135 mL) was added thereto, followed by heating with stirring at 100° C. for 6 hours. After completion of the reaction, the solvent of the suspension was concentrated by short-pass silica gel column chromatography. The resulting residue was washed with ethyl acetate and then washed with toluene to obtain a yellow solid (6.60 g, yield: 70%). The obtained solid was intermediate 6-3, which was an intended product, and the result of mass spectrometric analysis was: m/e=1046 for the molecular weight of 1048.

Synthesis of BD-6

Under an argon atmosphere, intermediates 6-3 (6.60 g, 6.30 mmol), iodide copper(I) (1.44 g, 7.56 mmol), 1,10-phenanthroline (1.36 g, 7.56 mmol), and $K_2CO_3$ (6.97 g, 50.4 mmol) were suspended in N,N-dimethylacetamide (1.15 L), followed by heating with stirring at 120° C. for 15 hours. After completion of the reaction, the solvent of the suspension was concentrated by short-pass silica gel column chromatography. The resulting residue was recrystallized with chlorobenzene, washed with toluene and then washed with methanol to obtain a yellow solid (3.99 g, yield: 65%). The obtained solid was BD-6, which was an intended product, and the result of mass spectrometric analysis was: m/e=974 for the molecular weight of 975.

Synthesis Example 7: Synthesis of Compound BD-7
BD-7 was synthesized in accordance with the synthetic route described below.
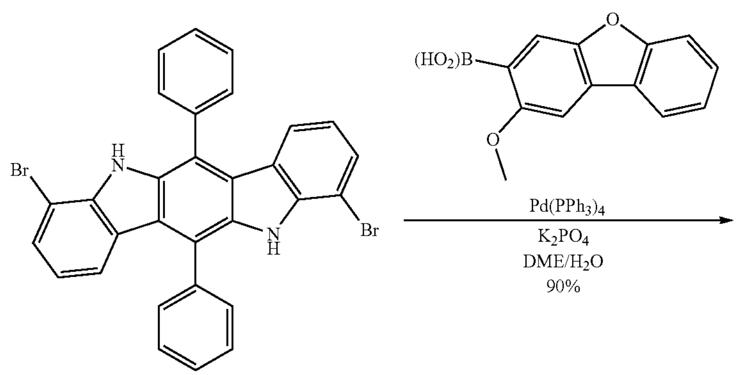
Intermediate 2-2
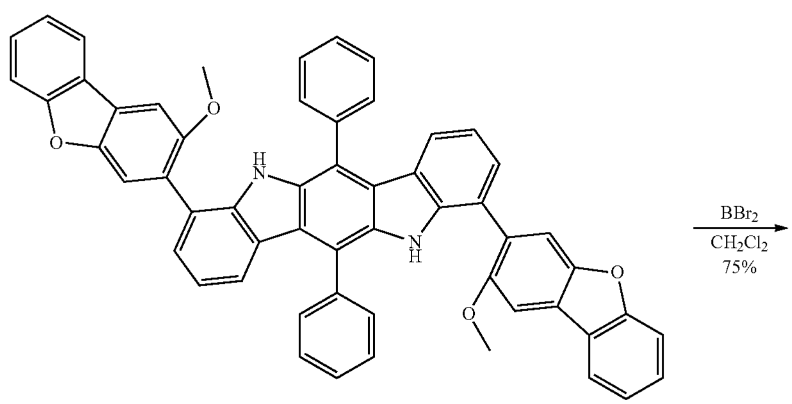
Intermediate 7-1
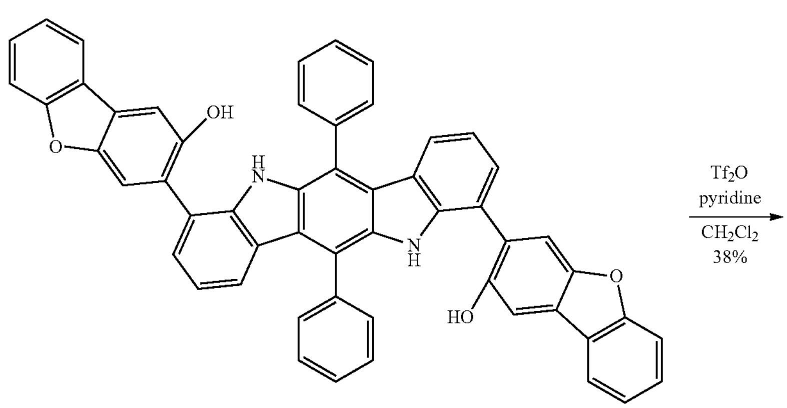
Intermediate 7-2

-continued

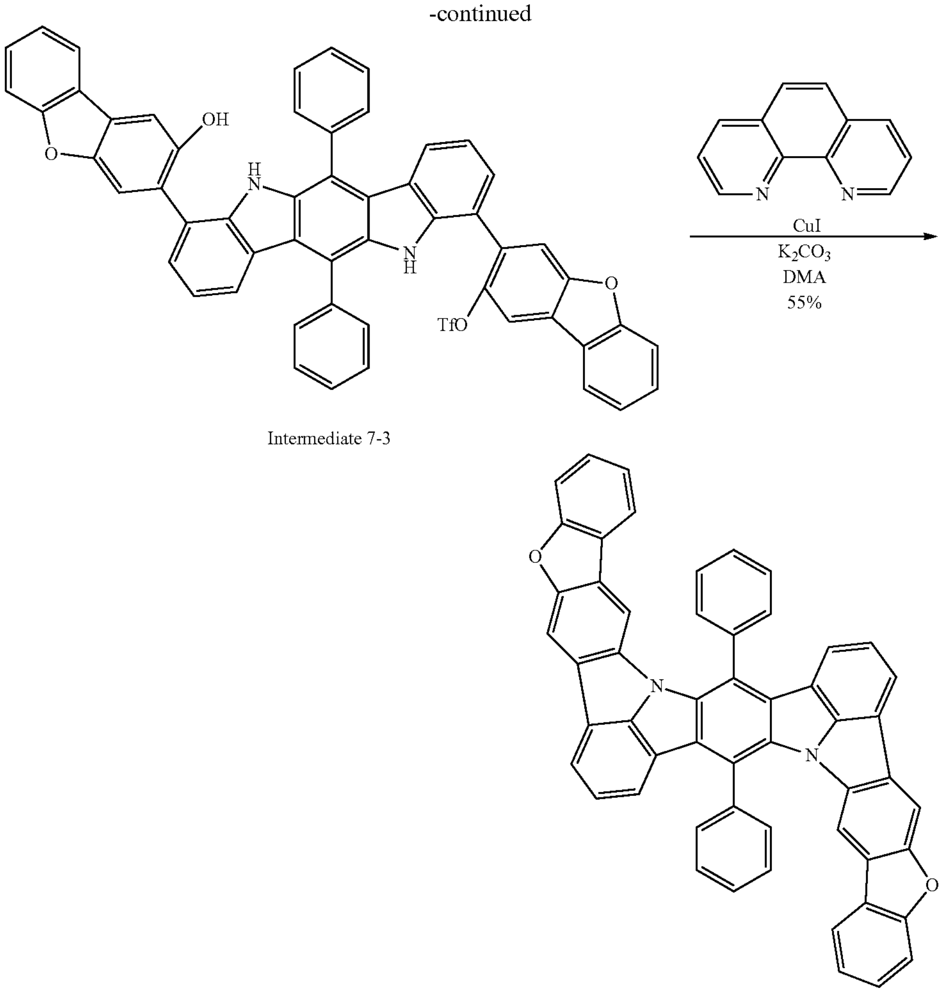

Intermediate 7-3

BD-7

Synthesis of Intermediate 7-1

Under an argon atmosphere, 1,2-dimethoxyethane (80 mL) and water (20 mL) were added to a mixture of intermediate 2-2 (3.00 g, 5.30 mmol), 2-methoxydibenzofuranyl-3-boronic acid (3.85 g, 15.9 mmol), tetrakis(triphenylphosphine)palladium(0) ($Pd(PPh_3)_4$, 918 mg, 0.795 mmol) and $K_3PO_4$ (6.74 g, 31.8 mmol), followed by stirring at 80° C. for 12 hours. After completion of the reaction, an organic phase was concentrated and solids were collected by filtration. The resulting solids were purified by column chromatography to obtain a light yellow solid (3.82 g, yield: 90%). The obtained solid was intermediate 7-1, which was an intended product, and the result of mass spectrometric analysis was: m/e=800 for the molecular weight of 801.

Synthesis of Intermediate 7-2

Under an argon atmosphere, intermediate 7-1 (3.80 g, 4.74 mmol) was dissolved in dichloromethane (100 mL), and a 1M solution of $BBr_3$ in dichloromethane (30 mL) was added thereto, followed by stirring for 24 hours. After completion of the reaction, methanol and water were added thereto, and the resulting mixture was extracted with ethyl acetate. The solvent was distilled off, and the resulting residue was purified by column chromatography to obtain a light yellow solid (2.74 g, yield: 75%). The obtained solid was intermediate 7-2, which was an intended product, and the result of mass spectrometric analysis was: m/e=772 for the molecular weight of 773.

Synthesis of Intermediate 7-3

Under an argon atmosphere, intermediate 7-2 (2.50 g, 3.24 mmol) was suspended in dichloromethane (100 mL), and pyridine (2 mL) and trifluoromethanesulfonic anhydride (2.74 g, 9.72 mmol) were added thereto, followed by stirring for 6 hours. After completion of the reaction, water was added thereto, and only an organic phase was concentrated, and precipitated solids were collected by filtration. The resulting solids were purified by column chromatography to obtain a light yellow solid (1.21 g, yield: 36%). The obtained solid was intermediate 7-3, which was an intended product, and the result of mass spectrometric analysis was: m/e=1036 for the molecular weight of 1037.

Synthesis of BD-7

Under an argon atmosphere, intermediate 7-3 (1.00 g, 0.963 mmol), iodide copper(I) (92 mg, 0.482 mmol), 1,10-phenanthroline (87 mg, 0.482 mmol), and $K_2CO_3$ (532 mg, 3.85 mmol) were suspended in N,N-dimethylacetamide (20 mL), followed by heating with stirring at 160° C. for 8 hours. After completion of the reaction, water was added thereto, and precipitates were collected by filtration. The resulting precipitates were purified by column chromatography to obtain a yellow solid (390 mg, yield: 55%). The obtained solid was BD-7, which was an intended product, and the result of mass spectrometric analysis was: m/e=736 for the molecular weight of 737.

Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, many of these modifications are within the scope of the invention.

The invention claimed is:

1. An organic electroluminescence device comprising:
a cathode;
an anode; and
an organic layer disposed between the cathode and the anode, wherein
the organic layer comprises an emitting layer and a first layer;
the first layer is disposed between the cathode and the emitting layer;
the emitting layer comprises a compound represented by the following formula (A1); and
the first layer comprises a compound represented by the following formula (B1):

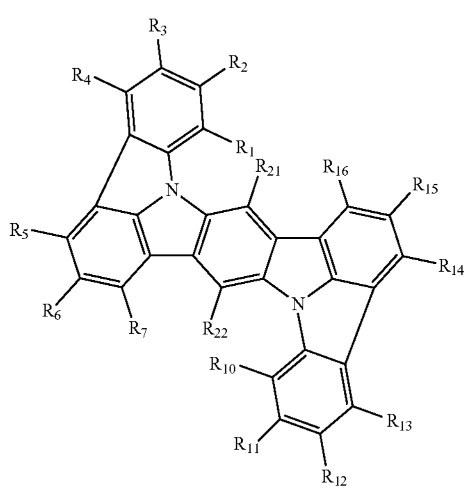

wherein in the formula (A1),
one or more sets of adjacent two or more of $R_1$ to $R_7$ and $R_{10}$ to $R_{16}$ form a substituted or unsubstituted, saturated or unsaturated ring by bonding with each other, or do not form a substituted or unsubstituted, saturated or unsaturated ring;
$R_1$ to $R_7$ and $R_{10}$ to $R_{16}$ which do not form the substituted or unsubstituted, saturated or unsaturated ring, and $R_{21}$ and $R_{22}$ are independently a hydrogen atom or a substituent;
the substituent is a substituted or unsubstituted alkyl group including 1 to 50 carbon atoms,
a substituted or unsubstituted alkenyl group including 2 to 50 carbon atoms,
a substituted or unsubstituted alkynyl group including 2 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
—S—($R_{905}$),
—N($R_{906}$)($R_{907}$),
a halogen atom, a cyano group, a nitro group,
a substituted or unsubstituted aryl group including 6 to 50 ring carbon atoms, or
a substituted or unsubstituted monovalent heterocyclic group including 5 to 50 ring atoms;
$R_{901}$ to $R_{907}$ are independently
a hydrogen atom,
a substituted or unsubstituted alkyl group including 1 to 50 carbon atoms,
a substituted or unsubstituted cycloalkyl group including 3 to 50 ring carbon atoms,
a substituted or unsubstituted aryl group including 6 to 50 ring carbon atoms, or
a substituted or unsubstituted monovalent heterocyclic group including 5 to 50 ring atoms;
when two or more of each of $R_{901}$ to $R_{907}$ are present, the two or more of each of $R_{901}$ to $R_{907}$ may be the same or different; and
provided that the formula (A1) satisfies one or both of the following requirements (i) and (ii):
(i) one or more sets of adjacent two or more of $R_1$ to $R_7$ and $R_{10}$ to $R_{16}$ form a substituted or unsubstituted, saturated or unsaturated ring by bonding with each other,
(ii) one or more of $R_1$ to $R_7$, $R_{10}$ to $R_{16}$, $R_{21}$ and $R_{22}$ is the substituent:

(B1)

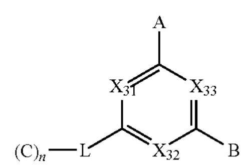

wherein in the formula (B1),
one or more of $X_{31}$ to $X_{33}$ is a nitrogen atom, and the others which are not a nitrogen atom are CR;
R is
a hydrogen atom, a cyano group,
a substituted or unsubstituted alkyl group including 1 to 50 carbon atoms,
a substituted or unsubstituted cycloalkyl group including 3 to 50 ring carbon atoms,
—Si($R_{901}$)($R_{902}$)($R_{903}$),
—O—($R_{904}$),
a substituted or unsubstituted aryl group including 6 to 50 ring carbon atoms, or
a substituted or unsubstituted monovalent heterocyclic group including 5 to 50 ring atoms;
$R_{901}$ to $R_{904}$ are as defined in the formula (A1);
when a plurality of R's are present, the plurality of R's may be the same as or different from each other;
A is a substituted or unsubstituted aryl group including 6 to 18 ring carbon atoms, or a substituted or unsubstituted monovalent heterocyclic group including 5 to 13 ring atoms;

B is a substituted or unsubstituted aryl group including 6 to 18 ring carbon atoms, or a substituted or unsubstituted monovalent heterocyclic group including 5 to 13 ring atoms;

L is a single bond, a substituted or unsubstituted (n+1)-valent aromatic hydrocarbon ring group including 6 to 18 ring carbon atoms, or a substituted or unsubstituted (n+1)-valent heterocyclic group including 5 to 13 ring atoms; the aromatic hydrocarbon ring group may be a structure formed by bonding two or more different aromatic hydrocarbon rings;

C's are independently a substituted or unsubstituted aryl group including 6 to 30 ring carbon atoms, or a substituted or unsubstituted monovalent heterocyclic group including 5 to 60 ring atoms; and n is an integer of 1 to 3; when n is 2 or more, L is not a single bond;

provided that when two of $X_{31}$ to $X_{33}$ are nitrogen atoms, n is 2, and L is a trivalent benzene ring, A and B are not unsubstituted m-biphenyl groups; when two of $X_{31}$ to $X_{33}$ are nitrogen atoms and A is a trivalent benzene ring, B and -L-$(C)_n$ are not unsubstituted m-biphenyl groups; and when two of $X_{31}$ to $X_{33}$ are nitrogen atoms and B is a trivalent benzene ring, A and -L-$(C)_n$ are not unsubstituted m-biphenyl groups.

2. The organic electroluminescence device according to claim 1, wherein the compound represented by the formula (A1) satisfies only the requirement (i).

3. The organic electroluminescence device according to claim 1, wherein the compound represented by the formula (A1) satisfies only the requirement (ii).

4. The organic electroluminescence device according to claim 1, wherein the compound represented by the formula (A1) satisfies the requirements (i) and (ii).

5. The organic electroluminescence device according to claim 1, wherein one or more of $R_1$ to $R_7$ and $R_{10}$ to $R_{16}$ in the formula (A1) is —$N(R_{906})(R_{907})$.

6. The organic electroluminescence device according to claim 1, wherein two or more of $R_1$ to $R_7$ and $R_{10}$ to $R_{16}$ in the formula (A1) are —$N(R_{906})(R_{907})$.

7. The organic electroluminescence device according to claim 6, wherein the compound represented by the formula (A1) is a compound represented by the following formula (A10):

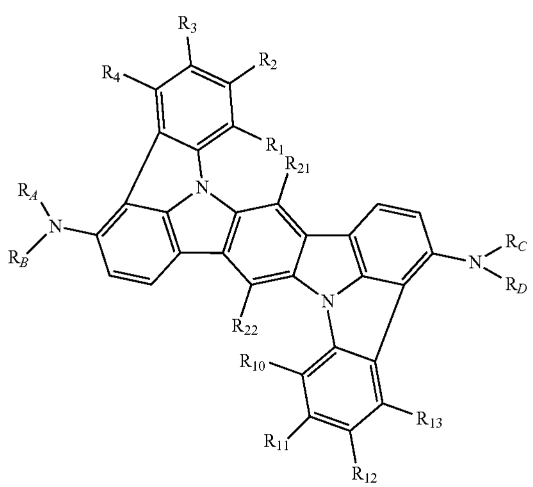

wherein in the formula (A10), $R_1$ to $R_4$, $R_{10}$ to $R_{13}$, $R_{21}$ and $R_{22}$ are as defined in the formula (A1); and $R_A$, $R_B$, $R_C$ and $R_D$ are independently a substituted or unsubstituted aryl group including 6 to 18 ring carbon atoms, or a substituted or unsubstituted monovalent heterocyclic group including 5 to 18 ring atoms.

8. The organic electroluminescence device according to claim 7, wherein the compound represented by the formula (A10) is a compound represented by the following formula (A11):

(A11)

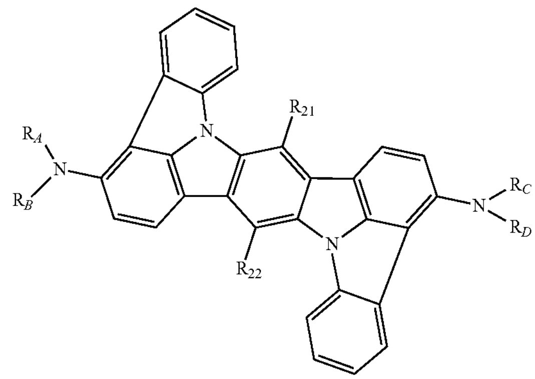

wherein in the formula (A11), $R_{21}$, $R_{22}$, $R_A$, $R_B$, $R_C$ and $R_D$ are as defined in the formula (A10).

9. The organic electroluminescence device according to claim 7, wherein $R_A$, $R_B$, $R_C$ and $R_D$ are independently a substituted or unsubstituted aryl group including 6 to 18 ring carbon atoms.

10. The organic electroluminescence device according to claim 7, wherein $R_A$, $R_B$, $R_C$ and $R_D$ are independently a substituted or unsubstituted phenyl group.

11. The organic electroluminescence device according to claim 1, wherein one or more sets selected from the group consisting of $R_1$ and $R_2$, $R_2$ and $R_3$, $R_3$ and $R_4$, $R_{10}$ and $R_{11}$, $R_{11}$ and $R_{12}$, and $R_{12}$ and $R_{13}$ in the formula (A1) form a ring represented by the following formula (X):

(X)

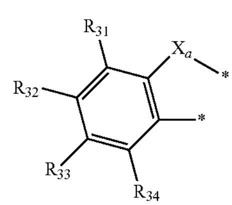

wherein in the formula (X), two *'s are respectively bonded to $R_1$ and $R_2$, $R_2$ and $R_3$, $R_3$ and $R_4$, $R_{10}$ and $R_{11}$, $R_{11}$ and $R_{12}$ or $R_{12}$ and $R_{13}$ in the formula (A1);

$X_a$ is selected from the group consisting of O, S and $N(R_{35})$, and when two or more $X_a$'s are present, the plurality of $X_a$'s may be the same as or different from each other;

$R_{35}$ forms a substituted or unsubstituted, saturated or unsaturated ring by bonding with $R_{31}$, or does not form the ring;

$R_{31}$ which does not form the ring by bonding with $R_{35}$, and $R_{32}$ to $R_{34}$ are independently a hydrogen atom, a substituted or unsubstituted alkyl group including 1 to 50 carbon atoms, or a substituted or unsubstituted aryl group including 6 to 50 ring carbon atoms; and $R_{35}$ which does not form the ring is a hydrogen atom, a substituted or unsubstituted alkyl group including 1 to 50 carbon atoms, a substituted or unsubstituted cycloalkyl group including 3 to 50 ring carbon atoms, a substituted or unsubstituted aryl group including 6 to 50 ring carbon atoms, or a substituted or unsubstituted monovalent heterocyclic group including 5 to 50 ring atoms.

12. The organic electroluminescence device according to claim 11, wherein the compound represented by the formula (A1) is a compound represented by the following formula (A12):

(A12)

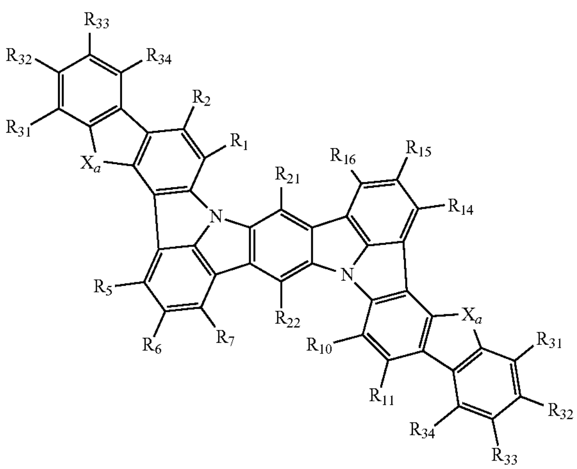

wherein in the formula (A12), $R_1$, $R_2$, $R_5$ to $R_7$, $R_{10}$, $R_{11}$, $R_{14}$ to $R_{16}$, $R_{21}$, $R_{22}$, $R_{31}$ to $R_{34}$ and $X_a$ are as defined in the formula (A1) or the formula (X).

13. The organic electroluminescence device according to claim 1, wherein $R_{21}$ and $R_{22}$ in the formula (A1) are hydrogen atoms.

14. The organic electroluminescence device according to claim 1, wherein two of $X_{31}$ to $X_{33}$ in the formula (B1) are nitrogen atoms.

15. The organic electroluminescence device according to claim 1, wherein the compound represented by the formula (B1) is a compound represented by the following formula (B10):

(B10)

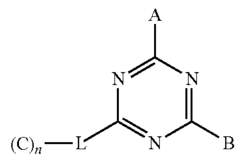

wherein in the formula (B10),

A, B, L, C, and n are as defined in the formula (B1).

16. The organic electroluminescence device according to claim 15, wherein the compound represented by the formula (B10) is a compound represented by the following formula (B11) or (B12):

(B11)

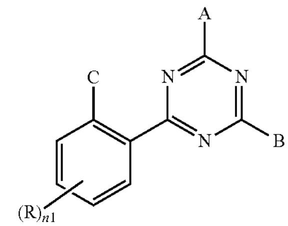

wherein in the formula (B11),

A, B and C are as defined in the formula (B1);

when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring;

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —$Si(R_{901})(R_{902})(R_{903})$,

—O—$(R_{904})$, a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

n1 is an integer of 0 to 4; and when a plurality of R's is present, the plurality of R's may be the same as or different from each other;

(B12)

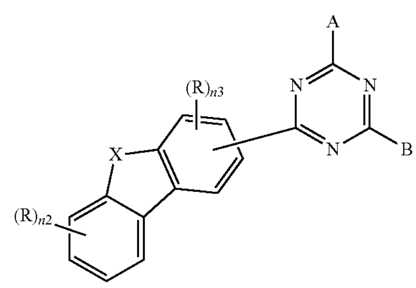

wherein in the formula (B12),

A, B and C are as defined in the formula (B1);

X is $CR_{51}R_{52}$, $NR_{53}$, an oxygen atom, or a sulfur atom;

when X is $CR_{51}R_{52}$, $R_{51}$ and $R_{52}$ form a substituted or unsubstituted, saturated or unsaturated ring by bonding with each other, or do not form a substituted or unsubstituted, saturated or unsaturated ring;

when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring;

$R_{53}$, and R, $R_{51}$ and $R_{52}$ which do not form the substituted or unsubstituted, saturated or unsaturated ring are independently a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

n2 is an integer of 0 to 4, and n3 is an integer of 0 to 3; and when a plurality of R's is present, the plurality of R's may be the same as or different from each other.

17. The organic electroluminescence device according to claim 16, wherein the compound represented by the formula (B12) is a compound represented by the following formula (B12-1):

(B12-1)

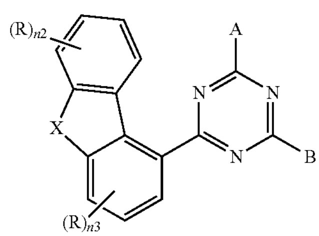

wherein in the formula (B12-1),

A, B, X, R, n2 and n3 are as defined in the formula (B12).

18. The organic electroluminescence device according to claim 15, wherein the compound represented by the formula (B10) is a compound represented by the following formula (B13):

(B13)

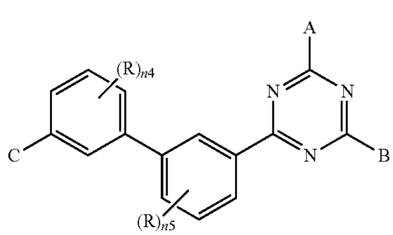

wherein in the formula (B13),

A, B and C are as defined in the formula (B1);

when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring;

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

n4 and n5 are independently an integer of 0 to 4; and when a plurality of R's is present, the plurality of R's may be the same as or different from each other.

19. The organic electroluminescence device according to claim 1, wherein C is a substituted or unsubstituted monovalent heterocyclic group including 13 to 35 ring atoms.

20. The organic electroluminescence device according to claim 1, wherein C is a substituted or unsubstituted aryl group including 14 to 24 ring atoms.

21. The organic electroluminescence device according to claim 15, wherein the compound represented by the formula (B10) is a compound represented by the following formula (B14):

(B14)

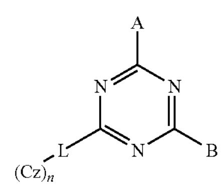

wherein in the formula (B14),

A, B and L are as defined in the formula (B1);

Cz is a group represented by any one of the following formulas (Cz1), (Cz2) and (Cz3); and n is an integer of 1 to 3;

(Cz1)

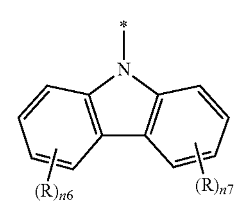

(Cz2)

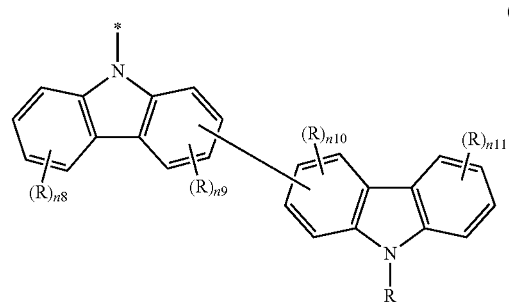

-continued (Cz3)

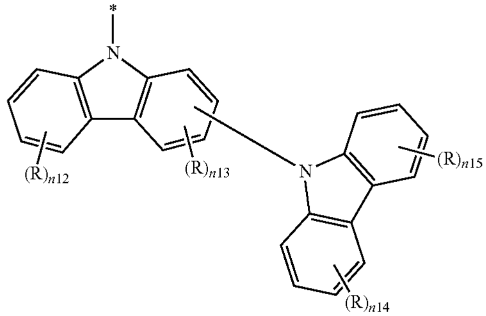

wherein in the formulas (Cz1), (Cz2) and (Cz3), when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring;

R which does not form the substituted or unsubstituted, saturated or unsaturated ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

n6 and n7 are independently an integer of 0 to 4;

n8 and n11 are independently an integer of 0 to 4, and n9 and n10 are independently an integer of 0 to 3;

n12, n14 and n15 are independently an integer of 0 to 4, and n13 is an integer of 0 to 3;

when a plurality of R's is present, the plurality of R's may be the same as or different from each other; and

* is bonded to L.

22. The organic electroluminescence device according to claim 15, wherein the compound represented by the formula (B10) is a compound represented by the following formula (B15):

(B15)

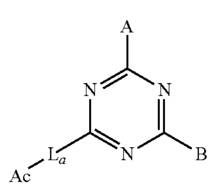

wherein in the formula (B15),

A and B are as defined in the formula (B1);

$L_a$ is a single bond, a substituted or unsubstituted divalent aromatic hydrocarbon ring group including 6 to 18 ring carbon atoms, or a substituted or unsubstituted divalent heterocyclic group including 5 to 13 ring atoms; and Ac is a group represented by any one of the following formulas (Ac1), (Ac2) and (Ac3);

(Ac1)

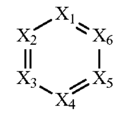

(Ac2)

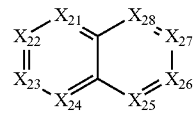

(Ac3)

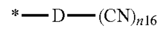

wherein in the formula (Ac1), one or more of $X_1$ to $X_6$ is a nitrogen atom, the others which are not a nitrogen atom are CR's, and one of R's is a single bond bonded to $L_a$;

R which is not a single bond bonded to $L_a$ is a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

when a plurality of R's is present, the plurality of R's may be the same as or different from each other;

wherein in the formula (Ac2), one or more of $X_{21}$ to $X_{28}$ is a nitrogen atom, the others which are not a nitrogen atom are CR's, and one of R's is a single bond bonded to $L_a$;

when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring;

R which is not a single bond bonded to $L_a$, and which does not form the substituted or unsubstituted, saturated or unsaturated ring is a hydrogen atom, a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

when a plurality of R's is present, the plurality of R's may be the same as or different from each other; and wherein in the formula (Ac3), D is an aryl group including 6 to 18 ring carbon atoms which is substituted by n16 cyano groups, or a monovalent heterocyclic group including 5 to 13 ring atoms which is substituted by n16 cyano groups, and provided that D may have a substituent other than a cyano group;

n16 represents the number of cyano groups substituted to D and is an integer of 1 to 9; and

* is bonded to $L_a$.

23. The organic electroluminescence device according to claim 22, wherein the compound represented by the formula (B15) is a compound represented by the following formula (B16):

(B16)

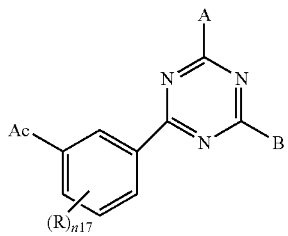

wherein in the formula (B16),

A, B, Ac and R are as defined in the formula (B15);

n17 is an integer of 0 to 4;

when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring;

R which does not form the ring is a cyano group, a substituted or unsubstituted alkyl group including 1 to 50 carbon atoms, a substituted or unsubstituted cycloalkyl group including 3 to 50 ring carbon atoms, —Si($R_{901}$)($R_{902}$)($R_{903}$),

—O—($R_{904}$), a substituted or unsubstituted aryl group including 6 to 50 ring carbon atoms, or a substituted or unsubstituted monovalent heterocyclic group including 5 to 50 ring atoms;

$R_{901}$ to $R_{904}$ is as defined in the formula (A1); and when a plurality of R's is present, the plurality of R's may be the same as or different from each other.

24. The organic electroluminescence device according to claim 1, wherein L or $L_a$ is an aromatic hydrocarbon ring group represented by the following formula (L1) or (L2):

(L1)

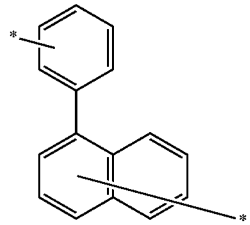

-continued (L2)

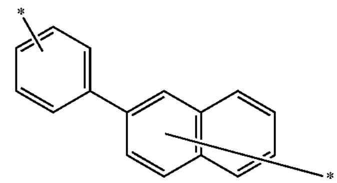

wherein in the formula (L1) or (L2), either one of two *'s is bonded to the nitrogen-containing six-membered ring and the other is bonded to $(C)_n$, $(Cz)_n$ or Ac; and when n is an integer of 1 to 3, the bonding to C or Cz is present in the number of 1 to 3, respectively.

25. The organic electroluminescence device according to claim 1, wherein L is a single bond, or a substituted or unsubstituted (n+1)-valent aromatic hydrocarbon ring group including 6 to 12 ring carbon atoms.

26. The organic electroluminescence device according to claim 1, wherein L or $L_a$ is a single bond.

27. The organic electroluminescence device according to claim 1, wherein A is a substituted or unsubstituted aryl group including 6 to 12 ring carbon atoms.

28. The organic electroluminescence device according to claim 1, wherein A is a substituted or unsubstituted phenyl group, a substituted or unsubstituted biphenyl group, or a substituted or unsubstituted naphthyl group.

29. The organic electroluminescence device according to claim 1, wherein A is a phenyl group, a biphenyl group, or a naphthyl group.

30. The organic electroluminescence device according to claim 1, wherein B is a substituted or unsubstituted aryl group including 6 to 12 ring carbon atoms.

31. The organic electroluminescence device according to claim 1, wherein B is a substituted or unsubstituted phenyl group, a substituted or unsubstituted biphenyl group, or a substituted or unsubstituted naphthyl group.

32. The organic electroluminescence device according to claim 1, wherein B is a phenyl group, a biphenyl group, or a naphthyl group.

33. The organic electroluminescence device according to claim 1, wherein the first layer is directly adjacent to the emitting layer.

34. The organic electroluminescence device according to claim 1, further comprising a second layer disposed between the emitting layer and the first layer.

35. The organic electroluminescence device according to claim 34, wherein the emitting layer, the second layer, and the first layer are formed directly adjacent to each other in this order, and the first layer and the second layer independently comprise the compound represented by the formula (B1).

36. The organic electroluminescence device according to claim 1, further comprising a third layer, wherein the third layer is disposed between the anode and the emitting layer, and the third layer comprises a compound represented by the following formula (C1) or (D1):

(C1)

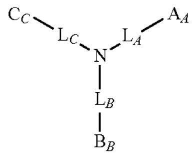

wherein in the formula (C1), $L_A$, $L_B$ and $L_C$ are independently a single bond, a substituted or unsubstituted arylene group including 6 to 18 ring carbon atoms, or a substituted or unsubstituted divalent heterocyclic group including 5 to 13 ring atoms;

$A_A$, $B_B$ and $C_C$ are independently a substituted or unsubstituted aryl group including 6 to 30 ring carbon atoms, a substituted or unsubstituted monovalent heterocyclic group including 5 to 30 ring atoms, or —Si(R'$_{901}$)(R'$_{902}$)(R'$_{903}$);

R'$_{901}$ to R'$_{903}$ are independently a substituted or unsubstituted aryl group including 6 to 30 ring carbon atoms; and when two or more of each of one or more of R'$_{901}$ to R'$_{903}$ are present, each of the two or more R'$_{901}$ to R'$_{903}$ may be the same or different;

(D1)

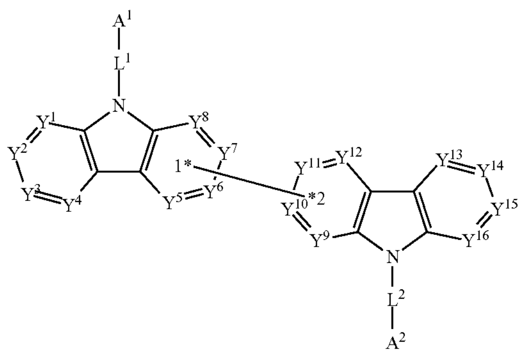

wherein in the formula (D1), $A^1$ and $A^2$ are independently a substituted or unsubstituted aryl group including 6 to 30 ring carbon atoms or a substituted or unsubstituted monovalent heterocyclic group including 5 to ring atoms;

one of $Y^5$ to $Y^8$ is a carbon atom which is bonded to *1;

one of $Y^9$ to $Y^{12}$ is a carbon atom which is bonded to *2;

$Y^1$ to $Y^4$, $Y^{13}$ to $Y^{16}$, $Y^5$ to $Y^8$ which are not bonded to *1, and $Y^9$ to $Y^{12}$ which are bonded to *2 are independently CR;

when a plurality of R's is present, one or more sets of adjacent two or more of the plurality of R's form a substituted or unsubstituted, saturated or unsaturated ring by bonding with each other, or do not form a substituted or unsubstituted, saturated or unsaturated ring;

R which does not form the substituted or unsubstituted, saturated or unsaturated ring is a hydrogen atom, a cyano group, a substituted or unsubstituted alkyl group including 1 to 50 carbon atoms, a substituted or unsubstituted alkenyl group including 2 to 50 carbon atoms, a substituted or unsubstituted alkynyl group including 2 to 50 carbon atoms, a substituted or unsubstituted cycloalkyl group including 3 to 50 ring carbon atoms, —Si($R_{901}$)($R_{902}$)($R_{903}$),

—O—($R_{904}$), a halogen atom, a nitro group, a substituted or unsubstituted aryl group including 6 to 50 ring carbon atoms, or a substituted or unsubstituted monovalent heterocyclic group including 5 to 50 ring atoms;

$R_{901}$ to $R_{904}$ are as defined in the formula (A1);

when a plurality of R's is present, the plurality of R's may be the same as or different from each other;

$L^1$ and $L^2$ are independently a single bond, a substituted or unsubstituted arylene group including 6 to 30 ring carbon atoms, or a substituted or unsubstituted divalent heterocyclic group including 5 to 30 ring atoms.

37. The organic electroluminescence device according to claim 36, wherein the third layer comprises the compound represented by the formula (C1).

38. The organic electroluminescence device according to claim 1, wherein the substituent in the case of "substituted or unsubstituted" is a group selected from the group consisting of an alkyl group including 1 to 18 carbon atoms, an aryl group including 6 to 18 ring carbon atoms, and a monovalent heterocyclic group including 5 to 18 ring atoms.

39. The organic electroluminescence device according to claim 1, wherein the substituent in the case of "substituted or unsubstituted" is a group selected from the group consisting of an alkyl group including 1 to 5 carbon atoms.

40. An electronic apparatus, equipped with the organic electroluminescence device according to claim 1.

* * * * *